US012757568B2

(12) United States Patent
Toyoshima et al.

(10) Patent No.: US 12,757,568 B2
(45) Date of Patent: Oct. 6, 2026

(54) ORGANIC ELECTROLUMINESCENCE DEVICE, LIGHT EMITTING DEVICE, ORGANIC ELECTROLUMINESCENCE DISPLAY DEVICE AND ELECTRONIC DEVICE

(71) Applicant: IDEMITSU KOSAN CO., LTD., Tokyo (JP)

(72) Inventors: Hiroaki Toyoshima, Tokyo (JP); Kazuki Nishimura, Tokyo (JP); Emiko Kambe, Tokyo (JP); Masato Nakamura, Tokyo (JP); Tetsuya Masuda, Tokyo (JP); Yusuke Takahashi, Tokyo (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 924 days.

(21) Appl. No.: 17/895,676

(22) Filed: Aug. 25, 2022

(65) Prior Publication Data

US 2023/0036664 A1 Feb. 2, 2023

Related U.S. Application Data

(63) Continuation of application No. 17/511,495, filed on Oct. 26, 2021, now Pat. No. 11,575,087.

(30) Foreign Application Priority Data

Dec. 25, 2020 (JP) ................................ 2020-217949
Jun. 25, 2021 (JP) ................................ 2021-106108
Jun. 25, 2021 (JP) ................................ 2021-106127

(51) Int. Cl.

*H01L 51/50* (2006.01)
*H10K 50/15* (2023.01)
*H10K 59/80* (2023.01)
*H10K 85/40* (2023.01)
*H10K 85/60* (2023.01)
*H10K 50/11* (2023.01)
*H10K 50/13* (2023.01)
*H10K 101/10* (2023.01)

(52) U.S. Cl.

CPC ....... *H10K 50/156* (2023.02); *H10K 59/8051* (2023.02); *H10K 85/40* (2023.02); *H10K 85/624* (2023.02); *H10K 85/626* (2023.02); *H10K 85/633* (2023.02); *H10K 85/636* (2023.02); *H10K 85/6572* (2023.02); *H10K 85/6574* (2023.02); *H10K 85/6576* (2023.02); *H10K 50/11* (2023.02); *H10K 50/13* (2023.02); *H10K 59/879* (2023.02); *H10K 2101/10* (2023.02)

(58) Field of Classification Search

None
See application file for complete search history.

(56) References Cited

U.S. PATENT DOCUMENTS

| | | | | |
|---|---|---|---|---|
| 9,853,224 | B2 | 12/2017 | Tanabe et al. | |
| 11,482,675 | B1 | 10/2022 | Tasaki et al. | |
| 11,489,128 | B1 | 11/2022 | Tasaki et al. | |
| 2003/0170491 | A1* | 9/2003 | Liao | H05B 33/00 |
| 2007/0114922 | A1 | 5/2007 | Sung et al. | |
| 2008/0203406 | A1 | 8/2008 | He | |
| 2010/0295444 | A1 | 11/2010 | Kuma et al. | |
| 2010/0301318 | A1 | 12/2010 | Kuma et al. | |
| 2011/0248249 | A1 | 10/2011 | Forrest et al. | |
| 2011/0285274 | A1 | 11/2011 | Hamada et al. | |
| 2012/0292609 | A1 | 11/2012 | Yokoyama et al. | |
| 2013/0270539 | A1 | 10/2013 | Kuma et al. | |
| 2014/0183500 | A1 | 7/2014 | Ikeda et al. | |
| 2016/0190477 | A1 | 6/2016 | Kawakami et al. | |
| 2017/0125494 | A1* | 5/2017 | Matsusue | H01L 51/504 |
| 2017/0269435 | A1* | 9/2017 | Yoon | H01L 27/32 |

(Continued)

FOREIGN PATENT DOCUMENTS

| | | | |
|---|---|---|---|
| CN | 102931357 | A | 2/2013 |
| CN | 106221691 | A | 12/2016 |

(Continued)

OTHER PUBLICATIONS

PCT International Preliminary Report on Patentability, dated Jul. 4, 2023, which includes a translation of International Searching Authority, "Written Opinion," issued in connection with International Patent Application No. PCT/JP2022/000808, dated Apr. 5, 2022.
PCT International Preliminary Report on Patentability, dated Jul. 4, 2023, which includes a translation of International Searching Authority, "Written Opinion," issued in connection with International Patent Application No. PCT/JP2022/000809, dated Apr. 5, 2022.
International Search Report and Written Opinion issued in corresponding International Patent Application No. PCT/JP2021/048348 dated Mar. 15, 2022.

(Continued)

*Primary Examiner* — Gregory D Clark
(74) *Attorney, Agent, or Firm* — Foley & Lardner LLP

(57) ABSTRACT

An organic electroluminescence device includes: an emitting region provided between a cathode and an anode; and a hole transporting zone provided between the anode and the emitting region, in which the hole transporting zone includes at least a first anode side organic layer and a second anode side organic layer, the first anode side organic layer is in direct contact with the second anode side organic layer, a total film thickness of the hole transporting zone is in a range from 20 nm to 80 nm, the first anode side organic layer contains no compound contained in the second anode side organic layer, the first anode side organic layer contains a first organic material and a second organic material, the first organic material is different from the second organic material, and a content of the first organic material in the first anode side organic layer is less than 50 mass %.

29 Claims, 10 Drawing Sheets

(56) References Cited

U.S. PATENT DOCUMENTS

Figure 1:
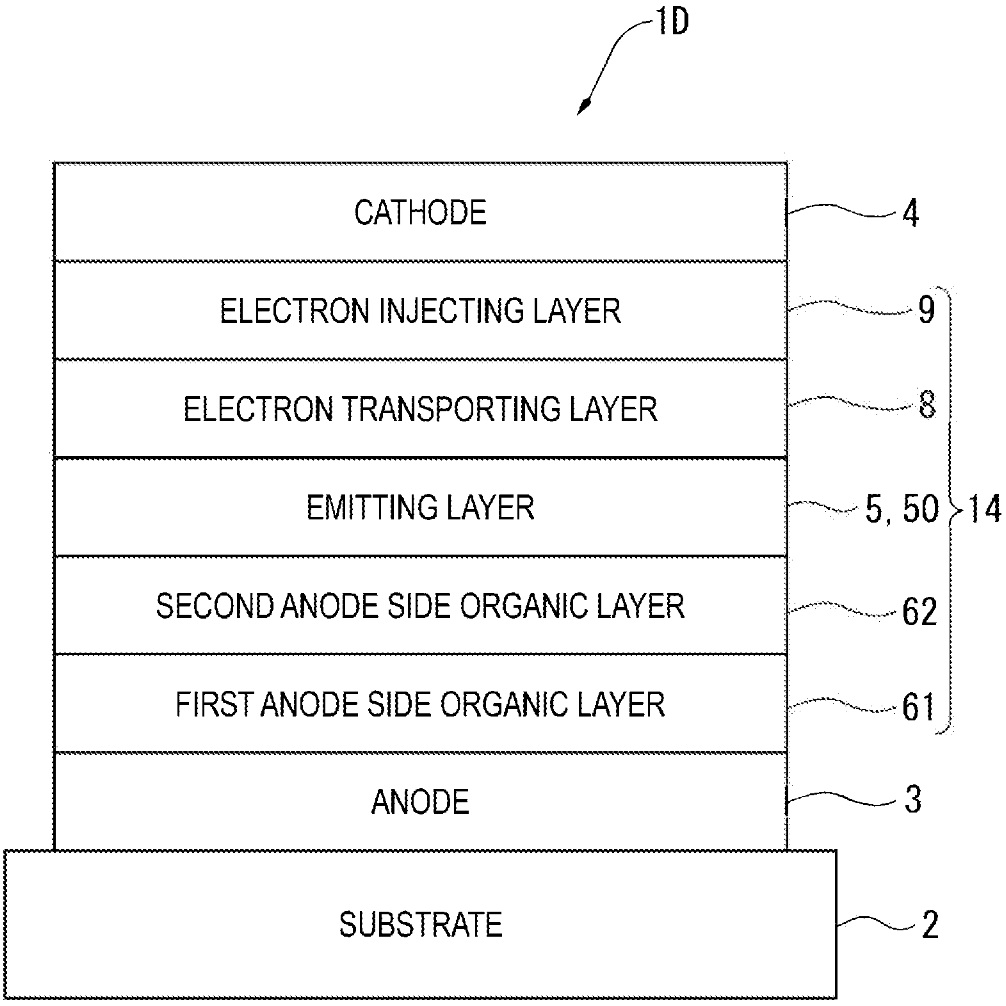

| | | | | |
|---|---|---|---|---|
| 2017/0324043 | A1 | 11/2017 | Ikeda et al. | |
| 2018/0019428 | A1 | 1/2018 | Kawamura | |
| 2019/0058124 | A1 | 2/2019 | Hatakeyama et al. | |
| 2019/0194219 | A1 | 6/2019 | Kawamura et al. | |
| 2019/0280209 | A1 | 9/2019 | Fujita | |
| 2020/0091435 | A1 | 3/2020 | Masuda et al. | |
| 2020/0106044 | A1 | 4/2020 | Gao et al. | |
| 2020/0111962 | A1 | 4/2020 | Nakano et al. | |
| 2020/0111965 | A1 | 4/2020 | Nakano et al. | |
| 2020/0290985 | A1 | 9/2020 | Kudo et al. | |
| 2021/0005825 | A1 | 1/2021 | Tasaki et al. | |
| 2021/0005826 | A1 | 1/2021 | Tasaki et al. | |
| 2021/0013439 | A1 | 1/2021 | Sado et al. | |
| 2021/0083193 | A1 | 3/2021 | Tasaki et al. | |
| 2021/0130336 | A1 | 5/2021 | Shirasaki et al. | |
| 2021/0135116 | A1* | 5/2021 | Mochizuki | H10K 85/654 |
| 2021/0159418 | A1 | 5/2021 | Ye et al. | |
| 2021/0226086 | A1 | 7/2021 | Lee et al. | |
| 2021/0234098 | A1 | 7/2021 | Lee et al. | |
| 2021/0242419 | A1 | 8/2021 | Nakamura et al. | |
| 2021/0273173 | A1 | 9/2021 | Tasaki et al. | |
| 2021/0384430 | A1 | 12/2021 | Nakano et al. | |
| 2022/0045293 | A1 | 2/2022 | Kim et al. | |
| 2022/0073447 | A1 | 3/2022 | Montenegro et al. | |
| 2022/0119360 | A1 | 4/2022 | Mochizuki et al. | |
| 2022/0165964 | A1 | 5/2022 | Itoi et al. | |
| 2022/0173335 | A1 | 6/2022 | Itoi et al. | |
| 2022/0285625 | A1 | 9/2022 | Tasaki et al. | |
| 2022/0310930 | A1 | 9/2022 | Tasaki et al. | |
| 2022/0348522 | A1 | 11/2022 | Tasaki et al. | |
| 2023/0047477 | A1 | 2/2023 | Tasaki et al. | |

FOREIGN PATENT DOCUMENTS

| | | | |
|---|---|---|---|
| CN | 111377908 | A | 7/2020 |
| JP | 2007-242927 | A | 9/2007 |
| JP | 2007-294261 | A | 11/2007 |
| JP | 2008-509565 | A | 3/2008 |
| JP | 2008-177455 | A | 7/2008 |
| JP | 2011-054668 | A | 3/2011 |
| JP | 2011-084717 | A | 4/2011 |
| JP | 2011-100943 | A | 5/2011 |
| JP | 2019-161218 | A | 9/2019 |
| KR | 102017134163 | A | 12/2017 |
| KR | 1020190088030 | A | 7/2019 |
| KR | 10-2020-0129989 | A | 11/2020 |
| WO | WO-2010/134350 | A1 | 11/2010 |
| WO | WO-2011/093056 | A1 | 8/2011 |
| WO | WO-2014/104144 | A1 | 7/2014 |
| WO | WO-2015/162912 | A1 | 10/2015 |
| WO | WO-2017/138526 | A1 | 8/2017 |
| WO | WO-2018/043435 | A1 | 3/2018 |
| WO | WO-2018/174293 | A1 | 9/2018 |
| WO | WO-2018/186374 | A1 | 10/2018 |
| WO | WO-2018/186396 | A1 | 10/2018 |
| WO | WO-2019/088231 | A1 | 5/2019 |
| WO | WO-2019/198806 | A1 | 10/2019 |
| WO | WO-2019/235475 | A1 | 12/2019 |
| WO | WO-2020/071479 | A1 | 4/2020 |
| WO | WO-2020/080416 | A1 | 4/2020 |
| WO | WO-2020/080417 | A1 | 4/2020 |
| WO | WO-2020/116562 | A1 | 6/2020 |
| WO | WO-2020/127145 | A2 | 6/2020 |
| WO | WO-2020/171221 | A1 | 8/2020 |
| WO | WO-2020/189316 | A1 | 9/2020 |
| WO | WO-2020/209299 | A1 | 10/2020 |
| WO | WO-2020/209307 | A1 | 10/2020 |
| WO | WO-2021/025162 | A1 | 2/2021 |
| WO | WO-2021/049653 | A1 | 3/2021 |
| WO | WO-2021/049654 | A1 | 3/2021 |
| WO | WO-2021/090932 | A1 | 5/2021 |

OTHER PUBLICATIONS

International Search Report and Written Opinion issued in corresponding International Patent Application No. PCT/JP2021/048350 dated Mar. 15, 2022.

Baranoff et al., "Flrpic: archetypal blue phosphorescent emitter for electroluminescence", Dalton Transactions, 2015, 44, 8318 (Year: 2015).

International Search Report, dated Apr. 5, 2022, issued in corresponding International Application No. PCT/JP2022/000808 (English translation).

International Search Report, dated Apr. 5, 2022, issued in corresponding International Application No. PCT/JP2022/000809 (English translation).

International Searching Authority, "International Search Report," issued in connection with International Patent Application No. PCT/JP2021/048349, dated Mar. 15, 2022.

International Searching Authority, "Written Opinion," issued in connection with International Patent Application No. PCT/JP2021/048349, dated Mar. 15, 2022.

PCT International Preliminary Report on Patentability, dated Jun. 13, 2023, which includes a translation of International Searching Authority, "Written Opinion," issued in connection with International Patent Application No. PCT/JP2021/048349, dated Mar. 15, 2022.

PCT International Preliminary Report on Patentability, dated Jun. 13, 2023, which includes a translation of International Searching Authority, "Written Opinion," issued in connection with International Patent Application No. PCT/JP2021/048350, dated Mar. 15, 2022 (6 pages).

Written Opinion of the International Searching Authority, dated Apr. 5, 2022, issued in corresponding International Application No. PCT/JP2022/000808.

Written Opinion of the International Searching Authority, dated Apr. 5, 2022, issued in corresponding International Application No. PCT/JP2022/000809.

Office Action issued in corresponding U.S. Appl. No. 18/259,254 dated Aug. 5, 2026 (18 pages).

* cited by examiner

ORGANIC ELECTROLUMINESCENCE DEVICE, LIGHT EMITTING DEVICE, ORGANIC ELECTROLUMINESCENCE DISPLAY DEVICE AND ELECTRONIC DEVICE

CROSS-REFERENCE RELATED APPLICATIONS

The present application is a Continuation of U.S. patent application Ser. No. 17/511,495, filed on Oct. 26, 2021, which claims priority to and the benefit of Japanese Patent Application Nos. 2020-217949, filed on Dec. 25, 2020, 2021-106108 and 2021-106127, both filed on Jun. 25, 2021. The contents of these applications are hereby incorporated by reference in their entireties.

TECHNICAL FIELD

The present invention relates to an organic electroluminescence device, a light-emitting device, an organic electroluminescence display device, and an electronic device.

BACKGROUND ART

An organic electroluminescence device (hereinafter, occasionally referred to as "organic EL device") has found its application in a full-color display for mobile phones, televisions and the like. When a voltage is applied to the organic EL device, holes are injected from an anode and electrons are injected from a cathode into an emitting layer. The injected electrons and holes are recombined in the emitting layer to form excitons. Specifically, according to the electron spin statistics theory, singlet excitons and triplet excitons are generated at a ratio of 25%:75%.

Studies for improving performance of an organic EL device has been made, for instance, in Literature 1 (International Publication No. WO2020/189316), Literature 2 (JP 2019-161218 A), and Literature 3 (International Publication No. WO2011/093056). The performance of the organic EL device is evaluable in terms of, for instance, luminance, emission wavelength, chromaticity, luminous efficiency, drive voltage, and lifetime. One of the problems with the organic EL device is low light-extraction efficiency. Especially, decay due to the reflection caused by the difference between refractive indices of adjacent layers is a major factor in reducing the light-extraction efficiency of the organic EL device. An arrangement of the organic EL device provided with a layer formed from a low refractive index material has been proposed in order to reduce the above effect.

SUMMARY OF THE INVENTION

An object of the invention is to provide an organic electroluminescence device, a light-emitting device and an organic electroluminescence display device with improved luminous efficiency, an electronic device including the organic electroluminescence device, and an electronic device including the organic electroluminescence display device.

According to an aspect of the invention, an organic electroluminescence device includes: a cathode; an anode; an emitting region provided between the cathode and the anode; and a hole transporting zone provided between the anode and the emitting region, in which the emitting region includes at least one emitting layer, the hole transporting zone includes at least a first anode side organic layer and a second anode side organic layer, the first anode side organic layer is in direct contact with the second anode side organic layer, the first anode side organic layer and the second anode side organic layer are disposed between the anode and the emitting region in this order from the anode, a total film thickness of the hole transporting zone is in a range from 20 nm to 80 nm, the first anode side organic layer does not contain a compound contained in the second anode side organic layer, the first anode side organic layer contains compounds being a first organic material and a second organic material, the first organic material is different from the second organic material, and a content of the first organic material in the first anode side organic layer is less than 50 mass %.

Using the layer formed from a low refractive index material as the organic layer (e.g., hole transporting layer) in the hole transporting zone reduces light emission loss in an evanescent mode. Further, as the organic layers (e.g., hole transporting layer) in the hole transporting zone, the organic layer formed from a high refractive index material is disposed close to the anode and the organic layer formed from the low refractive index material is disposed close to the emitting layer, thereby making it possible to reduce light emission loss in a thin film mode. It is possible especially for the light extraction in the bottom-emission organic electroluminescence device to inhibit not only the light emission loss in an organic thin-film layer but also the light emission loss in a substrate mode, thereby resulting in enhanced light-extraction efficiency. Specifically, the light-extraction efficiency can be effectively enhanced when the organic layer formed from the low refractive index material has a film thickness of 20 nm or more. Further, a hole supply property can be easily adjusted by combining mutually different two kinds of materials in the organic layers in the hole transporting zone.

According to another aspect of the invention, a light-emitting device includes the organic electroluminescence device according to the above aspect of the invention and a color conversion layer.

According to still another aspect of the invention, an organic electroluminescence display device includes: an anode and a cathode provided to face each other; a blue-emitting organic EL device as a blue pixel; a green-emitting organic EL device as a green pixel; and a red-emitting organic EL device as a red pixel, in which the blue pixel includes the organic electroluminescence device according to the above aspect of the invention as the blue-emitting organic EL device, the green-emitting organic EL device includes a green emitting region provided between the anode and the cathode, the red-emitting organic EL device includes a red emitting region provided between the anode and the cathode, in a case where the first anode side organic layer, the second anode side organic layer and the third anode side organic layer are provided for the blue-emitting organic EL device, the first anode side organic layer, the second anode side organic layer and the third anode side organic layer are provided in a shared manner across the blue-emitting organic EL device, the green-emitting organic EL device and the red-emitting organic EL device between the anode and the emitting region of the blue-emitting organic EL device, the green emitting region and the red emitting region, and in a case where the third anode side organic layer is not provided and the first anode side organic layer and the second anode side organic layer are provided for the blue-emitting organic EL device, the first anode side organic layer and the second anode side organic layer are provided in a shared manner across the blue-emitting organic EL device, the green-emitting organic EL device and the red-emitting organic EL device between the anode and the emitting region of the blue-emitting organic EL device, the green emitting region and the red emitting region.

According to a further aspect of the invention, an electronic device includes the organic electroluminescence device according to the above aspect of the invention.

According to a still further aspect of the invention, an electronic device includes the organic electroluminescence display device according to the above aspect of the invention.

According to a still further aspect of the invention, an organic electroluminescence device, a light-emitting device and an organic electroluminescence display device with improved luminous efficiency, an electronic device including the organic electroluminescence device, and an electronic device including the organic electroluminescence display device can be provided.

BRIEF DESCRIPTION OF DRAWING(S)

FIG. 1 schematically shows an exemplary arrangement of an organic electroluminescence device according to a first exemplary embodiment of the invention.

Figure 2:
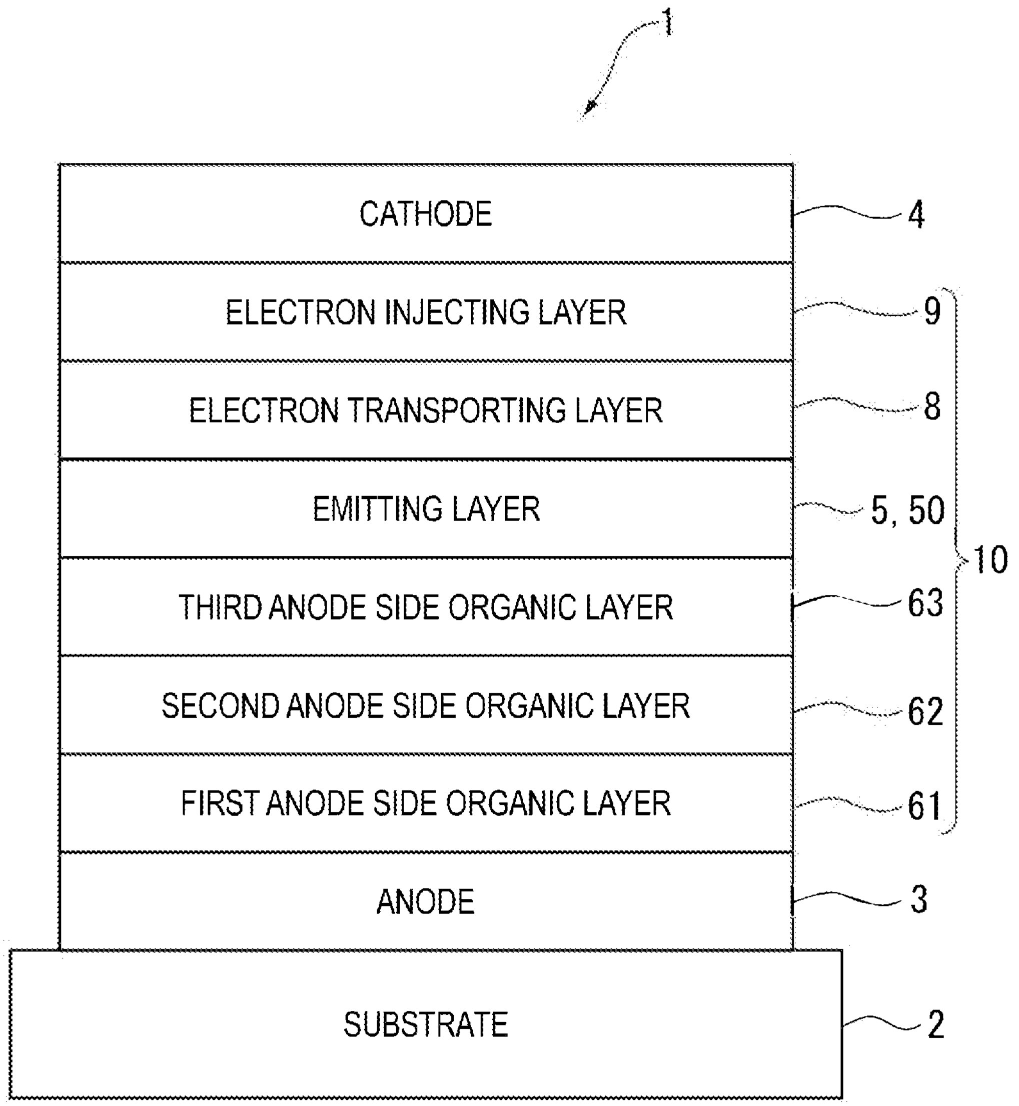

FIG. 2 schematically shows another exemplary arrangement of the organic electroluminescence device according to the first exemplary embodiment.

Figure 3:
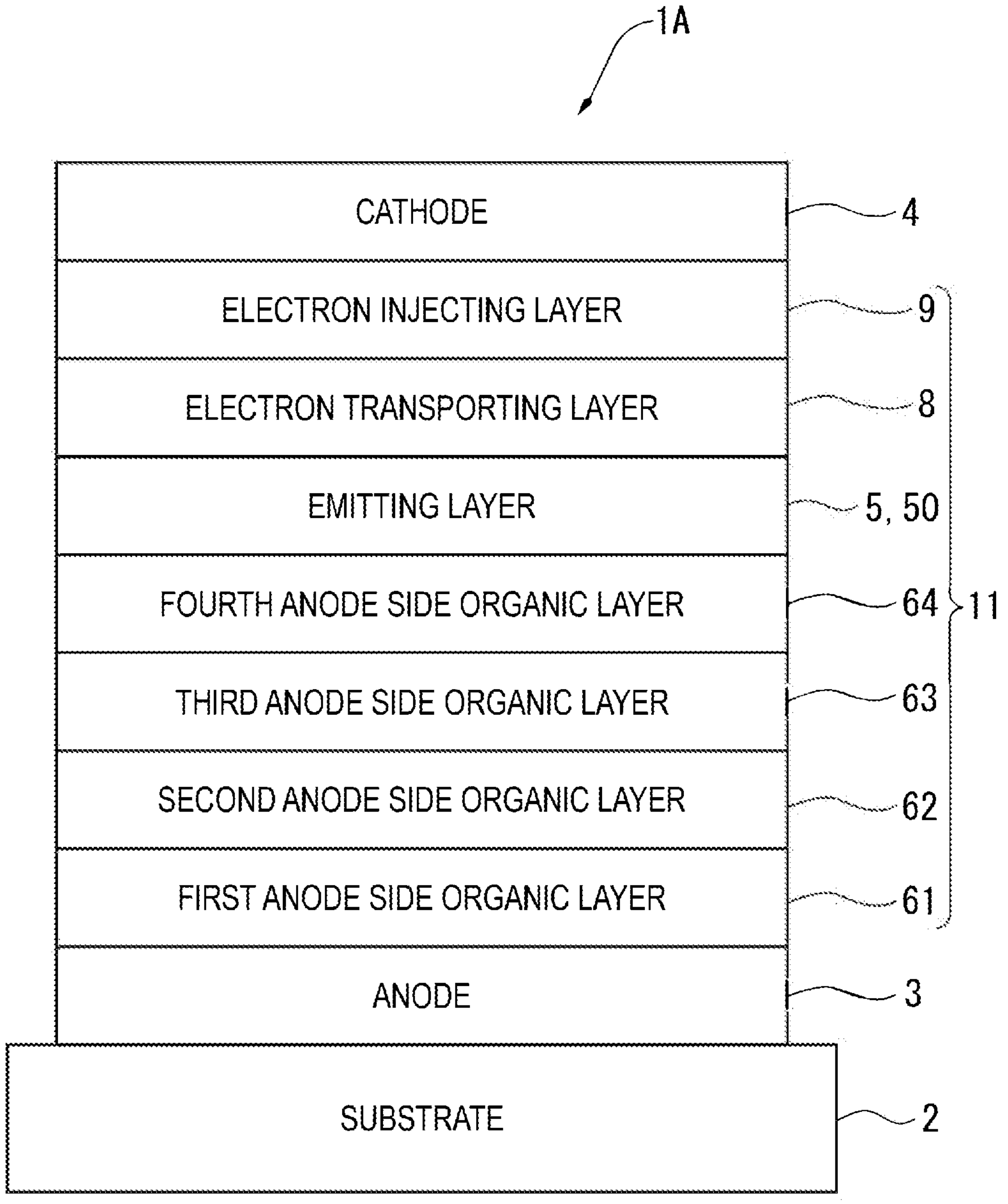

FIG. 3 schematically shows still another exemplary arrangement of the organic electroluminescence device according to the first exemplary embodiment.

Figure 4:
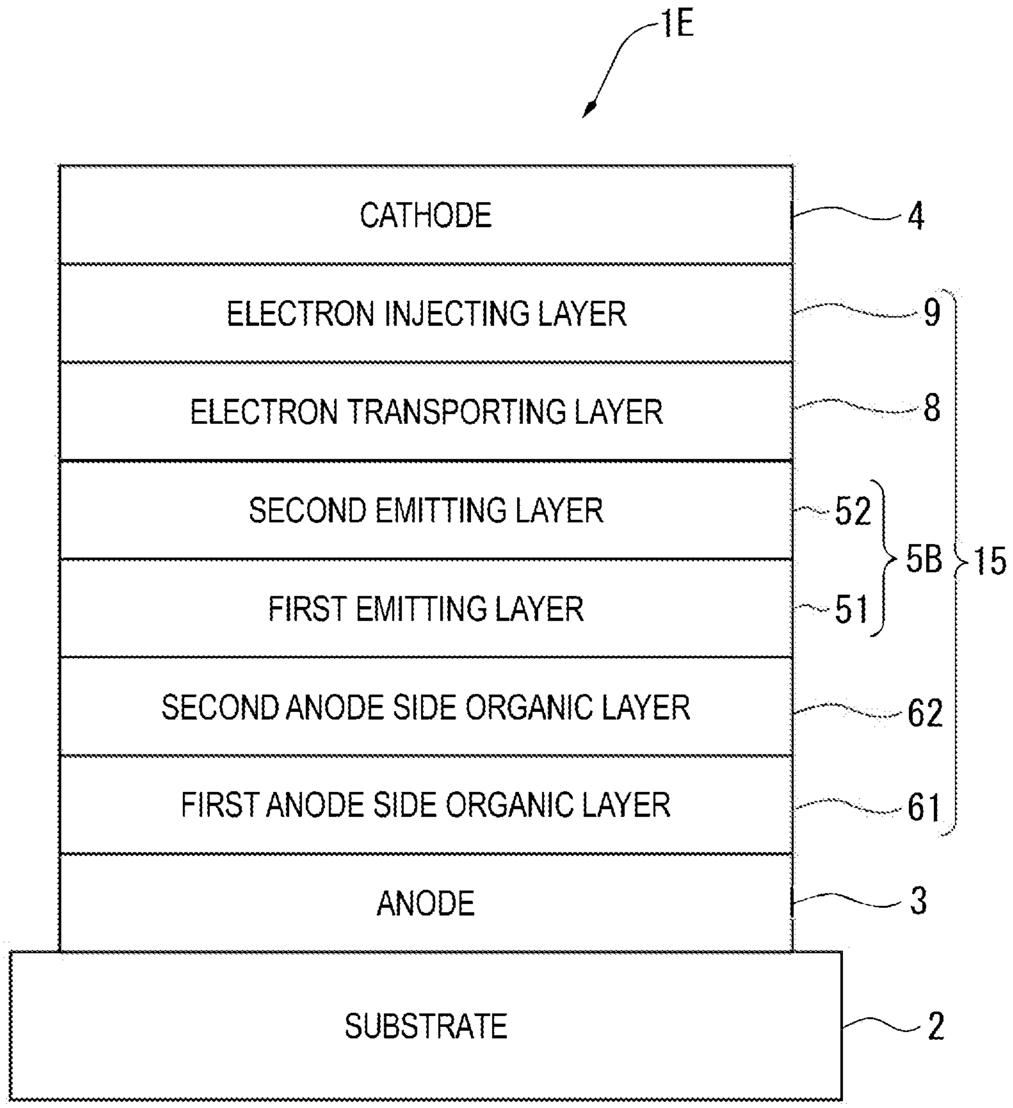

FIG. 4 schematically shows a further exemplary arrangement of the organic electroluminescence device according to the first exemplary embodiment.

Figure 5:
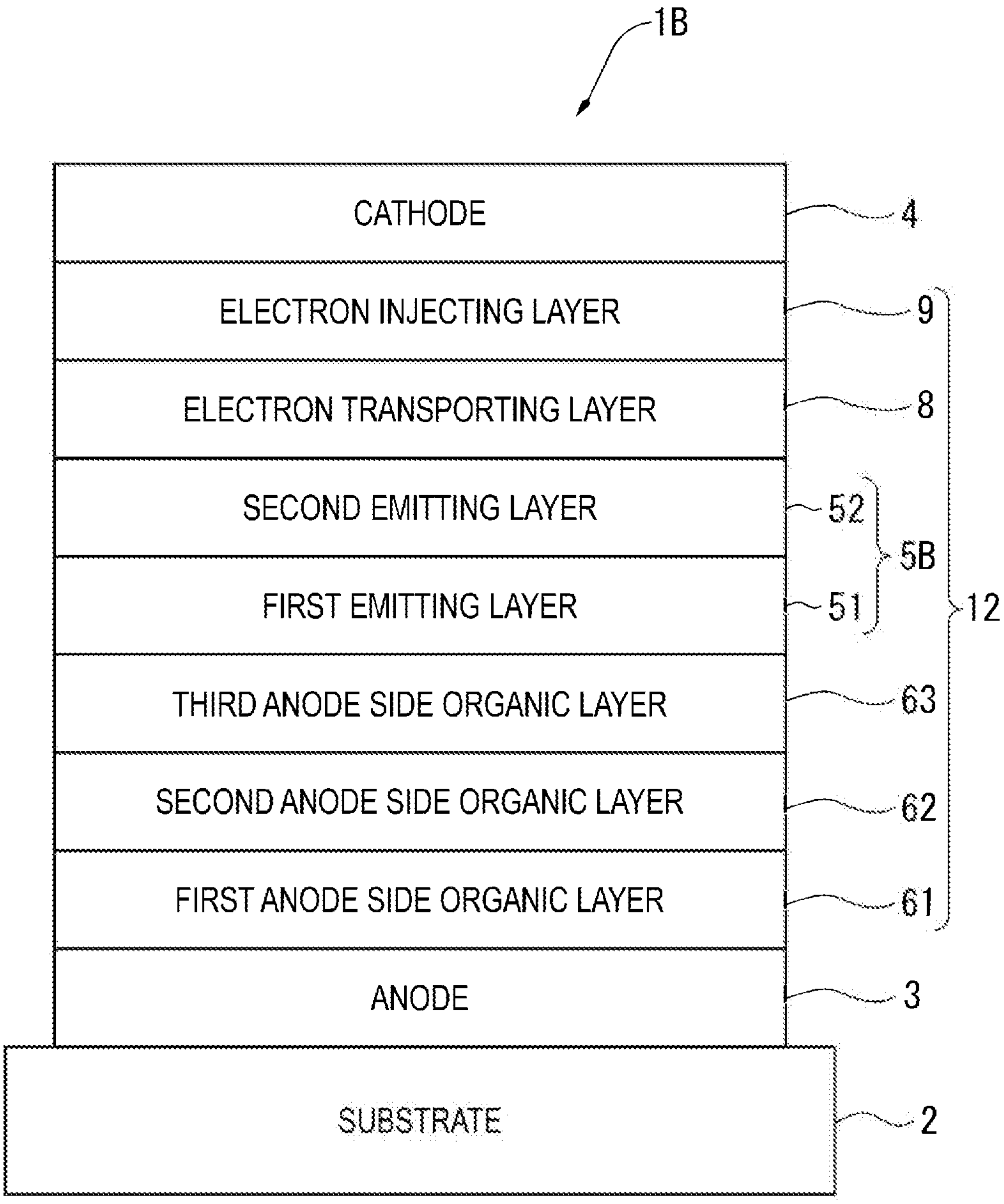

FIG. 5 schematically shows a still further exemplary arrangement of the organic electroluminescence device according to the first exemplary embodiment.

Figure 6:
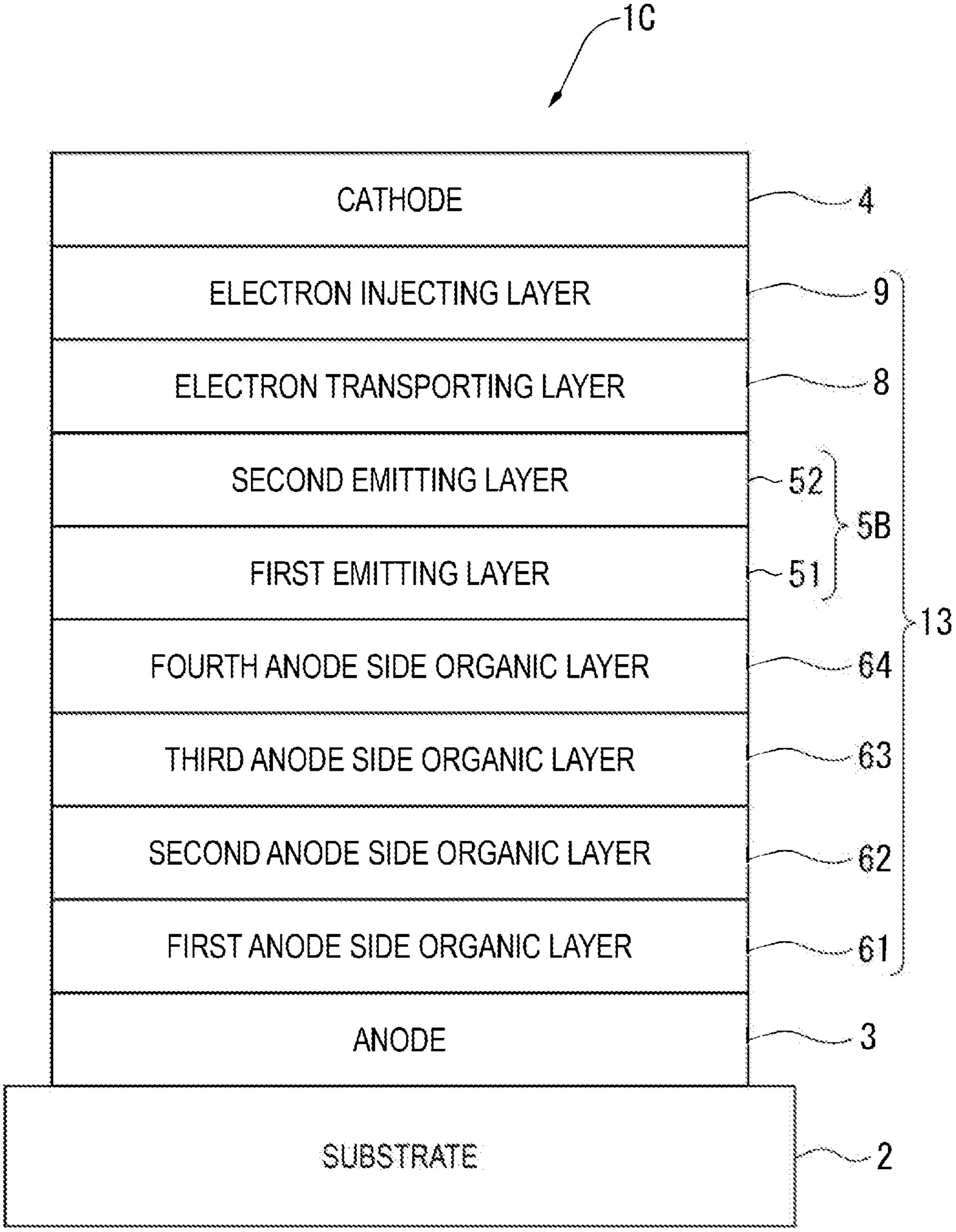

FIG. 6 schematically shows a still further exemplary arrangement of the organic arrangement of the organic electroluminescence display device according to the first exemplary embodiment of the invention.

Figure 7:
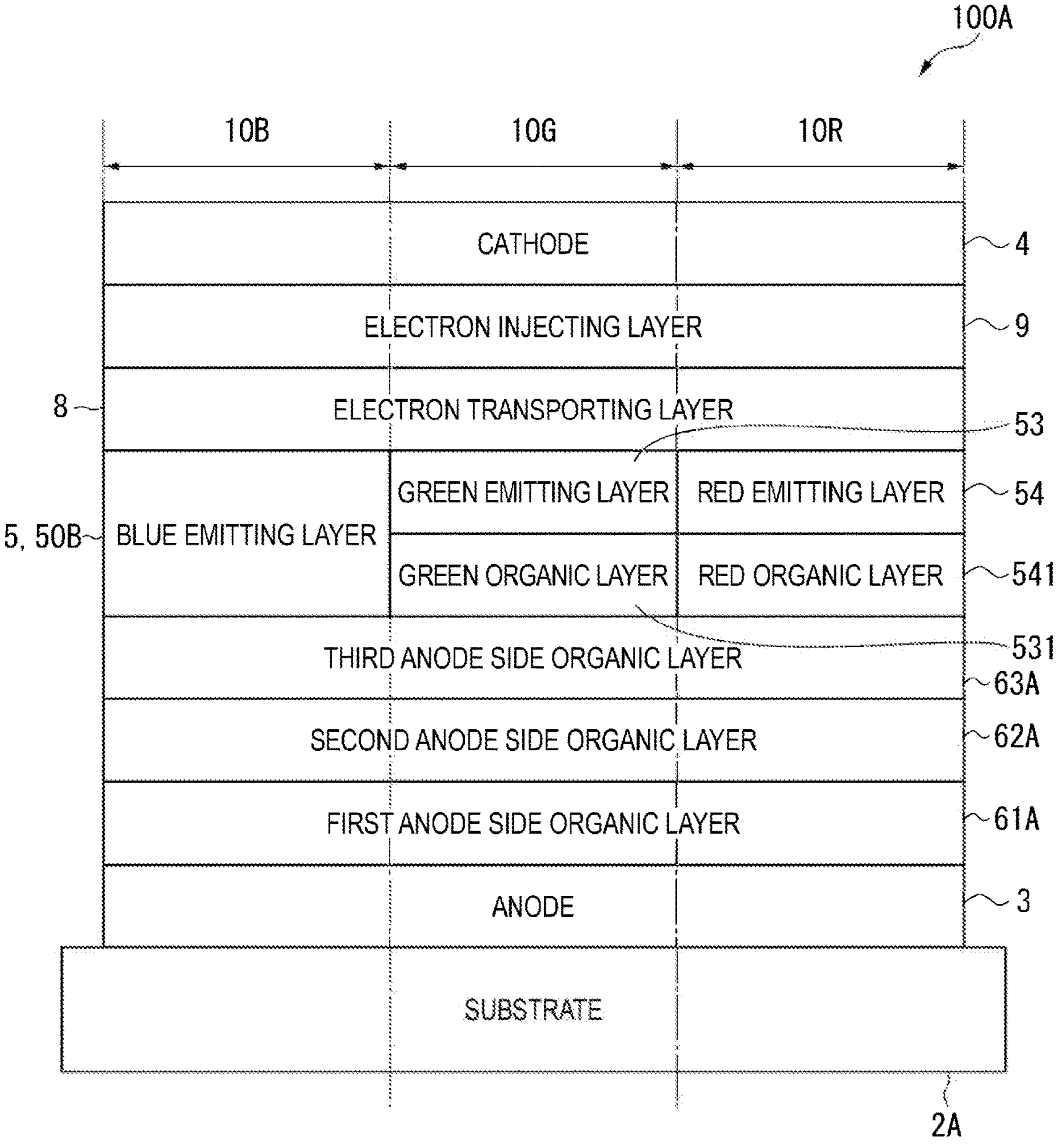

FIG. 7 schematically shows an exemplary arrangement of the organic electroluminescence display device according to the second exemplary embodiment of the invention.

Figure 8:
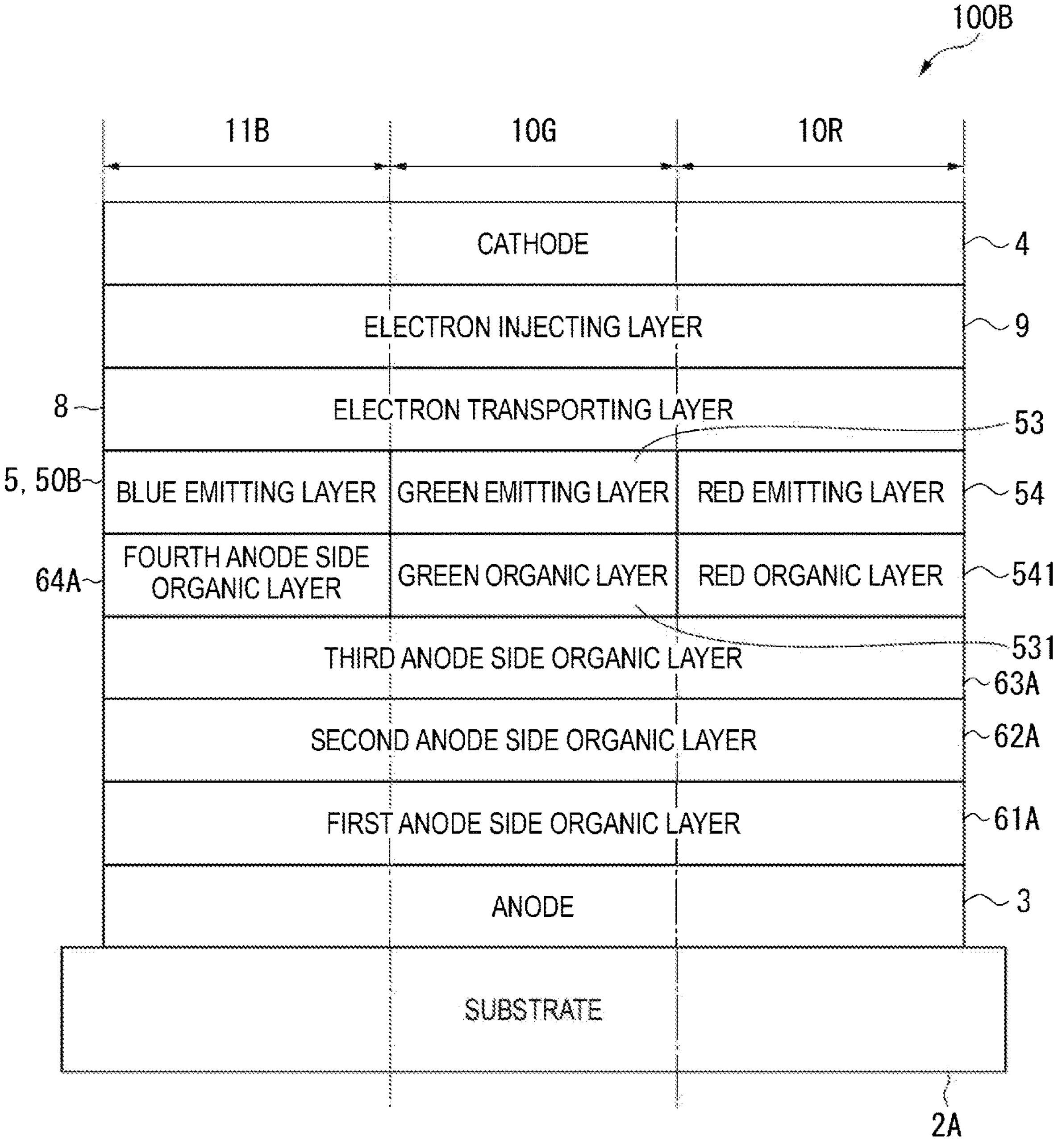

FIG. 8 schematically shows another exemplary arrangement of the organic electroluminescence display device according to the second exemplary embodiment.

Figure 9:
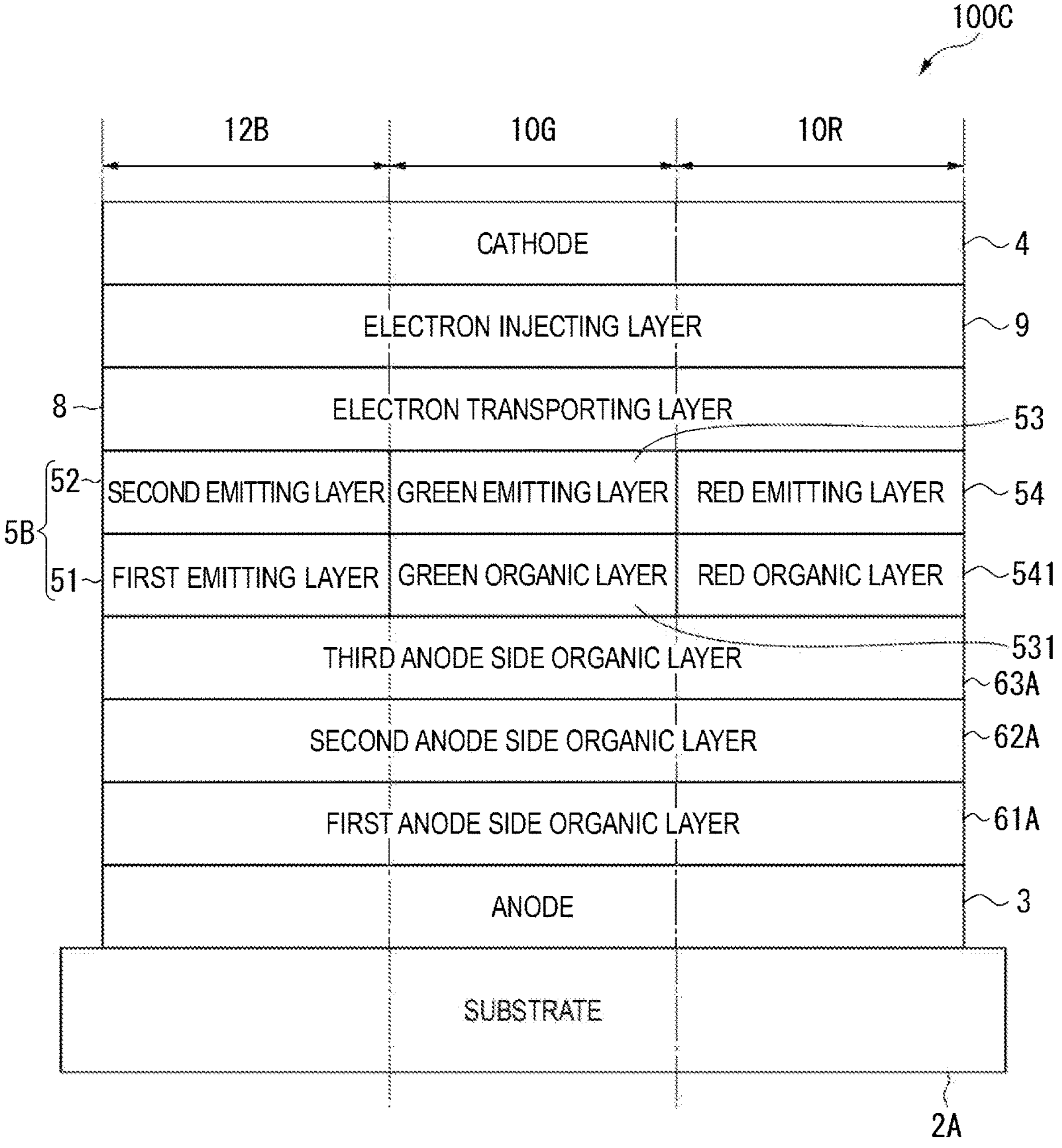

FIG. 9 schematically shows still another exemplary arrangement of the organic electroluminescence display device according to the second exemplary embodiment.

Figure 10:
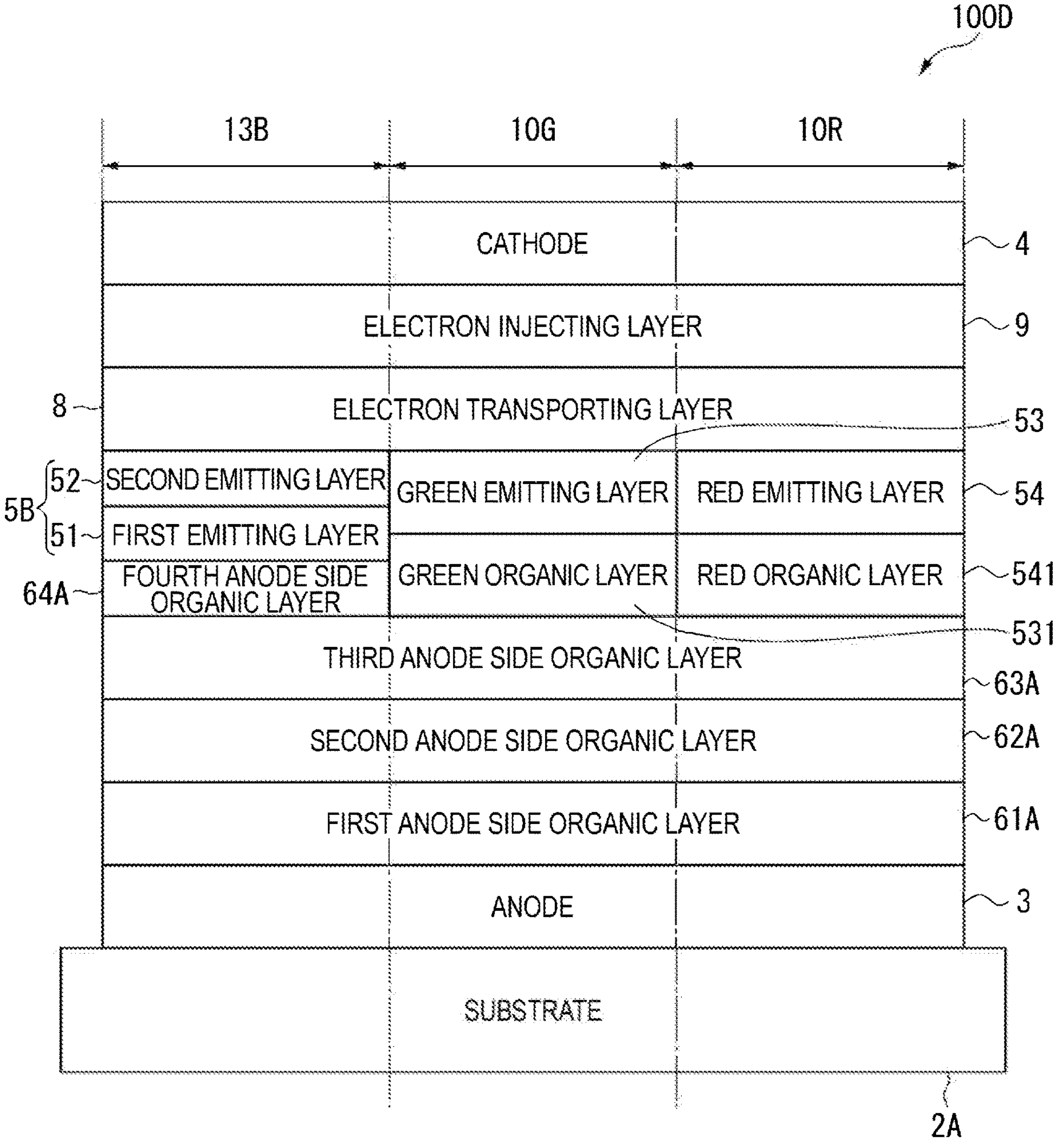

FIG. 10 schematically shows a further exemplary arrangement of the organic electroluminescence display device according to the second exemplary embodiment.

DESCRIPTION OF EMBODIMENT(S)

Definitions

Herein, a hydrogen atom includes isotope having different numbers of neutrons, specifically, protium, deuterium and tritium.

In chemical formulae herein, it is assumed that a hydrogen atom (i.e. protium, deuterium and tritium) is bonded to each of bondable positions that are not annexed with signs "R" or the like or "D" representing a deuterium.

Herein, the ring carbon atoms refer to the number of carbon atoms among atoms forming a ring of a compound (e.g., a monocyclic compound, fused-ring compound, cross-linking compound, carbon ring compound, and heterocyclic compound) in which the atoms are bonded with each other to form the ring. When the ring is substituted by a substituent(s), carbon atom(s) contained in the substituent(s) is not counted in the ring carbon atoms. Unless otherwise specified, the same applies to the "ring carbon atoms" described later. For instance, a benzene ring has 6 ring carbon atoms, a naphthalene ring has 10 ring carbon atoms, a pyridine ring has 5 ring carbon atoms, and a furan ring has 4 ring carbon atoms. Further, for instance, 9,9-diphenylfluorenyl group has 13 ring carbon atoms and 9,9'-spirobifluorenyl group has 25 ring carbon atoms.

When a benzene ring is substituted by a substituent in a form of, for instance, an alkyl group, the number of carbon atoms of the alkyl group is not counted in the number of the ring carbon atoms of the benzene ring. Accordingly, the benzene ring substituted by an alkyl group has 6 ring carbon atoms. When a naphthalene ring is substituted by a substituent in a form of, for instance, an alkyl group, the number of carbon atoms of the alkyl group is not counted in the number of the ring carbon atoms of the naphthalene ring. Accordingly, the naphthalene ring substituted by an alkyl group has 10 ring carbon atoms.

Herein, the ring atoms refer to the number of atoms forming a ring of a compound (e.g., a monocyclic compound, fused-ring compound, cross-linking compound, carbon ring compound, and heterocyclic compound) in which the atoms are bonded to each other to form the ring (e.g., monocyclic ring, fused ring, and ring assembly). Atom(s) not forming the ring (e.g., hydrogen atom(s) for saturating the valence of the atom which forms the ring) and atom(s) in a substituent by which the ring is substituted are not counted as the ring atoms. Unless otherwise specified, the same applies to the "ring atoms" described later. For instance, a pyridine ring has 6 ring atoms, a quinazoline ring has 10 ring atoms, and a furan ring has 5 ring atoms. For instance, the number of hydrogen atom(s) bonded to a pyridine ring or the number of atoms forming a substituent are not counted as the pyridine ring atoms. Accordingly, a pyridine ring bonded with a hydrogen atom(s) or a substituent(s) has 6 ring atoms. For instance, the hydrogen atom(s) bonded to carbon atom(s) of a quinazoline ring or the atoms forming a substituent are not counted as the quinazoline ring atoms. Accordingly, a quinazoline ring bonded with hydrogen atom(s) or a substituent(s) has 10 ring atoms.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX," "XX" representing an integer of 1 or more and "YY" representing an integer of 2 or more.

Herein, "XX to YY atoms" in the description of "substituted or unsubstituted ZZ group having XX to YY atoms" represent atoms of an unsubstituted ZZ group and do not include atoms of a substituent(s) of the substituted ZZ group. Herein, "YY" is larger than "XX," "XX" representing an integer of 1 or more and "YY" representing an integer of 2 or more.

Herein, an unsubstituted ZZ group refers to an "unsubstituted ZZ group" in a "substituted or unsubstituted ZZ group," and a substituted ZZ group refers to a "substituted ZZ group" in a "substituted or unsubstituted ZZ group."

Herein, the term "unsubstituted" used in a "substituted or unsubstituted ZZ group" means that a hydrogen atom(s) in the ZZ group is not substituted with a substituent(s). The hydrogen atom(s) in the “unsubstituted ZZ group” is protium, deuterium, or tritium.

Herein, the term “substituted” used in a “substituted or unsubstituted ZZ group” means that at least one hydrogen atom in the ZZ group is substituted with a substituent. Similarly, the term “substituted” used in a “BB group substituted by AA group” means that at least one hydrogen atom in the BB group is substituted with the AA group.

Substituents Mentioned Herein

Substituents mentioned herein will be described below.

An “unsubstituted aryl group” mentioned herein has, unless otherwise specified herein, 6 to 50, preferably 6 to 30, more preferably 6 to 18 ring carbon atoms.

An “unsubstituted heterocyclic group” mentioned herein has, unless otherwise specified herein, 5 to 50, preferably 5 to 30, more preferably 5 to 18 ring atoms.

An “unsubstituted alkyl group” mentioned herein has, unless otherwise specified herein, 1 to 50, preferably 1 to 20, more preferably 1 to 6 carbon atoms.

An “unsubstituted alkenyl group” mentioned herein has, unless otherwise specified herein, 2 to 50, preferably 2 to 20, more preferably 2 to 6 carbon atoms.

An “unsubstituted alkynyl group” mentioned herein has, unless otherwise specified herein, 2 to 50, preferably 2 to 20, more preferably 2 to 6 carbon atoms.

An “unsubstituted cycloalkyl group” mentioned herein has, unless otherwise specified herein, 3 to 50, preferably 3 to 20, more preferably 3 to 6 ring carbon atoms.

An “unsubstituted arylene group” mentioned herein has, unless otherwise specified herein, 6 to 50, preferably 6 to 30, more preferably 6 to 18 ring carbon atoms.

An “unsubstituted divalent heterocyclic group” mentioned herein has, unless otherwise specified herein, 5 to 50, preferably 5 to 30, more preferably 5 to 18 ring atoms.

An “unsubstituted alkylene group” mentioned herein has, unless otherwise specified herein, 1 to 50, preferably 1 to 20, more preferably 1 to 6 carbon atoms.

Substituted or Unsubstituted Aryl Group

Specific examples (specific example group G1) of the “substituted or unsubstituted aryl group” mentioned herein include unsubstituted aryl groups (specific example group G1A) below and substituted aryl groups (specific example group G1B) below. (Herein, an unsubstituted aryl group refers to an “unsubstituted aryl group” in a “substituted or unsubstituted aryl group,” and a substituted aryl group refers to a “substituted aryl group” in a “substituted or unsubstituted aryl group.” A simply termed “aryl group” herein includes both of an “unsubstituted aryl group” and a “substituted aryl group.”

The “substituted aryl group” refers to a group derived by substituting at least one hydrogen atom in an “unsubstituted aryl group” with a substituent. Examples of the “substituted aryl group” include a group derived by substituting at least one hydrogen atom in the “unsubstituted aryl group” in the specific example group G1A below with a substituent, and examples of the substituted aryl group in the specific example group G1B below. It should be noted that the examples of the “unsubstituted aryl group” and the “substituted aryl group” mentioned herein are merely exemplary, and the “substituted aryl group” mentioned herein includes a group derived by further substituting a hydrogen atom bonded to a carbon atom of a skeleton of a “substituted aryl group” in the specific example group G1B below, and a group derived by further substituting a hydrogen atom of a substituent of the “substituted aryl group” in the specific example group G1B below.

Unsubstituted Aryl Group (Specific Example Group G1A):

phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, benzanthryl group, phenanthryl group, benzophenanthryl group, phenalenyl group, pyrenyl group, chrysenyl group, benzochrysenyl group, triphenylenyl group, benzotriphenylenyl group, tetracenyl group, pentacenyl group, fluorenyl group, 9,9'-spirobifluorenyl group, benzofluorenyl group, dibenzofluorenyl group, fluoranthenyl group, benzofluoranthenyl group, a perylenyl group, and a monovalent aryl group derived by removing one hydrogen atom from cyclic structures represented by formulae (TEMP-1) to (TEMP-15) below.

(TEMP-1)

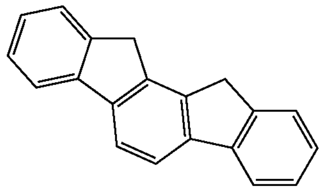

(TEMP-2)

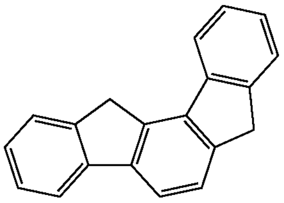

(TEMP-3)

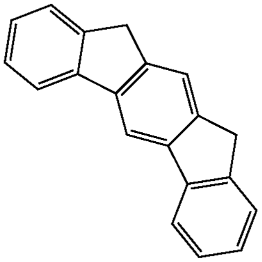

(TEMP-4)

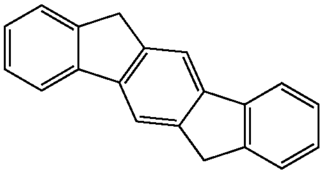

(TEMP-5)

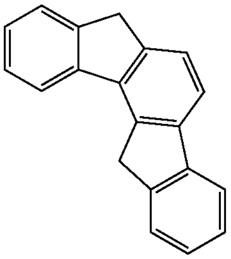

-continued (TEMP-6)

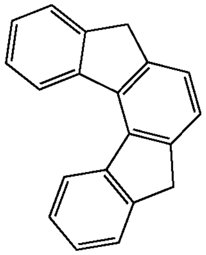

(TEMP-7)

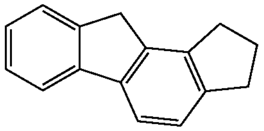

(TEMP-8)

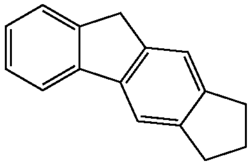

(TEMP-9)

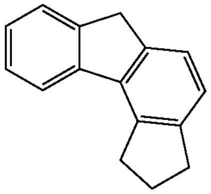

(TEMP-10)

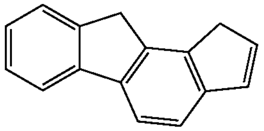

(TEMP-11)

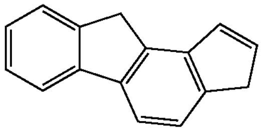

(TEMP-12)

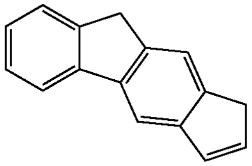

(TEMP-13)

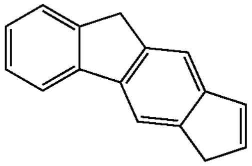

(TEMP-14)

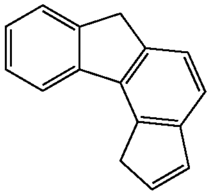

-continued (TEMP-15)

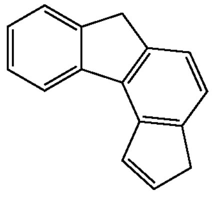

Substituted Aryl Group (Specific Example Group G1B):

o-tolyl group, m-tolyl group, p-tolyl group, para-xylyl group, meta-xylyl group, ortho-xylyl group, para-isopropylphenyl group, meta-isopropylphenyl group, ortho-isopropylphenyl group, para-t-butylphenyl group, meta-t-butylphenyl group, ortho-t-butylphenyl group, 3,4,5-trimethylphenyl group, 9,9-dimethylfluorenyl group, 9,9-diphenylfluorenyl group, 9,9-bis(4-methylphenyl)fluorenyl group, 9,9-bis(4-isopropylphenyl)fluorenyl group, 9,9-bis(4-t-butylphenyl)fluorenyl group, cyanophenyl group, triphenylsilylphenyl group, trimethylsilylphenyl group, phenylnaphthyl group, naphthylphenyl group, and a group derived by substituting at least one hydrogen atom of a monovalent group derived from the cyclic structures represented by the formulae (TEMP-1) to (TEMP-15) with a substituent.

Substituted or Unsubstituted Heterocyclic Group

The “heterocyclic group” mentioned herein refers to a cyclic group having at least one hetero atom in the ring atoms. Specific examples of the hetero atom include a nitrogen atom, oxygen atom, sulfur atom, silicon atom, phosphorus atom, and boron atom.

The “heterocyclic group” mentioned herein is a monocyclic group or a fused-ring group.

The “heterocyclic group” mentioned herein is an aromatic heterocyclic group or a non-aromatic heterocyclic group.

Specific examples (specific example group G2) of the “substituted or unsubstituted heterocyclic group” mentioned herein include unsubstituted heterocyclic groups (specific example group G2A) below and substituted heterocyclic groups (specific example group G2B) below. (Herein, an unsubstituted heterocyclic group refers to an “unsubstituted heterocyclic group” in a “substituted or unsubstituted heterocyclic group,” and a substituted heterocyclic group refers to a “substituted heterocyclic group” in a “substituted or unsubstituted heterocyclic group.”) A simply termed “heterocyclic group” herein includes both of “unsubstituted heterocyclic group” and “substituted heterocyclic group.”

The “substituted heterocyclic group” refers to a group derived by substituting at least one hydrogen atom in an “unsubstituted heterocyclic group” with a substituent. Specific examples of the “substituted heterocyclic group” include a group derived by substituting at least one hydrogen atom in the “unsubstituted heterocyclic group” in the specific example group G2A below with a substituent, and examples of the substituted heterocyclic group in the specific example group G2B below. It should be noted that the examples of the “unsubstituted heterocyclic group” and the “substituted heterocyclic group” mentioned herein are merely exemplary, and the “substituted heterocyclic group” mentioned herein includes a group derived by further substituting a hydrogen atom bonded to a ring atom of a skeleton of a “substituted heterocyclic group” in the specific example group G2B below, and a group derived by further substituting a hydrogen atom of a substituent of the "substituted heterocyclic group" in the specific example group G2B below.

The specific example group G2A includes, for instance, unsubstituted heterocyclic groups including a nitrogen atom (specific example group G2A1) below, unsubstituted heterocyclic groups including an oxygen atom (specific example group G2A2) below, unsubstituted heterocyclic groups including a sulfur atom (specific example group G2A3) below, and monovalent heterocyclic groups (specific example group G2A4) derived by removing a hydrogen atom from cyclic structures represented by formulae (TEMP-16) to (TEMP-33) below.

The specific example group G2B includes, for instance, substituted heterocyclic groups including a nitrogen atom (specific example group G2B1) below, substituted heterocyclic groups including an oxygen atom (specific example group G2B2) below, substituted heterocyclic groups including a sulfur atom (specific example group G2B3) below, and groups derived by substituting at least one hydrogen atom of the monovalent heterocyclic groups (specific example group G2B4) derived from the cyclic structures represented by formulae (TEMP-16) to (TEMP-33) below.

Unsubstituted Heterocyclic Groups Including Nitrogen Atom (Specific Example Group G2A1):

pyrrolyl group, imidazolyl group, pyrazolyl group, triazolyl group, tetrazolyl group, oxazolyl group, isoxazolyl group, oxadiazolyl group, thiazolyl group, isothiazolyl group, thiadiazolyl group, pyridyl group, pyridazynyl group, pyrimidinyl group, pyrazinyl group, triazinyl group, indolyl group, isoindolyl group, indolizinyl group, quinolizinyl group, quinolyl group, isoquinolyl group, cinnolyl group, phthalazinyl group, quinazolinyl group, quinoxalinyl group, benzimidazolyl group, indazolyl group, phenanthrolinyl group, phenanthridinyl group, acridinyl group, phenazinyl group, carbazolyl group, benzocarbazolyl group, morpholino group, phenoxazinyl group, phenothiazinyl group, azacarbazolyl group, and diazacarbazolyl group.

Unsubstituted Heterocyclic Groups Including Oxygen Atom (Specific Example Group G2A2):

furyl group, oxazolyl group, isoxazolyl group, oxadiazolyl group, xanthenyl group, benzofuranyl group, isobenzofuranyl group, dibenzofuranyl group, naphthobenzofuranyl group, benzoxazolyl group, benzisoxazolyl group, phenoxazinyl group, morpholino group, dinaphthofuranyl group, azadibenzofuranyl group, diazadibenzofuranyl group, azanaphthobenzofuranyl group, and diazanaphthobenzofuranyl group.

Unsubstituted Heterocyclic Groups Including Sulfur Atom (Specific Example Group G2A3):

thienyl group, thiazolyl group, isothiazolyl group, thiadiazolyl group, benzothiophenyl group (benzothienyl group), isobenzothiophenyl group (isobenzothienyl group), dibenzothiophenyl group (dibenzothienyl group), naphthobenzothiophenyl group (nahthobenzothienyl group), benzothiazolyl group, benzisothiazolyl group, phenothiazinyl group, dinaphthothiophenyl group (dinaphthothienyl group), azadibenzothiophenyl group (azadibenzothienyl group), diazadibenzothiophenyl group (diazadibenzothienyl group), azanaphthobenzothiophenyl group (azanaphthobenzothienyl group), and diazanaphthobenzothiophenyl group (diazanaphthobenzothienyl group).

Monovalent Heterocyclic Groups Derived by Removing One Hydrogen Atom from Cyclic Structures Represented by Formulae (TEMP-16) to (TEMP-33) (Specific Example Group G2A4):

(TEMP-16)

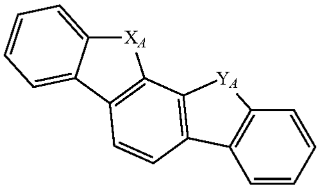

(TEMP-17)

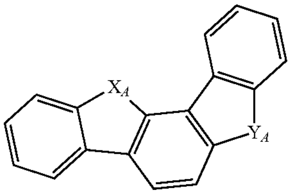

(TEMP-18)

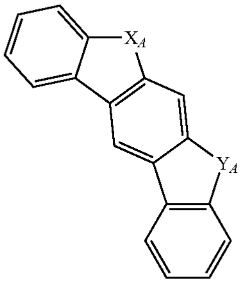

(TEMP-19)

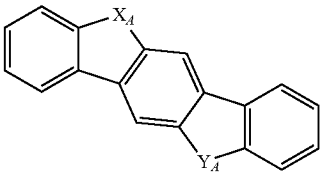

(TEMP-20)

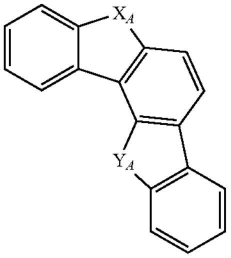

(TEMP-21)

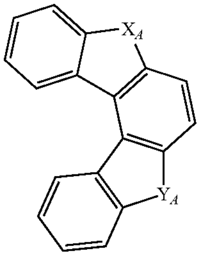

(TEMP-22)

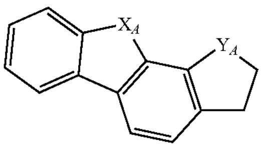

-continued

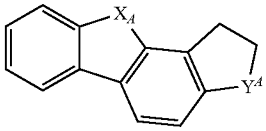

(TEMP-23)

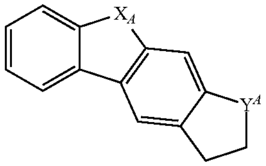

(TEMP-24)

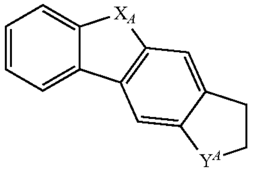

(TEMP-25)

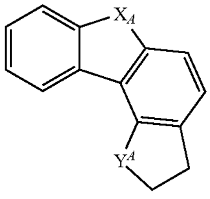

(TEMP-26)

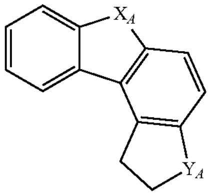

(TEMP-27)

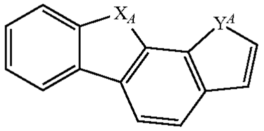

(TEMP-28)

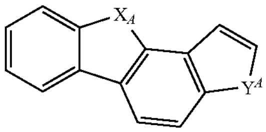

(TEMP-29)

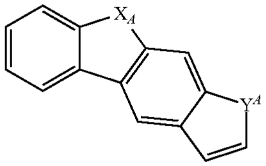

(TEMP-30)

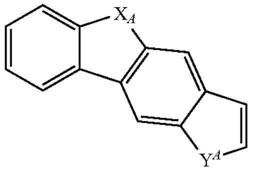

(TEMP-31)

-continued (TEMP-32)

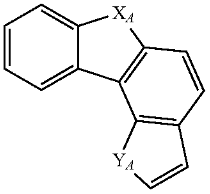

(TEMP-33)

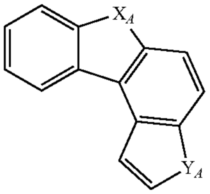

In the formulae (TEMP-16) to (TEMP-33), $X_A$ and $Y_A$ are each independently an oxygen atom, a sulfur atom, NH, or $CH_2$. However, at least one of $X_A$ or $Y_A$ is an oxygen atom, a sulfur atom, or NH.

When at least one of $X_A$ or $Y_A$ in the formulae (TEMP-16) to (TEMP-33) is NH or $CH_2$, the monovalent heterocyclic groups derived from the cyclic structures represented by the formulae (TEMP-16) to (TEMP-33) include a monovalent group derived by removing one hydrogen atom from NH, or $CH_2$.

Substituted Heterocyclic Groups Including Nitrogen Atom (Specific Example Group G2B1):

(9-phenyl)carbazolyl group, (9-biphenylyl)carbazolyl group, (9-phenyl)phenylcarbazolyl group, (9-naphthyl)carbazolyl group, diphenylcarbazole-9-yl group, phenylcarbazole-9-yl group, methylbenzimidazolyl group, ethylbenzimidazolyl group, phenyltriazinyl group, biphenylyltriazinyl group, diphenyltriazinyl group, phenylquinazolinyl group, and biphenylquinazolinyl group.

Substituted Heterocyclic Groups Including Oxygen Atom (Specific Example Group G2B2):

phenyldibenzofuranyl group, methyldibenzofuranyl group, t-butyldibenzofuranyl group, and monovalent residue of spiro[9H-xanthene-9,9'-[9H]fluorene].

Substituted Heterocyclic Groups Including Sulfur Atom (Specific Example Group G2B3):

phenyldibenzothiophenyl group, methyldibenzothiophenyl group, t-butyldibenzothiophenyl group, and monovalent residue of spiro[9H-thioxanthene-9,9'-[9H]fluorene].

Groups Obtained by Substituting at Least One Hydrogen Atom of Monovalent Heterocyclic Group Derived from Cyclic Structures Represented by Formulae (TEMP-16) to (TEMP-33) with Substituent (Specific Example Group G2B4):

The "at least one hydrogen atom of a monovalent heterocyclic group" means at least one hydrogen atom selected from a hydrogen atom bonded to a ring carbon atom of the monovalent heterocyclic group, a hydrogen atom bonded to a nitrogen atom of at least one of $X_A$ or $Y_A$ in a form of NH, and a hydrogen atom of one of $X_A$ and $Y_A$ in a form of a methylene group ($CH_2$).

Substituted or Unsubstituted Alkyl Group

Specific examples (specific example group G3) of the "substituted or unsubstituted alkyl group" mentioned herein include unsubstituted alkyl groups (specific example group G3A) below and substituted alkyl groups (specific example group G3B) below. (Herein, an unsubstituted alkyl group refers to an "unsubstituted alkyl group" in a "substituted or unsubstituted alkyl group," and a substituted alkyl group refers to a "substituted alkyl group" in a "substituted or unsubstituted alkyl group.") A simply termed "alkyl group" herein includes both of "unsubstituted alkyl group" and "substituted alkyl group."

The "substituted alkyl group" refers to a group derived by substituting at least one hydrogen atom in an "unsubstituted alkyl group" with a substituent. Specific examples of the "substituted alkyl group" include a group derived by substituting at least one hydrogen atom of an "unsubstituted alkyl group" (specific example group G3A) below with a substituent, and examples of the substituted alkyl group (specific example group G3B) below. Herein, the alkyl group for the "unsubstituted alkyl group" refers to a chain alkyl group. Accordingly, the "unsubstituted alkyl group" include linear "unsubstituted alkyl group" and branched "unsubstituted alkyl group." It should be noted that the examples of the "unsubstituted alkyl group" and the "substituted alkyl group" mentioned herein are merely exemplary, and the "substituted alkyl group" mentioned herein includes a group derived by further substituting a hydrogen atom bonded to a carbon atom of a skeleton of the "substituted alkyl group" in the specific example group G3B, and a group derived by further substituting a hydrogen atom of a substituent of the "substituted alkyl group" in the specific example group G3B.

Unsubstituted Alkyl Group (Specific Example Group G3A):

methyl group, ethyl group, n-propyl group, isopropyl group, n-butyl group, isobutyl group, s-butyl group, and t-butyl group.

Substituted Alkyl Group (Specific Example Group G3B):

heptafluoropropyl group (including isomer thereof), pentafluoroethyl group, 2,2,2-trifluoroethyl group, and trifluoromethyl group.

Substituted or Unsubstituted Alkenyl Group

Specific examples (specific example group G4) of the "substituted or unsubstituted alkenyl group" mentioned herein include unsubstituted alkenyl groups (specific example group G4A) and substituted alkenyl groups (specific example group G4B). (Herein, an unsubstituted alkenyl group refers to an "unsubstituted alkenyl group" in a "substituted or unsubstituted alkenyl group," and a substituted alkenyl group refers to a "substituted alkenyl group" in a "substituted or unsubstituted alkenyl group.") A simply termed "alkenyl group" herein includes both of "unsubstituted alkenyl group" and "substituted alkenyl group."

The "substituted alkenyl group" refers to a group derived by substituting at least one hydrogen atom in an "unsubstituted alkenyl group" with a substituent. Specific examples of the "substituted alkenyl group" include an "unsubstituted alkenyl group" (specific example group G4A) substituted by a substituent, and examples of the substituted alkenyl group (specific example group G4B) below. It should be noted that the examples of the "unsubstituted alkenyl group" and the "substituted alkenyl group" mentioned herein are merely exemplary, and the "substituted alkenyl group" mentioned herein includes a group derived by further substituting a hydrogen atom of a skeleton of the "substituted alkenyl group" in the specific example group G4B with a substituent, and a group derived by further substituting a hydrogen atom of a substituent of the "substituted alkenyl group" in the specific example group G4B with a substituent.

Unsubstituted Alkenyl Group (Specific Example Group G4A):

vinyl group, allyl group, 1-butenyl group, 2-butenyl group, and 3-butenyl group.

Substituted Alkenyl Group (Specific Example Group G4B):

1,3-butanedienyl group, 1-methylvinyl group, 1-methylallyl group, 1,1-dimethylallyl group, 2-methylallyl group, and 1,2-dimethylallyl group.

Substituted or Unsubstituted Alkynyl Group

Specific examples (specific example group G5) of the "substituted or unsubstituted alkynyl group" mentioned herein include unsubstituted alkynyl groups (specific example group G5A) below. (Herein, an unsubstituted alkynyl group refers to an "unsubstituted alkynyl group" in a "substituted or unsubstituted alkynyl group".) A simply termed "alkynyl group" herein includes both of "unsubstituted alkynyl group" and "substituted alkynyl group."

The "substituted alkynyl group" refers to a group derived by substituting at least one hydrogen atom in an "unsubstituted alkynyl group" with a substituent. Specific examples of the "substituted alkynyl group" include a group derived by substituting at least one hydrogen atom of the "unsubstituted alkynyl group" (specific example group G5A) below with a substituent.

Unsubstituted Alkynyl Group (Specific Example Group G5A): Ethynyl Group.

Substituted or Unsubstituted Cycloalkyl Group

Specific examples (specific example group G6) of the "substituted or unsubstituted cycloalkyl group" mentioned herein include unsubstituted cycloalkyl groups (specific example group G6A) and substituted cycloalkyl groups (specific example group G6B). (Herein, an unsubstituted cycloalkyl group refers to an "unsubstituted cycloalkyl group" in a "substituted or unsubstituted cycloalkyl group," and a substituted cycloalkyl group refers to a "substituted cycloalkyl group" in a "substituted or unsubstituted cycloalkyl group.") A simply termed "cycloalkyl group" herein includes both of "unsubstituted cycloalkyl group" and "substituted cycloalkyl group."

The "substituted cycloalkyl group" refers to a group derived by substituting at least one hydrogen atom of an "unsubstituted cycloalkyl group" with a substituent. Specific examples of the "substituted cycloalkyl group" include a group derived by substituting at least one hydrogen atom of the "unsubstituted cycloalkyl group" (specific example group G6A) below with a substituent, and examples of the substituted cycloalkyl group (specific example group G6B) below. It should be noted that the examples of the "unsubstituted cycloalkyl group" and the "substituted cycloalkyl group" mentioned herein are merely exemplary, and the "substituted cycloalkyl group" mentioned herein includes a group derived by substituting at least one hydrogen atom bonded to a carbon atom of a skeleton of the "substituted cycloalkyl group" in the specific example group G6B with a substituent, and a group derived by further substituting a hydrogen atom of a substituent of the "substituted cycloalkyl group" in the specific example group G6B with a substituent.

Unsubstituted Cycloalkyl Group (Specific Example Group G6A):

cyclopropyl group, cyclobutyl group, cyclopentyl group, cyclohexyl group, 1-adamantyl group, 2-adamantyl group, 1-norbornyl group, and 2-norbornyl group. Substituted Cycloalkyl Group (Specific Example Group G6B): 4-methylcyclohexyl group.

Group Represented by $-Si(R_{901})(R_{902})(R_{903})$

Specific examples (specific example group G7) of the group represented herein by $-Si(R_{901})(R_{902})(R_{903})$ include: $-Si(G1)(G1)(G1)$; $-Si(G1)(G2)(G2)$; $-Si(G1)(G1)(G2)$; $-Si(G2)(G2)(G2)$; $-Si(G3)(G3)(G3)$; and $-Si(G6)(G6)(G6)$. Herein: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

A plurality of G1 in —Si(G1)(G1)(G1) are mutually the same or different.

A plurality of G2 in —Si(G1)(G2)(G2) are mutually the same or different.

A plurality of G1 in —Si(G1)(G1)(G2) are mutually the same or different.

A plurality of G2 in —Si(G2)(G2)(G2) are mutually the same or different.

A plurality of G3 in —Si(G3)(G3)(G3) are mutually the same or different.

A plurality of G6 in —Si(G6)(G6)(G6) are mutually the same or different.

Group Represented by —O—($R_{904}$)

Specific examples (specific example group G8) of a group represented by —O—($R_{904}$) herein include —O(G1); —O(G2); —O(G3); and —O(G6).

Herein: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —S—($R_{905}$)

Specific examples (specific example group G9) of a group represented herein by —S—($R_{905}$) include: —S(G1); —S(G2); —S(G3); and —S(G6).

Herein: G1 represents a "substituted or unsubstituted aryl group" in the specific example group G1;

G2 represents a "substituted or unsubstituted heterocyclic group" in the specific example group G2; G3 represents a "substituted or unsubstituted alkyl group" in the specific example group G3; and G6 represents a "substituted or unsubstituted cycloalkyl group" in the specific example group G6.

Group Represented by —N($R_{906}$)($R_{907}$)

Specific examples (specific example group G10) of a group represented herein by —N($R_{906}$)($R_{907}$) include: —N(G1)(G1); —N(G2)(G2); —N(G1)(G2); —N(G3)(G3); and —N(G6)(G6).

Herein: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

A plurality of G1 in —N(G1)(G1) are mutually the same or different.

A plurality of G2 in —N(G2)(G2) are mutually the same or different.

A plurality of G3 in —N(G3)(G3) are mutually the same or different.

A plurality of G6 in —N(G6)(G6) are mutually the same or different.

Halogen Atom

Specific examples (specific example group G11) of "halogen atom" mentioned herein include a fluorine atom, chlorine atom, bromine atom, and iodine atom.

Substituted or Unsubstituted Fluoroalkyl Group

The "substituted or unsubstituted fluoroalkyl group" mentioned herein refers to a group derived by substituting at least one hydrogen atom bonded to at least one of carbon atoms forming an alkyl group in the "substituted or unsubstituted alkyl group" with a fluorine atom, and also includes a group (perfluoro group) derived by substituting all of hydrogen atoms bonded to carbon atoms forming the alkyl group in the "substituted or unsubstituted alkyl group" with fluorine atoms. An "unsubstituted fluoroalkyl group" has, unless otherwise specified herein, 1 to 50, preferably 1 to 30, more preferably 1 to 18 carbon atoms. The "substituted fluoroalkyl group" refers to a group derived by substituting at least one hydrogen atom in a "fluoroalkyl group" with a substituent. It should be noted that the examples of the "substituted fluoroalkyl group" mentioned herein include a group derived by further substituting at least one hydrogen atom bonded to a carbon atom of an alkyl chain of a "substituted fluoroalkyl group" with a substituent, and a group derived by further substituting at least one hydrogen atom of a substituent of the "substituted fluoroalkyl group" with a substituent. Specific examples of the "substituted fluoroalkyl group" include a group derived by substituting at least one hydrogen atom of the "alkyl group" (specific example group G3) with a fluorine atom.

Substituted or Unsubstituted Haloalkyl Group

The "substituted or unsubstituted haloalkyl group" mentioned herein refers to a group derived by substituting at least one hydrogen atom bonded to carbon atoms forming the alkyl group in the "substituted or unsubstituted alkyl group" with a halogen atom, and also includes a group derived by substituting all hydrogen atoms bonded to carbon atoms forming the alkyl group in the "substituted or unsubstituted alkyl group" with halogen atoms. An "unsubstituted haloalkyl group" has, unless otherwise specified herein, 1 to 50, preferably 1 to 30, more preferably 1 to 18 carbon atoms. The "substituted haloalkyl group" refers to a group derived by substituting at least one hydrogen atom in a "haloalkyl group" with a substituent. It should be noted that the examples of the "substituted haloalkyl group" mentioned herein include a group derived by further substituting at least one hydrogen atom bonded to a carbon atom of an alkyl chain of a "substituted haloalkyl group" with a substituent, and a group derived by further substituting at least one hydrogen atom of a substituent of the "substituted haloalkyl group" with a substituent. Specific examples of the "substituted haloalkyl group" include a group derived by substituting at least one hydrogen atom of the "alkyl group" (specific example group G3) with a halogen atom. The haloalkyl group is sometimes referred to as a halogenated alkyl group.

Substituted or Unsubstituted Alkoxy Group

Specific examples of a "substituted or unsubstituted alkoxy group" mentioned herein include a group represented by —O(G3), G3 being the "substituted or unsubstituted alkyl group" in the specific example group G3. An "unsubstituted alkoxy group" has, unless otherwise specified herein, 1 to 50, preferably 1 to 30, more preferably 1 to 18 carbon atoms.

Substituted or Unsubstituted Alkylthio Group

Specific examples of a "substituted or unsubstituted alkylthio group" mentioned herein include a group represented by —S(G3), G3 being the "substituted or unsubstituted alkyl group" in the specific example group G3. An "unsubstituted alkylthio group" has, unless otherwise specified herein, 1 to 50, preferably 1 to 30, more preferably 1 to 18 carbon atoms.

Substituted or Unsubstituted Aryloxy Group

Specific examples of a "substituted or unsubstituted aryloxy group" mentioned herein include a group represented by —O(G1), G1 being the "substituted or unsubstituted aryl group" in the specific example group G1. An "unsubstituted aryloxy group" has, unless otherwise specified herein, 6 to 50, preferably 6 to 30, more preferably 6 to 18 ring carbon atoms.

Substituted or Unsubstituted Arylthio Group

Specific examples of a "substituted or unsubstituted arylthio group" mentioned herein include a group represented by —S(G1), G1 being the "substituted or unsubstituted aryl group" in the specific example group G1. An "unsubstituted arylthio group" has, unless otherwise specified herein, 6 to 50, preferably 6 to 30, more preferably 6 to 18 ring carbon atoms.

Substituted or Unsubstituted Trialkylsilyl Group

Specific examples of a "trialkylsilyl group" mentioned herein include a group represented by —Si(G3)(G3)(G3), G3 being the "substituted or unsubstituted alkyl group" in the specific example group G3. The plurality of G3 in —Si(G3)(G3)(G3) are mutually the same or different. Each of the alkyl groups in the "trialkylsilyl group" has, unless otherwise specified herein, 1 to 50, preferably 1 to 20, more preferably 1 to 6 carbon atoms.

Substituted or Unsubstituted Aralkyl Group

Specific examples of a "substituted or unsubstituted aralkyl group" mentioned herein include a group represented by (G3)-(G1), G3 being the "substituted or unsubstituted alkyl group" in the specific example group G3, G1 being the "substituted or unsubstituted aryl group" in the specific example group G1. Accordingly, the "aralkyl group" is a group derived by substituting a hydrogen atom of the "alkyl group" with a substituent in a form of the "aryl group," which is an example of the "substituted alkyl group." An "unsubstituted aralkyl group," which is an "unsubstituted alkyl group" substituted by an "unsubstituted aryl group," has, unless otherwise specified herein, 7 to 50 carbon atoms, preferably 7 to 30 carbon atoms, more preferably 7 to 18 carbon atoms.

Specific examples of the "substituted or unsubstituted aralkyl group" include a benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, and 2-β-naphthylisopropyl group.

Preferable examples of the substituted or unsubstituted aryl group mentioned herein include, unless otherwise specified herein, a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, phenanthryl group, pyrenyl group, chrysenyl group, triphenylenyl group, fluorenyl group, 9,9'-spirobifluorenyl group, 9,9-dimethylfluorenyl group, and 9,9-diphenylfluorenyl group.

Preferable examples of the substituted or unsubstituted heterocyclic group mentioned herein include, unless otherwise specified herein, a pyridyl group, pyrimidinyl group, triazinyl group, quinolyl group, isoquinolyl group, quinazolinyl group, benzimidazolyl group, phenanthrolinyl group, carbazolyl group (1-carbazolyl group, 2-carbazolyl group, 3-carbazolyl group, 4-carbazolyl group, or 9-carbazolyl group), benzocarbazolyl group, azacarbazolyl group, diazacarbazolyl group, dibenzofuranyl group, naphthobenzofuranyl group, azadibenzofuranyl group, diazadibenzofuranyl group, dibenzothiophenyl group, naphthobenzothiophenyl group, azadibenzothiophenyl group, diazadibenzothiophenyl group, (9-phenyl)carbazolyl group ((9-phenyl)carbazole-1-yl group, (9-phenyl)carbazole-2-yl group, (9-phenyl)carbazole-3-yl group, or (9-phenyl)carbazole-4-yl group), (9-biphenylyl)carbazolyl group, (9-phenyl)phenylcarbazolyl group, diphenylcarbazole-9-yl group, phenylcarbazole-9-yl group, phenyltriazinyl group, biphenylyltriazinyl group, diphenyltriazinyl group, phenyldibenzofuranyl group, and phenyldibenzothiophenyl group.

The carbazolyl group mentioned herein is, unless otherwise specified herein, specifically a group represented by one of formulae below.

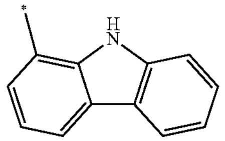

(TEMP-Cz1)

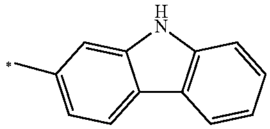

(TEMP-Cz2)

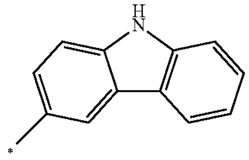

(TEMP-Cz3)

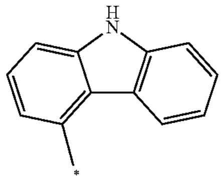

(TEMP-Cz3)

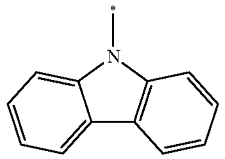

(TEMP-Cz5)

The (9-phenyl)carbazolyl group mentioned herein is, unless otherwise specified herein, specifically a group represented by one of formulae below.

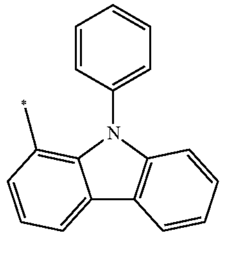

(TEMP-Cz6)

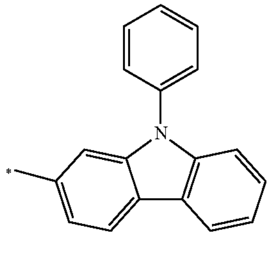

(TEMP-Cz7)

-continued

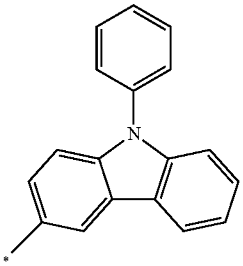

(TEMP-Cz8)

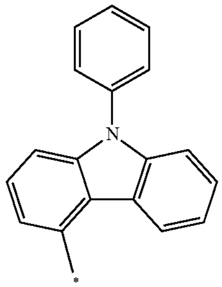

(TEMP-Cz9)

In the formulae (TEMP-Cz1) to (TEMP-Cz9), * represents a bonding position.

The dibenzofuranyl group and dibenzothiophenyl group mentioned herein are, unless otherwise specified herein, each specifically represented by one of formulae below.

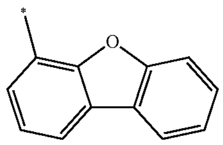

(TEMP-34)

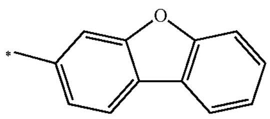

(TEMP-35)

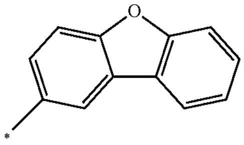

(TEMP-36)

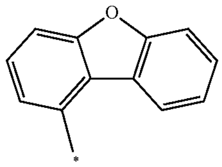

(TEMP-37)

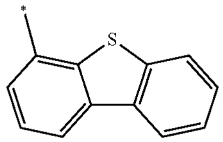

(TEMP-38)

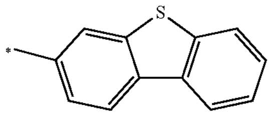

(TEMP-39)

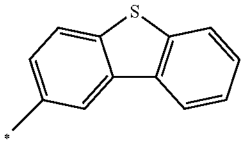

(TEMP-40)

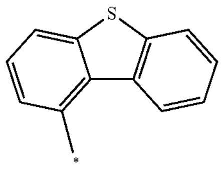

(TEMP-41)

In the formulae (TEMP-34) to (TEMP-41), * represents a bonding position.

Preferable examples of the substituted or unsubstituted alkyl group mentioned herein include, unless otherwise specified herein, a methyl group, ethyl group, propyl group, isopropyl group, n-butyl group, isobutyl group, and t-butyl group.

Substituted or Unsubstituted Arylene Group

The "substituted or unsubstituted arylene group" mentioned herein is, unless otherwise specified herein, a divalent group derived by removing one hydrogen atom on an aryl ring of the "substituted or unsubstituted aryl group." Specific examples of the "substituted or unsubstituted arylene group" (specific example group G12) include a divalent group derived by removing one hydrogen atom on an aryl ring of the "substituted or unsubstituted aryl group" in the specific example group G1.

Substituted or Unsubstituted Divalent Heterocyclic Group

The "substituted or unsubstituted divalent heterocyclic group" mentioned herein is, unless otherwise specified herein, a divalent group derived by removing one hydrogen atom on a heterocyclic ring of the "substituted or unsubstituted heterocyclic group." Specific examples of the "substituted or unsubstituted divalent heterocyclic group" (specific example group G13) include a divalent group derived by removing one hydrogen atom on a heterocyclic ring of the "substituted or unsubstituted heterocyclic group" in the specific example group G2.

Substituted or Unsubstituted Alkylene Group

The "substituted or unsubstituted alkylene group" mentioned herein is, unless otherwise specified herein, a divalent group derived by removing one hydrogen atom on an alkyl chain of the "substituted or unsubstituted alkyl group." Specific examples of the "substituted or unsubstituted alkylene group" (specific example group G14) include a divalent group derived by removing one hydrogen atom on an alkyl chain of the "substituted or unsubstituted alkyl group" in the specific example group G3.

The substituted or unsubstituted arylene group mentioned herein is, unless otherwise specified herein, preferably any one of groups represented by formulae (TEMP-42) to (TEMP-68) below.

(TEMP-42)

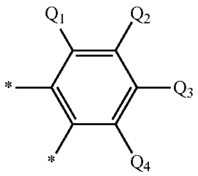

(TEMP-43)

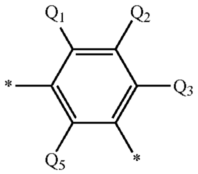

(TEMP-44)

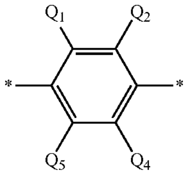

(TEMP-45)

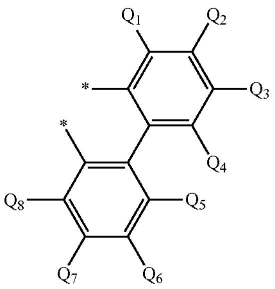

-continued
(TEMP-46)
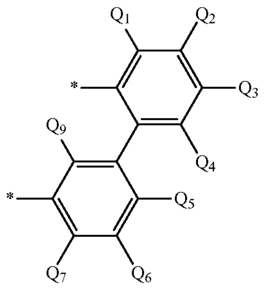
(TEMP-47)
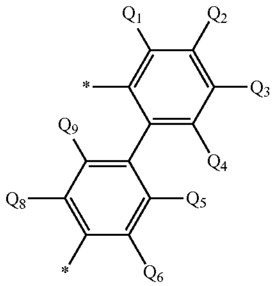
(TEMP-48)
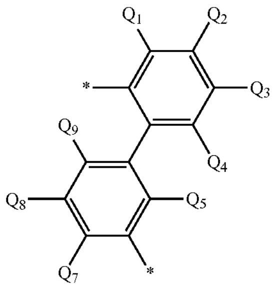
(TEMP-49)
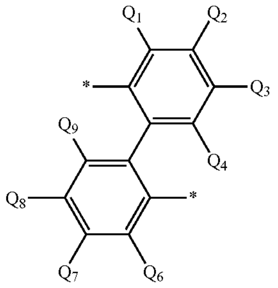
(TEMP-50)
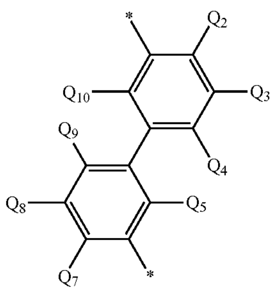
-continued
(TEMP-51)
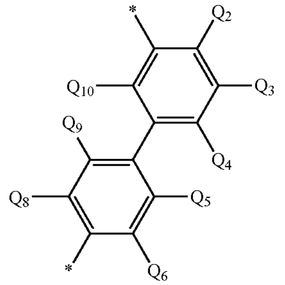
(TEMP-52)
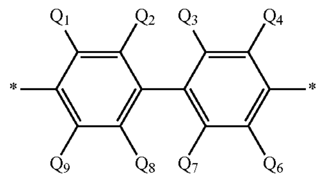
In the formulae (TEMP-42) to (TEMP-52), $Q_1$ to $Q_{10}$ each independently are a hydrogen atom or a substituent.
In the formulae (TEMP-42) to (TEMP-52), * represents a bonding position.
(TEMP-53)
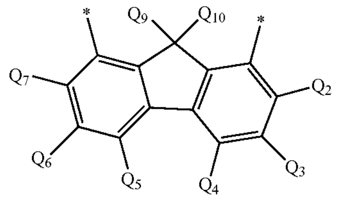
(TEMP-54)
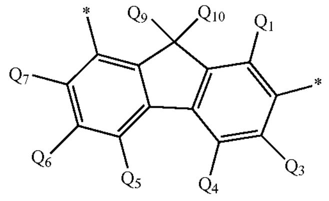
(TEMP-55)
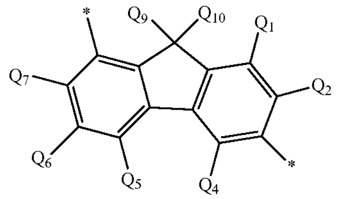
(TEMP-56)
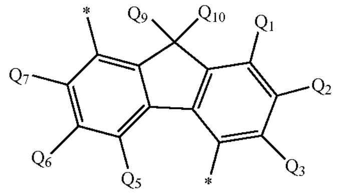

-continued (TEMP-57)

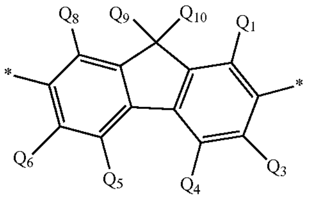

(TEMP-58)

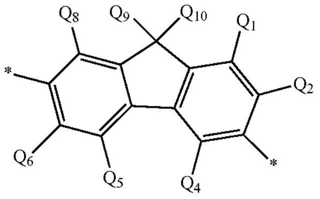

(TEMP-59)

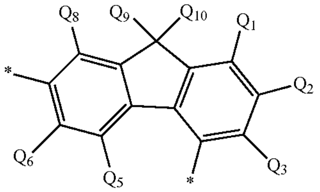

(TEMP-60)

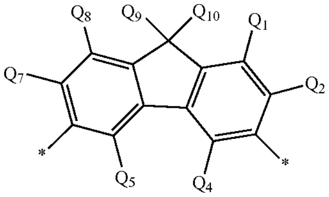

(TEMP-61)

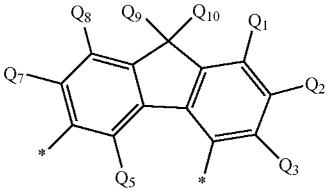

(TEMP-62)

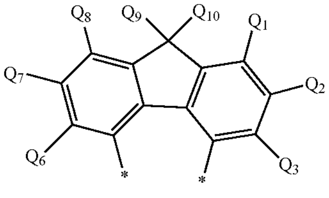

In the formulae (TEMP-53) to (TEMP-62), $Q_1$ to $Q_{10}$ each independently are a hydrogen atom or a substituent.

In the formulae, Qs and $Q_{10}$ may be mutually bonded through a single bond to form a ring.

In the formulae (TEMP-53) to (TEMP-62), * represents a bonding position.

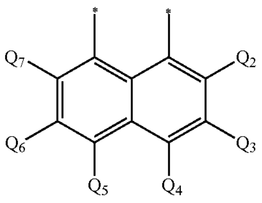

(TEMP-63)

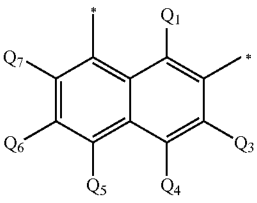

(TEMP-64)

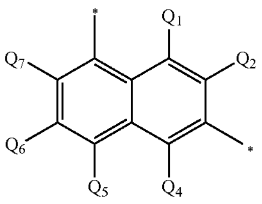

(TEMP-65)

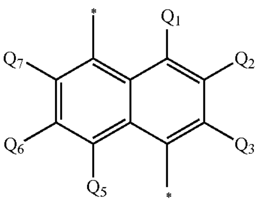

(TEMP-66)

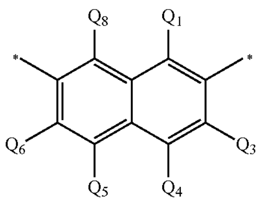

(TEMP-67)

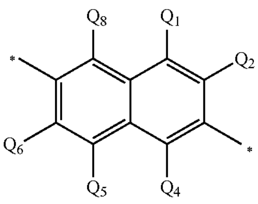

(TEMP-68)

In the formulae (TEMP-63) to (TEMP-68), $Q_1$ to $Q_8$ each independently are a hydrogen atom or a substituent.

In the formulae (TEMP-63) to (TEMP-68), * represents a bonding position.

The substituted or unsubstituted divalent heterocyclic group mentioned herein is, unless otherwise specified herein, preferably a group represented by any one of formulae (TEMP-69) to (TEMP-102) below.

(TEMP-69)

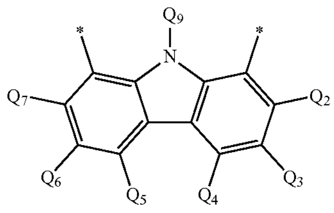

(TEMP-70)

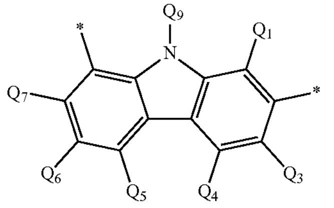

-continued
(TEMP-71)
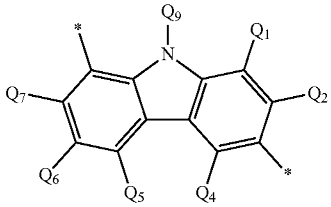
(TEMP-72)
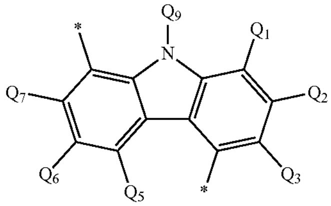
(TEMP-73)
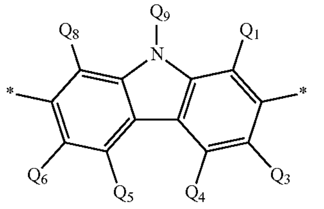
(TEMP-74)
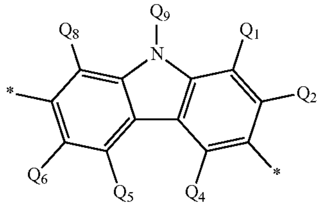
(TEMP-75)
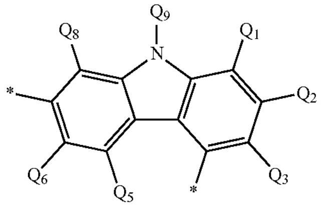
(TEMP-76)
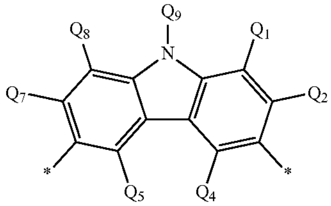
(TEMP-77)
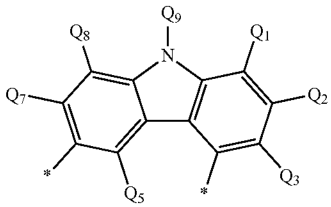
-continued
(TEMP-78)
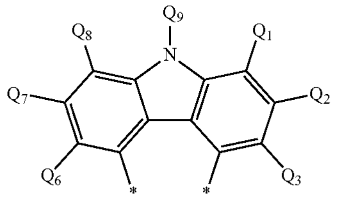
(TEMP-79)
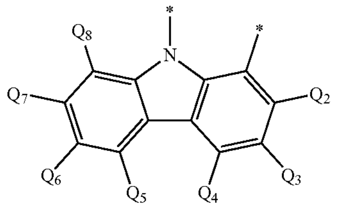
(TEMP-80)
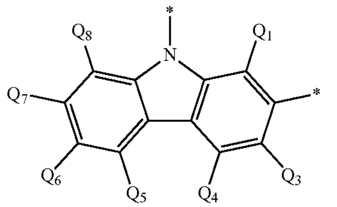
(TEMP-81)
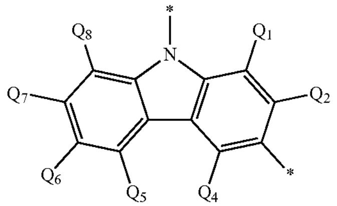
(TEMP-82)
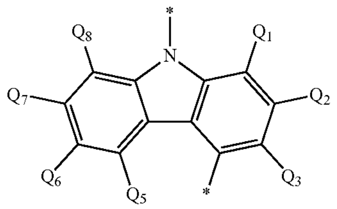
In the formulae (TEMP-69) to (TEMP-82), $Q_1$ to $Q_9$ each independently are a hydrogen atom or a substituent.
(TEMP-83)
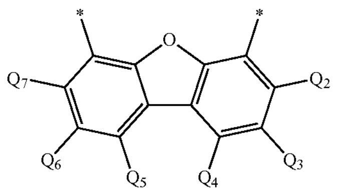
(TEMP-84)
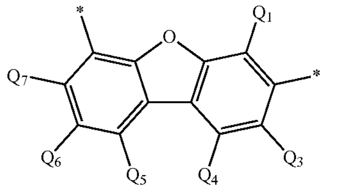

-continued
(TEMP-85)
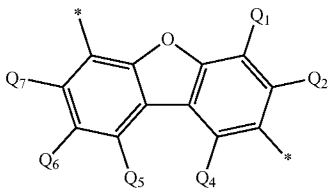
(TEMP-86)
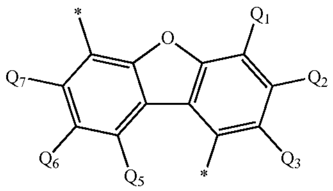
(TEMP-87)
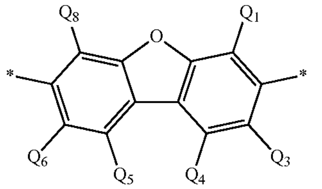
(TEMP-88)
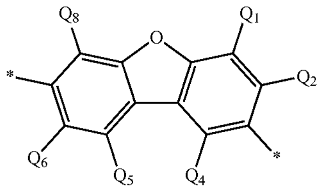
(TEMP-89)
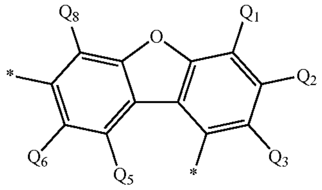
(TEMP-90)
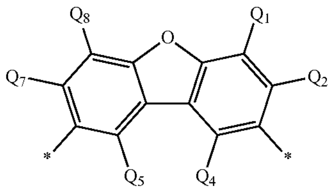
(TEMP-91)
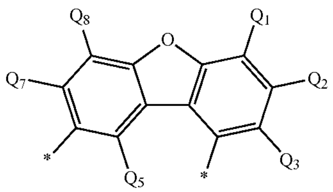
(TEMP-92)
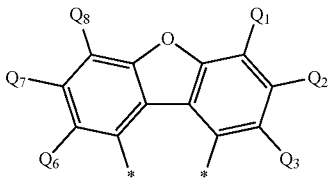
-continued
(TEMP-93)
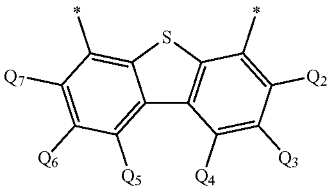
(TEMP-94)
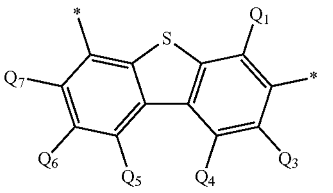
(TEMP-95)
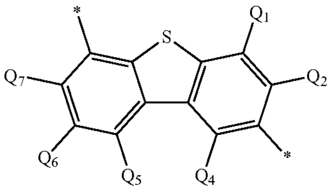
(TEMP-96)
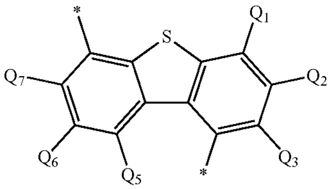
(TEMP-97)
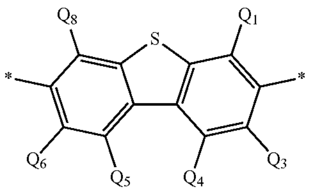
(TEMP-98)
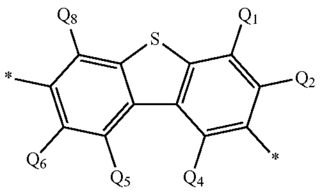
(TEMP-99)
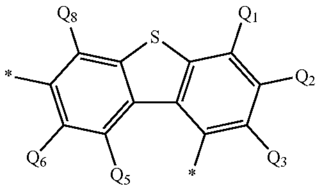
(TEMP-100)
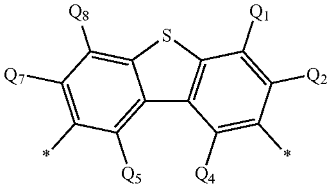

-continued (TEMP-101)

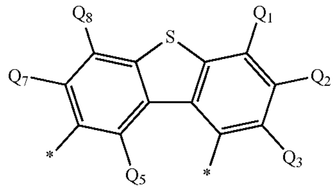

(TEMP-102)

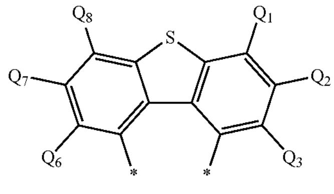

In the formulae (TEMP-83) to (TEMP-102), $Q_1$ to $Q_8$ each independently are a hydrogen atom or a substituent.

The substituent mentioned herein has been described above.

Instance of "Bonded to Form Ring"

Instances where "at least one combination of adjacent two or more (of . . . ) are mutually bonded to form a substituted or unsubstituted monocyclic ring, mutually bonded to form a substituted or unsubstituted fused ring, or not mutually bonded" mentioned herein refer to instances where "at least one combination of adjacent two or more (of . . . ) are mutually bonded to form a substituted or unsubstituted monocyclic ring, "at least one combination of adjacent two or more (of . . . ) are mutually bonded to form a substituted or unsubstituted fused ring," and "at least one combination of adjacent two or more (of . . . ) are not mutually bonded."

Instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (these instances will be sometimes collectively referred to as an instance of "bonded to form a ring" hereinafter) will be described below. An anthracene compound having a basic skeleton in a form of an anthracene ring and represented by a formula (TEMP-103) below will be used as an example for the description.

(TEMP-103)

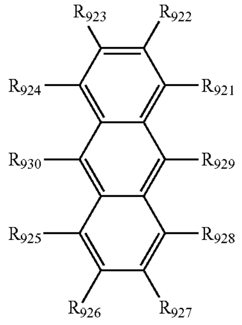

For instance, when "at least one combination of adjacent two or more of" $R_{921}$ to $R_{930}$ "are mutually bonded to form a ring," the combination of adjacent ones of $R_{921}$ to $R_{930}$ (i.e. the combination at issue) is a combination of $R_{921}$ and $R_{922}$, a combination of $R_{922}$ and $R_{923}$, a combination of $R_{923}$ and $R_{924}$, a combination of $R_{924}$ and $R_{930}$, a combination of $R_{930}$ and $R_{925}$, a combination of $R_{925}$ and $R_{926}$, a combination of $R_{926}$ and $R_{927}$, a combination of $R_{927}$ and $R_{928}$, a combination of $R_{928}$ and $R_{929}$, or a combination of $R_{929}$ and $R_{921}$.

The term "at least one combination" means that two or more of the above combinations of adjacent two or more of $R_{921}$ to $R_{930}$ may simultaneously form rings. For instance, when $R_{921}$ and $R_{922}$ are mutually bonded to form a ring $Q_A$ and $R_{925}$ and $R_{926}$ are simultaneously mutually bonded to form a ring $Q_B$, the anthracene compound represented by the formula (TEMP-103) is represented by a formula (TEMP-104) below.

(TEMP-104)

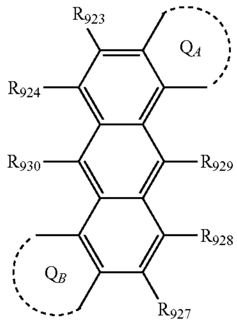

The instance where the "combination of adjacent two or more" form a ring means not only an instance where the "two" adjacent components are bonded but also an instance where adjacent "three or more" are bonded. For instance, $R_{921}$ and $R_{922}$ are mutually bonded to form a ring $Q_A$ and $R_{922}$ and $R_{923}$ are mutually bonded to form a ring $Q_C$, and mutually adjacent three components ($R_{921}$, $R_{922}$ and $R_{923}$) are mutually bonded to form a ring fused to the anthracene basic skeleton. In this case, the anthracene compound represented by the formula (TEMP-103) is represented by a formula (TEMP-105) below. In the formula (TEMP-105) below, the ring $Q_A$ and the ring $Q_C$ share $R_{922}$.

(TEMP-105)

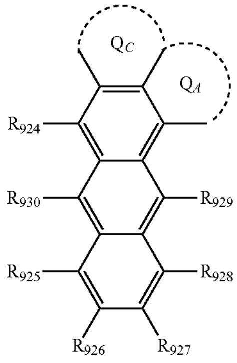

The formed "monocyclic ring" or "fused ring" may be, in terms of the formed ring in itself, a saturated ring or an unsaturated ring. When the "combination of adjacent two" form a "monocyclic ring" or a "fused ring," the "monocyclic ring" or "fused ring" may be a saturated ring or an unsaturated ring. For instance, the ring $Q_A$ and the ring $Q_B$ formed in the formula (TEMP-104) are each independently a "monocyclic ring" or a "fused ring." Further, the ring $Q_A$ and the ring $Q_C$ formed in the formula (TEMP-105) are each a "fused ring." The ring $Q_A$ and the ring $Q_C$ in the formula (TEMP-105) are fused to form a fused ring. When the ring $Q_A$ in the formula (TMEP-104) is a benzene ring, the ring $Q_A$ is a monocyclic ring. When the ring $Q_A$ in the formula (TMEP-104) is a naphthalene ring, the ring $Q_A$ is a fused ring.

The "unsaturated ring" represents an aromatic hydrocarbon ring or an aromatic heterocycle. The "saturated ring" represents an aliphatic hydrocarbon ring or a non-aromatic heterocycle.

Specific examples of the aromatic hydrocarbon ring include a ring formed by terminating a bond of a group in the specific example of the specific example group G1 with a hydrogen atom.

Specific examples of the aromatic heterocycle include a ring formed by terminating a bond of an aromatic heterocyclic group in the specific example of the specific example group G2 with a hydrogen atom.

Specific examples of the aliphatic hydrocarbon ring include a ring formed by terminating a bond of a group in the specific example of the specific example group G6 with a hydrogen atom.

The phrase "to form a ring" herein means that a ring is formed only by a plurality of atoms of a basic skeleton, or by a combination of a plurality of atoms of the basic skeleton and one or more optional atoms. For instance, the ring $Q_A$ formed by mutually bonding $R_{921}$ and $R_{922}$ shown in the formula (TEMP-104) is a ring formed by a carbon atom of the anthracene skeleton bonded with $R_{921}$, a carbon atom of the anthracene skeleton bonded with $R_{922}$, and one or more optional atoms. Specifically, when the ring $Q_A$ is a monocyclic unsaturated ring formed by $R_{921}$ and $R_{922}$, the ring formed by a carbon atom of the anthracene skeleton bonded with $R_{921}$, a carbon atom of the anthracene skeleton bonded with $R_{922}$, and four carbon atoms is a benzene ring.

The "optional atom" is, unless otherwise specified herein, preferably at least one atom selected from the group consisting of a carbon atom, nitrogen atom, oxygen atom, and sulfur atom. A bond of the optional atom (e.g. a carbon atom and a nitrogen atom) not forming a ring may be terminated by a hydrogen atom or the like or may be substituted by an "optional substituent" described later. When the ring includes an optional element other than carbon atom, the resultant ring is a heterocycle.

The number of "one or more optional atoms" forming the monocyclic ring or fused ring is, unless otherwise specified herein, preferably in a range from 2 to 15, more preferably in a range from 3 to 12, further preferably in a range from 3 to 5.

Unless otherwise specified herein, the ring, which may be a "monocyclic ring" or "fused ring," is preferably a "monocyclic ring."

Unless otherwise specified herein, the ring, which may be a "saturated ring" or "unsaturated ring," is preferably an "unsaturated ring."

Unless otherwise specified herein, the "monocyclic ring" is preferably a benzene ring.

Unless otherwise specified herein, the "unsaturated ring" is preferably a benzene ring.

When "at least one combination of adjacent two or more" (of . . . ) are "mutually bonded to form a substituted or unsubstituted monocyclic ring" or "mutually bonded to form a substituted or unsubstituted fused ring," unless otherwise specified herein, at least one combination of adjacent two or more of components are preferably mutually bonded to form a substituted or unsubstituted "unsaturated ring" formed of a plurality of atoms of the basic skeleton, and 1 to 15 atoms of at least one element selected from the group consisting of carbon, nitrogen, oxygen and sulfur.

When the "monocyclic ring" or the "fused ring" has a substituent, the substituent is the substituent described in later-described "optional substituent." When the "monocyclic ring" or the "fused ring" has a substituent, specific examples of the substituent are the substituents described in the above under the subtitle "Substituents Mentioned Herein."

When the "saturated ring" or the "unsaturated ring" has a substituent, the substituent is, for instance, the substituent described in later-described "optional substituent." When the "monocyclic ring" or the "fused ring" has a substituent, specific examples of the substituent are the substituents described in the above under the subtitle "Substituents Mentioned Herein."

The above is the description for the instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (sometimes referred to as an instance "bonded to form a ring").

Substituent for Substituted or Unsubstituted Group

In an exemplary embodiment herein, a substituent for the substituted or unsubstituted group (sometimes referred to as an "optional substituent" hereinafter) is, for instance, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901}$)($R_{902}$)($R_{903}$), —O—($R_{904}$), —S—($R_{905}$), —N($R_{906}$)($R_{907}$), a halogen atom, a cyano group, a nitro group, an unsubstituted aryl group having 6 to 50 ring carbon atoms, and an unsubstituted heterocyclic group having 5 to 50 ring atoms;

$R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when two or more $R_{901}$ are present, the two or more $R_{901}$ are mutually the same or different;

when two or more $R_{902}$ are present, the two or more $R_{902}$ are mutually the same or different;

when two or more $R_{903}$ are present, the two or more $R_{903}$ are mutually the same or different;

when two or more $R_{904}$ are present, the two or more $R_{904}$ are mutually the same or different;

when two or more $R_{905}$ are present, the two or more $R_{905}$ are mutually the same or different;

when two or more $R_{906}$ are present, the two or more $R_{906}$ are mutually the same or different; and when two or more $R_{907}$ are present, the two or more $R_{907}$ are mutually the same or different.

In an exemplary embodiment, a substituent for the substituted or unsubstituted group is selected from the group consisting of an alkyl group having 1 to 50 carbon atoms, an aryl group having 6 to 50 ring carbon atoms, and a heterocyclic group having 5 to 50 ring atoms.

In an exemplary embodiment, a substituent for the substituted or unsubstituted group is selected from the group consisting of an alkyl group having 1 to 18 carbon atoms, an aryl group having 6 to 18 ring carbon atoms, and a heterocyclic group having 5 to 18 ring atoms.

Specific examples of the above optional substituent are the same as the specific examples of the substituent described in the above under the subtitle "Substituent Mentioned Herein."

Unless otherwise specified herein, adjacent ones of the optional substituents may form a "saturated ring" or an "unsaturated ring," preferably a substituted or unsubstituted saturated five-membered ring, a substituted or unsubstituted saturated six-membered ring, a substituted or unsubstituted unsaturated five-membered ring, or a substituted or unsubstituted unsaturated six-membered ring, more preferably a benzene ring.

Unless otherwise specified herein, the optional substituent may further include a substituent. Examples of the substituent for the optional substituent are the same as the examples of the optional substituent.

Herein, numerical ranges represented by "AA to BB" represents a range whose lower limit is the value (AA) recited before "to" and whose upper limit is the value (BB) recited after "to."

Herein, a numerical formula represented by "A B" means that the value A is equal to the value B, or the value A is larger than the value B.

Herein, a numerical formula represented by "A B" means that the value A is equal to the value B, or the value A is smaller than the value B.

First Exemplary Embodiment

Organic Electroluminescence Device

An organic electroluminescence device according to a first exemplary embodiment includes: a cathode; an anode; an emitting region provided between the cathode and the anode; and a hole transporting zone provided between the anode and the emitting region, in which the emitting region includes at least one emitting layer, the hole transporting zone includes at least a first anode side organic layer and a second anode side organic layer, the first anode side organic layer is in direct contact with the second anode side organic layer, the first anode side organic layer and the second anode side organic layer are disposed between the anode and the emitting region in this order from the anode, a total film thickness of the hole transporting zone is in a range from 20 nm to 80 nm, the first anode side organic layer does not contain a compound contained in the second anode side organic layer, the first anode side organic layer contains compounds being a first organic material and a second organic material, the first organic material is different from the second organic material, and a content of the first organic material in the first anode side organic layer is less than 50 mass %.

According to the exemplary embodiment, luminous efficiency of an organic EL device can be improved.

Hole Transporting Zone

Herein, a zone disposed between an anode and an emitting region and formed by a plurality of organic layers is referred to as a hole transporting zone.

In an arrangement of the organic EL device according to the exemplary embodiment, the anode is in direct contact with the hole transporting zone and the emitting region is in direct contact with the hole transporting zone.

In an arrangement of the organic EL device according to the exemplary embodiment, the total film thickness of the hole transporting zone is in a range from 20 nm to 80 nm.

In an arrangement of the organic EL device according to the exemplary embodiment, the total film thickness of the hole transporting zone is in a range from 40 nm to 80 nm.

First Anode Side Organic Layer and Second Anode Side Organic Layer

The hole transporting zone includes at least the first anode side organic layer and the second anode side organic layer.

In an arrangement of the organic EL device according to the exemplary embodiment, a refractive index $NM_1$ of a constituent material contained in the first anode side organic layer is larger than a refractive index $NM_2$ of a constituent material contained in the second anode side organic layer. When the refractive index $NM_1$ is larger than the refractive index $NM_2$, the organic EL device has improved light-extraction efficiency.

The refractive index $NM_1$ of the constituent material contained in the first anode side organic layer corresponds to a refractive index of a mixture of compounds contained in the first anode side organic layer (i.e., at least the first organic material and the second organic material). When the second anode side organic layer contains a single type of compound, the refractive index $NM_2$ of the constituent material contained in the second anode side organic layer corresponds to a refractive index of the single type of compound. When the second anode side organic layer contains a plurality of types of compounds, the refractive index $NM_2$ of the constituent material contained in the second anode side organic layer corresponds to a refractive index of a mixture containing the plurality of types of compounds. A refractive index of a constituent material contained in any other organic layer is similarly defined. The refractive index can be measured by a measurement method described in Examples below. Herein, a value of the refractive index at 2.7 eV in the substrate parallel direction (Ordinary direction), from among the values measured by the variable-angle spectroscopic ellipsometry measurement, is defined as a refractive index of the measurement target material.

In an arrangement of the organic EL device according to the exemplary embodiment, a difference $NM_1-NM_2$ between the refractive index $NM_1$ of the constituent material contained in the first anode side organic layer and the refractive index $NM_2$ of the constituent material contained in the second anode side organic layer satisfies a relationship of a numerical formula (Numerical Formula N1) below.

$$NM_1-NM_2 \geq 0.10 \quad \text{(Numerical Formula N1)}$$

Satisfying the relationship of the above numerical formula (Numerical Formula N1) improves the light-extraction efficiency of the organic EL device.

In an arrangement of the organic EL device according to the exemplary embodiment, the difference $NM_1-NM_2$ between the refractive index $NM_1$ of the constituent material contained in the first anode side organic layer and the refractive index $NM_2$ of the constituent material contained in the second anode side organic layer satisfies a relationship of a numerical formula (Numerical Formula N2) below.

$$NM_1-NM_2 \geq 0.10 \quad \text{(Numerical Formula N2)}$$

In an arrangement of the organic EL device according to the exemplary embodiment, the difference $NM_1-NM_2$ between the refractive index $NM_1$ of the constituent material contained in the first anode side organic layer and the refractive index $NM_2$ of the constituent material contained in the second anode side organic layer satisfies a relationship of a numerical formula (Numerical Formula N3), a numerical formula (Numerical Formula N4), a numerical formula (Numerical Formula N5) or a numerical formula (Numerical Formula N6) below.

$$NM_1-NM_2 \geq 0.01 \quad \text{(Numerical Formula N3)}$$

$$NM_1-NM_2 \geq 0.0 \quad \text{(Numerical Formula N4)}$$

$$NM_1-NM_2 \geq 0.075 \quad \text{(Numerical Formula N5)}$$

$$NM_1-NM_2 \geq 0.11 \quad \text{(Numerical Formula N6)}$$

In an arrangement of the organic EL device according to the exemplary embodiment, the refractive index $NM_1$ of the constituent material contained in the first anode side organic layer is 1.90 or more.

In an arrangement of the organic EL device according to the exemplary embodiment, the refractive index of the compound(s) contained in the first anode side organic layer is 1.90 or more.

In an arrangement of the organic EL device according to the exemplary embodiment, the refractive index of the second organic material is 1.90 or more.

In an arrangement of the organic EL device according to the exemplary embodiment, the refractive index $NM_1$ of the constituent material contained in the first anode side organic layer is 1.94 or more.

In an arrangement of the organic EL device according to the exemplary embodiment, the refractive index of the compound(s) contained in the first anode side organic layer is 1.94 or more.

In an arrangement of the organic EL device according to the exemplary embodiment, the refractive index of the second organic material is 1.94 or more.

In an arrangement of the organic EL device according to the exemplary embodiment, the refractive index of the compound(s) contained in the second anode side organic layer is less than 1.94.

In an arrangement of the organic EL device according to the exemplary embodiment, the refractive index of the compound(s) contained in the second anode side organic layer is 1.92 or less.

In an arrangement of the organic EL device according to the exemplary embodiment, the refractive index of the compound(s) contained in the second anode side organic layer is 1.90 or less.

In an arrangement of the organic EL device according to the exemplary embodiment, the refractive index of the compound(s) contained in the second anode side organic layer is preferably 1.89 or less.

In an arrangement of the organic EL device according to the exemplary embodiment, the hole transporting zone consists of the first anode side organic layer and the second anode side organic layer. In this case, the total film thickness of the hole transporting zone corresponds to a total of a film thickness of the first anode side organic layer and a film thickness of the second anode side organic layer.

In an arrangement of the organic EL device according to the exemplary embodiment, the film thickness of the second anode side organic layer is 20 nm or more.

In an arrangement of the organic EL device according to the exemplary embodiment, the film thickness of the second anode side organic layer is in a range from 20 nm to 60 nm.

In an arrangement of the organic EL device according to the exemplary embodiment, the film thickness of the second anode side organic layer is in a range from 20 nm to 55 nm.

In an arrangement of the organic EL device according to the exemplary embodiment, the film thickness of the second anode side organic layer is in a range from 20 nm to 50 nm.

In an arrangement of the organic EL device according to the exemplary embodiment, the film thickness of the second anode side organic layer is 30 nm or more.

In an arrangement of the organic EL device according to the exemplary embodiment, the film thickness of the second anode side organic layer is 35 nm or more.

In an arrangement of the organic EL device according to the exemplary embodiment, the anode is in direct contact with the first anode side organic layer.

In an arrangement of the organic EL device according to the exemplary embodiment, when the hole transporting zone consists of the first anode side organic layer and the second anode side organic layer, the second anode side organic layer is in direct contact with the emitting region.

In an arrangement of the organic EL device according to the exemplary embodiment, the first anode side organic layer does not contain the compound(s) contained in the second anode side organic layer. An arrangement satisfying the above condition is, for instance, an arrangement as follows: when a compound CA, a compound CB and a compound AA are different compounds, the first anode side organic layer contains two types of compounds (the compound CA as the first organic material and the compound CB as the second organic material) and the second anode side organic layer contains a single type of compound (the compound AA). The above condition is satisfied because both the compounds CA and CB contained in the first anode side organic layer are different from the compound AA.

On the other hand, the above condition is not satisfied, for instance, when the first anode side organic layer contains two types of compounds (the compound CA and the compound CB) and the second anode side organic layer contains a single type of compound (the compound CB), because the first anode side organic layer and the second anode side organic layer contain the same compound (the compound CB).

In an arrangement of the organic EL device according to the exemplary embodiment, all the compound(s) contained in the first anode side organic layer is/are different from all the compound(s) contained in the second anode side organic layer.

An arrangement satisfying the above condition is, for instance, an arrangement as follows: when the compound CA, the compound CB, the compound AA and a compound AB are different compounds, the second anode side organic layer contains a single type of compound (the compound AA) and the first anode side organic layer contains two types of compounds (the compound CA and the compound CB). Further, the above condition is also satisfied when the second anode side organic layer contains two types of compounds (the compound AA and the compound AB) and the first anode side organic layer contains two types of compounds (the compound CA and the compound CB). On the other hand, the above condition is not satisfied, for instance, when the second anode side organic layer contains a single type of compound (the compound AA) and the first anode side organic layer contains two types of compounds (the compound CA and the compound AA), because the first anode side organic layer and the second anode side organic layer contain the same compound (the compound AA).

In an arrangement of the organic EL device according to the exemplary embodiment, the first anode side organic layer contains at least one compound selected from the group consisting of a compound represented by a formula (cHT2-1) below, a compound represented by a formula (cHT2-2) below and a compound represented by a formula (cHT2-3) below.

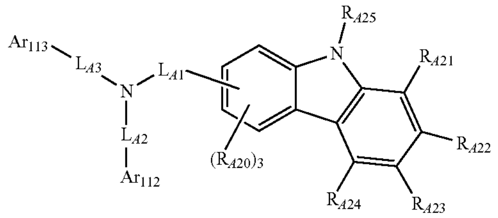

(cHT2-1)

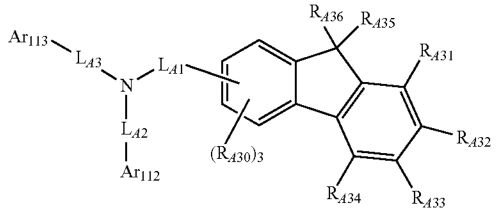

(cHT2-2)

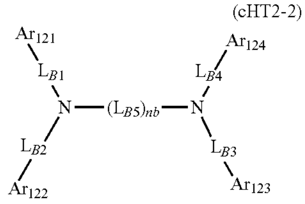

(cHT2-3)

In the formulae (cHT2-1), (cHT2-2) and (cHT2-3):

$Ar_{112}$, $Ar_{113}$, $Ar_{121}$, $Ar_{122}$, $Ar_{123}$ and $Ar_{124}$ are each independently a substituted or unsubstituted aryl group having 6 to 50 ring carbon atoms, a substituted or unsubstituted heterocyclic group having 5 to 50 ring atoms, or —Si($R_{C1}$)($R_{C2}$)($R_{C3}$);

$R_{C2}$ and $R_{C3}$ are each independently a substituted or unsubstituted aryl group having 6 to 50 ring carbon atoms;

when a plurality of $R_{C1}$ are present, the plurality of $R_{C1}$ are mutually the same or different;

when a plurality of $R_{C2}$ are present, the plurality of $R_{C2}$ are mutually the same or different;

when a plurality of $R_{C3}$ are present, the plurality of $R_{C3}$ are mutually the same or different;

$L_{A1}$, $L_{A2}$, $L_{A3}$, $L_{B1}$, $L_{B2}$, $L_{B3}$ and $L_{B4}$ are each independently a single bond, a substituted or unsubstituted arylene group having 6 to 50 ring carbon atoms, or a substituted or unsubstituted divalent heterocyclic group having 5 to 50 ring atoms;

nb is 1, 2, 3, or 4;

when nb is 1, $L_{B5}$ is a substituted or unsubstituted arylene group having 6 to 50 ring carbon atoms, or a substituted or unsubstituted divalent heterocyclic group having 5 to 50 ring atoms;

when nb is 2, 3 or 4, a plurality of $L_{B5}$ are mutually the same or different;

when nb is 2, 3 or 4, a plurality of $L_{B5}$ are mutually bonded to form a substituted or unsubstituted monocyclic ring, mutually bonded to form a substituted or unsubstituted fused ring, or not mutually bonded;

$L_{B5}$ not forming the substituted or unsubstituted monocyclic ring and not forming the substituted or unsubstituted fused ring is a substituted or unsubstituted arylene group having 6 to 50 ring carbon atoms, or a substituted or unsubstituted divalent heterocyclic group having 5 to 50 ring atoms;

a combination of $R_{A35}$ and $R_{A36}$ are mutually bonded to form a substituted or unsubstituted monocyclic ring, mutually bonded to form a substituted or unsubstituted fused ring, or not mutually bonded;

$R_{A25}$, and $R_{A35}$ and $R_{A36}$ not forming the substituted or unsubstituted monocyclic ring and not forming the substituted or unsubstituted fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

at least one combination of adjacent two or more of $R_{A20}$ to $R_{A24}$ are mutually bonded to form a substituted or unsubstituted monocyclic ring, mutually bonded to form a substituted or unsubstituted fused ring, or not mutually bonded;

at least one combination of adjacent two or more of $R_{A30}$ to $R_{A34}$ are mutually bonded to form a substituted or unsubstituted monocyclic ring, mutually bonded to form a substituted or unsubstituted fused ring, or not mutually bonded;

$R_{A20}$ to $R_{A24}$ and $R_{A30}$ to $R_{A34}$ not forming the substituted or unsubstituted monocyclic ring and not forming the substituted or unsubstituted fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

in the compounds represented by the formulae (cHT2-1), (cHT2-2) and (cHT2-3), $R_{901}$ to $R_{904}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different; and when a plurality of $R_{904}$ are present, the plurality of $R_{904}$ are mutually the same or different.

In an arrangement of the organic EL device according to the exemplary embodiment, substituents for "substituted or unsubstituted" groups in the compounds represented by the formulae (cHT2-1), (cHT2-2) and (cHT2-3) are each not a group represented by —N($R_{C6}$)($R_{C7}$), in which $R_{C6}$ and $R_{C7}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In an arrangement of the organic EL device according to the exemplary embodiment, the second organic material is a monoamine compound having one substituted or unsubstituted amino group in a molecule thereof.

In an arrangement of the organic EL device according to the exemplary embodiment, the compound represented by the formula (cHT2-1) and the compound represented by the formula (cHT2-2) are monoamine compounds.

In an arrangement of the organic EL device according to the exemplary embodiment, the second organic material as the compound contained in the first anode side organic layer is a diamine compound having two substituted or unsubstituted amino groups in a molecule thereof.

In an arrangement of the organic EL device according to the exemplary embodiment, the compound represented by the formula (cHT2-3) is a diamine compound.

In an arrangement of the organic EL device according to the exemplary embodiment, the second organic material is at least one compound selected from the group consisting of the compound represented by the formula (cHT2-1), the compound represented by the formula (cHT2-2) and the compound represented by the formula (cHT2-3).

In an arrangement of the organic EL device according to the exemplary embodiment, the second organic material has at least one group selected from the group consisting of a group represented by a formula (2-a) below, a group represented by a formula (2-b) below, a group represented by a formula (2-c) below, a group represented by a formula (2-d) below, a group represented by a formula (2-e) below and a group represented by a formula (2-f) below.

(2-a)

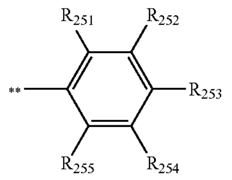

In the formula (2-a):

none of a combination(s) of adjacent two or more of $R_{251}$ to $R_{255}$ are mutually bonded;

$R_{251}$ to $R_{255}$ are each independently a hydrogen atom, or a substituted or unsubstituted alkyl group having 1 to 6 carbon atoms; and

** represents a bonding position.

(2-b)

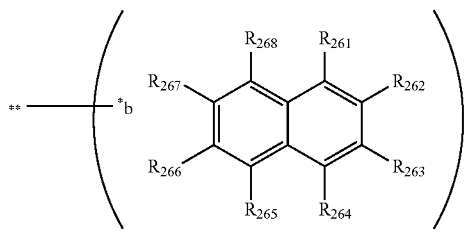

In the formula (2-b):

one of $R_{261}$ to $R_{268}$ is a single bond with *b;

none of a combination(s) of adjacent two or more of $R_{261}$ to $R_{268}$ not being the single bond with *b are mutually bonded;

$R_{261}$ to $R_{268}$ not being the single bond with *b are each independently a hydrogen atom, a substituted or unsubstituted alkyl group having 1 to 6 carbon atoms, or a substituted or unsubstituted aryl group having 6 to 12 ring carbon atoms; and

** represents a bonding position.

(2-c)

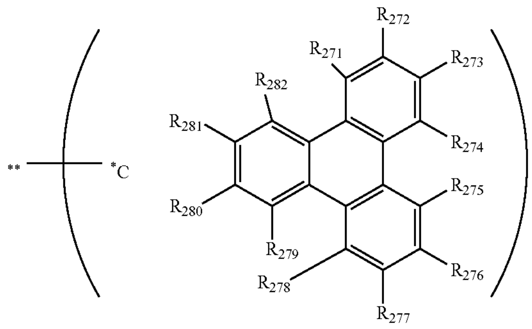

In the formula (2-c):

one of $R_{271}$ to $R_{282}$ is a single bond with *c;

none of a combination(s) of adjacent two or more of $R_{271}$ to $R_{282}$ not being the single bond with *c are mutually bonded;

$R_{271}$ to $R_{282}$ not being the single bond with *c are each independently a hydrogen atom, a substituted or unsubstituted alkyl group having 1 to 6 carbon atoms, or a substituted or unsubstituted aryl group having 6 to 12 ring carbon atoms; and

** represents a bonding position.

(2-d)

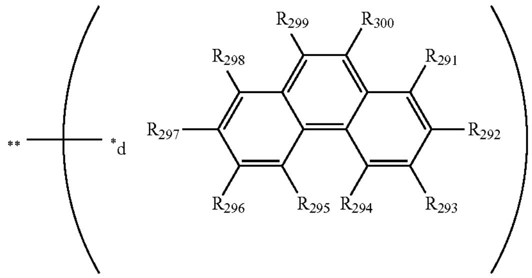

In the formula (2-d):

one of $R_{291}$ to 8300 is a single bond with *d;

none of a combination(s) of adjacent two or more of $R_{291}$ to $R_{300}$ not being the single bond with *d are mutually bonded;

$R_{291}$ to $R_{300}$ not being the single bond with *d are each independently a hydrogen atom, a substituted or unsubstituted alkyl group having 1 to 6 carbon atoms, or a substituted or unsubstituted aryl group having 6 to 12 ring carbon atoms; and

** represents a bonding position.

(2-e)

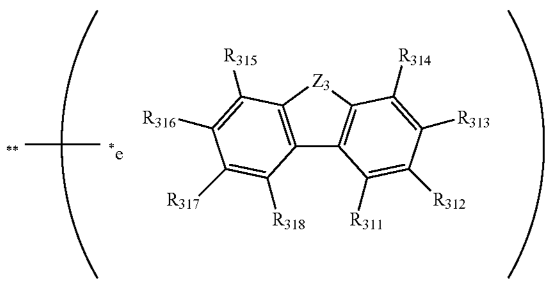

In the formula (2-e):

$Z_3$ is an oxygen atom, a sulfur atom, $NR_{319}$ or $C(R_{329})(R_{321})$;

one of $R_{311}$ to $R_{321}$ is a single bond with *e, or one of carbon atoms of a substituted or unsubstituted benzene ring, described below, formed by mutually bonding a combination of adjacent two or more of $R_{311}$ to $R_{318}$ is bonded to *e by a single bond;

a combination of adjacent two or more of $R_{311}$ to $R_{318}$ not being the single bond with *e are mutually bonded to form a substituted or unsubstituted benzene ring, or not mutually bonded;

$R_{311}$ to $R_{318}$ not being the single bond with *e and not forming the substituted or unsubstituted benzene ring are each independently a hydrogen atom, a substituted or unsubstituted alkyl group having 1 to 6 carbon atoms, a substituted or unsubstituted aryl group having 6 to 12 ring carbon atoms, or a substituted or unsubstituted heterocyclic group having 5 to 10 ring atoms;

$R_{319}$ not being the single bond with *e is a hydrogen atom, a substituted or unsubstituted alkyl group having 1 to 6 carbon atoms, or a substituted or unsubstituted aryl group having 6 to 12 ring carbon atoms;

a combination of $R_{320}$ and $R_{321}$ not being the single bond with *e are mutually bonded to form a substituted or unsubstituted monocyclic ring, mutually bonded to form a substituted or unsubstituted fused ring, or not mutually bonded;

$R_{320}$ and $R_{321}$ not being the single bond with *e, not forming the substituted or unsubstituted monocyclic ring and not forming the substituted or unsubstituted fused ring are each independently a hydrogen atom, a substituted or unsubstituted alkyl group having 1 to 6 carbon atoms, or a substituted or unsubstituted aryl group having 6 to 12 ring carbon atoms; and

** represents a bonding position.

(2-f)

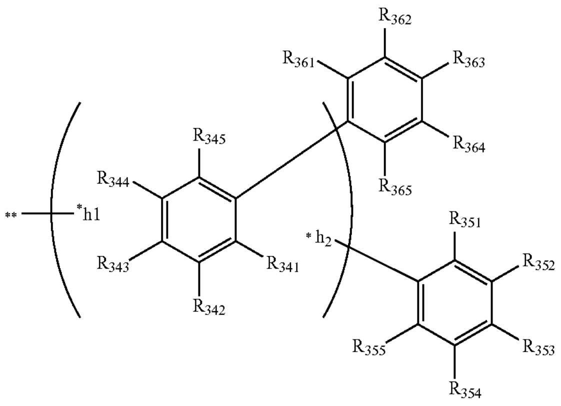

In the formula (24):

one of $R_{341}$ to $R_{345}$ is a single bond with *h1, and another one of $R_{341}$ to $R_{345}$ is a single bond with *h2;

none of a combination(s) of adjacent two or more of $R_{341}$ to $R_{345}$ not being the single bond with *h1 and not being the single bond with *h2 are mutually bonded;

at least one combination of adjacent two or more of $R_{351}$ to $R_{355}$ are mutually bonded to form a substituted or unsubstituted monocyclic ring, mutually bonded to form a substituted or unsubstituted fused ring, or not mutually bonded;

at least one combination of adjacent two or more of $R_{361}$ to 8365 are mutually bonded to form a substituted or unsubstituted monocyclic ring, mutually bonded to form a substituted or unsubstituted fused ring, or not mutually bonded;

$R_{341}$ to $R_{345}$ not being the single bond with *h1 and not being the single bond with *h2, and $R_{351}$ to $R_{355}$ and $R_{361}$ to 8365 not forming the substituted or unsubstituted monocyclic ring and not forming the substituted or unsubstituted fused ring are each independently a hydrogen atom, a substituted or unsubstituted alkyl group having 1 to 6 carbon atoms, or a substituted or unsubstituted aryl group having 6 to 12 ring carbon atoms; and

** represents a bonding position.

In an arrangement of the organic EL device according to the exemplary embodiment, the group represented by the formula (2-a), the group represented by the formula (2-b), the group represented by the formula (2-c), the group represented by the formula (2-d), the group represented by the formula (2-e) and the group represented by the formula (2-f) are each independently bonded directly, with a phenylene group, or with a biphenylene group to a nitrogen atom of the amino group of the monoamine compound.

In the organic EL device according to the exemplary embodiment, when $Z_3$ is $NR_{319}$, it is preferable that $R_{315}$, $R_{316}$ or $R_{318}$ is a single bond with *e.

In an arrangement of the organic EL device according to the exemplary embodiment, the group represented by the formula (2-e) is a group represented by a formula (2-e4), (2-e5) or (2-e6) below.

(2-e4)

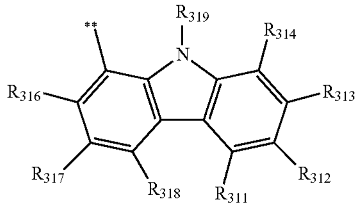

(2-e5)

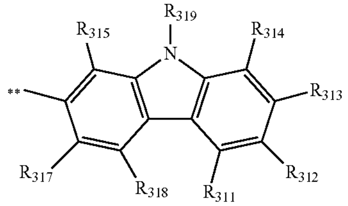

-continued (2-e6)

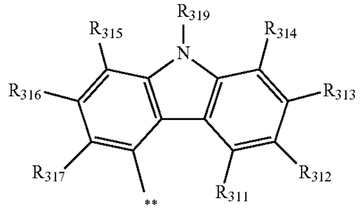

In the formulae (2-e4), (2-e5) and (2-e6), $R_{311}$ to $R_{319}$ respectively represent the same as $R_{311}$ to $R_{319}$ in the formula (2-e), and ** represents a bonding position.

In an arrangement of the organic EL device according to the exemplary embodiment, the group represented by the formula (2-e) is a group represented by a formula (2-e1), (2-e2) or (2-e3) below.

(2-e1)

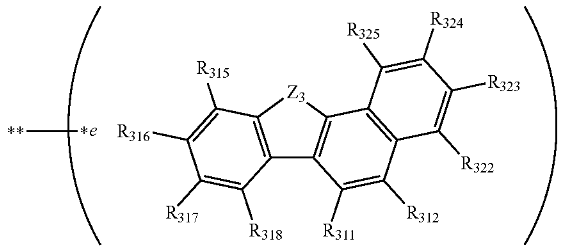

(2-e2)

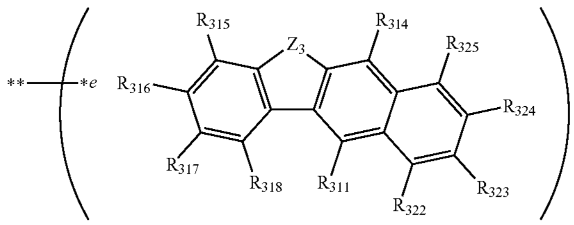

(2-e3)

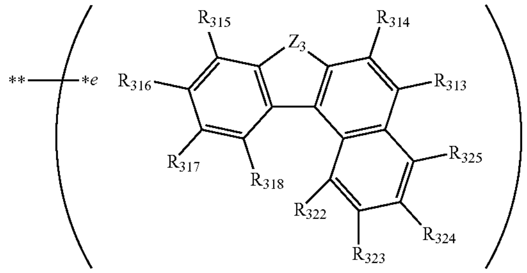

In the formulae (2-e1), (2-e2) and (2-e3):

$Z_3$ is an oxygen atom, a sulfur atom, $NR_{319}$ or $C(R_{320})(R_{321})$;

one of $R_{311}$ to $R_{325}$ is a single bond with *e;

$R_{311}$ to $R_{318}$ and $R_{322}$ to $R_{325}$ not being the single bond with *e are each independently a hydrogen atom, a substituted or unsubstituted alkyl group having 1 to 6 carbon atoms, a substituted or unsubstituted aryl group having 6 to 12 ring carbon atoms, or a substituted or unsubstituted heterocyclic group having 5 to 10 ring atoms;

$R_{319}$ not being the single bond with *e is a hydrogen atom, a substituted or unsubstituted alkyl group having 1 to 6 carbon atoms, or a substituted or unsubstituted aryl group having 6 to 12 ring carbon atoms;

a combination of $R_{320}$ and $R_{321}$ not being the single bond with *e are mutually bonded to form a substituted or unsubstituted monocyclic ring, mutually bonded to form a substituted or unsubstituted fused ring, or not mutually bonded;

$R_{320}$ and $R_{321}$ not being the single bond with *e, not forming the substituted or unsubstituted monocyclic ring and not forming the substituted or unsubstituted fused ring are each independently a hydrogen atom, a substituted or unsubstituted alkyl group having 1 to 6 carbon atoms, or a substituted or unsubstituted aryl group having 6 to 12 ring carbon atoms; and

** represents a bonding position.

In an arrangement of the organic EL device according to the exemplary embodiment, the compound(s) contained in the first anode side organic layer are a compound having no thiophene ring in a molecule thereof.

In an arrangement of the organic EL device according to the exemplary embodiment, the second organic material as the compound contained in the first anode side organic layer is sometimes referred to as a first hole transporting zone material.

In an arrangement of the organic EL device according to the exemplary embodiment, a content of the first organic material in the first anode side organic layer is 5 mass % or more.

In an arrangement of the organic EL device according to the exemplary embodiment, the content of the first organic material in the first anode side organic layer is 30 mass % or less, 20 mass % or less, or 15 mass % or less.

In an arrangement of the organic EL device according to the exemplary embodiment, a content of the second organic material in the first anode side organic layer is more than 50 mass %, 70 mass % or more, 80 mass % or more, or 85 mass % or more.

In an arrangement of the organic EL device according to the exemplary embodiment, the content of the second organic material in the first anode side organic layer is 95 mass % or less.

A total of the contents of the first organic material and the second organic material in the first anode side organic layer is 100 mass % or less.

In an arrangement of the organic EL device according to the exemplary embodiment, the first anode side organic layer contains a doped compound as the first organic material and the first hole transporting zone material as the second organic material.

In an arrangement of the organic EL device according to the exemplary embodiment, the doped compound is a compound including at least one of a first cyclic structure represented by a formula (P11) below or a second cyclic structure represented by a formula (P12) below.

(P11)

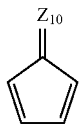

-continued (P12)

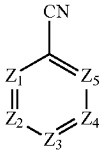

The first cyclic structure represented by the formula (P11) is fused, in a molecule of the doped compound, with at least one cyclic structure of a substituted or unsubstituted aromatic hydrocarbon ring having 6 to 50 ring carbon atoms or a substituted or unsubstituted heterocycle having 5 to 50 ring atoms; and a structure represented by $=Z_{10}$ is represented by a formula (11a), (11b), (11c), (11d), (11e), (11f), (11g), (11h), (11i), (11j), (11k) or (11m) below.

(11a)

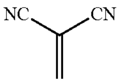

(11ab)

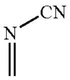

(11c)

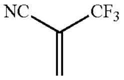

(11d)

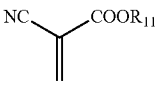

(11e)

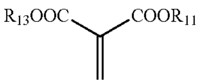

(11f)

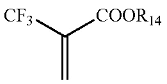

(11g)

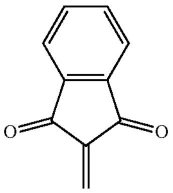

(11h)

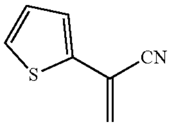

(11i)

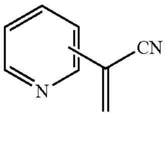

(11j)

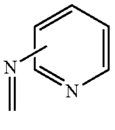

-continued (11k)

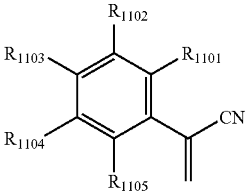

(11m)

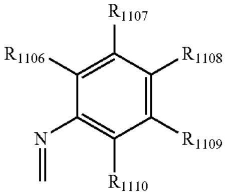

In the formula (11a), (11b), (11c), (11d), (11e), (11f), (11g), (11h), (11i), (11j), (11k) or (11m): $R_{11}$ to $R_{14}$ and $R_{1101}$ to $R_{1110}$ are each independently a hydrogen atom, a halogen atom, a hydroxy group, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted aryl group having 6 to 50 ring carbon atoms, or a substituted or unsubstituted heterocyclic group having 5 to 50 ring atoms. In the formula (P12):

$Z_1$ to $Z_5$ are each independently a nitrogen atom, a carbon atom bonded to $R_{15}$, or a carbon atom bonded to another atom in a molecule of the doped compound;

at least one of $Z_1$ to $Z_5$ is a carbon atom bonded to another atom in a molecule of the doped compound;

$R_{15}$ is selected from the group consisting of a hydrogen atom, a halogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a substituted or unsubstituted aryl group having 6 to 50 ring carbon atoms, a substituted or unsubstituted heterocyclic group having 5 to 50 ring atoms, a group represented by $-Si(R_{901})(R_{902})(R_{903})$, a group represented by $-O-(R_{904})$, a group represented by $-S-(R_{905})$, a group represented by $-N(R_{906})(R_{907})$, a substituted or unsubstituted alkenyl group having 2 to 50 carbon atoms, a substituted or unsubstituted aralkyl group having 7 to 50 carbon atoms, a carboxy group, a substituted or unsubstituted ester group, a substituted or unsubstituted carbamoyl group, a nitro group, and a substituted or unsubstituted siloxanyl group; and when a plurality of $R_{15}$ are present, the plurality of $R_{15}$ are mutually the same or different.

In the doped compound:

$R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different; and when a plurality of $R_{907}$ are present, the plurality of $R_{907}$ are mutually the same or different.

An ester group herein is at least one group selected from the group consisting of an alkyl ester group and an aryl ester group.

An alkyl ester group herein is represented, for instance, by $—C(=O)OR^E$. $R^E$ is exemplified by a substituted or unsubstituted alkyl group having 1 to 50 carbon atoms (preferably 1 to 10 carbon atoms).

An aryl ester group herein is represented, for instance, by $—C(=O)OR^{Ar}$. $R^{Ar}$ is exemplified by a substituted or unsubstituted aryl group having 6 to 30 ring carbon atoms.

A siloxanyl group herein is a silicon compound group through an ether bond and is exemplified by a trimethylsiloxanyl group.

A carbamoyl group herein is represented by $—CONH_2$.

A substituted carbamoyl group herein is represented, for instance, by $—CONH—Ar^C$ or $—CONH—R^C$. $Ar^C$ is exemplified by at least one group selected from the group consisting of a substituted or unsubstituted aryl group having 6 to 50 ring carbon atoms (preferably 6 to 10 ring carbon atoms) and a heterocyclic group having 5 to 50 ring atoms (preferably 5 to 14 ring atoms). $Ar^C$ may be a group formed by bonding a substituted or unsubstituted aryl group having 6 to 50 ring carbon atoms and a substituted or unsubstituted heterocyclic group having 5 to 50 ring atoms.

$R^C$ is exemplified by a substituted or unsubstituted alkyl group having 1 to 50 carbon atoms (preferably 1 to 6 carbon atoms).

In the doped compound, it is preferable that all groups described as "substituted or unsubstituted" groups are "unsubstituted" groups.

In an arrangement of the organic EL device according to the exemplary embodiment, the second organic material is a monoamine compound having only one substituted or unsubstituted amino group in a molecule thereof.

In an arrangement of the organic EL device according to the exemplary embodiment, the second organic material contains at least one compound selected from the group consisting of the compound represented by the formula (cHT2-1) and the compound represented by the formula (cHT2-2).

In an arrangement of the organic EL device according to the exemplary embodiment, the compound represented by the formula (cHT2-1) and the compound represented by the formula (cHT2-2) as the second organic material are monoamine compounds.

In an arrangement of the organic EL device according to the exemplary embodiment, the second anode side organic layer contains at least one compound selected from the group consisting of a compound represented by a formula (cHT3-1) below, a compound represented by a formula (cHT3-2) below, a compound represented by a formula (cHT3-3) below and a compound represented by a formula (cHT3-4) below.

(cHT3-1)

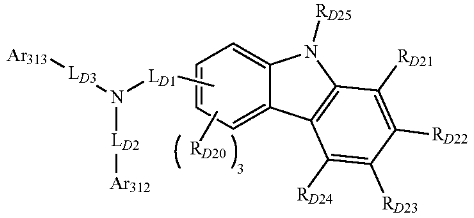

(cHT3-2)

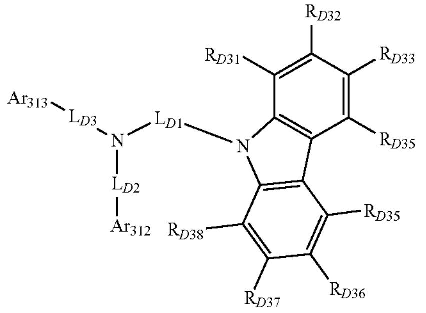

(cHT3-3)

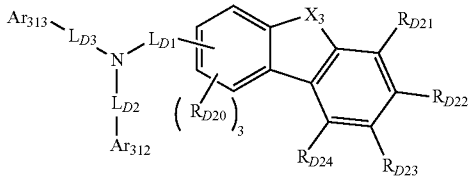

(cHT3-4)

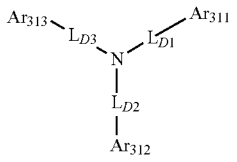

In the formulae (cHT3-1), (cHT3-2), (cHT3-3) and (cHT3-4):

$Ar_{311}$ is a group represented by one of formulae (1-a), (1-b), (1-c) and (1-d) below;

$Ar_{312}$ and $Ar_{313}$ are each independently a substituted or unsubstituted aryl group having 6 to 50 ring carbon atoms, a substituted or unsubstituted heterocyclic group having 5 to 50 ring atoms, or $—Si(R_{C1})(R_{C2})(R_{C3})$;

$R_{C1}$, $R_{C2}$ and $R_{C3}$ are each independently a substituted or unsubstituted aryl group having 6 to 50 ring carbon atoms;

when a plurality of $R_{C1}$ are present, the plurality of $R_{C1}$ are mutually the same or different;

when a plurality of $R_{C2}$ are present, the plurality of $R_{C2}$ are mutually the same or different;

when a plurality of $R_{C3}$ are present, the plurality of $R_{C3}$ are mutually the same or different;

$L_{D1}$, $L_{D2}$ and $L_{D3}$ are each independently a single bond, a substituted or unsubstituted arylene group having 6 to 50 ring carbon atoms, or a substituted or unsubstituted divalent heterocyclic group having 5 to 50 ring atoms;

at least one combination of adjacent two or more of $R_{D20}$ to $R_{D24}$ are mutually bonded to form a substituted or unsubstituted monocyclic ring, mutually bonded to form a substituted or unsubstituted fused ring, or not mutually bonded;

at least one combination of adjacent two or more of $R_{D31}$ to $R_{D38}$ are mutually bonded to form a substituted or unsubstituted monocyclic ring, mutually bonded to form a substituted or unsubstituted fused ring, or not mutually bonded;

at least one combination of adjacent two or more of $R_{D40}$ to $R_{D44}$ are mutually bonded to form a substituted or unsubstituted monocyclic ring, mutually bonded to form a substituted or unsubstituted fused ring, or not mutually bonded;

$X_3$ is an oxygen atom, a sulfur atom, or $C(R_{D45})(R_{D46})$;

a combination of $R_{D45}$ and $R_{D46}$ are mutually bonded to form a substituted or unsubstituted monocyclic ring, mutually bonded to form a substituted or unsubstituted fused ring, or not mutually bonded;

$R_{D25}$, and $R_{D20}$ to $R_{D24}$, $R_{D31}$ to $R_{D38}$, $R_{D40}$ to $R_{D44}$, $R_{D45}$ and $R_{D46}$ not forming the substituted or unsubstituted monocyclic ring and not forming the substituted or unsubstituted fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a substituted or unsubstituted aryl group having 6 to 50 ring carbon atoms, or a substituted or unsubstituted heterocyclic group having 5 to 50 ring atoms;

in the compounds represented by the formulae (cHT3-1), (cHT3-2), (cHT3-3) and (cHT3-4), $R_{901}$ to $R_{904}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different; and when a plurality of $R_{904}$ are present, the plurality of $R_{904}$ are mutually the same or different.

(1-a)

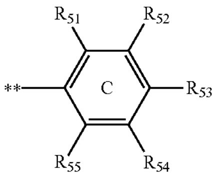

In the formula (1-a):

none of a combination(s) of adjacent two or more of $R_{51}$ to $R_{55}$ are mutually bonded;

$R_{51}$ to $R_{55}$ are each independently a hydrogen atom or a substituted or unsubstituted alkyl group having 1 to 6 carbon atoms; and

** represents a bonding position to $L_{D1}$.

(1-b)

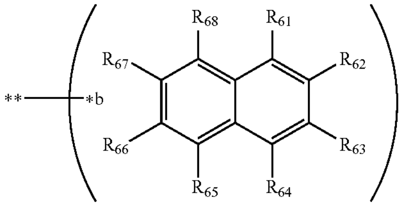

In the formula (1-b):

one of $R_{61}$ to $R_{68}$ is a single bond with *b;

none of a combination(s) of adjacent two or more of $R_{61}$ to $R_{68}$ not being the single bond with *b are mutually bonded;

$R_{61}$ to $R_{68}$ not being the single bond with *b are each independently a hydrogen atom, a substituted or unsubstituted alkyl group having 1 to 6 carbon atoms, or a substituted or unsubstituted aryl group having 6 to 12 ring carbon atoms; and

** represents a bonding position to $L_{D1}$.

(1-c)

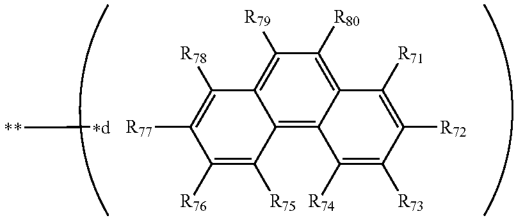

In the formula (1-c):

one of $R_{71}$ to $R_{80}$ is a single bond with *d;

none of a combination(s) of adjacent two or more of $R_{71}$ to $R_{80}$ not being the single bond with *d are mutually bonded;

$R_{71}$ to $R_{80}$ not being the single bond with *d are each independently a hydrogen atom, a substituted or unsubstituted alkyl group having 1 to 6 carbon atoms, or a substituted or unsubstituted aryl group having 6 to 12 ring carbon atoms; and

** represents a bonding position to $L_{D1}$.

(1-d)

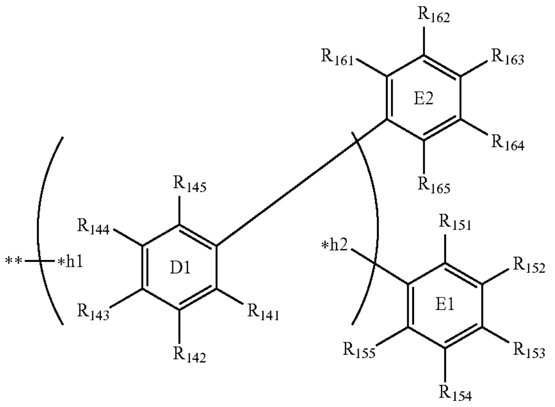

In the formula (1-d):

one of $R_{141}$ to $R_{145}$ is a single bond with *h1, and another one of $R_{141}$ to $R_{145}$ is a single bond with *h2;

none of a combination(s) of adjacent two or more of $R_{141}$ to $R_{145}$ not being the single bond with *h1 and not being the single bond with *h2 are mutually bonded;

at least one combination of adjacent two or more of $R_{151}$ to $R_{155}$ are mutually bonded to form a substituted or unsubstituted monocyclic ring, mutually bonded to form a substituted or unsubstituted fused ring, or not mutually bonded;

at least one combination of adjacent two or more of $R_{161}$ to $R_{165}$ are mutually bonded to form a substituted or unsubstituted monocyclic ring, mutually bonded to form a substituted or unsubstituted fused ring, or not mutually bonded;

$R_{141}$ to $R_{145}$ not being the single bond with *h1 and not being the single bond with *h2, and $R_{151}$ to $R_{155}$ and $R_{161}$ to $R_{165}$ not forming the substituted or unsubstituted monocyclic ring and not forming the substituted or unsubstituted fused ring are each independently a hydrogen atom, a substituted or unsubstituted alkyl group having 1 to 6 carbon atoms, or a substituted or unsubstituted aryl group having 6 to 12 ring carbon atoms; and

** represents a bonding position to $L_{D1}$.

In an arrangement of the organic EL device according to the exemplary embodiment, substituents for "substituted or unsubstituted" groups in the compounds represented by the formulae (cHT3-1), (cHT3-2), (cHT3-3) and (cHT3-4) are each not a group represented by —$N(R_{C6})(R_{C7})$, in which $R_{C6}$ and $R_{C7}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In an arrangement of the organic EL device according to the exemplary embodiment: the first anode side organic layer contains at least one compound selected from the group consisting of the compound represented by the formula (cHT2-1), the compound represented by the formula (cHT2-2) and the compound represented by the formula (cHT2-3); and the second anode side organic layer contains at least one compound selected from the group consisting of the compound represented by the formula (cHT3-1), the compound represented by the formula (cHT3-2), the compound represented by the formula (cHT3-3) and the compound represented by the formula (cHT3-4).

Third Anode Side Organic Layer

In an arrangement of the organic EL device according to the exemplary embodiment, the hole transporting zone further includes a third anode side organic layer, and the third anode side organic layer is disposed between the second anode side organic layer and the emitting region.

In an arrangement of the organic EL device according to the exemplary embodiment, the second anode side organic layer is in direct contact with the third anode side organic layer.

In an arrangement of the organic EL device according to the exemplary embodiment, the third anode side organic layer is in direct contact with the emitting region.

In an arrangement of the organic EL device according to the exemplary embodiment, the hole transporting zone consists of the first anode side organic layer, the second anode side organic layer and the third anode side organic layer. In this case, the total film thickness of the hole transporting zone corresponds to a total of the film thickness of the first anode side organic layer, the film thickness of the second anode side organic layer and a film thickness of the third anode side organic layer.

In an arrangement of the organic EL device according to the exemplary embodiment, all the compound(s) contained in the second anode side organic layer is/are different from all the compound(s) contained in the third anode side organic layer.

An arrangement satisfying the above condition is, for instance, an arrangement as follows: when the compound AA, the compound AB and a compound BB are different compounds, the second anode side organic layer contains a single type of compound (the compound AA) and the third anode side organic layer contains a single type of compound (the compound BB). Further, the above condition is also satisfied, for instance, when the second anode side organic layer contains two types of compounds (the compound AA and the compound AB) and the third anode side organic layer contains a single type of compound (the compound BB), because the compound AA and the compound AB are both different from the compound BB.

On the other hand, the above condition is not satisfied, for instance, when the second anode side organic layer contains two types of compounds (the compound AA and the compound AB) and the third anode side organic layer contains a single type of compound (the compound AB), because the second anode side organic layer and the third anode side organic layer contain the same compound (the compound AB).

In an arrangement of the organic EL device according to the exemplary embodiment, the third anode side organic layer does not contain the compound(s) contained in the first anode side organic layer.

In an arrangement of the organic EL device according to the exemplary embodiment, the third anode side organic layer contains at least one compound selected from the group consisting of the compound represented by the formula (cHT3-1), the compound represented by the formula (cHT3-2), the compound represented by the formula (cHT3-3) and the compound represented by the formula (cHT3-4).

In an arrangement of the organic EL device according to the exemplary embodiment, the first anode side organic layer, the second anode side organic layer and the third anode side organic layer each contain at least one compound, the respective compounds contained in the first, second and third anode side organic layers being different from each other.

In an arrangement of the organic EL device according to the exemplary embodiment, the first anode side organic layer, the second anode side organic layer and the third anode side organic layer each contain a monoamine compound having only one substituted or unsubstituted amino group in a molecule thereof.

In an arrangement of the organic EL device according to the exemplary embodiment, the first anode side organic layer, the second anode side organic layer and the third anode side organic layer do not contain a diamine compound.

In an arrangement of the organic EL device according to the exemplary embodiment, at least any of the first anode side organic layer, the second anode side organic layer and the third anode side organic layer also may contain a diamine compound.

In an arrangement of the organic EL device according to the exemplary embodiment, the compound(s) contained in the third anode side organic layer are sometimes referred to as a third hole transporting zone material.

Fourth Anode Side Organic Layer

In an arrangement of the organic EL device according to the exemplary embodiment, the hole transporting zone further includes a fourth anode side organic layer, and the fourth anode side organic layer is disposed between the third anode side organic layer and the emitting region.

In an arrangement of the organic EL device according to the exemplary embodiment, the fourth anode side organic layer is in direct contact with the emitting region.

In an arrangement of the organic EL device according to the exemplary embodiment, the fourth anode side organic layer is in direct contact with the third anode side organic layer.

In an arrangement of the organic EL device according to the exemplary embodiment, the first anode side organic layer, the second anode side organic layer, the third anode side organic layer, and the fourth anode side organic layer are arranged in this order from the anode.

In an arrangement of the organic EL device according to the exemplary embodiment, the fourth anode side organic layer is a blocking layer. For instance, when the blocking layer is disposed close to the anode with respect to the emitting layer, the blocking layer permits transport of holes and blocks electrons from reaching each organic layer in the hole transporting zone provided closer to the anode than the blocking layer. Alternatively, the blocking layer may be provided in direct contact with the emitting layer so that excitation energy does not leak out from the emitting layer toward neighboring layer(s). The blocking layer disposed close to the anode with respect to the emitting layer blocks excitons generated in the emitting layer from transferring to each organic layer in the hole transporting zone. The emitting layer is preferably in direct contact with the blocking layer.

In an arrangement of the organic EL device according to the exemplary embodiment, the fourth anode side organic layer contains a fourth hole transporting zone material.

In an arrangement of the organic EL device according to the exemplary embodiment, the fourth hole transporting zone material and the third hole transporting zone material are different compounds.

In an arrangement of the organic EL device according to the exemplary embodiment, the fourth hole transporting zone material, the third hole transporting zone material and a second hole transporting zone material are different compounds.

In an arrangement of the organic EL device according to the exemplary embodiment, the fourth anode side organic layer contains at least one compound selected from the group consisting of the compound represented by the formula (cHT3-1), the compound represented by the formula (cHT3-2), the compound represented by the formula (cHT3-3) and the compound represented by the formula (cHT3-4).

In an arrangement of the organic EL device according to the exemplary embodiment, both the third anode side organic layer and the fourth anode side organic layer may contain the compound represented by the formula (cHT3-1). The compound contained in the third anode side organic layer and the compound contained in the fourth anode side organic layer are mutually different in a molecular structure.

In an arrangement of the organic EL device according to the exemplary embodiment, the first anode side organic layer, the second anode side organic layer, the third anode side organic layer and the fourth anode side organic layer each contain at least one compound, the respective compounds contained in the first, second, third and fourth anode side organic layers being different from each other.

In an arrangement of the organic EL device according to the exemplary embodiment, the first anode side organic layer, the second anode side organic layer, the third anode side organic layer and the fourth anode side organic layer each contain a monoamine compound having only one substituted or unsubstituted amino group in a molecule thereof.

In an arrangement of the organic EL device according to the exemplary embodiment, the first anode side organic layer, the second anode side organic layer, the third anode side organic layer and the fourth anode side organic layer do not contain a diamine compound.

In an arrangement of the organic EL device according to the exemplary embodiment, at least any of the first anode side organic layer, the second anode side organic layer, the third anode side organic layer and the fourth anode side organic layer also may contain a diamine compound.

In the exemplary embodiment, it is preferable that all groups described as "substituted or unsubstituted" groups are "unsubstituted" groups.

In the exemplary embodiment, the first hole transporting zone material, the second hole transporting zone material, the third hole transporting zone material, and the fourth hole transporting zone material may be referred to as a hole transporting zone material.

Manufacturing Method of Hole Transporting Zone Material

The hole transporting zone material according to the exemplary embodiment can be manufactured by a known method or through a known alternative reaction using a known material(s) tailored for the target compound in accordance with the known method.

Specific Examples of Hole Transporting Zone Material

Specific examples of the hole transporting zone material according to the exemplary embodiment include the following compounds. It should however be noted that the invention is not limited to the specific examples.

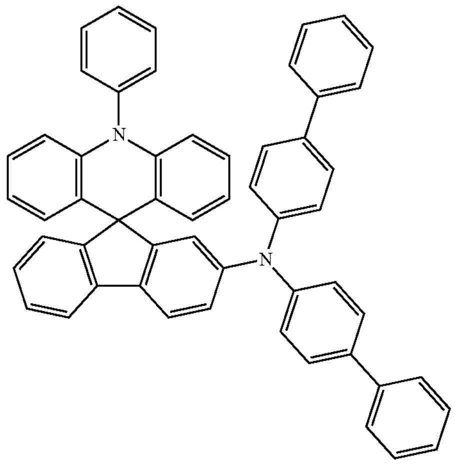

-continued
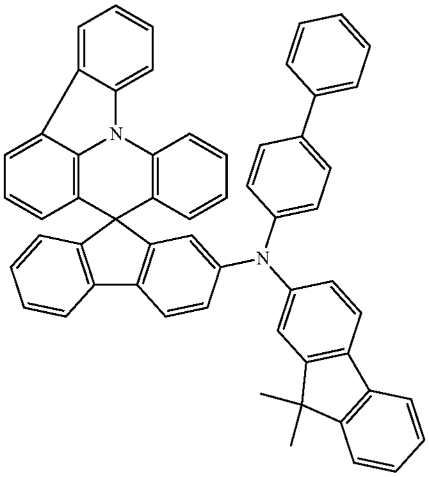
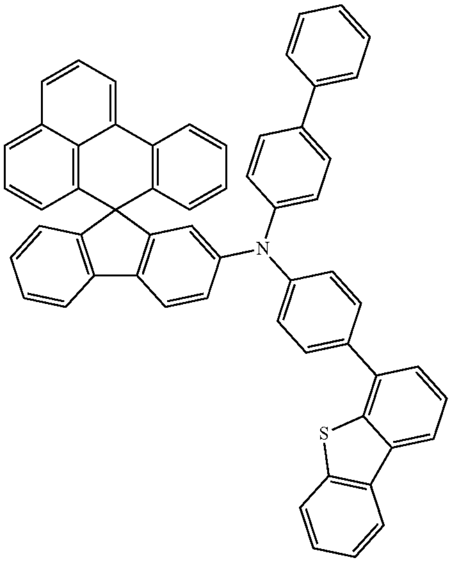
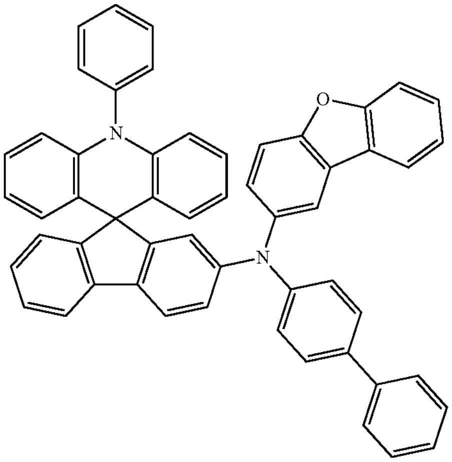
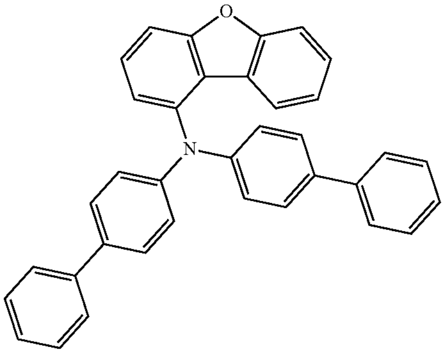
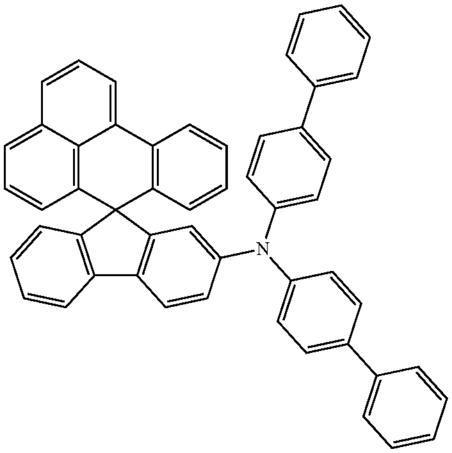
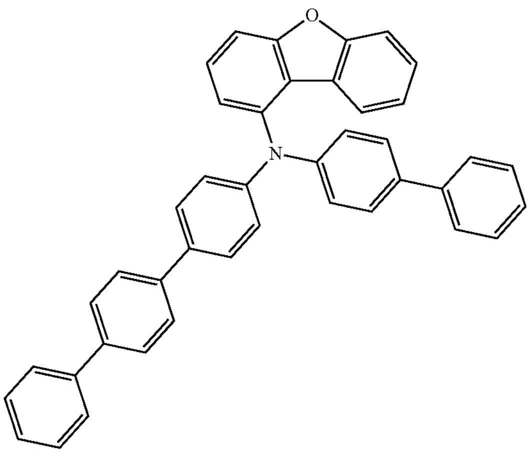
-continued -continued
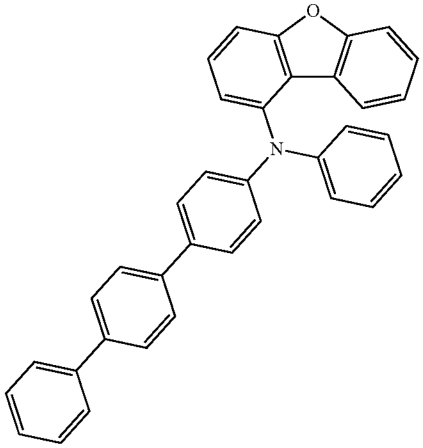
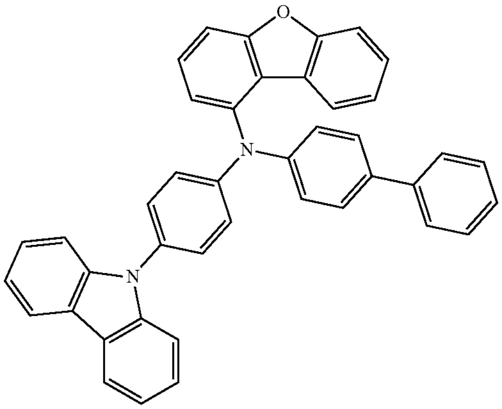
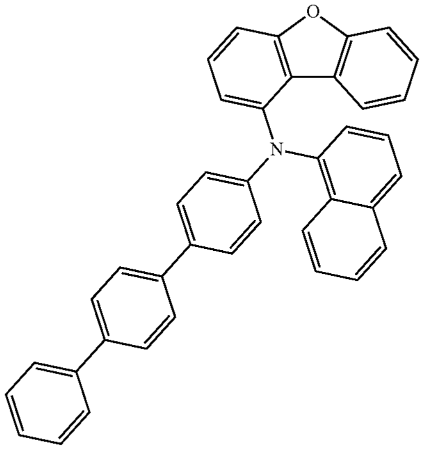
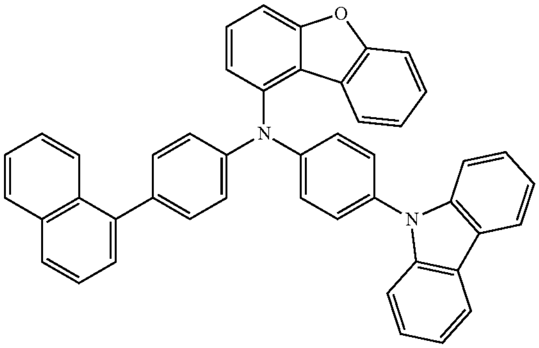
-continued
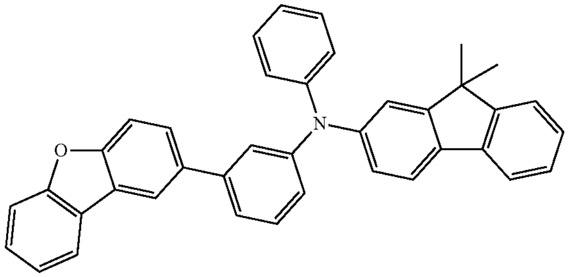
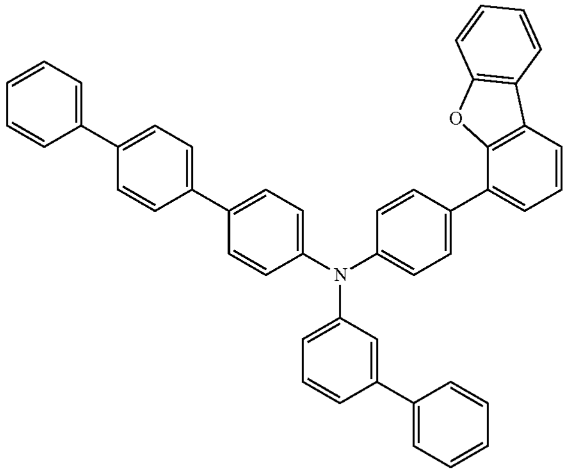
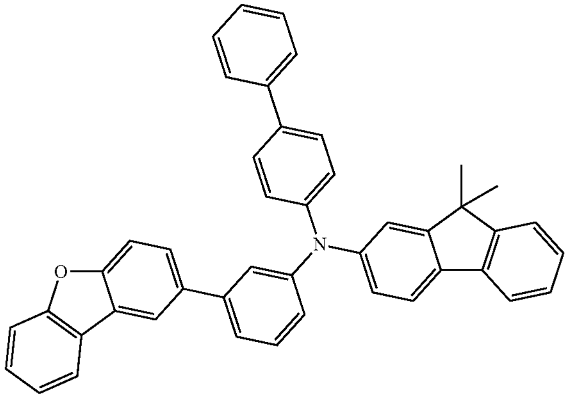
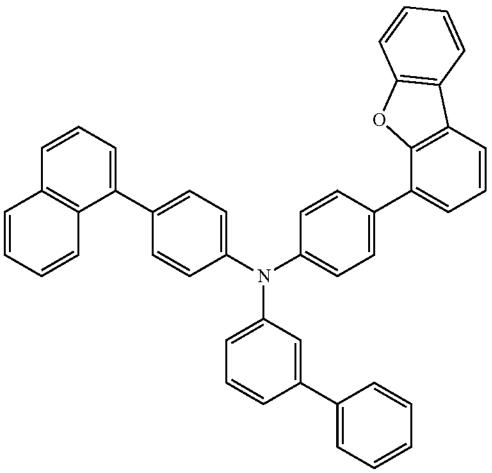

-continued
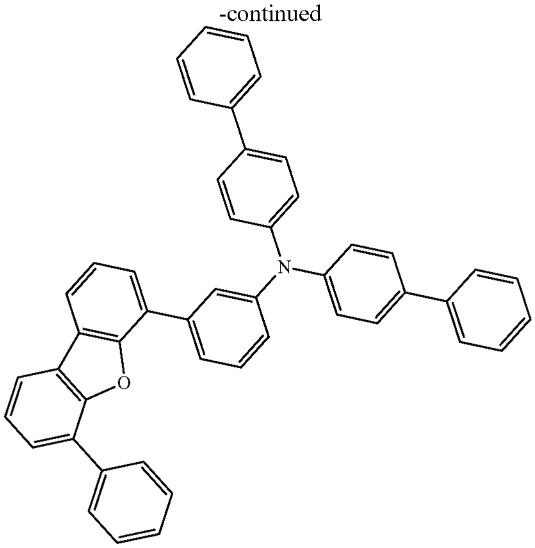
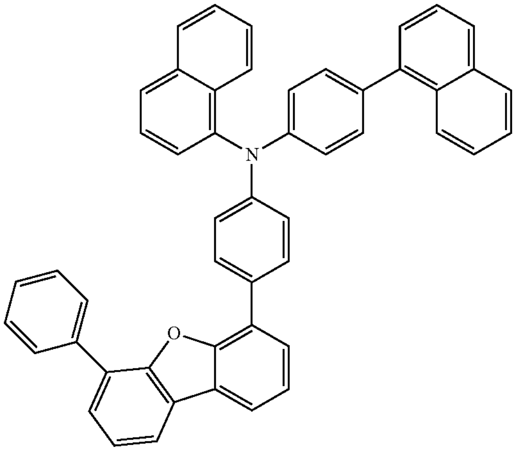
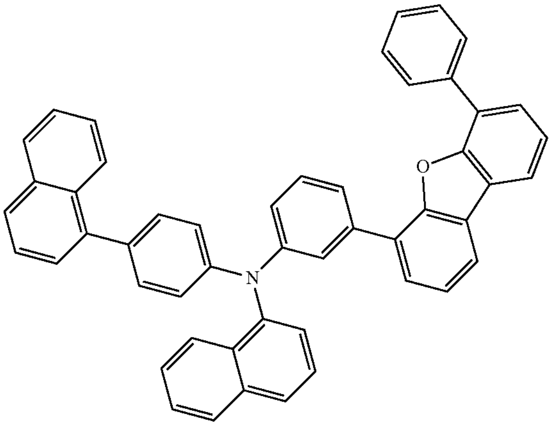
-continued
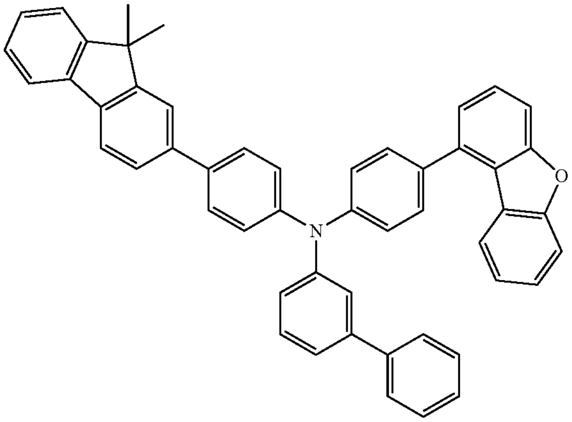
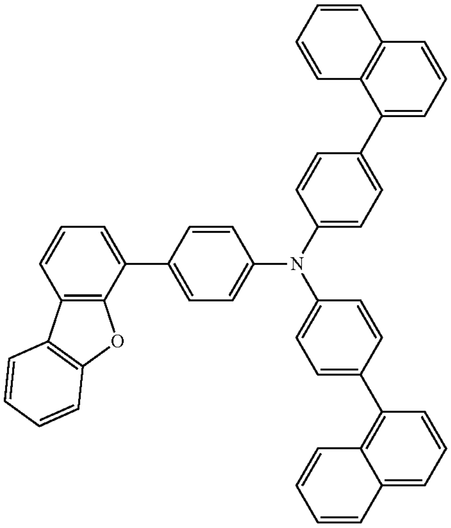
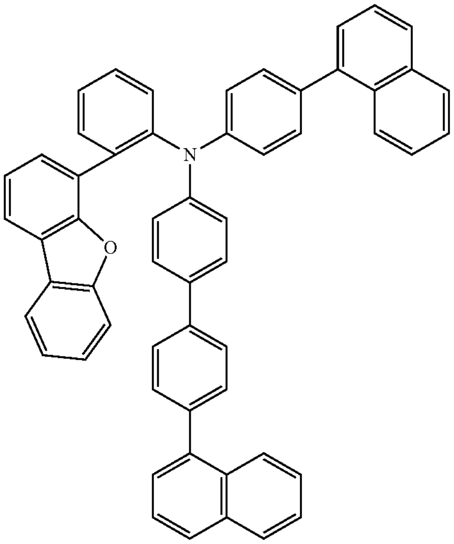

-continued
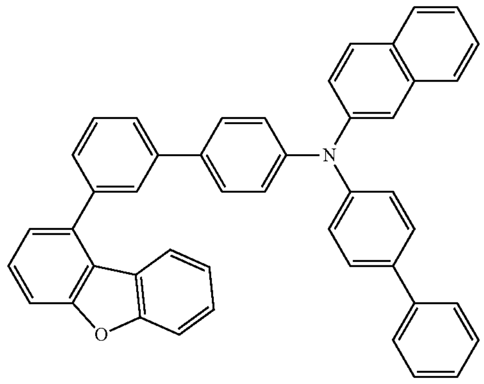
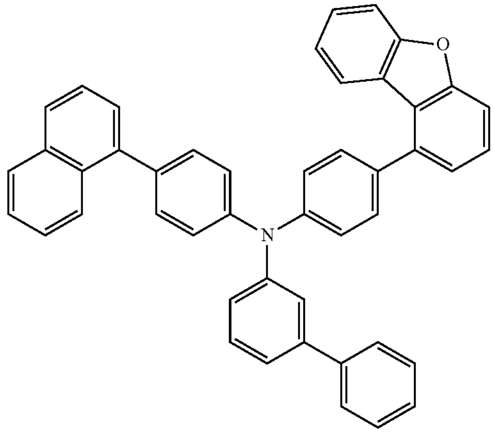
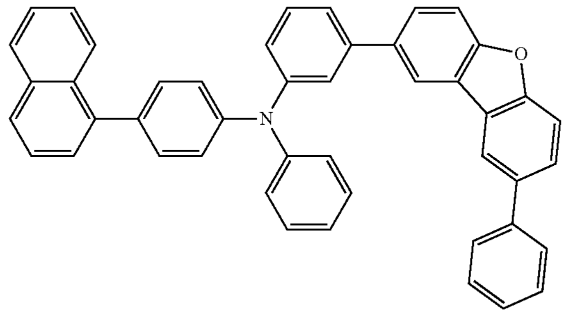
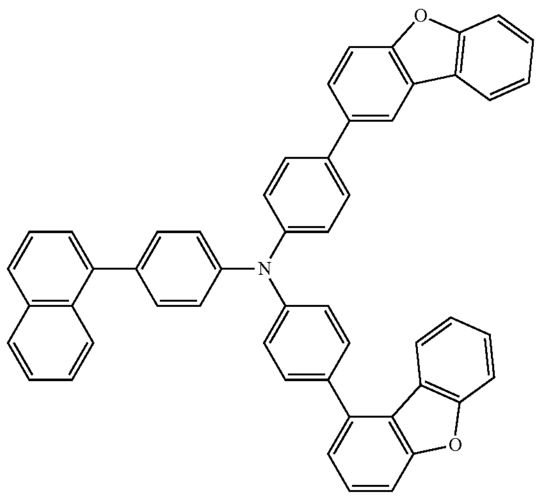
-continued
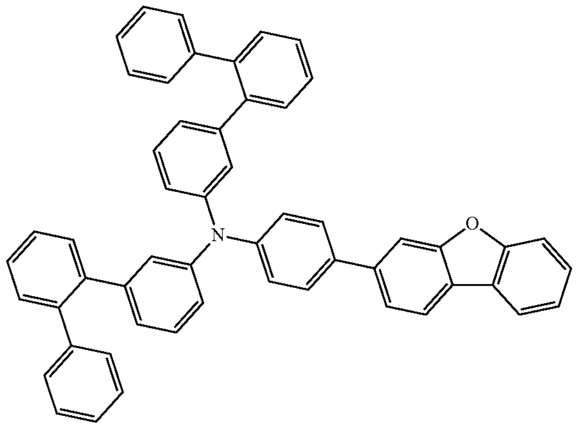
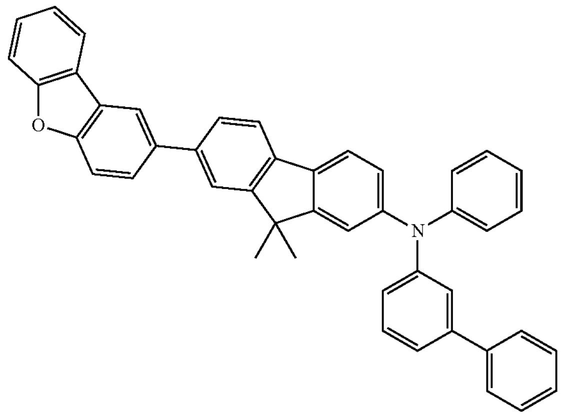
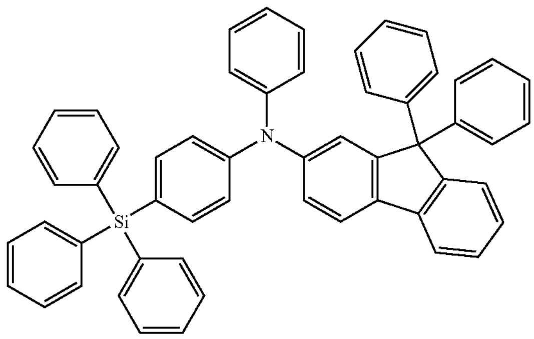
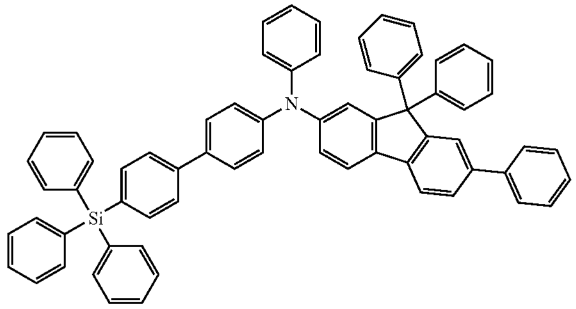

-continued
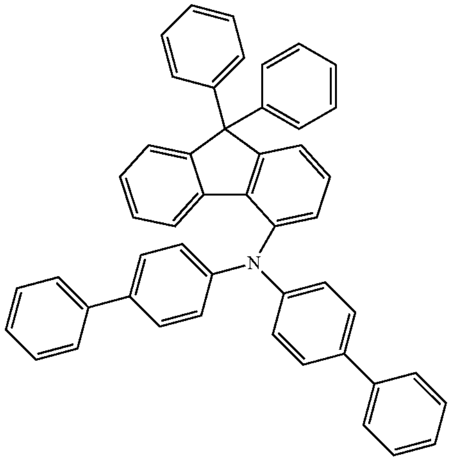
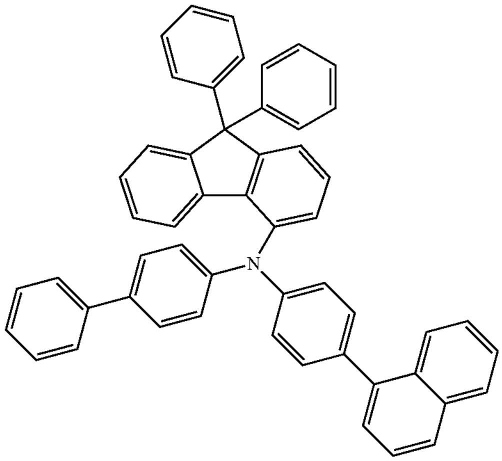
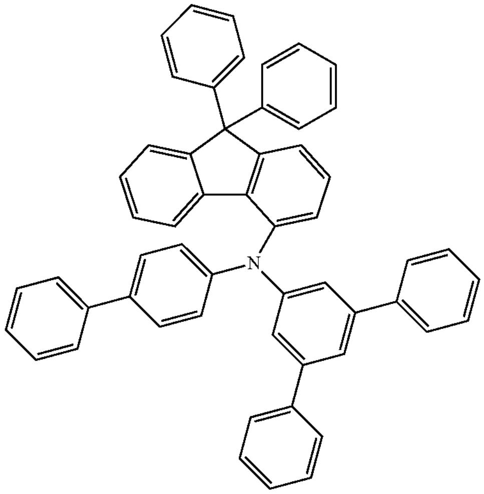
-continued
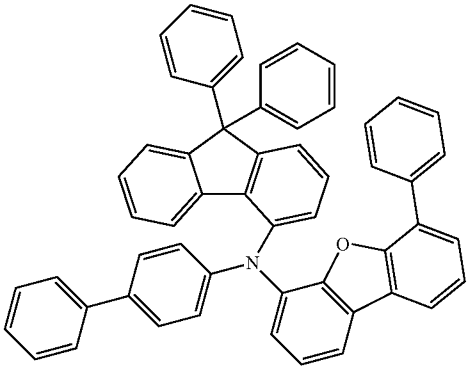
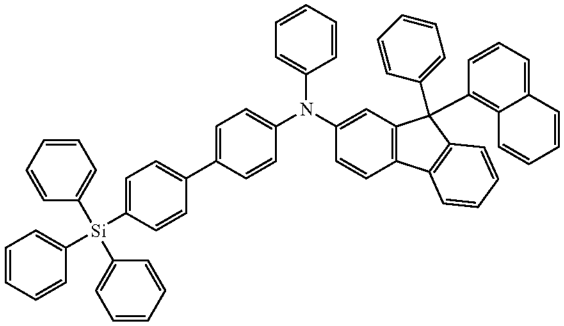
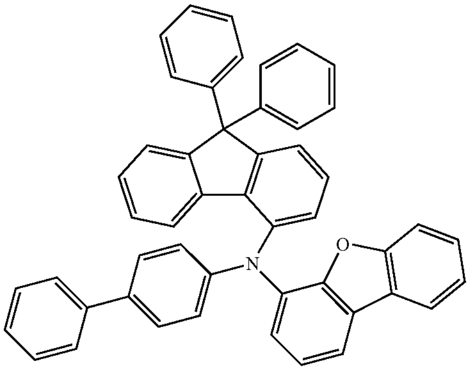
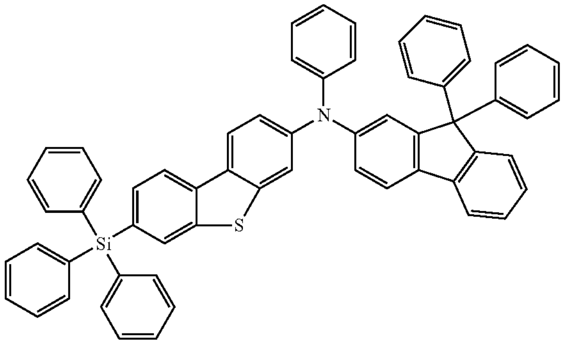

-continued
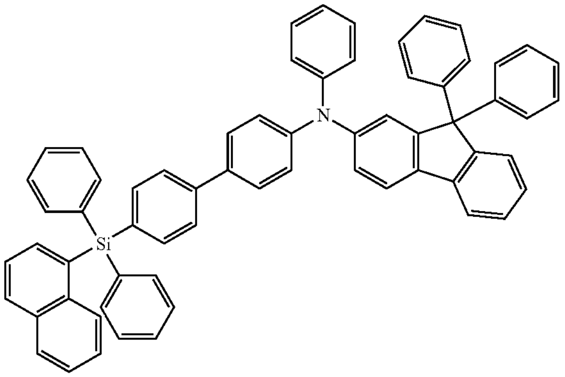
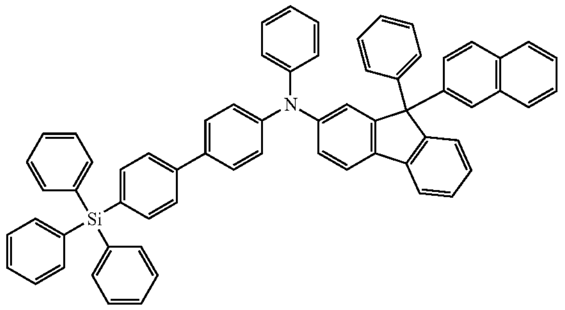
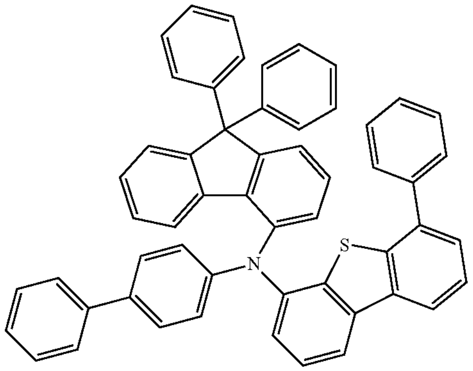
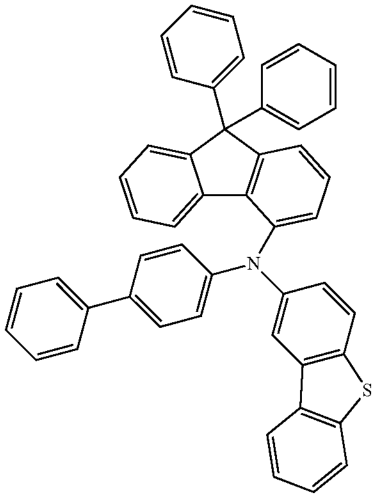
-continued
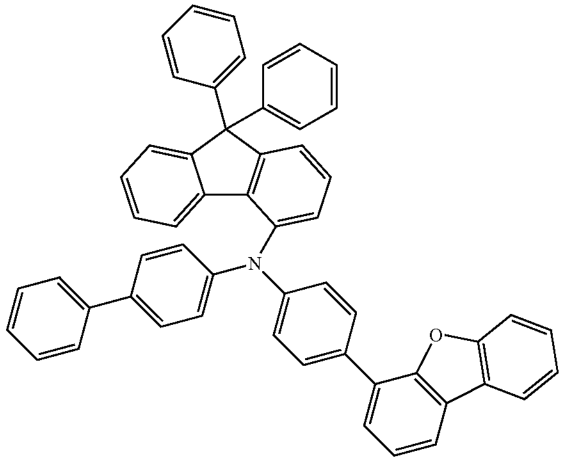
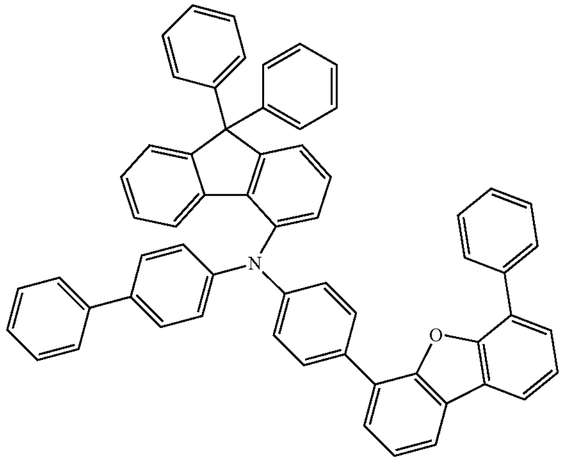
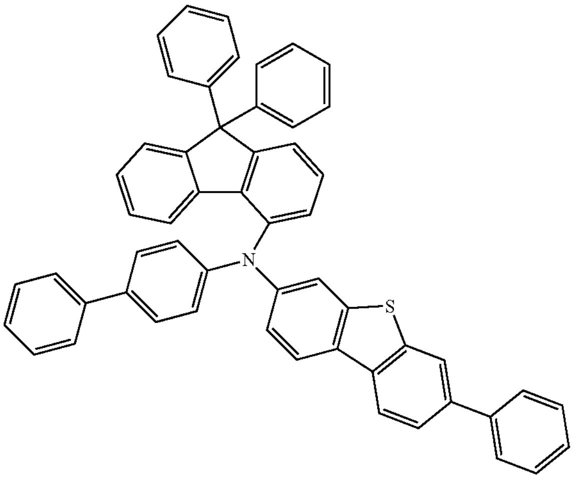

-continued
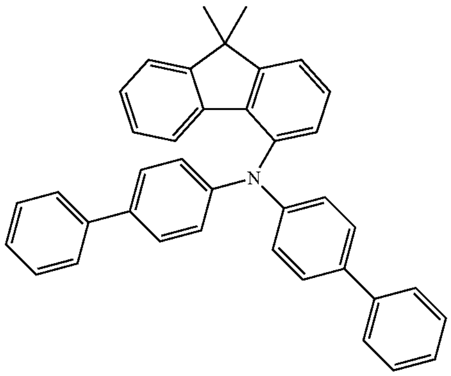
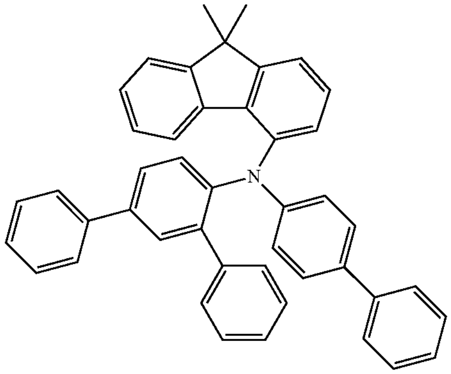
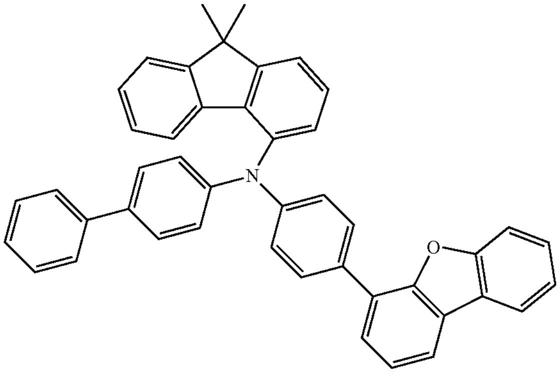
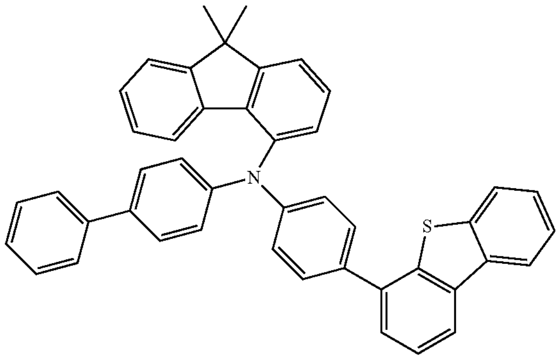
-continued
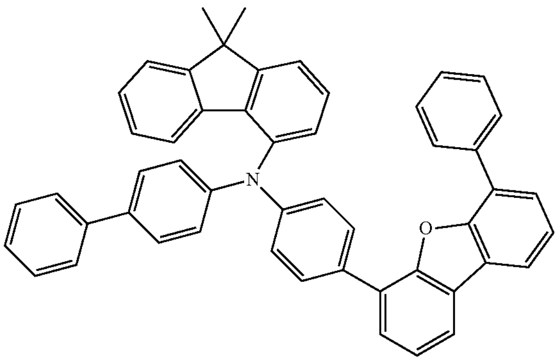
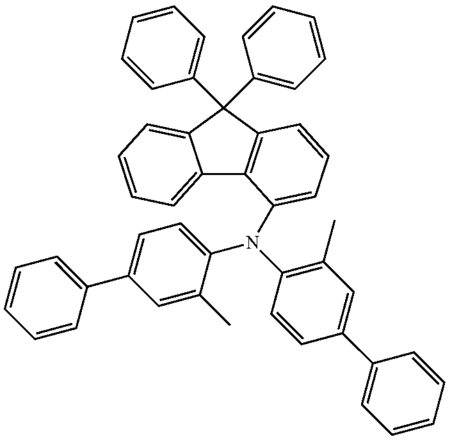
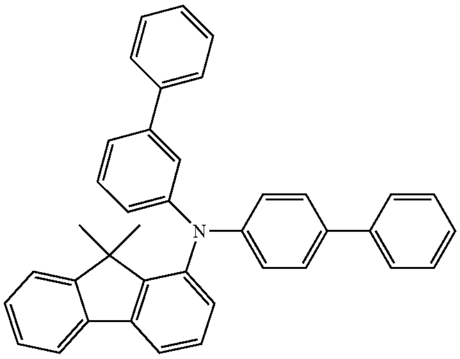
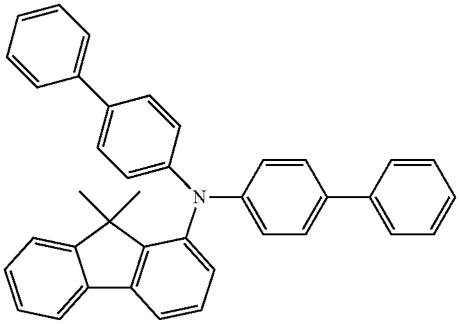

-continued
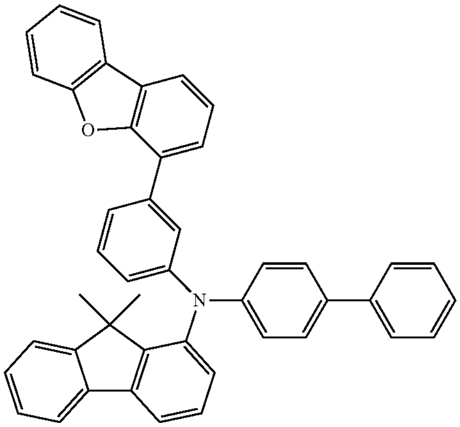
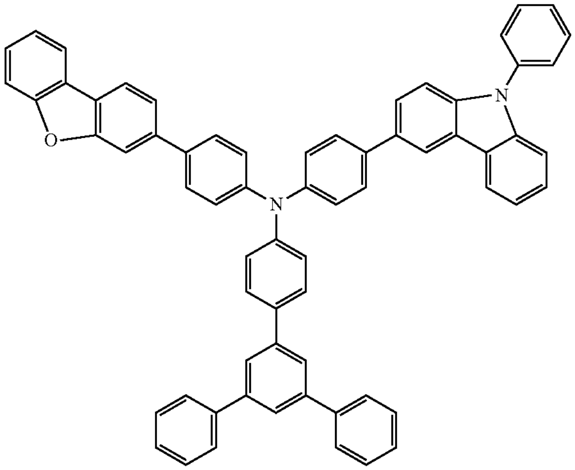
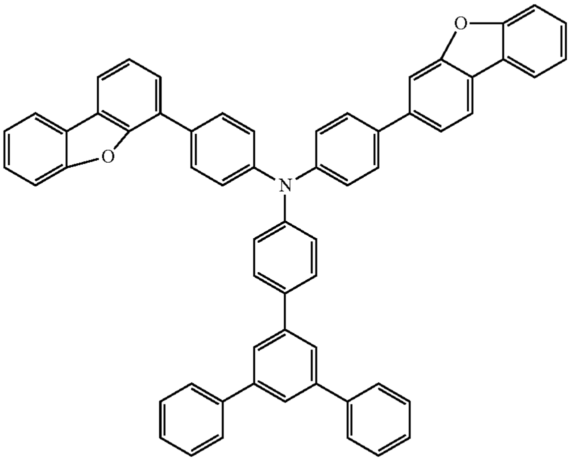
-continued
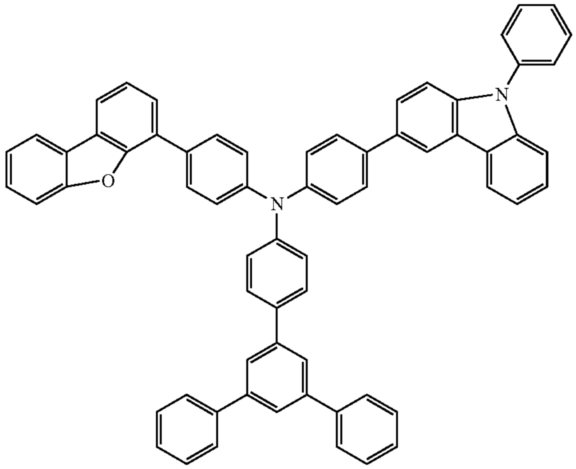
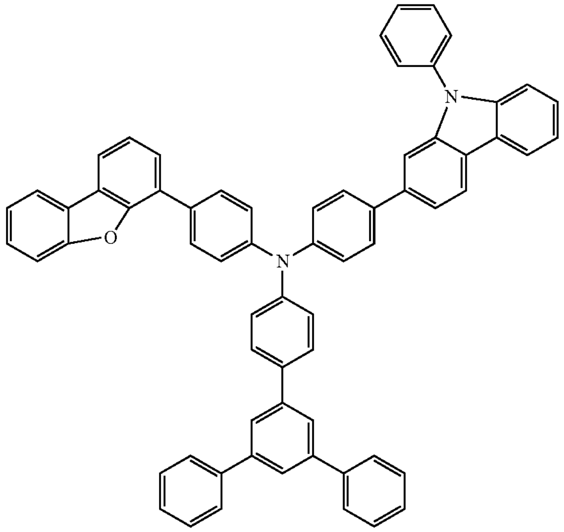
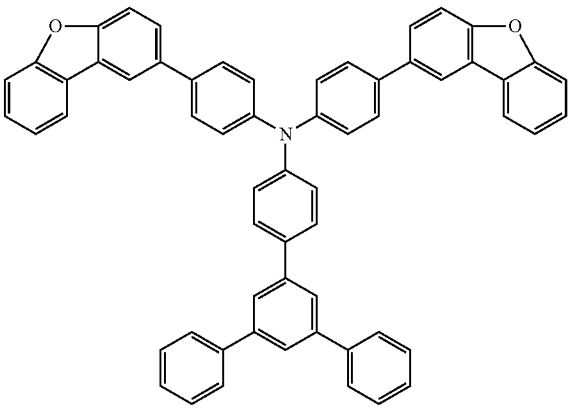

-continued
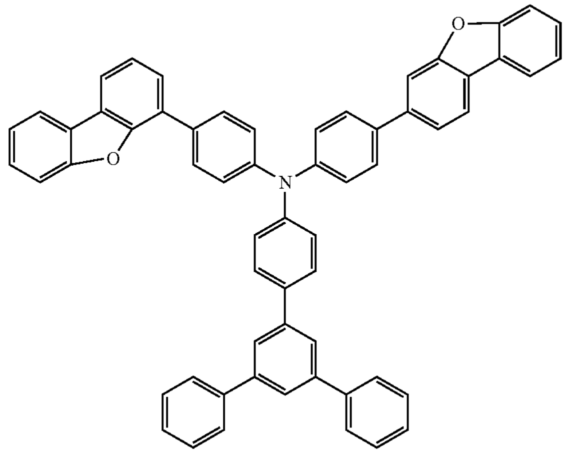
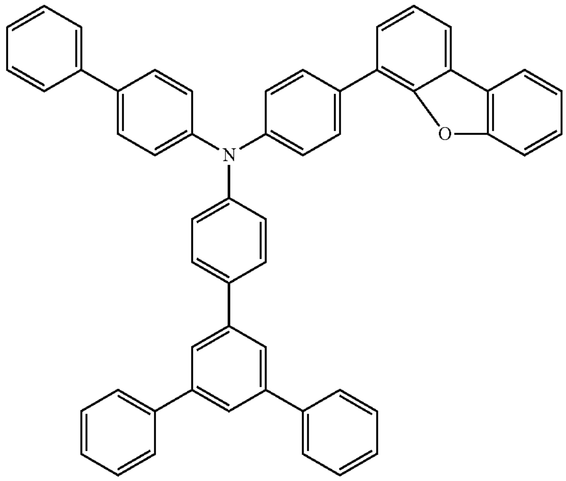
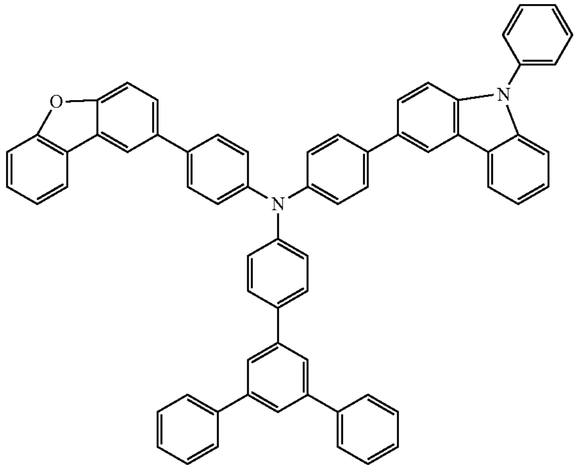
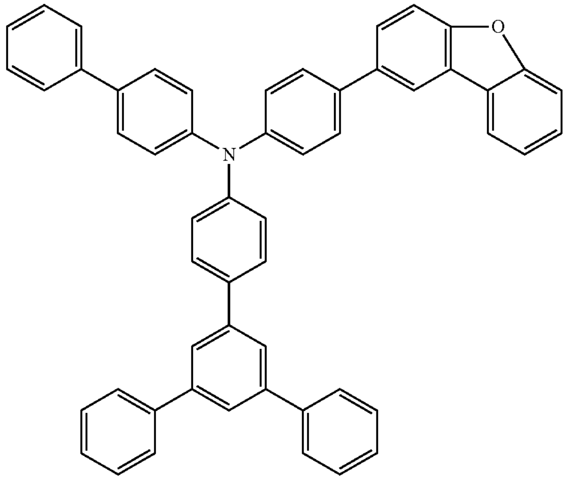
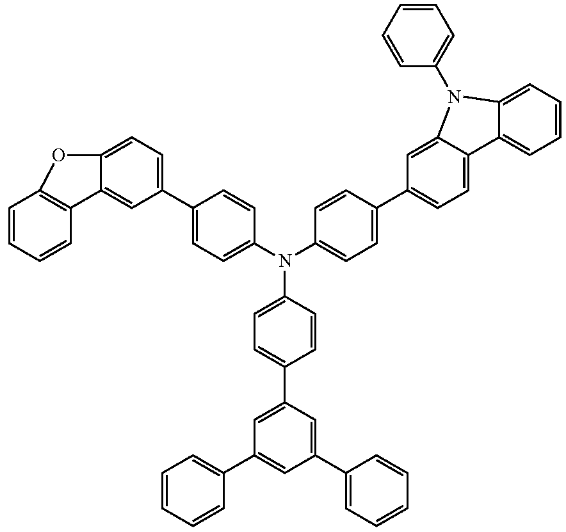
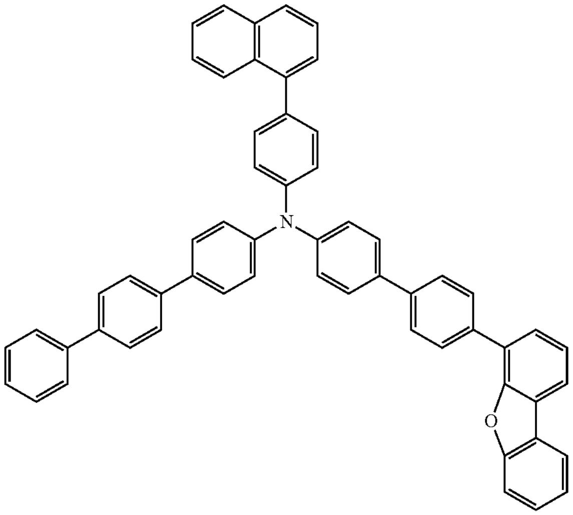
-continued -continued
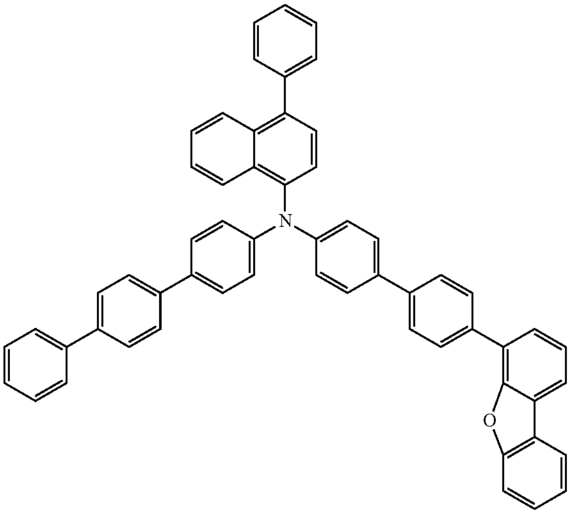
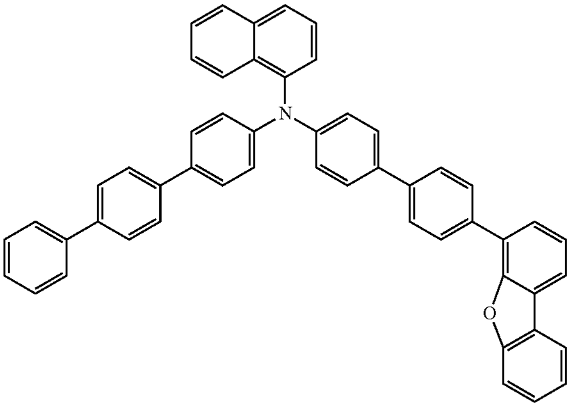
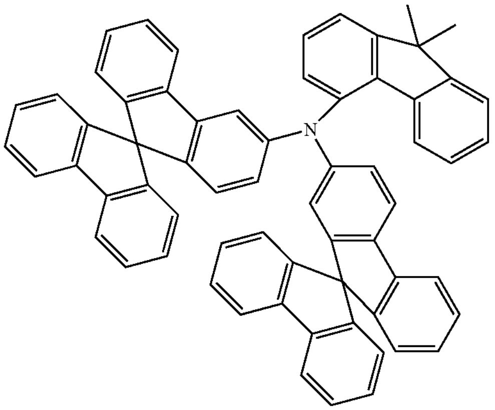
-continued
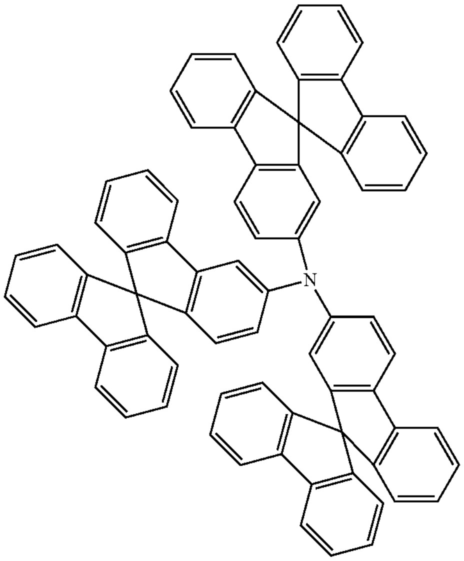
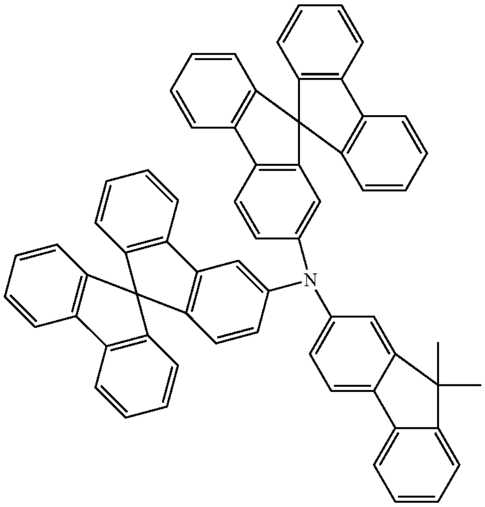
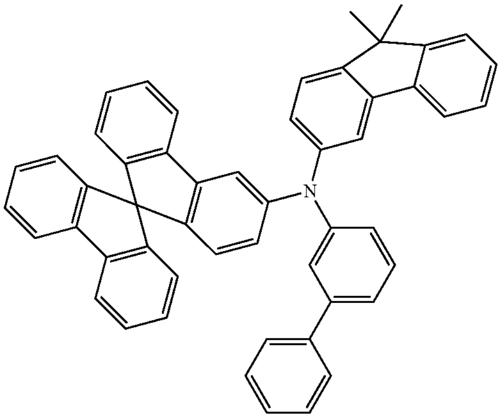

-continued
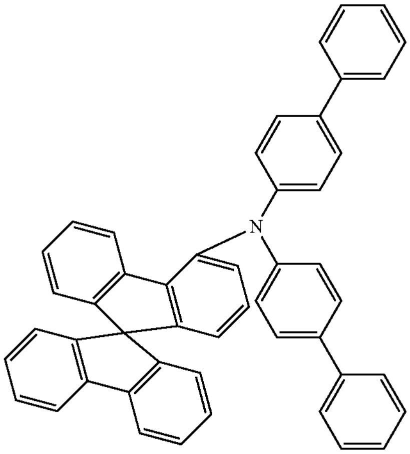
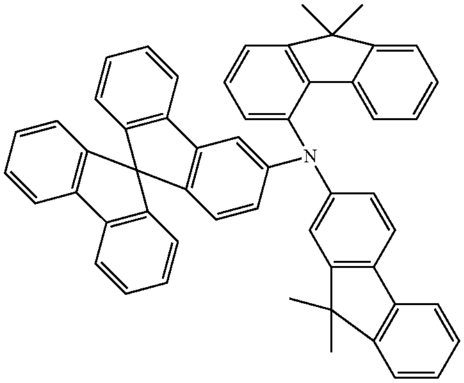
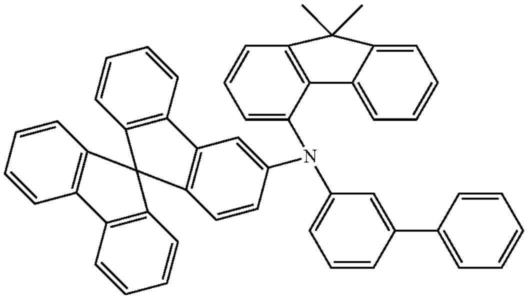
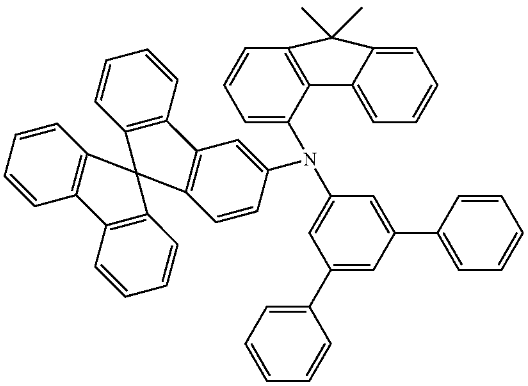
-continued
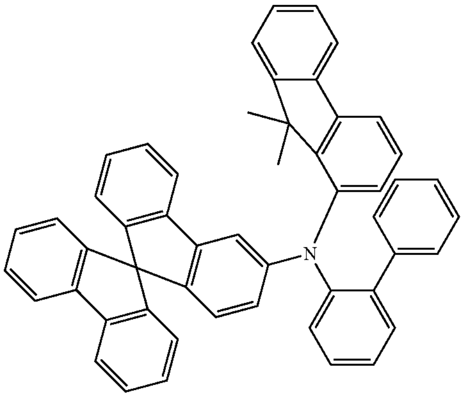
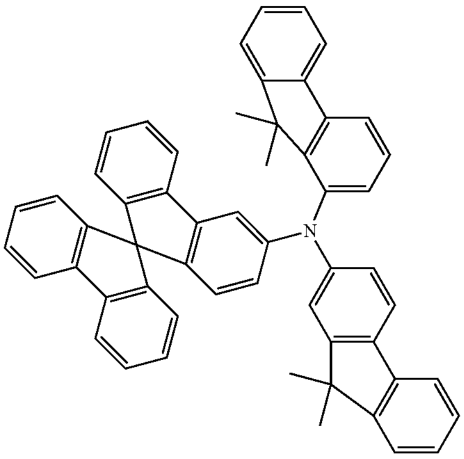
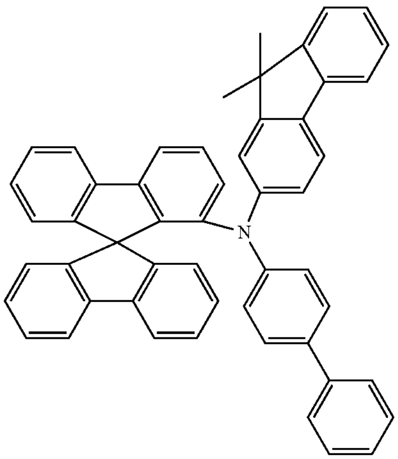

-continued
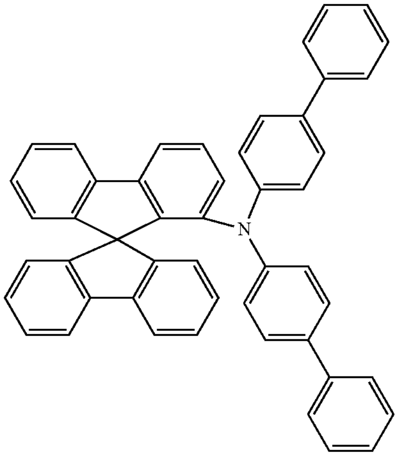
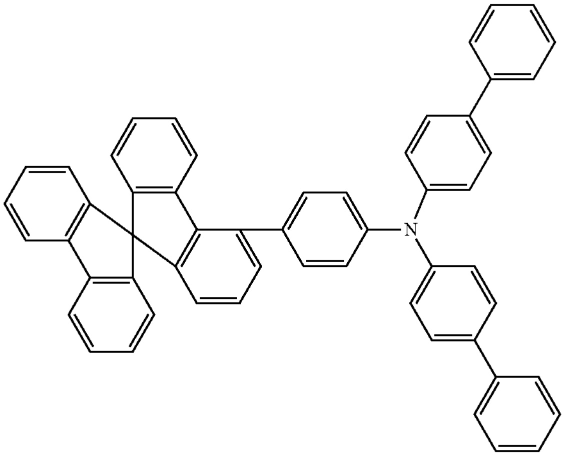
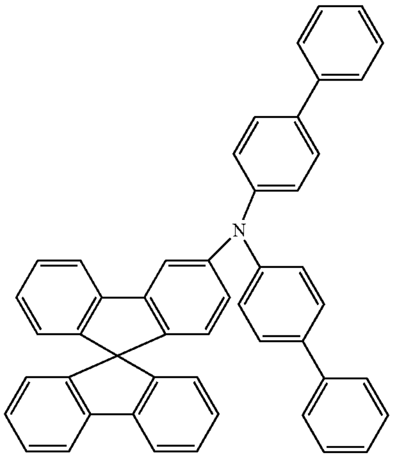
-continued
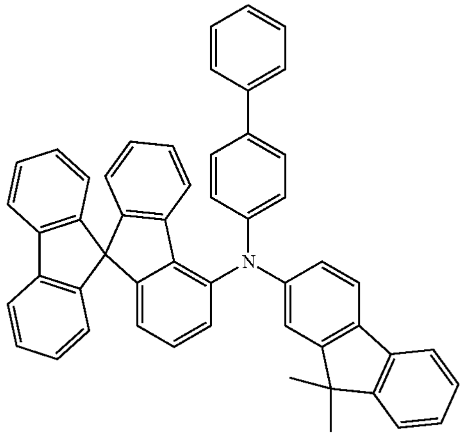
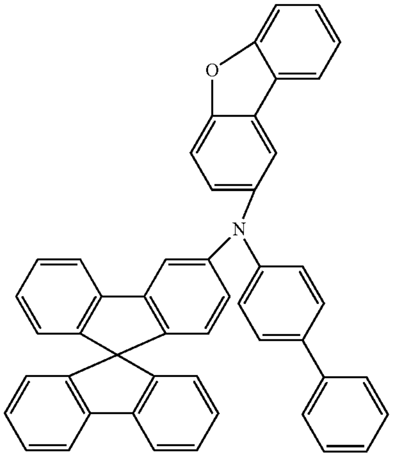
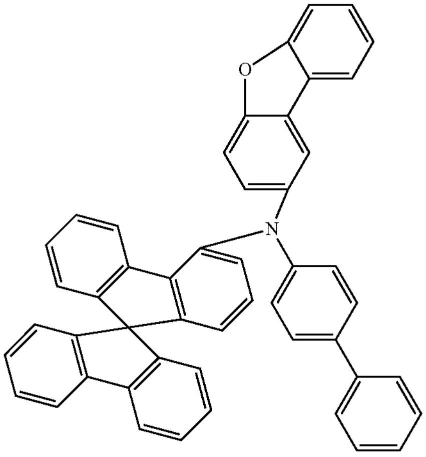

-continued
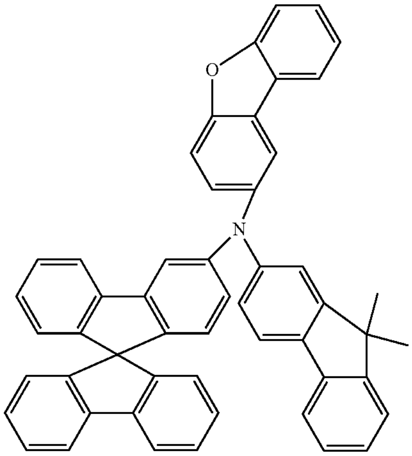
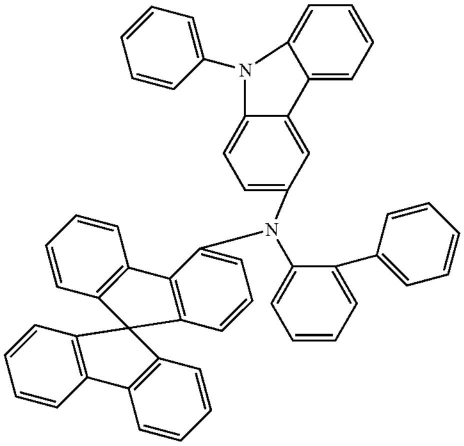
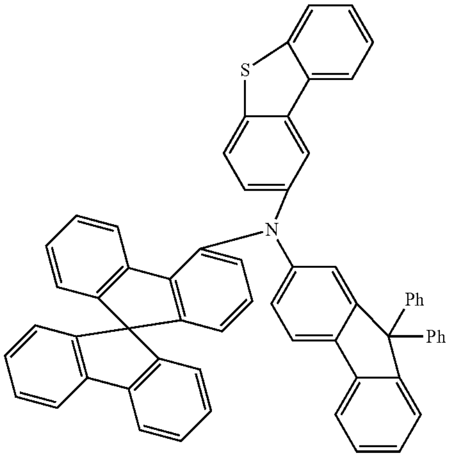
-continued
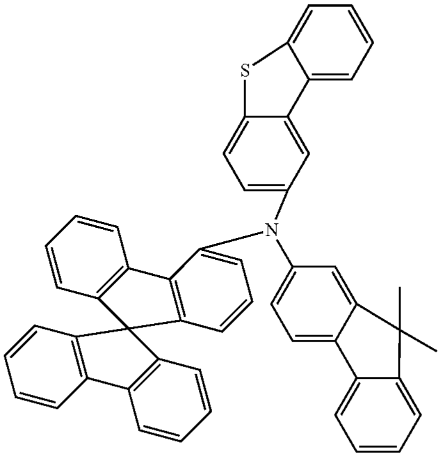
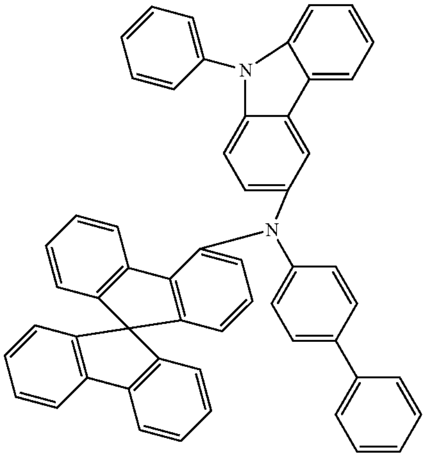
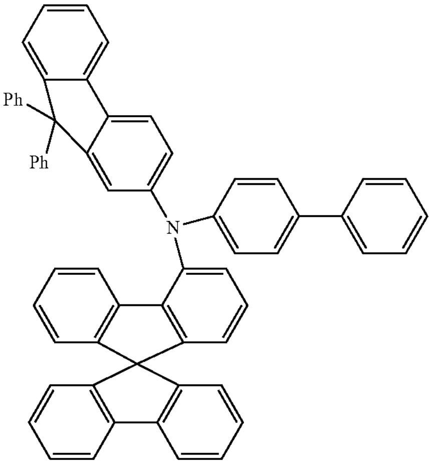

-continued
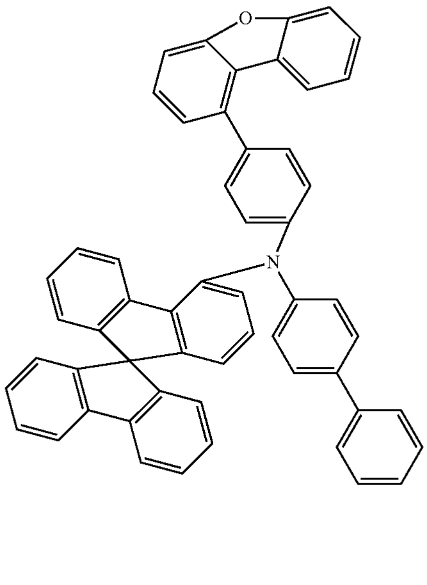
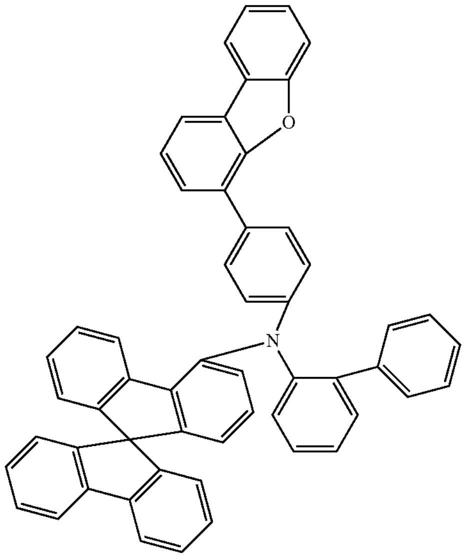
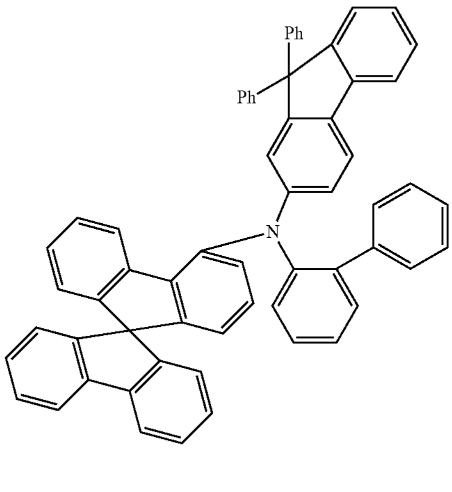
-continued
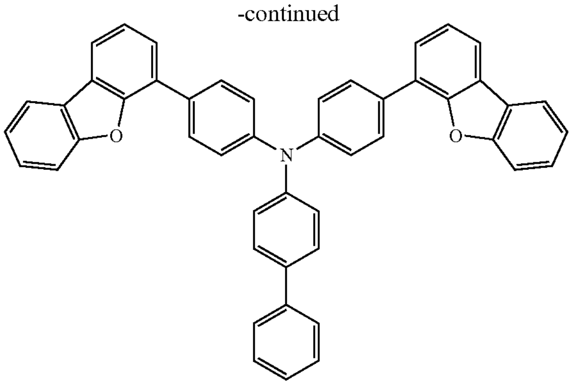
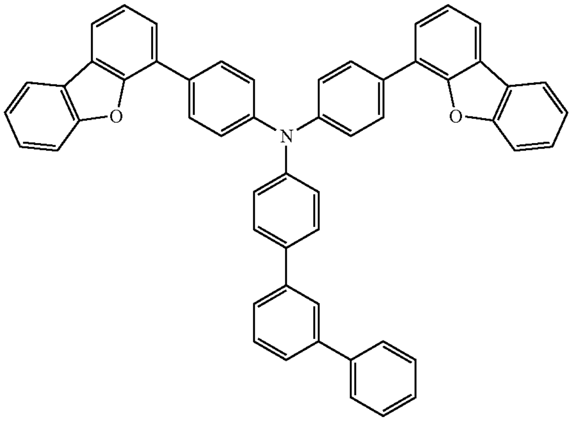
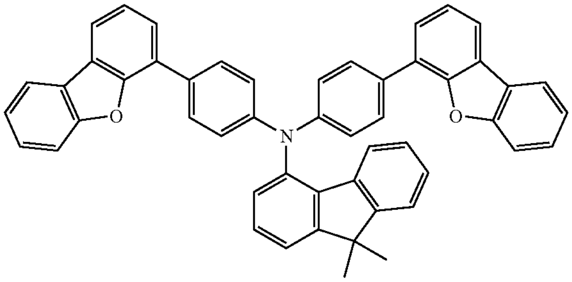
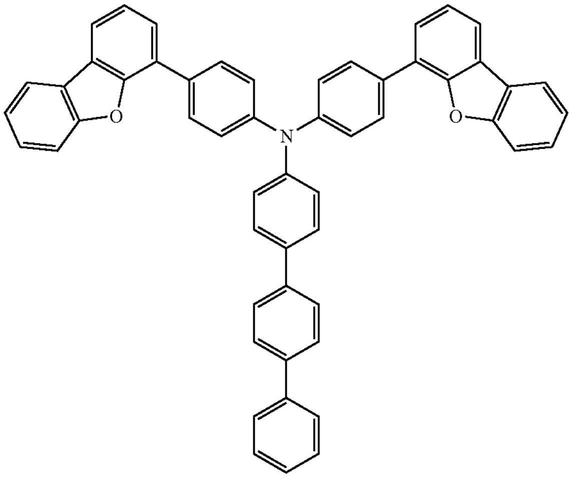

-continued
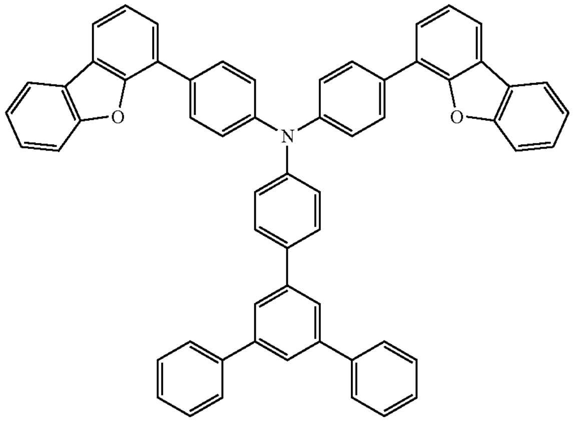
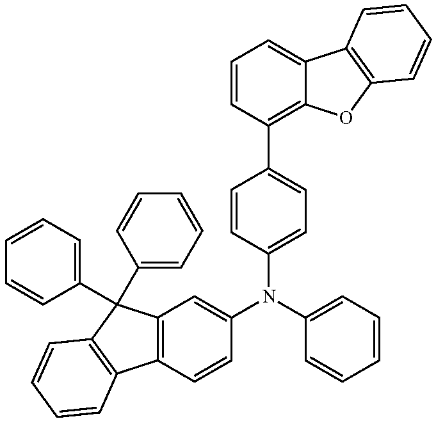
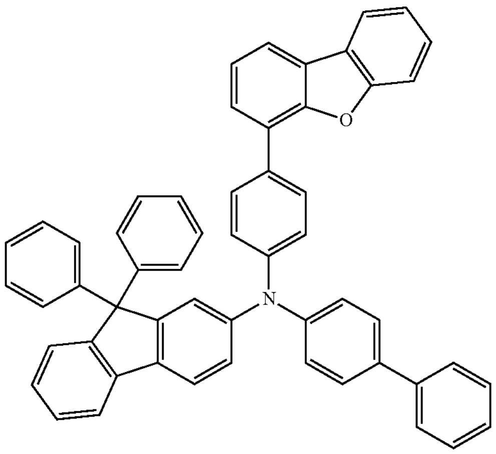
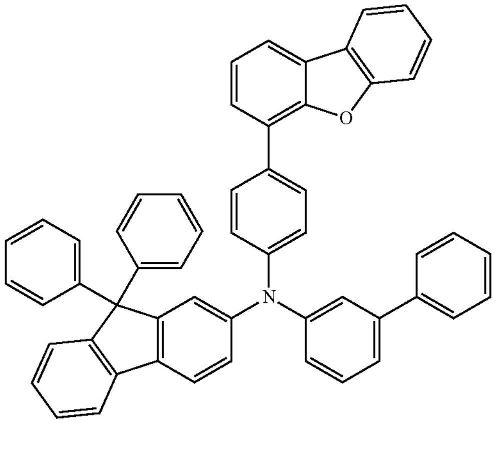
-continued
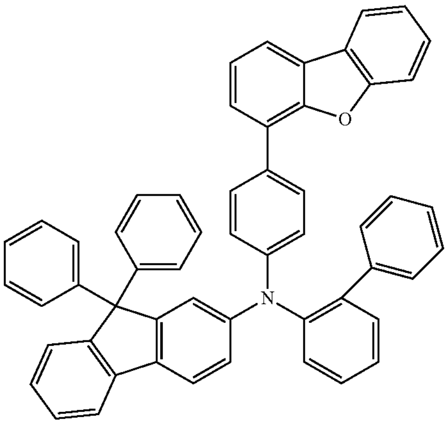
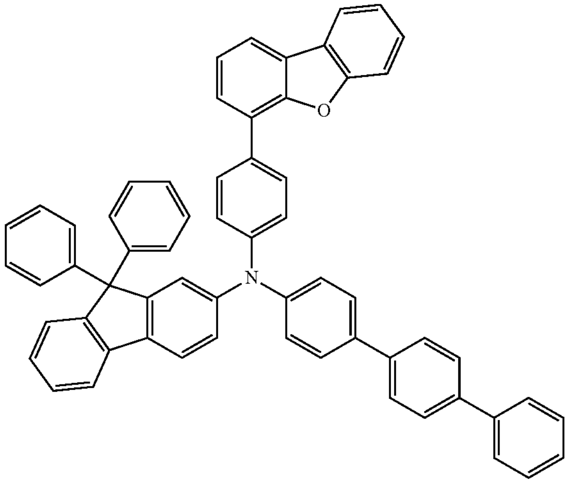
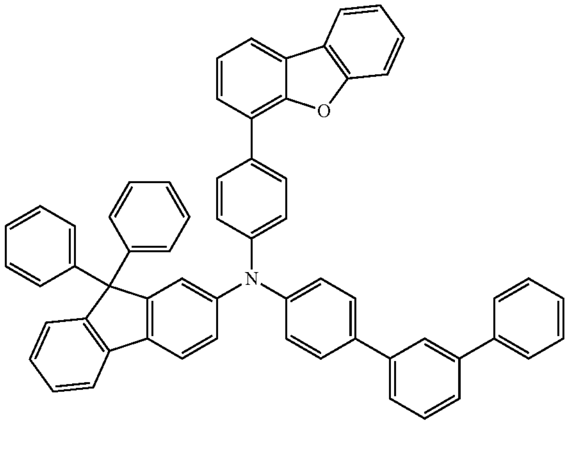

-continued
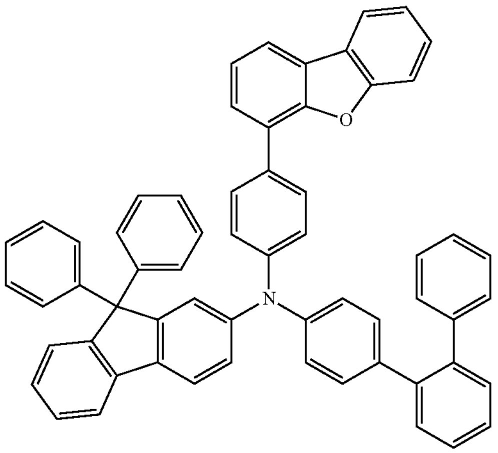
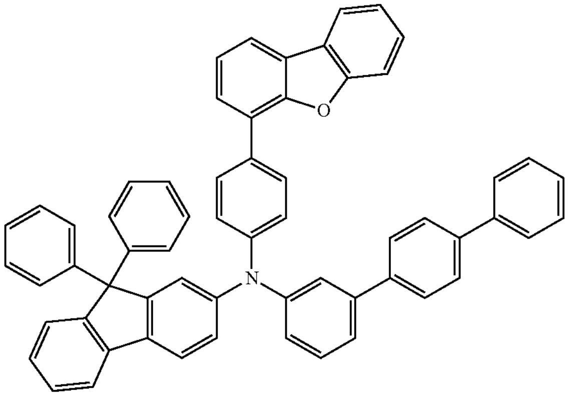
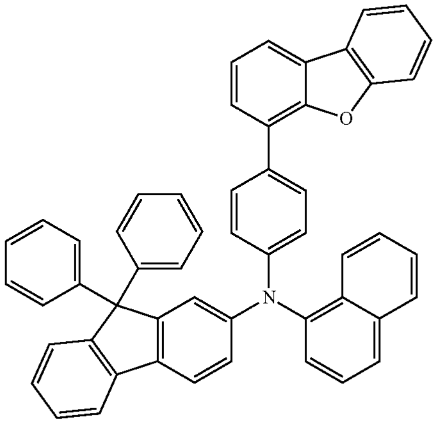
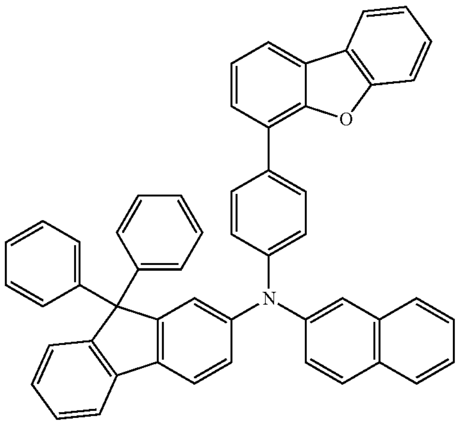
-continued
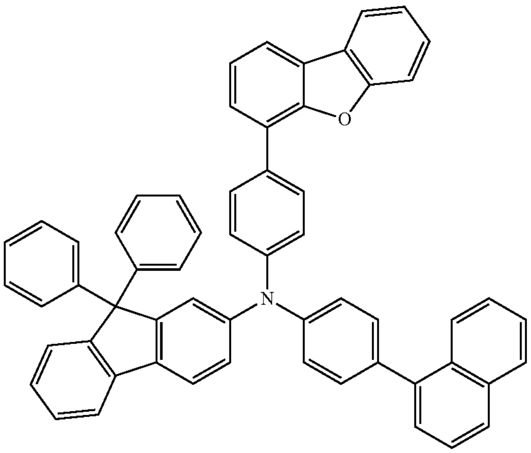
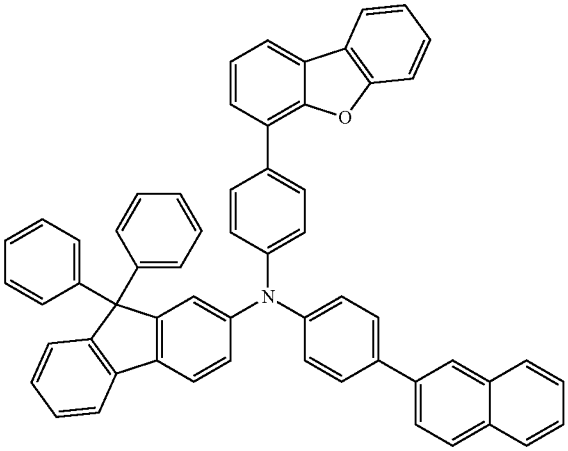
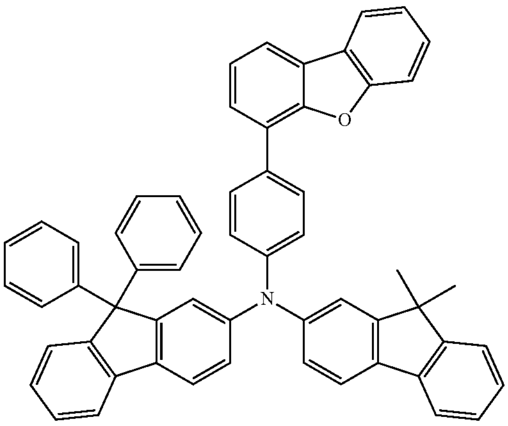

-continued
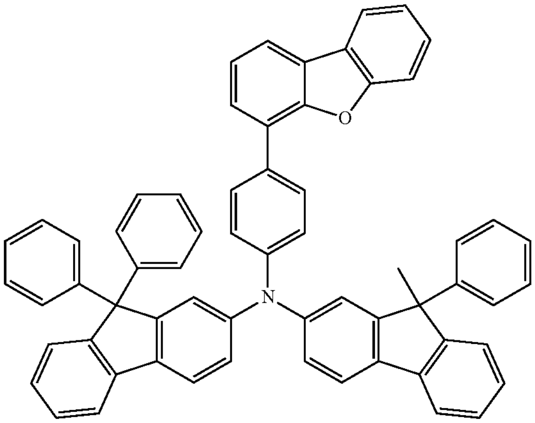
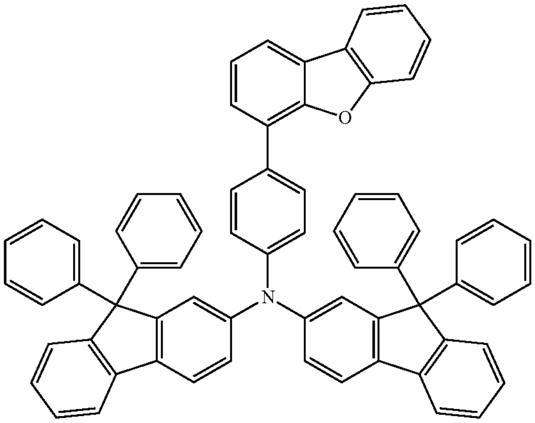
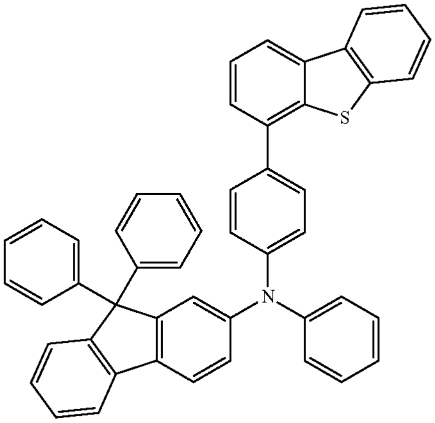
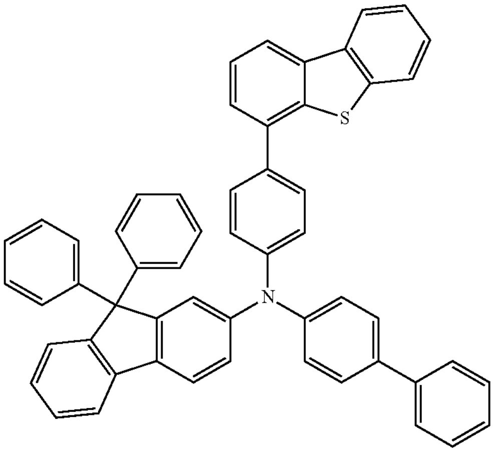
-continued
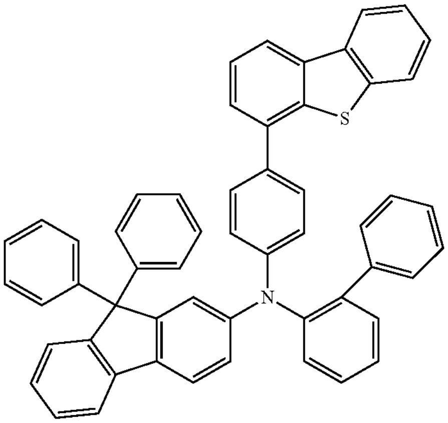
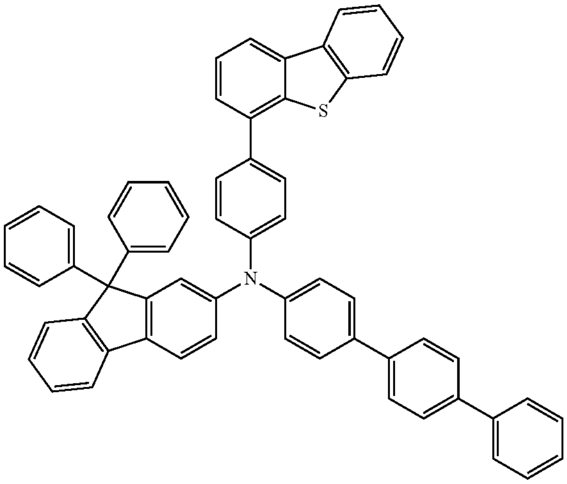
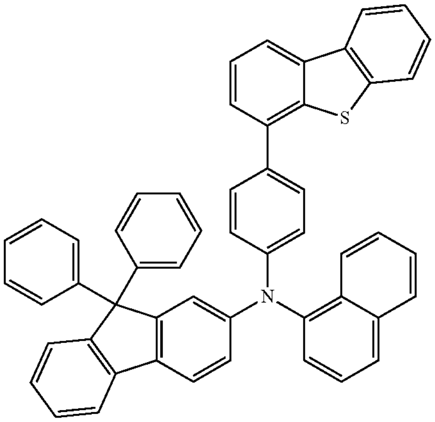

-continued
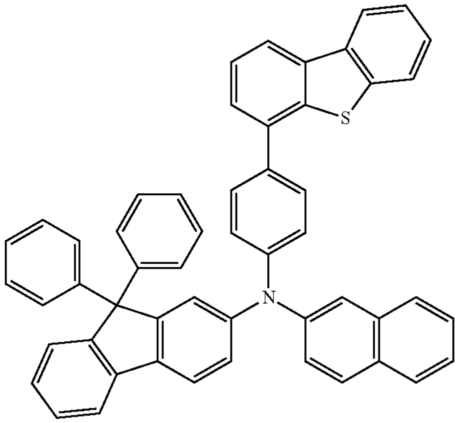
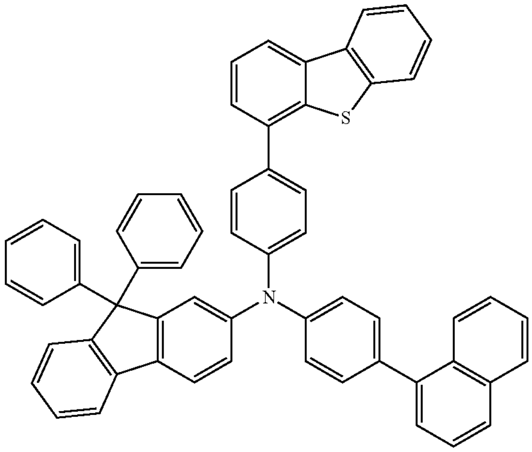
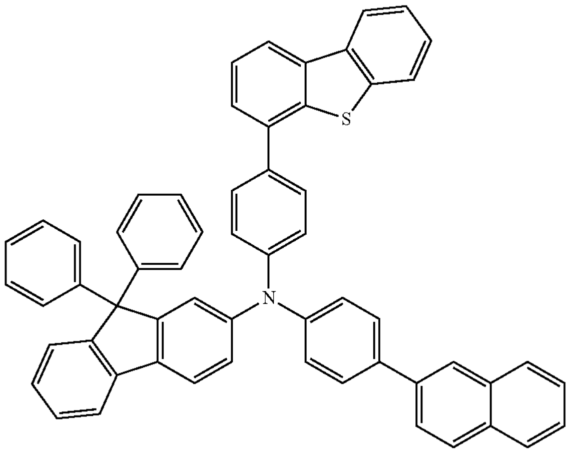
-continued
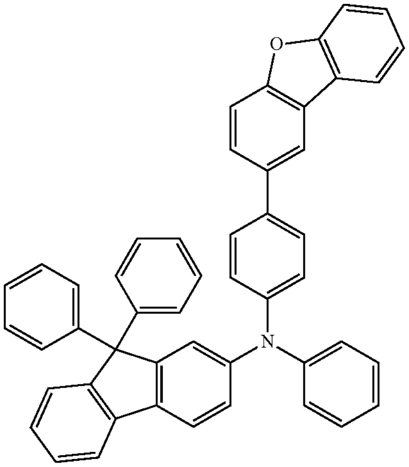
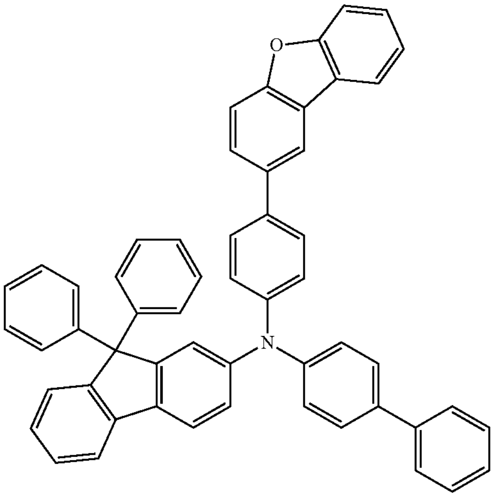
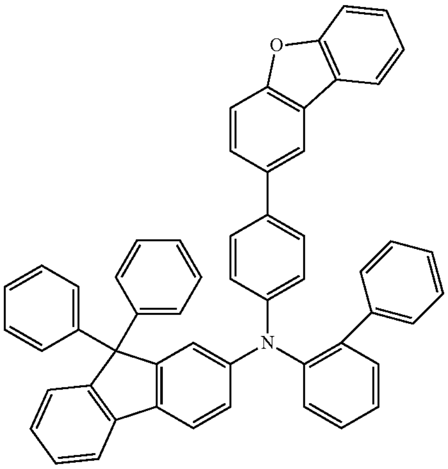

-continued
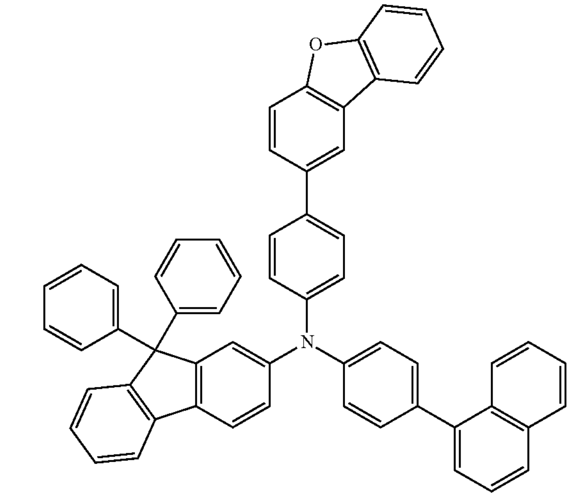
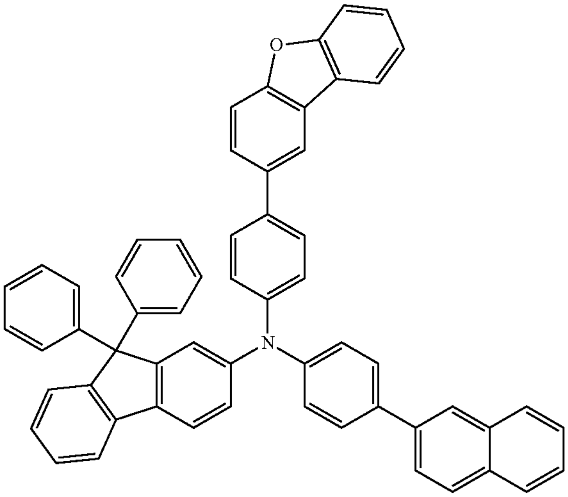
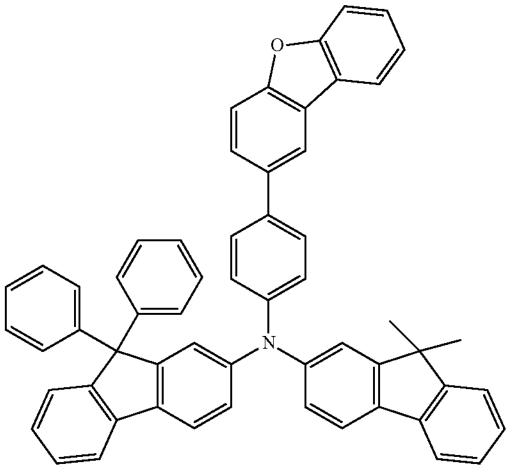
-continued
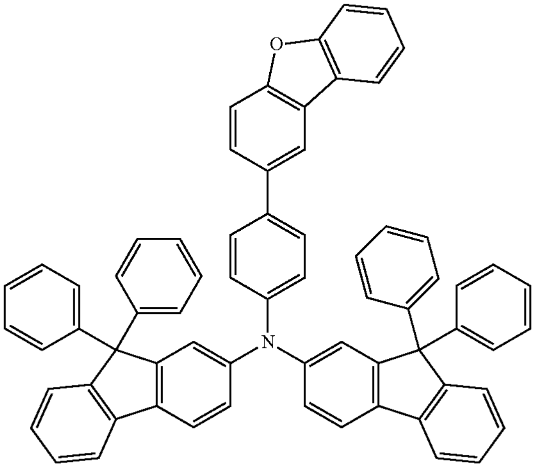
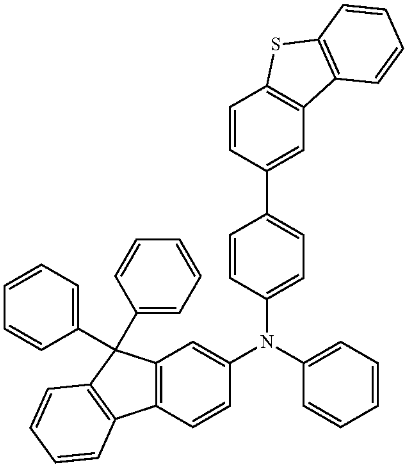
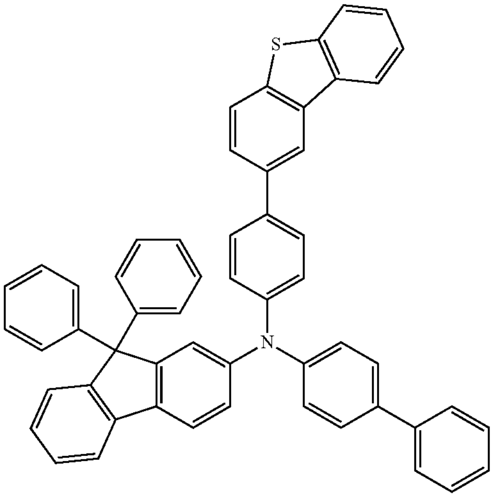

-continued
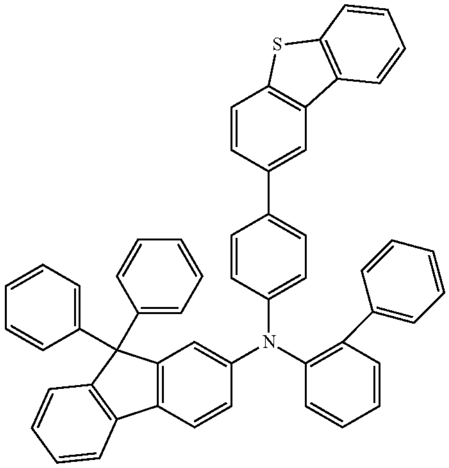
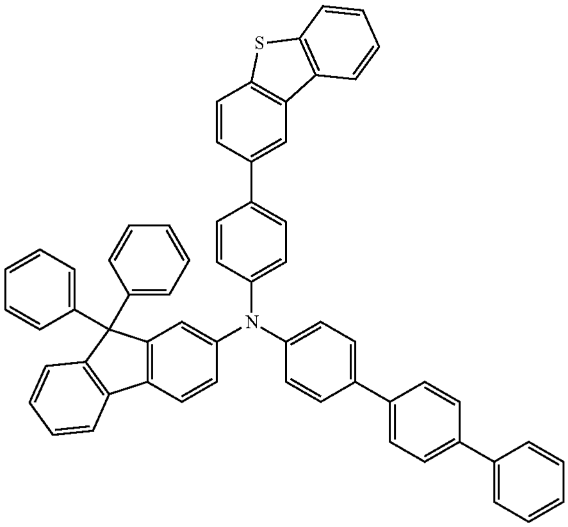
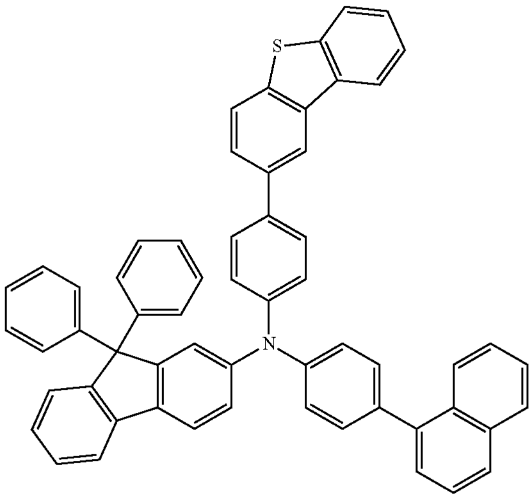
-continued
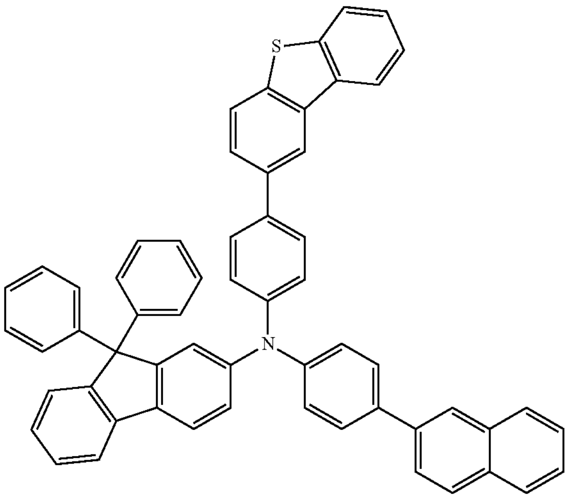
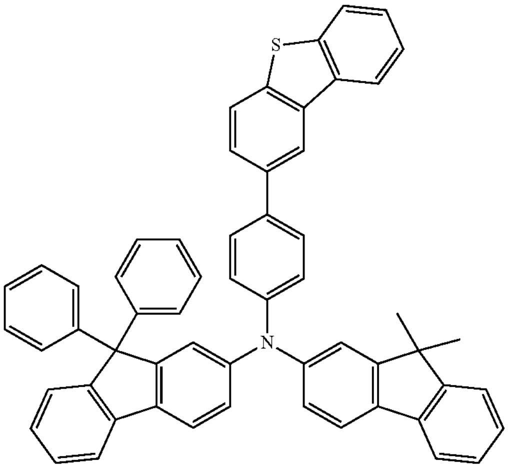
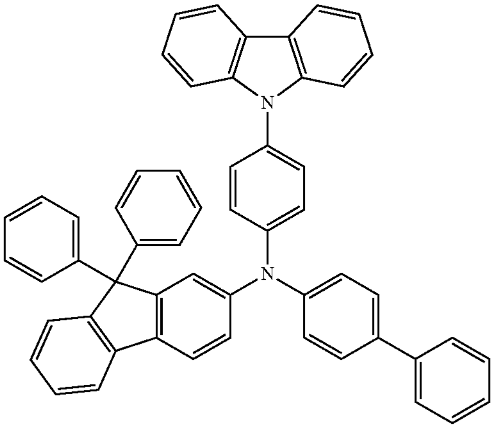

-continued
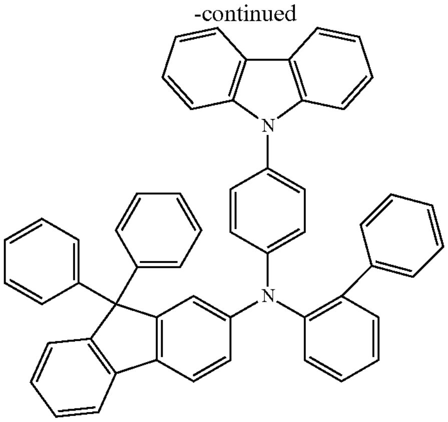
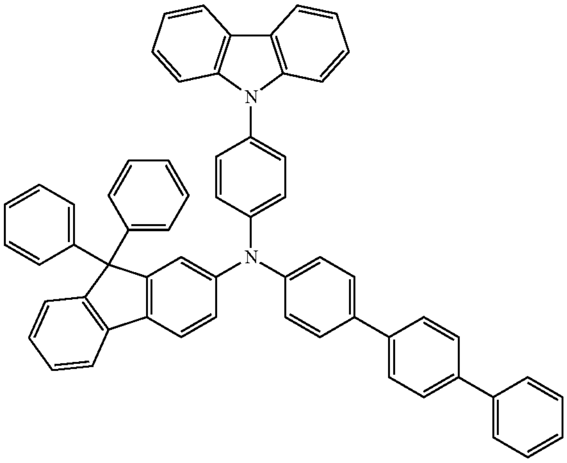
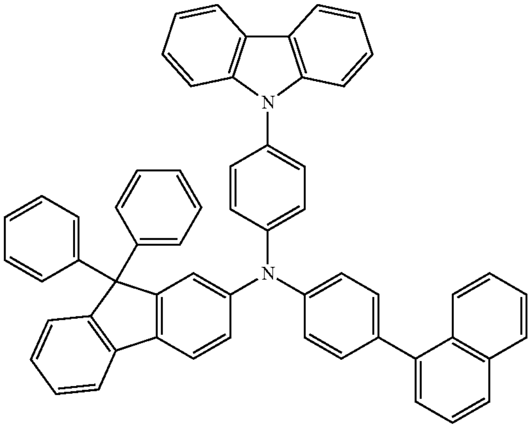
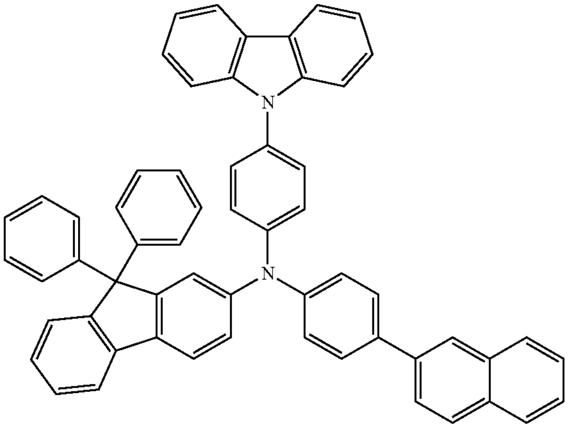
-continued
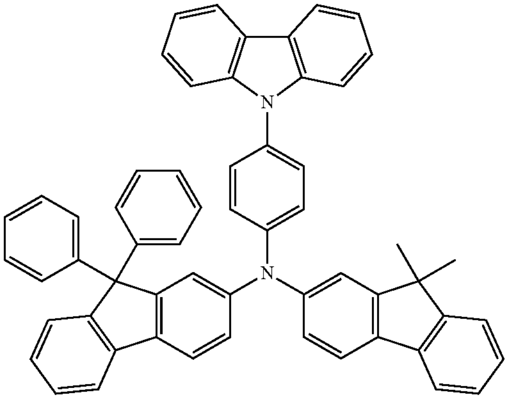
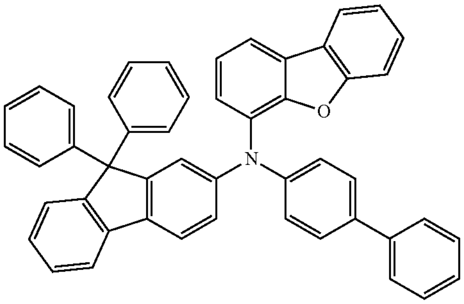
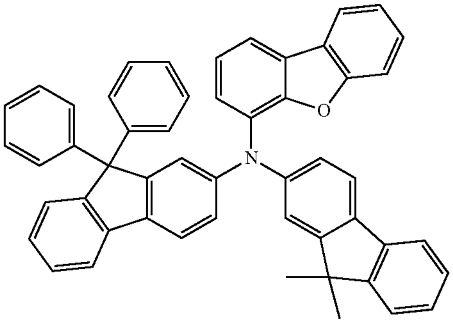
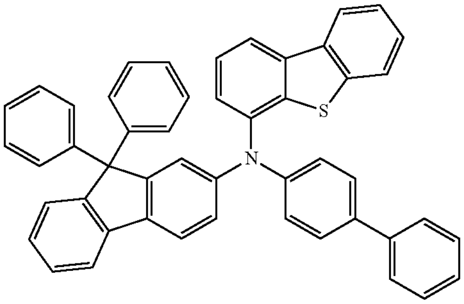
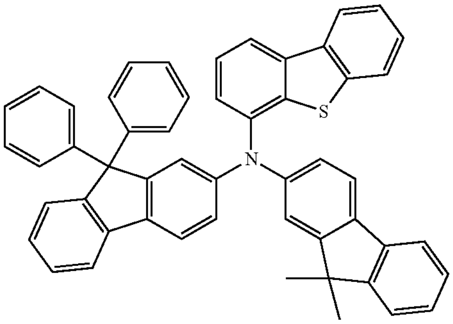

-continued
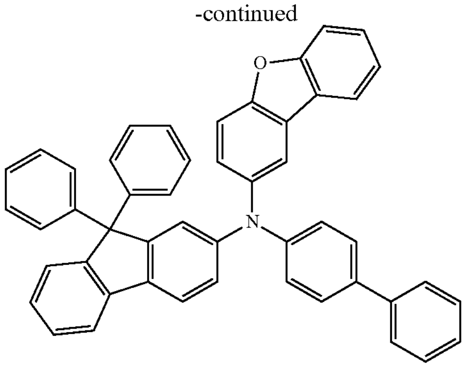
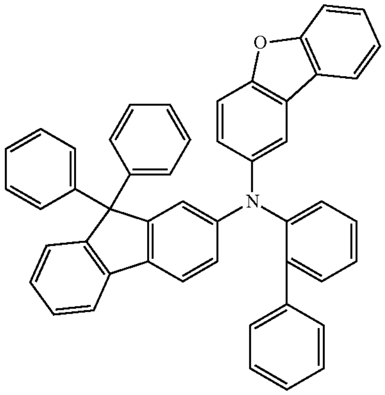
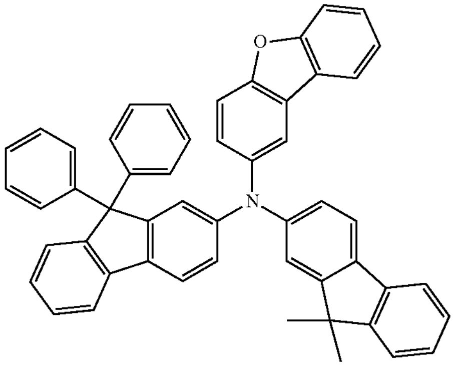
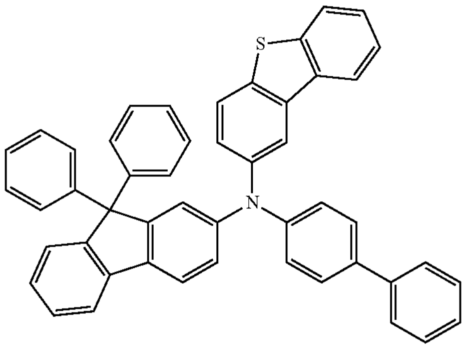
-continued
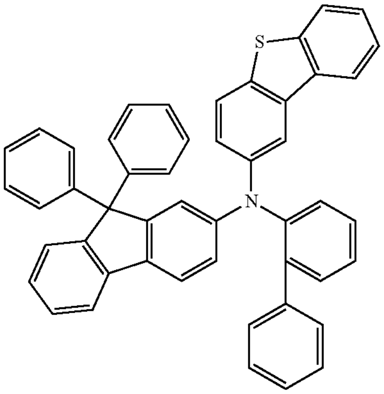
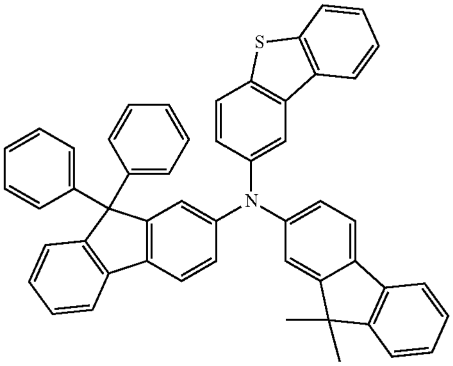
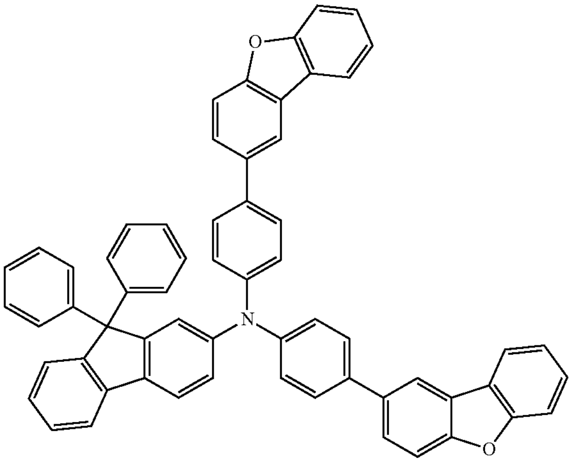
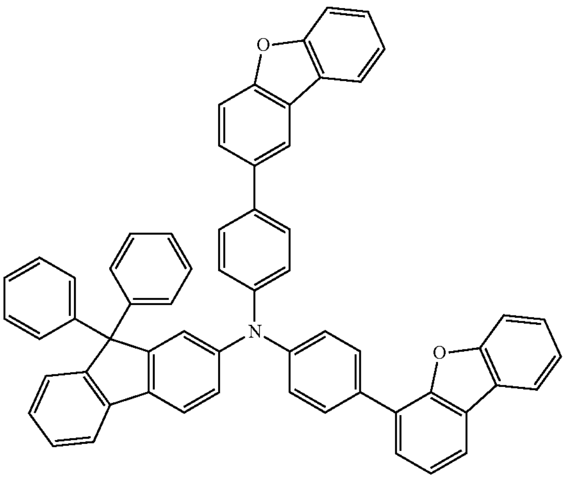

-continued
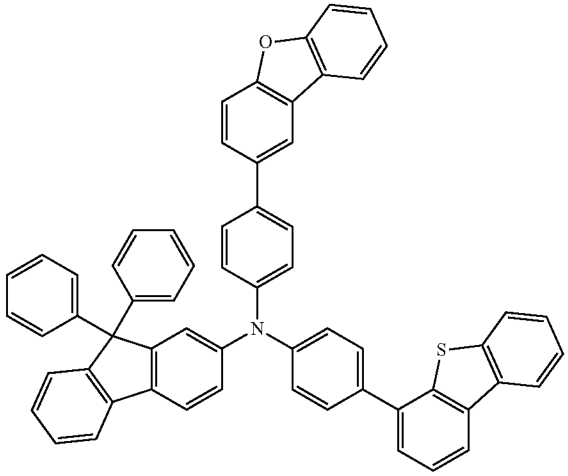
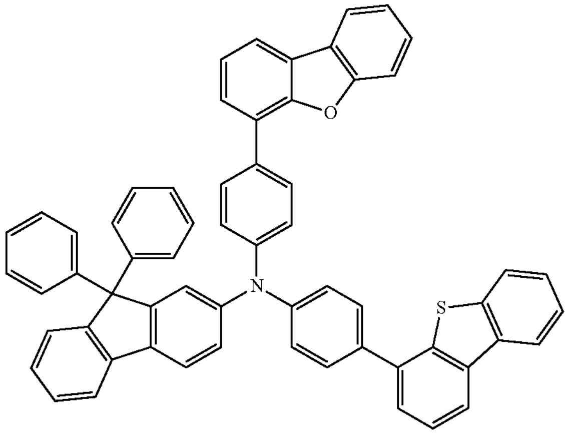
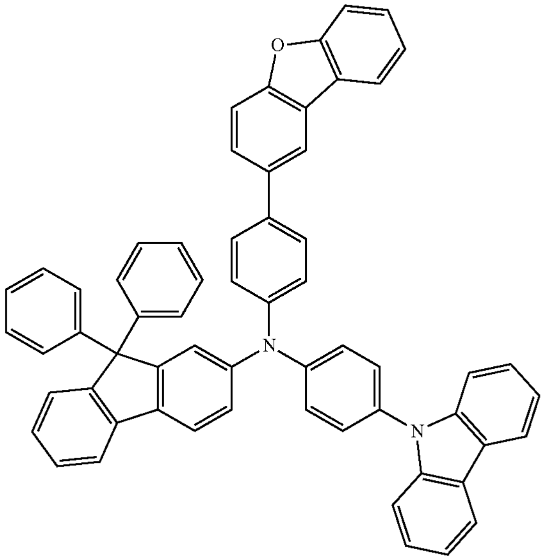
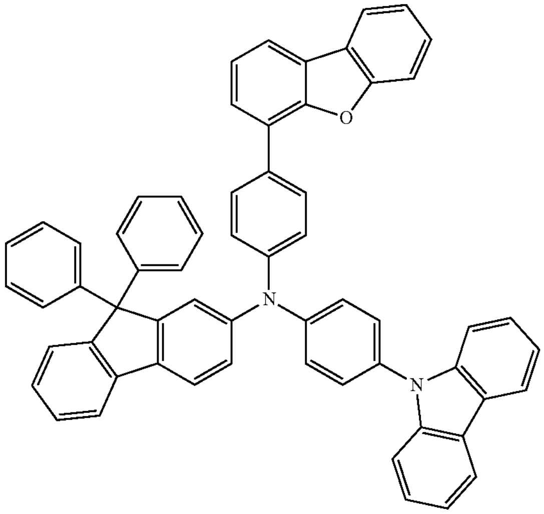
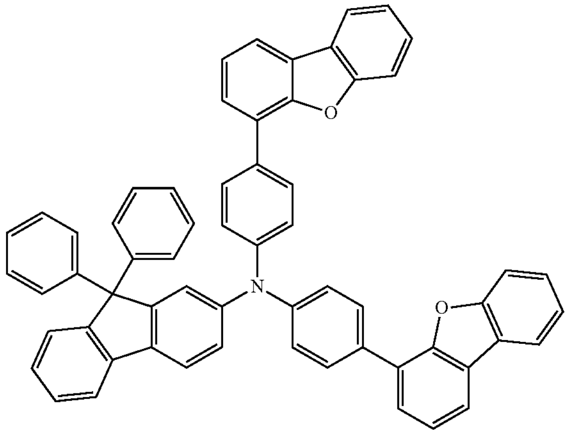
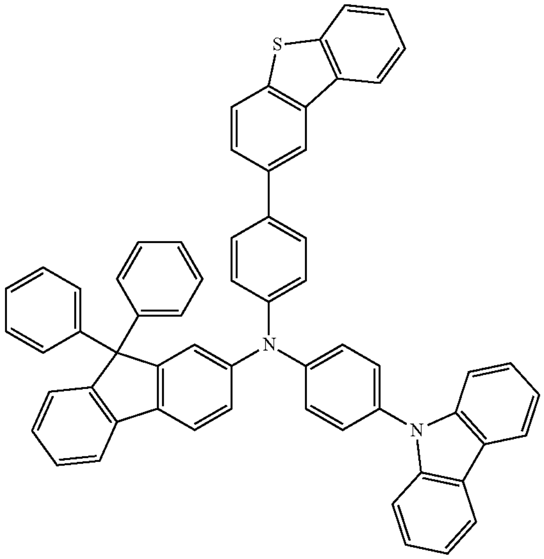
-continued -continued
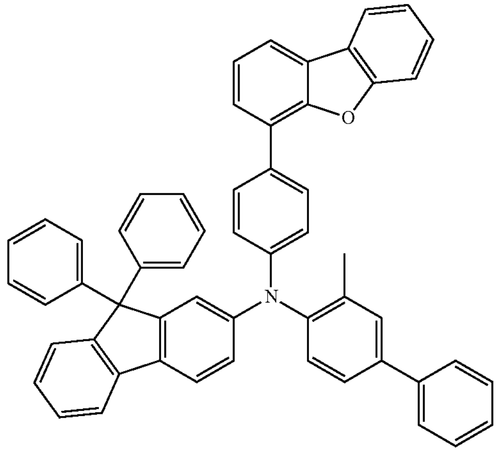
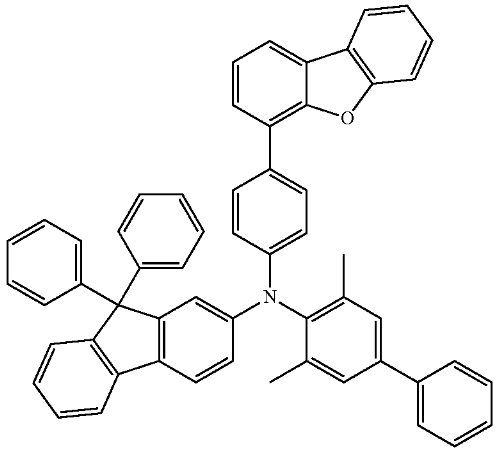
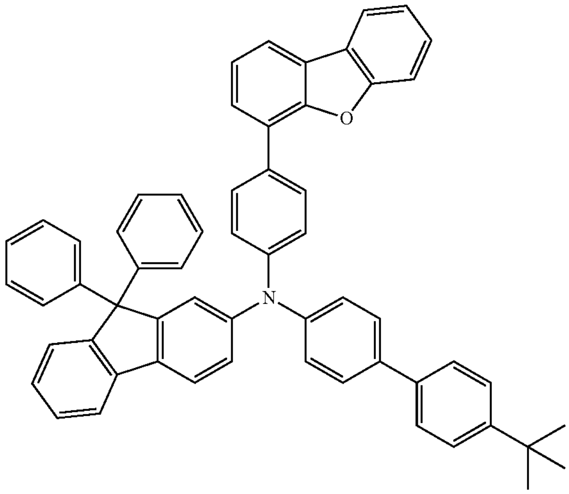
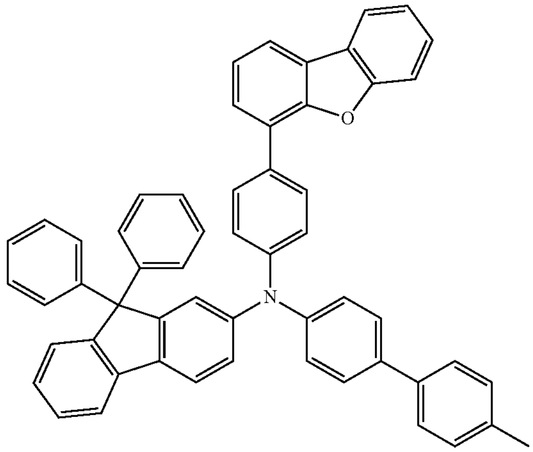
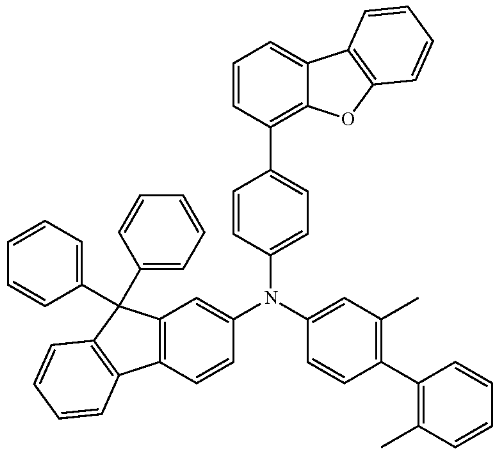
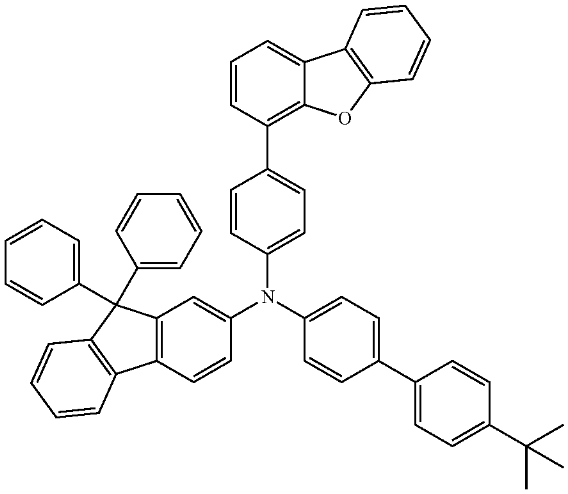

-continued
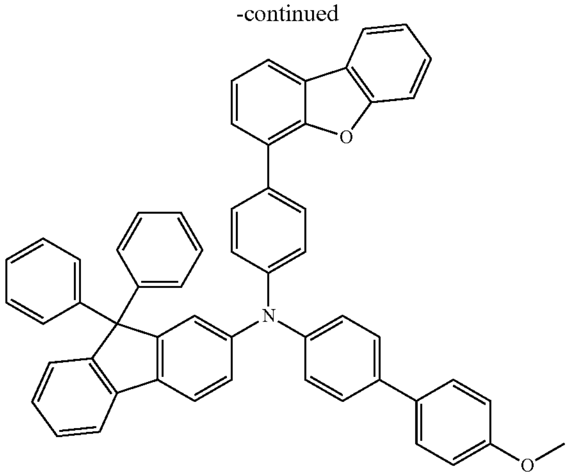
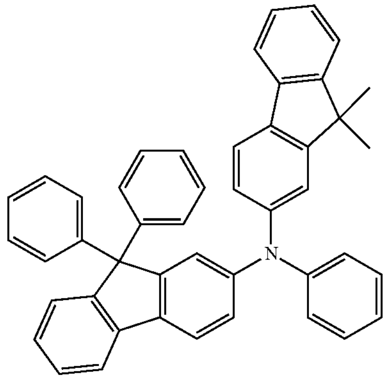
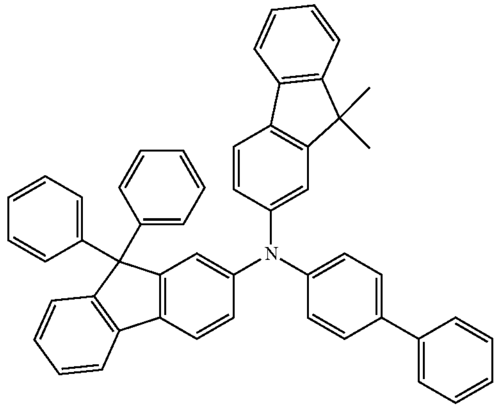
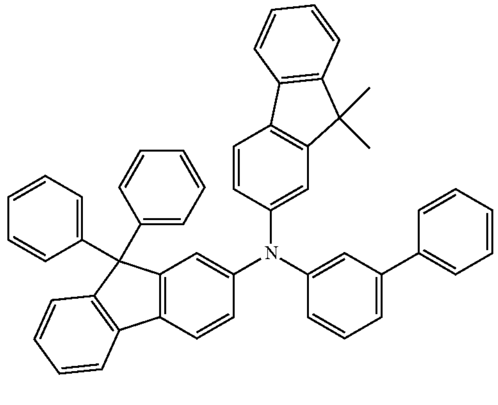
-continued
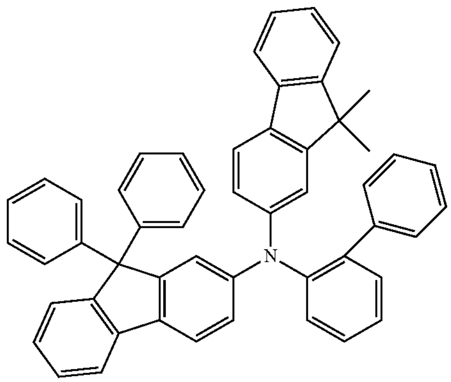
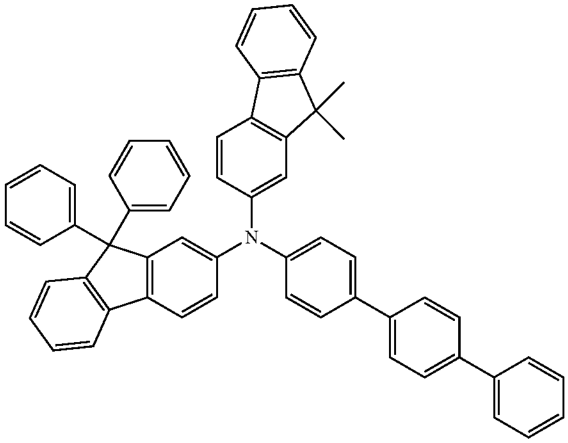
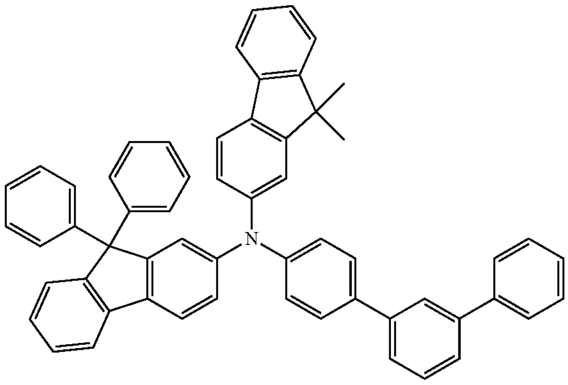
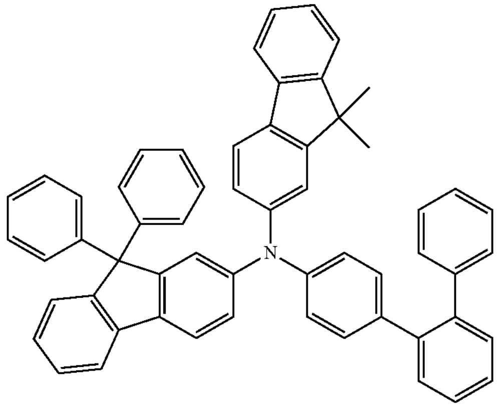

-continued
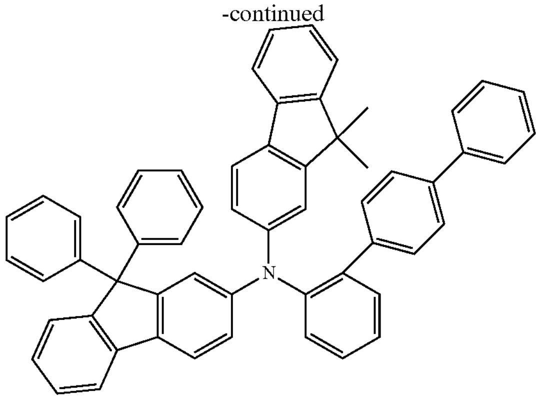
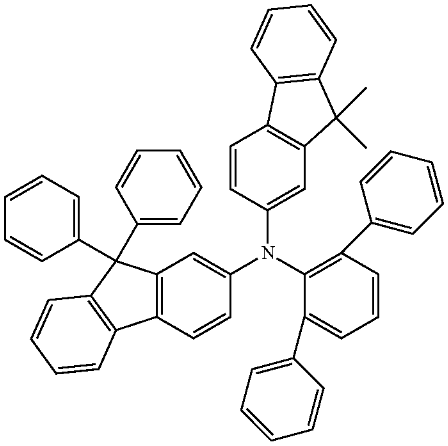
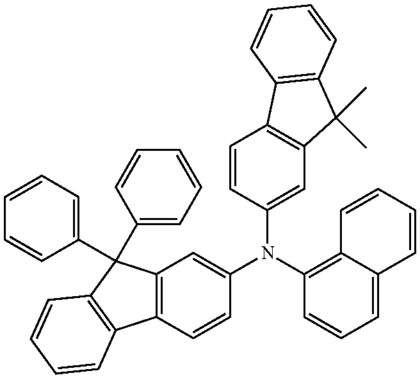
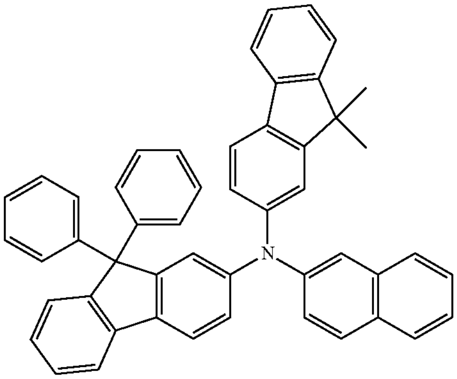
-continued
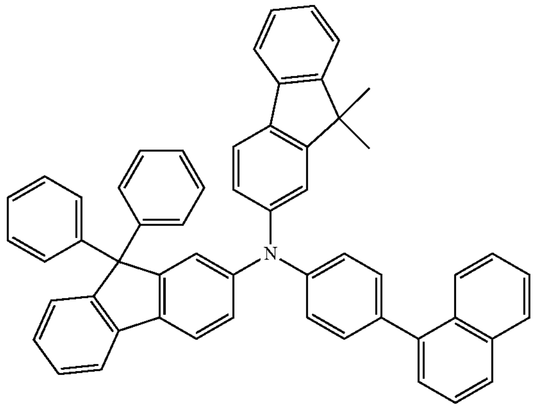
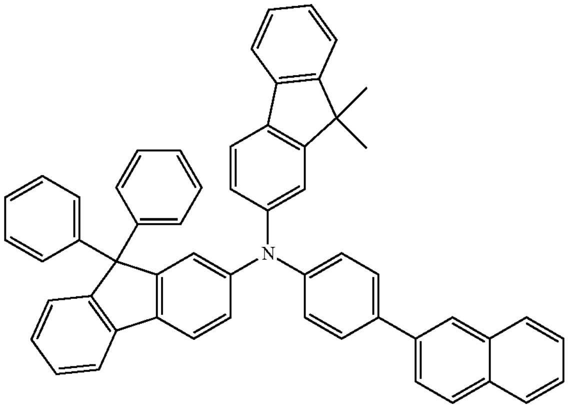
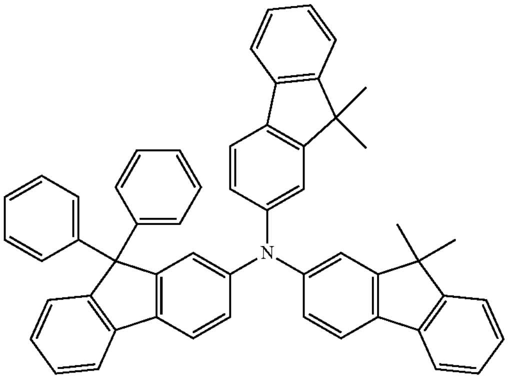
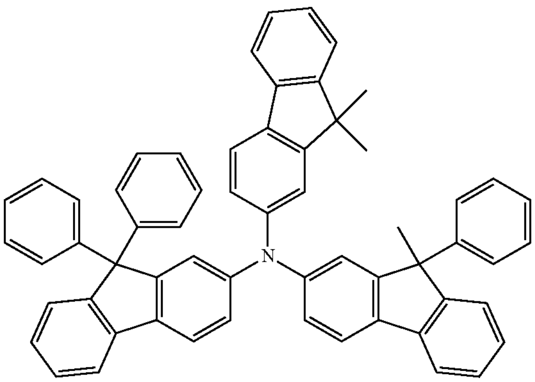

-continued
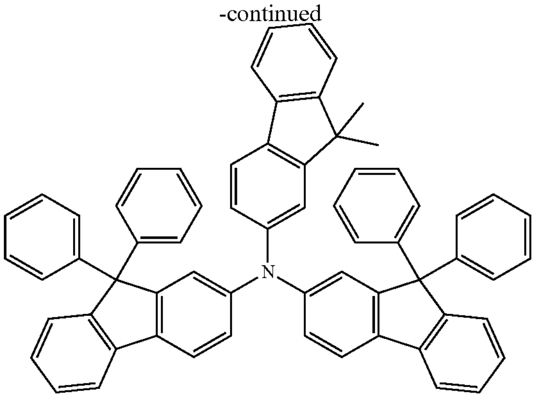
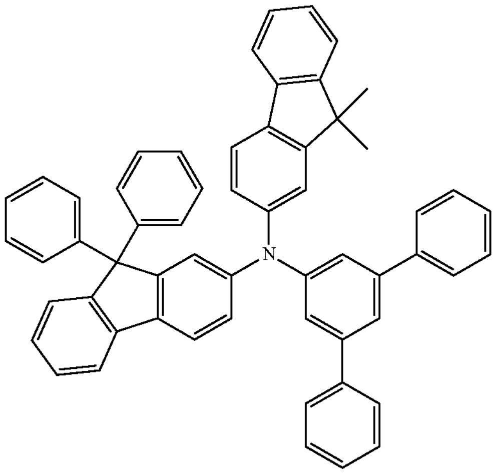
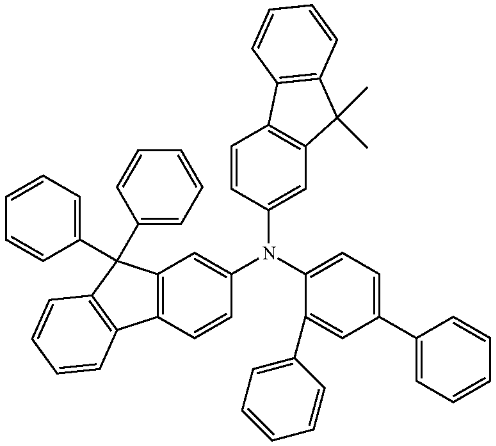
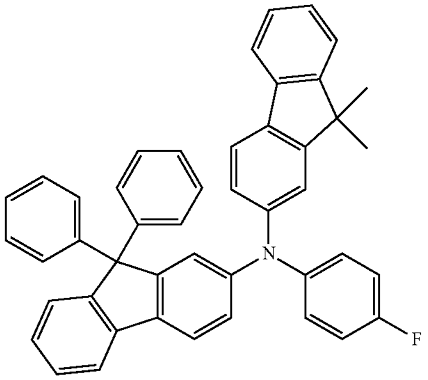
-continued
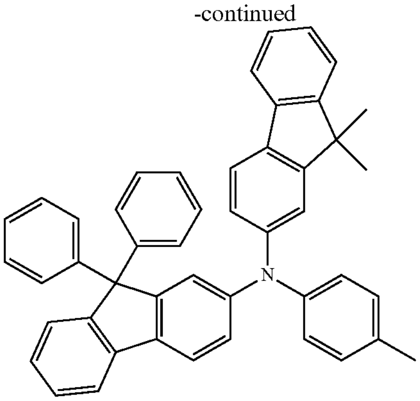
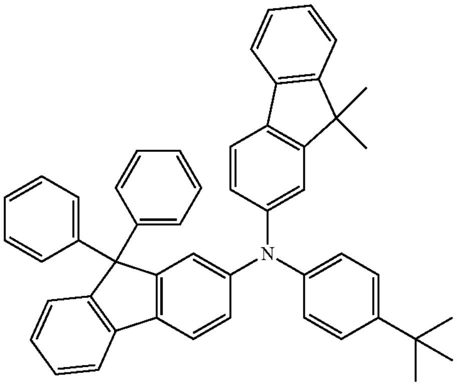
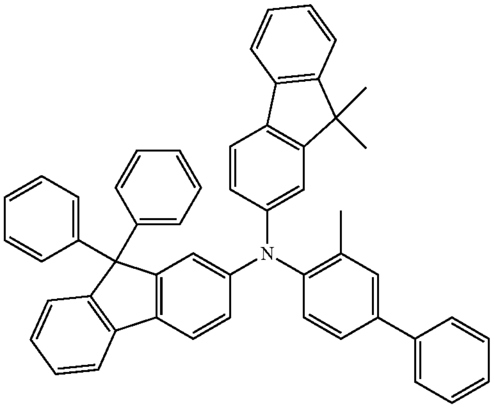
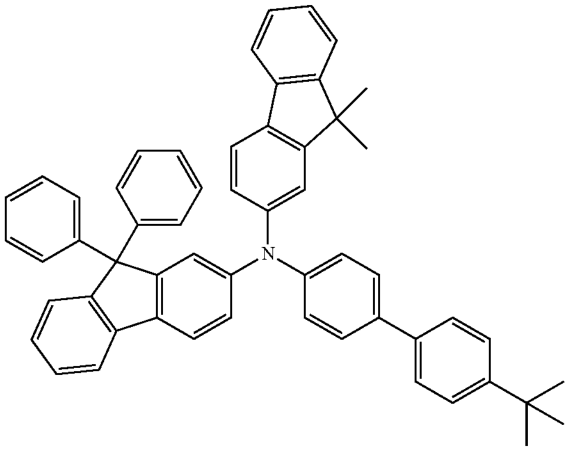

-continued
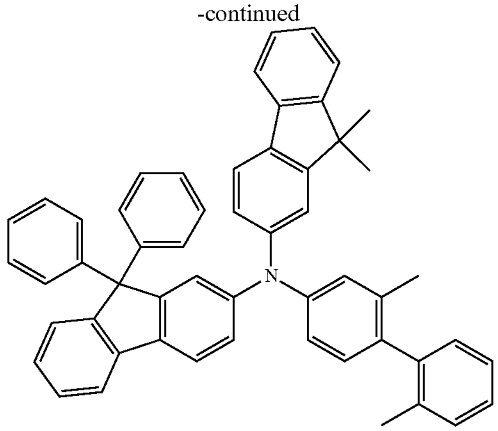
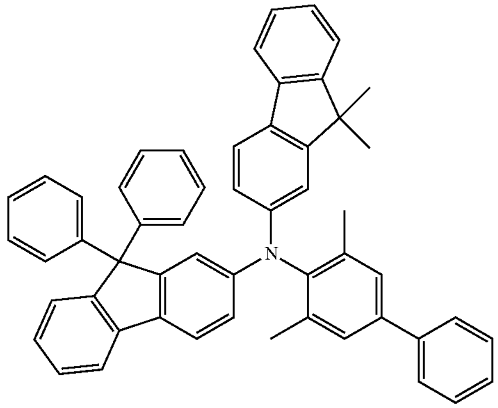
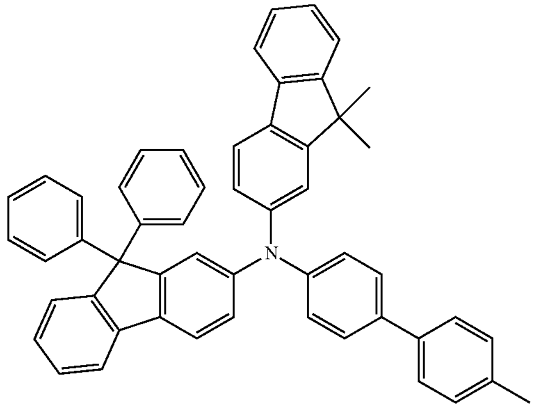
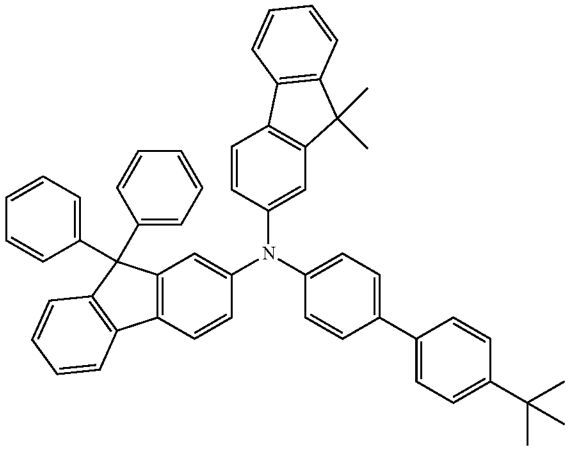
-continued
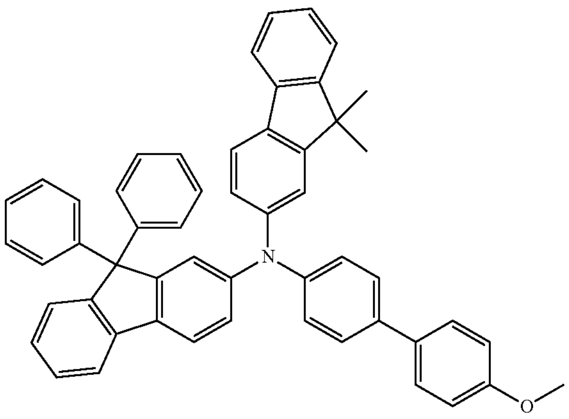
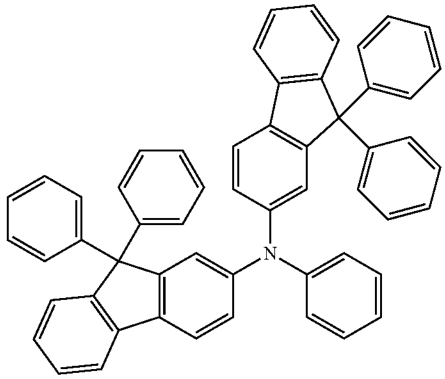
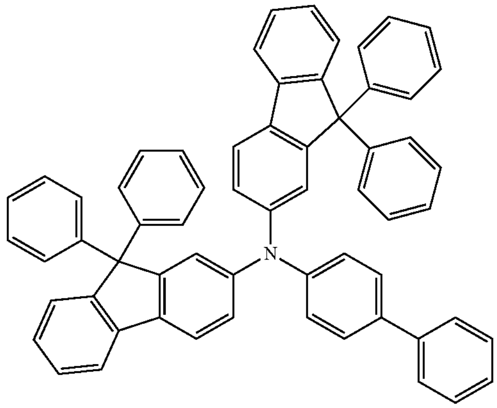
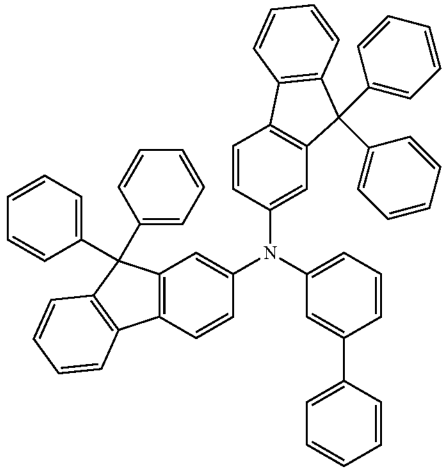

-continued
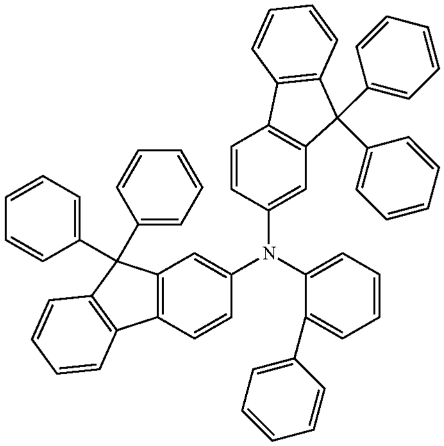
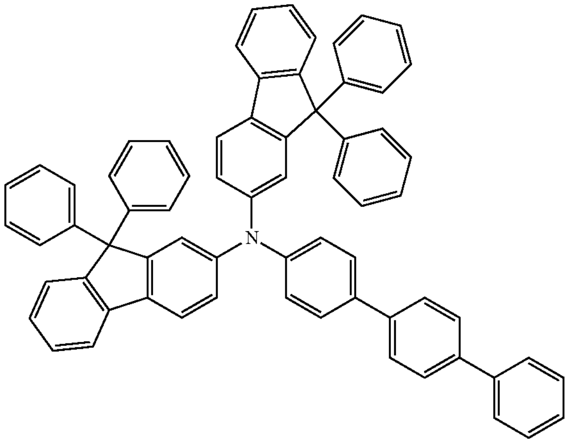
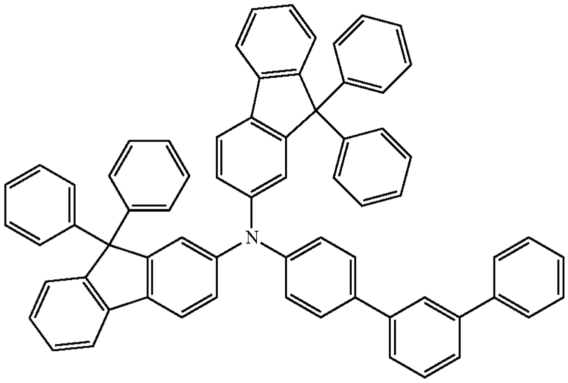
-continued
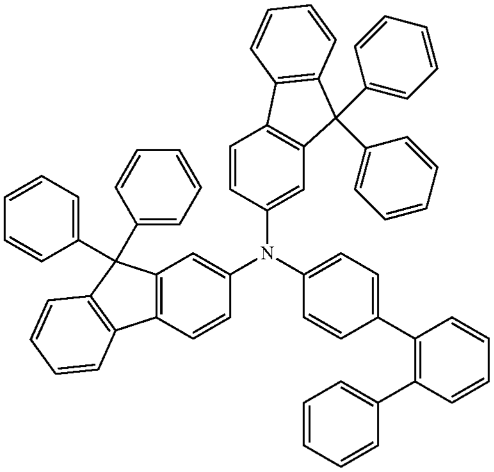
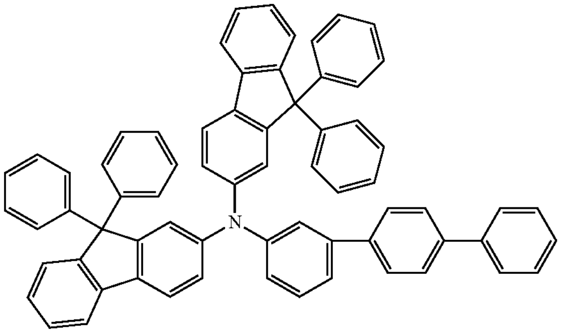
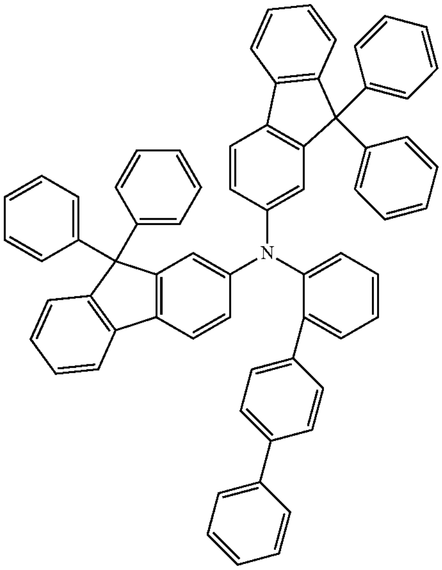

-continued
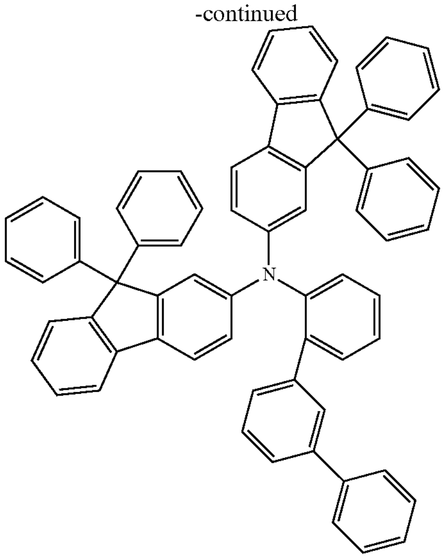
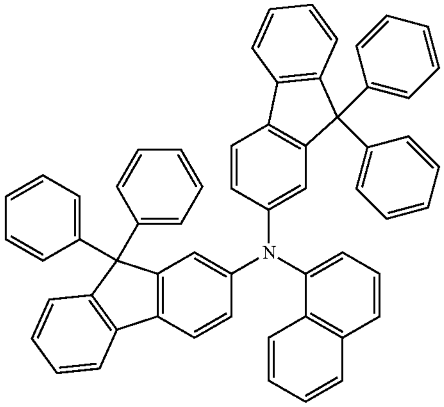
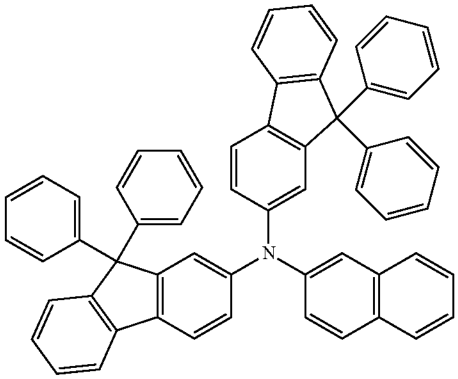
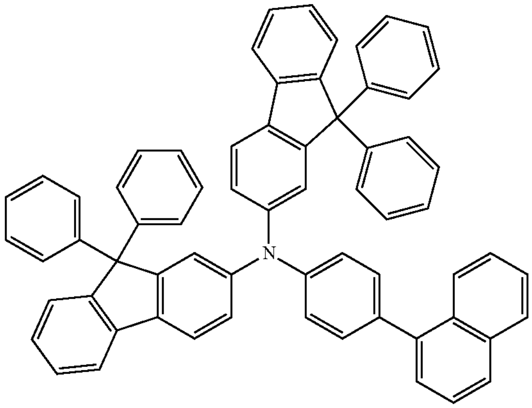
-continued
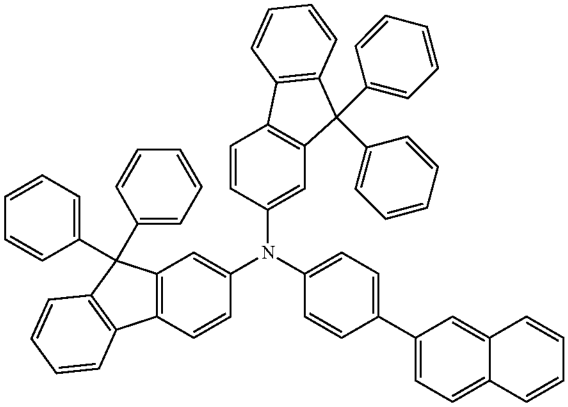
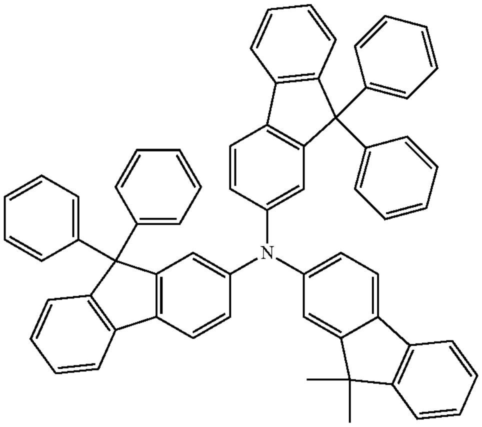
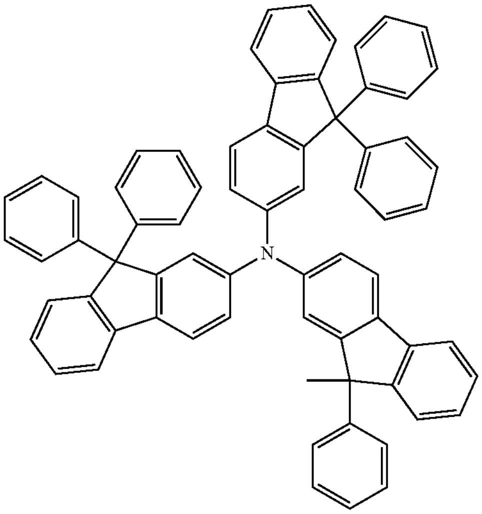

-continued
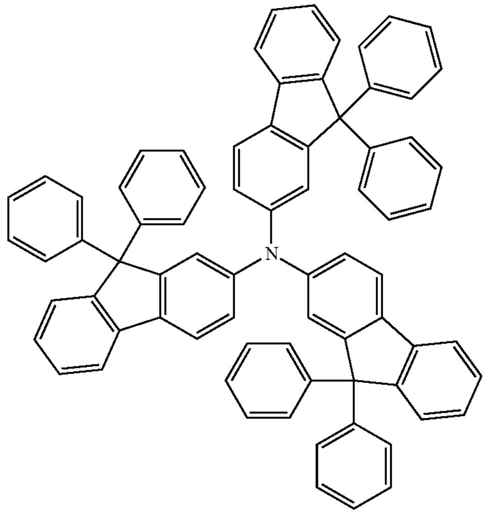
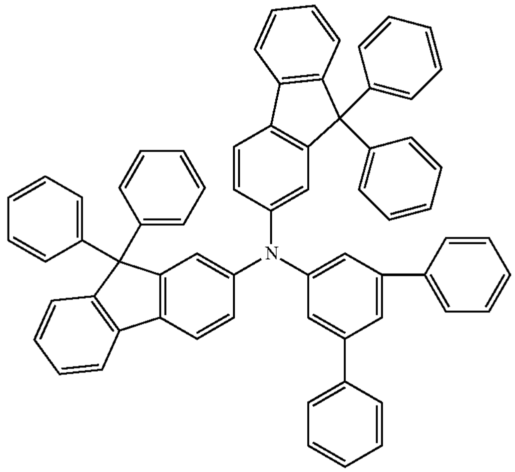
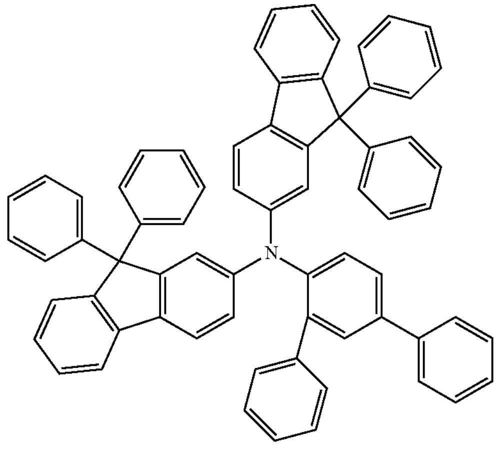
-continued
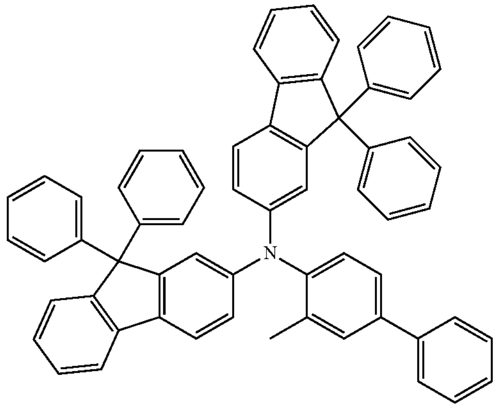
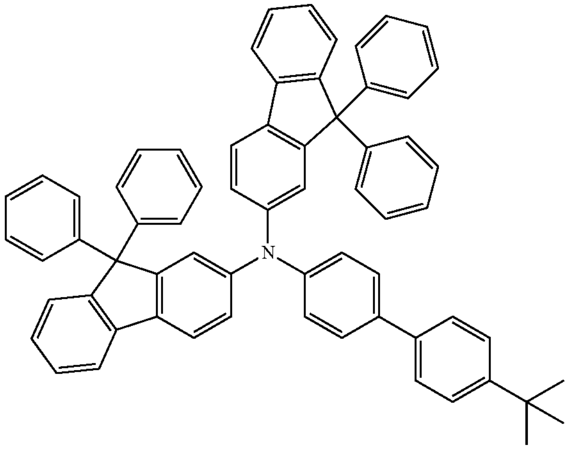
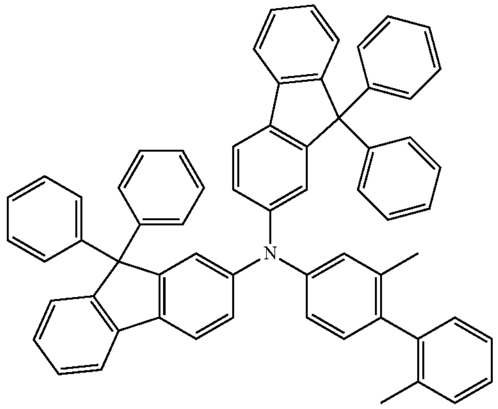
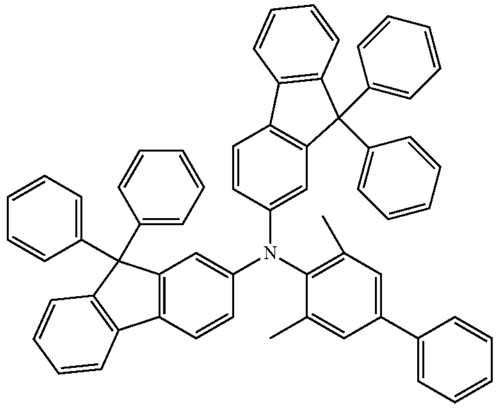

-continued
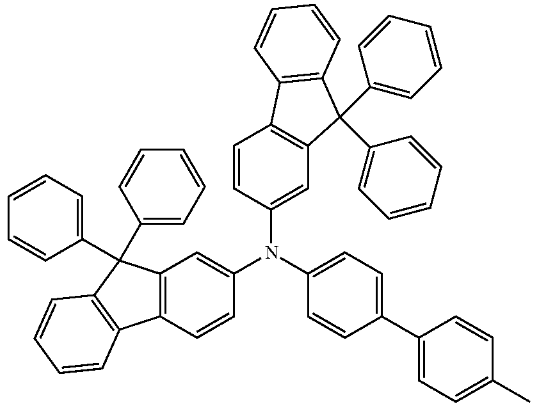
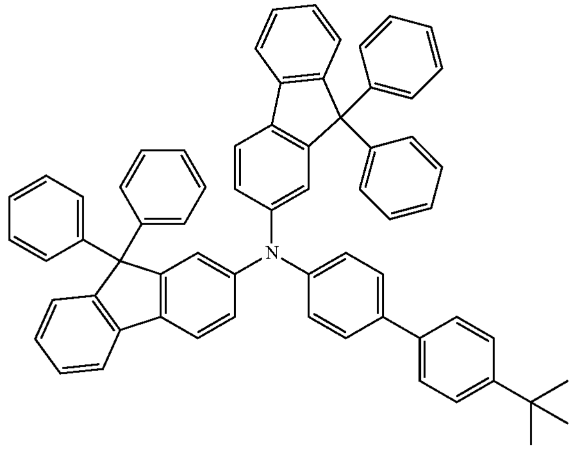
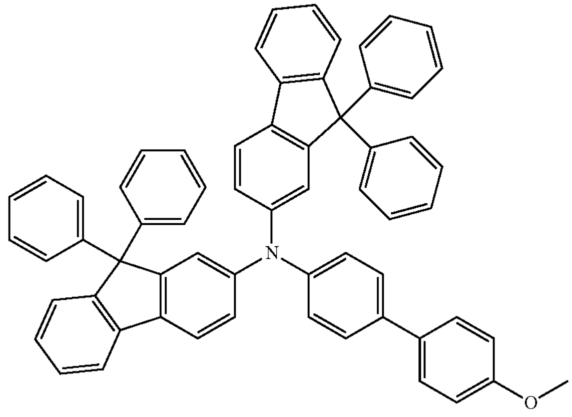
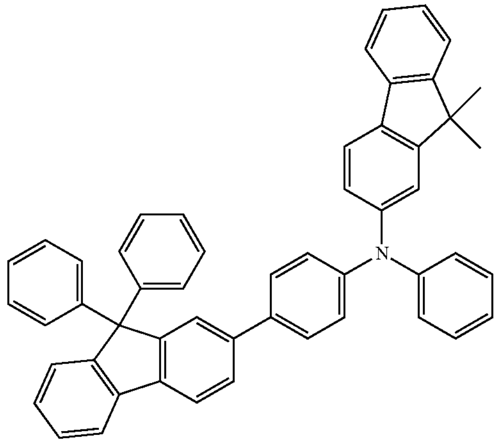
-continued
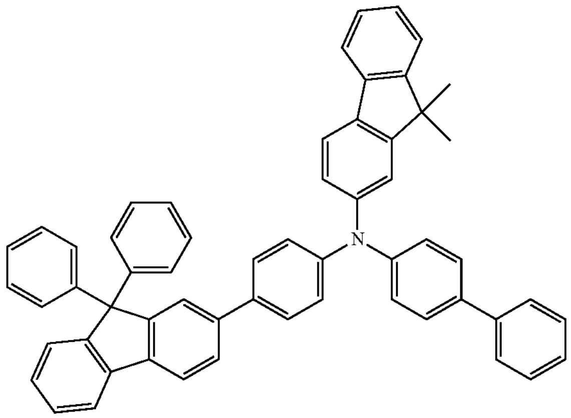
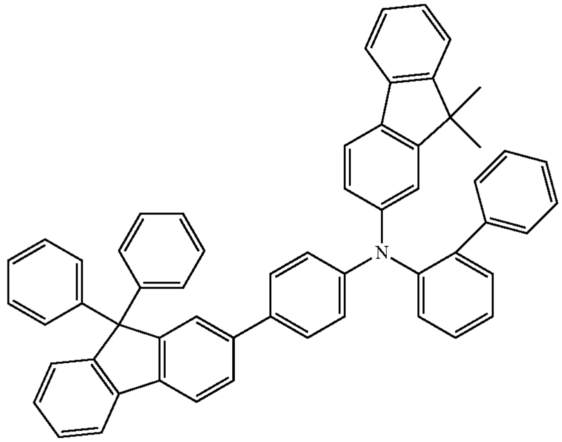
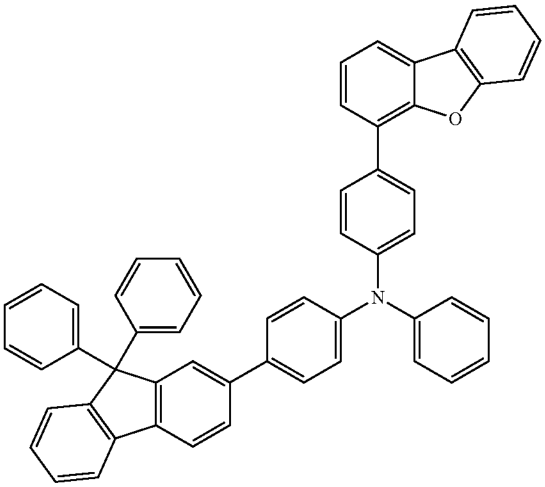

-continued
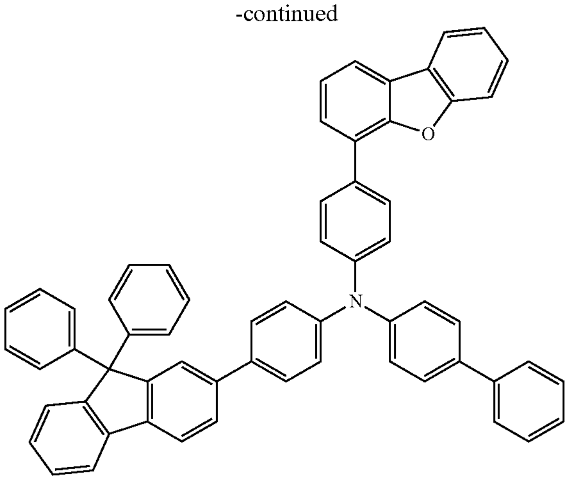
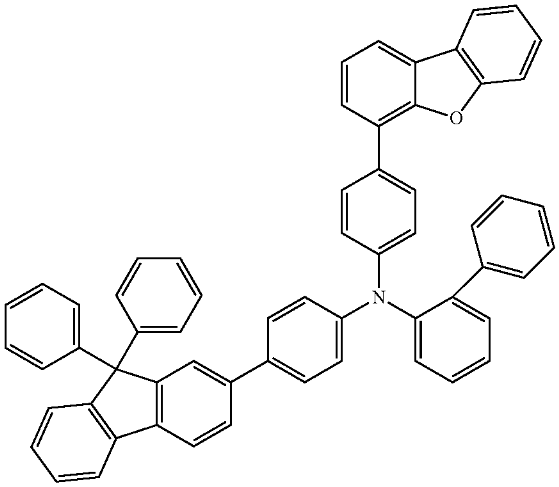
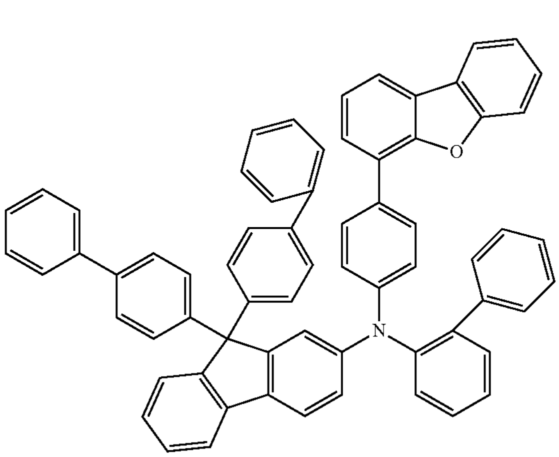
-continued
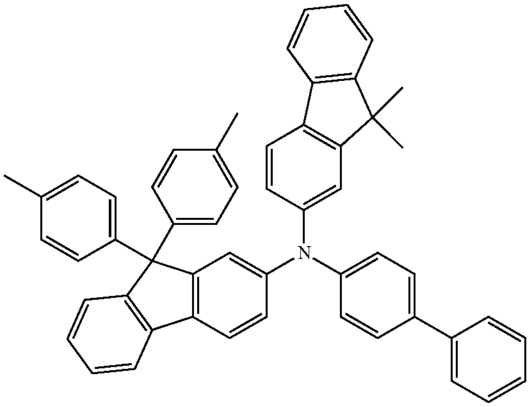
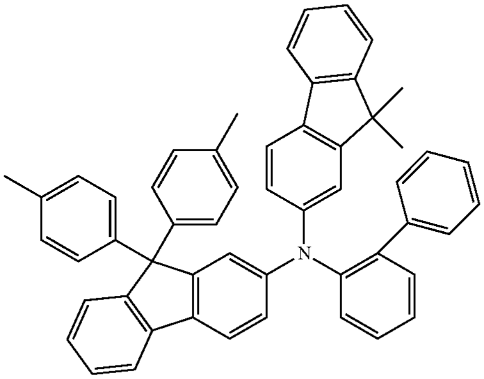
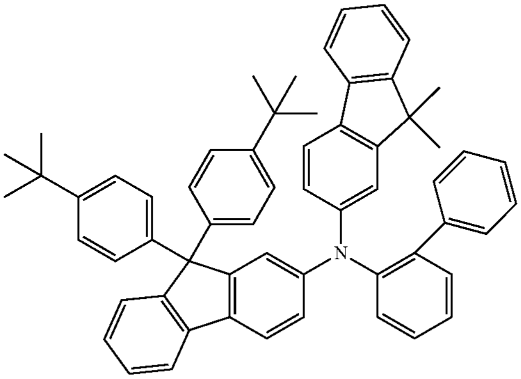
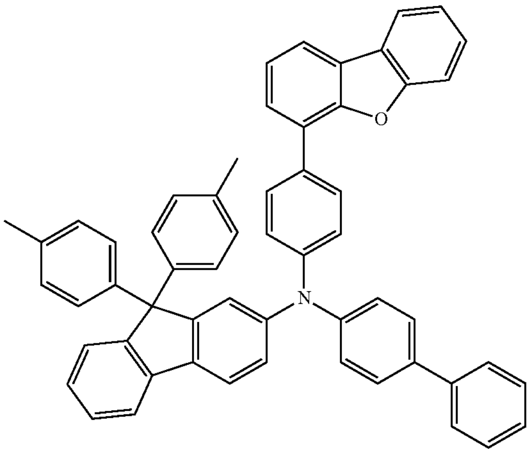

-continued
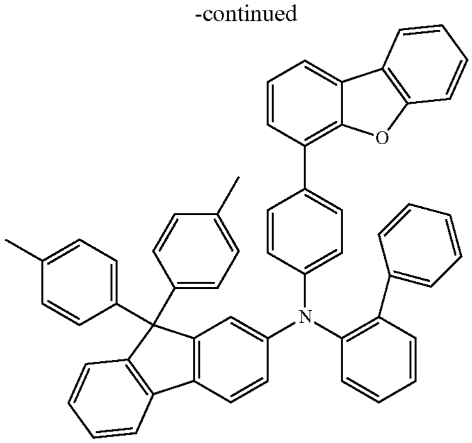
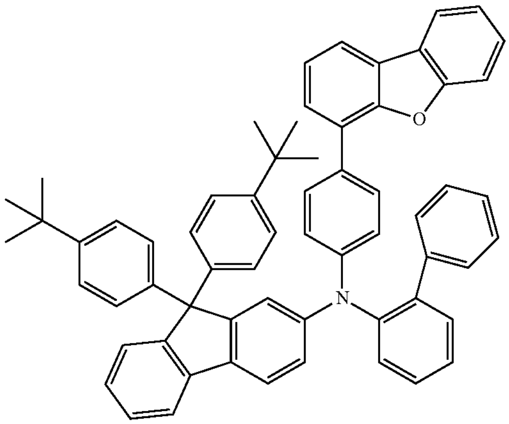
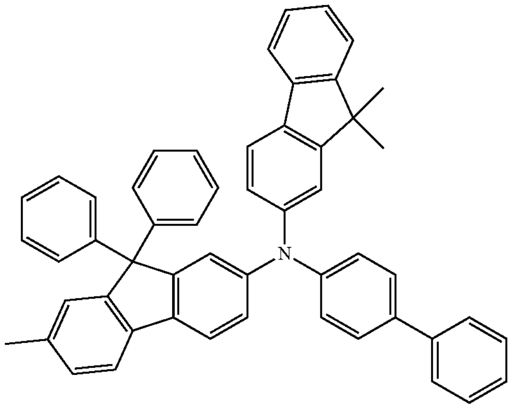
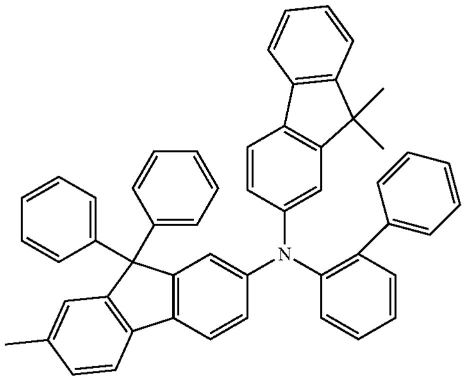
-continued
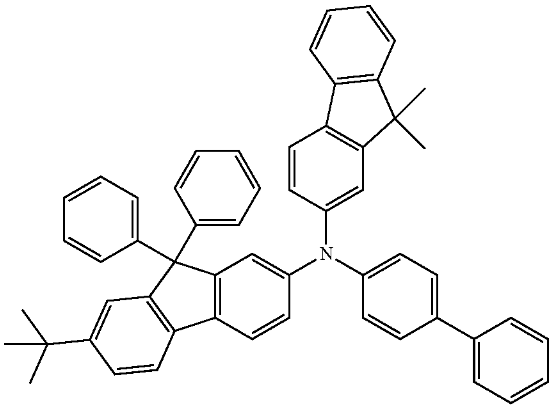
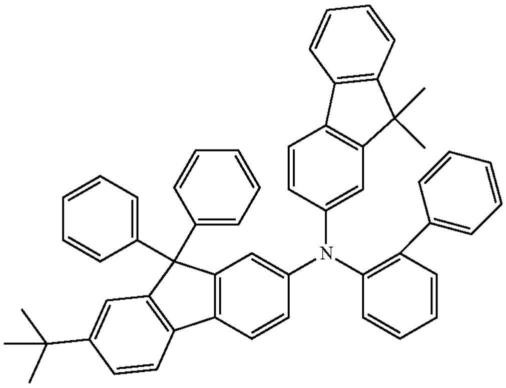
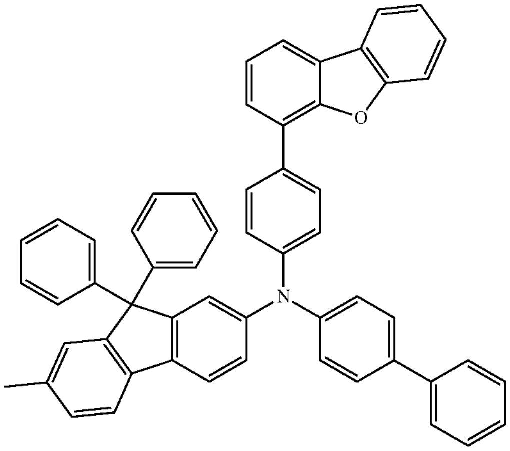
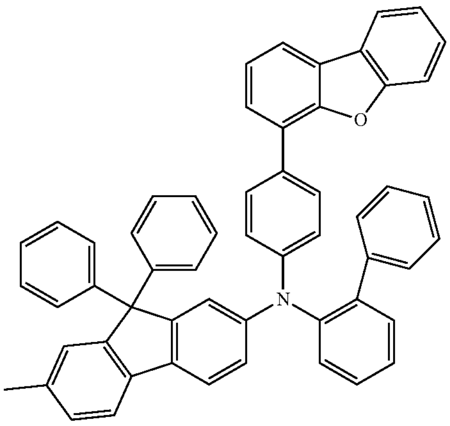

-continued
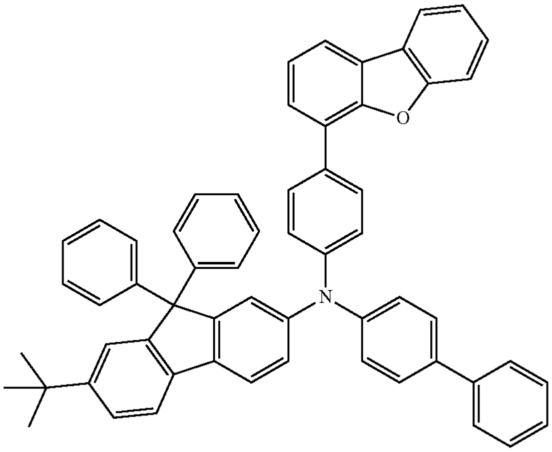
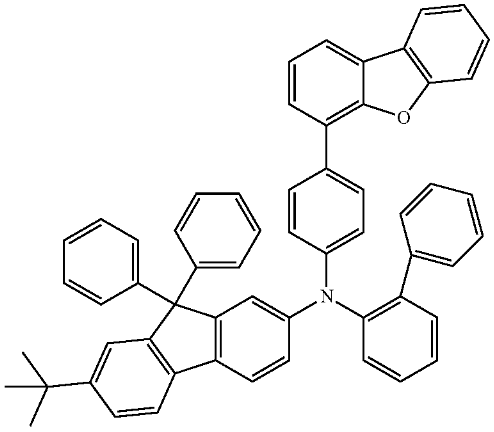
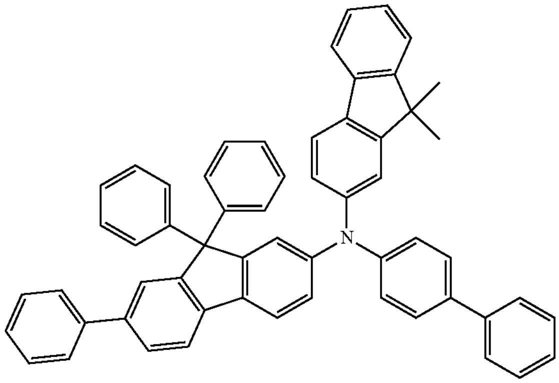
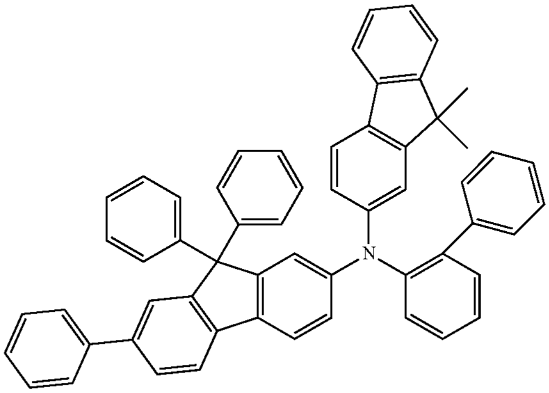
-continued
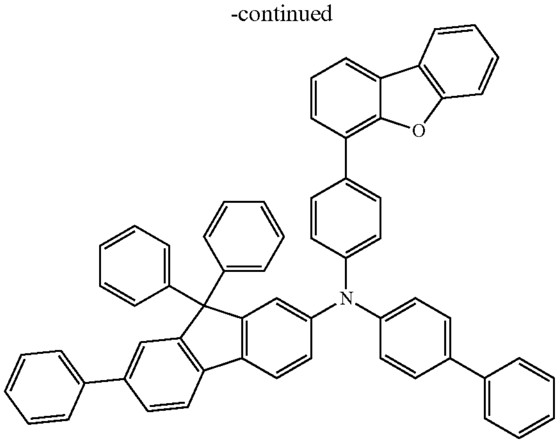
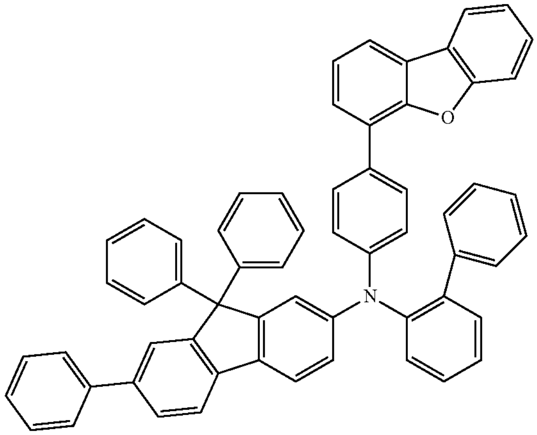
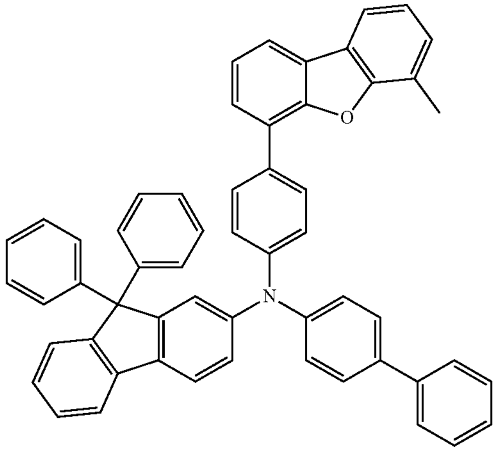
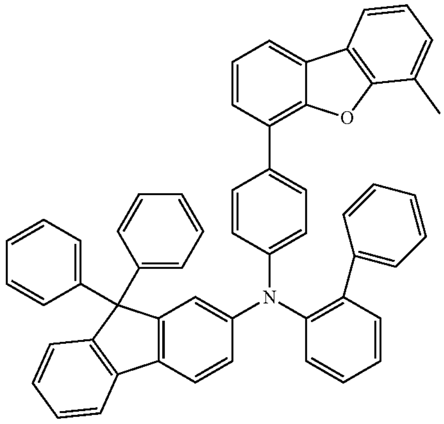

-continued
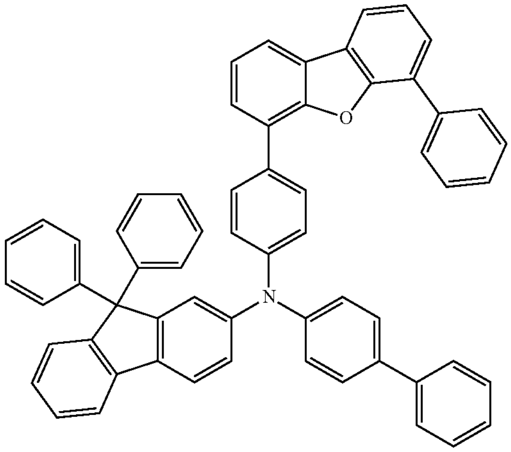
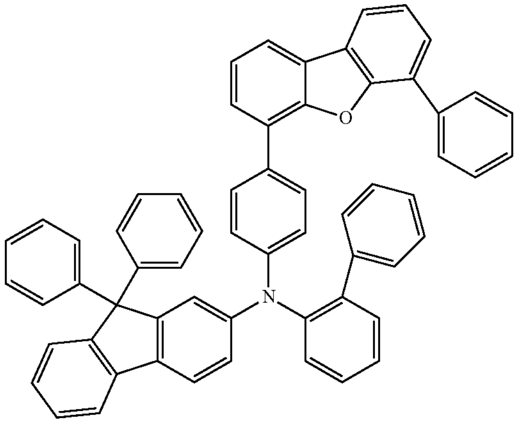
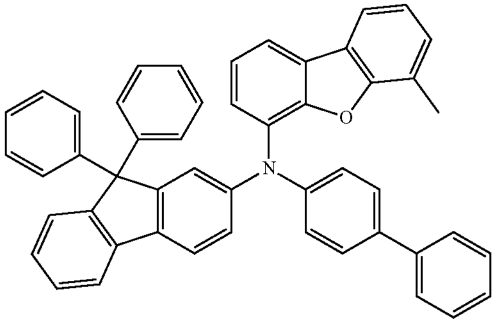
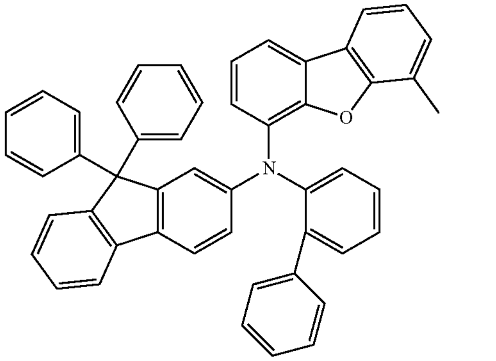
-continued
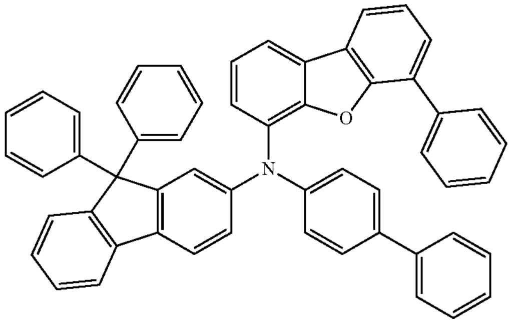
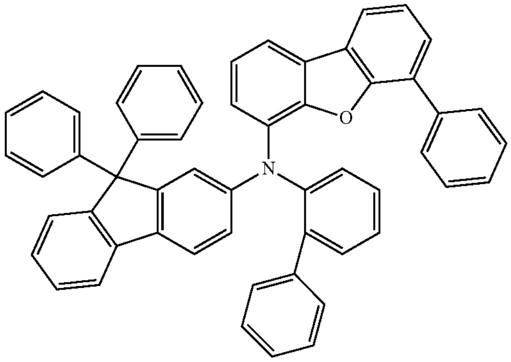
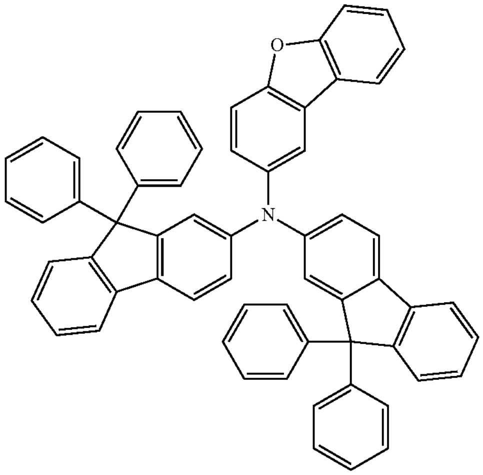
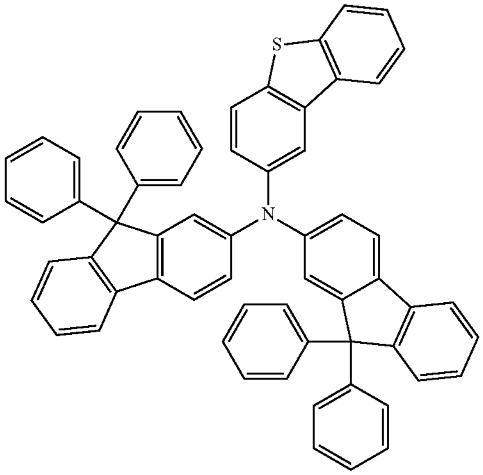

-continued
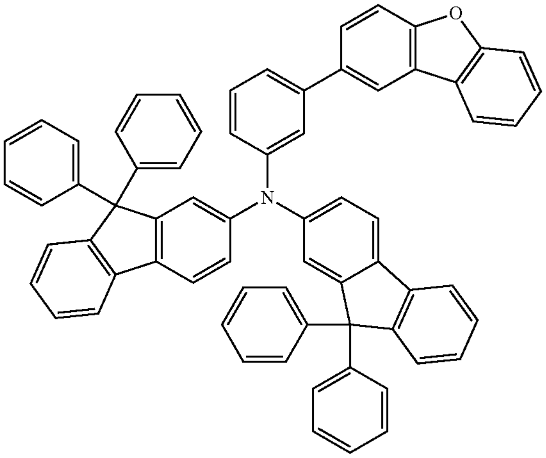
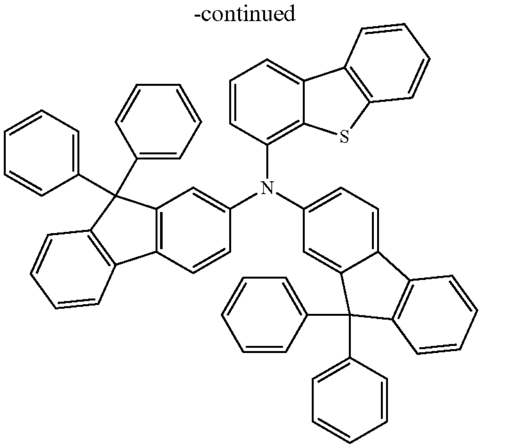
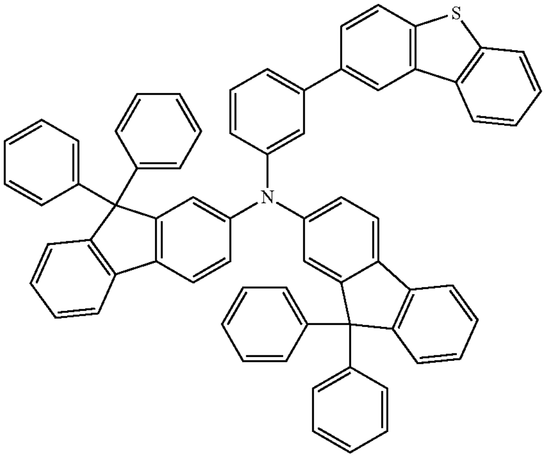
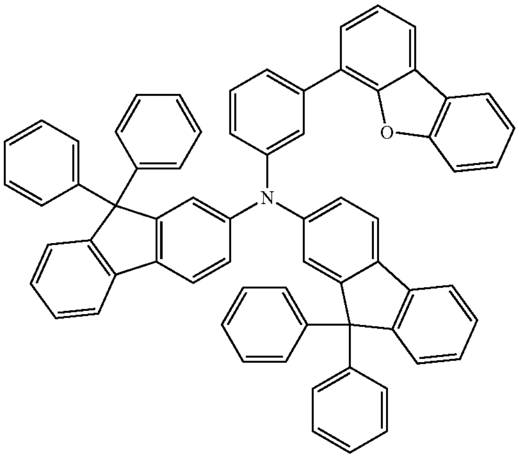
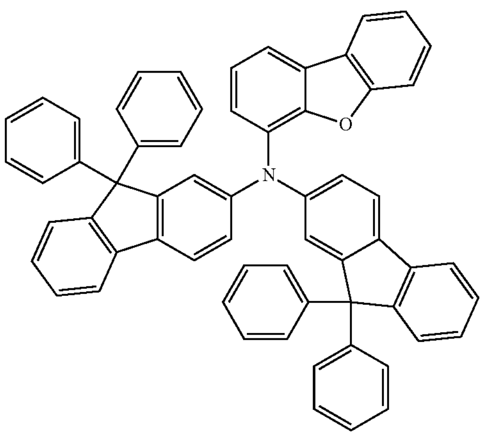
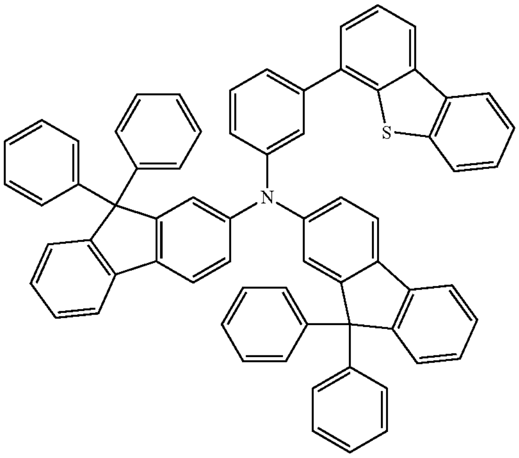
-continued -continued
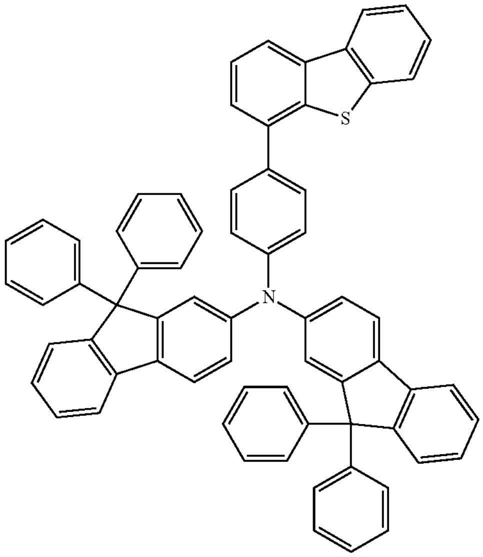
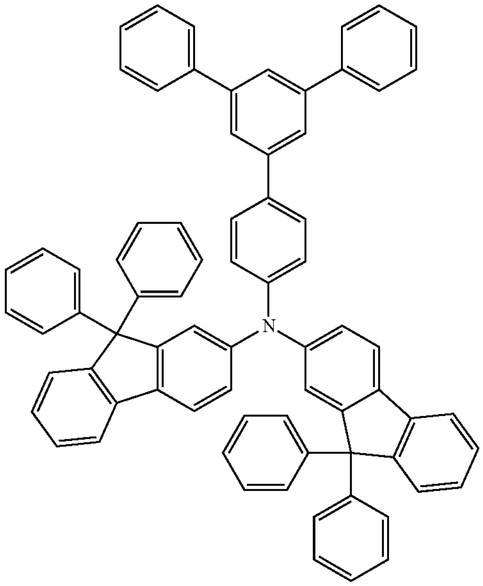
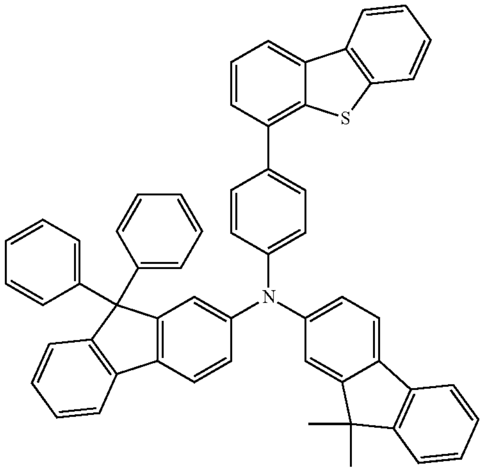
-continued
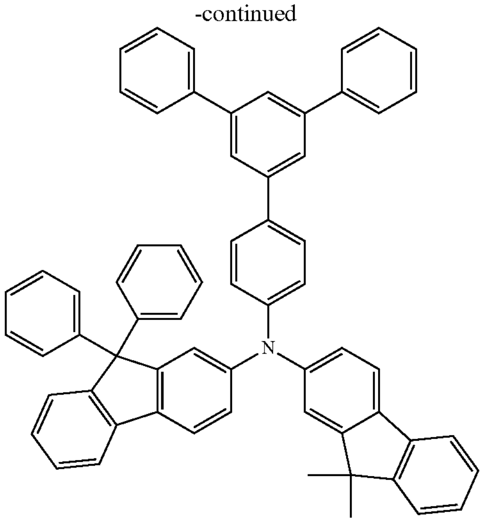
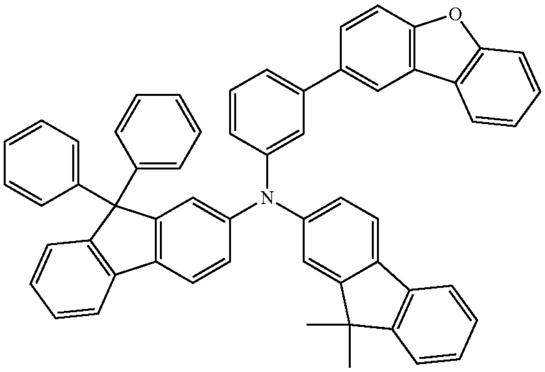
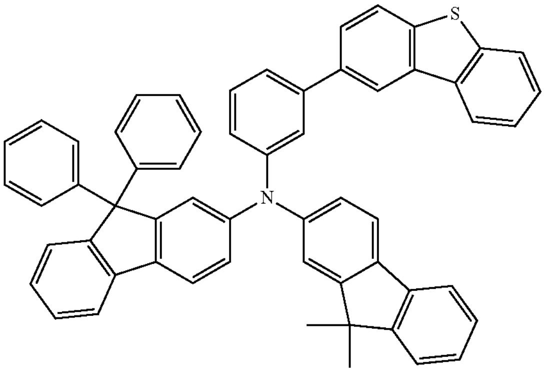
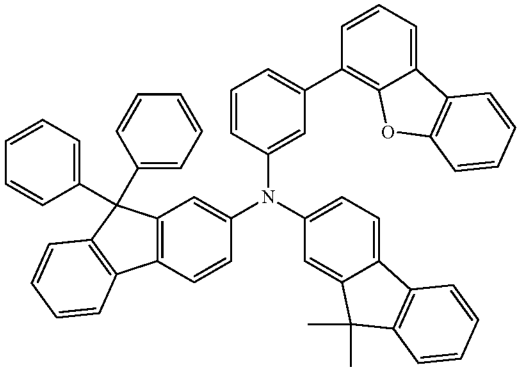

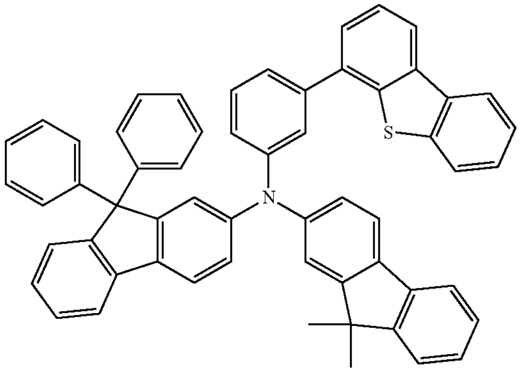
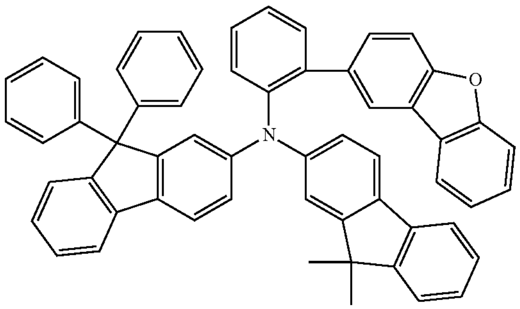
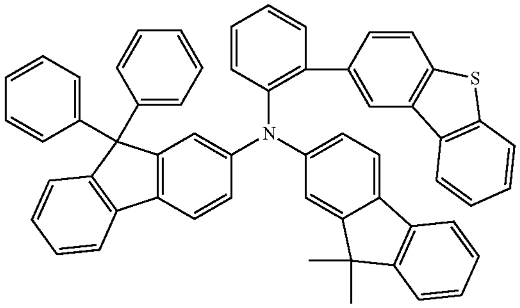
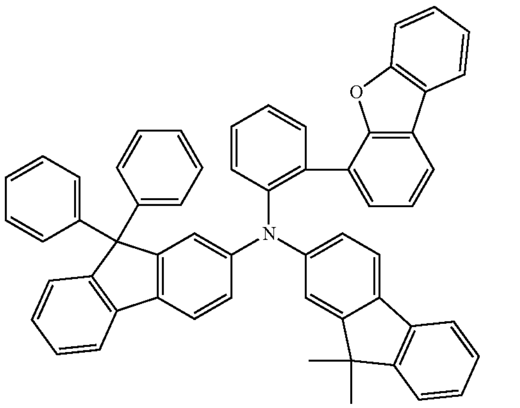
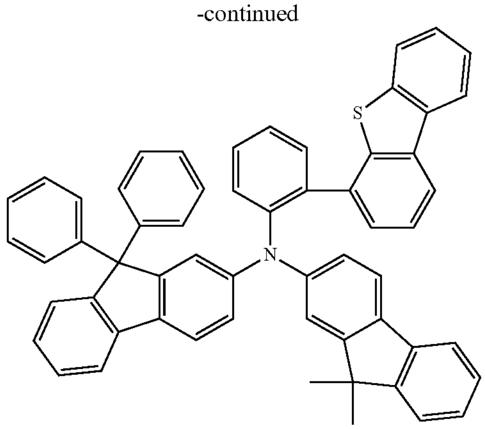
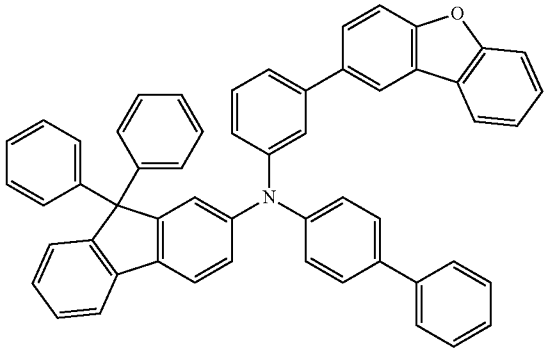
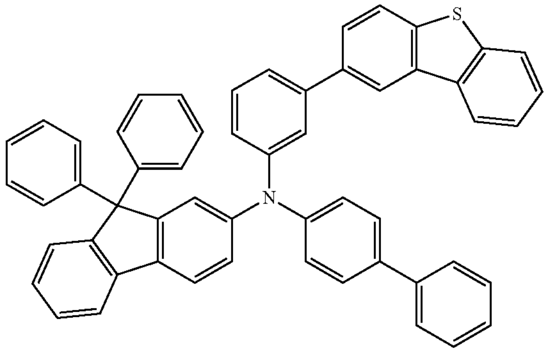
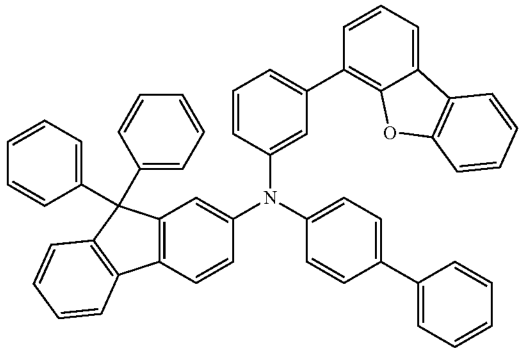

-continued
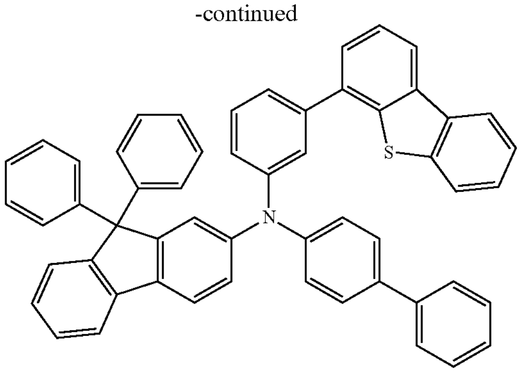
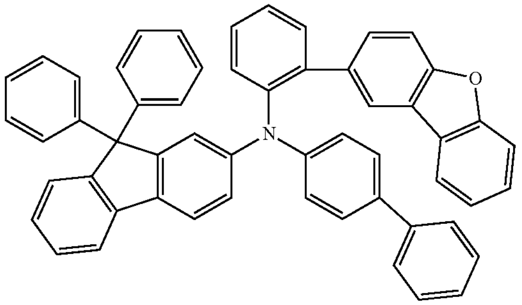
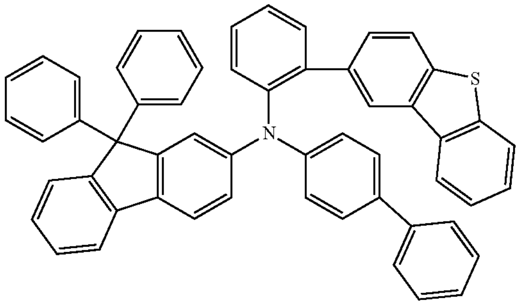
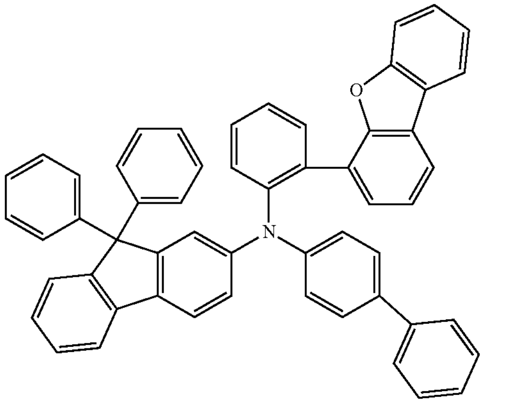
-continued
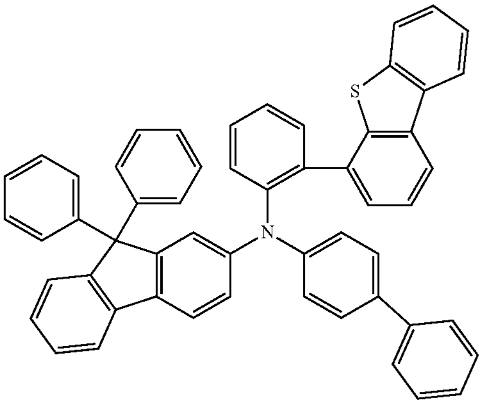
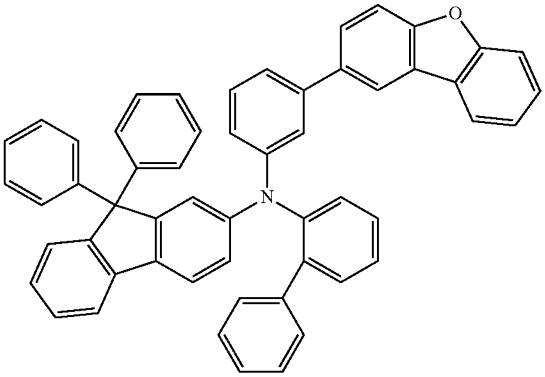
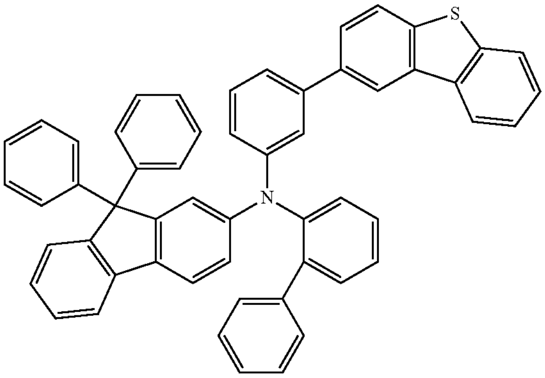
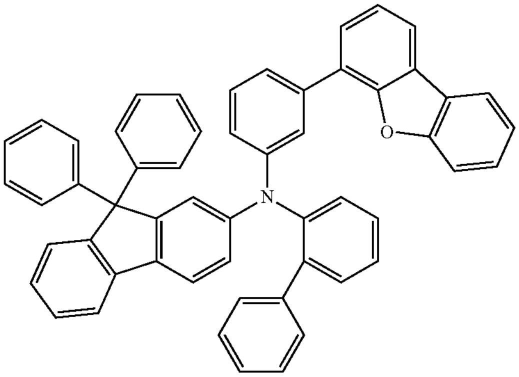

-continued
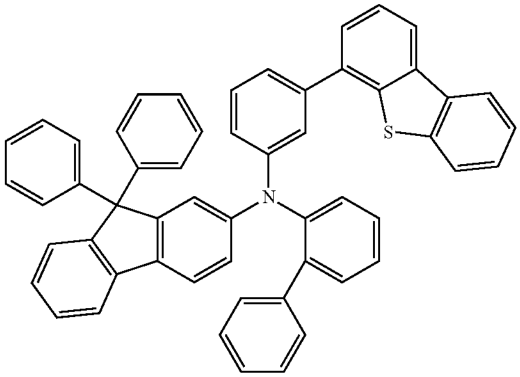
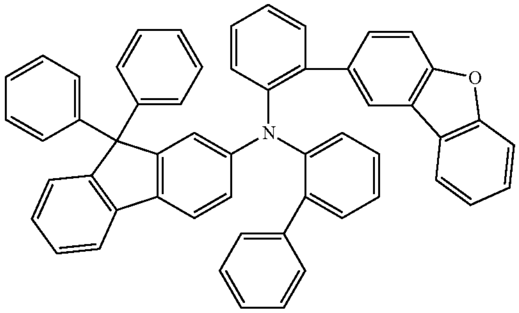
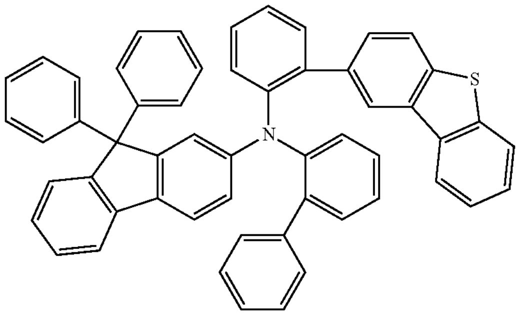
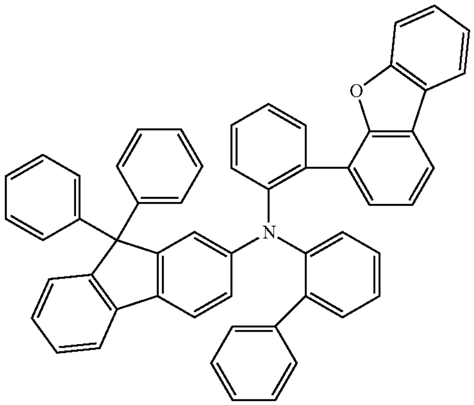
-continued
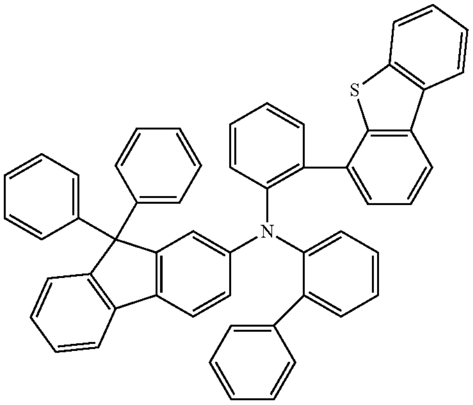
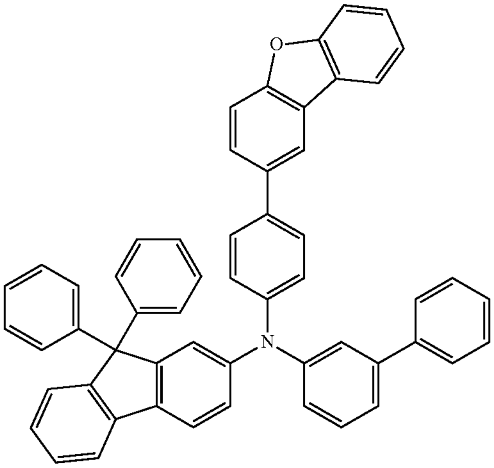
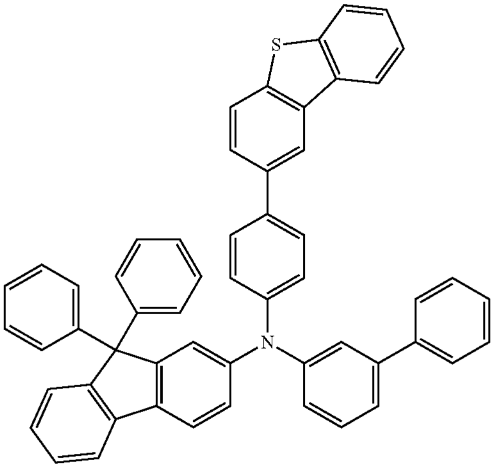

-continued
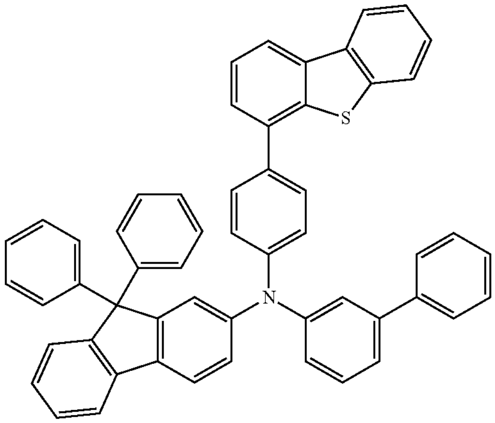
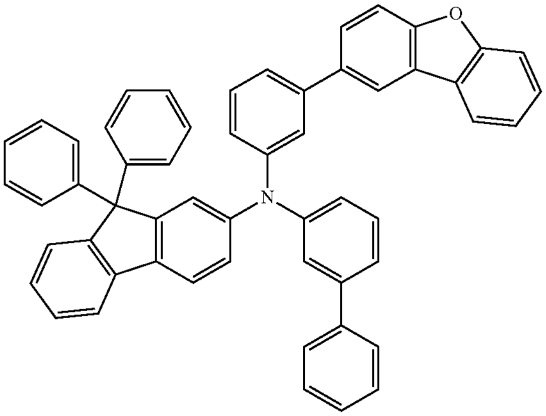
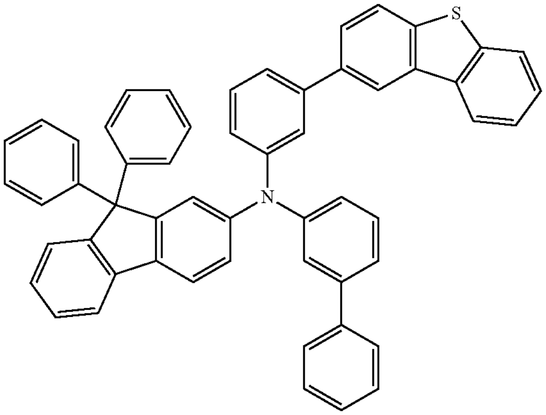
-continued
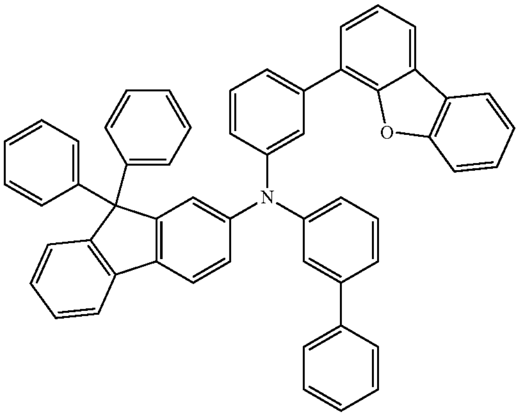
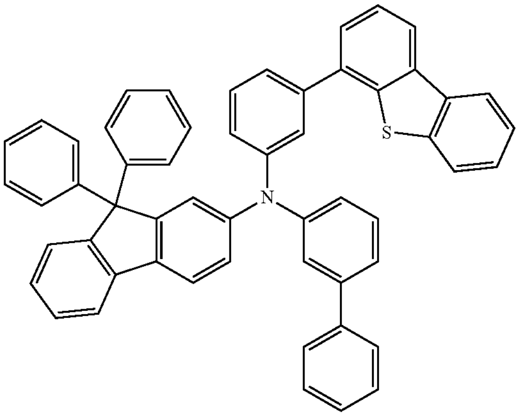
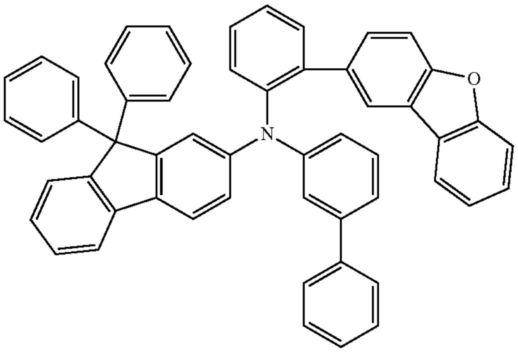
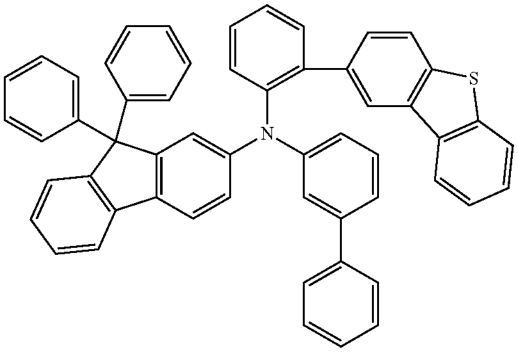

-continued
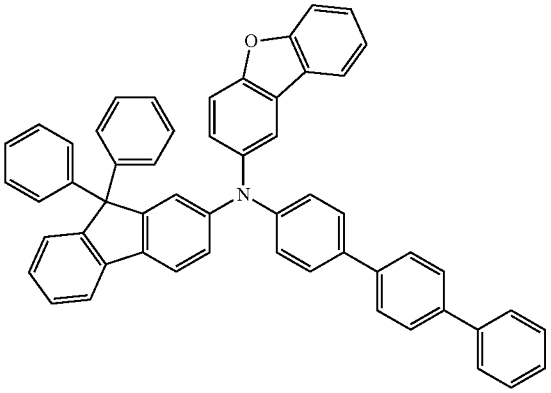
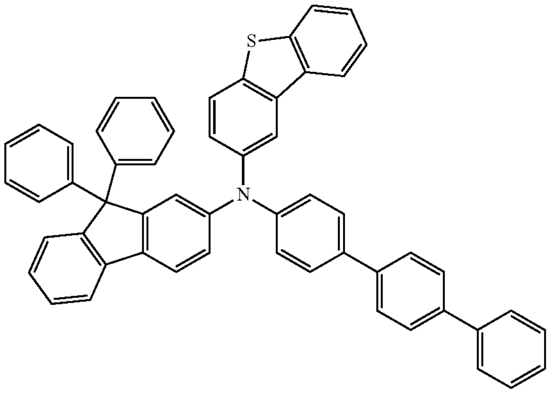
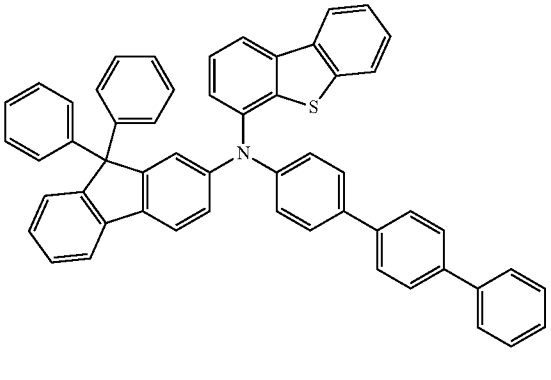
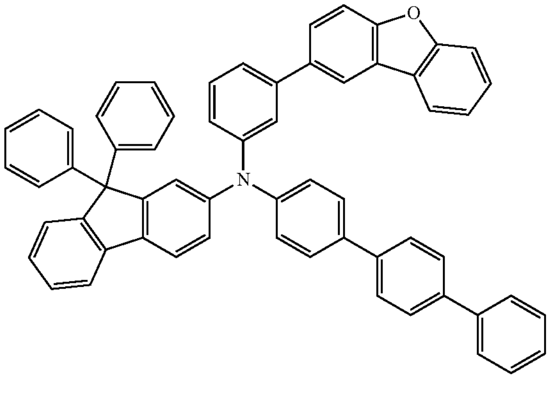
-continued
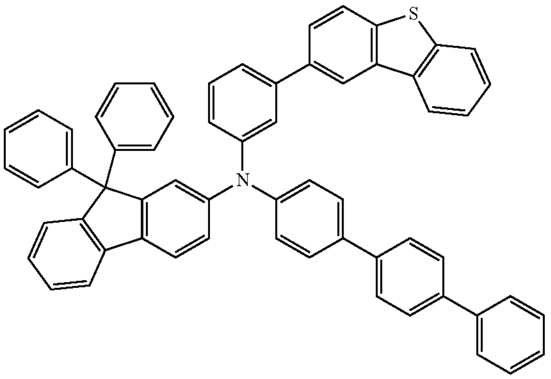
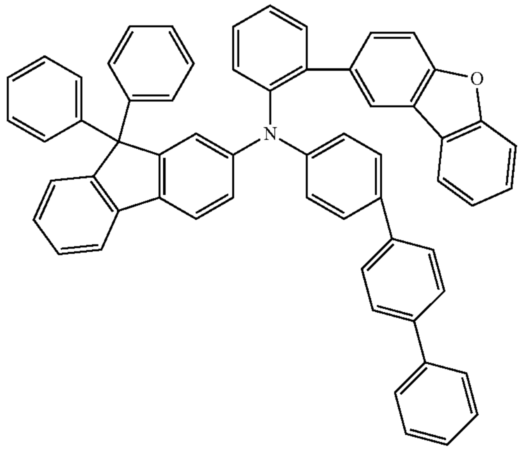
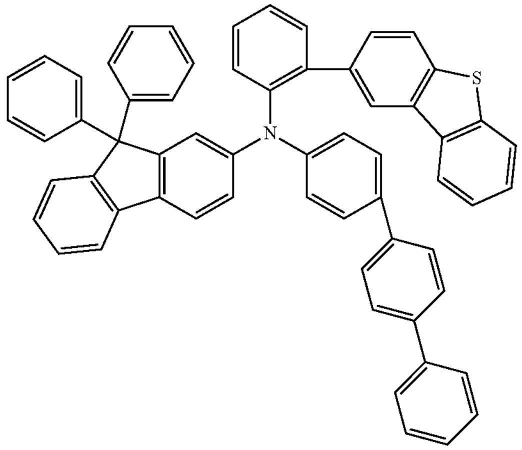
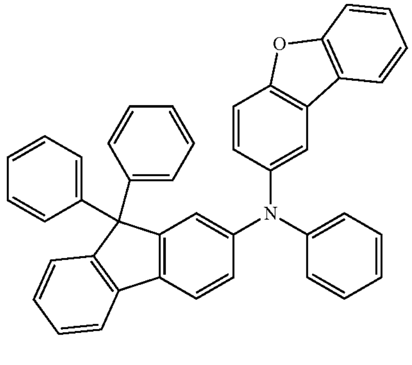

-continued
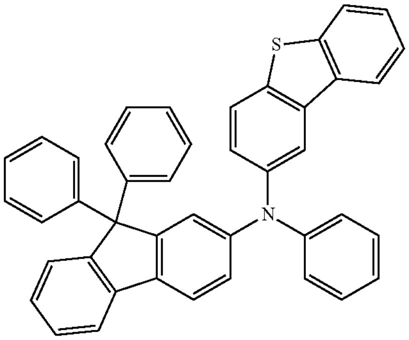
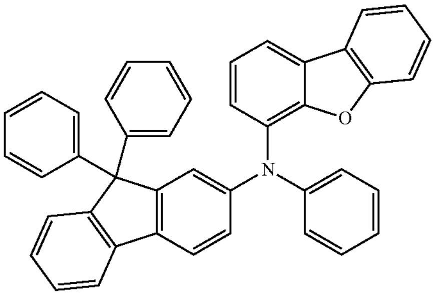
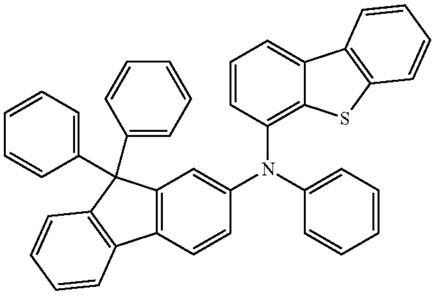
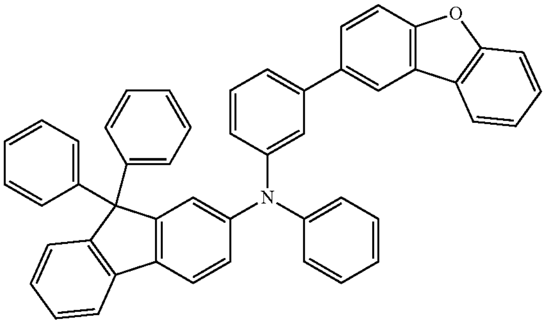
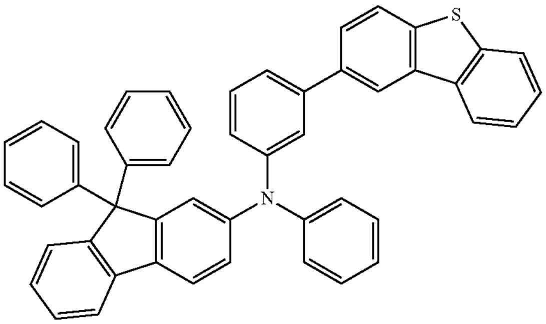
-continued
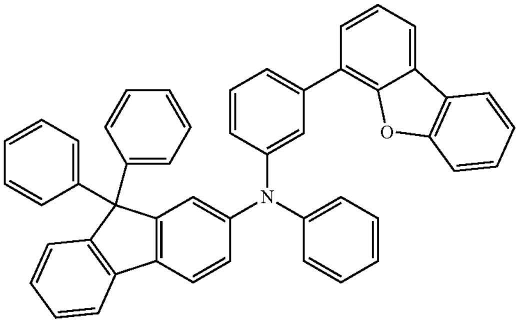
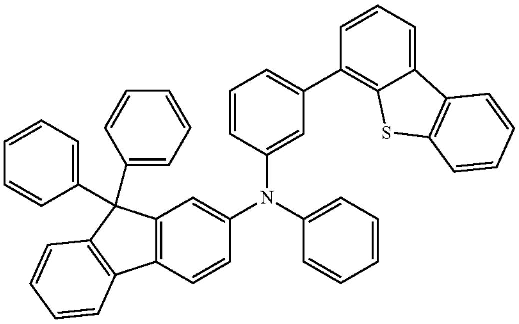
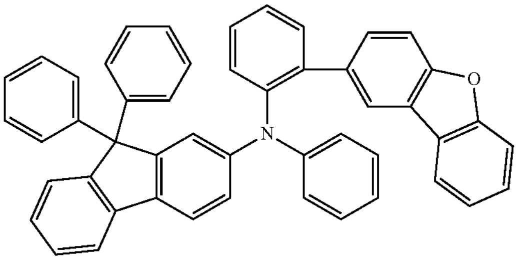
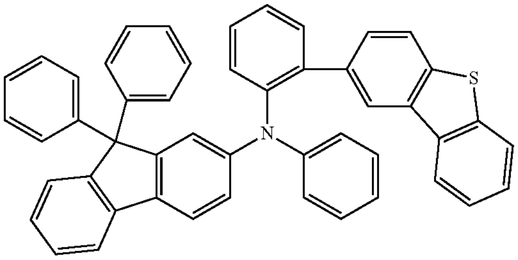
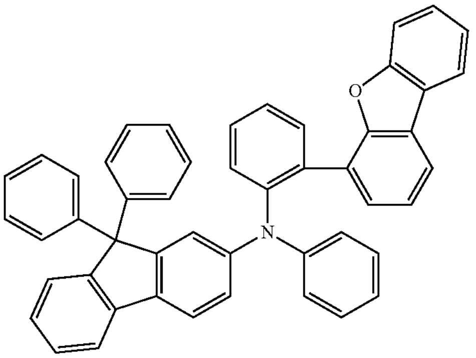

-continued
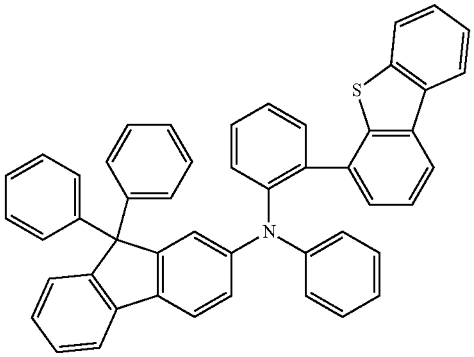
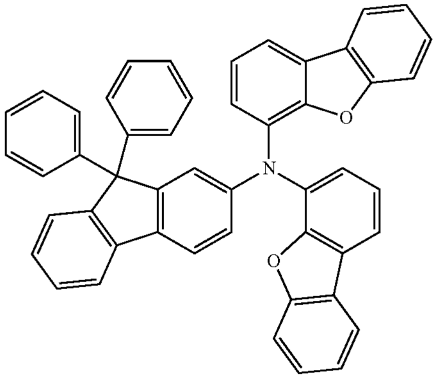
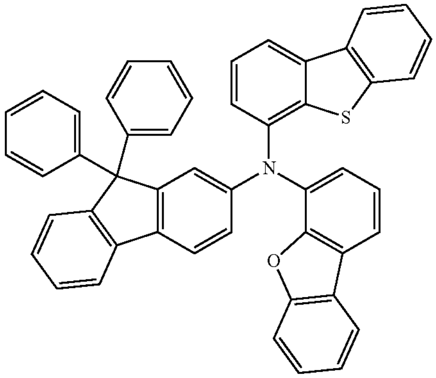
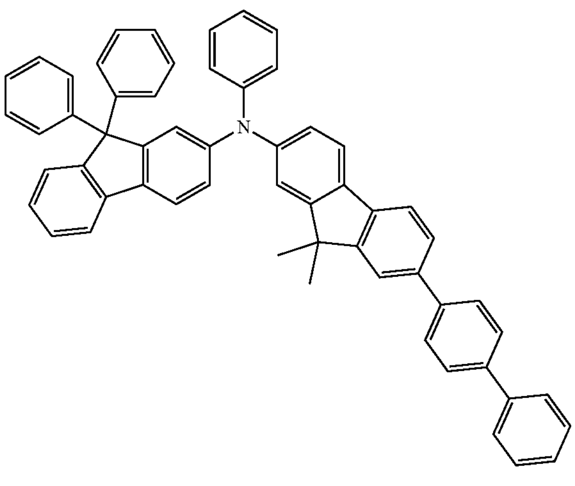
-continued
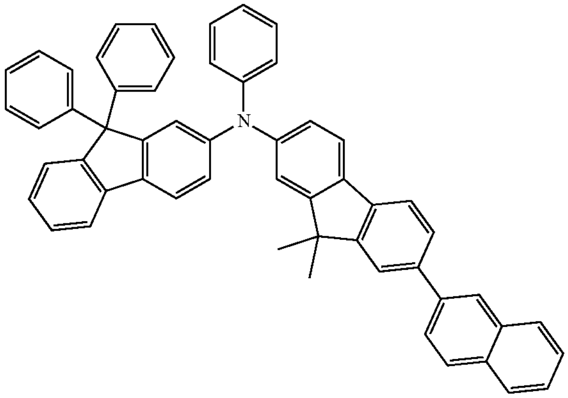
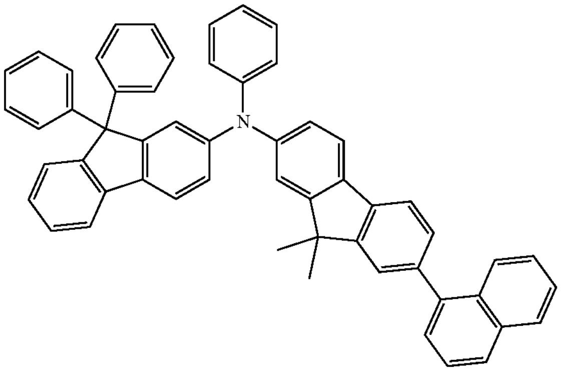
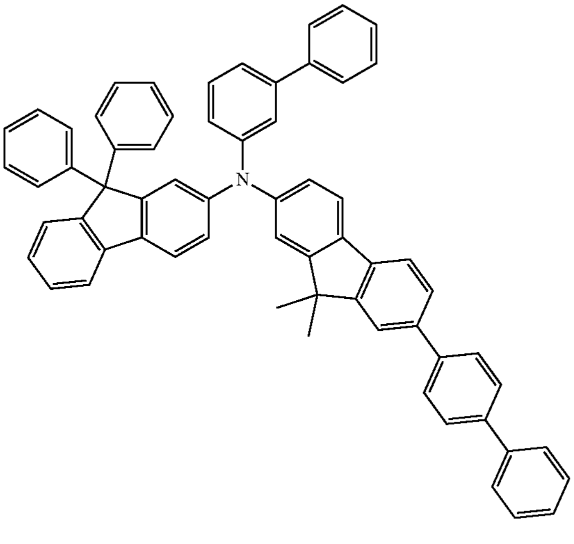

-continued
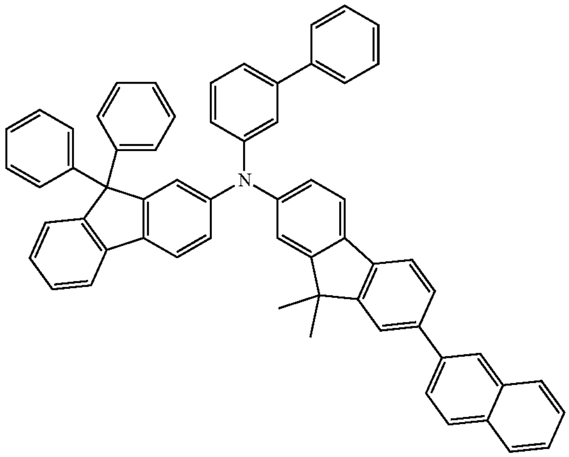
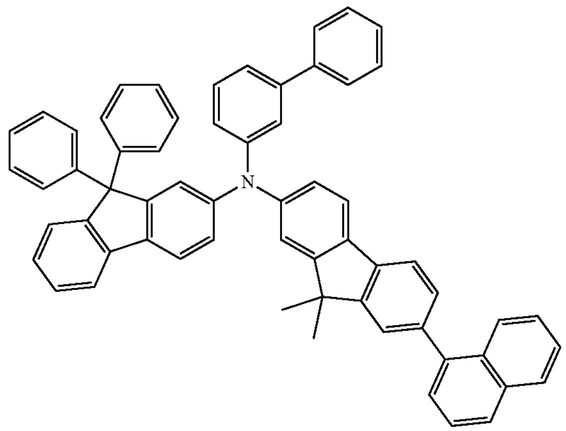
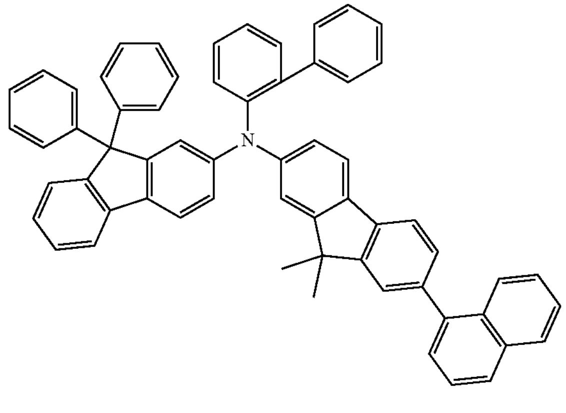
-continued
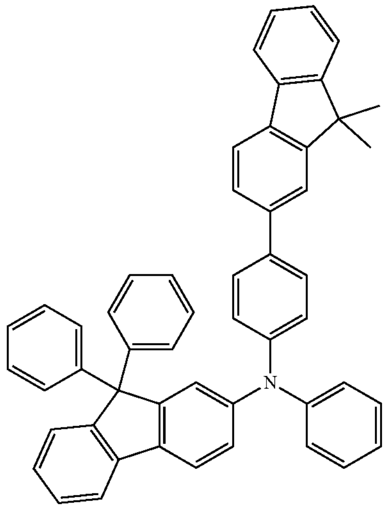
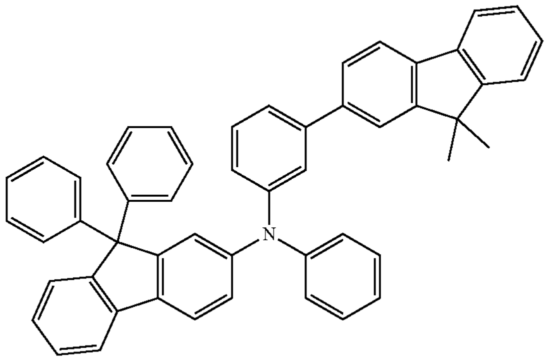
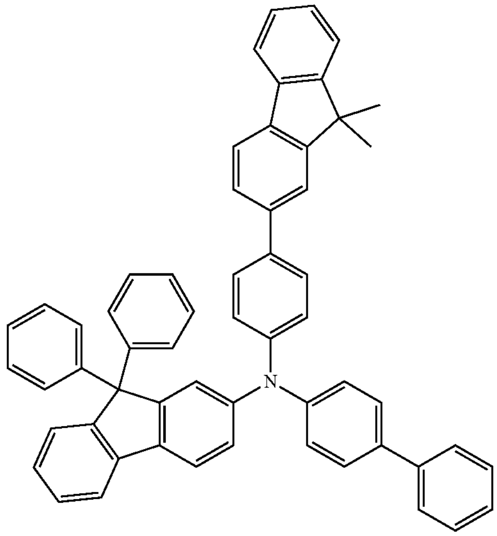

-continued
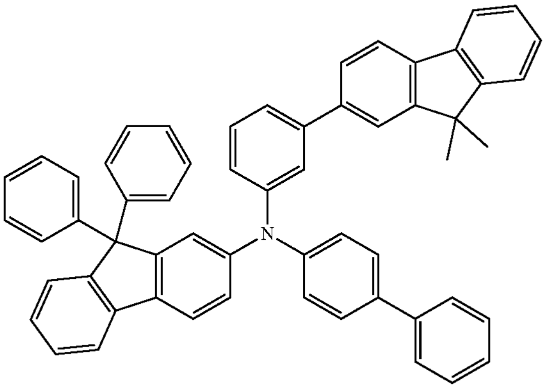
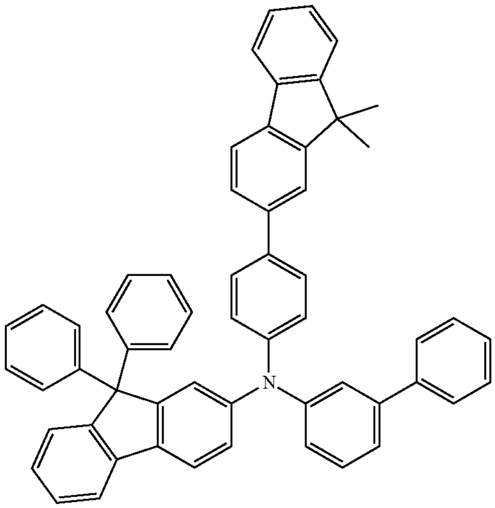
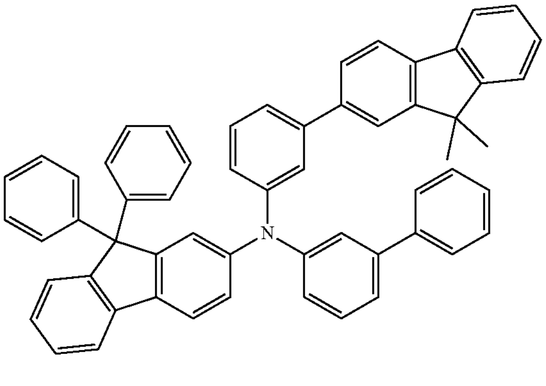
-continued
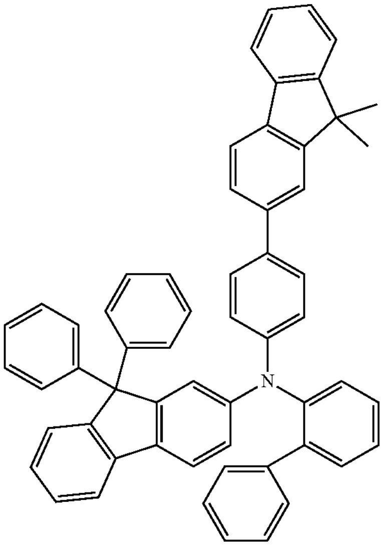
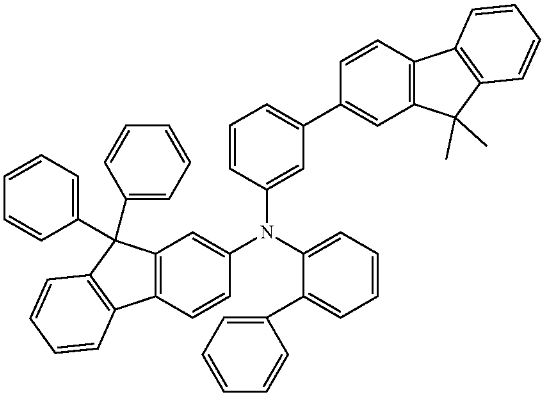
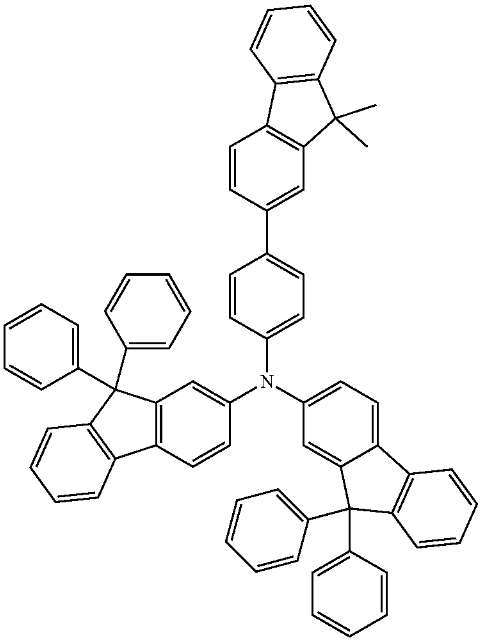

-continued
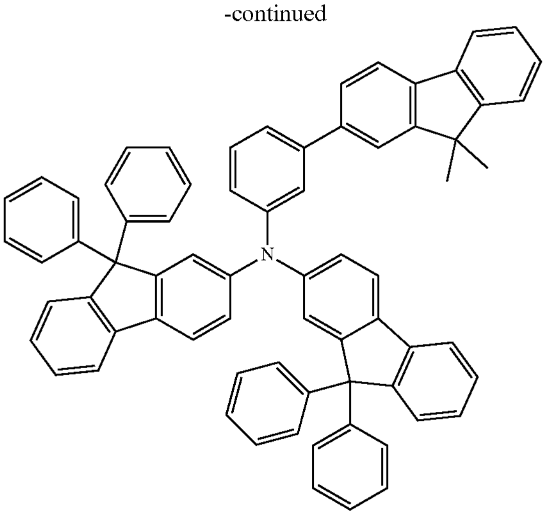
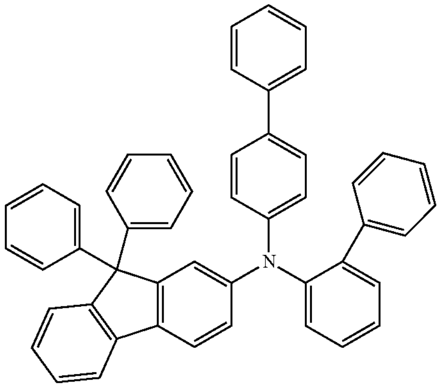
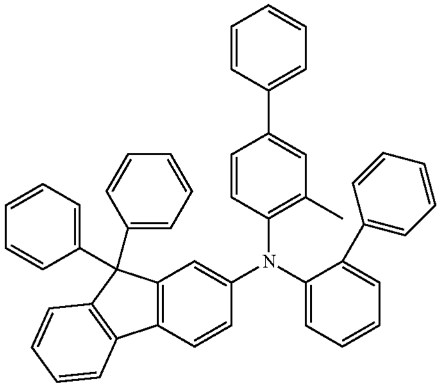
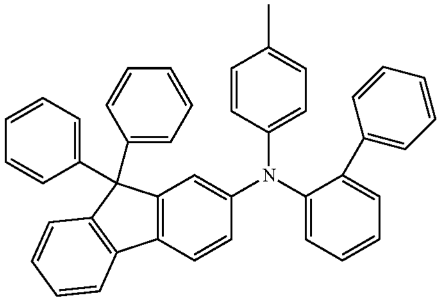
-continued
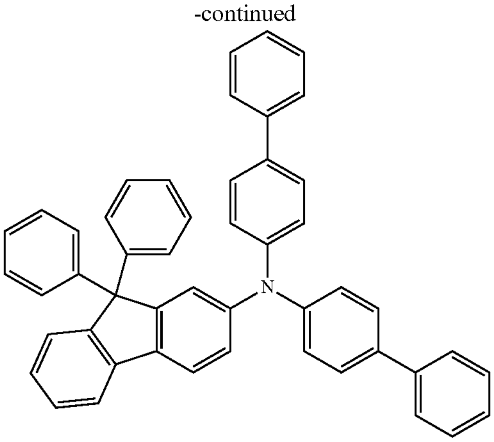
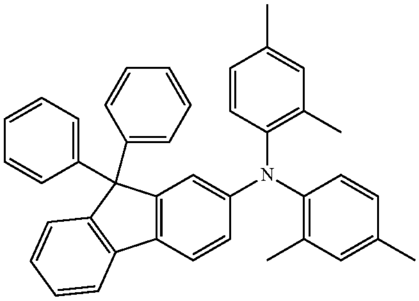
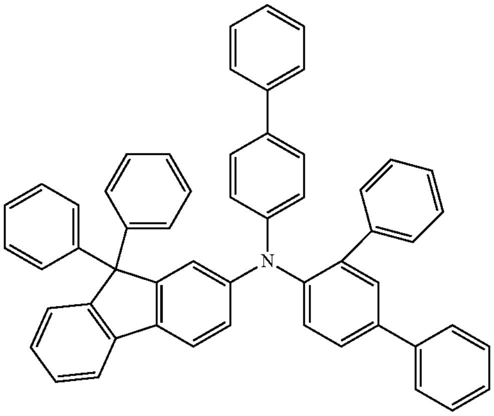
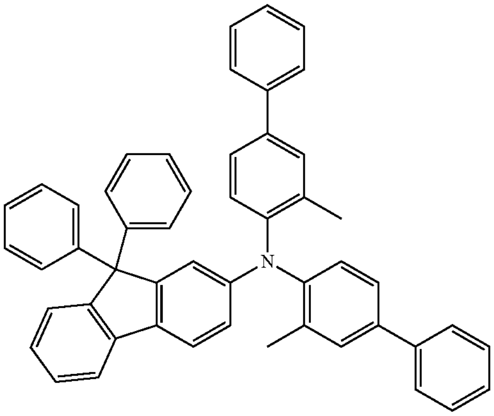

-continued
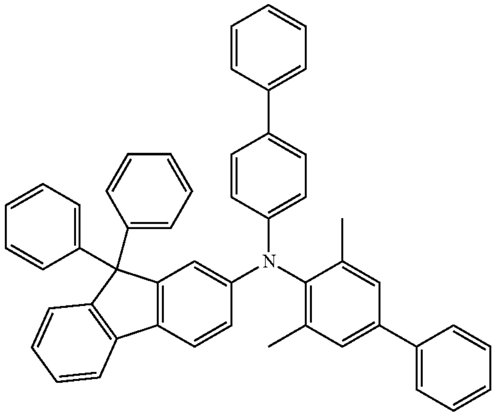
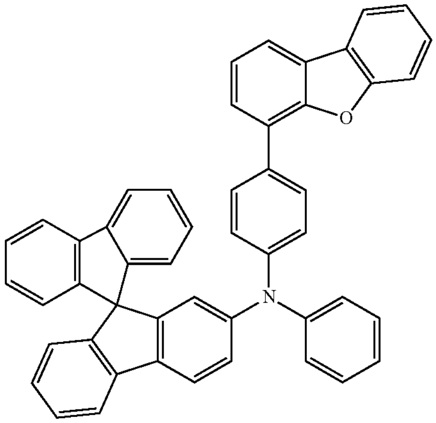
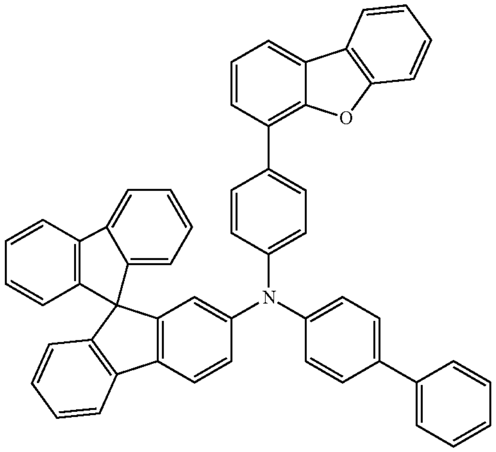
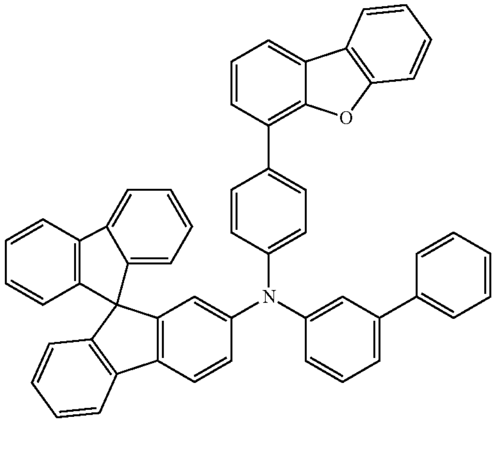
-continued
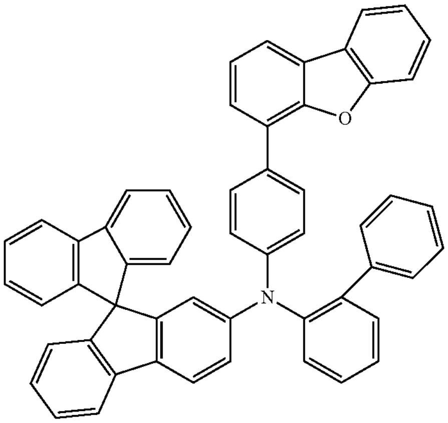
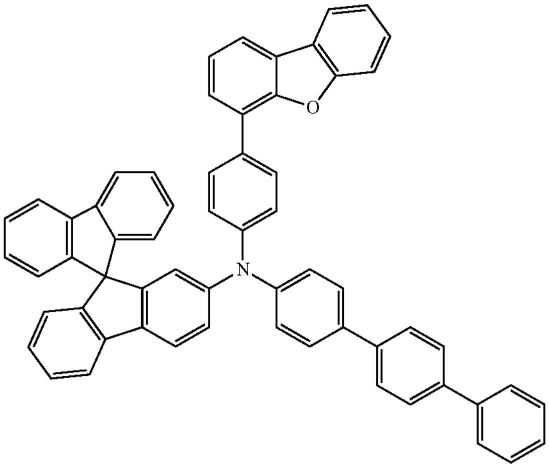
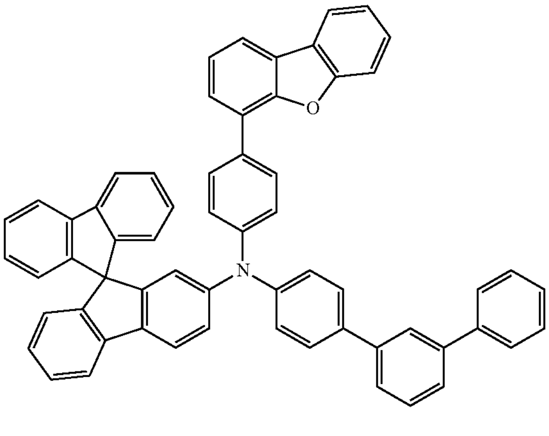

-continued
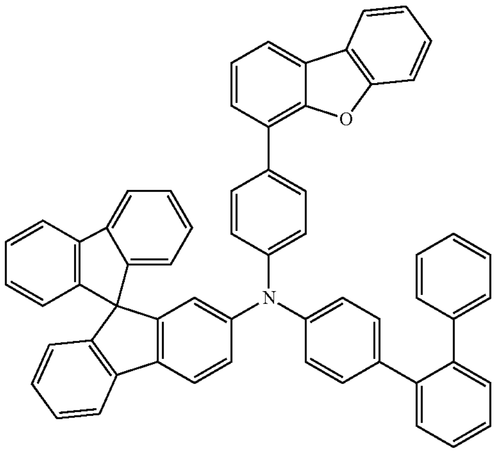
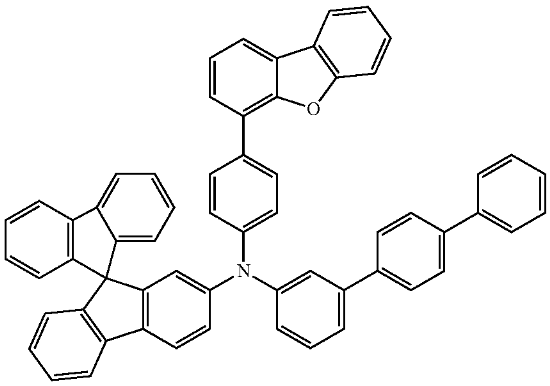
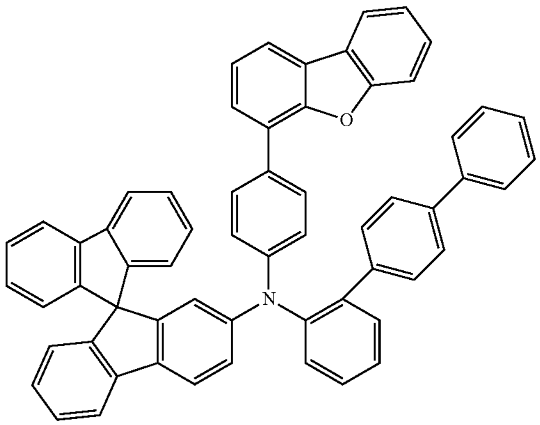
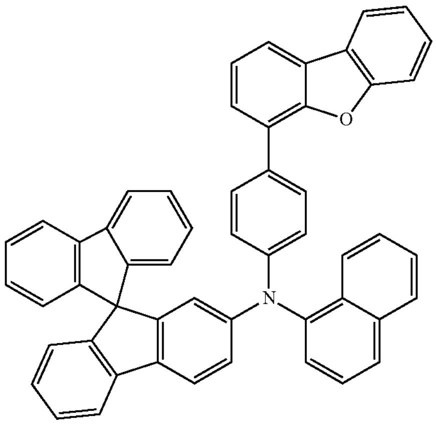
-continued
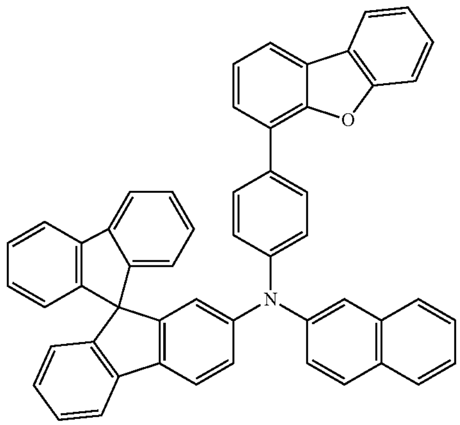
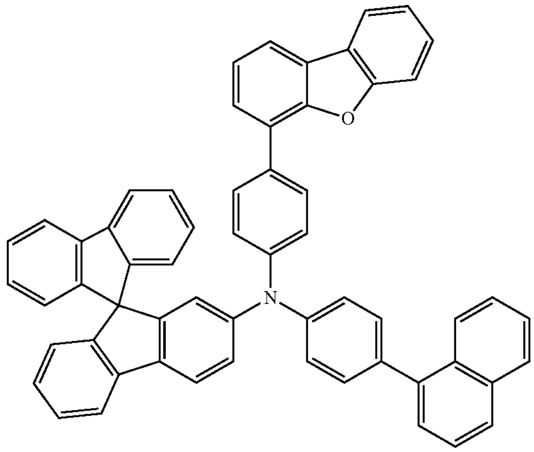
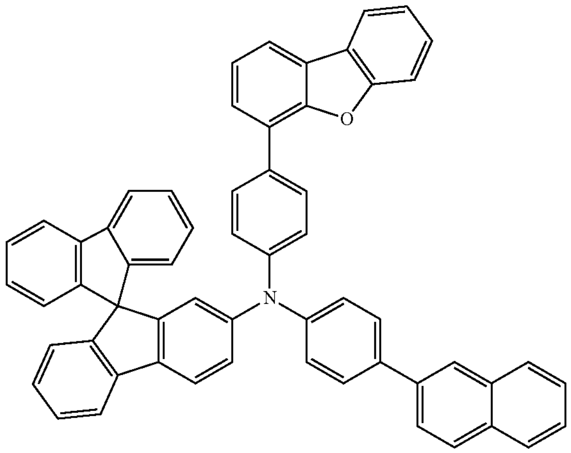

-continued
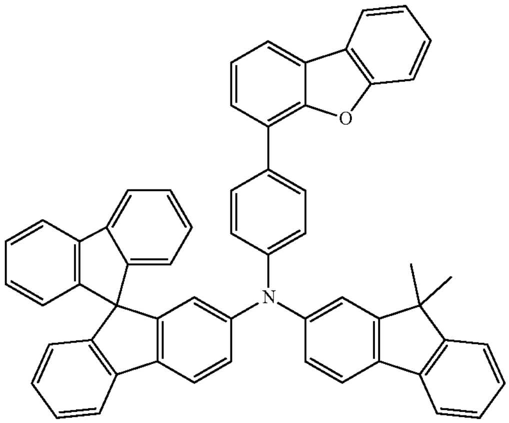
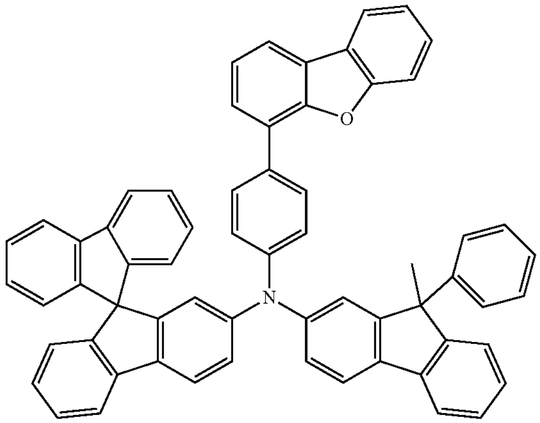
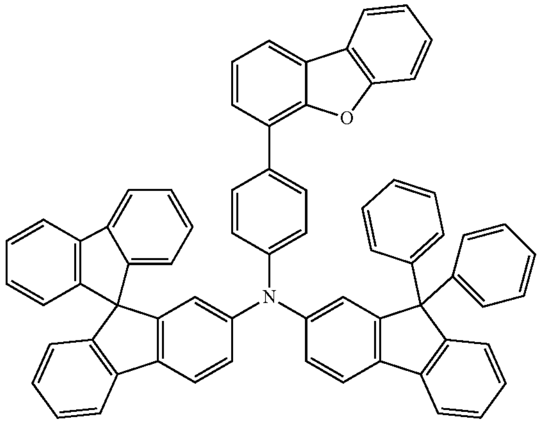
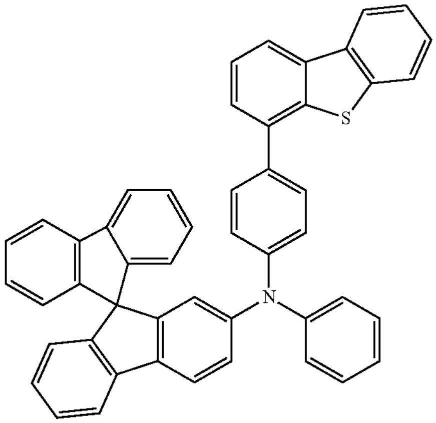
-continued
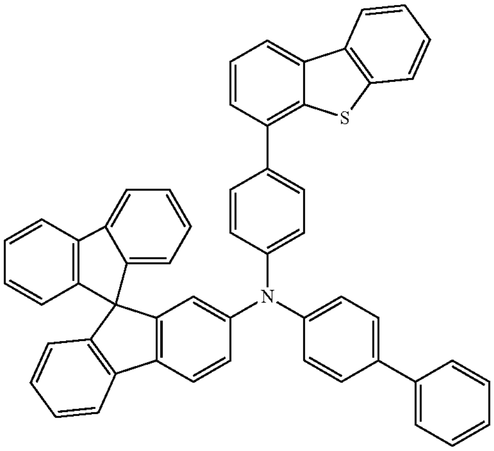
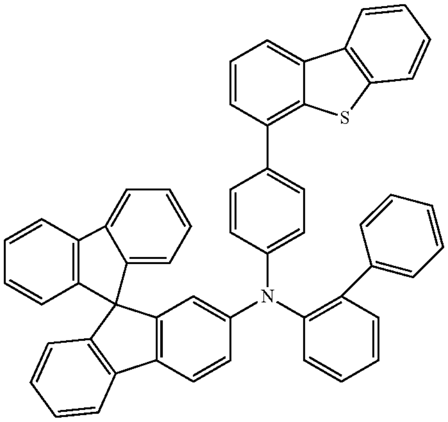
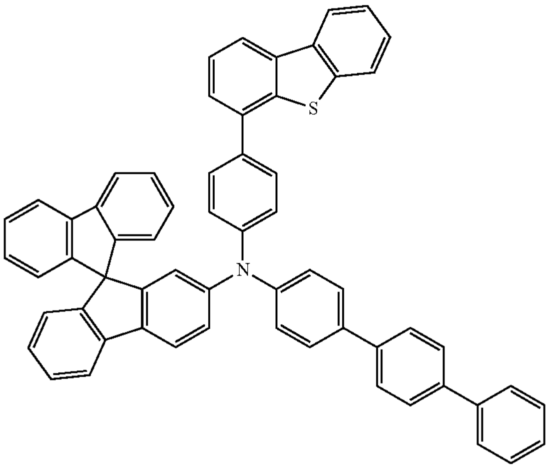

-continued
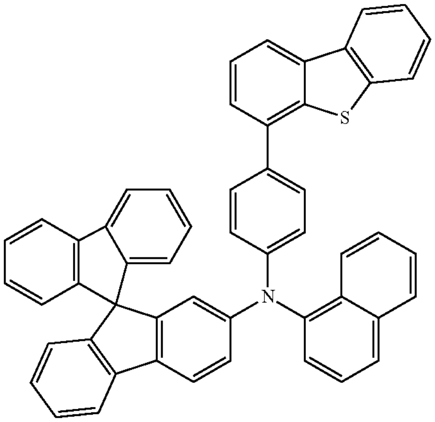
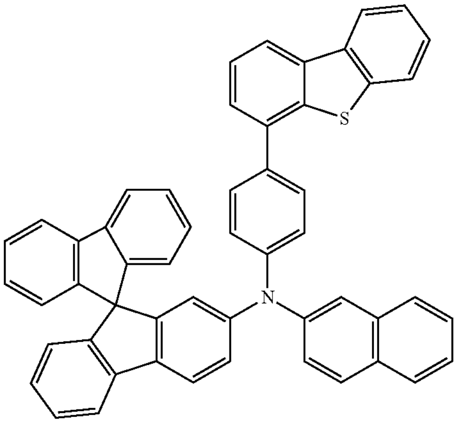
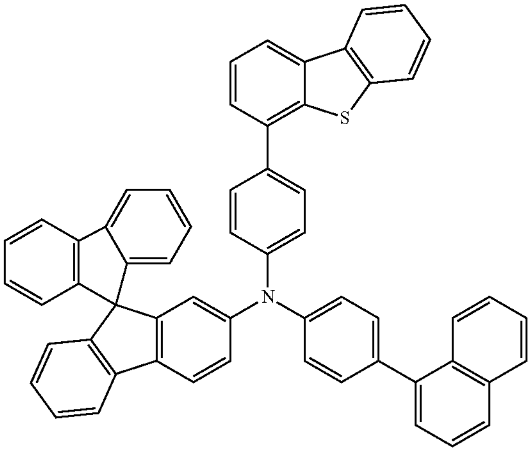
-continued
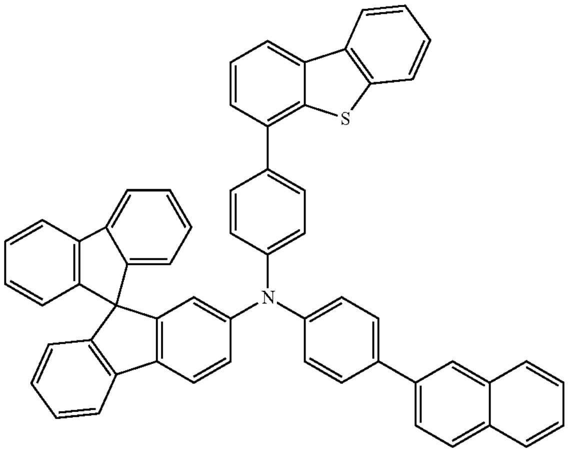
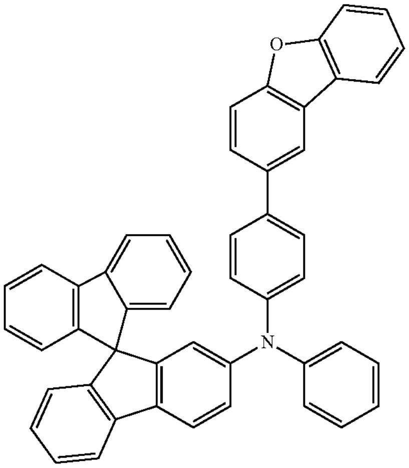
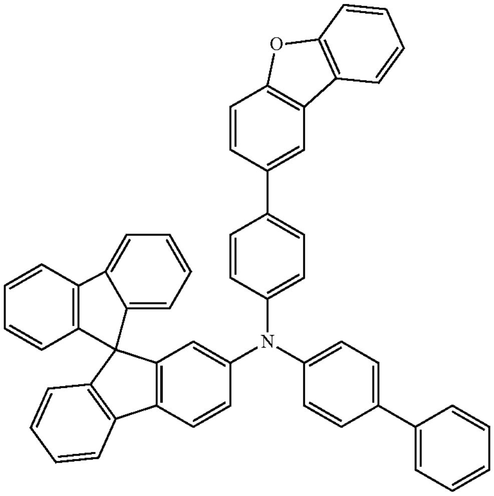

-continued
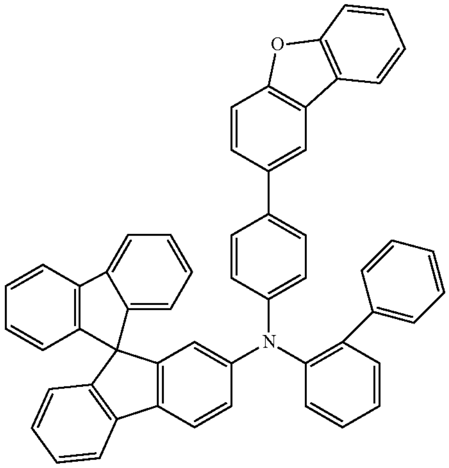
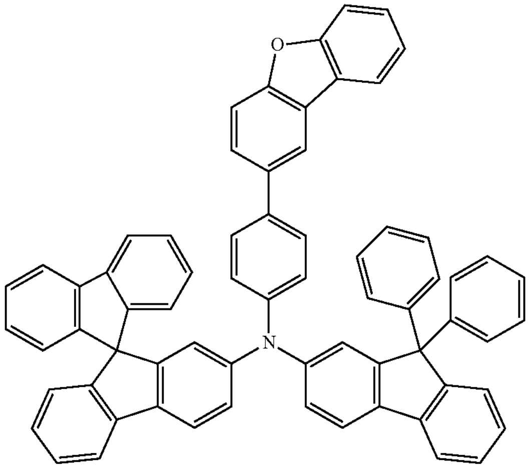
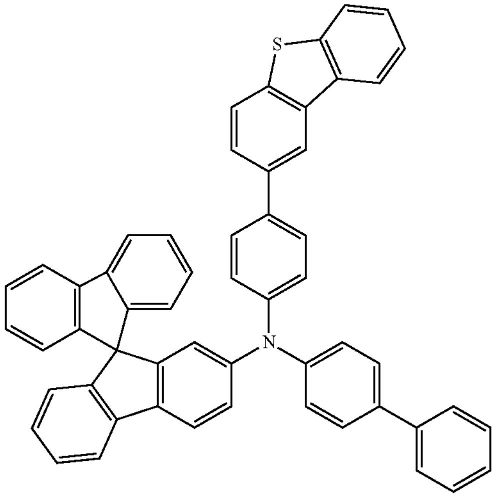
-continued
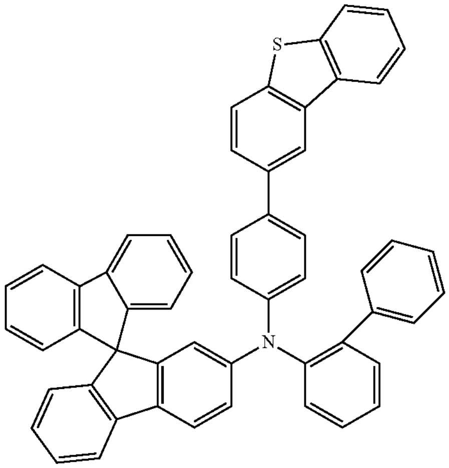
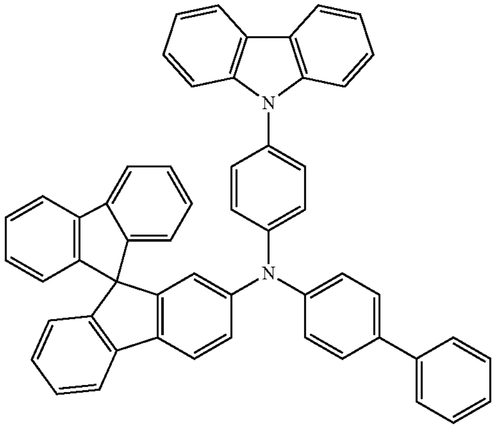
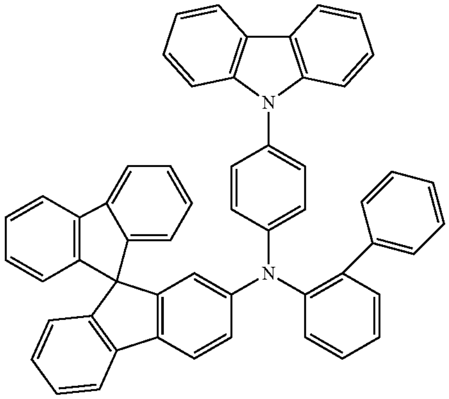
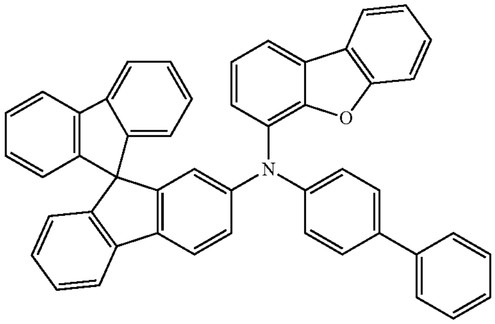

-continued
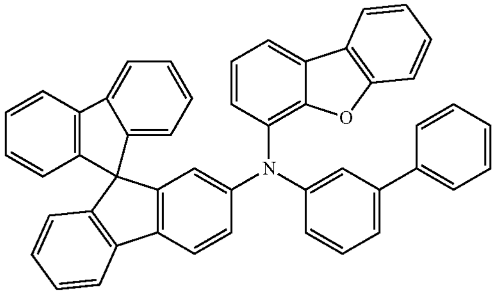
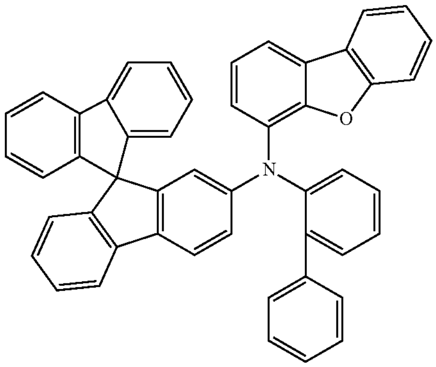
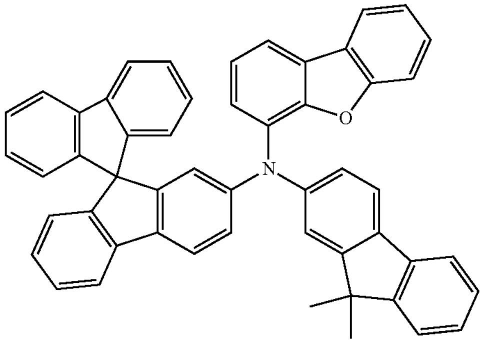
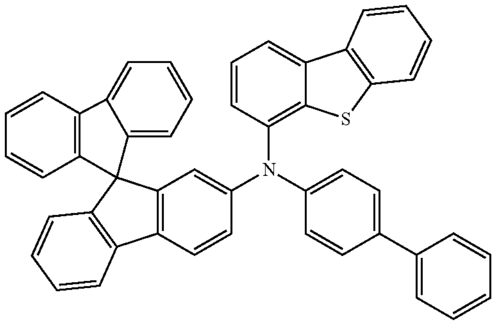
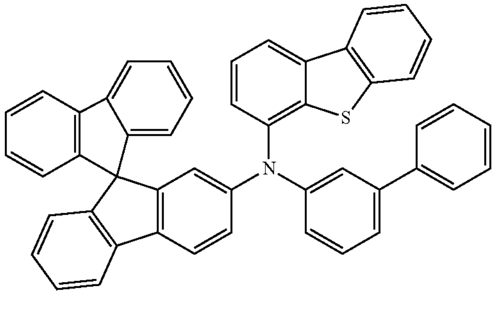
-continued
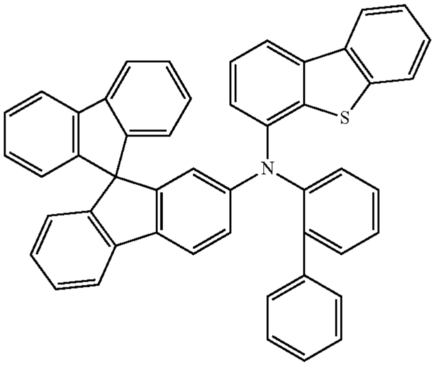
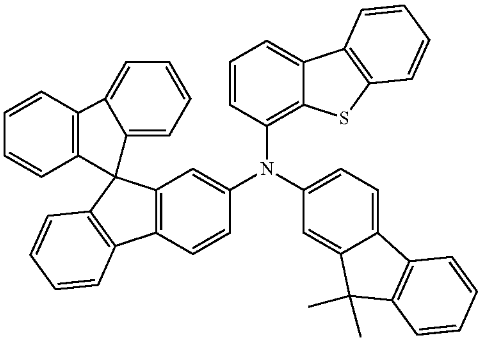
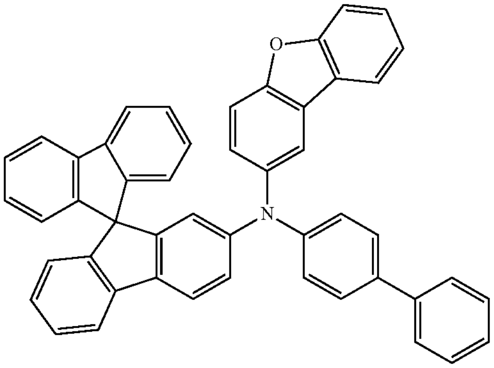
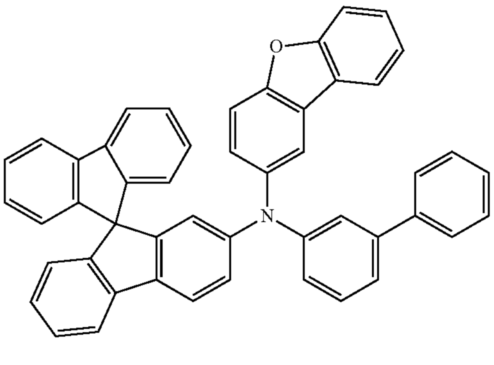

-continued
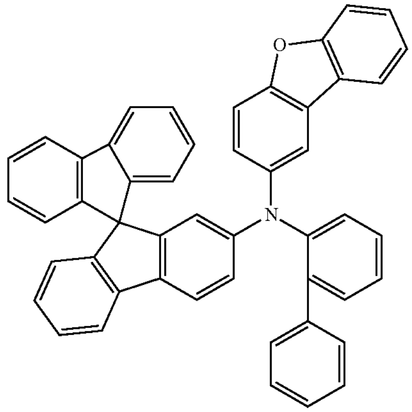
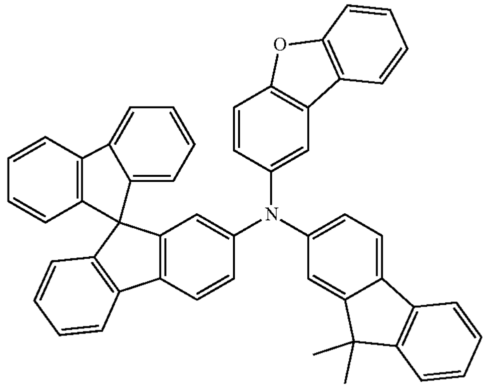
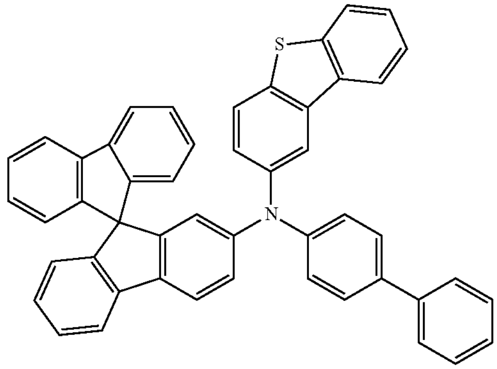
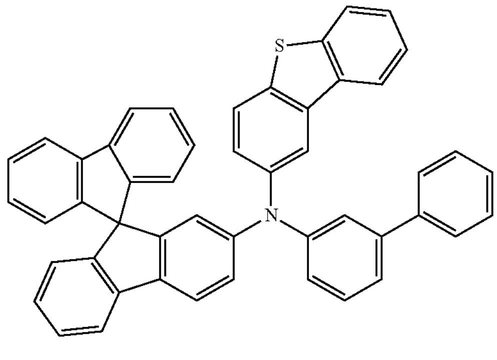
-continued
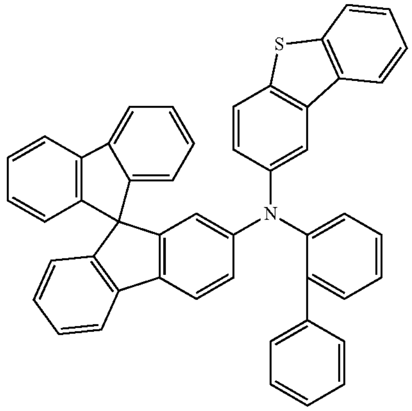
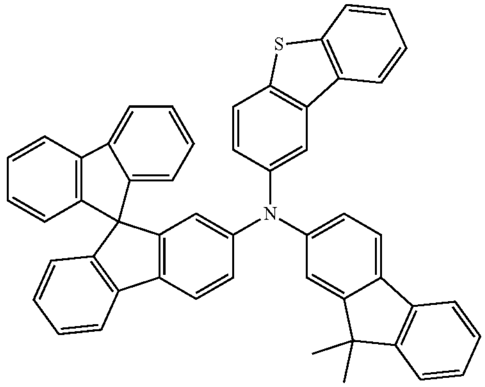
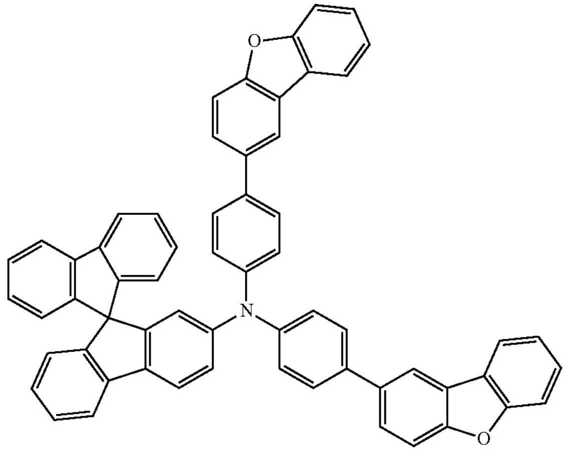

-continued
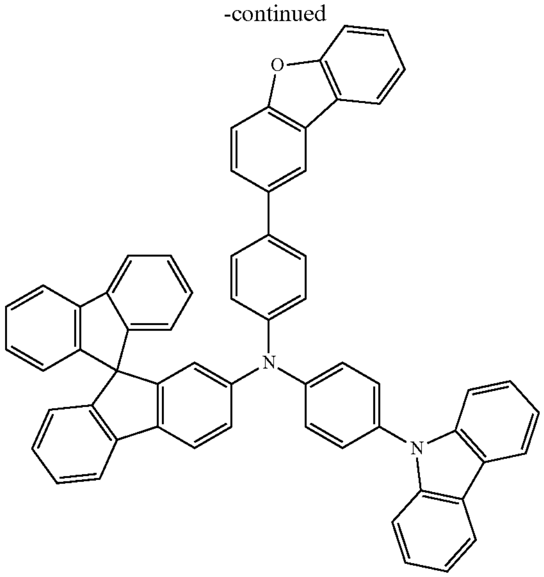
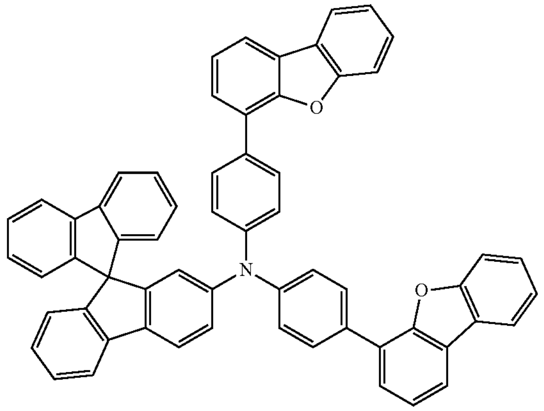
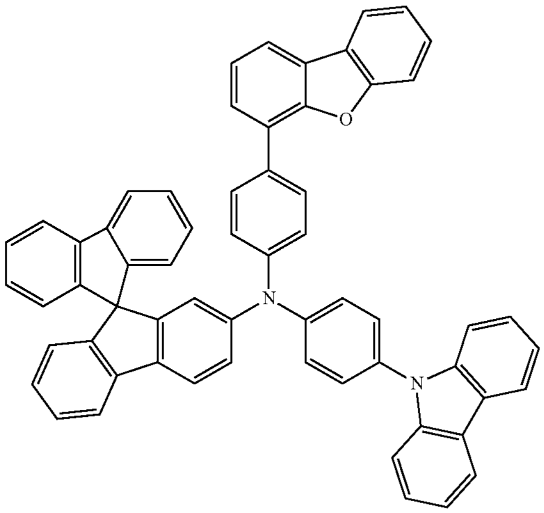
-continued
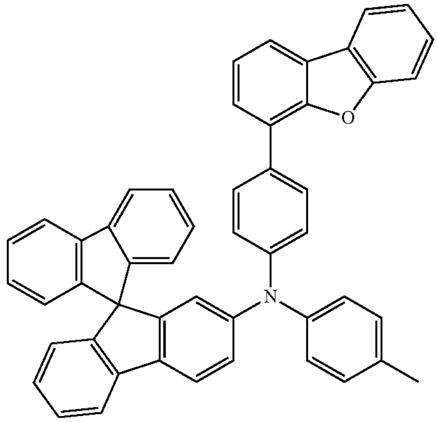
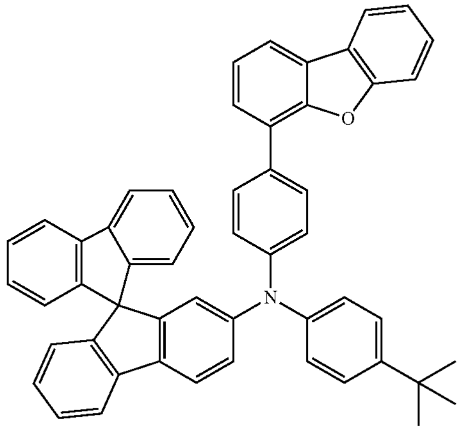
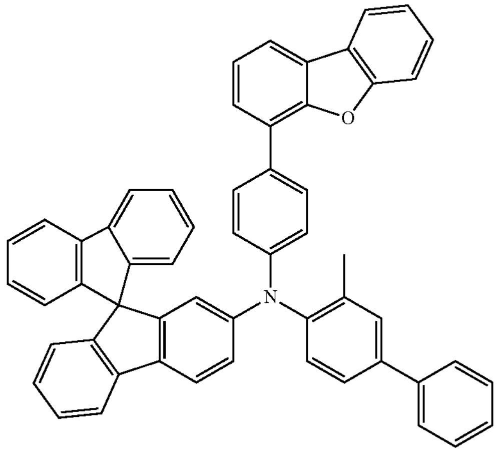

-continued
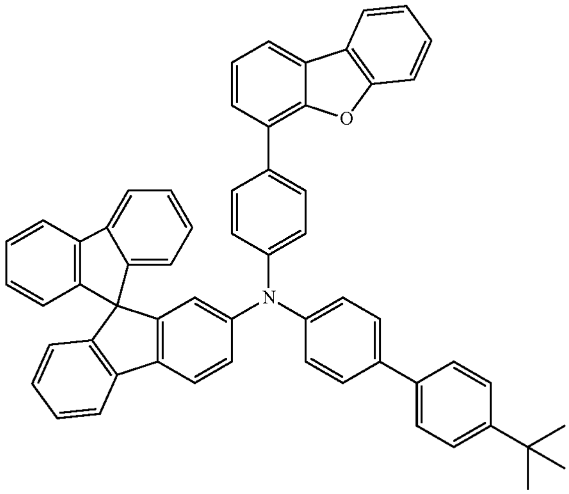 [SMILES: CC(C)(C)c1ccc(-c2ccc(N(c3ccc(-c4cccc5c4oc4ccccc45)cc3)c3ccc4c(c3)C3(c5ccccc5-c5ccccc53)c3ccccc3-4)cc2)cc1]
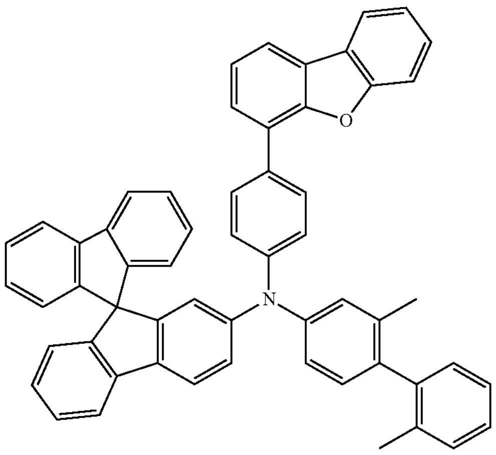
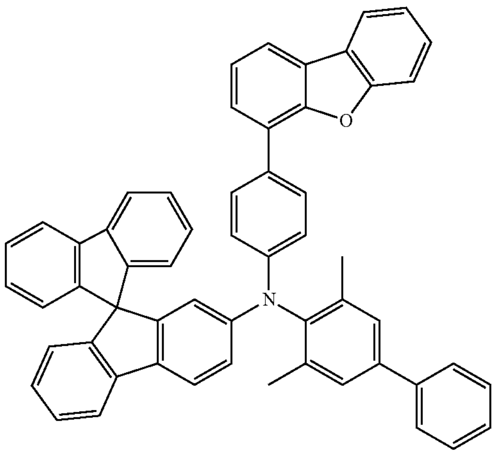
-continued
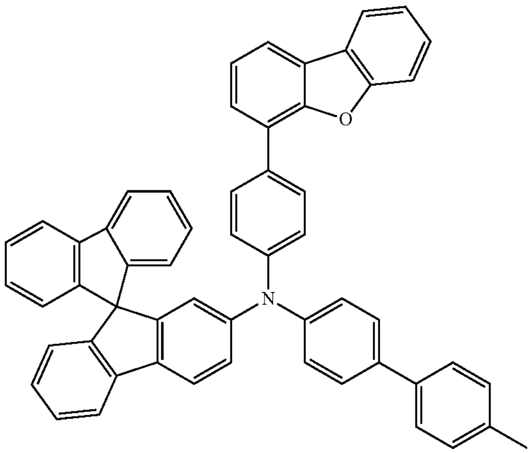
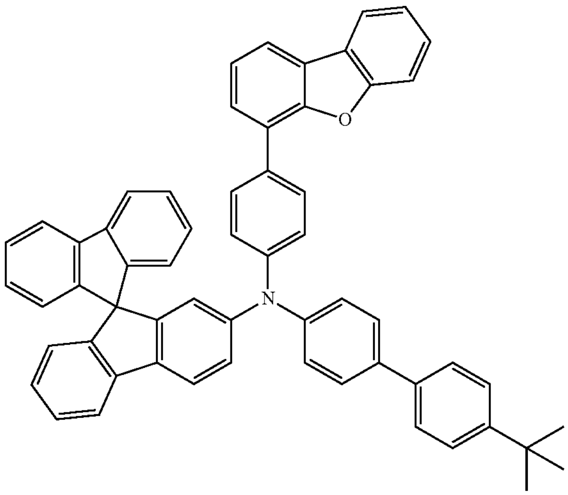
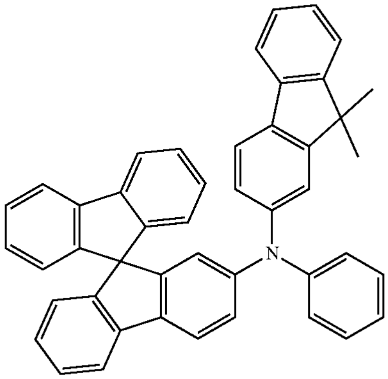

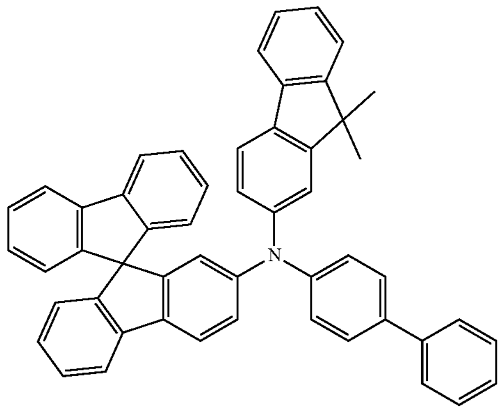
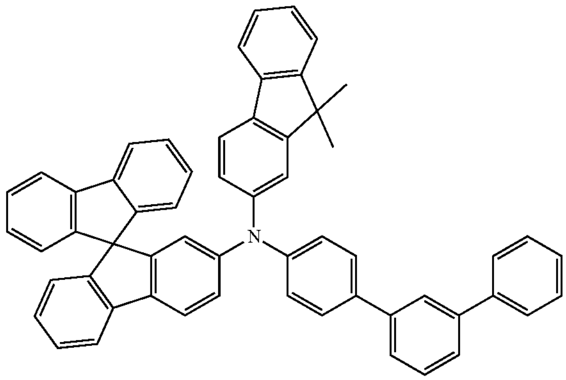
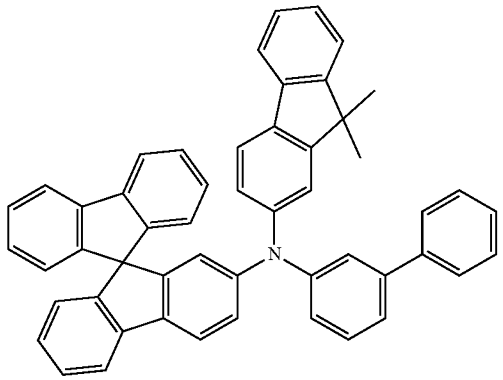
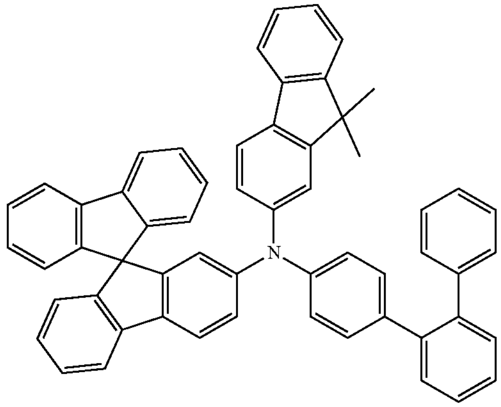
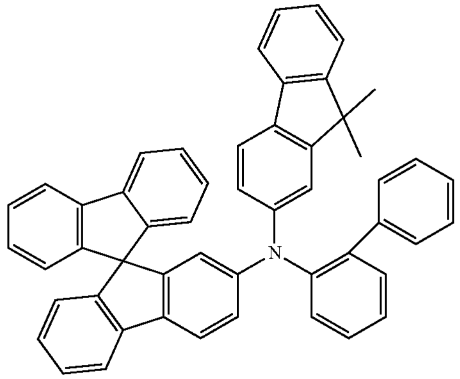
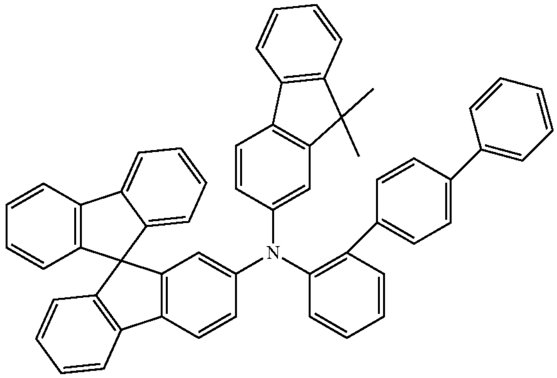
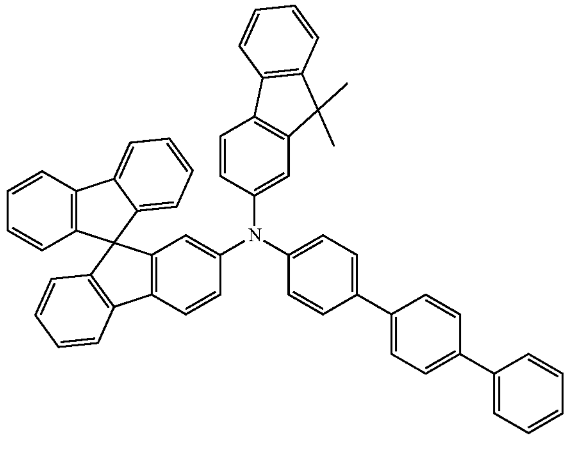
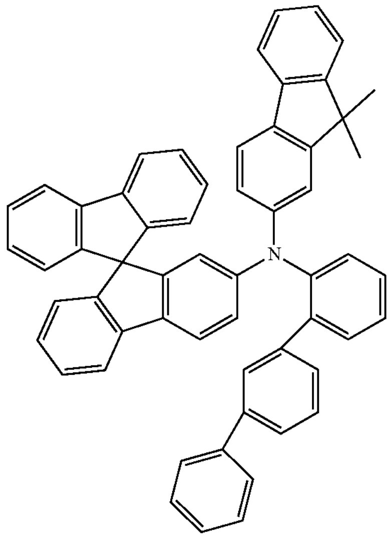

-continued
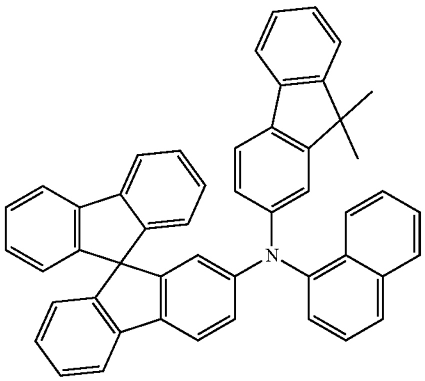
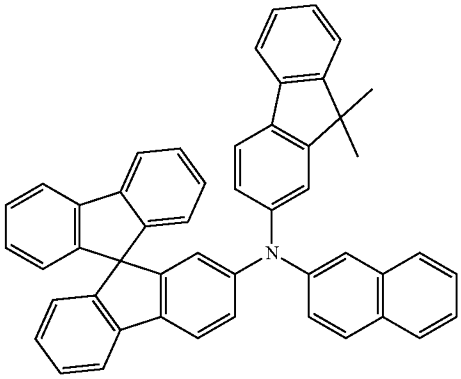
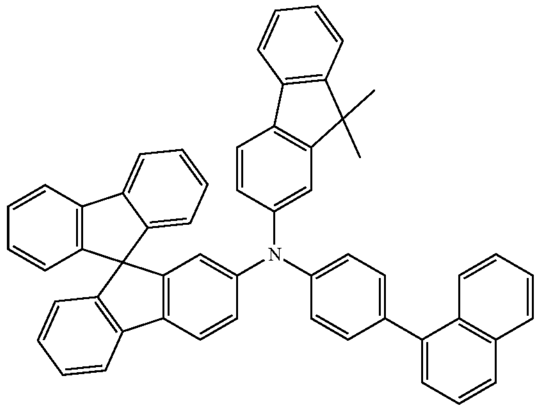
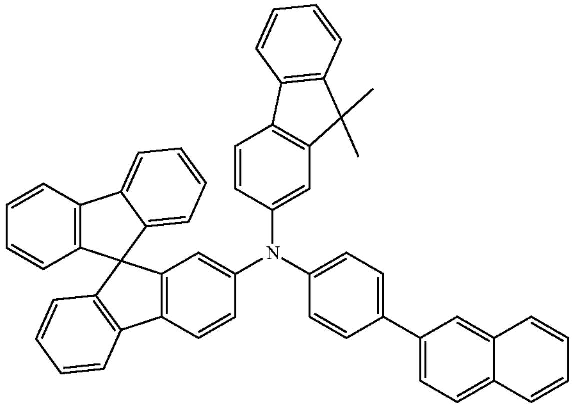
-continued
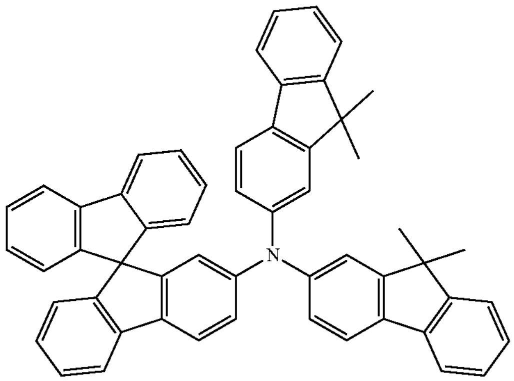
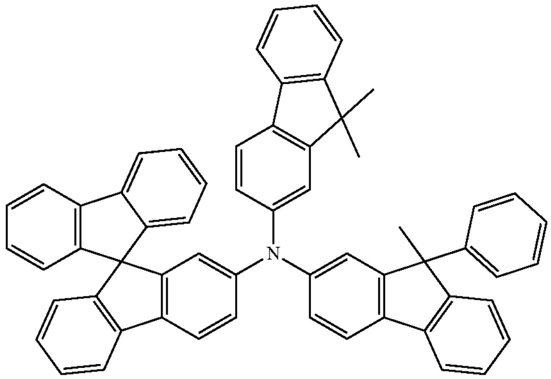
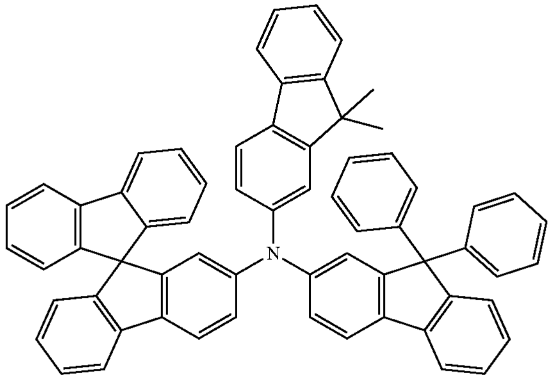
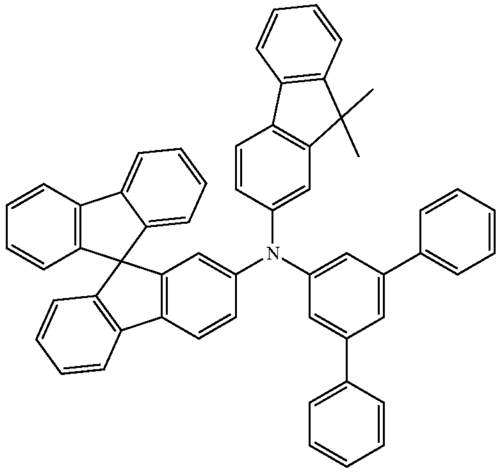

-continued
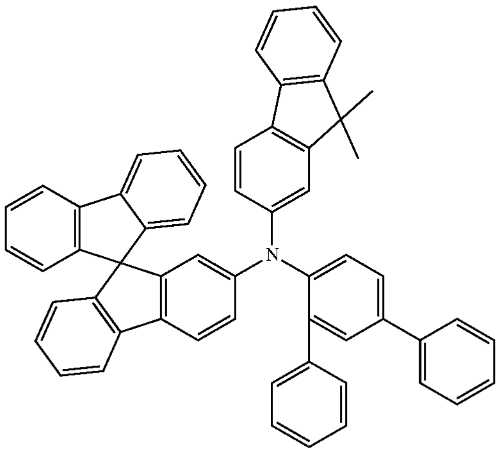
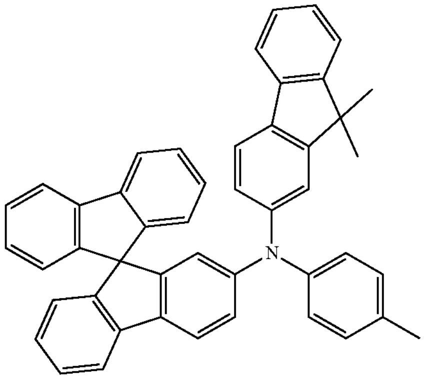
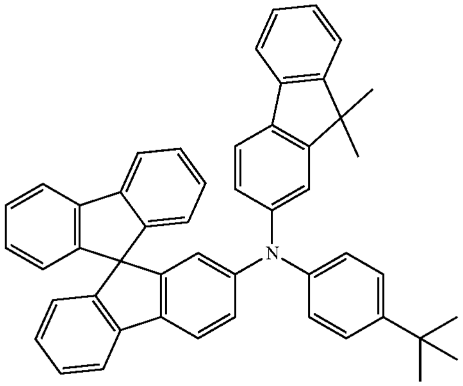
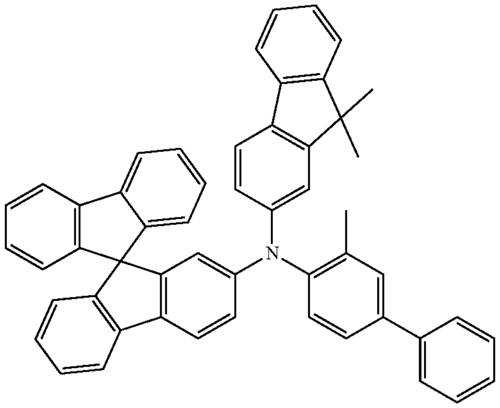
-continued
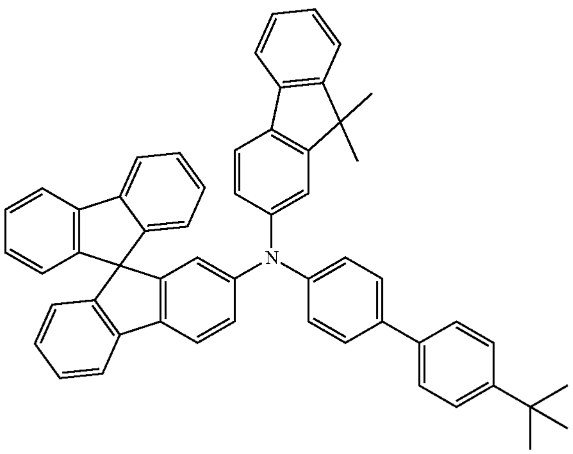
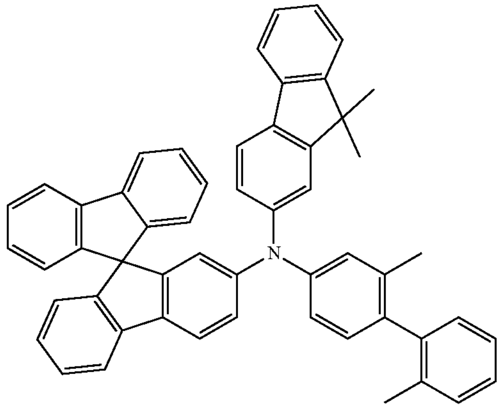
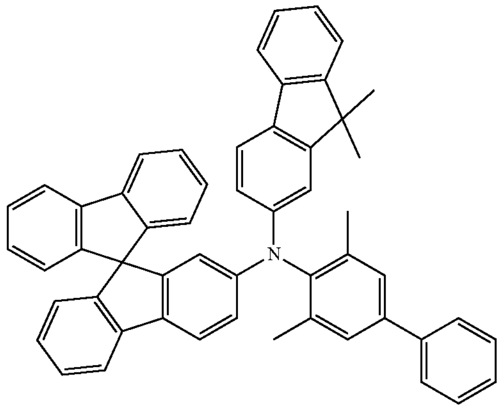
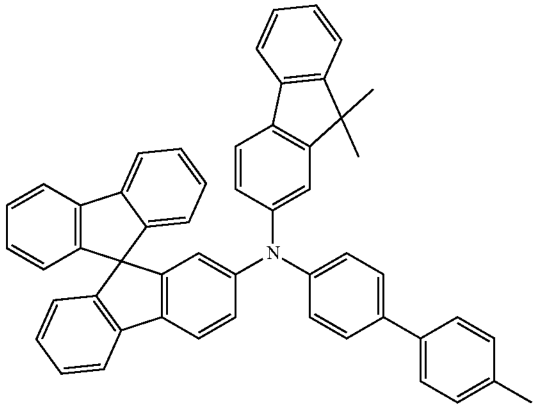

-continued
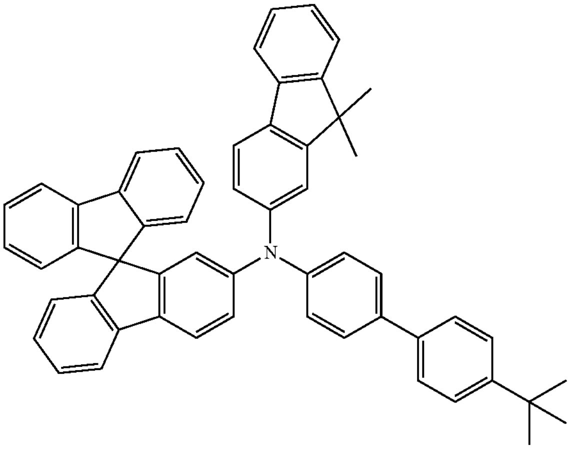
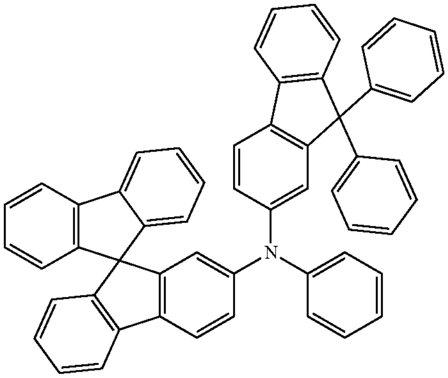
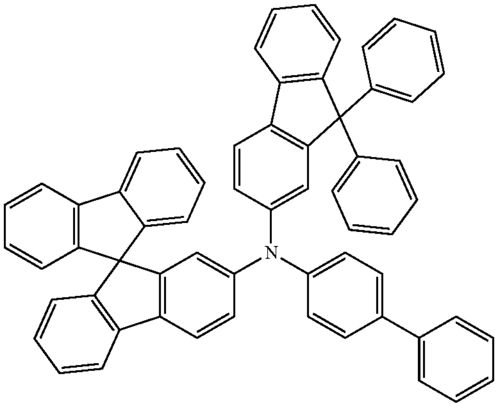
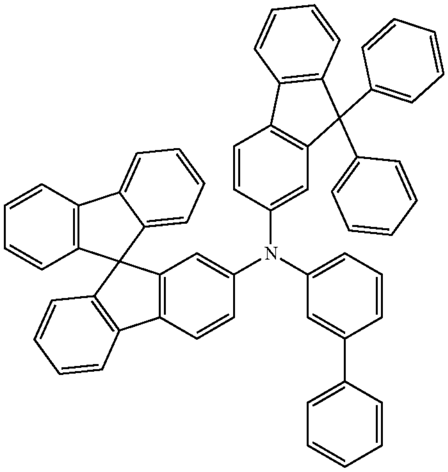
-continued
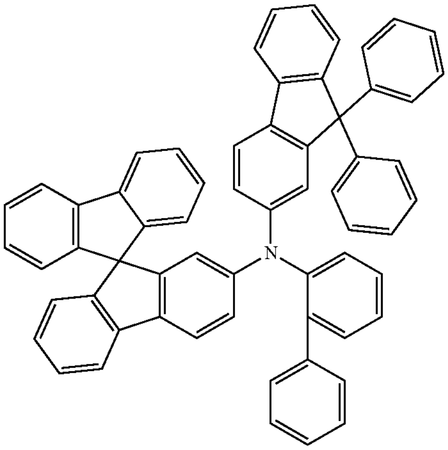
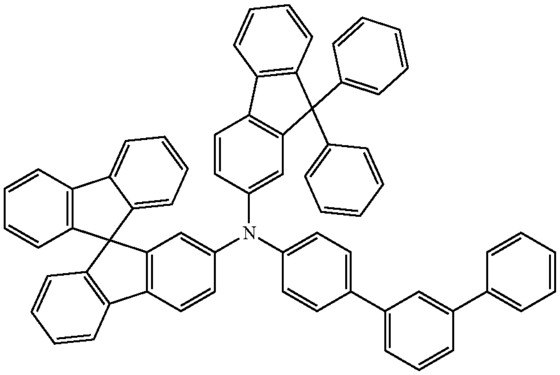
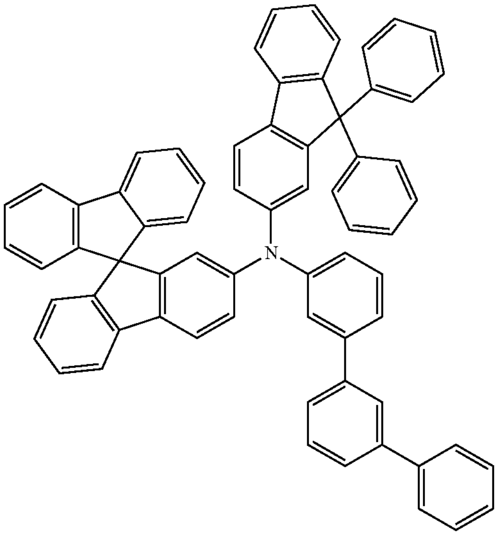

-continued
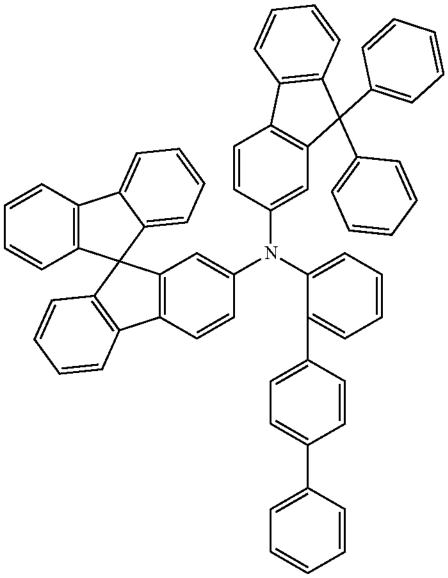
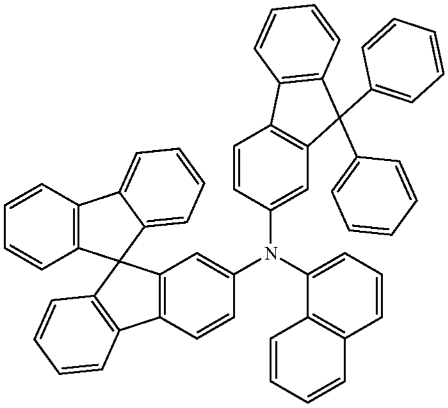
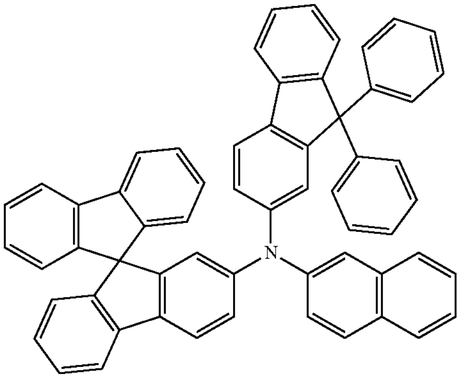
-continued
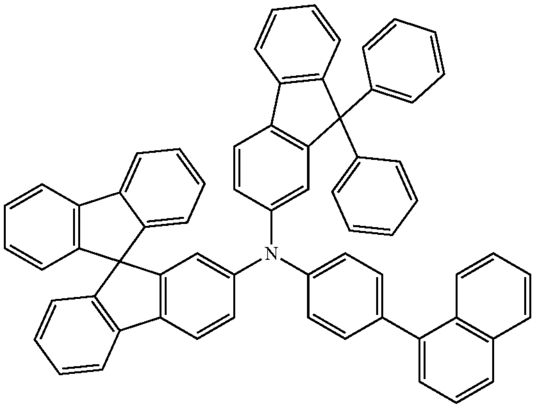
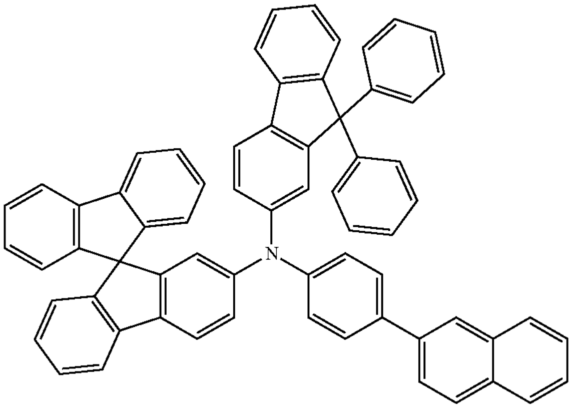
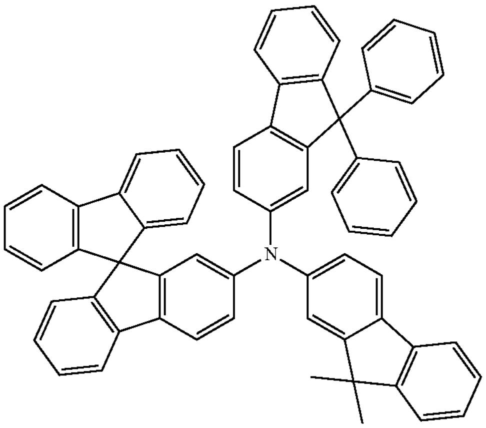

-continued
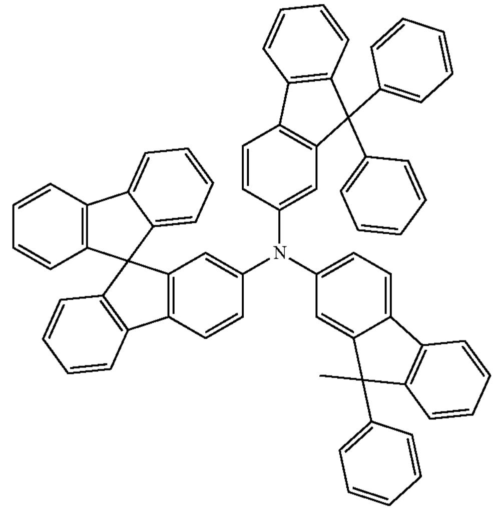
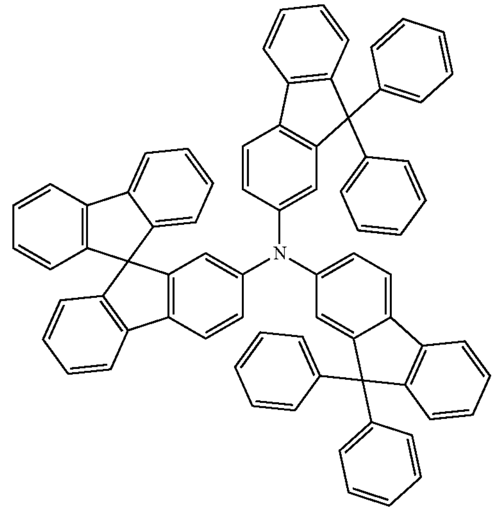
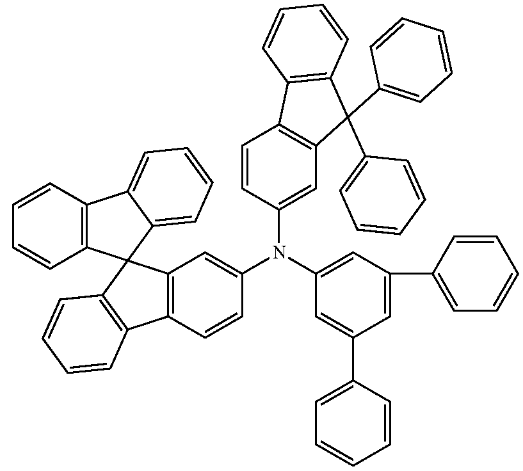
-continued
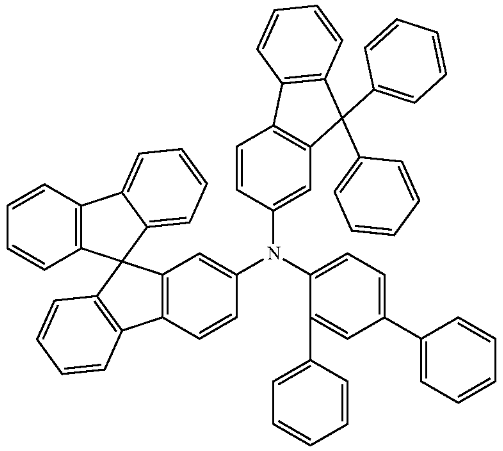
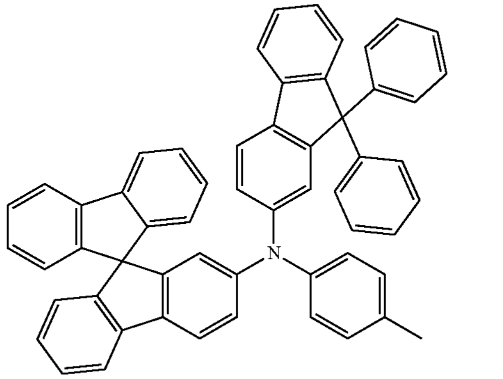
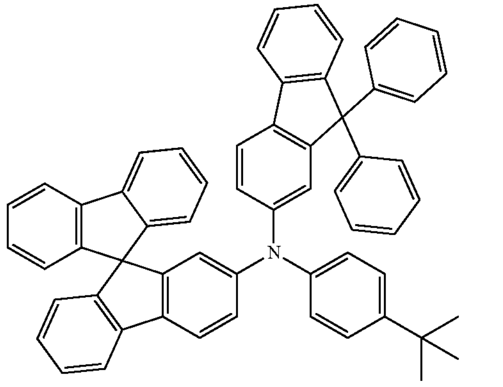
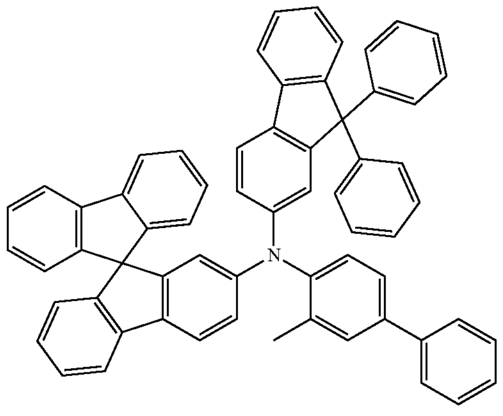

-continued
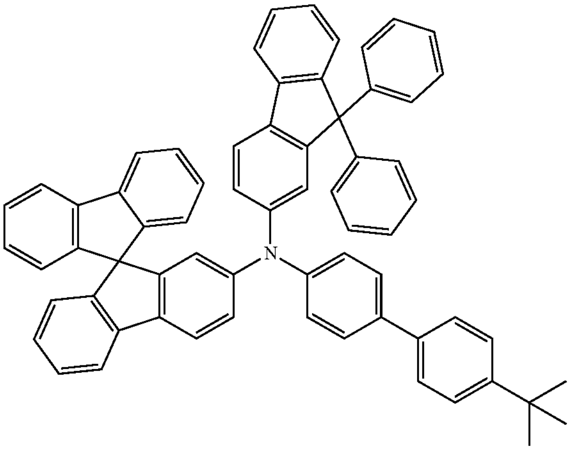
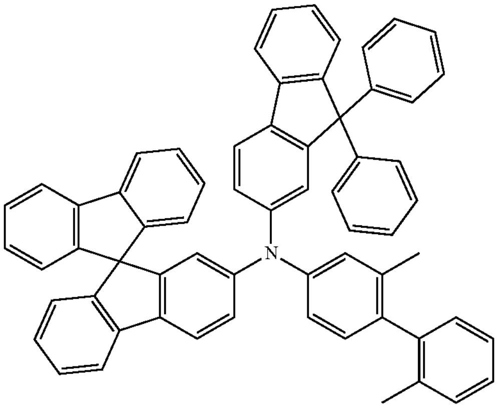
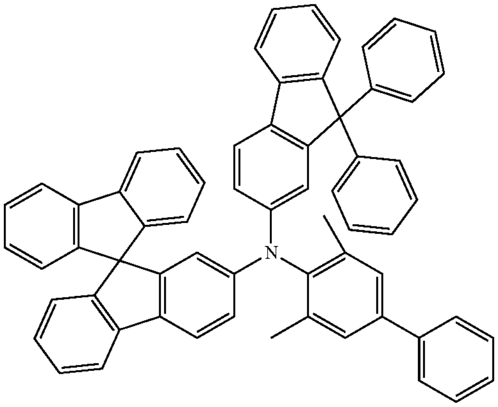
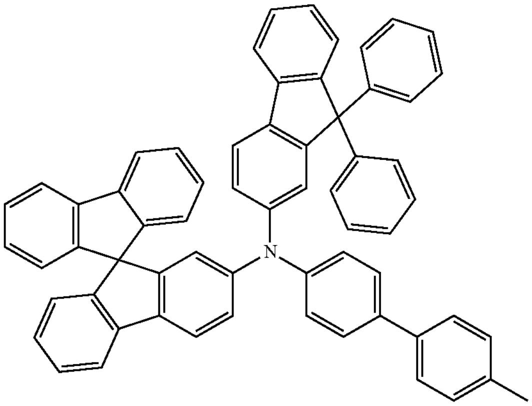
-continued
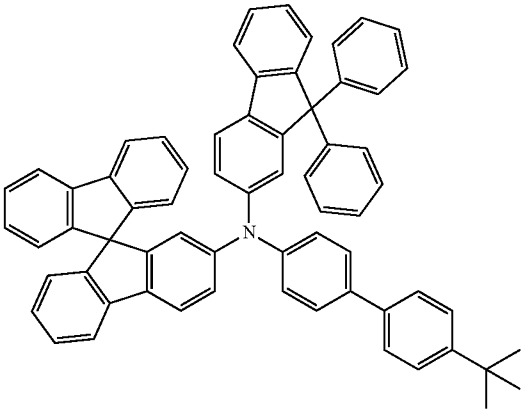
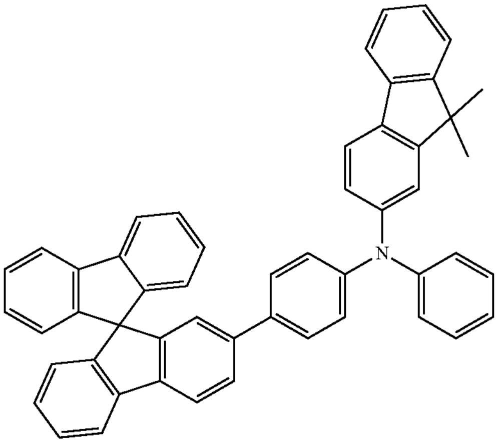
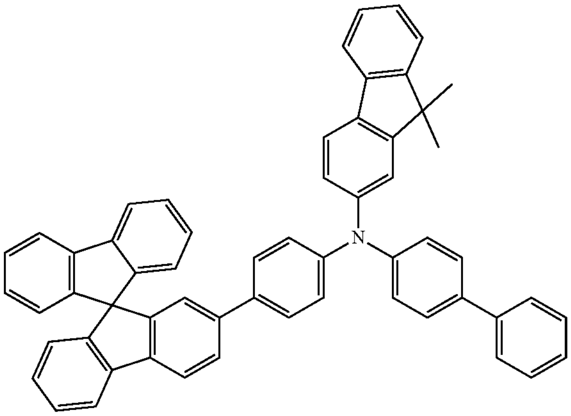
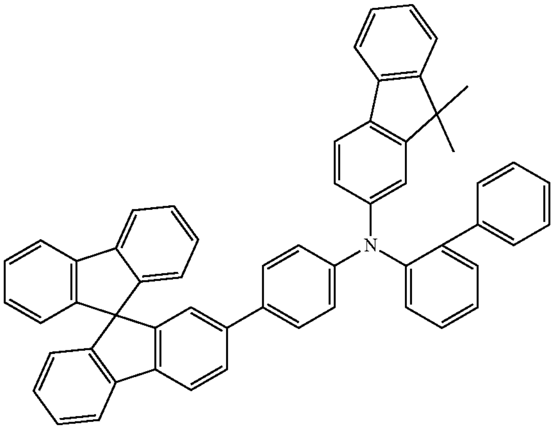

-continued
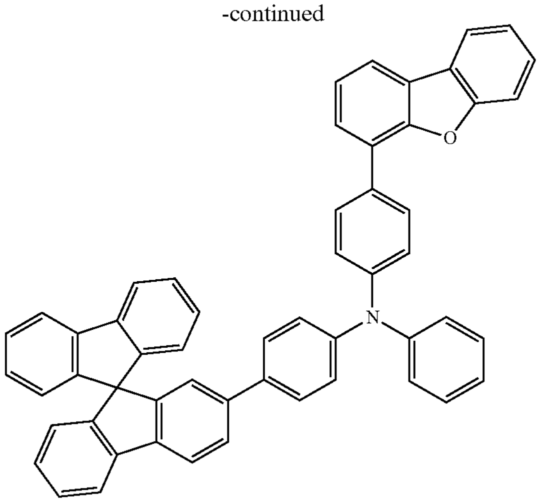
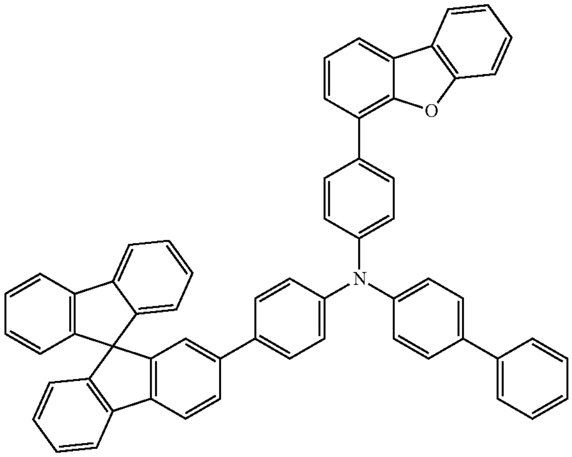
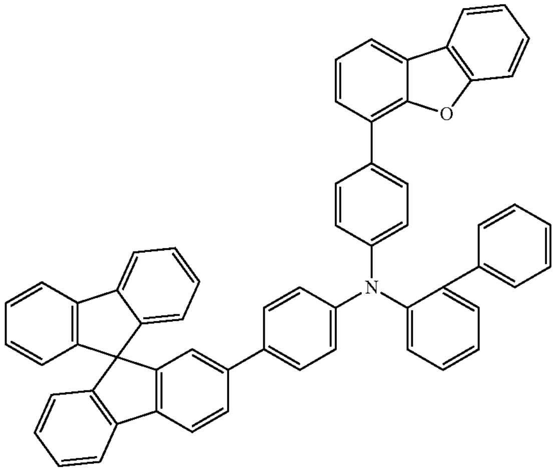
-continued
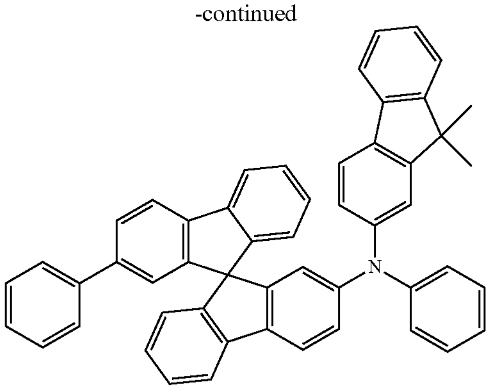
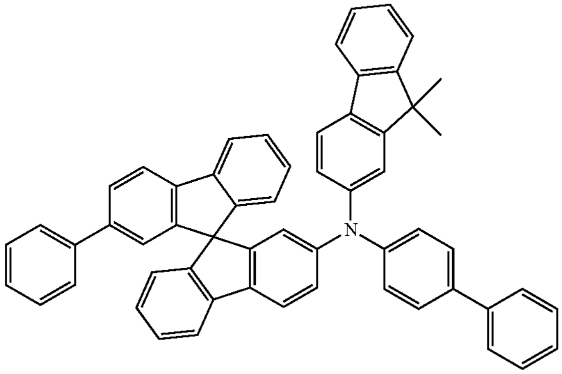
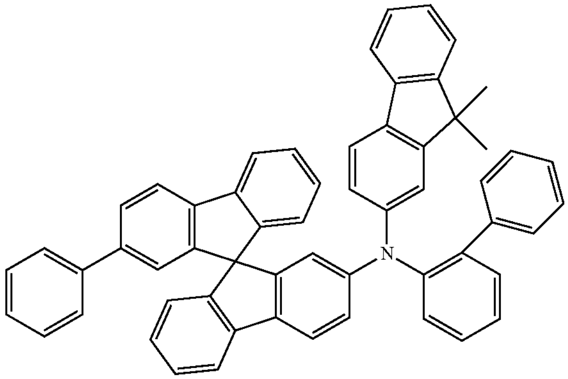
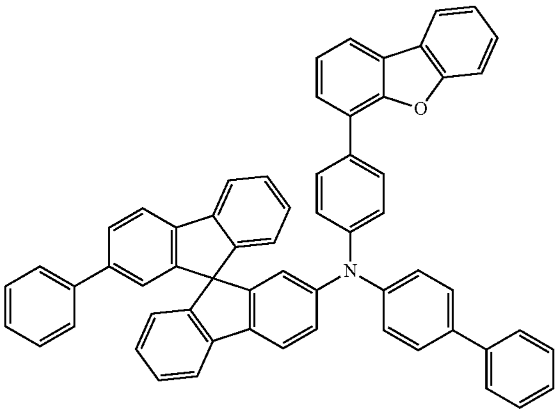

-continued
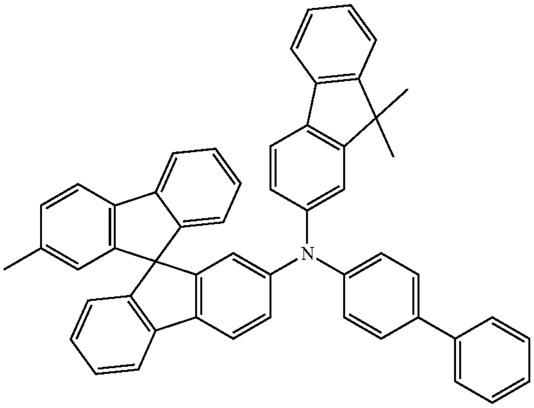
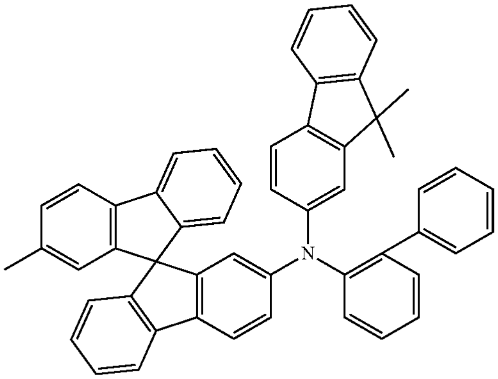
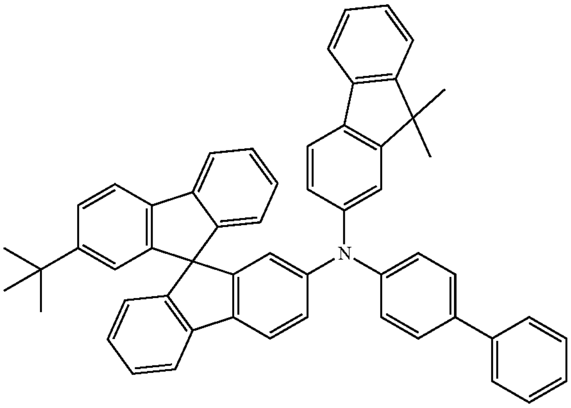
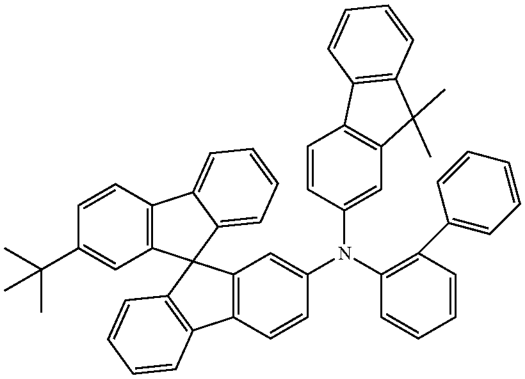
-continued
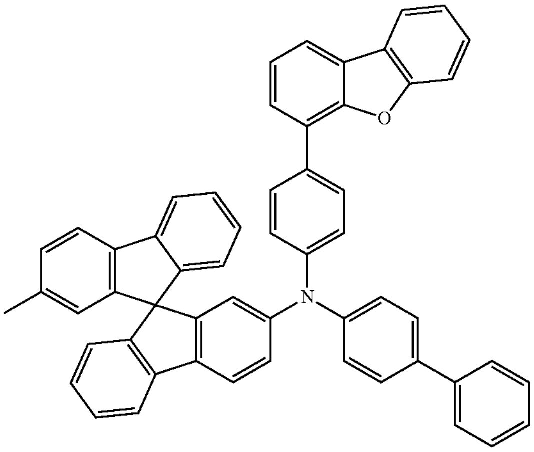
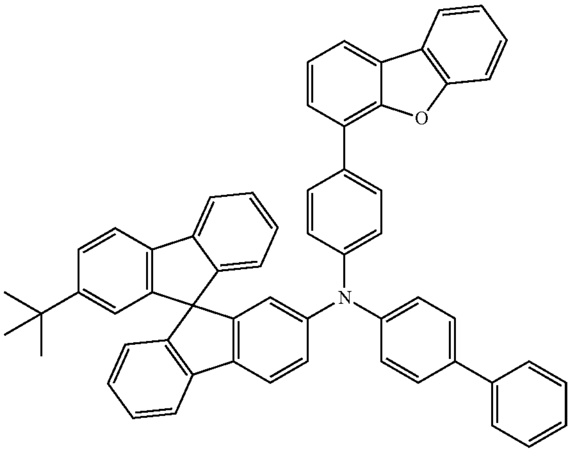
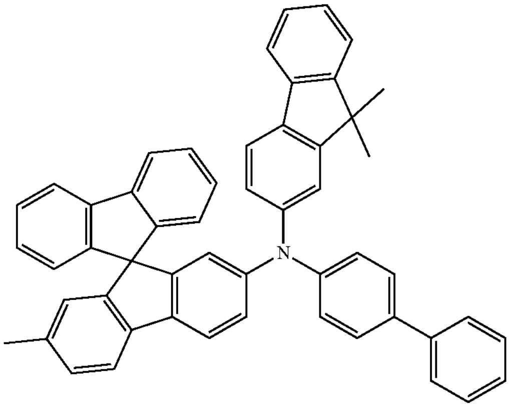
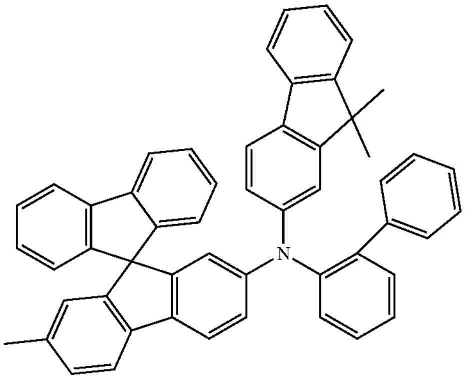

-continued
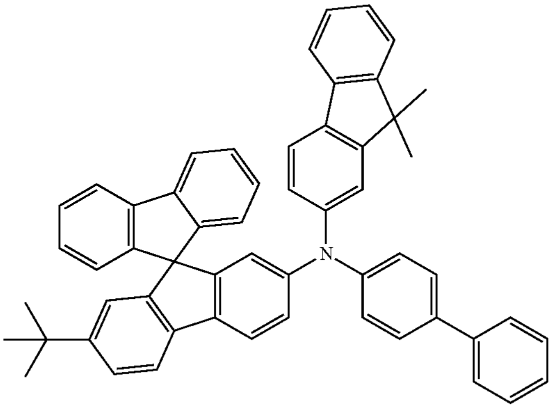
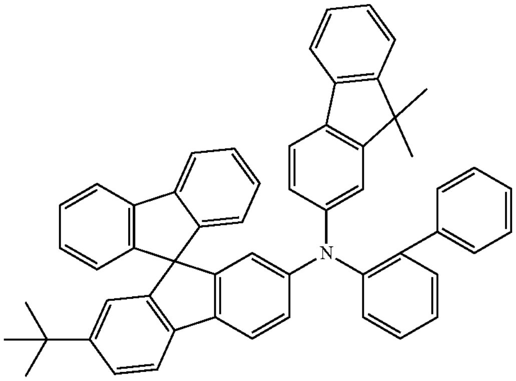
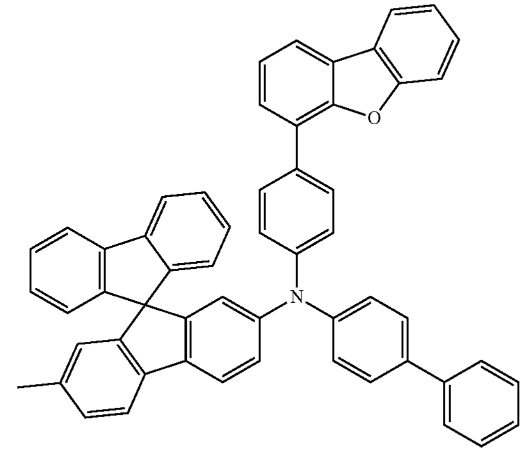
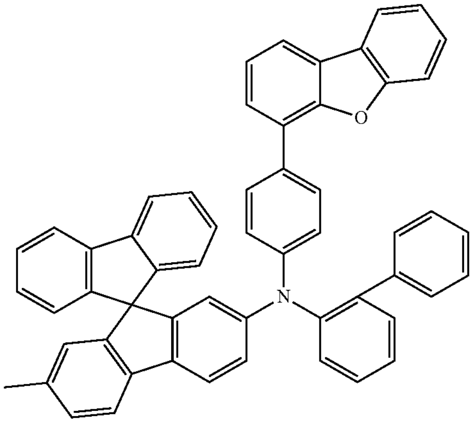
-continued
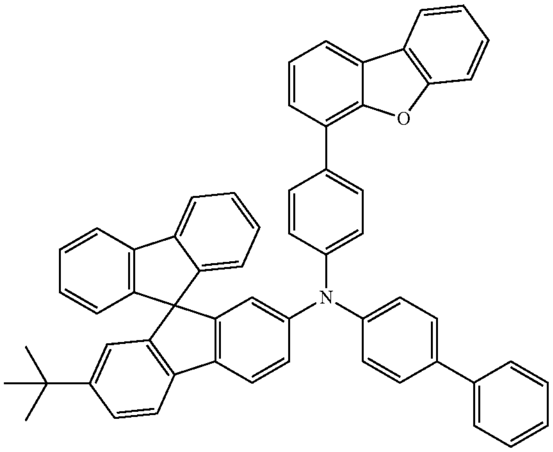
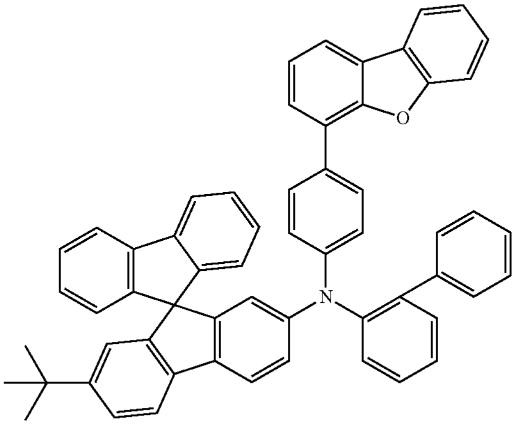
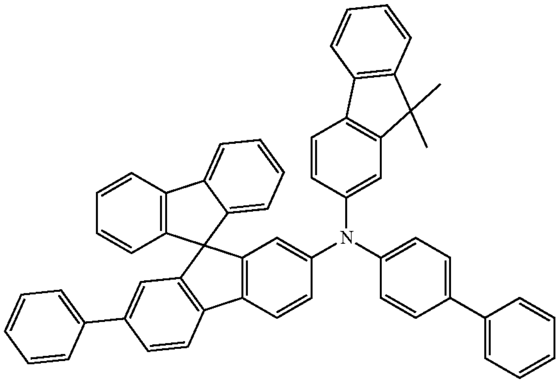
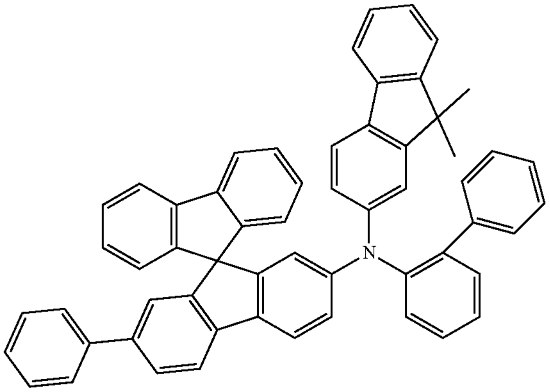

-continued
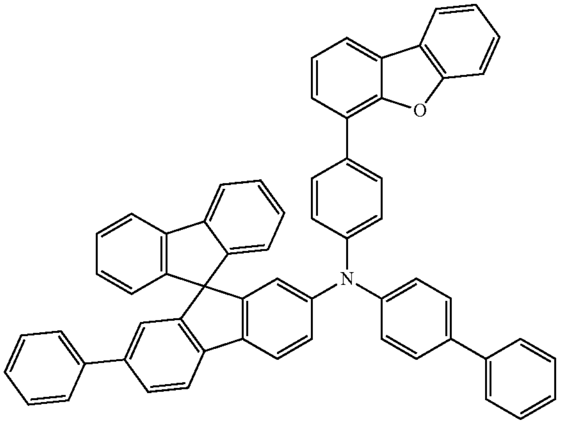
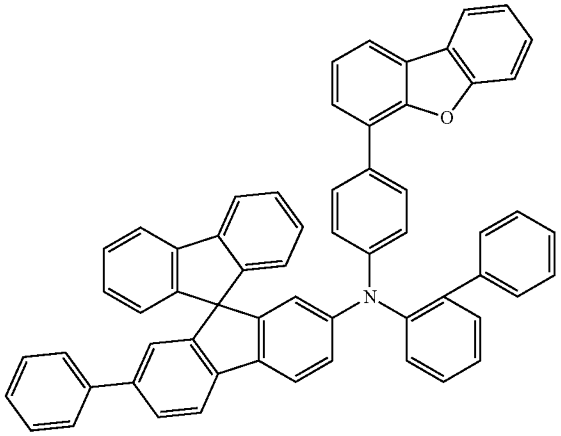
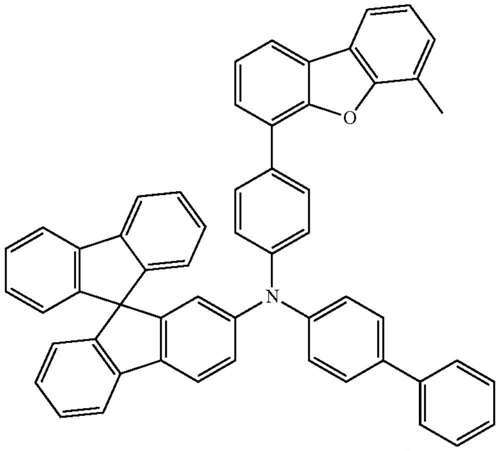
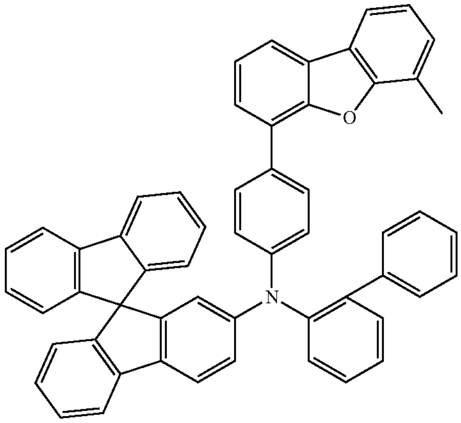
-continued
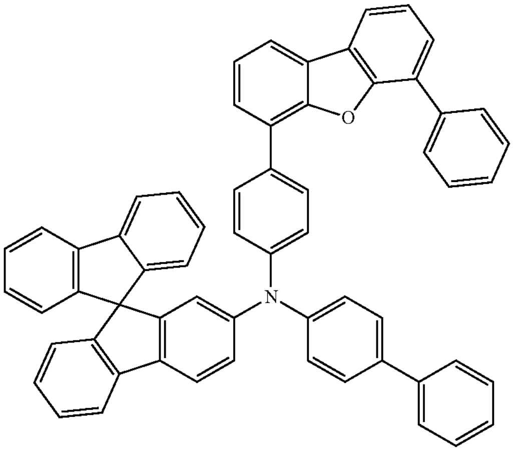
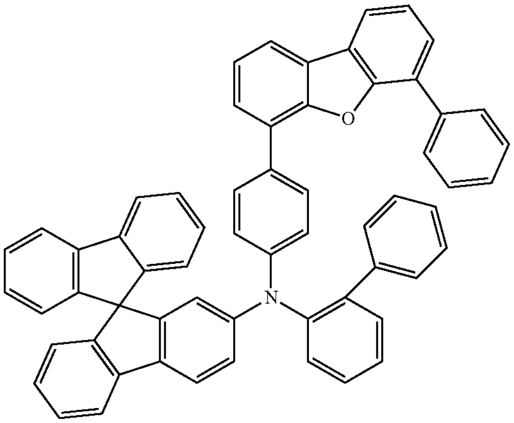
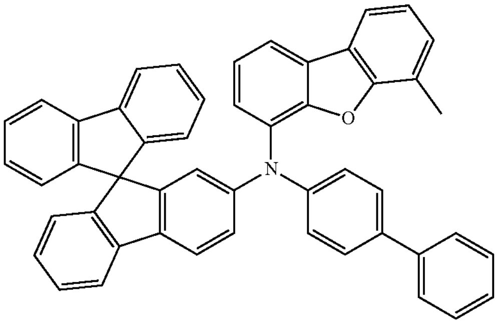
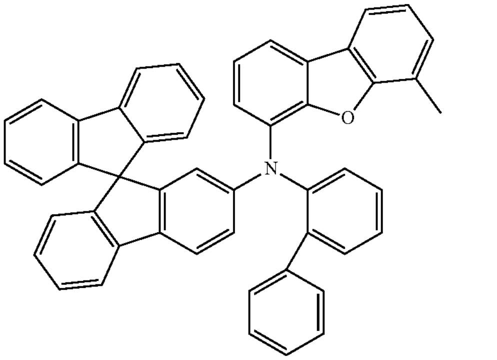

-continued
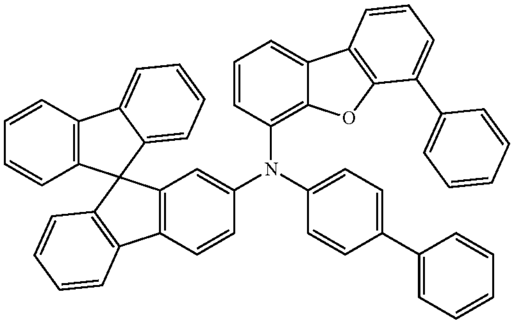
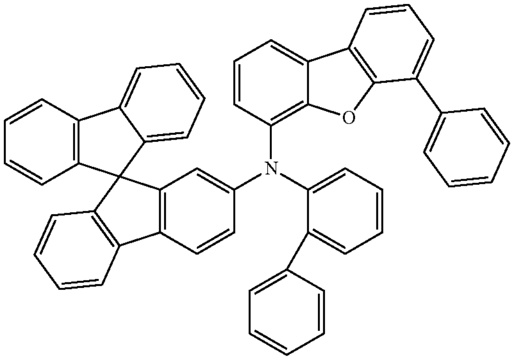
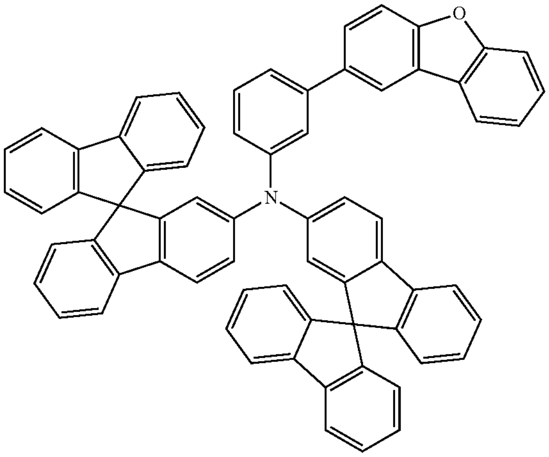
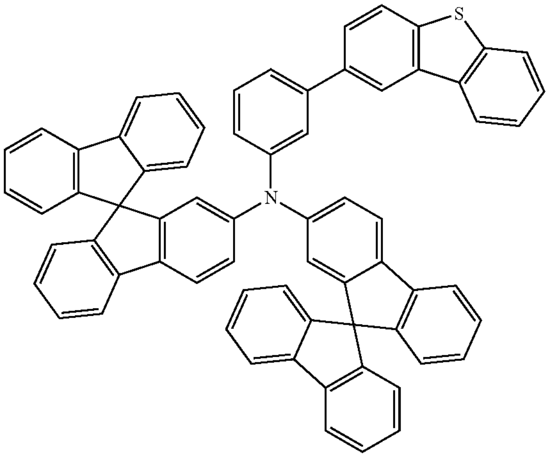
-continued
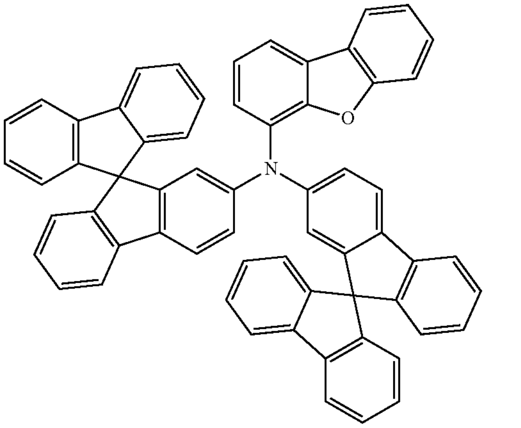
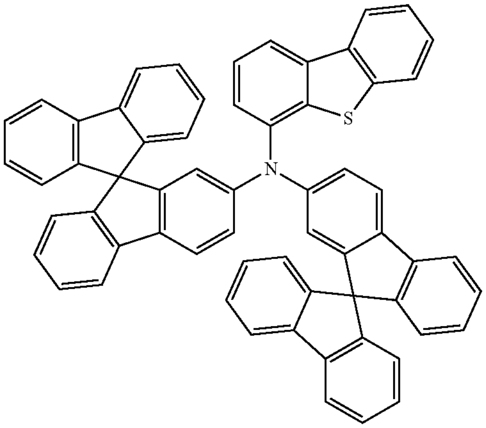
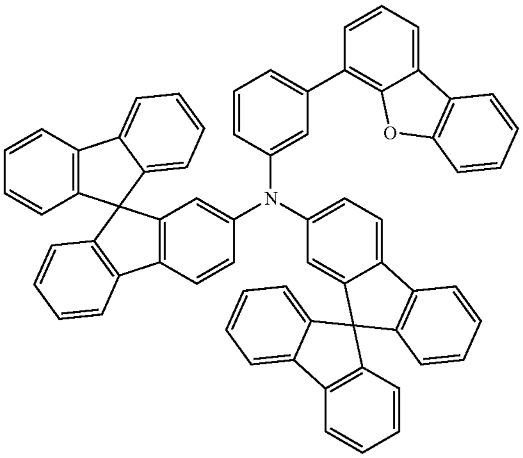

-continued
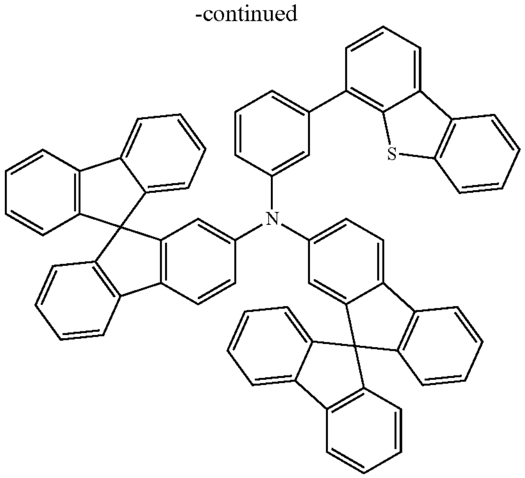
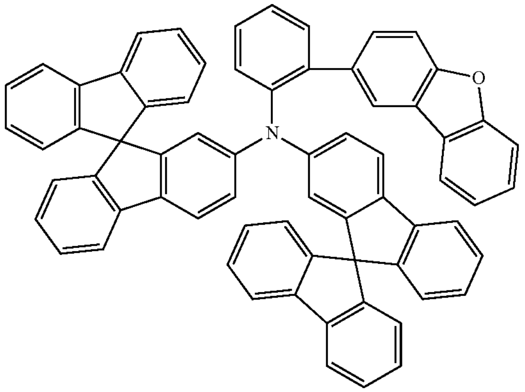
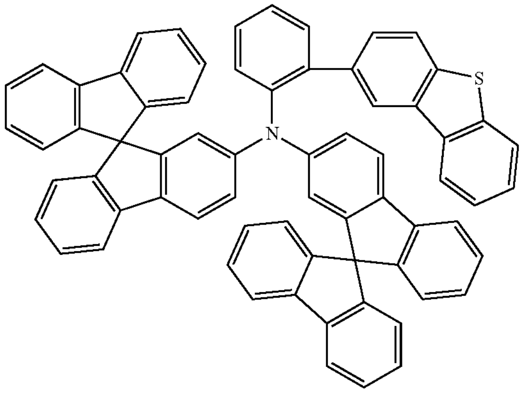
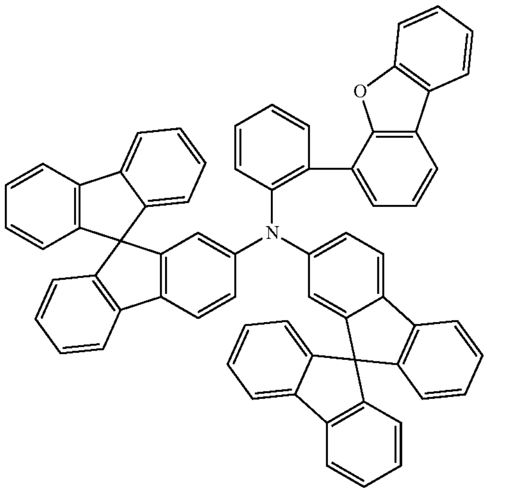
-continued
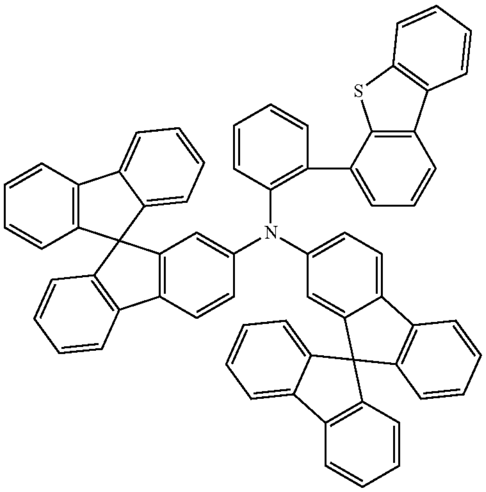
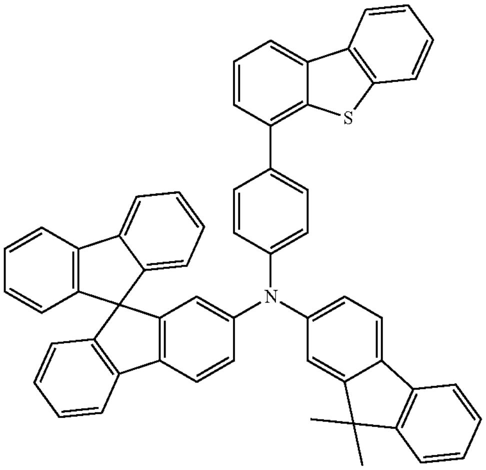
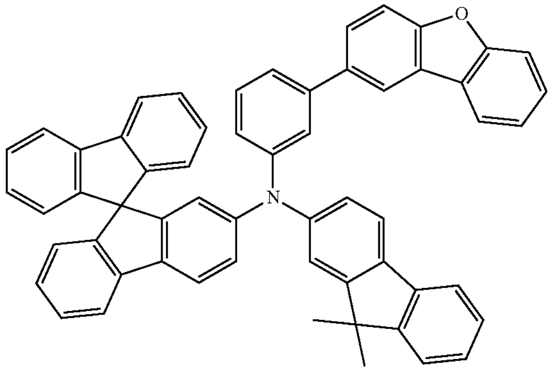
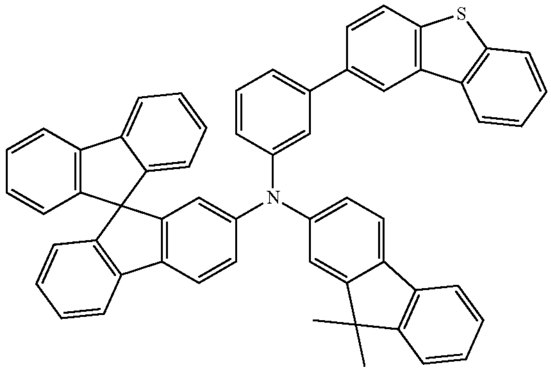

-continued
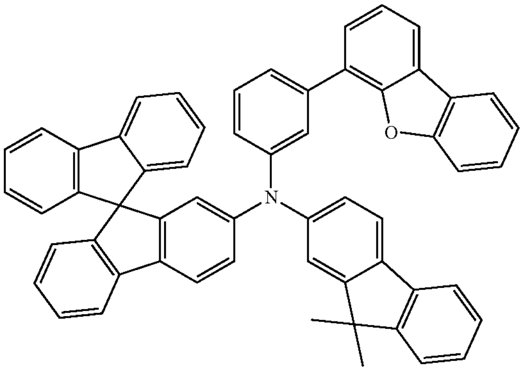
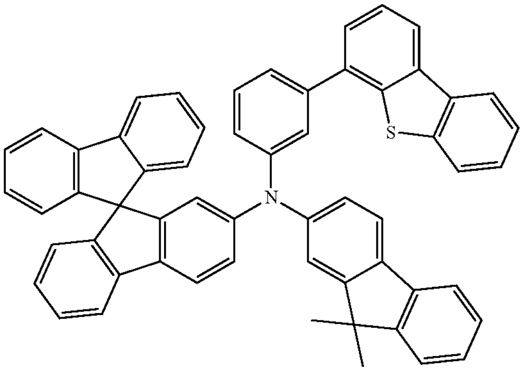
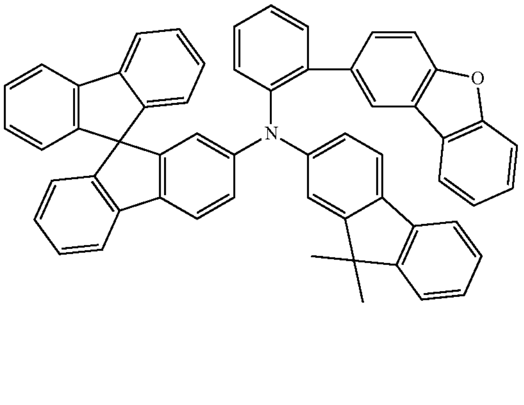
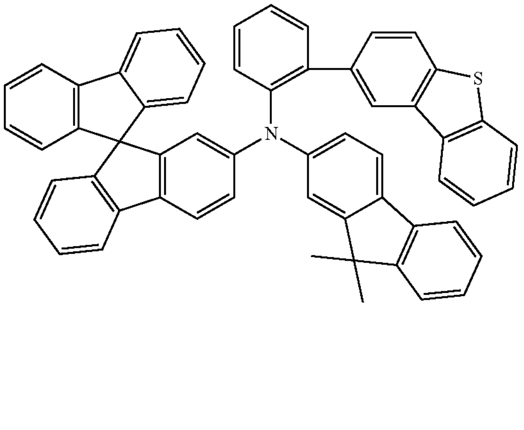
-continued
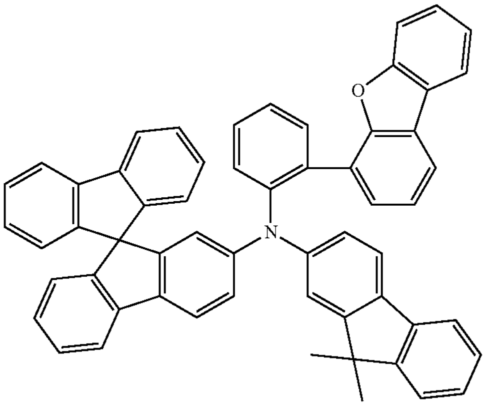
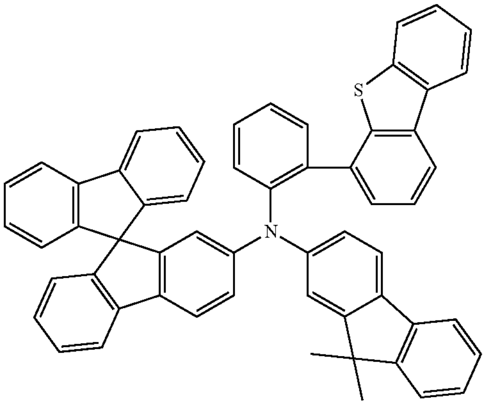
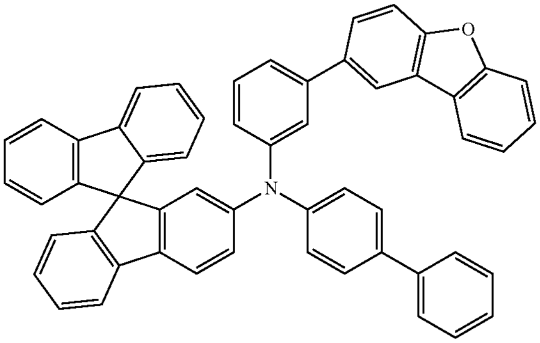
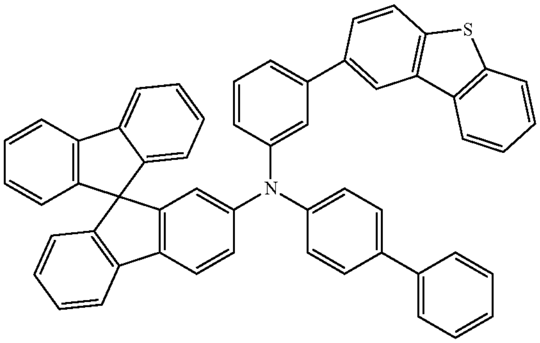

-continued
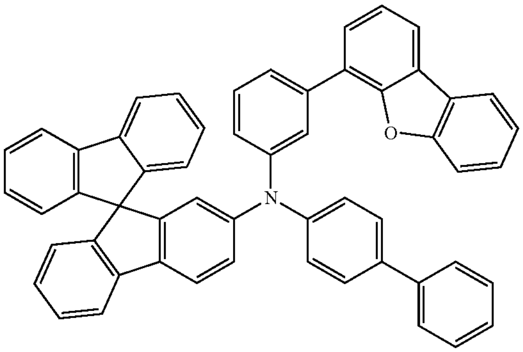
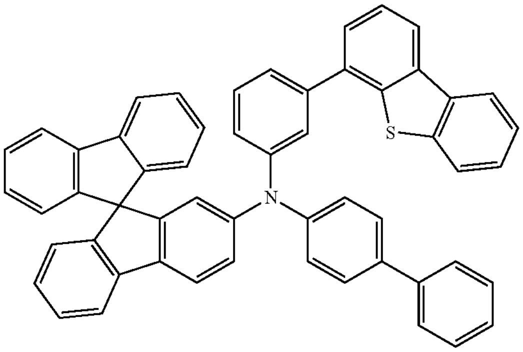
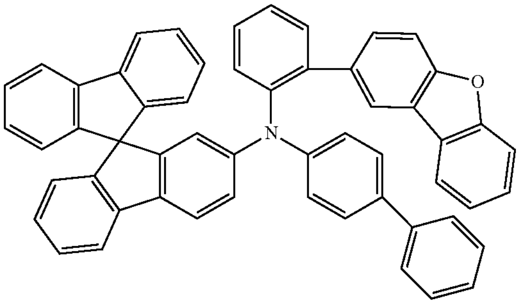
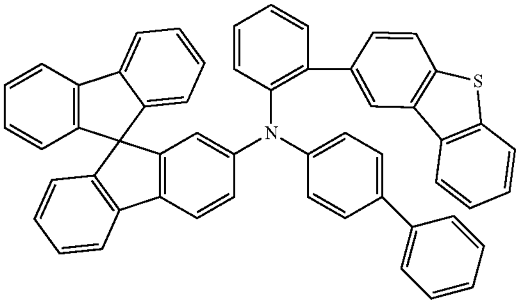
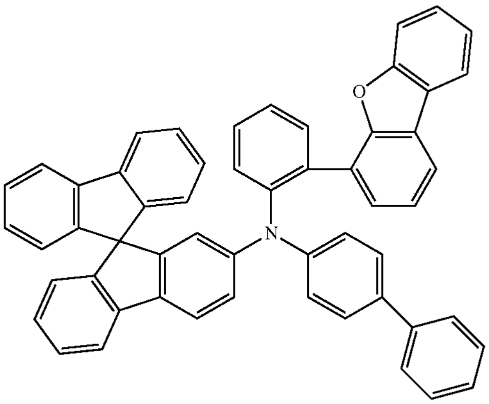
-continued
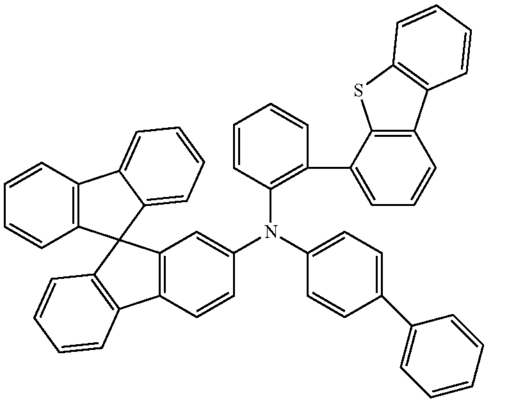
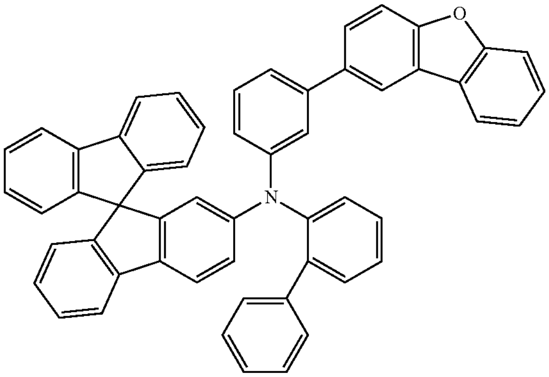
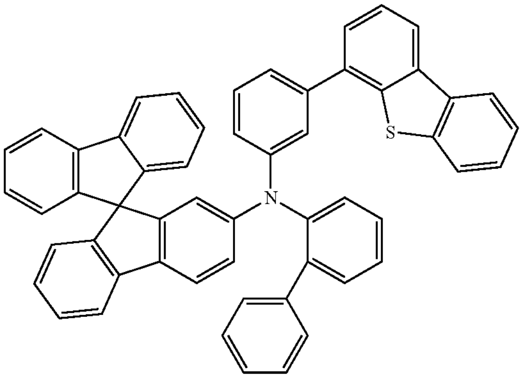
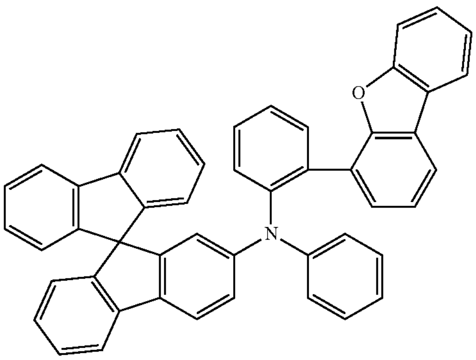

-continued
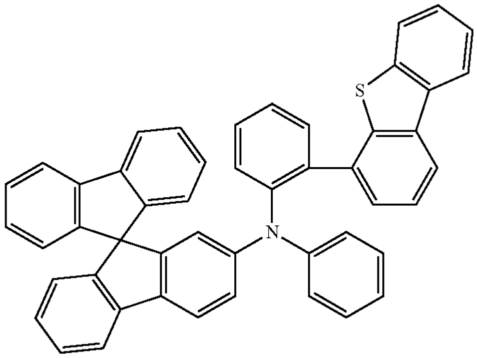
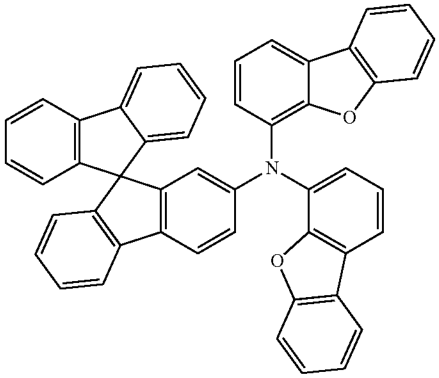
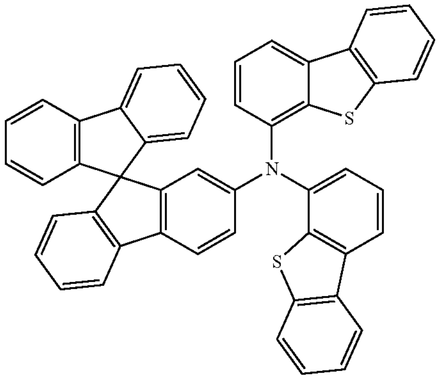
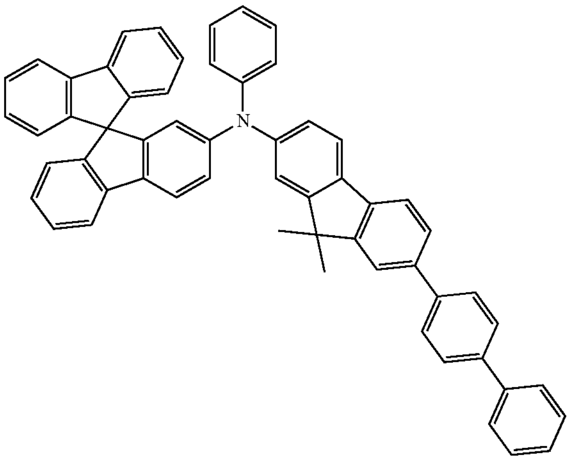
-continued
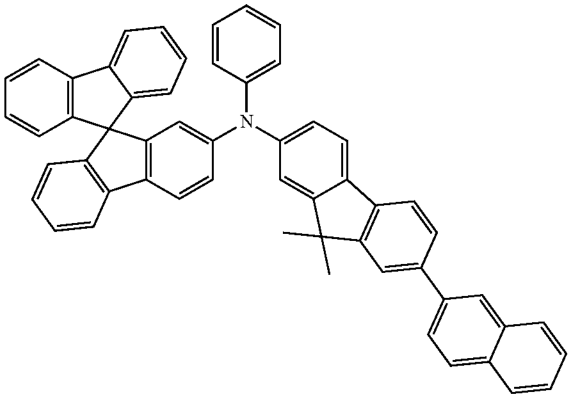
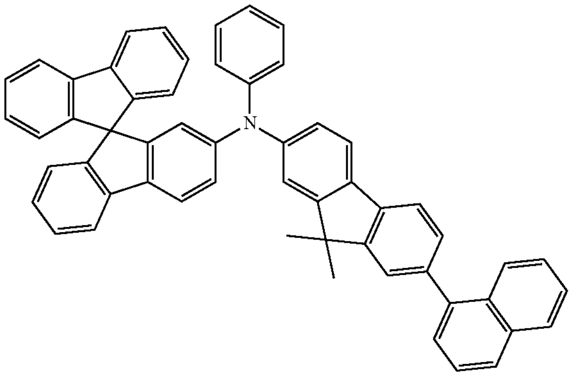
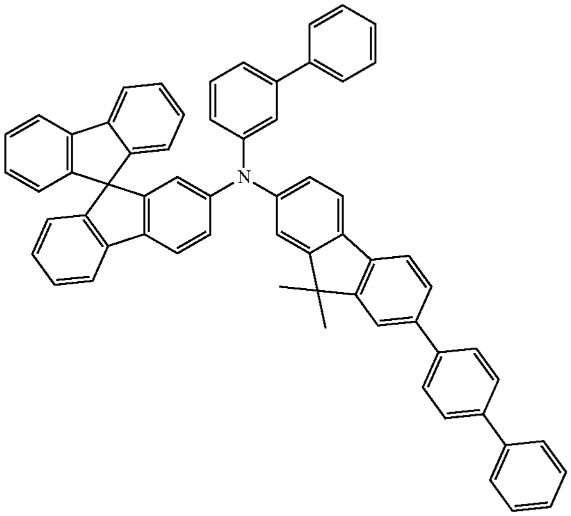
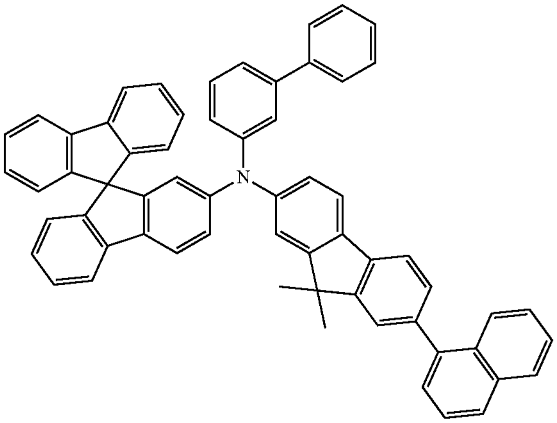

-continued
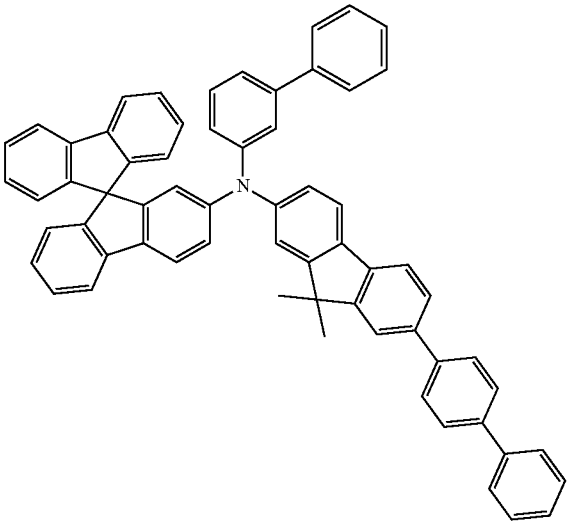
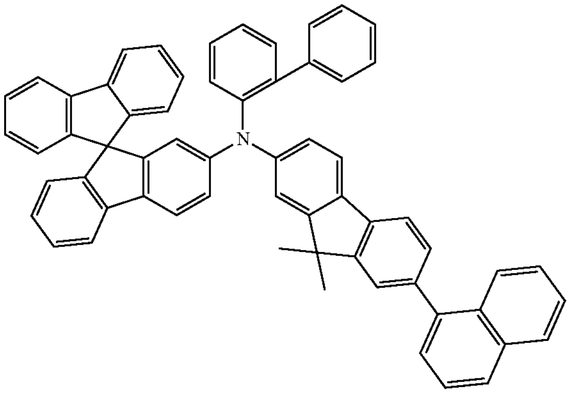
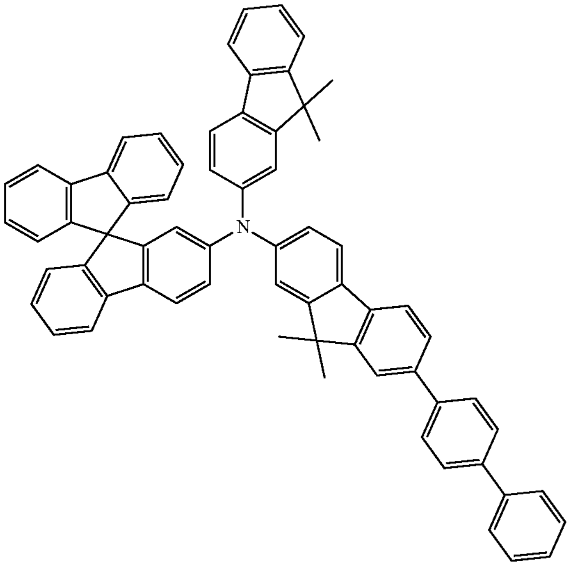
-continued
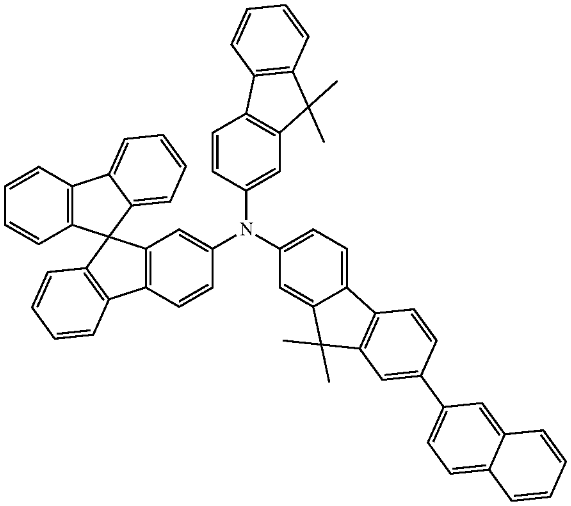
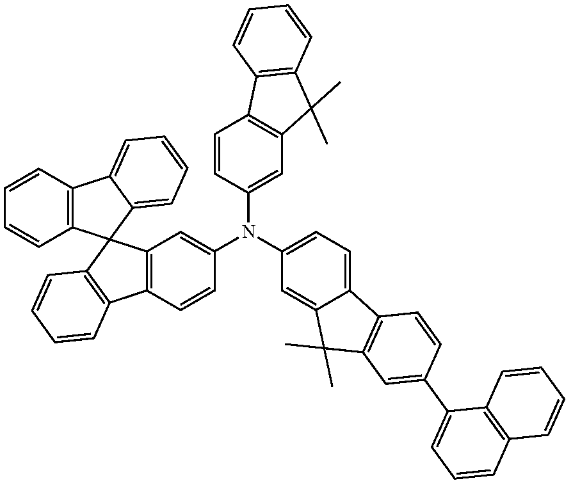
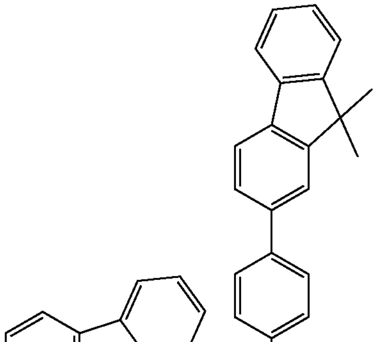

-continued
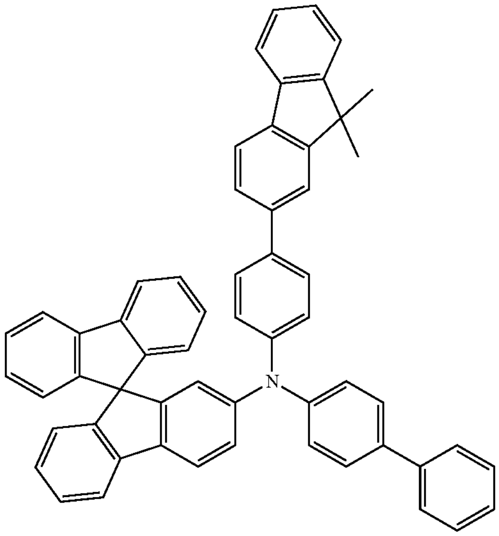
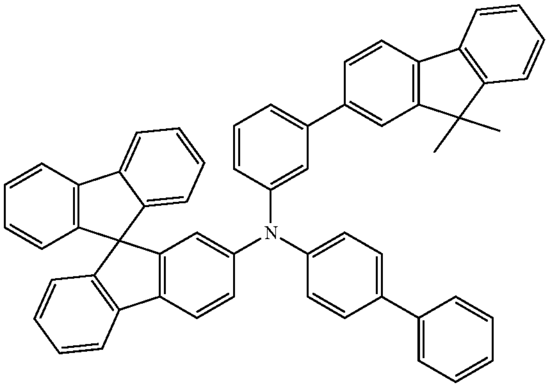
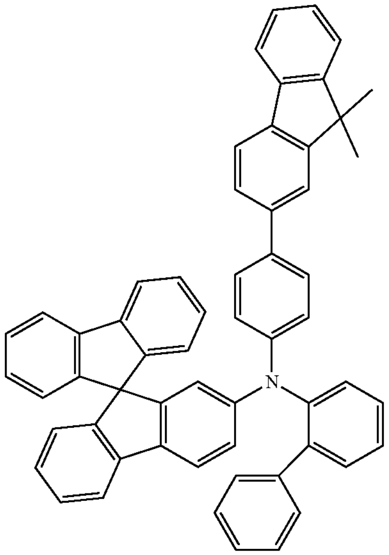
-continued
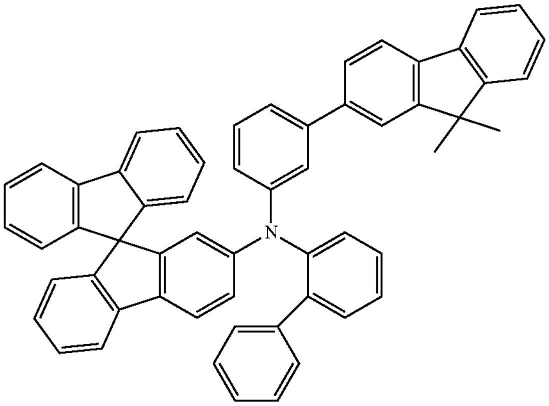
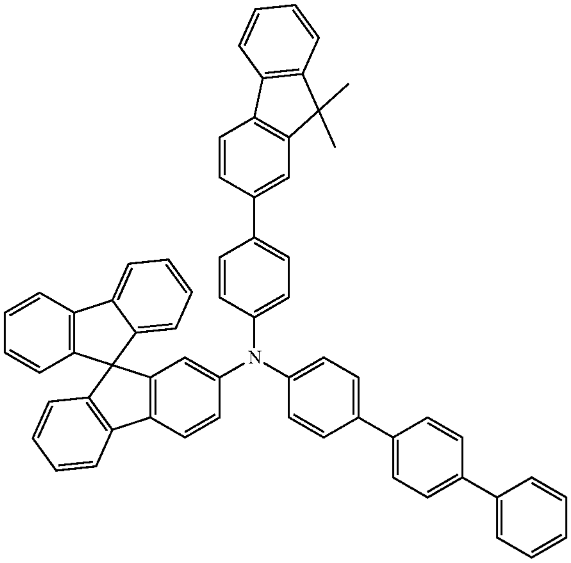
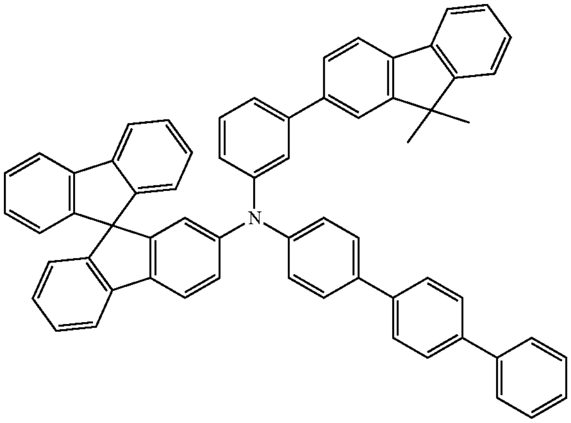

-continued
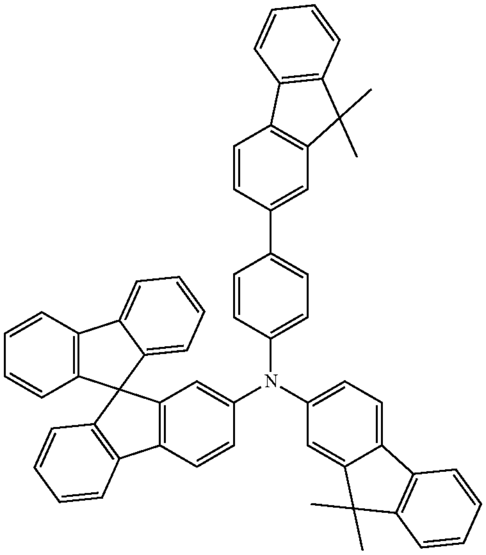
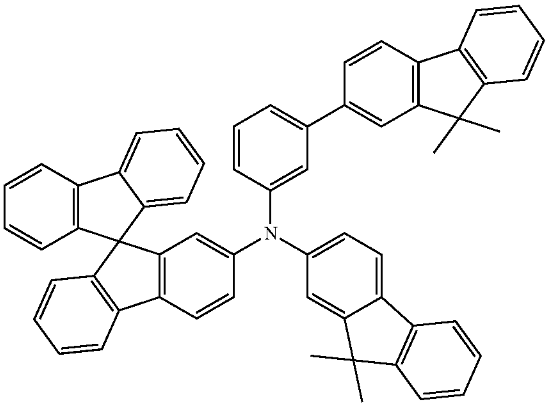
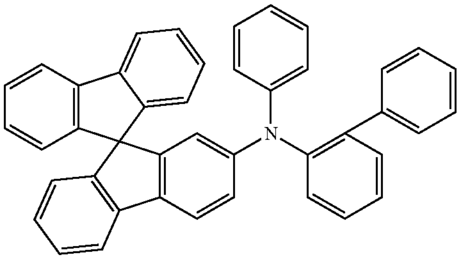
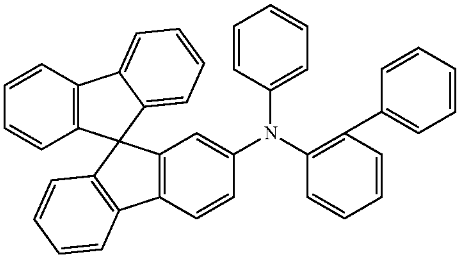
-continued
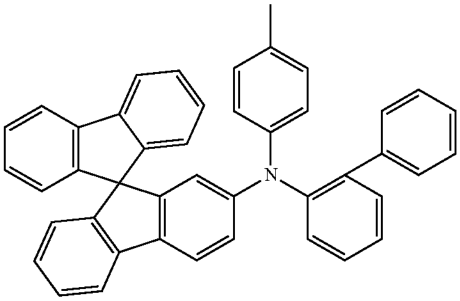
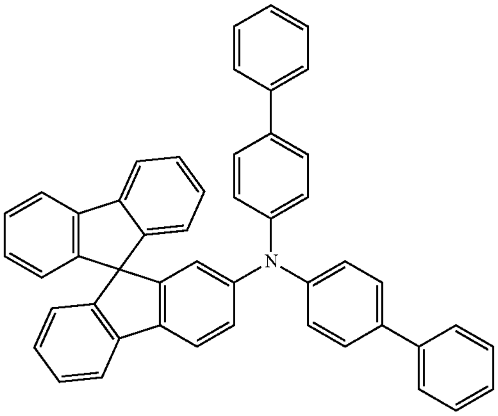
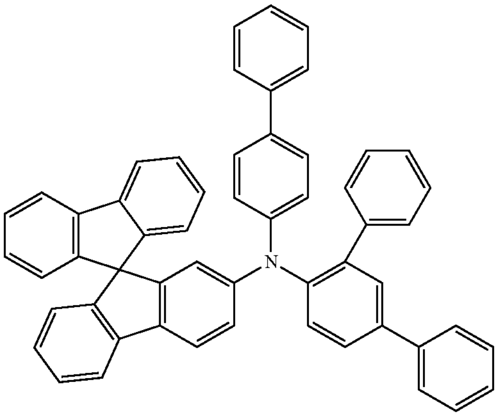
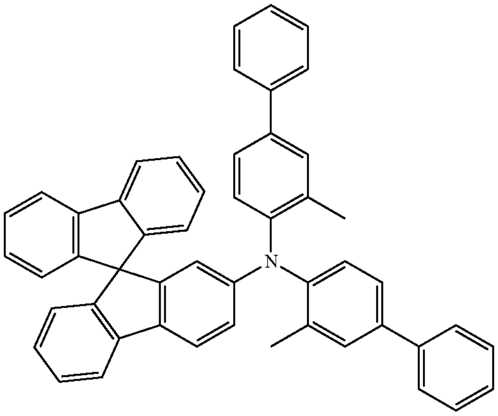

-continued
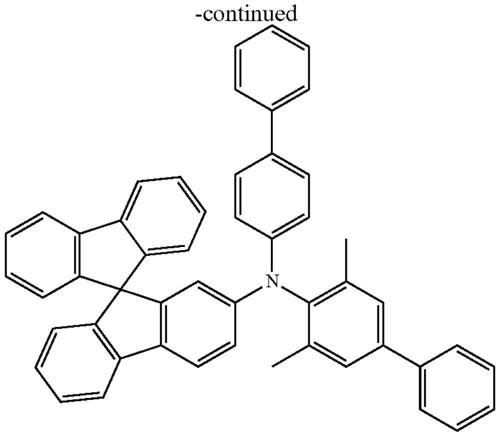
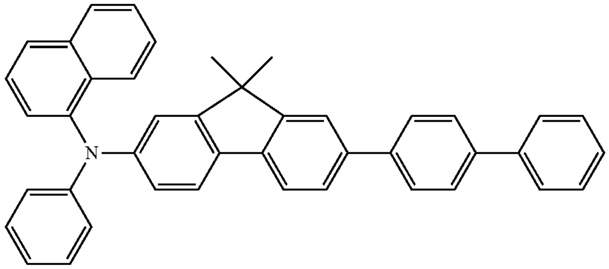
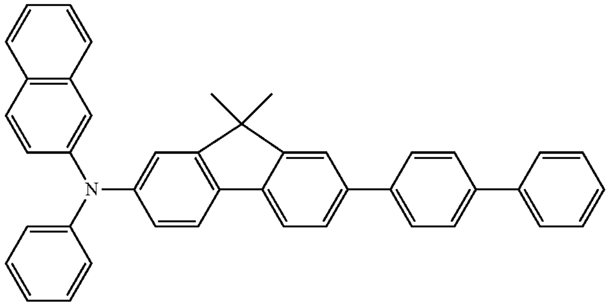
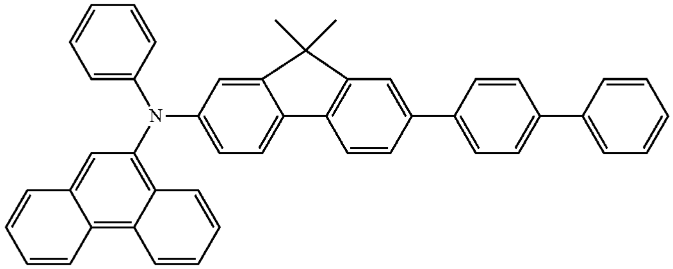
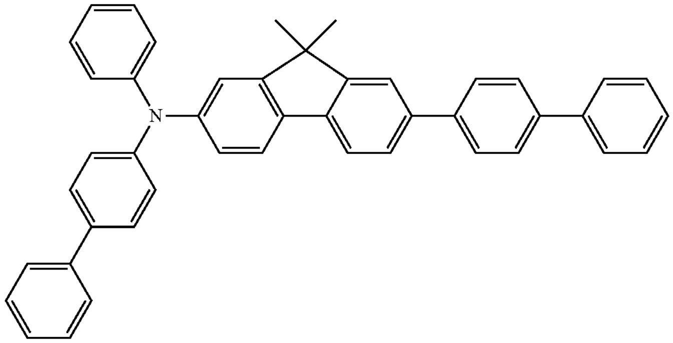

-continued
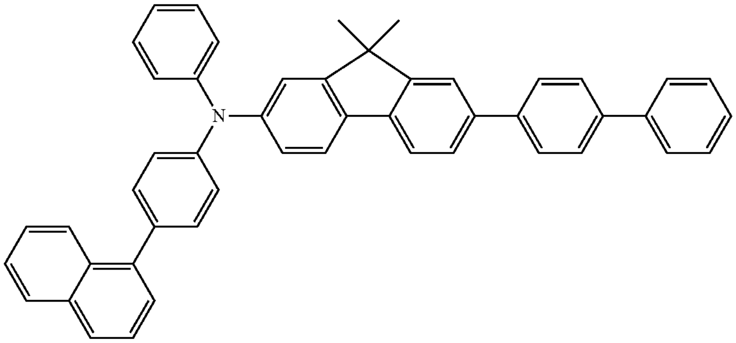
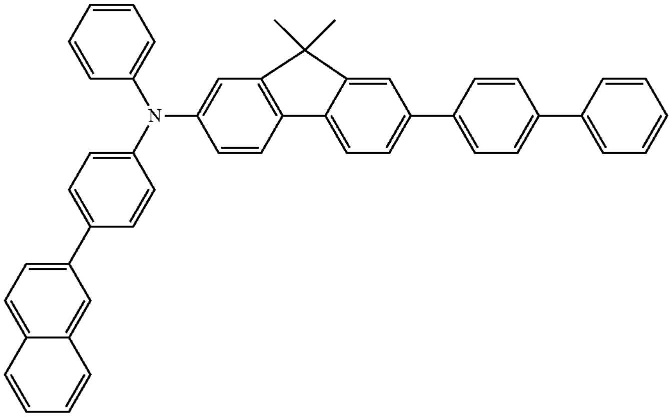
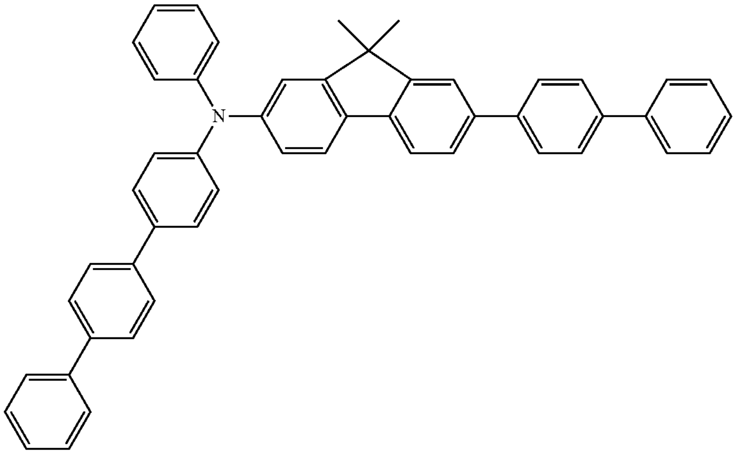
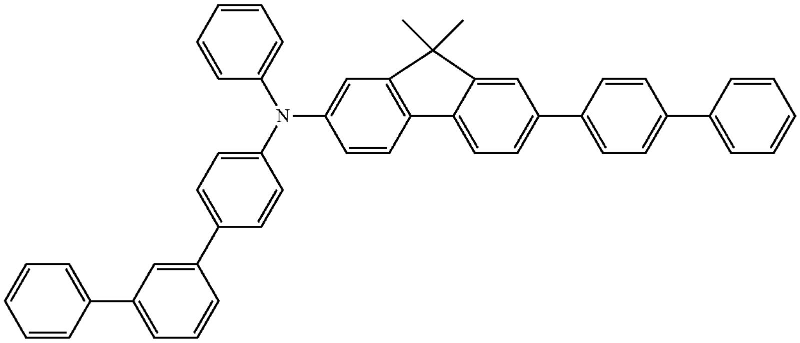

-continued
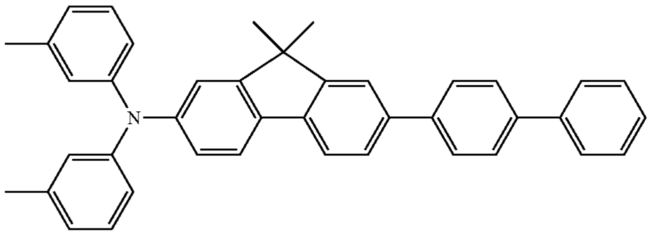
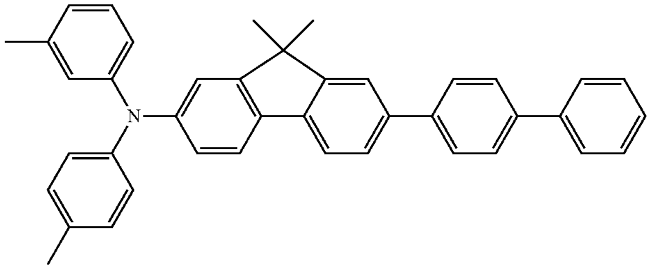
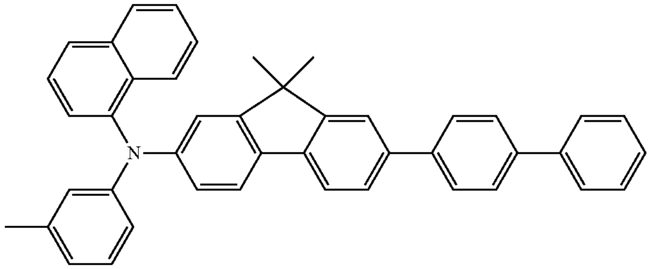
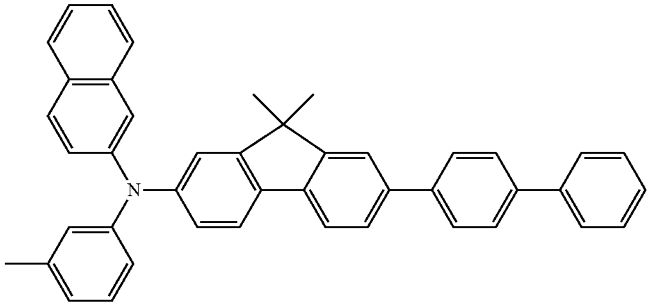
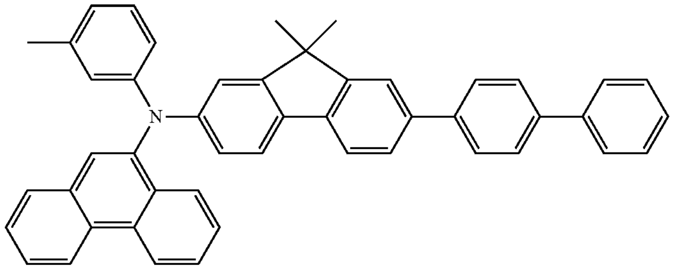
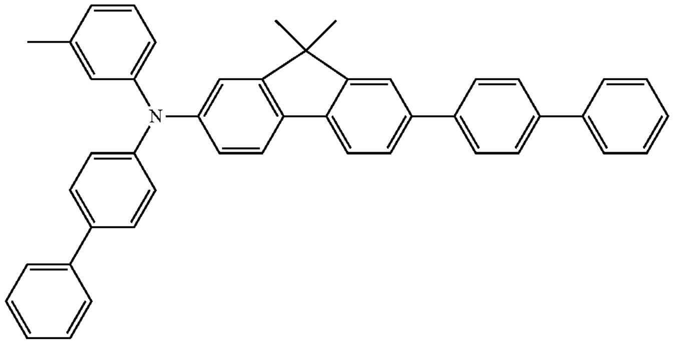

-continued
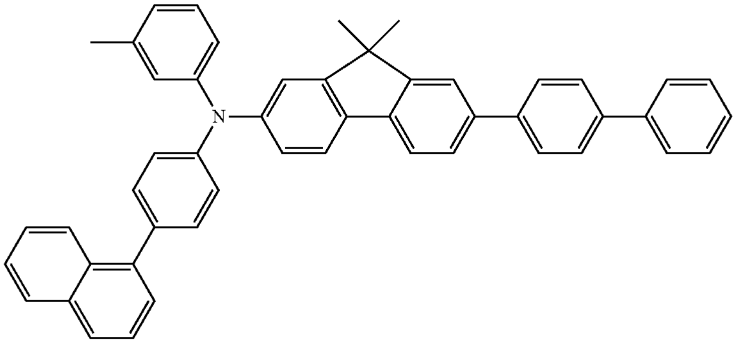
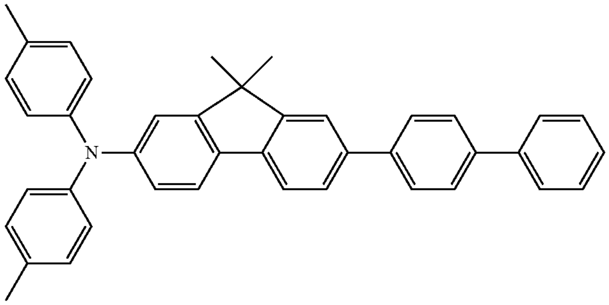
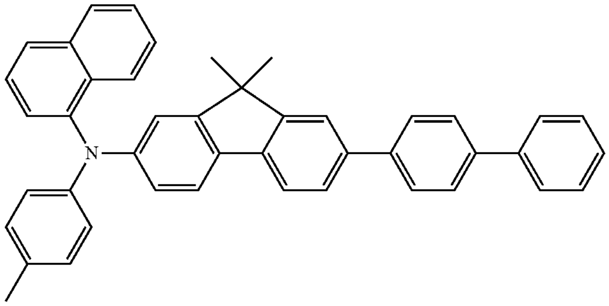
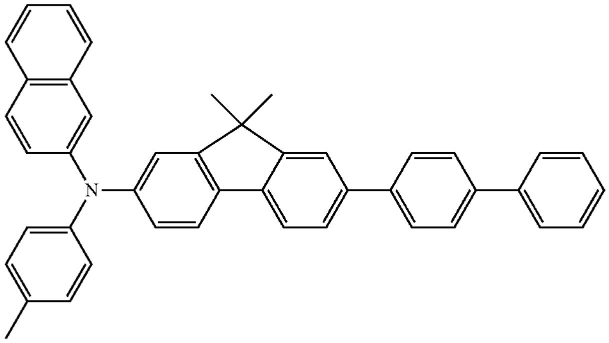
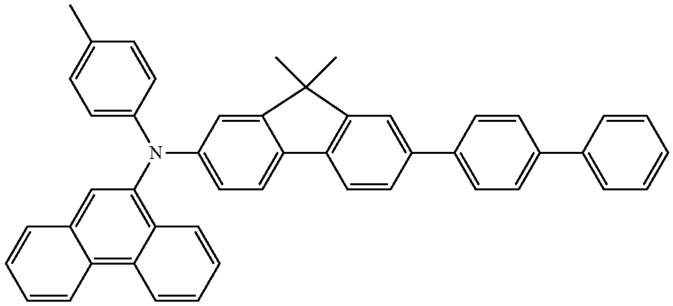

-continued
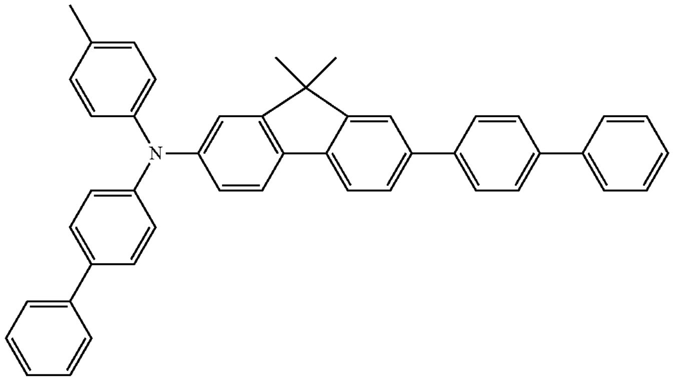
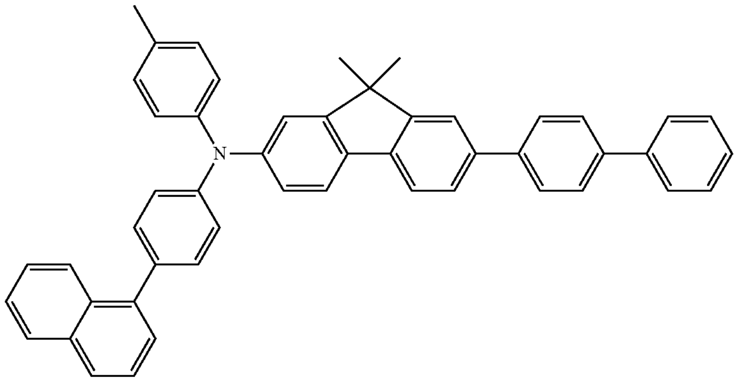
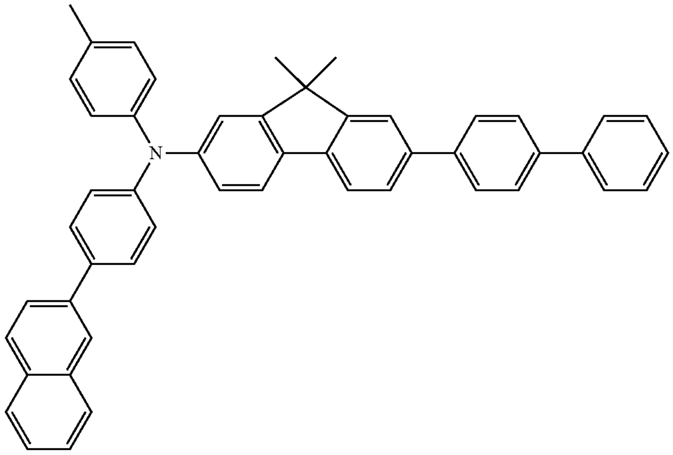
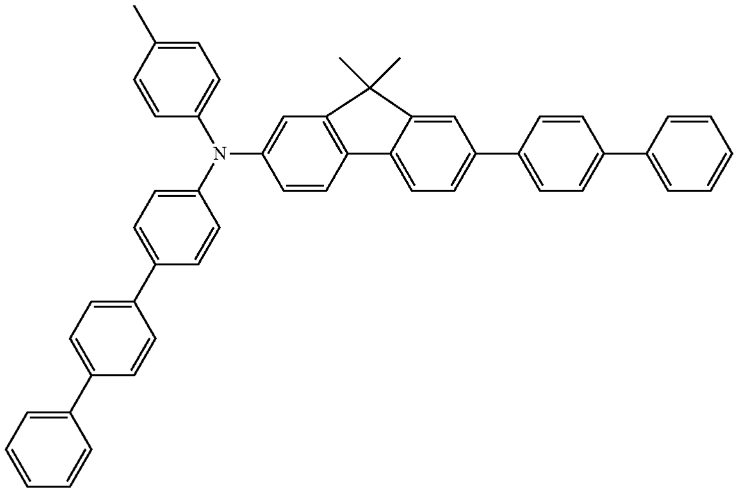

-continued
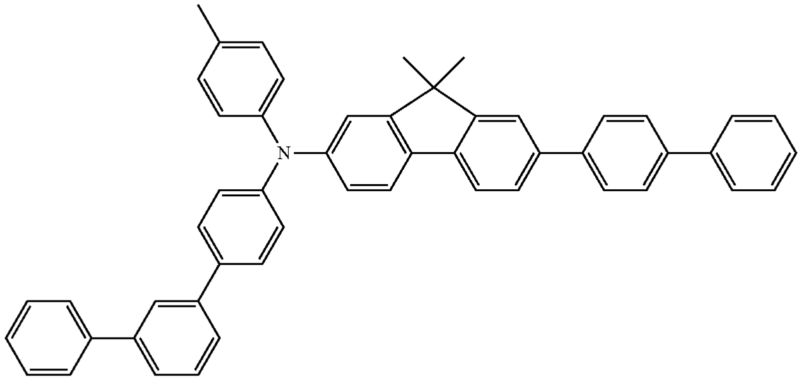
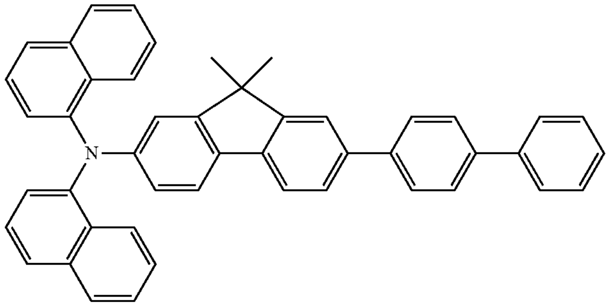
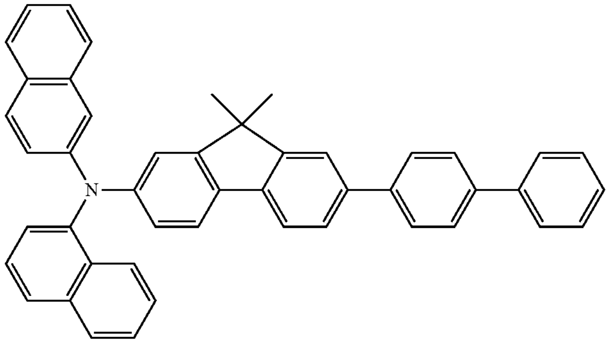
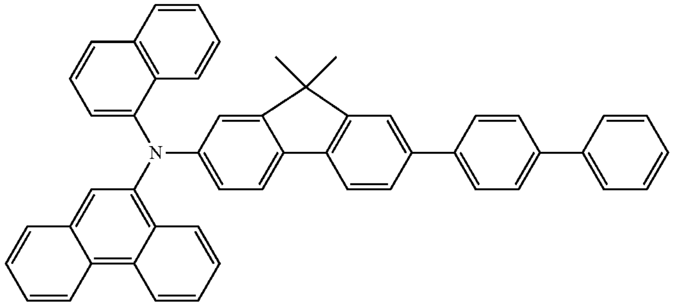
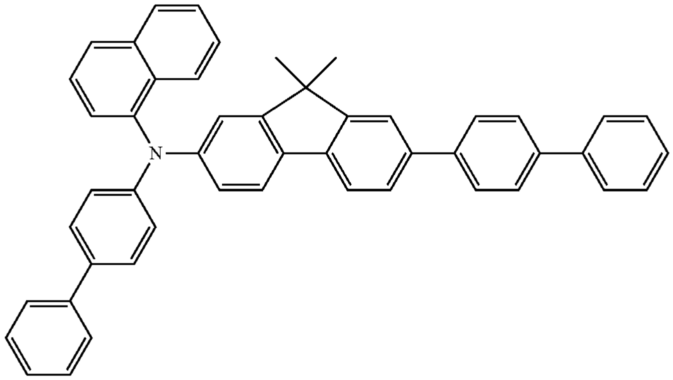

-continued
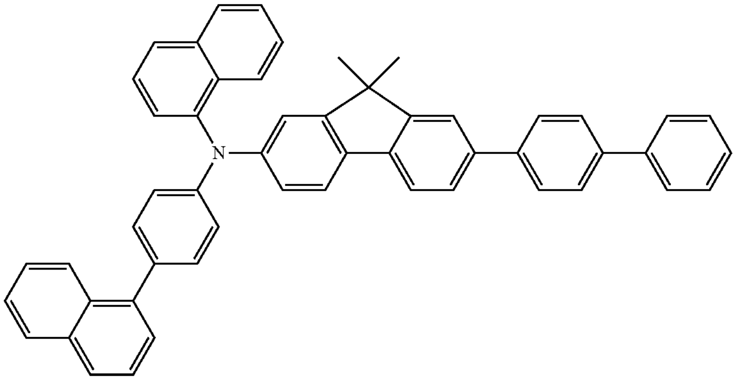
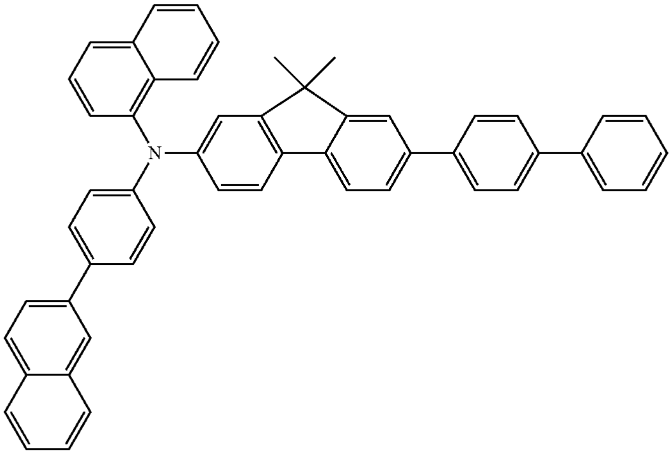
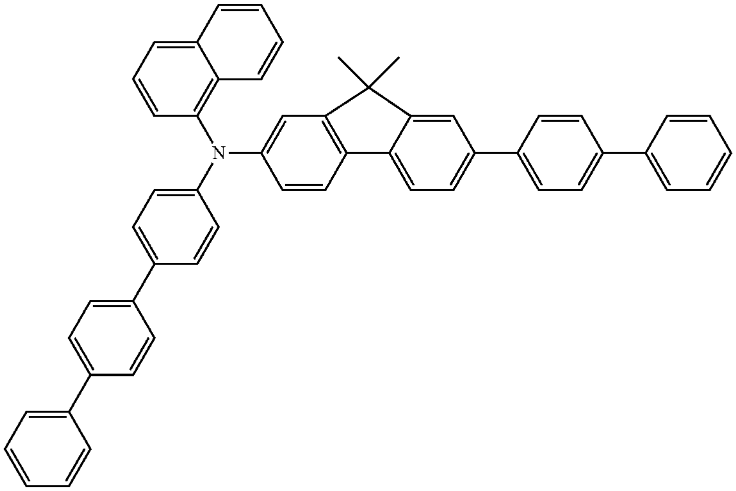
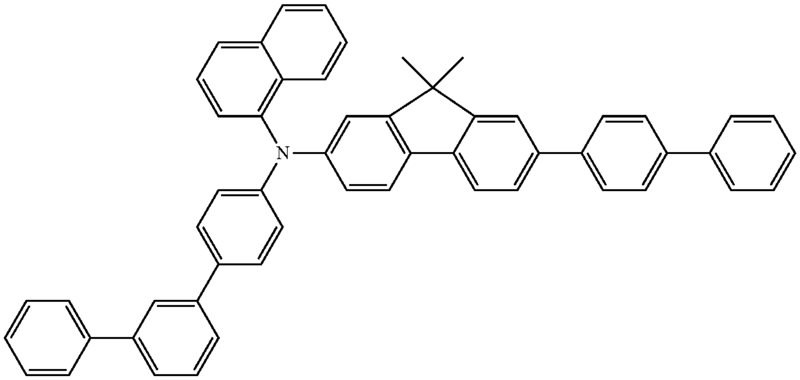

-continued
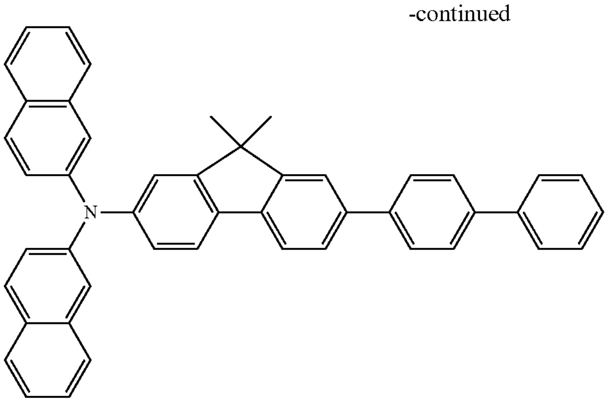
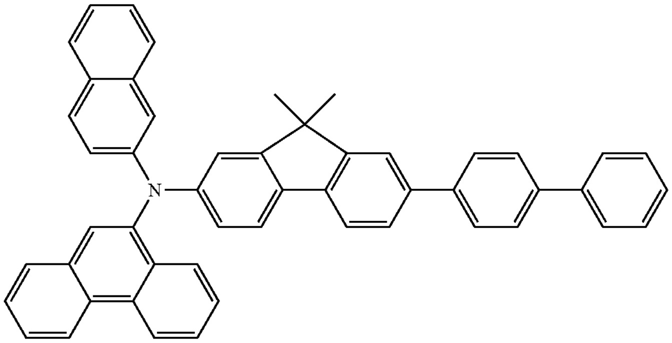
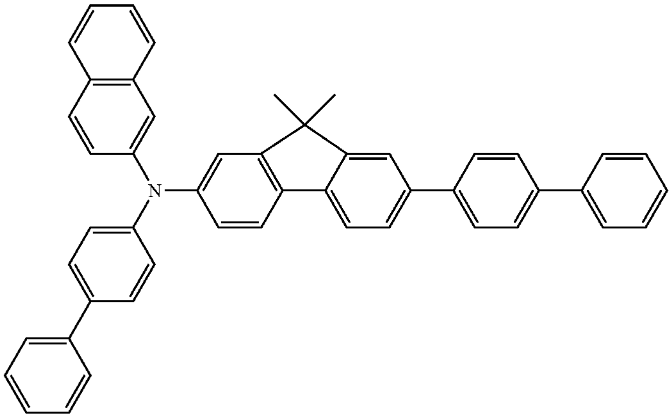
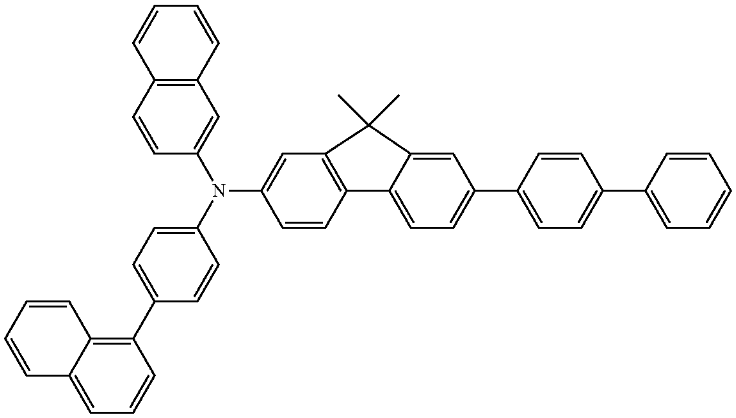

-continued
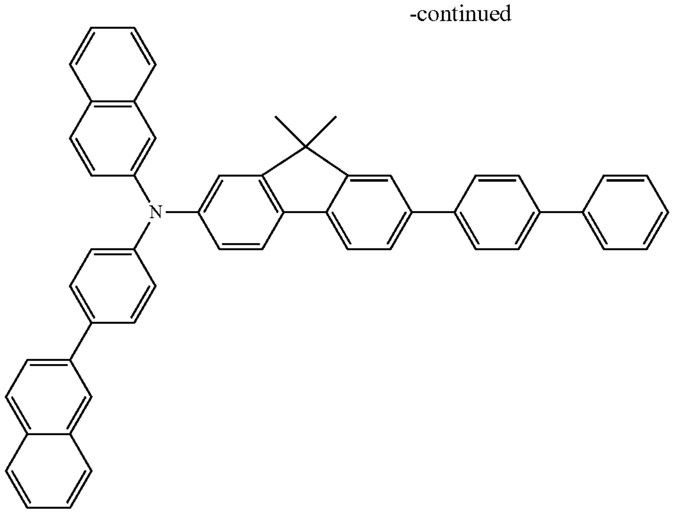
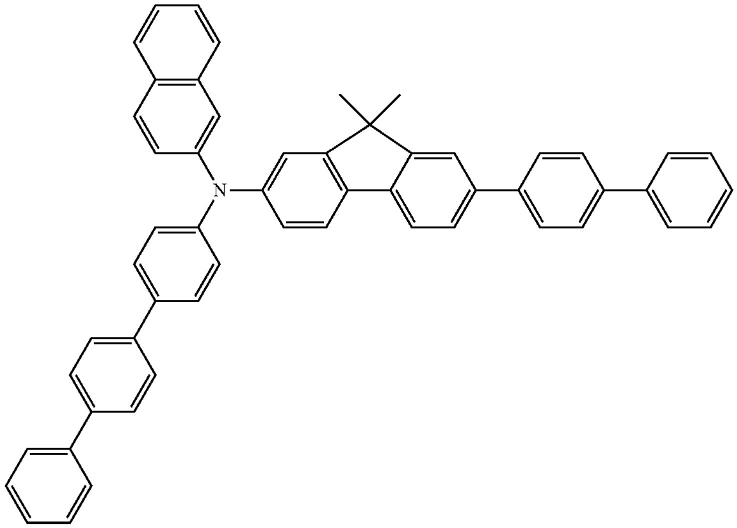
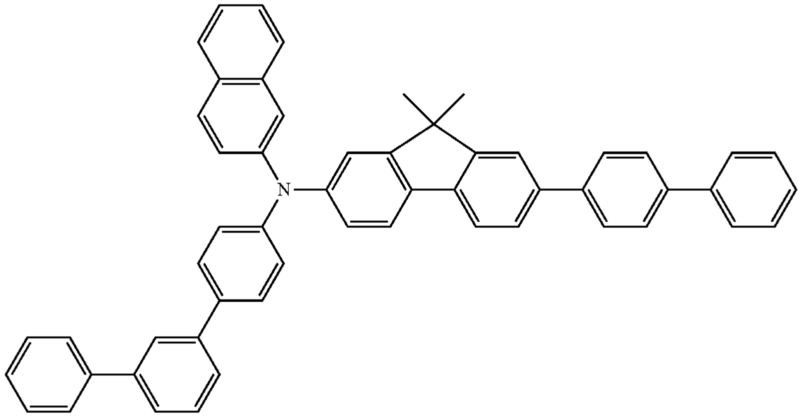

-continued
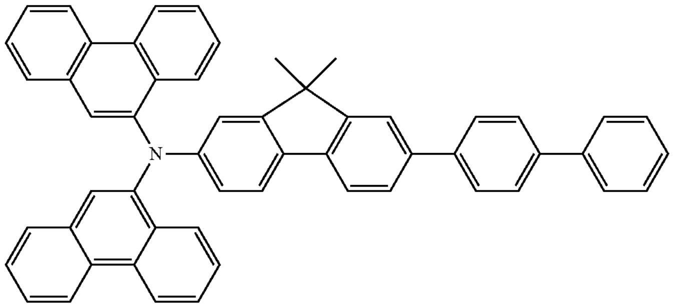
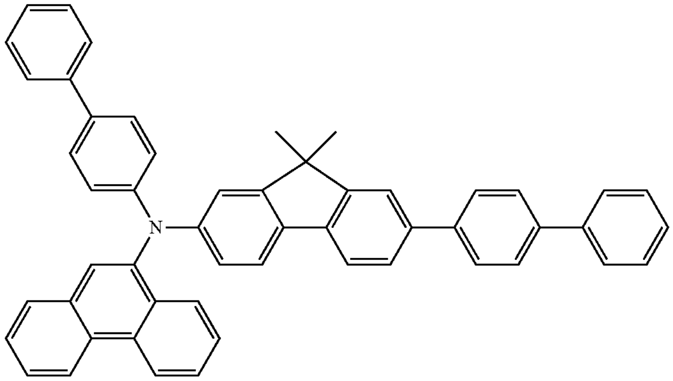
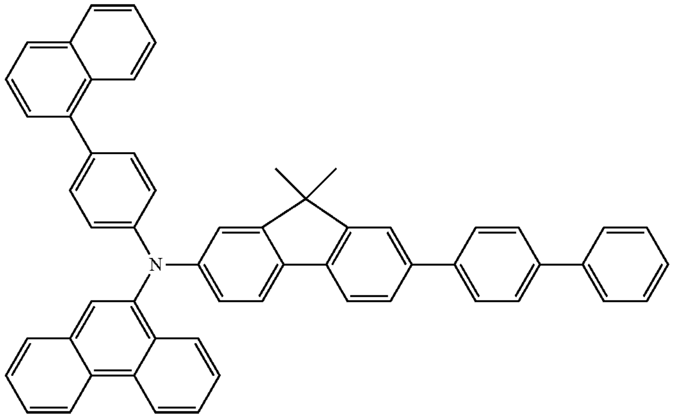
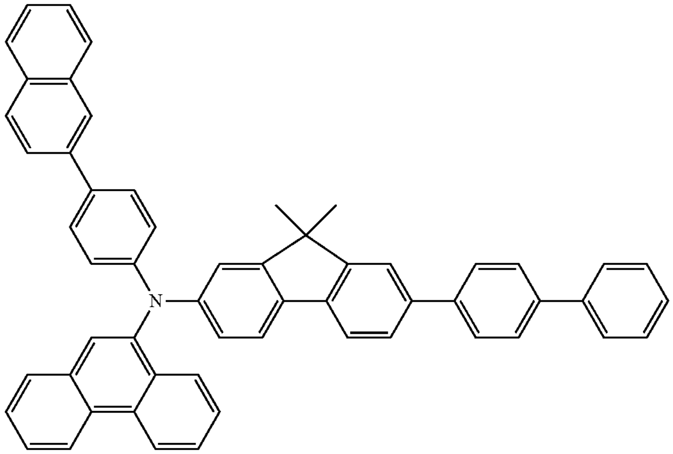

-continued
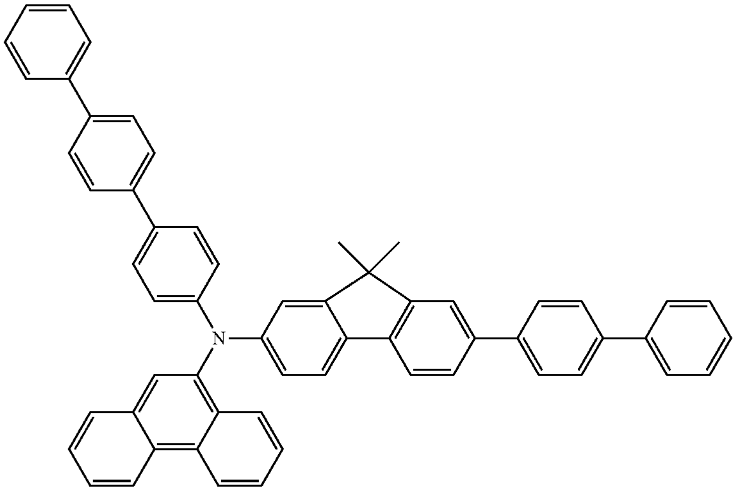
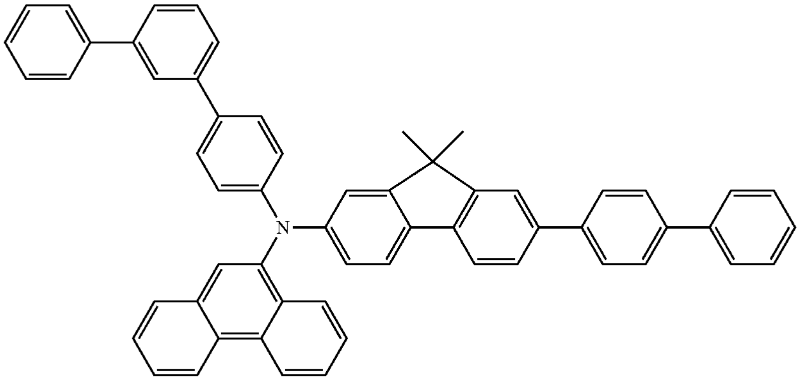
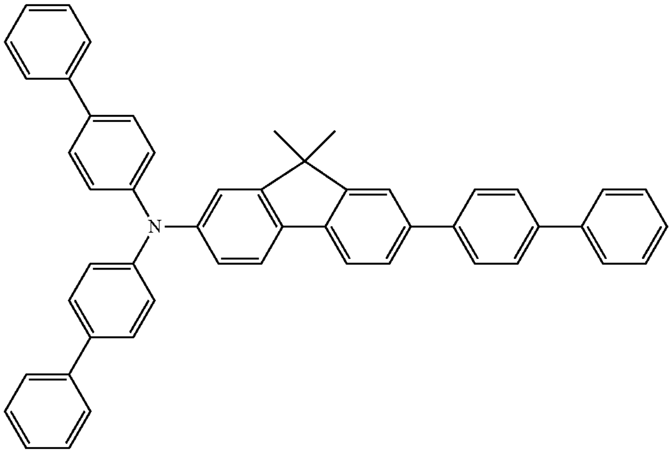
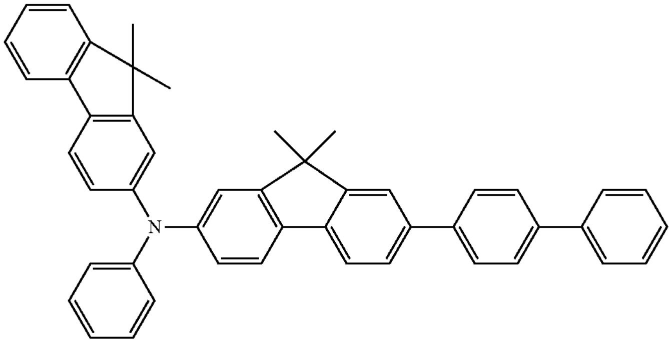

-continued
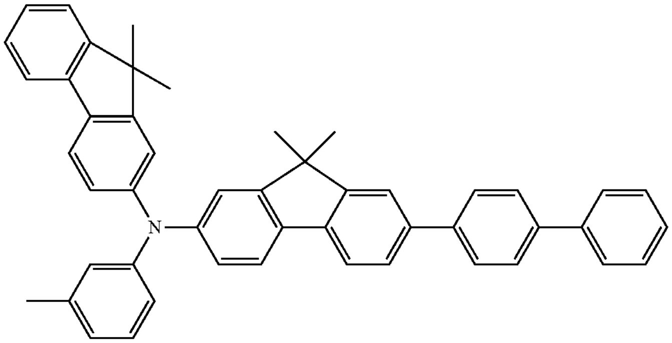
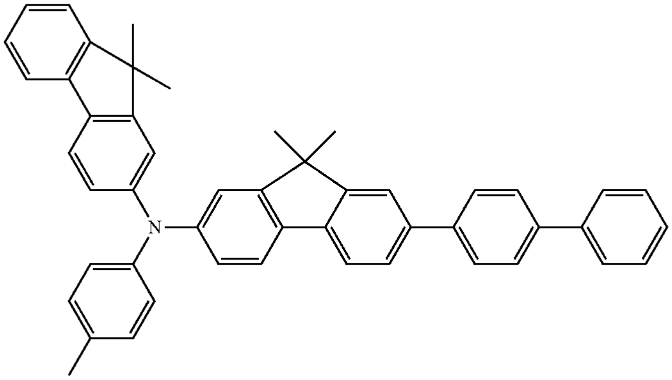
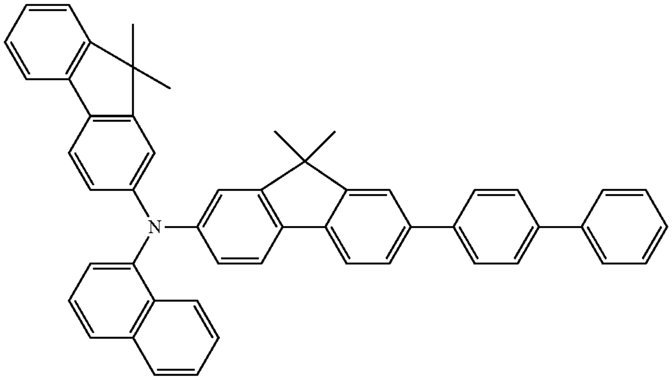
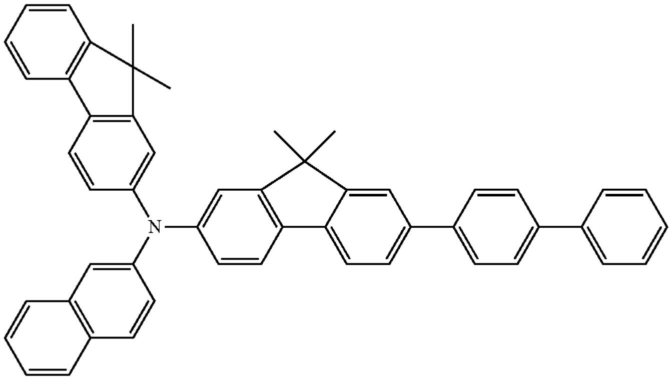

-continued
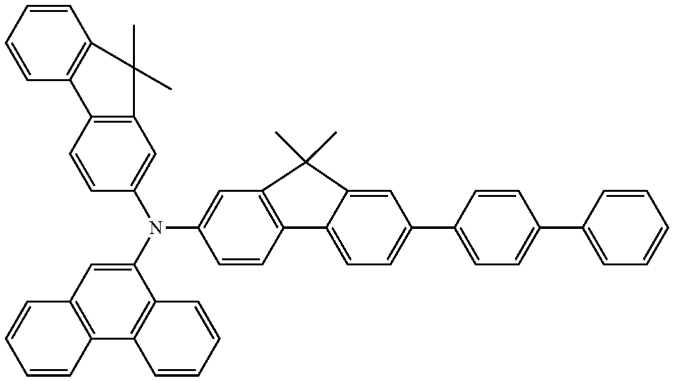
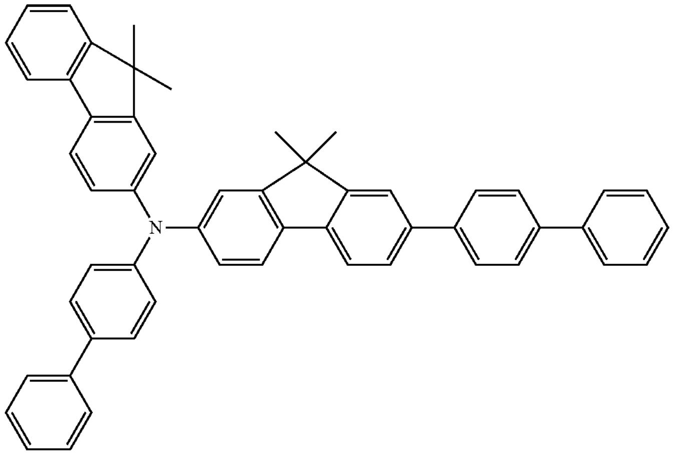
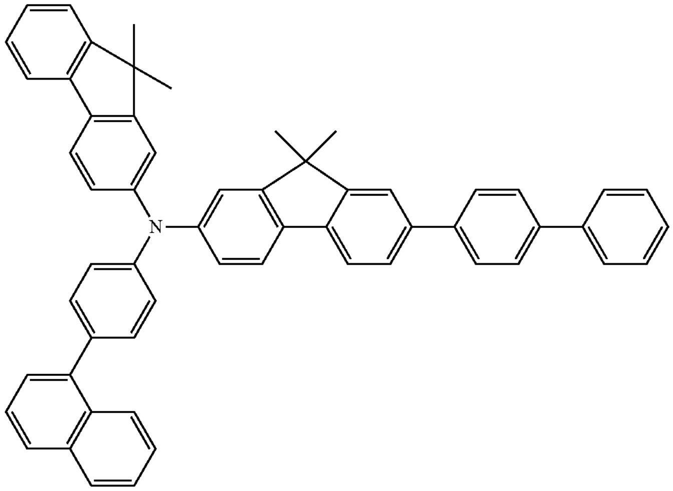

-continued
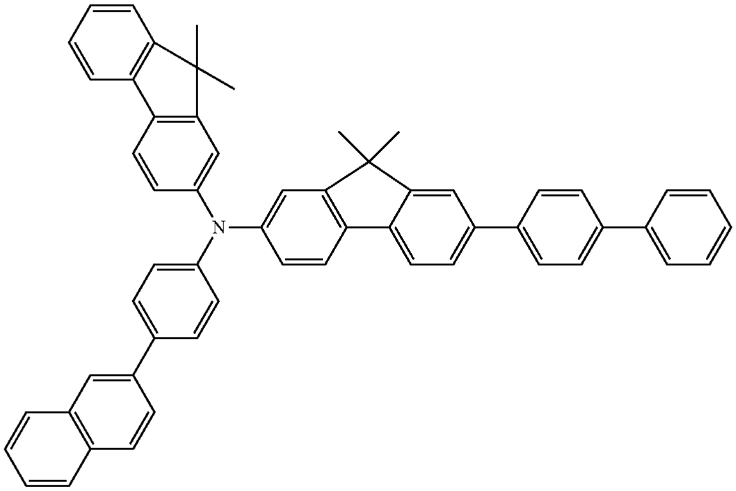
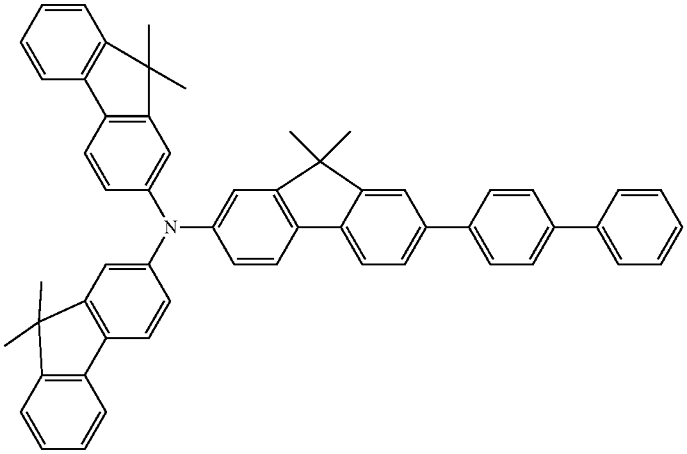
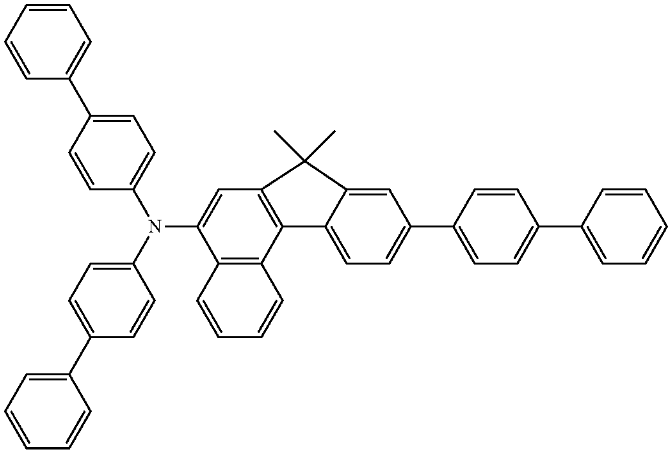

-continued
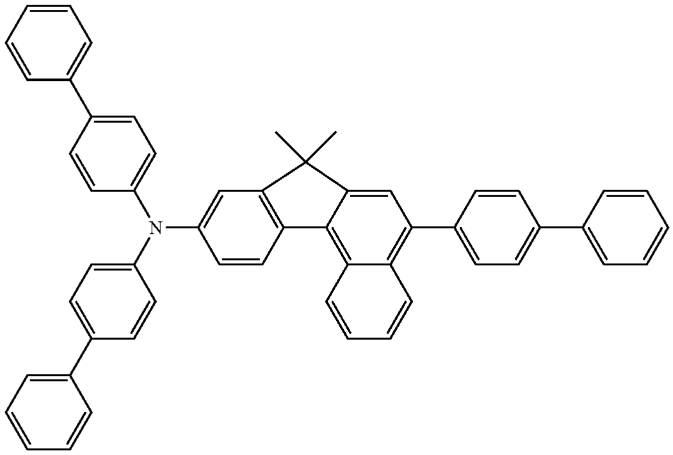
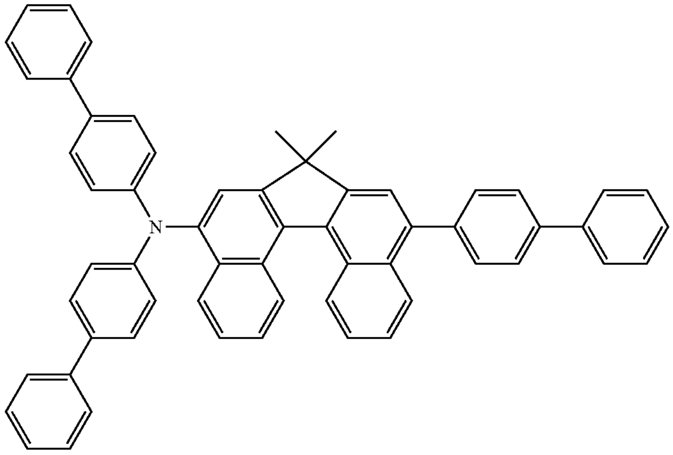
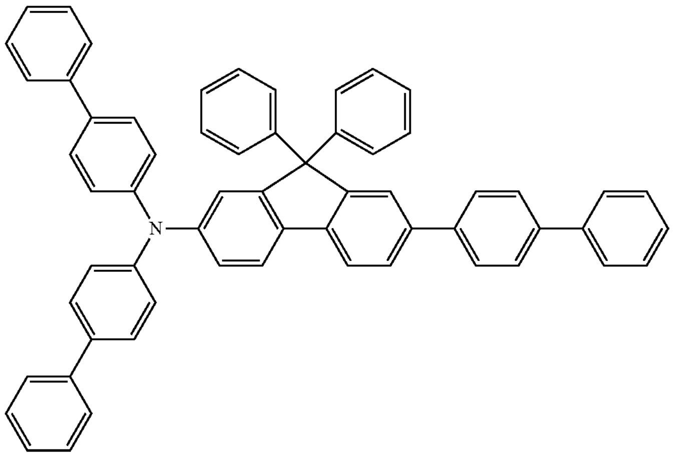

-continued
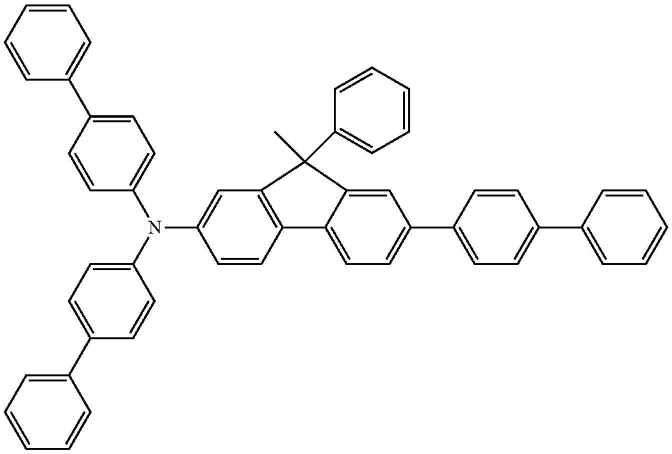
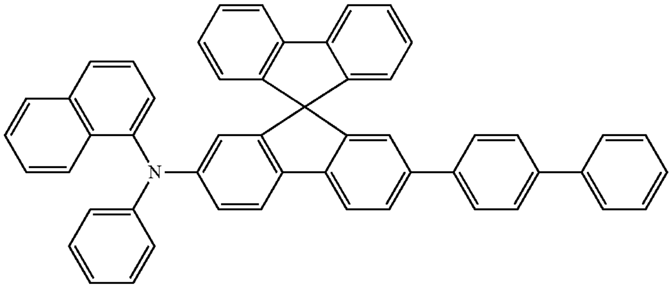
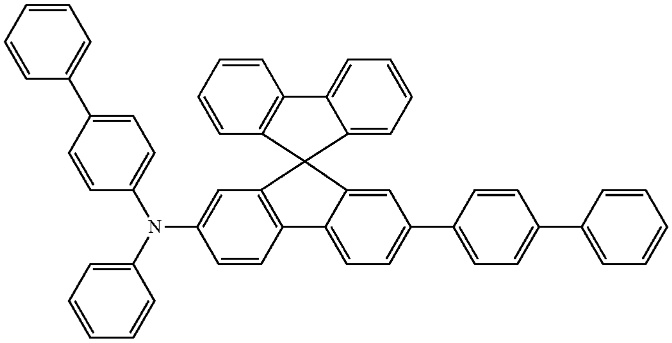
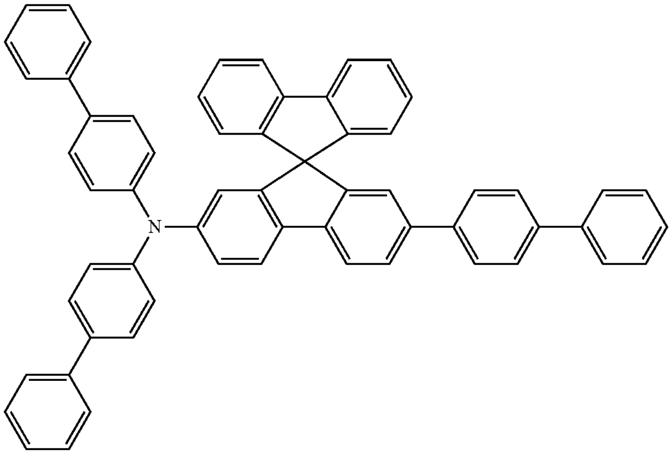

-continued
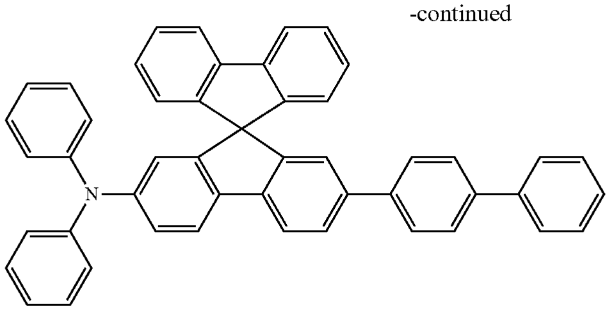
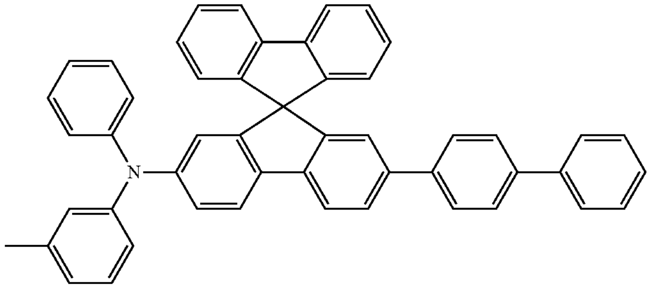
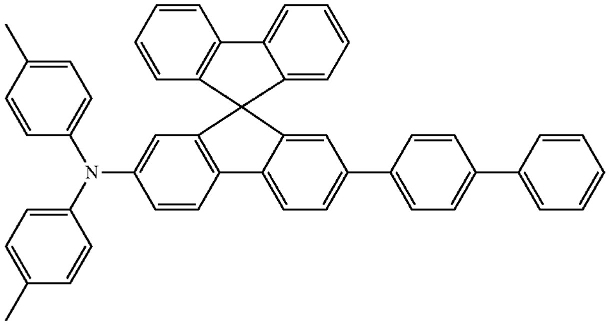
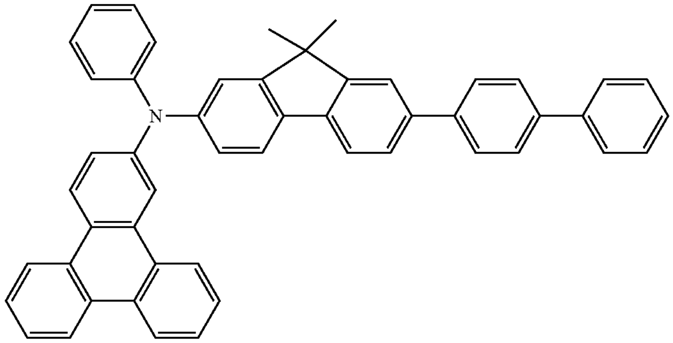
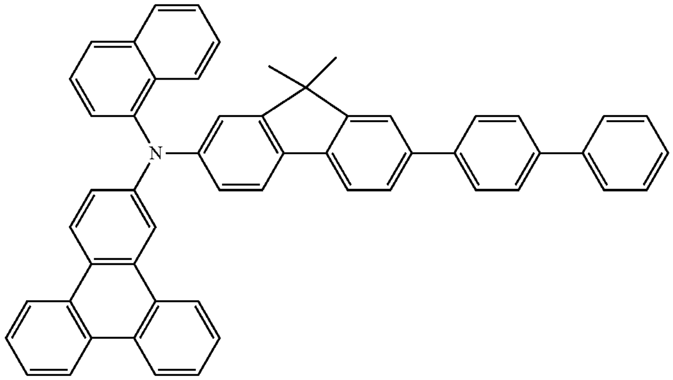

-continued
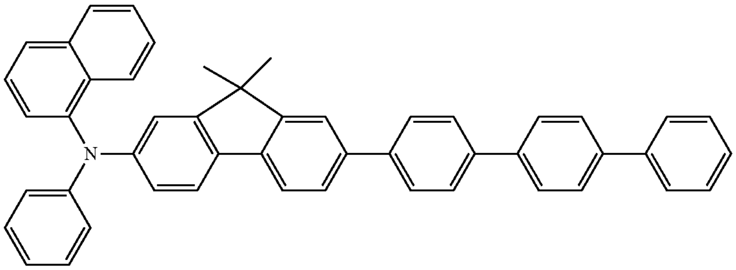
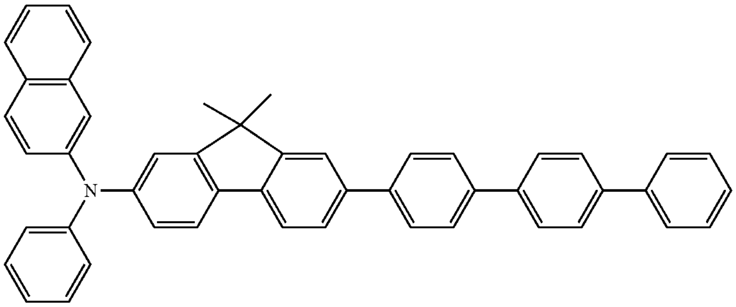
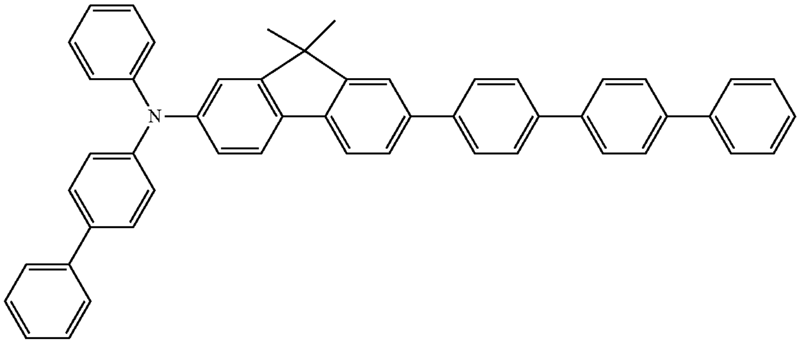
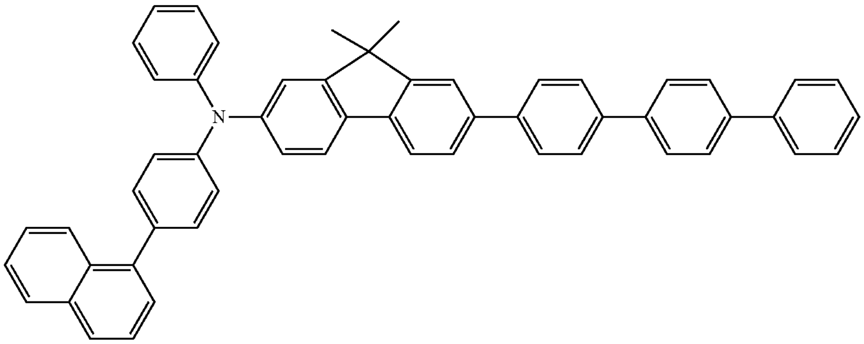
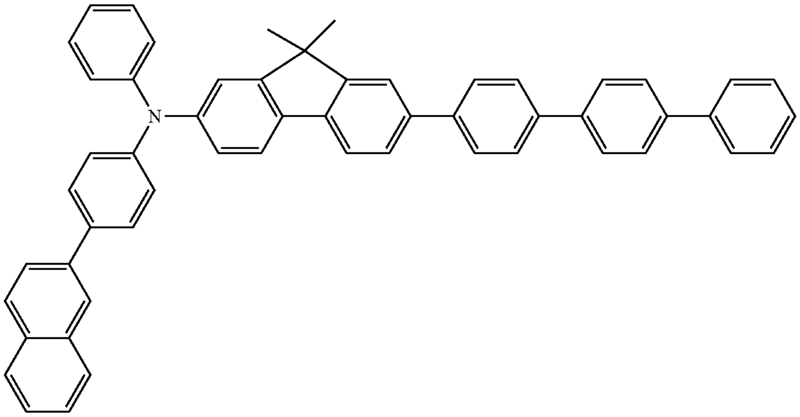

-continued
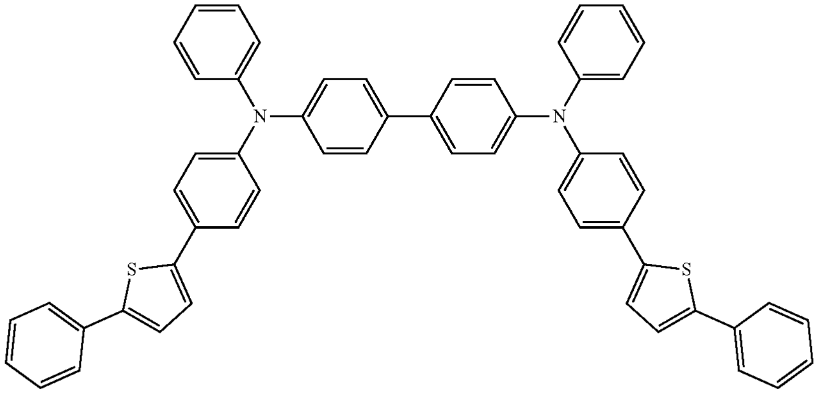
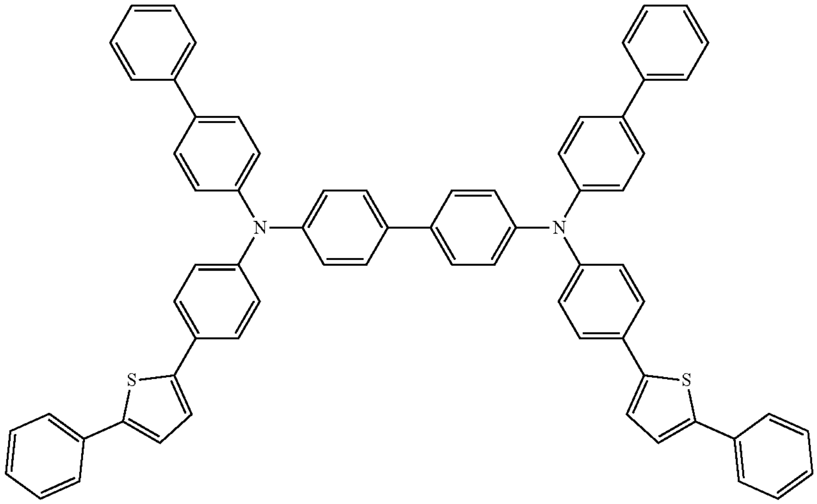
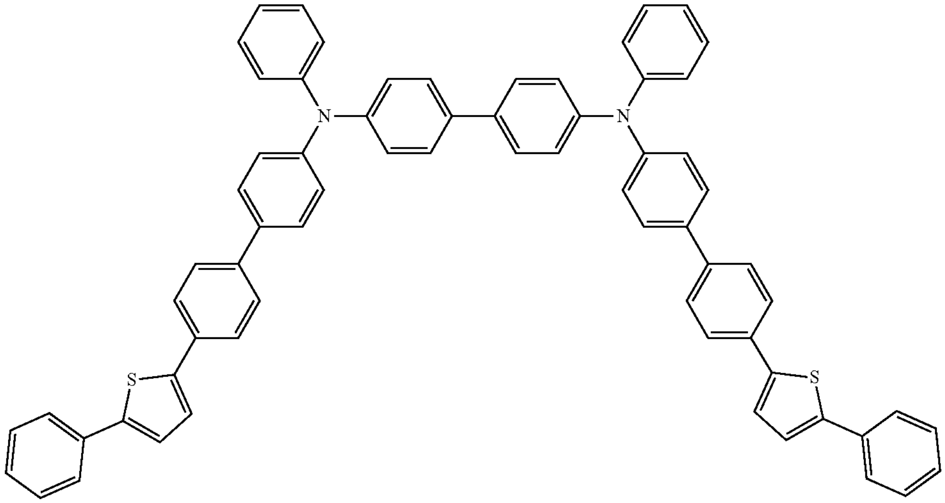

-continued
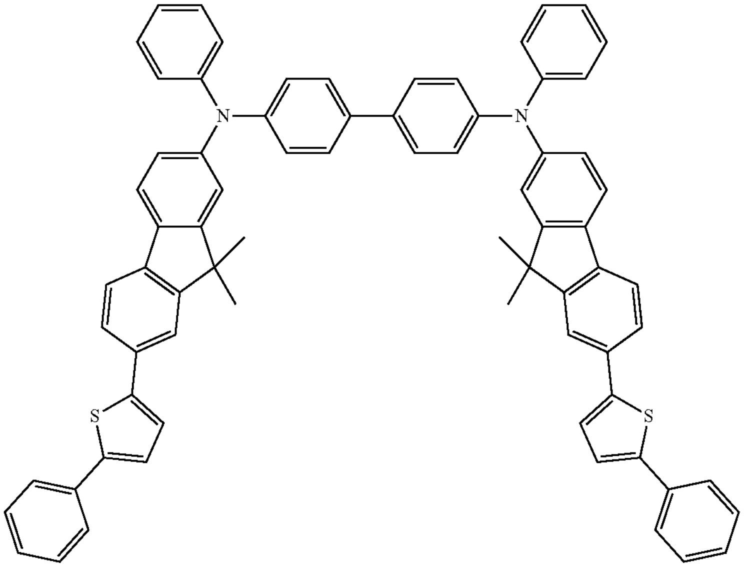
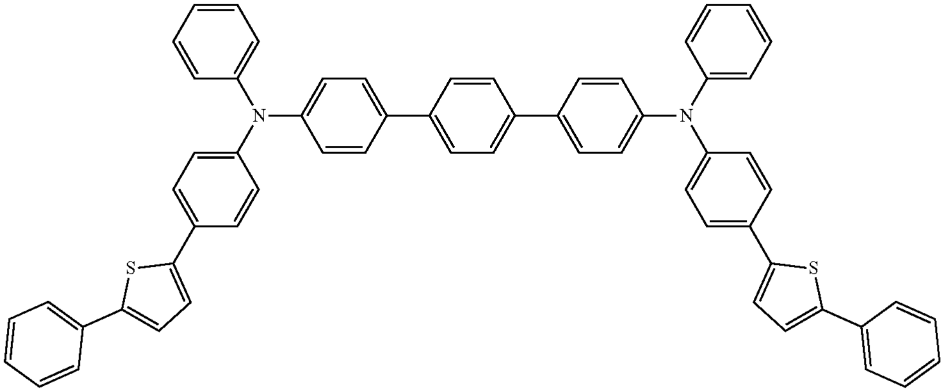
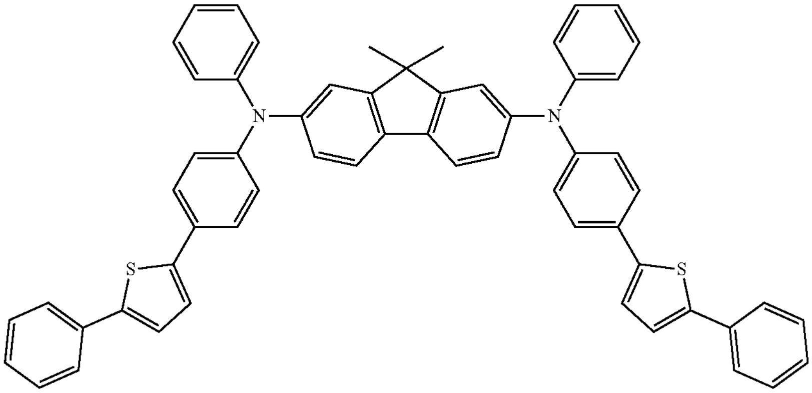

-continued
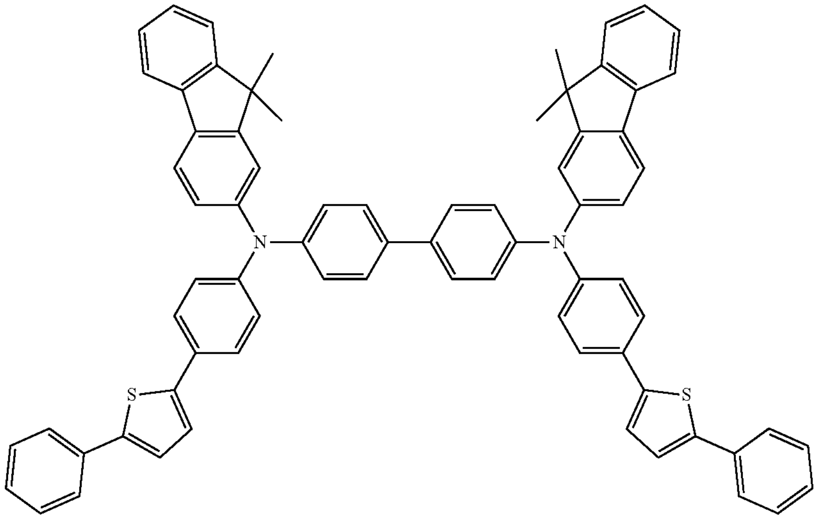
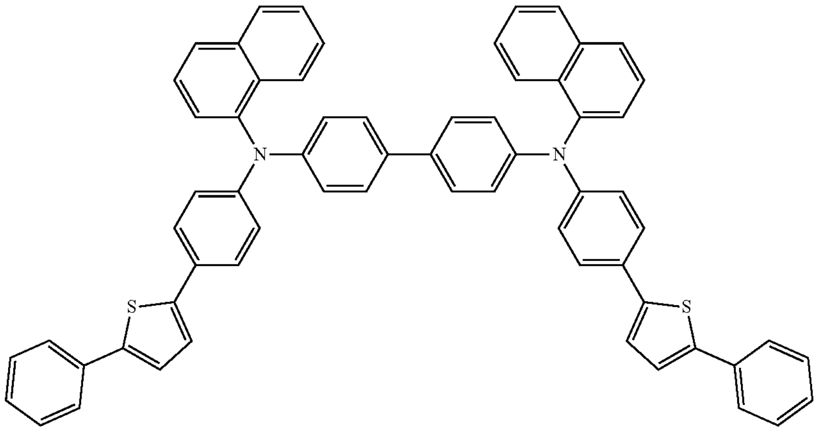
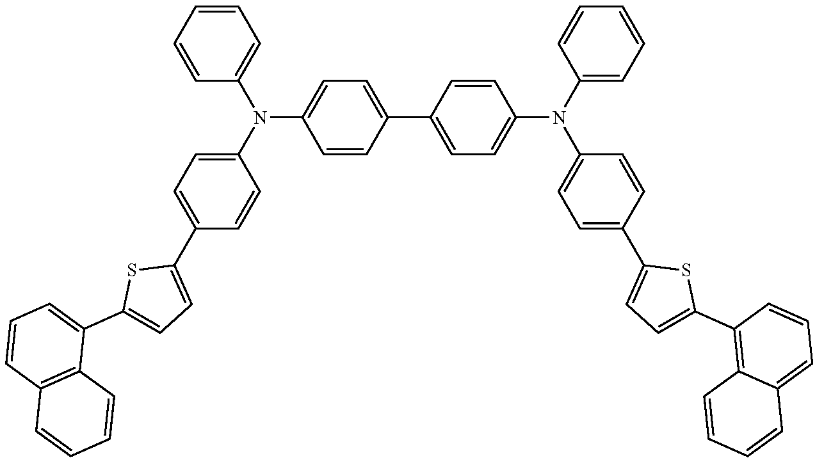

-continued
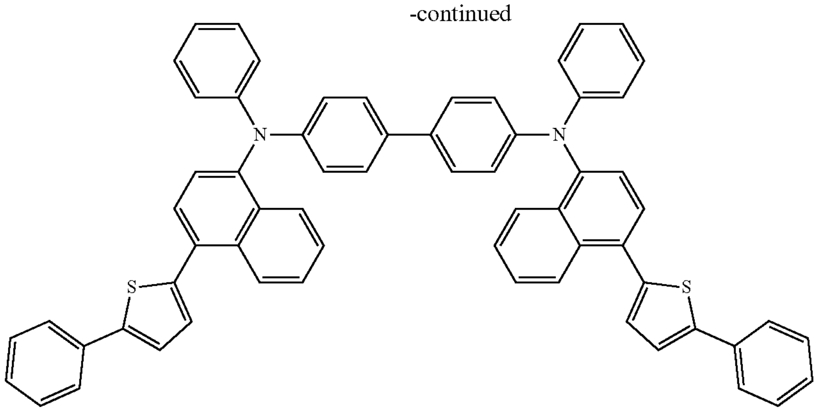
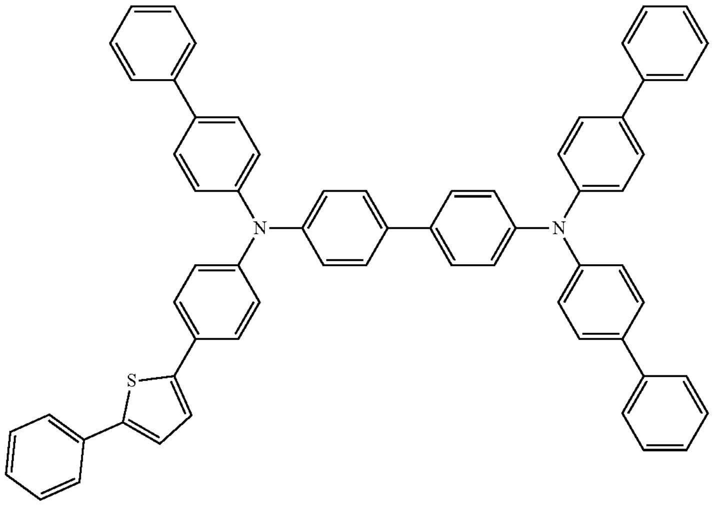
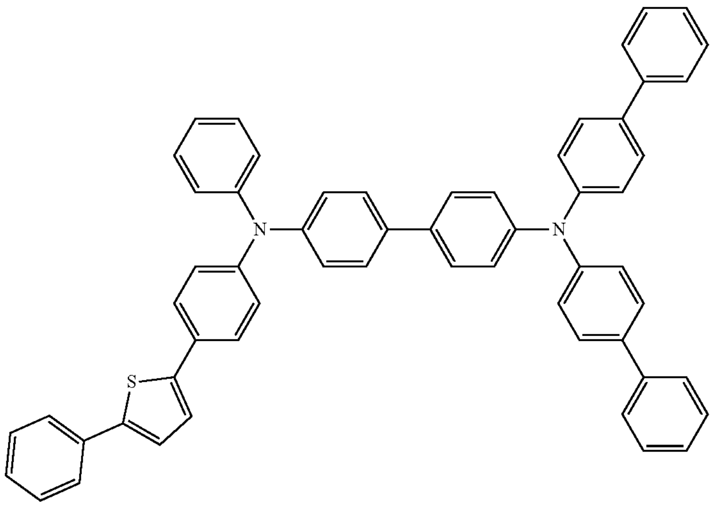

-continued
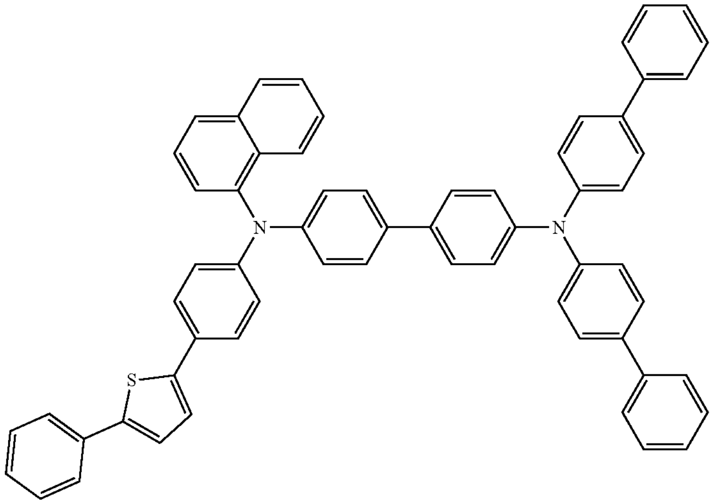
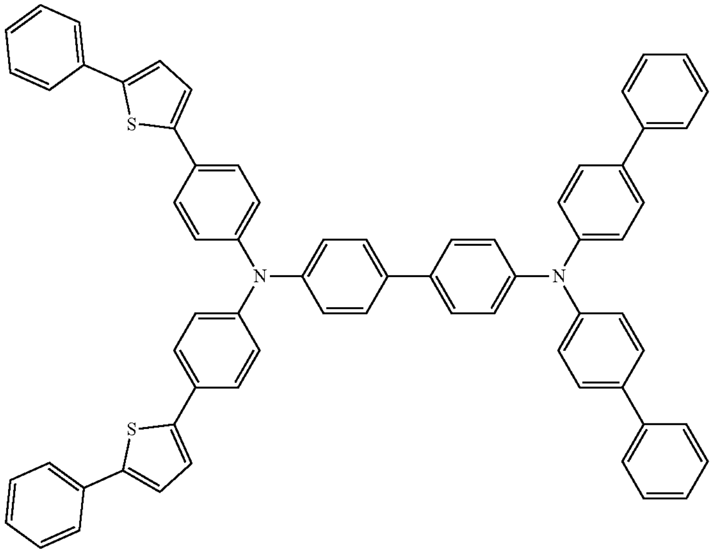
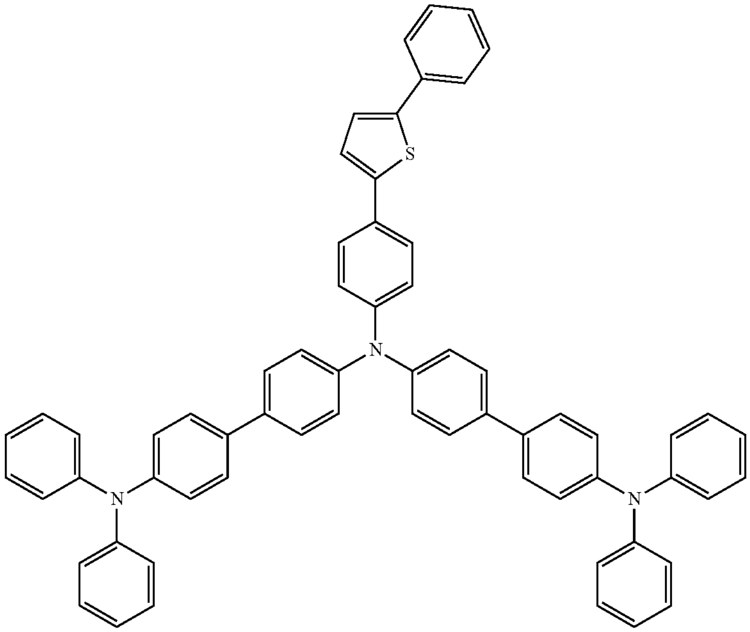

-continued
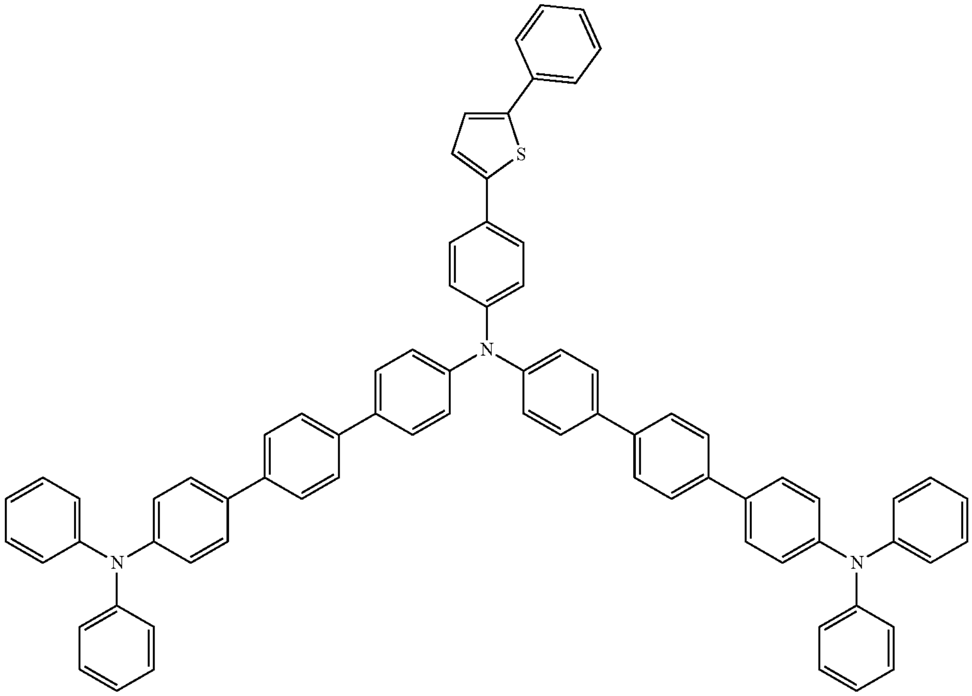
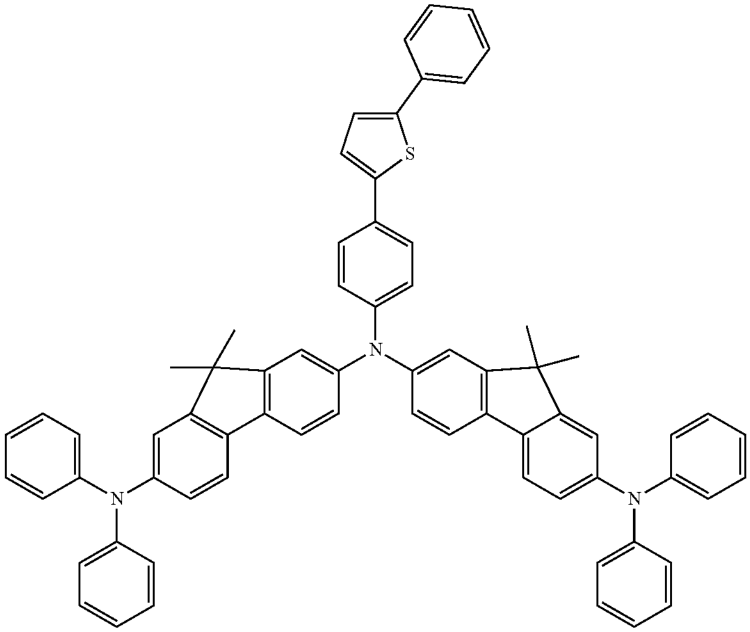

-continued
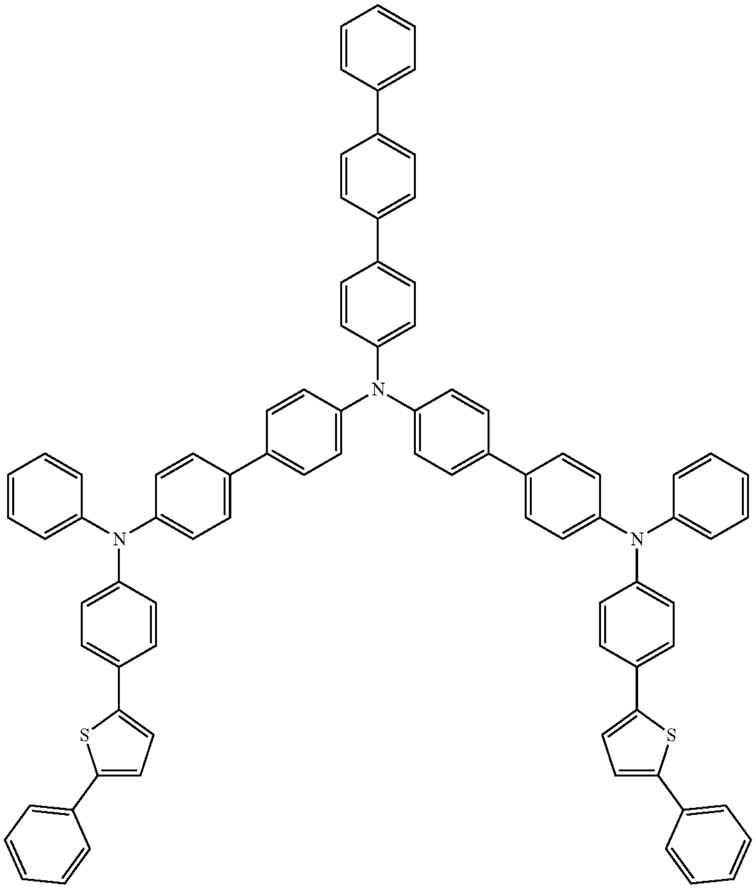
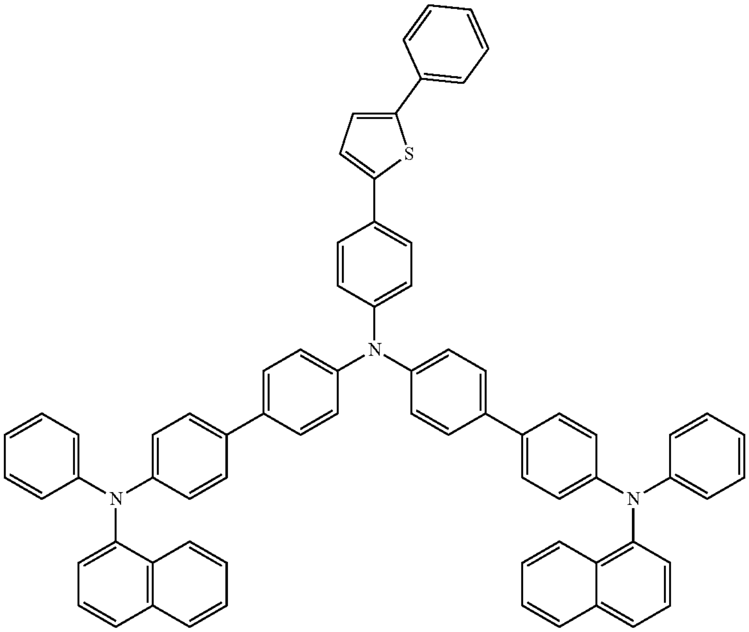

-continued
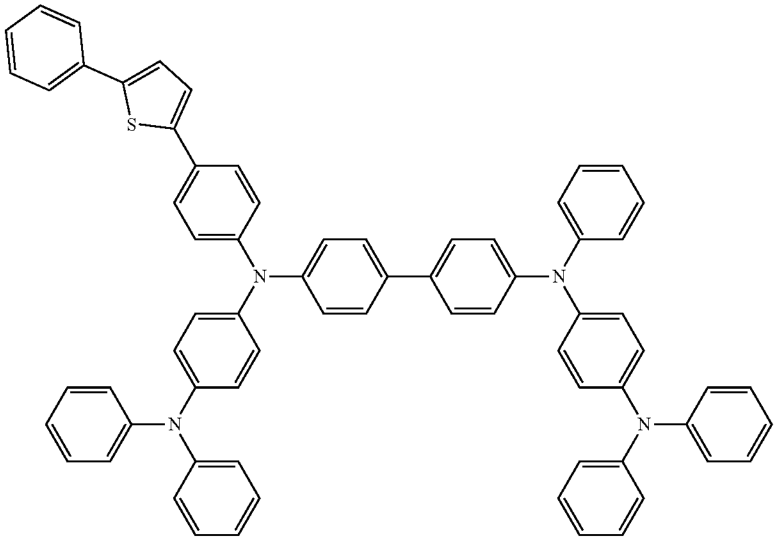
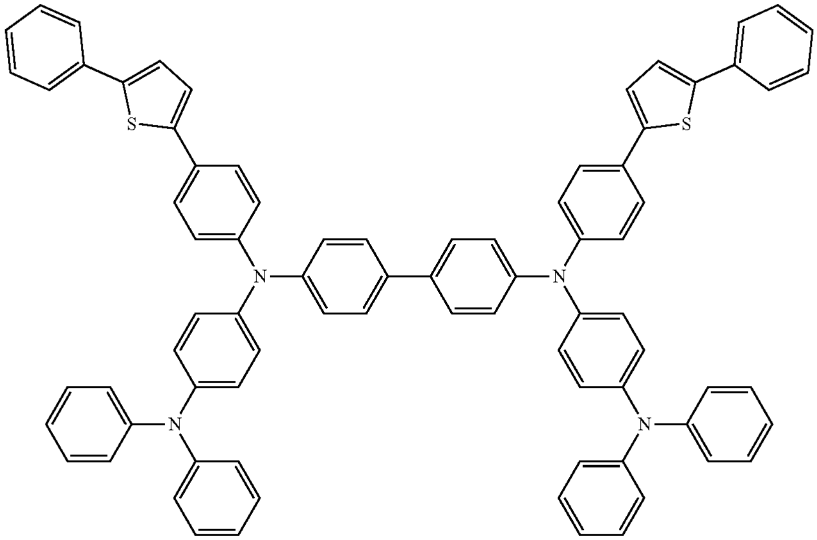
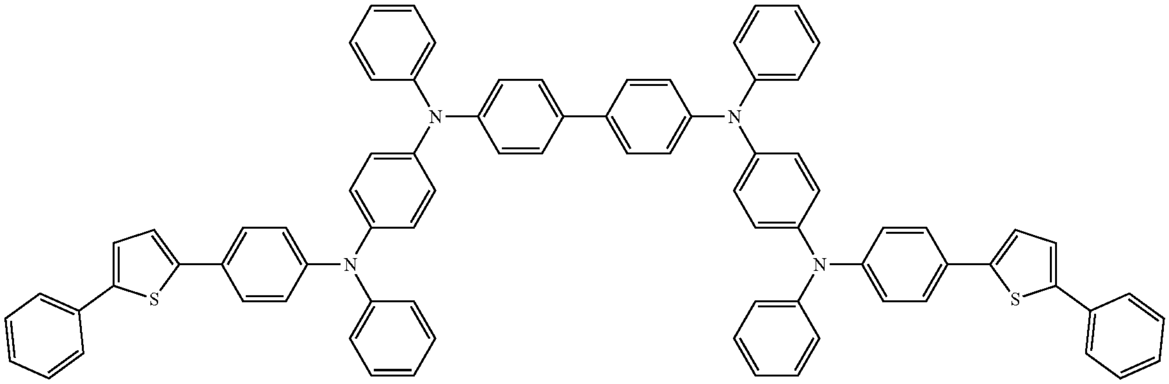

-continued
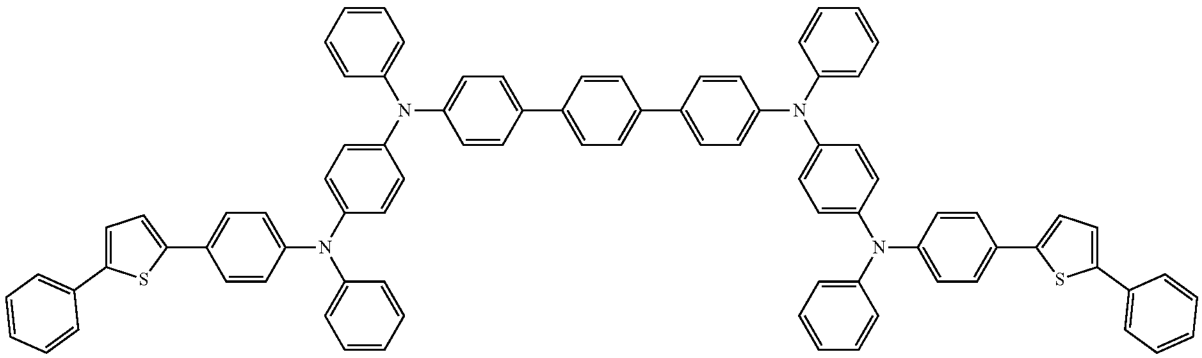
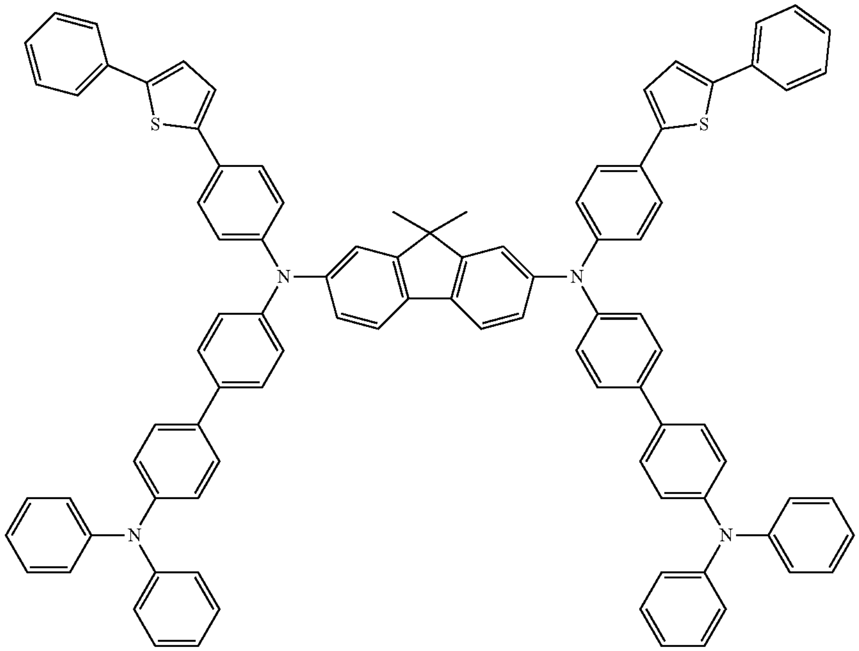

-continued
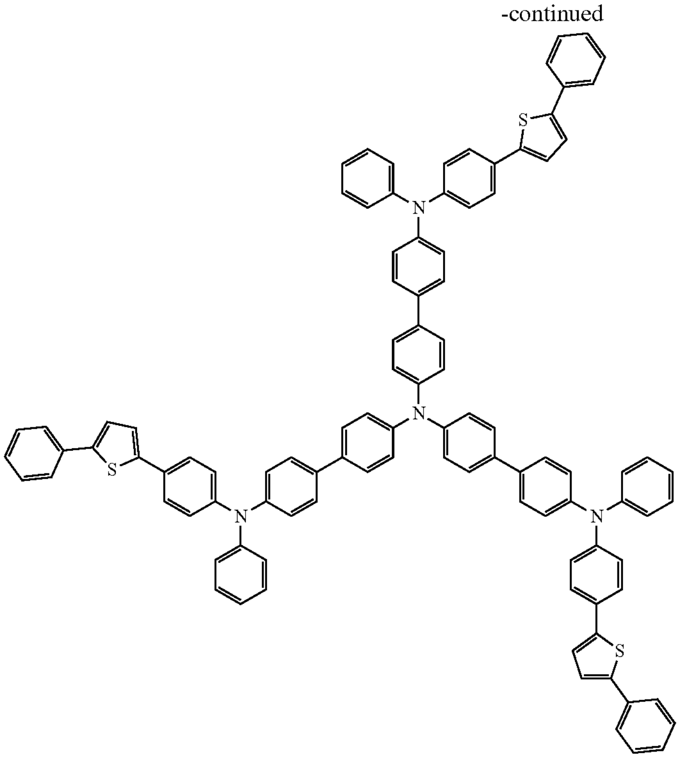
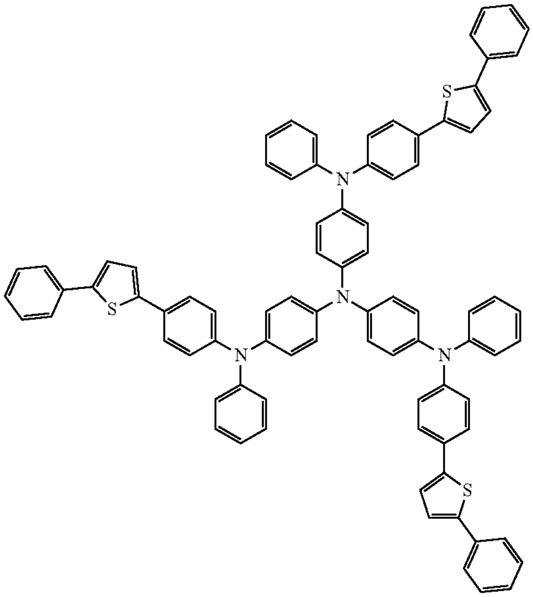
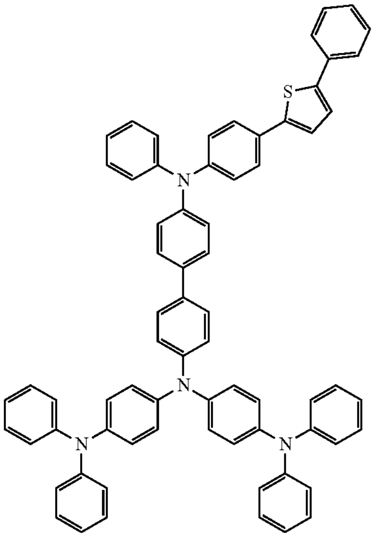
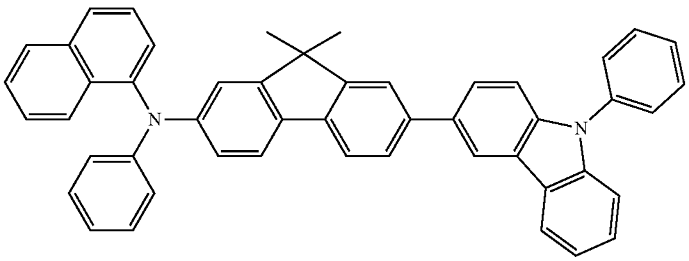

-continued
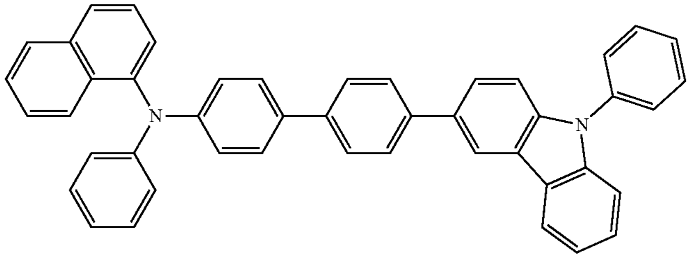
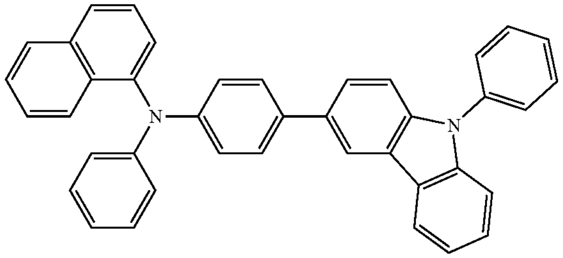
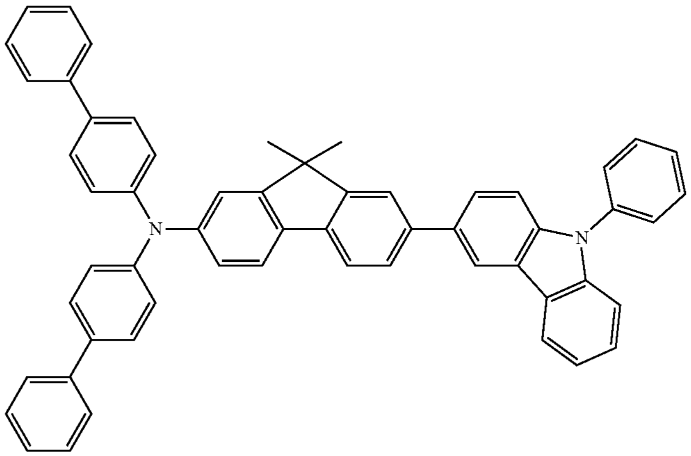
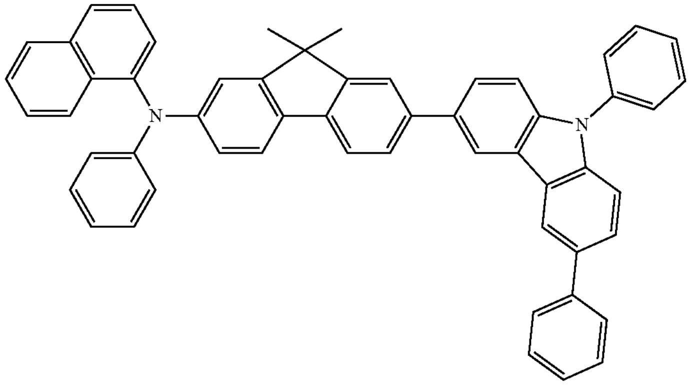

-continued
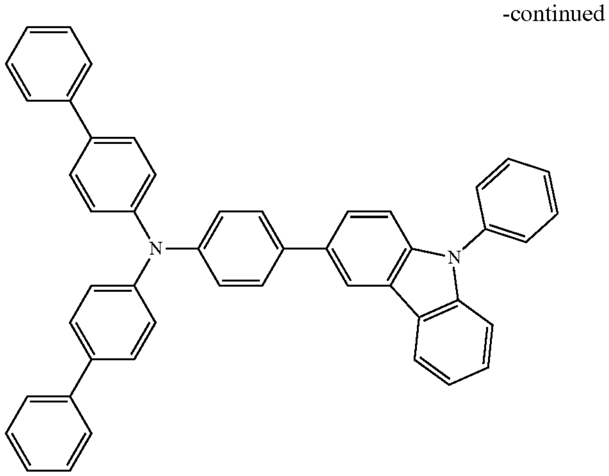
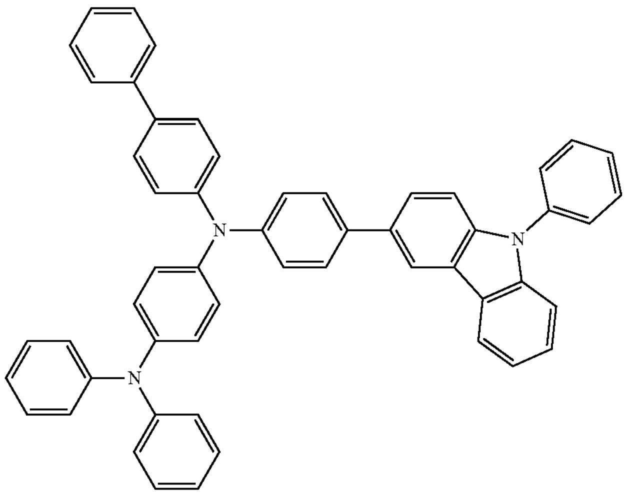
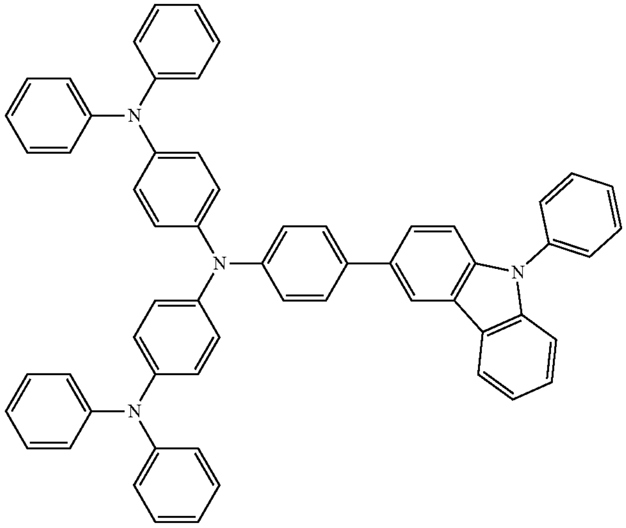

-continued
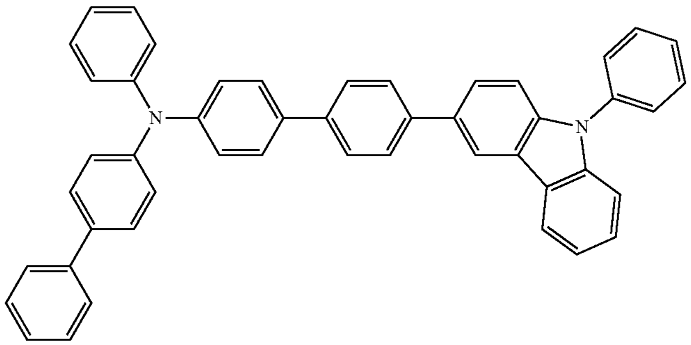
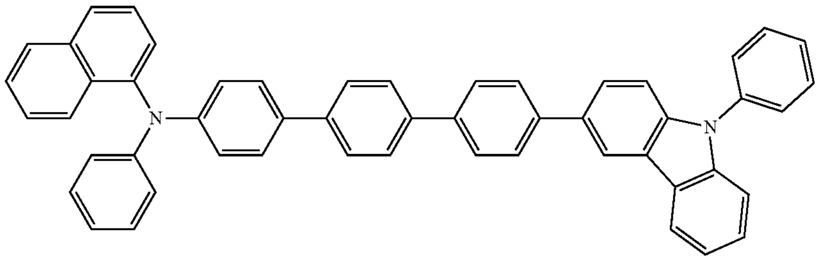
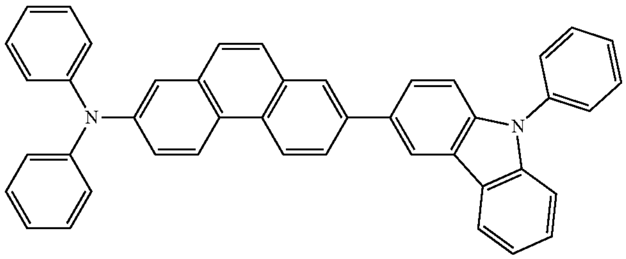
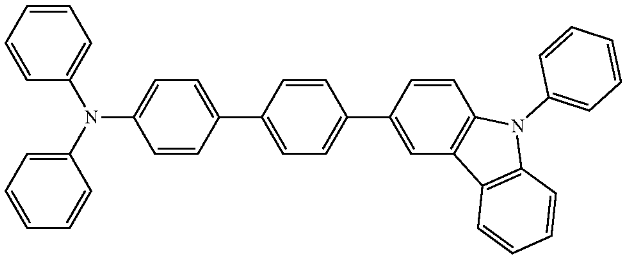
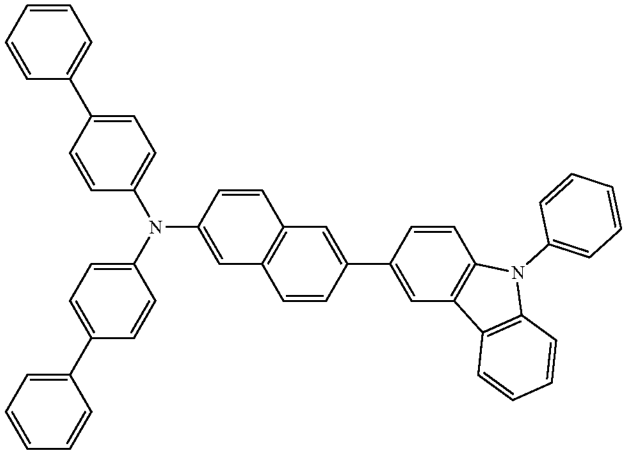

-continued
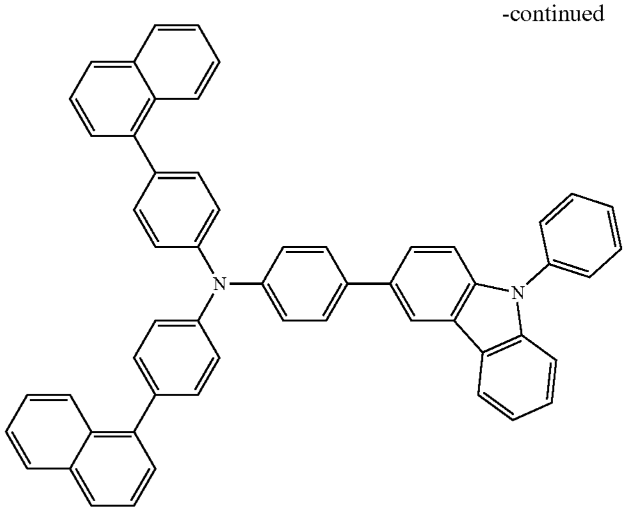
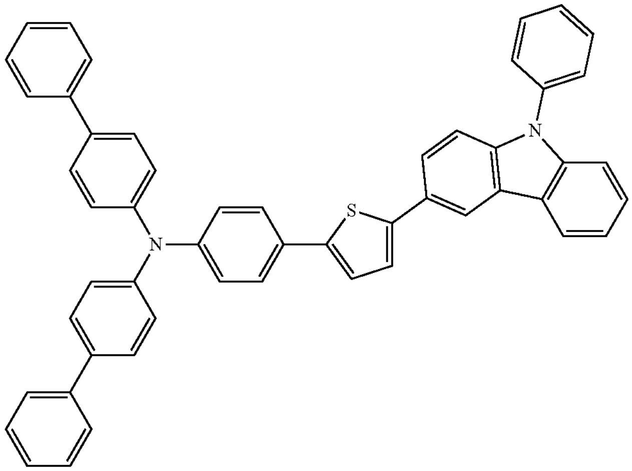
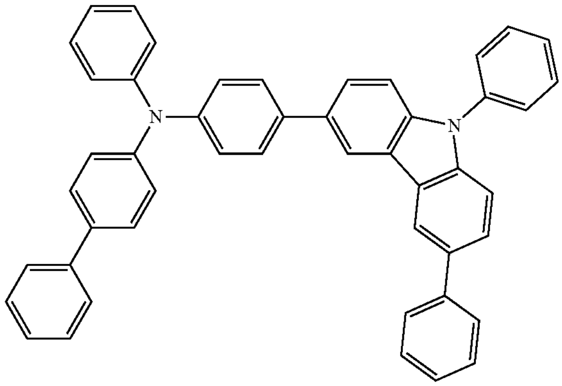

-continued
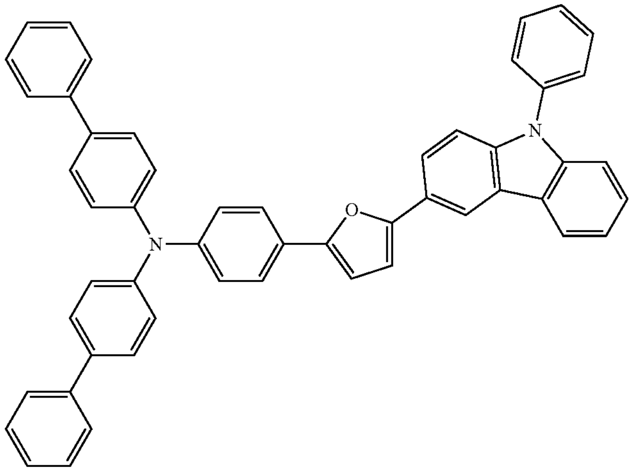
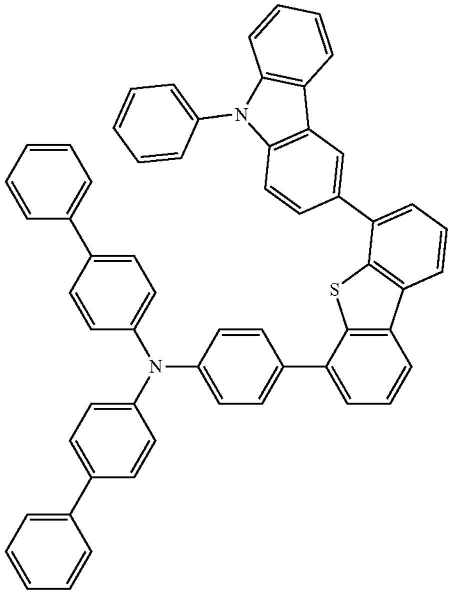
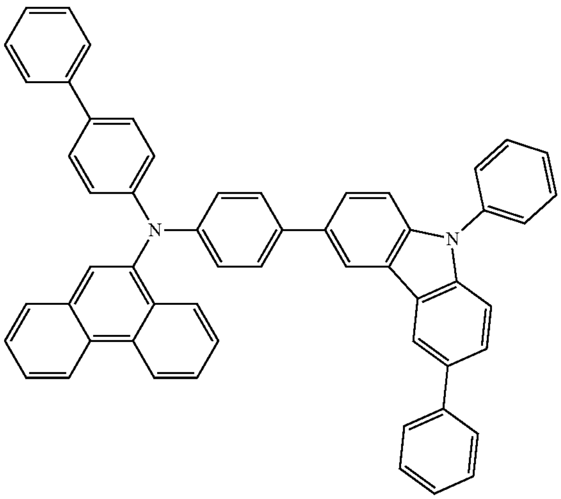
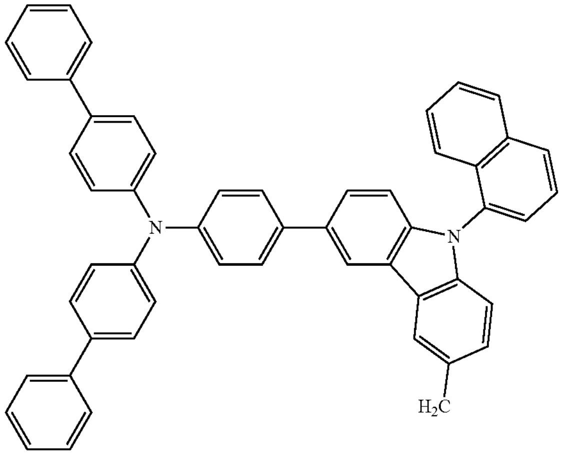
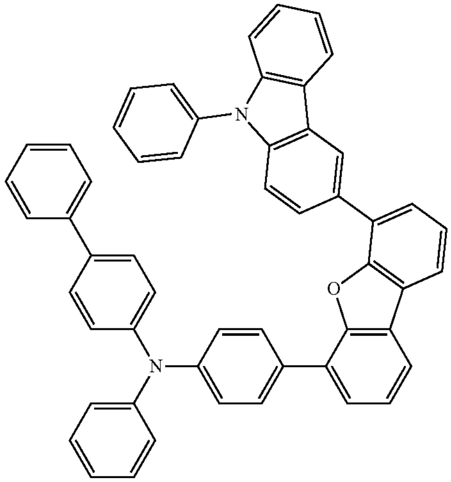

-continued
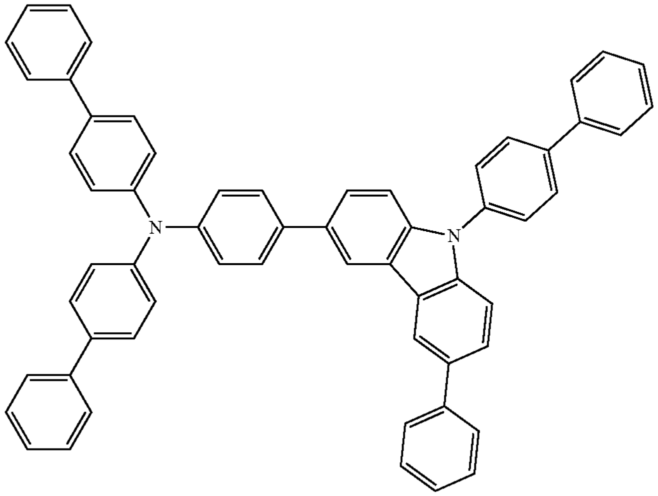
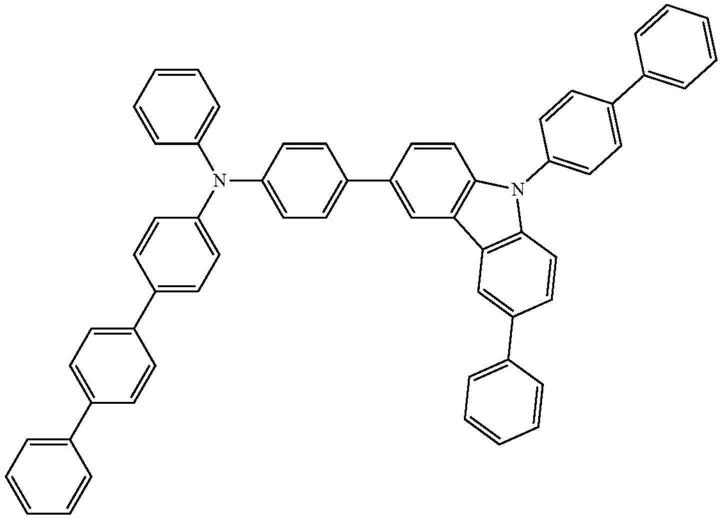
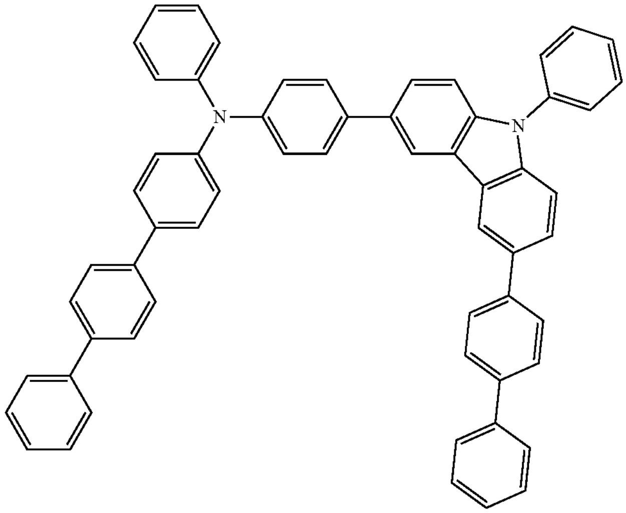

-continued
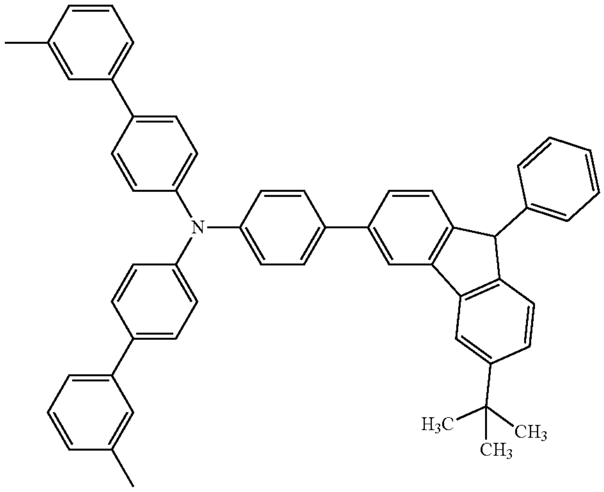
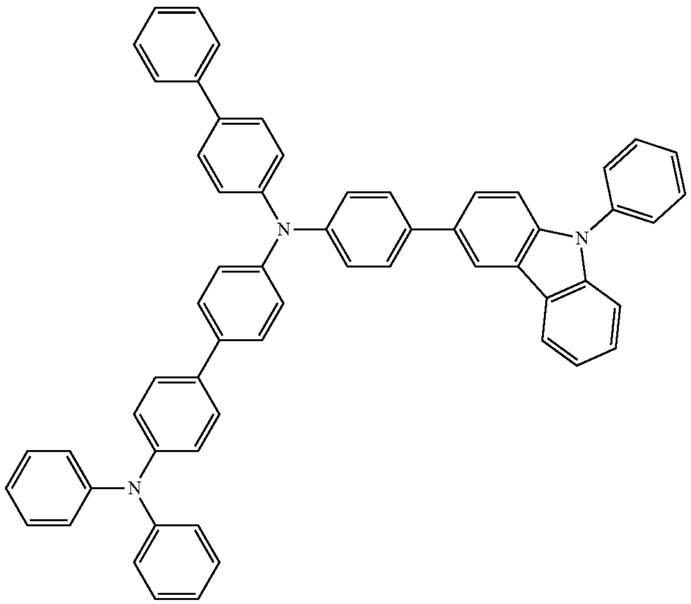
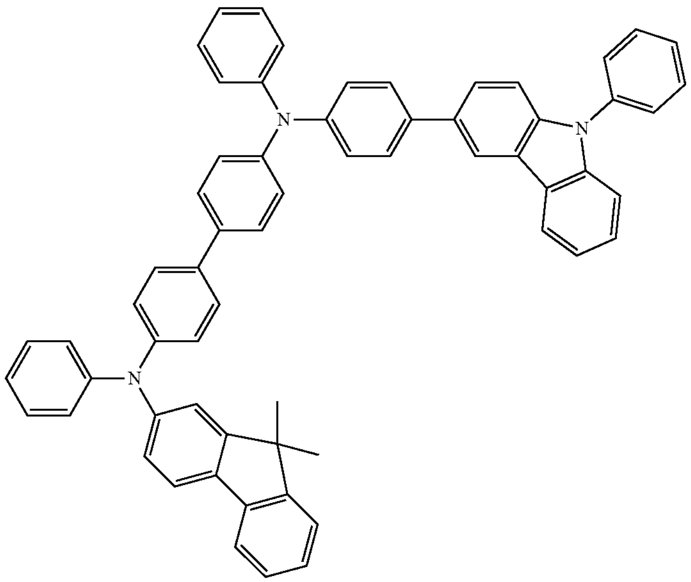

-continued
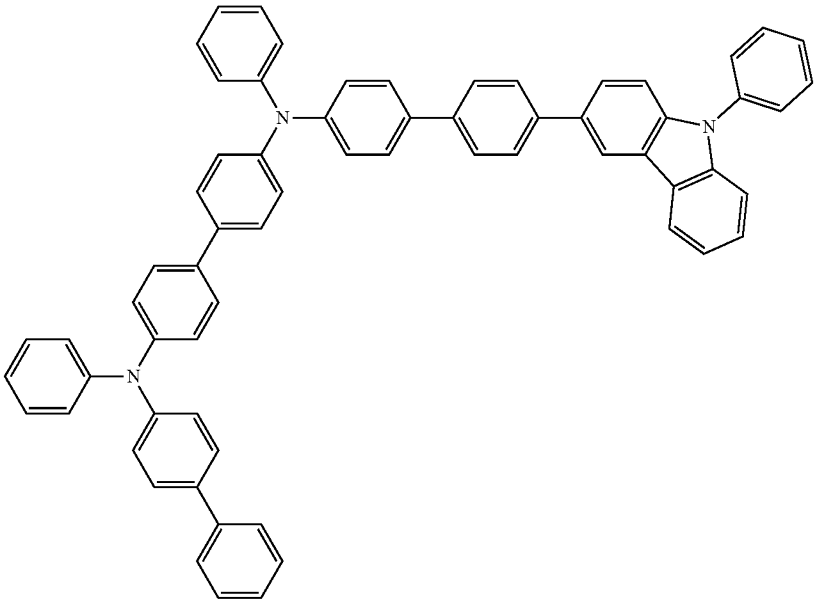
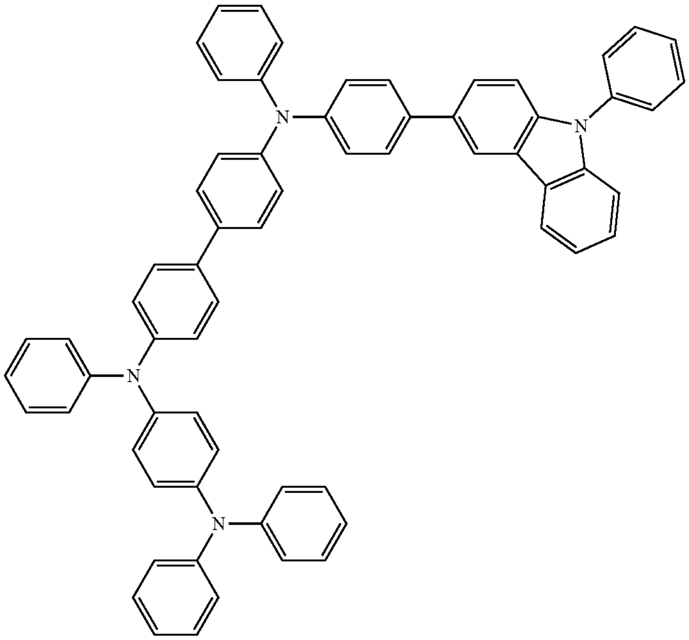

-continued
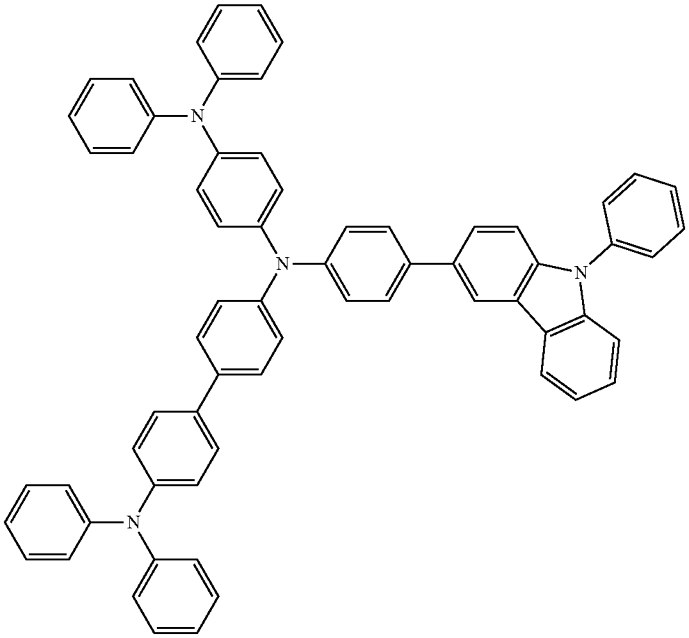
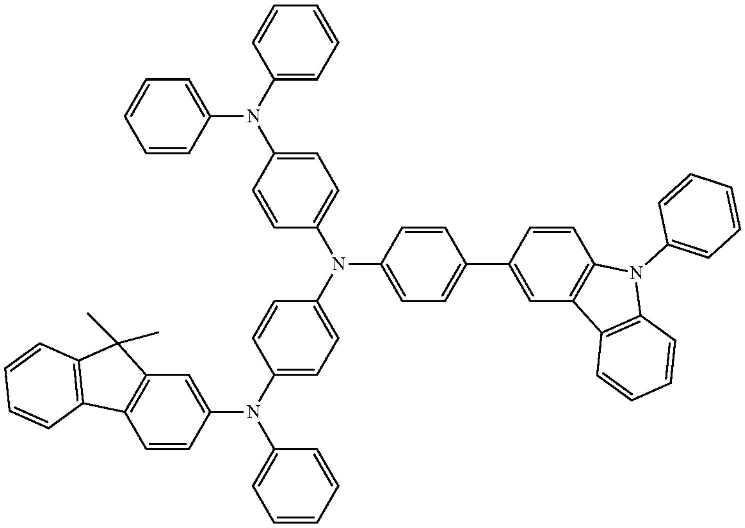
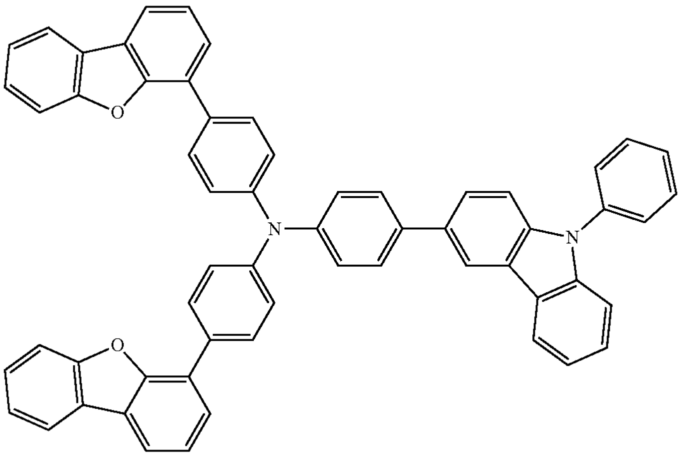

-continued
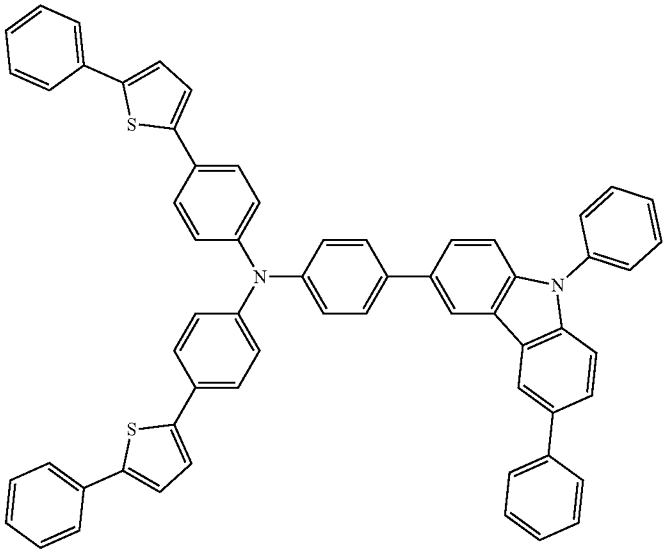
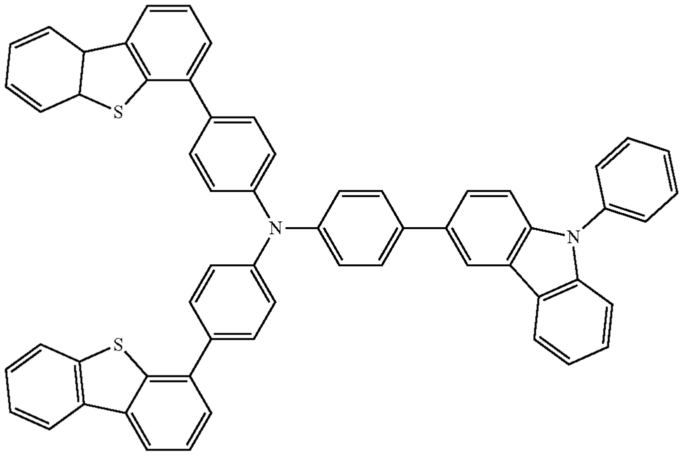
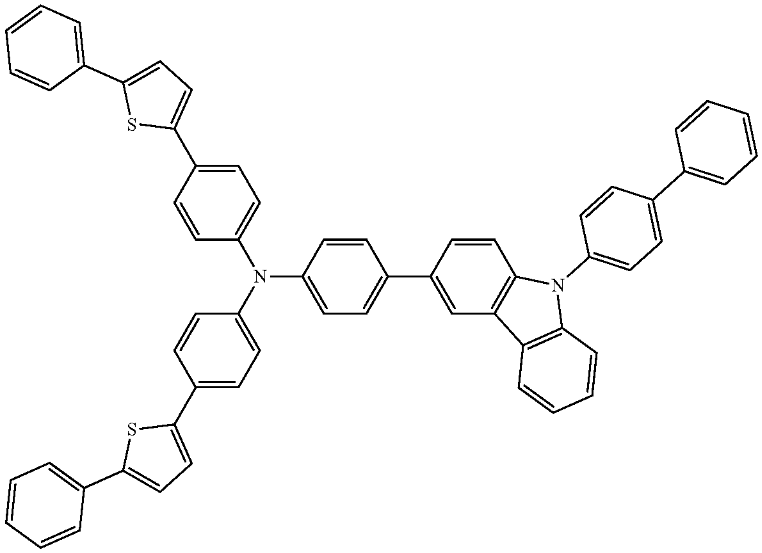

-continued
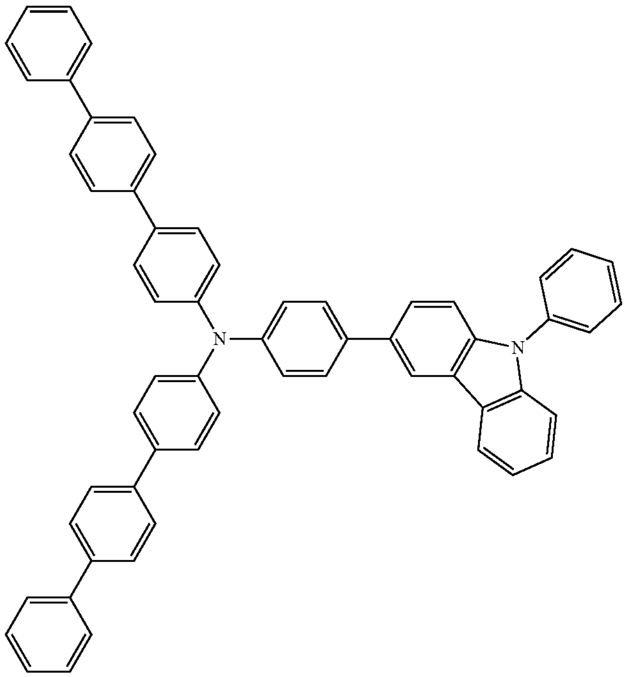
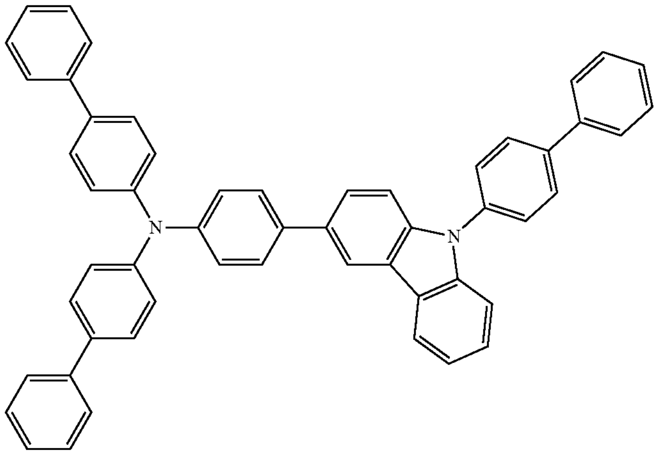
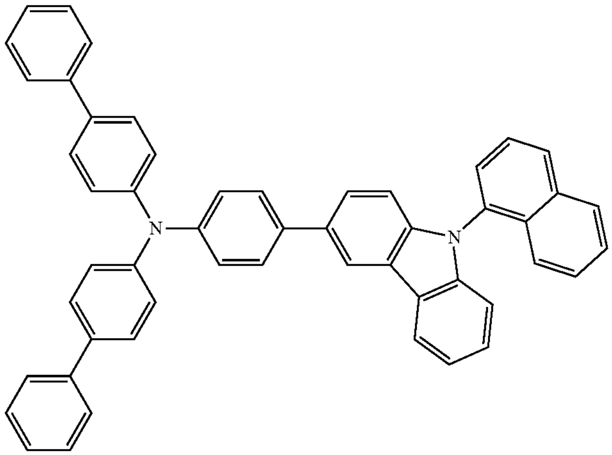

-continued
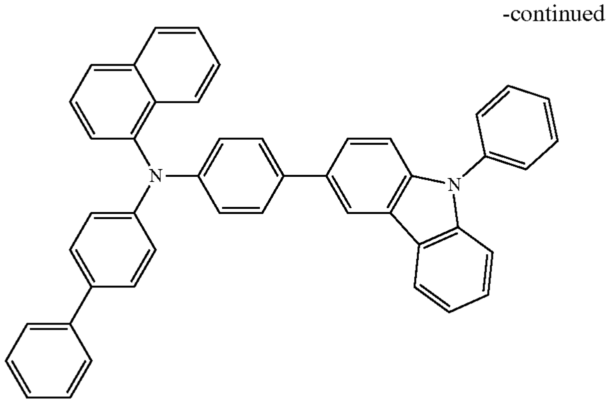
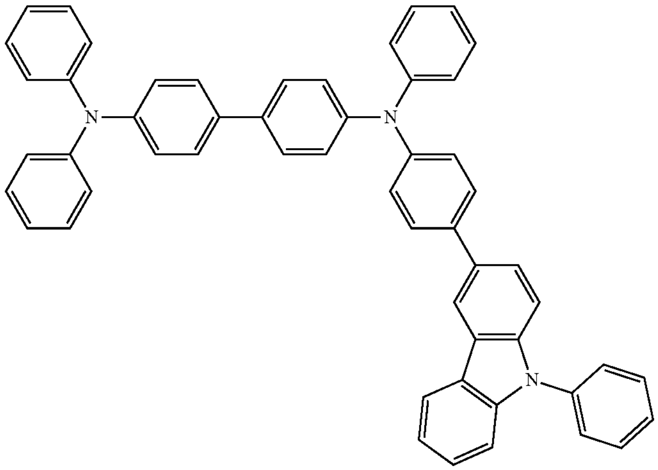
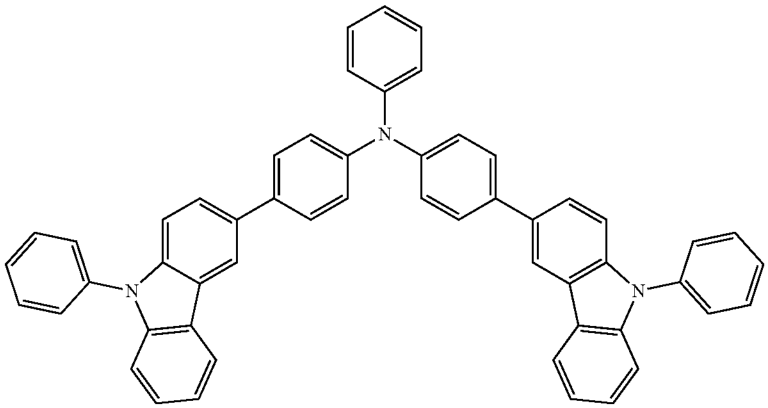

-continued
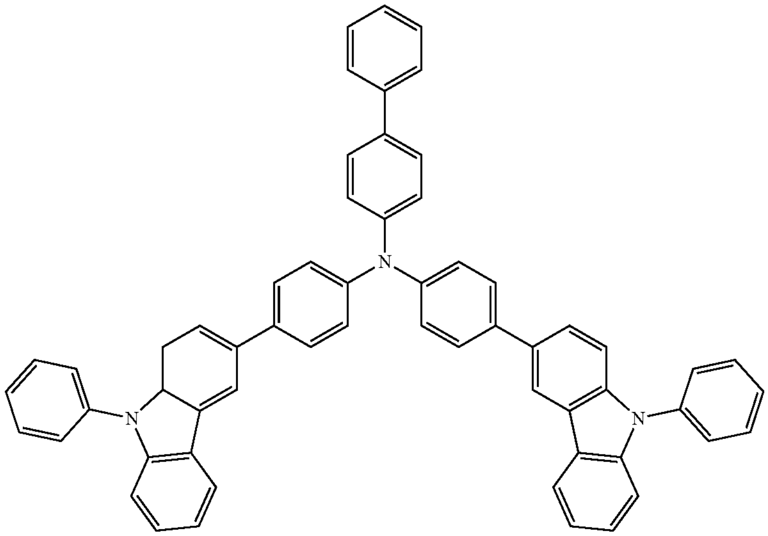
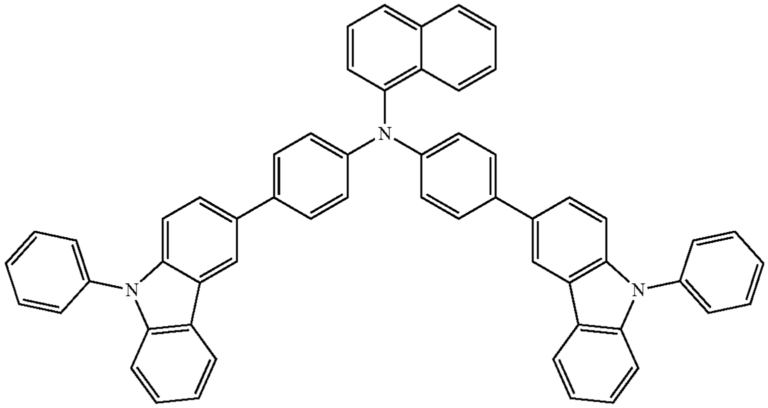
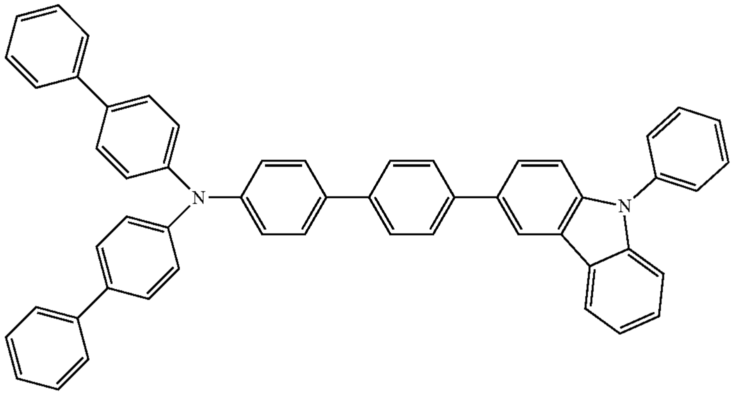
A-1
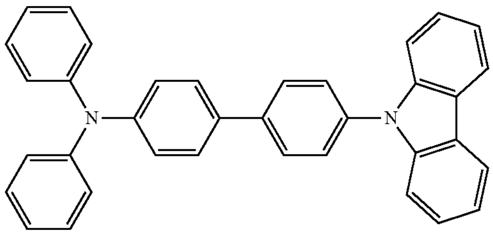

-continued
A-2
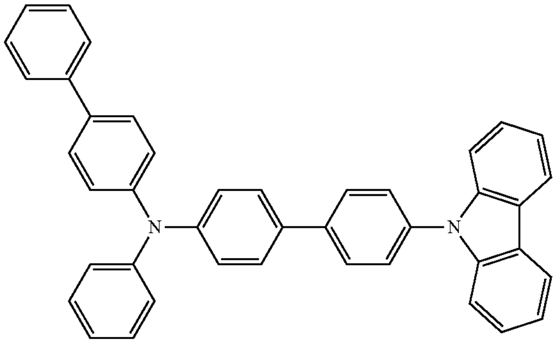
A-3
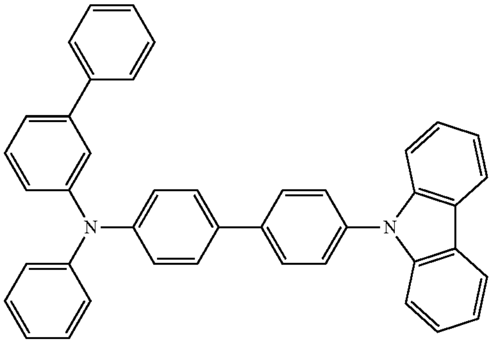
A-4
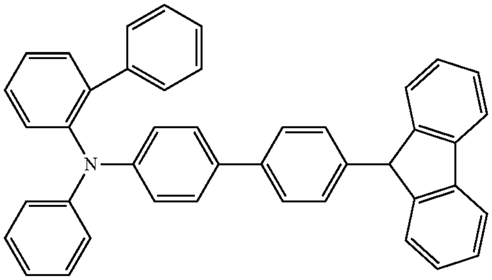
A-5
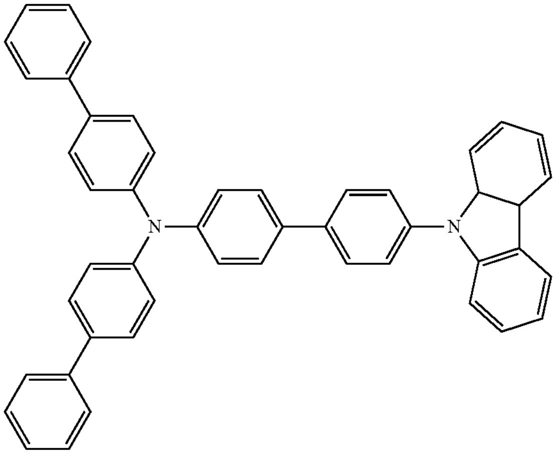

-continued
A-6
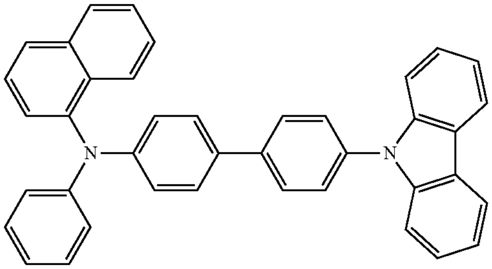
A-7
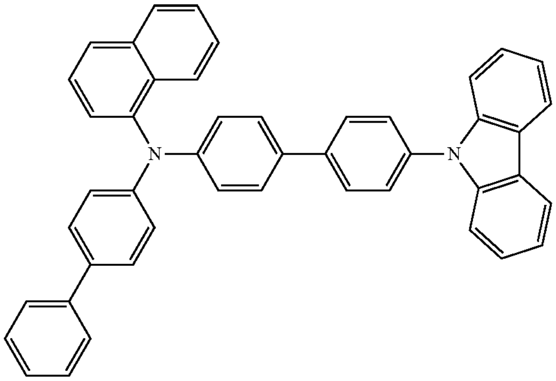
A-8
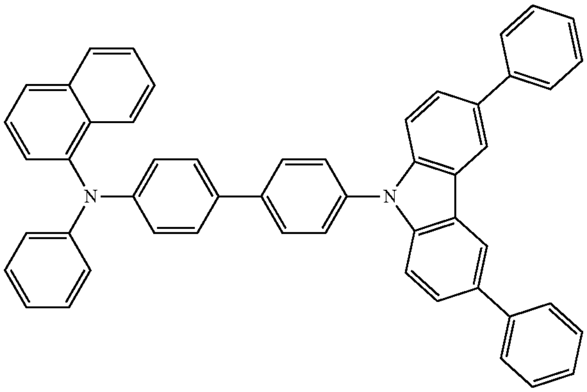
A-9
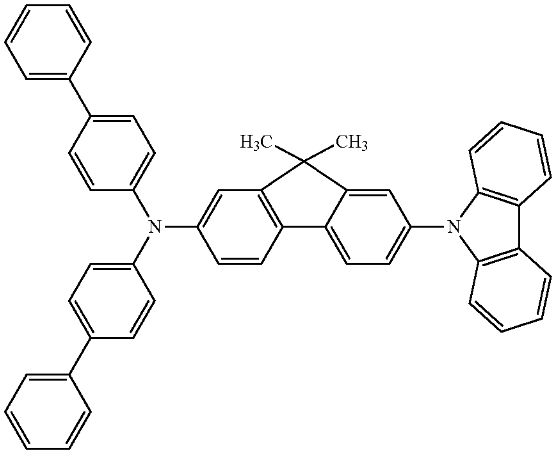

-continued
A-10
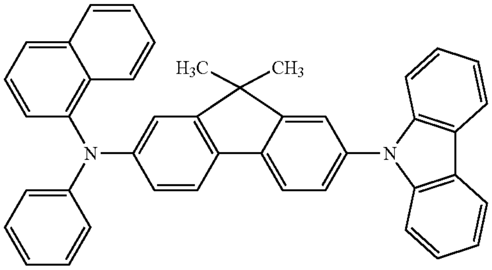
A-11
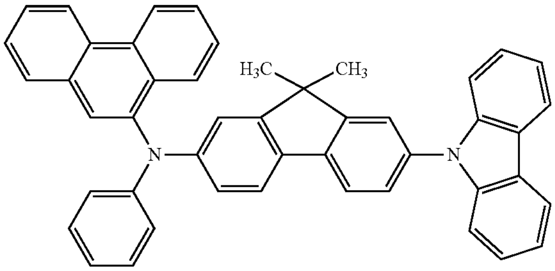
A-12
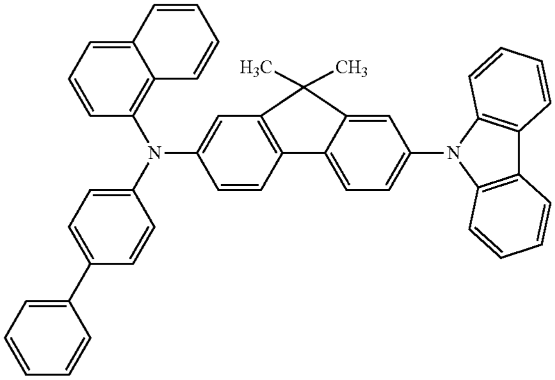
A-13
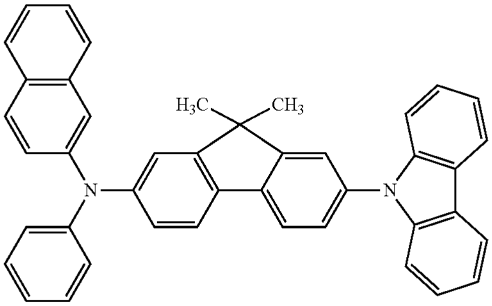
A-14
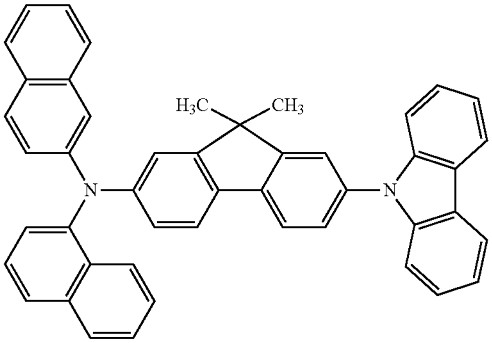

-continued
A-15
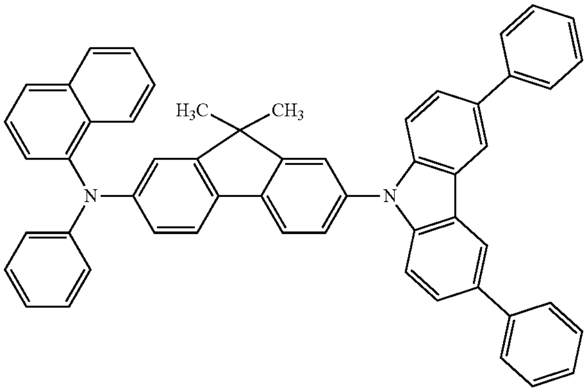
A-16
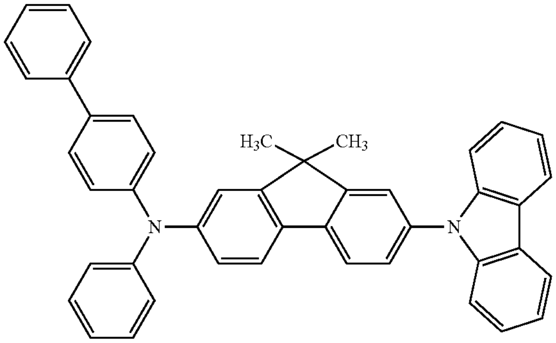
A-17
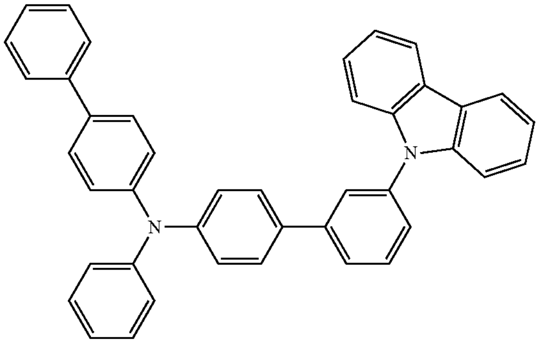
A-18
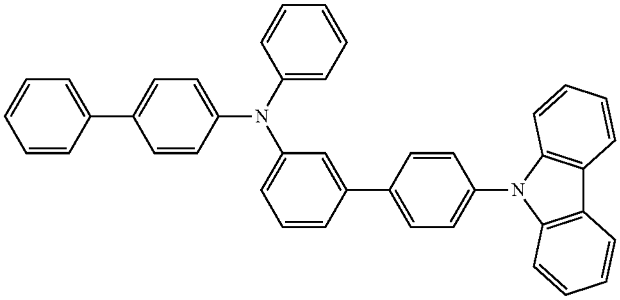
A-19
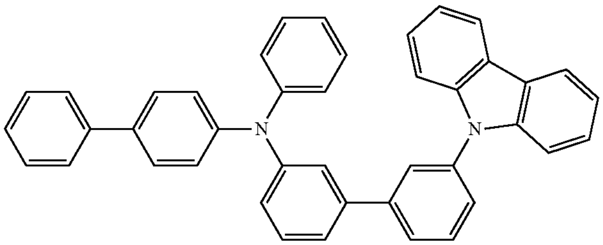

-continued
A-20
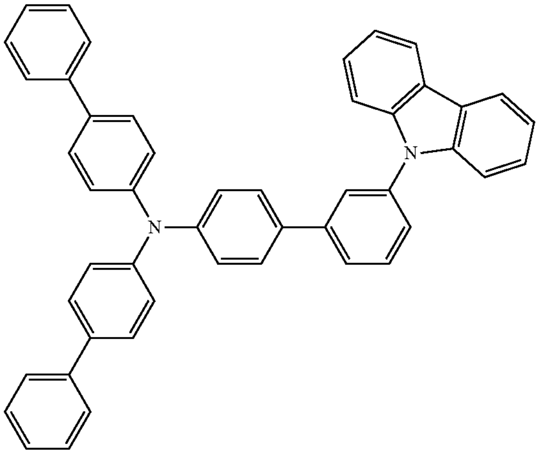
A-21
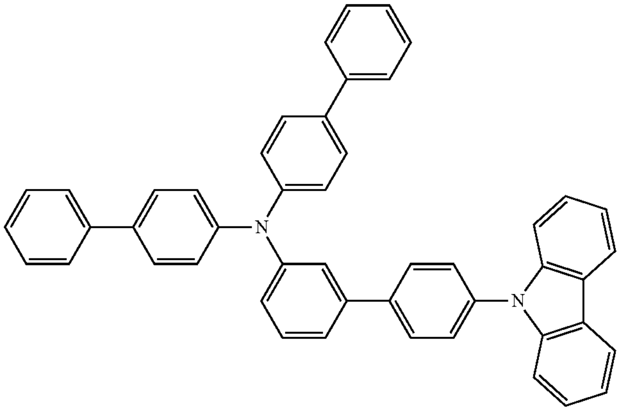
A-22
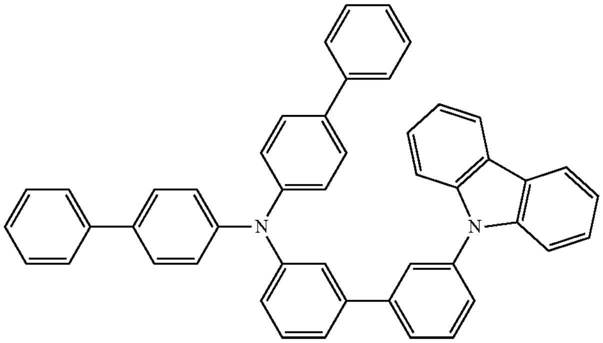
A-25
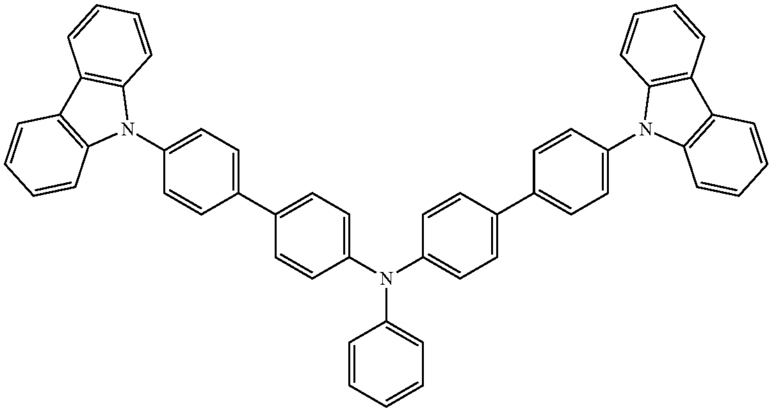

-continued
A-26
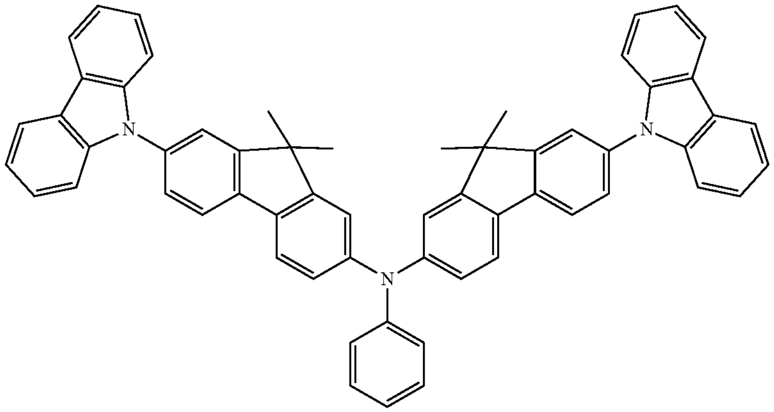
A-27
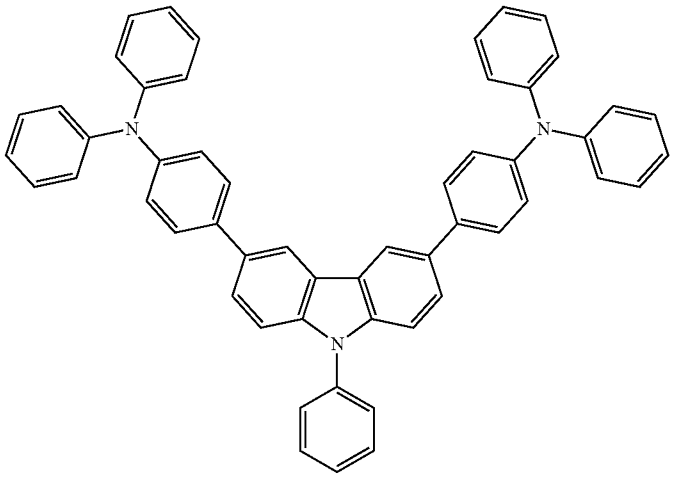
A-28
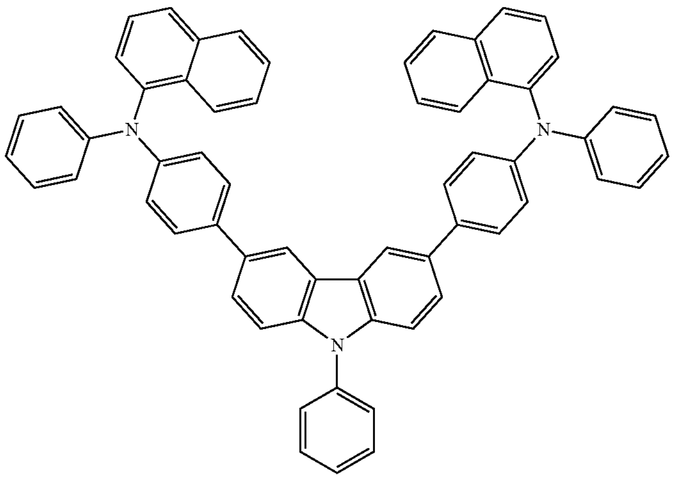

A-35
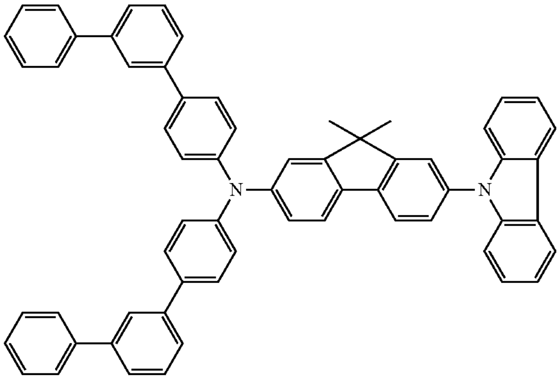
A-36
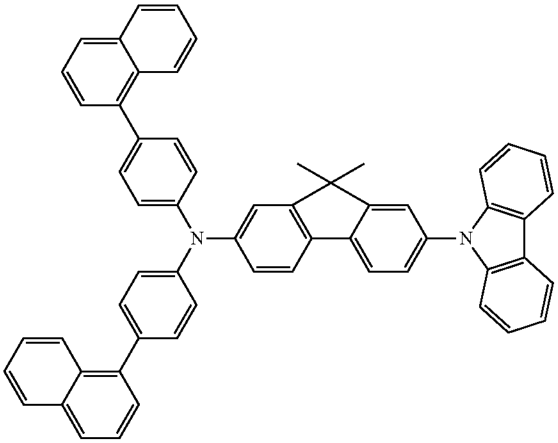
A-37
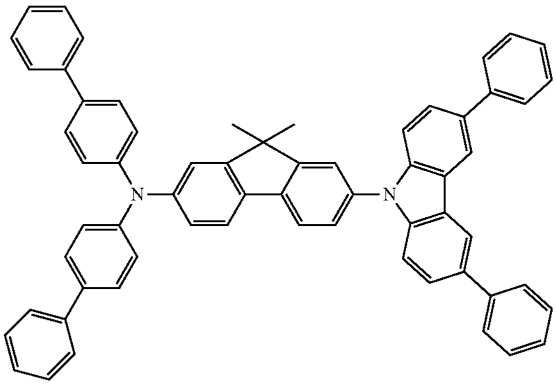
A-38
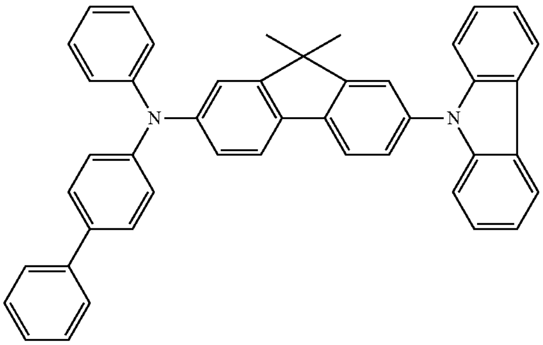
A-39
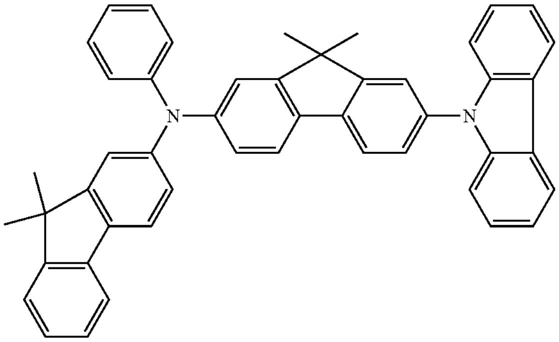
A-40
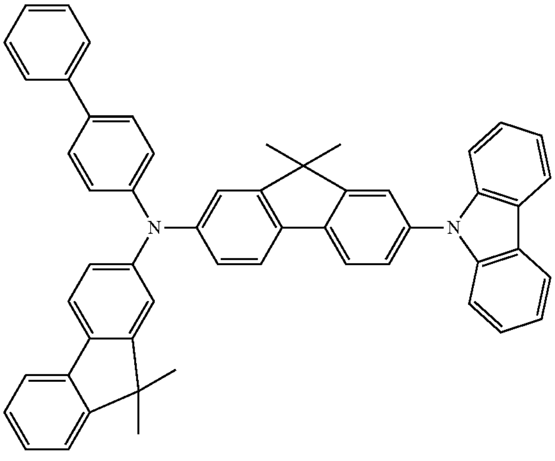

-continued
A-41
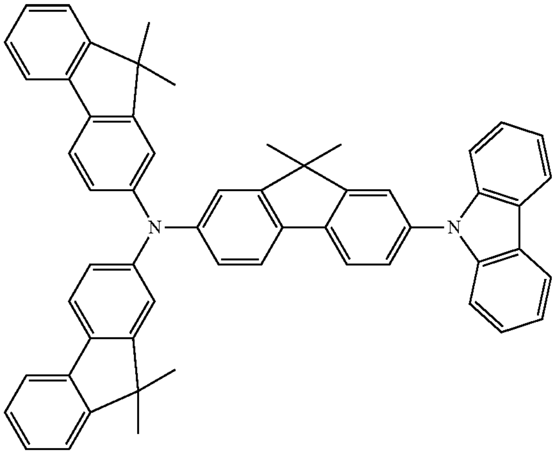
A-42
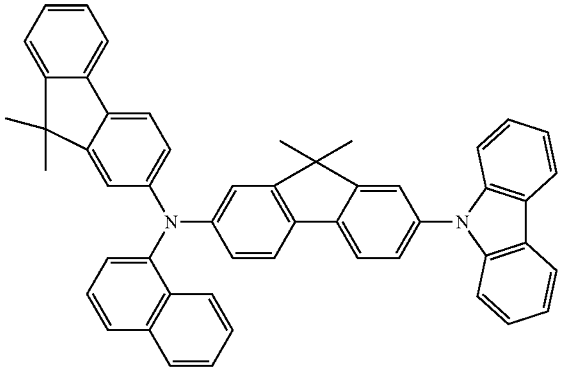
A-45
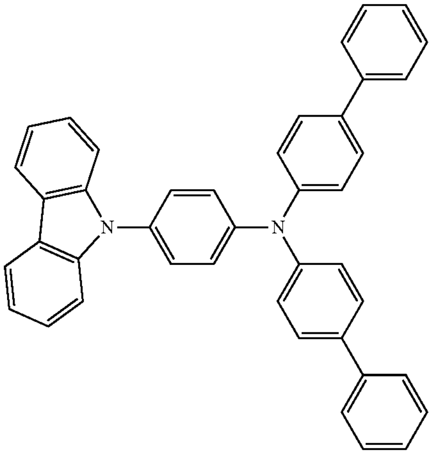
A-47
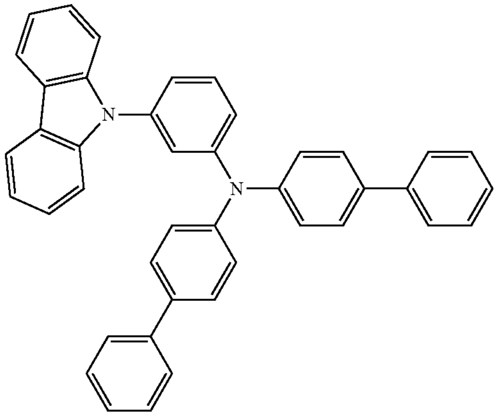
A-48
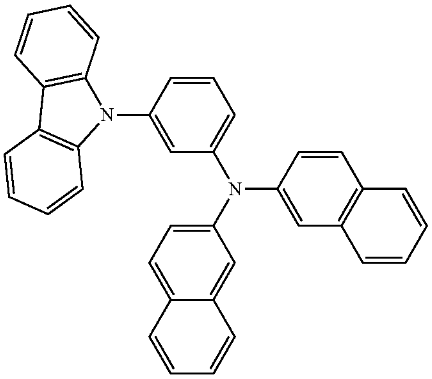
A-50
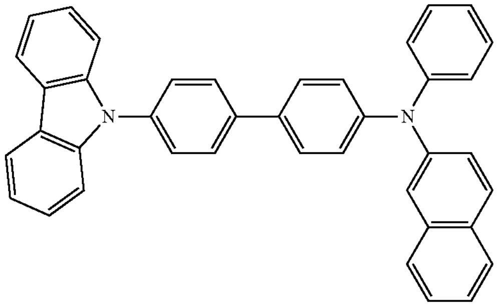

-continued
A-51
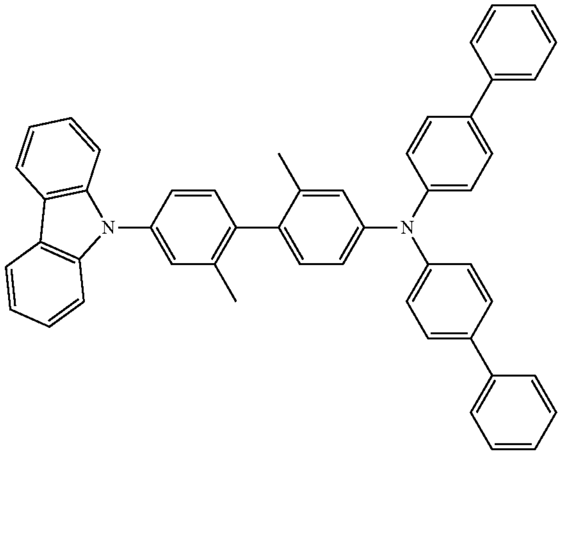
A-53
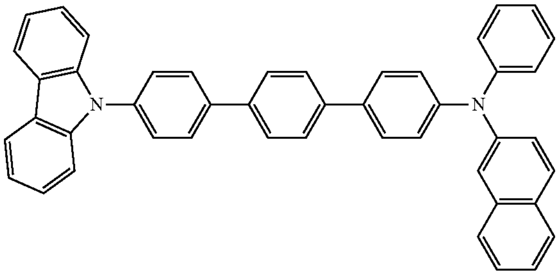
A-54
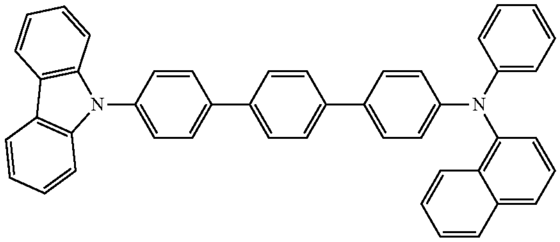
B-1
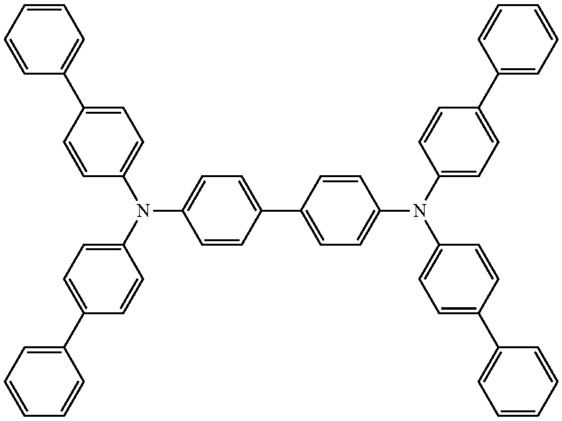
B-2
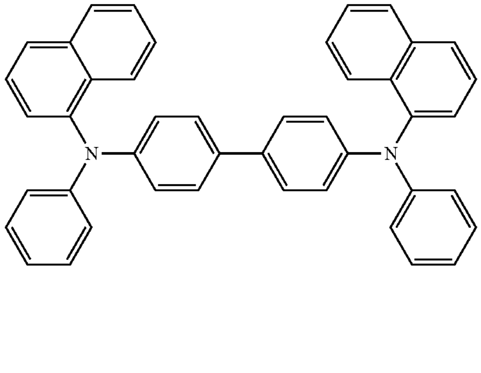
B-3
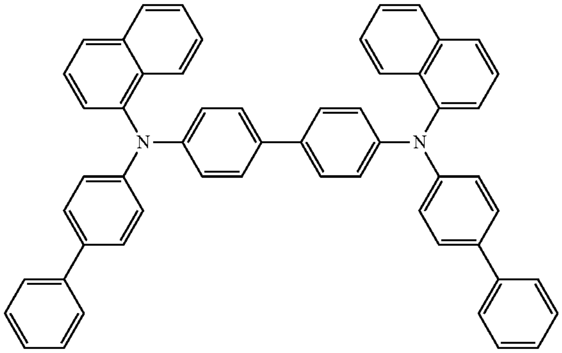

-continued
B-4
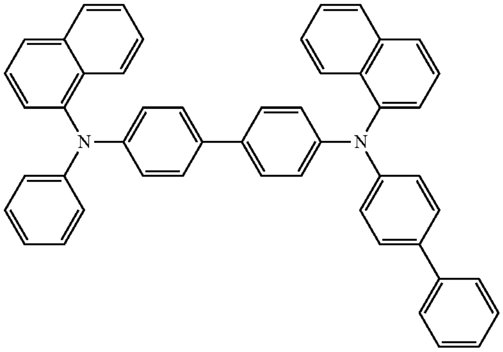
B-5
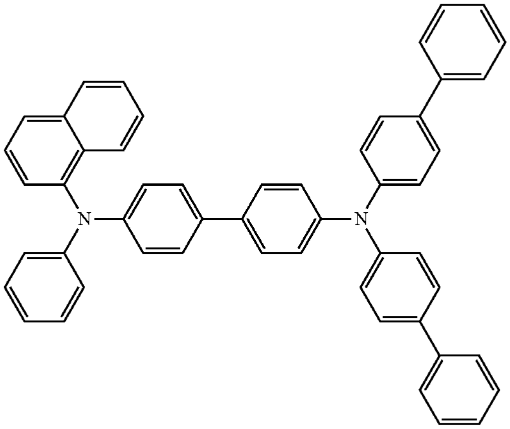
B-6
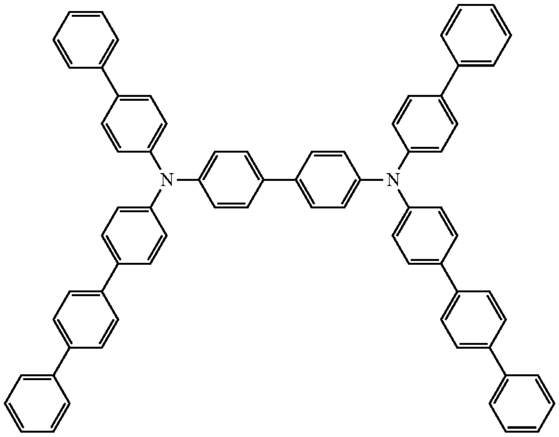
B-7
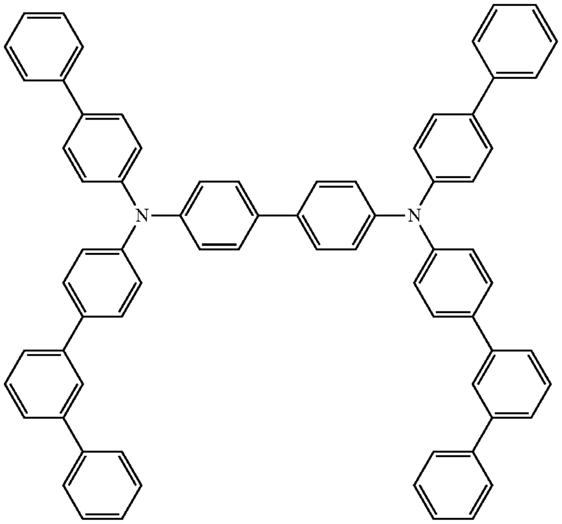
B-8
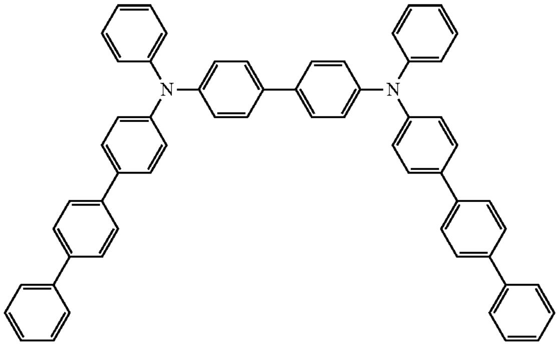
B-9
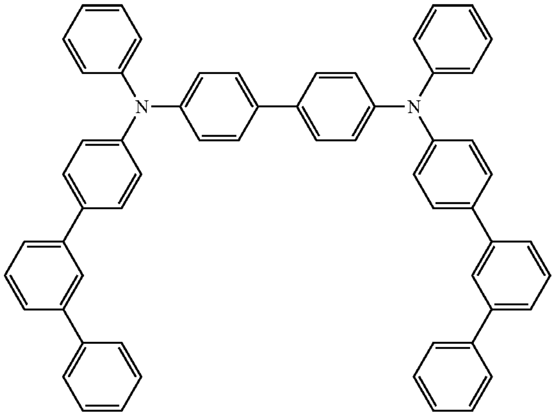

-continued
B-10
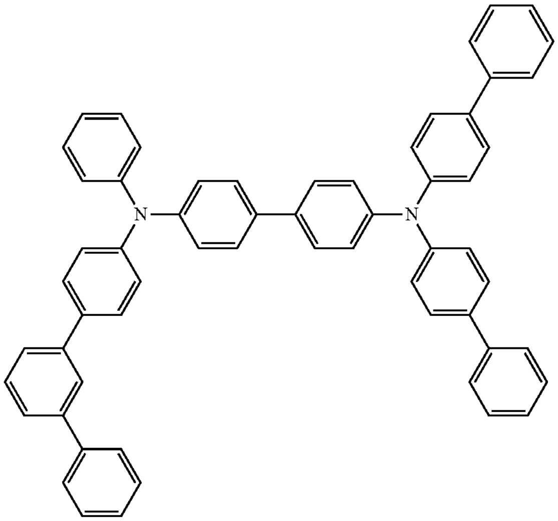
B-11
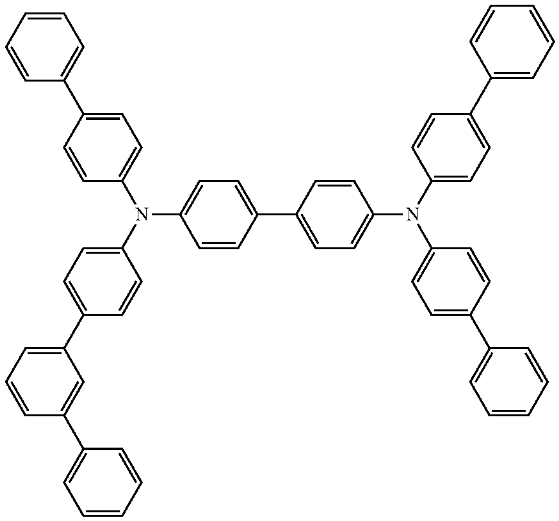
B-12
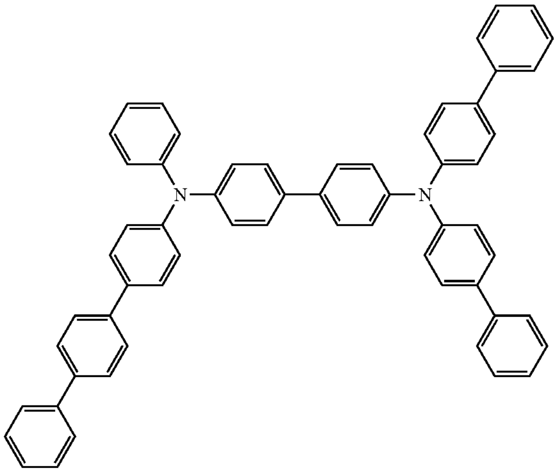
B-13
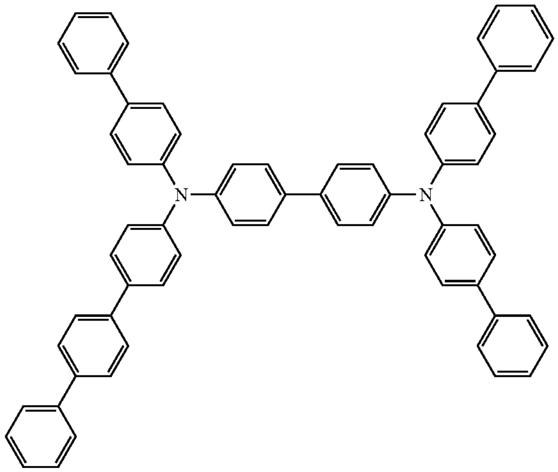
B-14
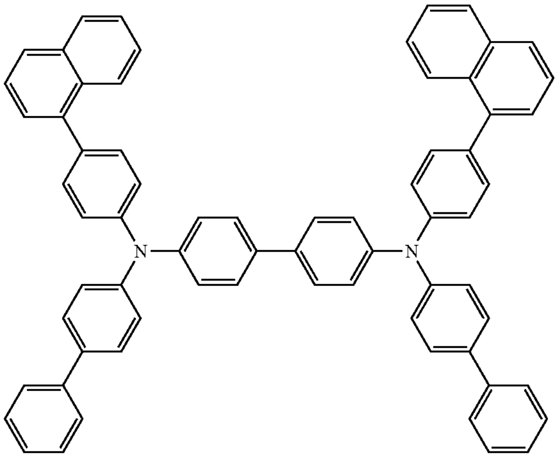
B-15
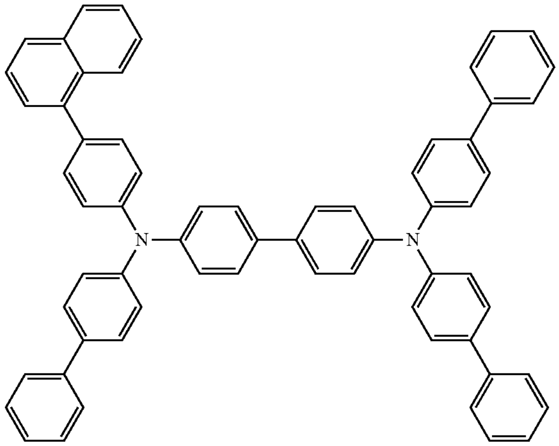

-continued
B-16
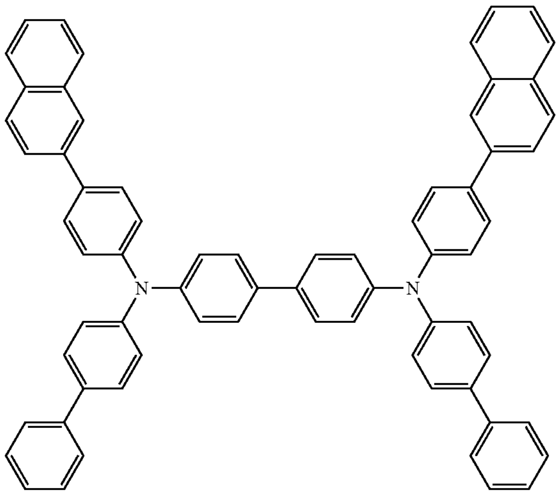
B-17
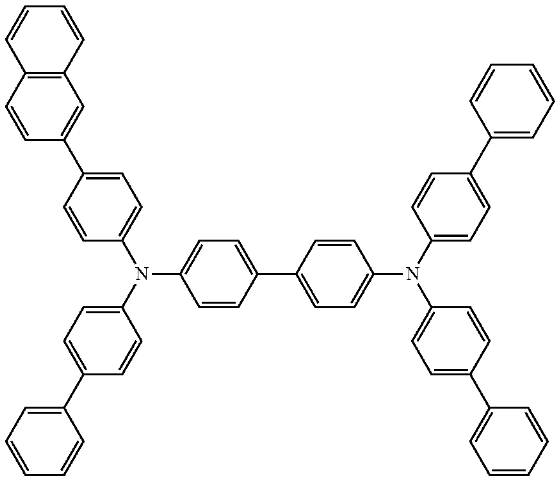
B-18
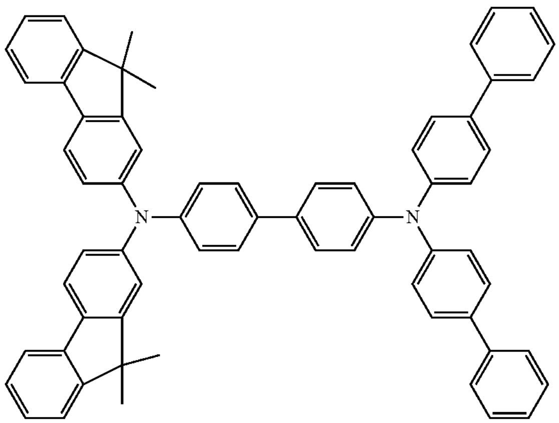
B-19
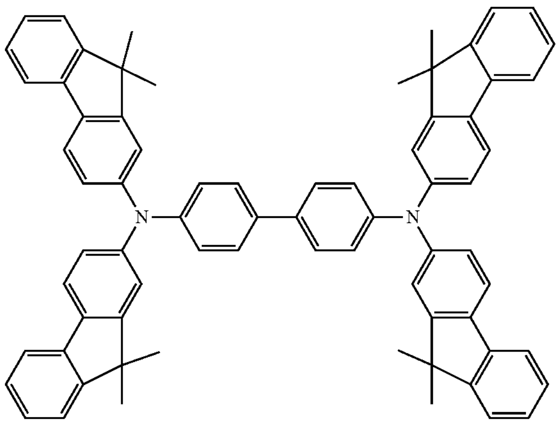
B-20
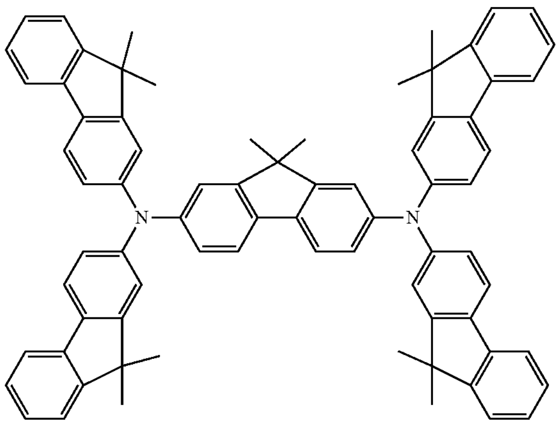
B-21
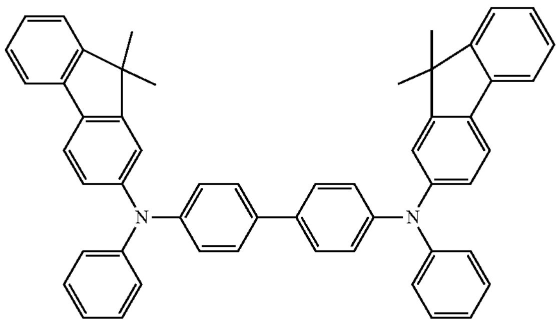

-continued
B-22
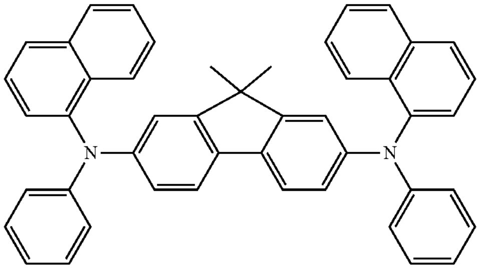
B-23
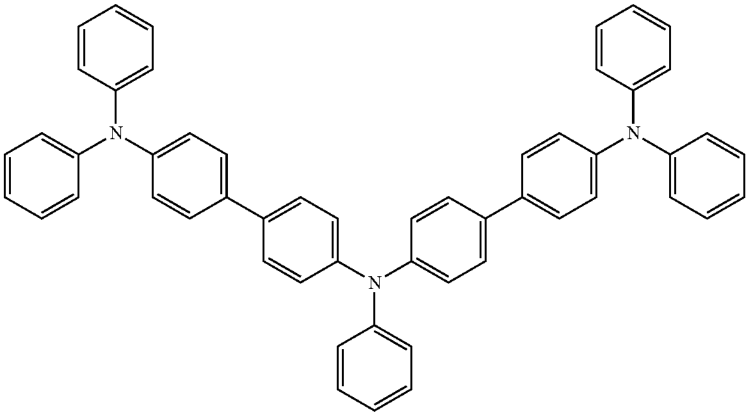
B-24
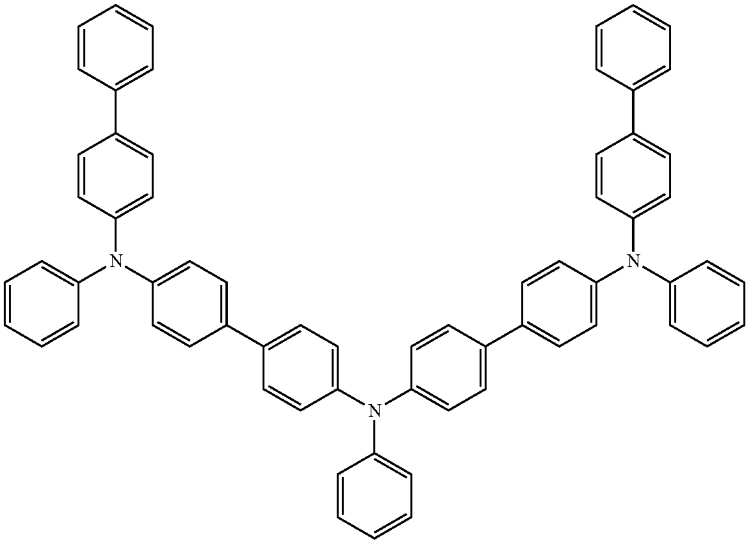
B-25
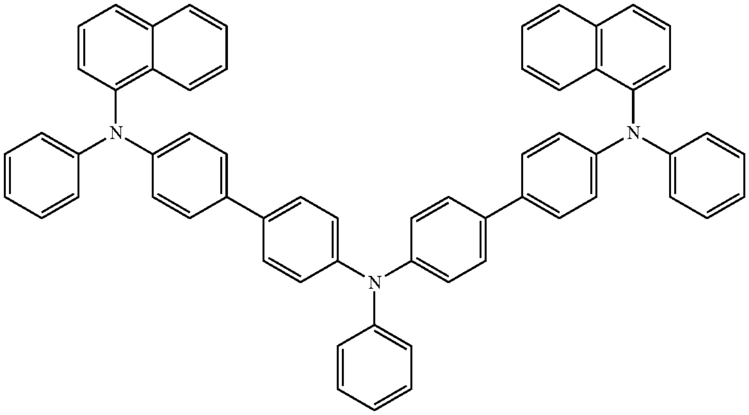

-continued
B-26
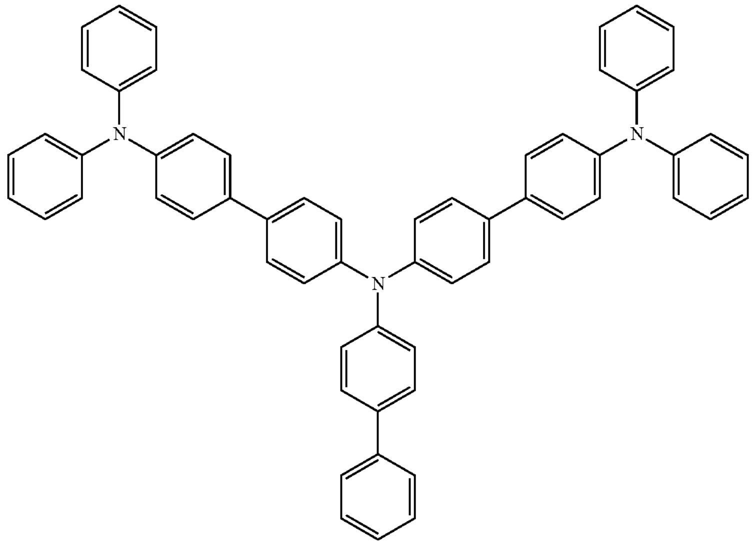
B-27
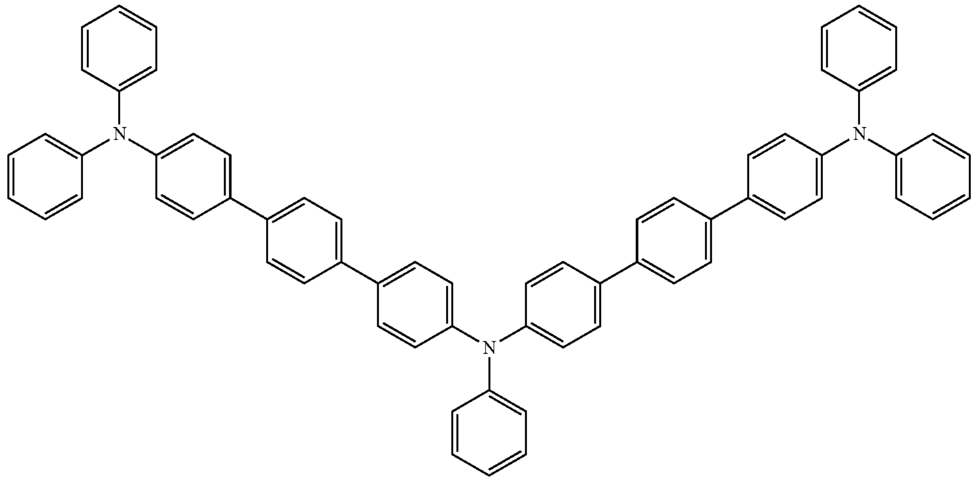
B-33
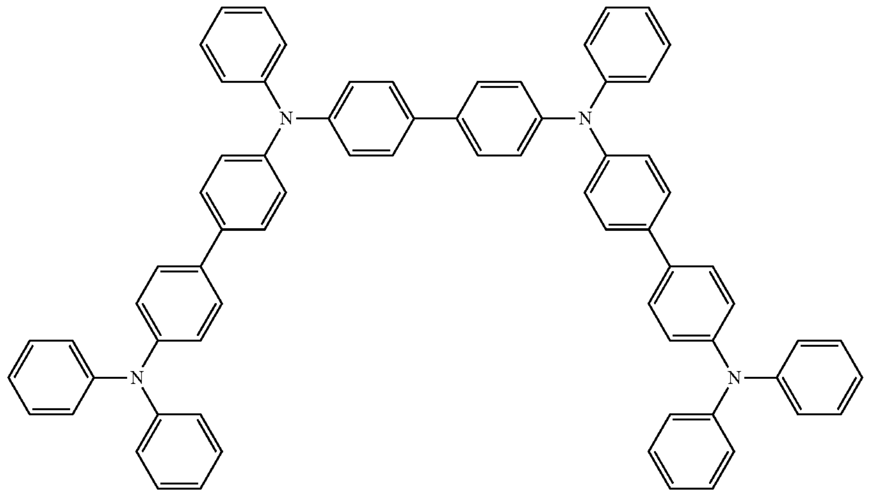

-continued
B-34
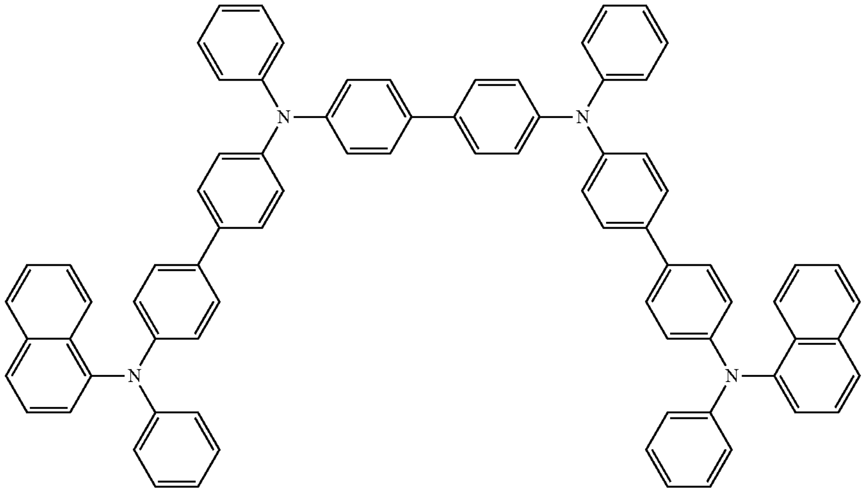
B-35
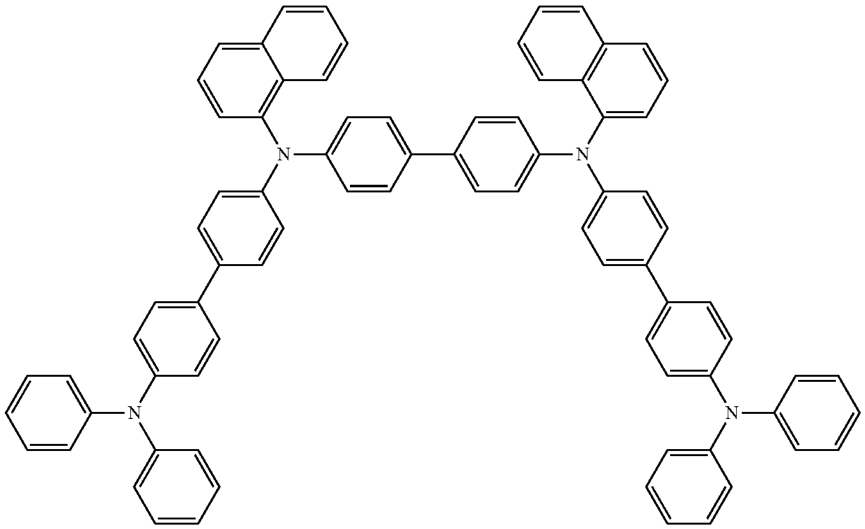
B-39
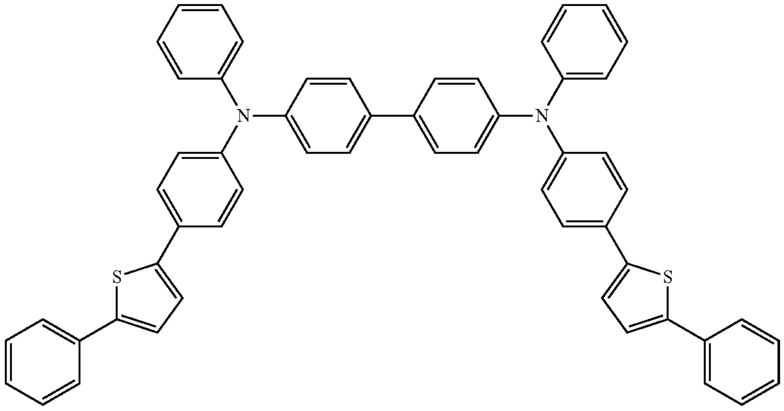

-continued
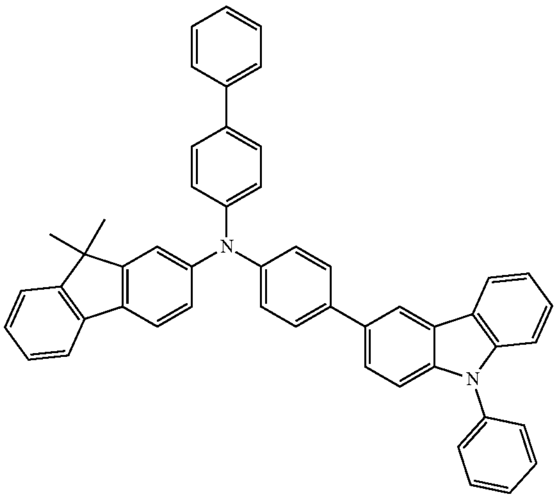
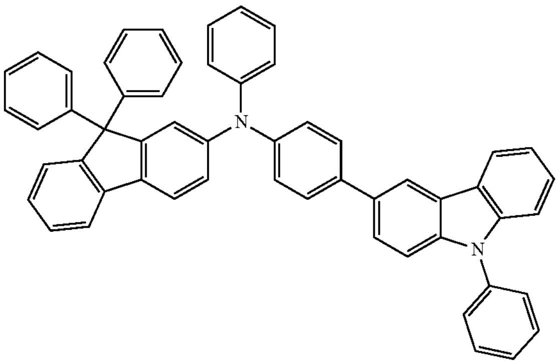
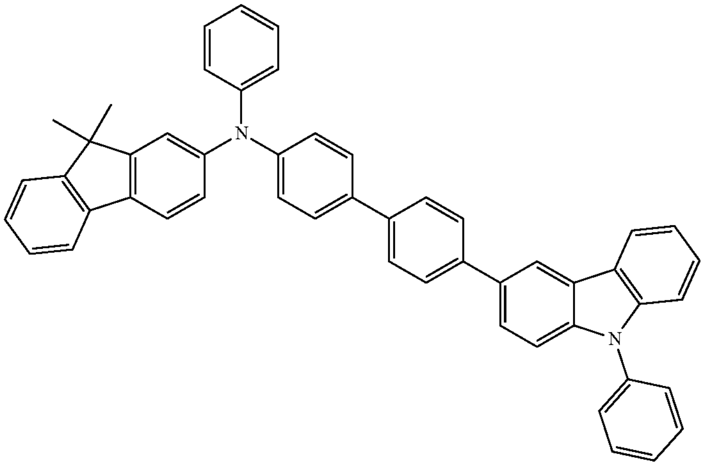
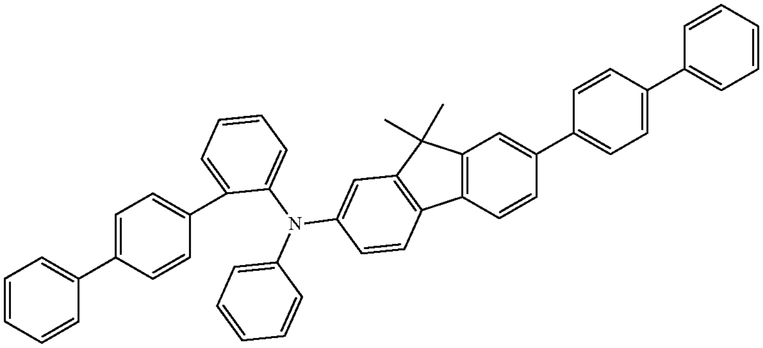
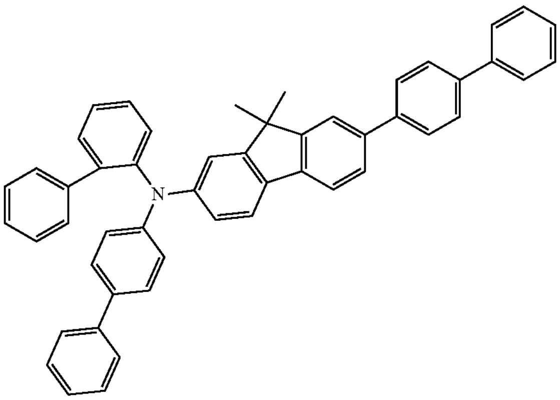
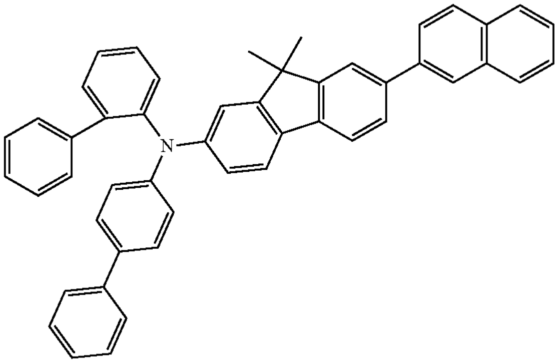

-continued
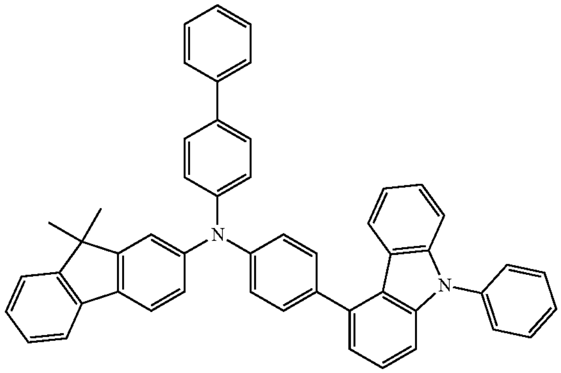
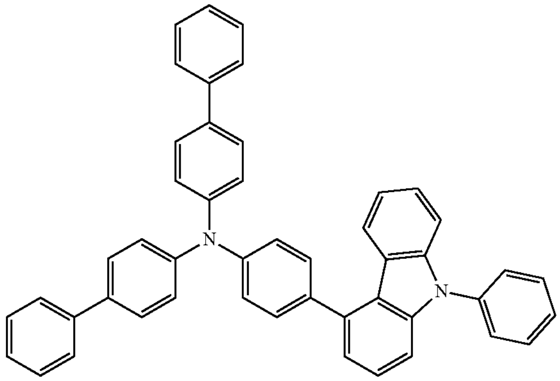
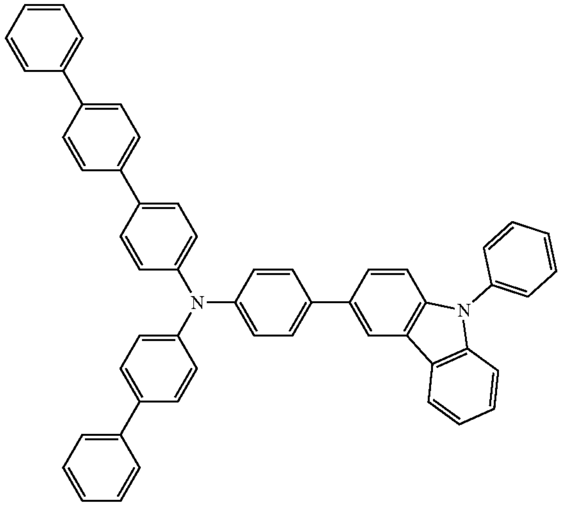
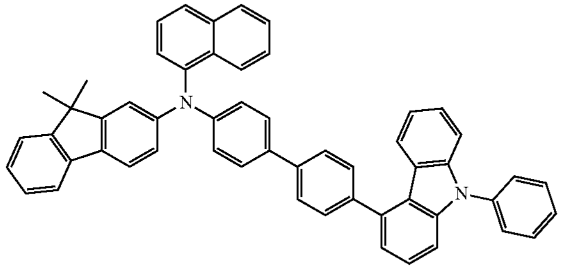
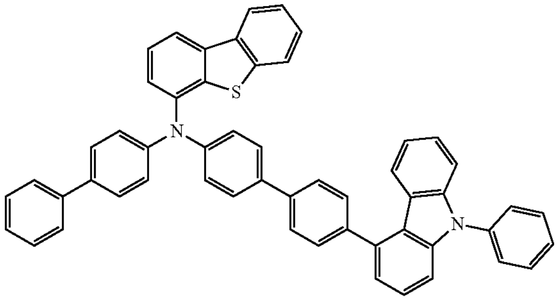
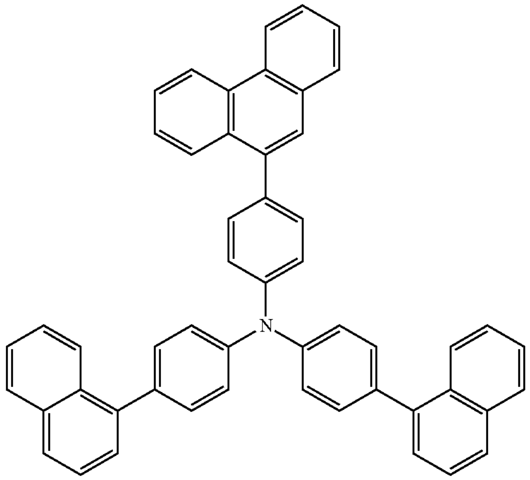

-continued
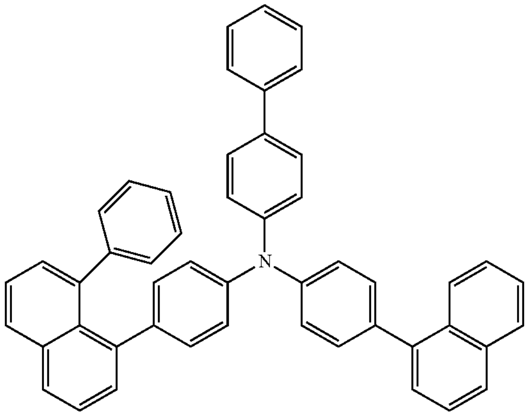
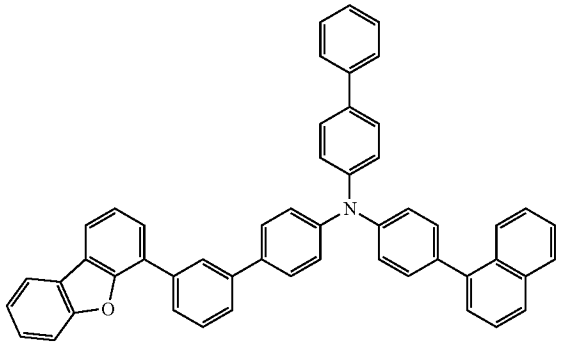
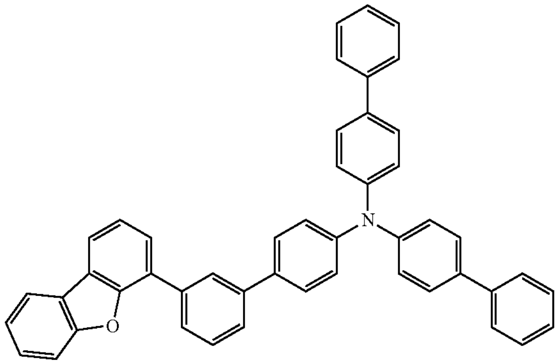
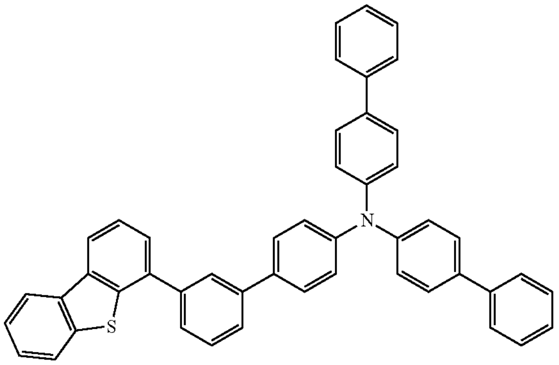
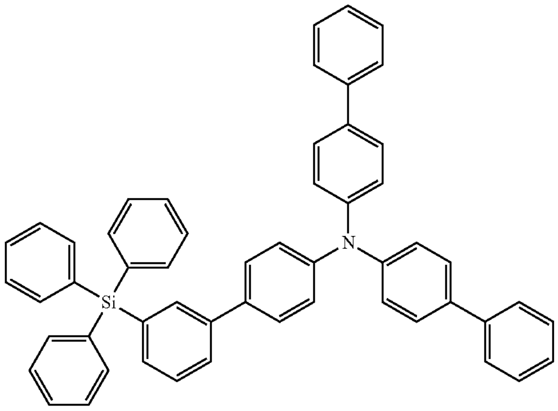
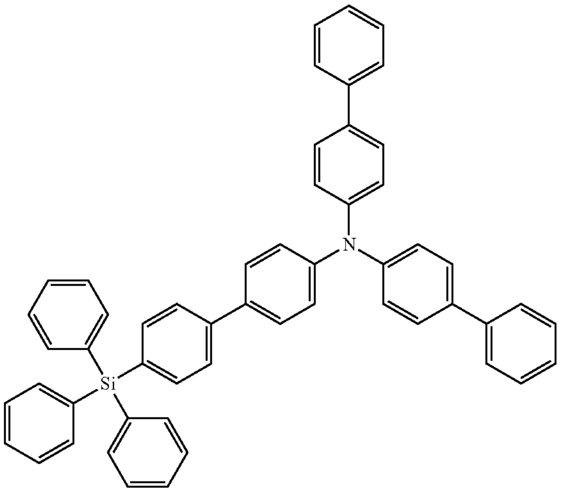
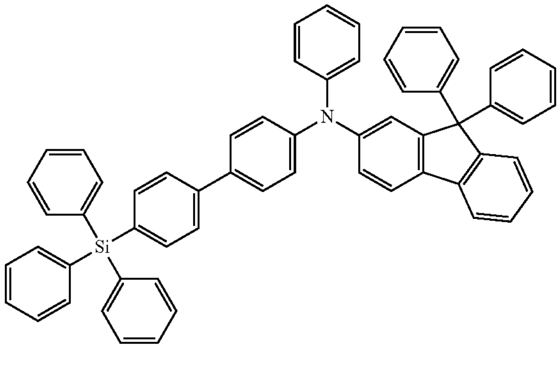
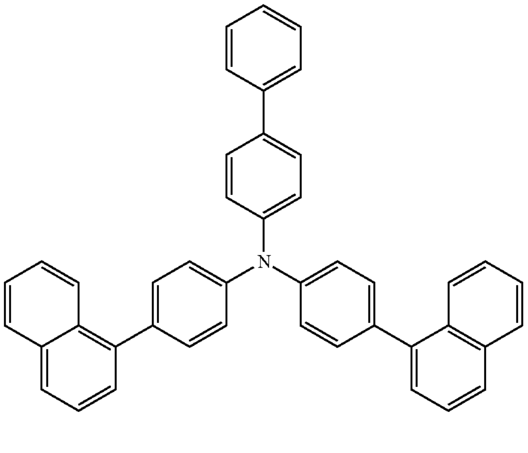

-continued
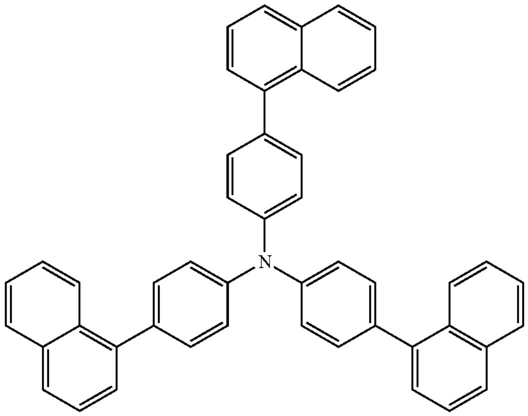
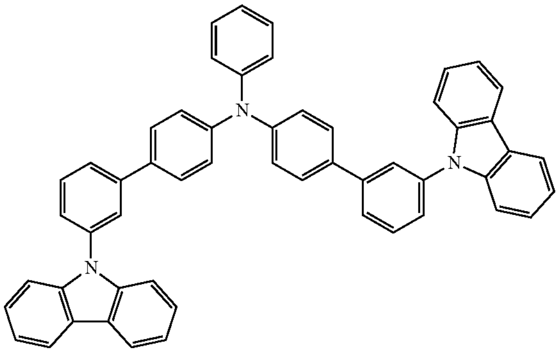
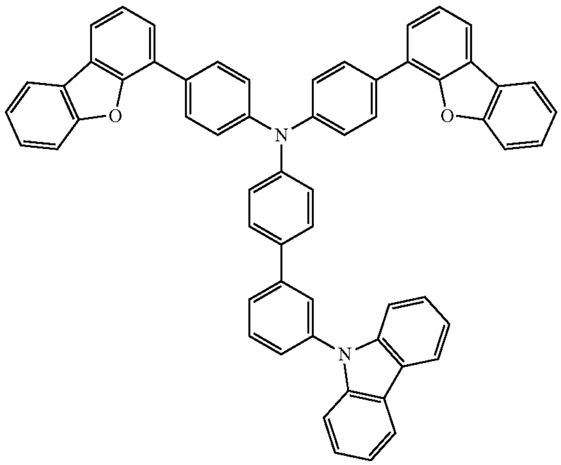
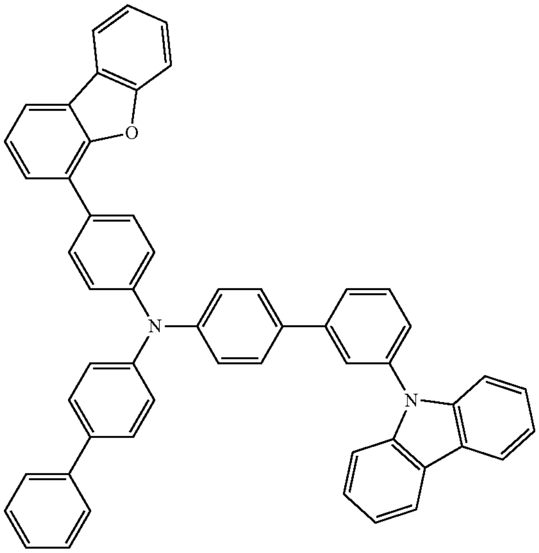
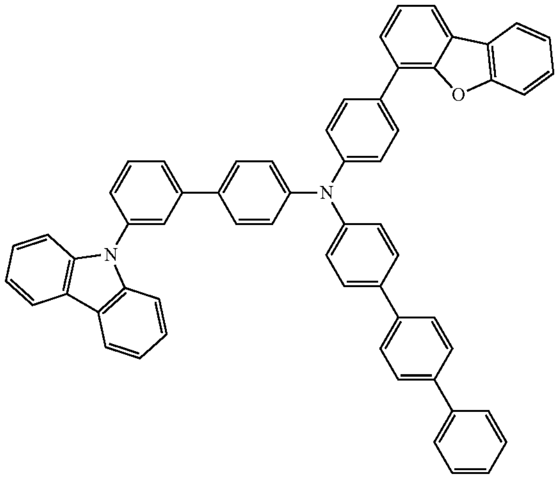
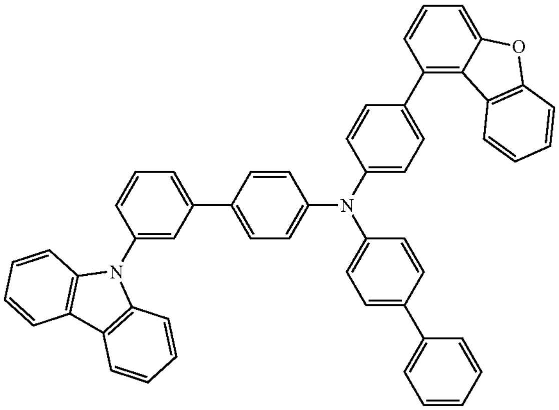

-continued
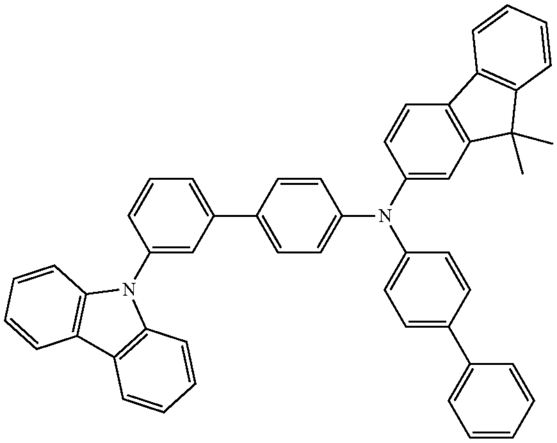
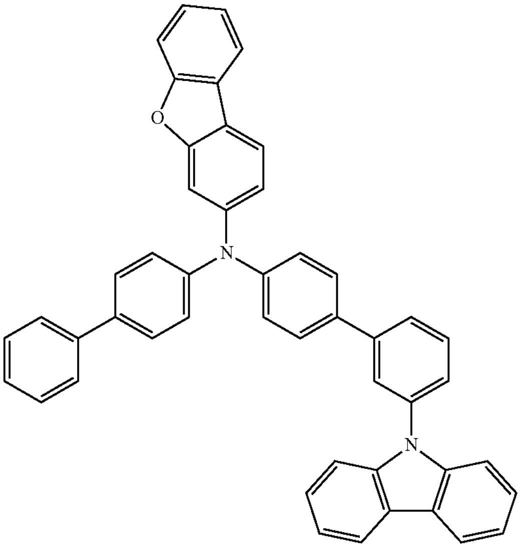
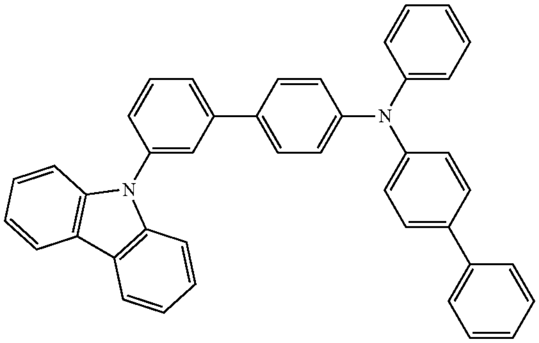
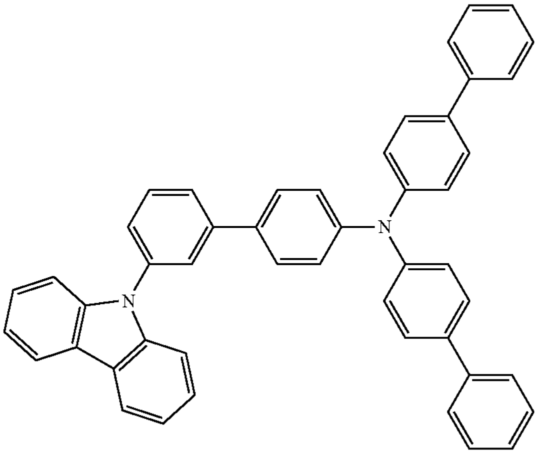
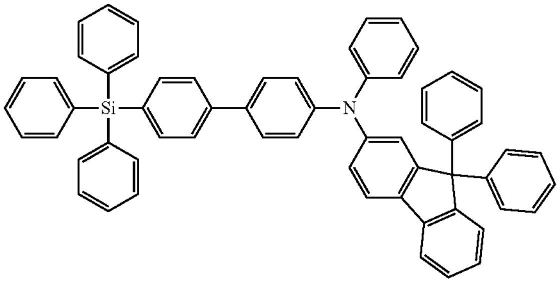
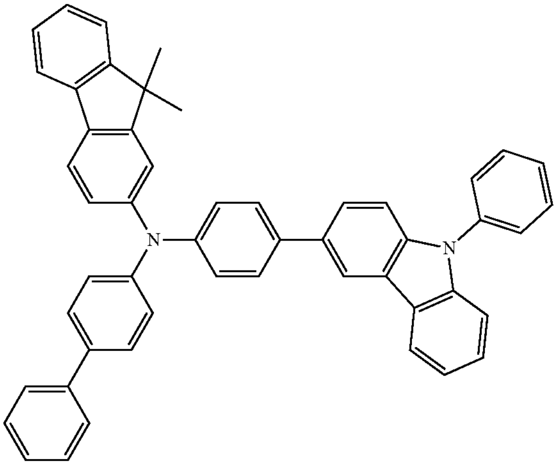

-continued
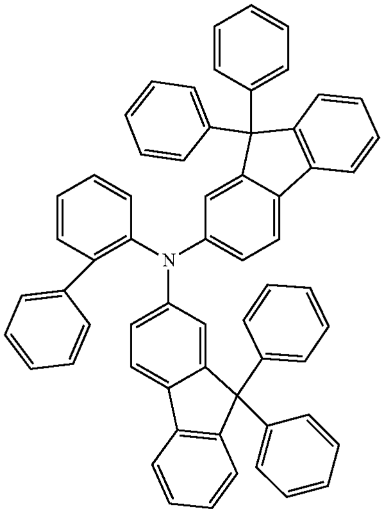
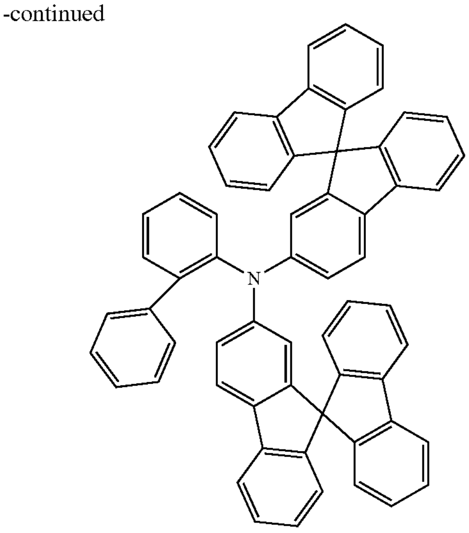
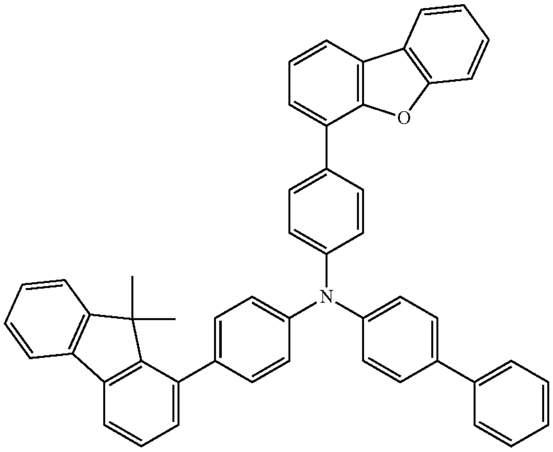
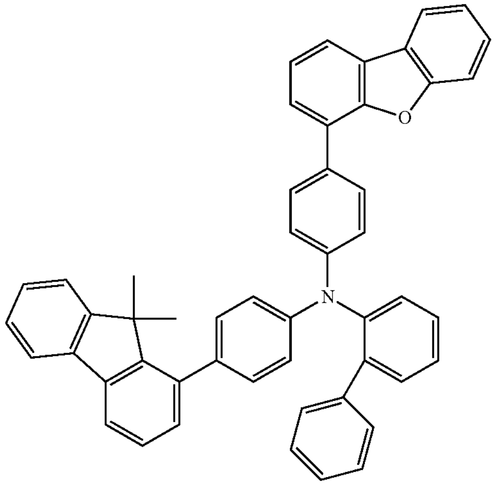
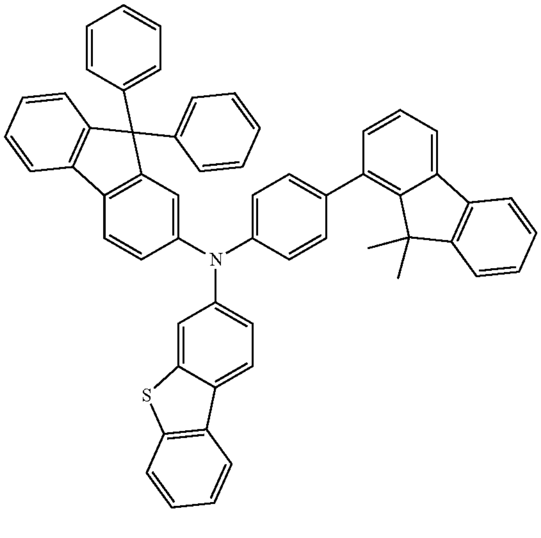
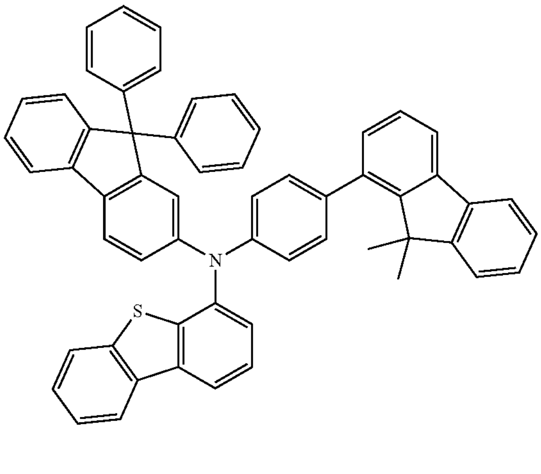

-continued
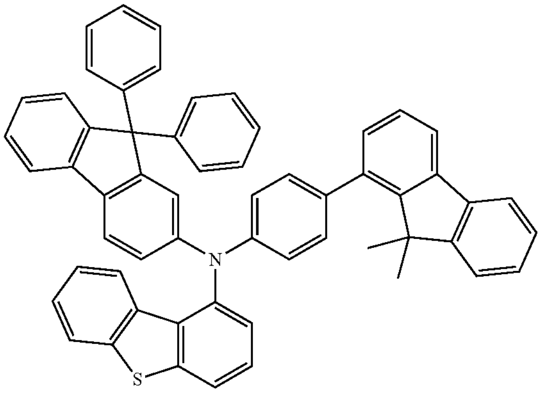
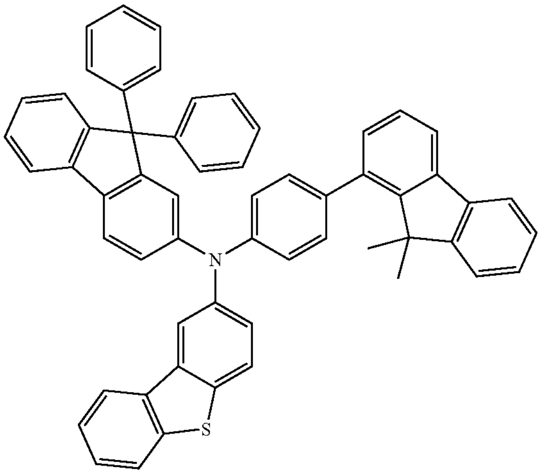
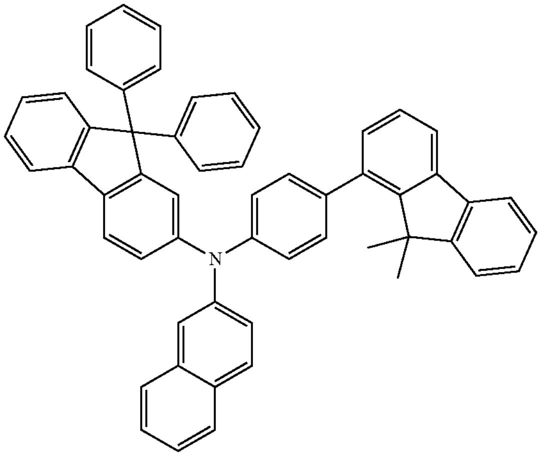
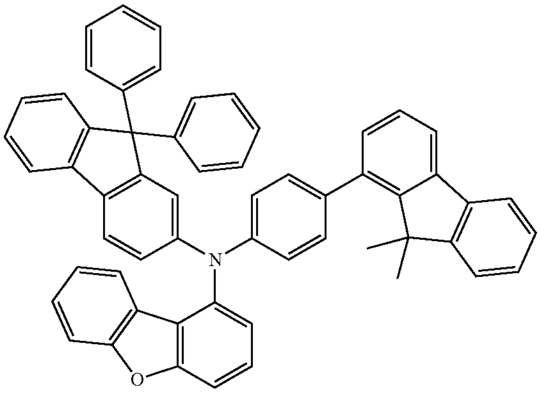
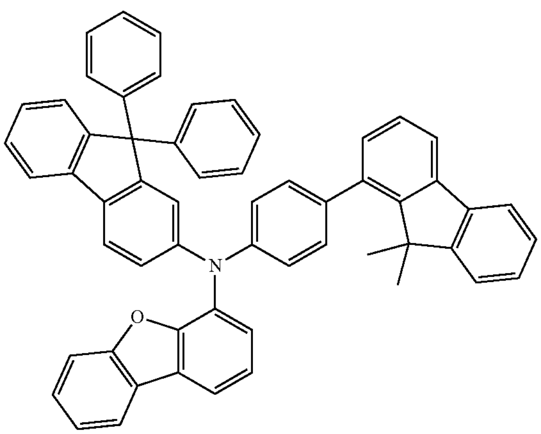
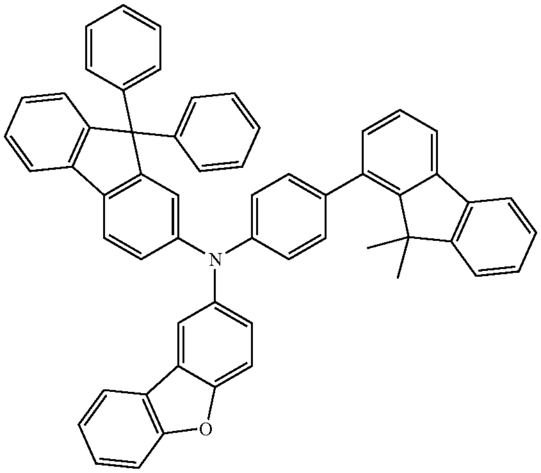

-continued
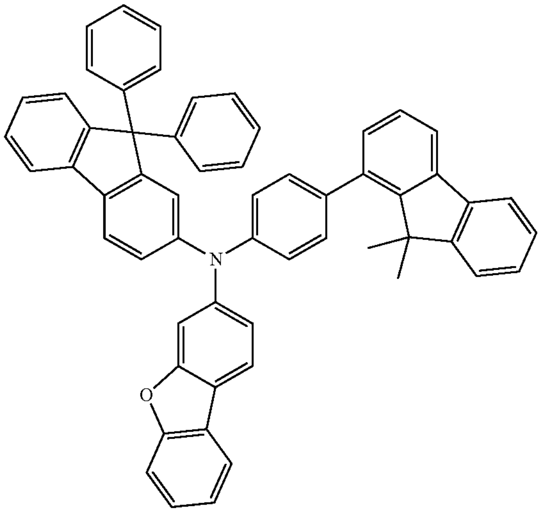
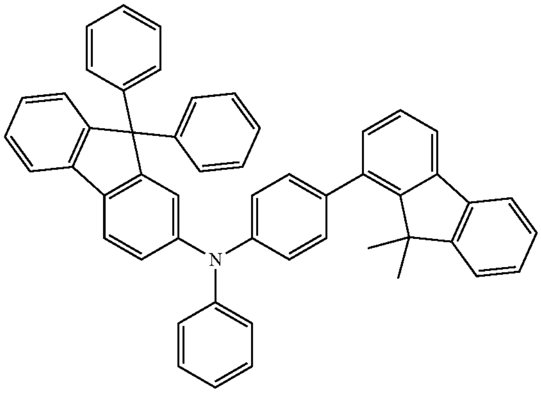
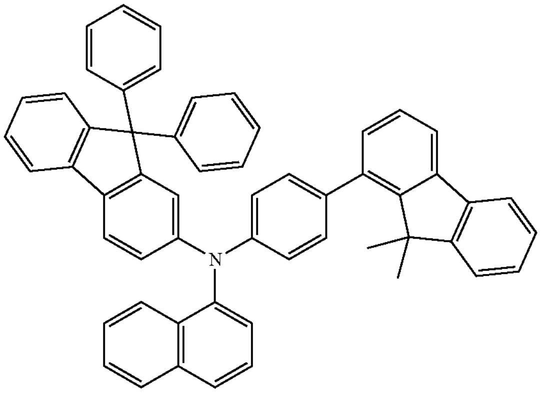
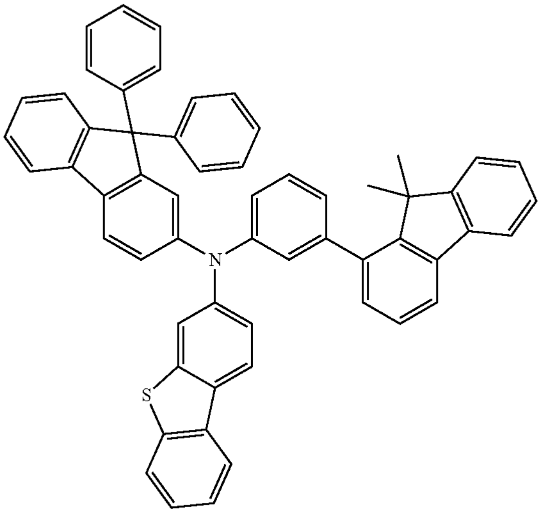
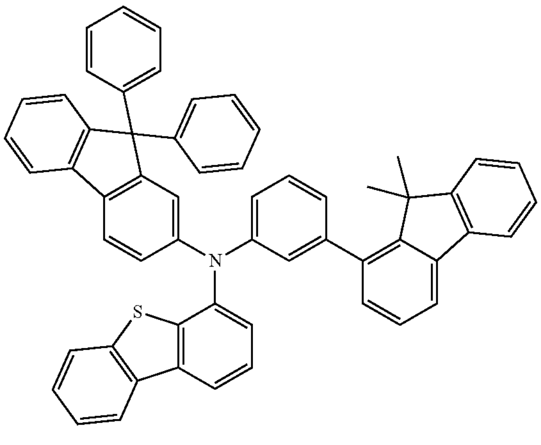
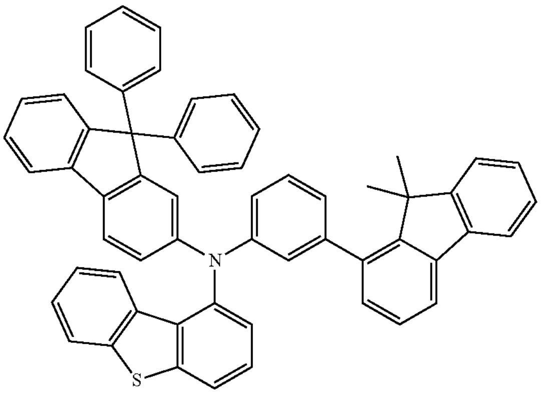

-continued
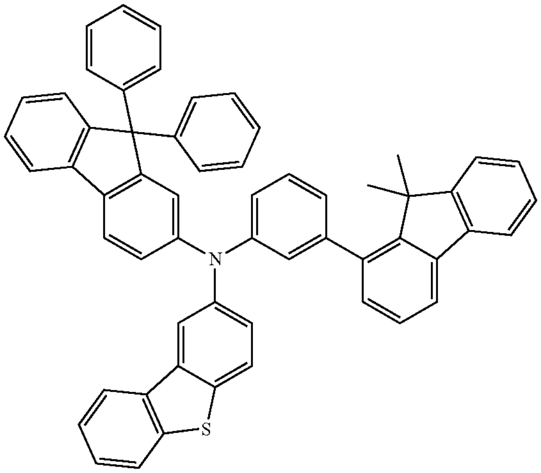
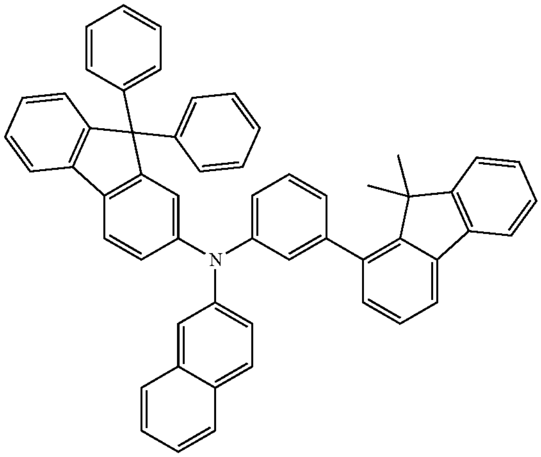
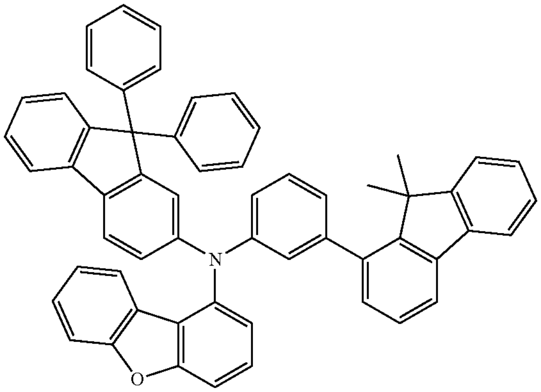
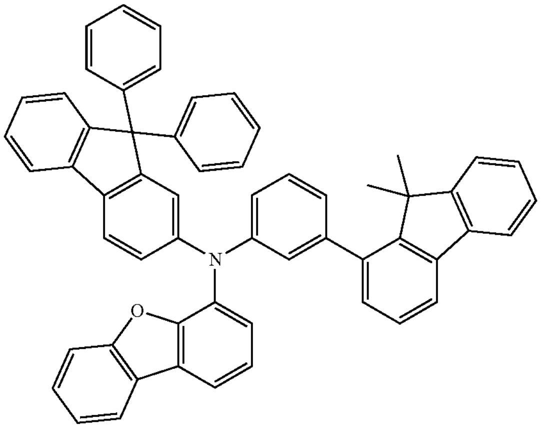
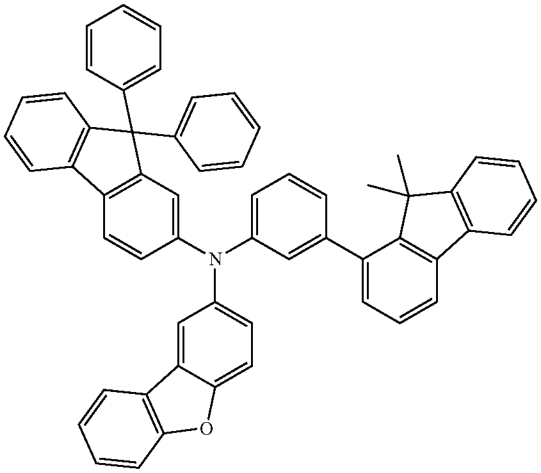
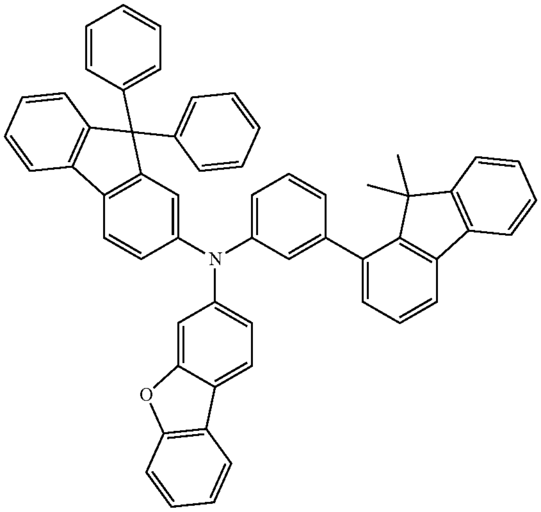

-continued
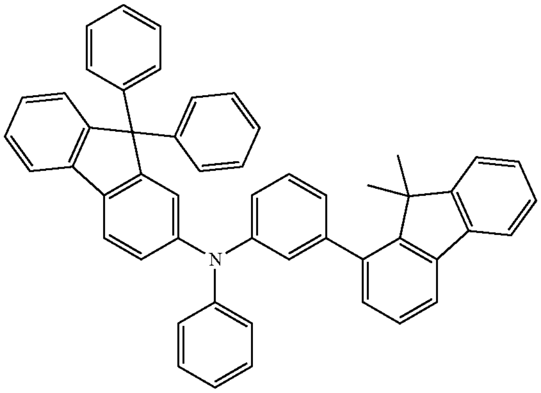
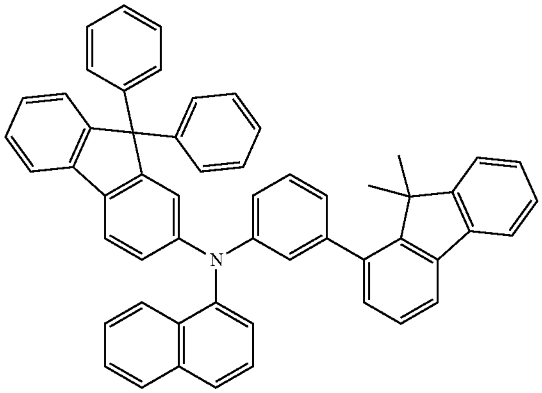
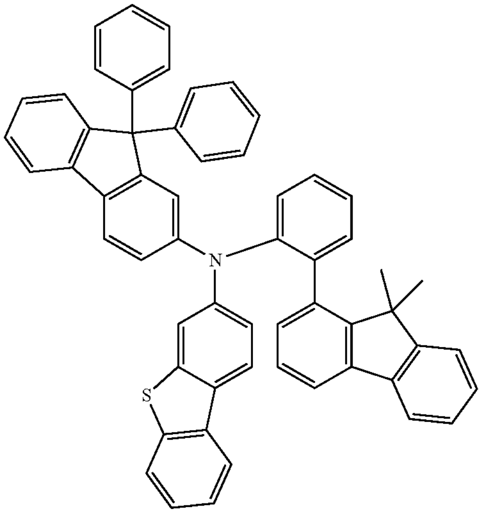
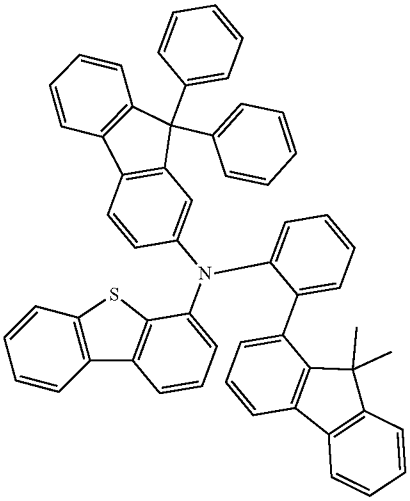
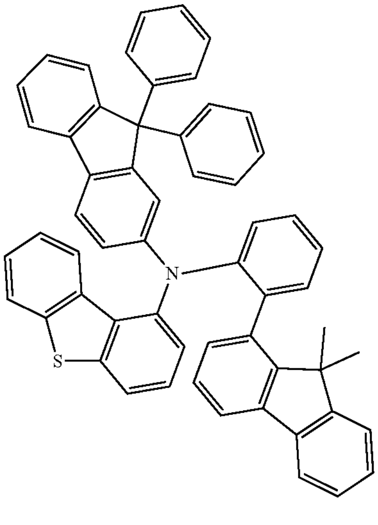
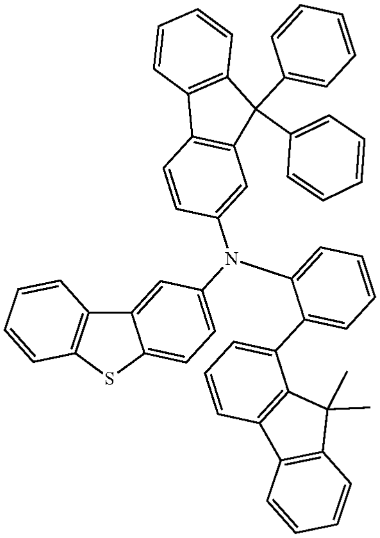

-continued
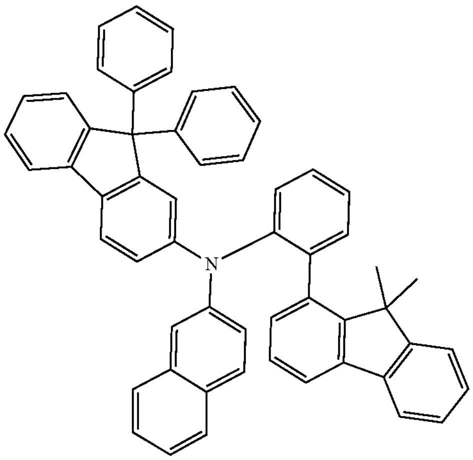
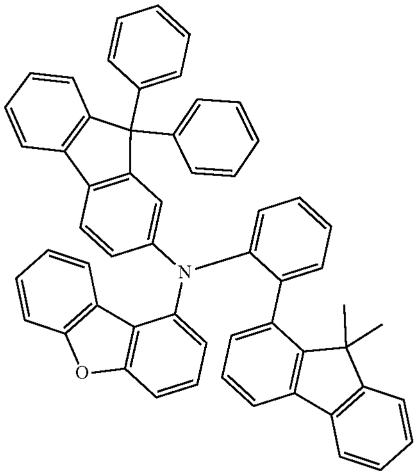
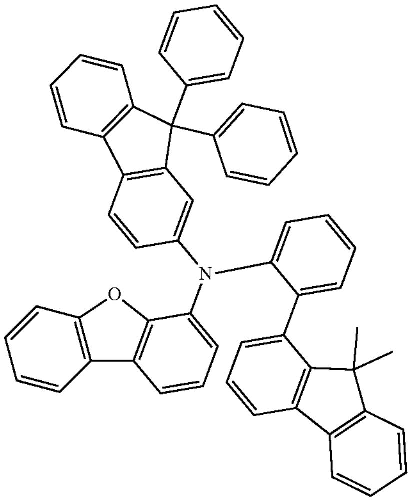
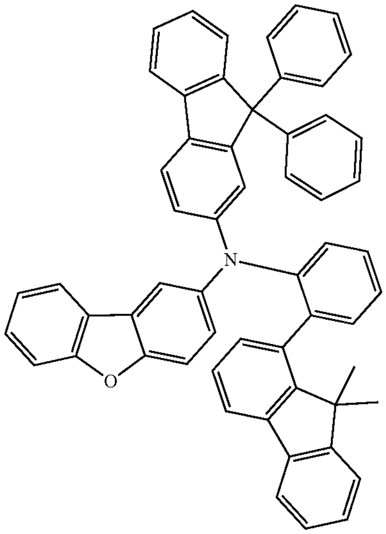
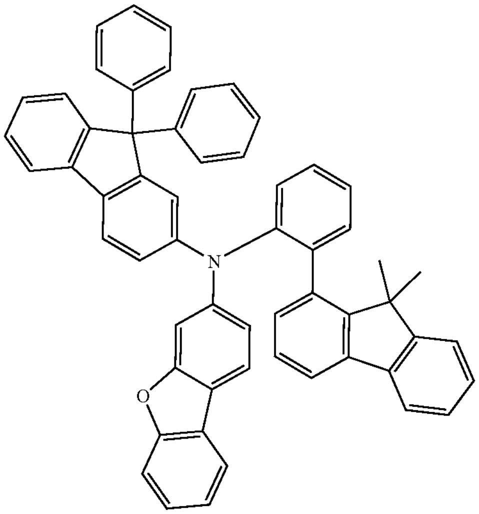
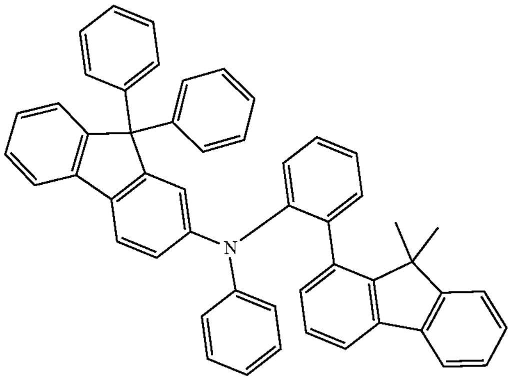

-continued
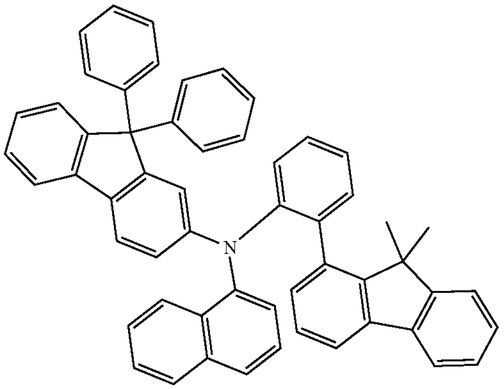
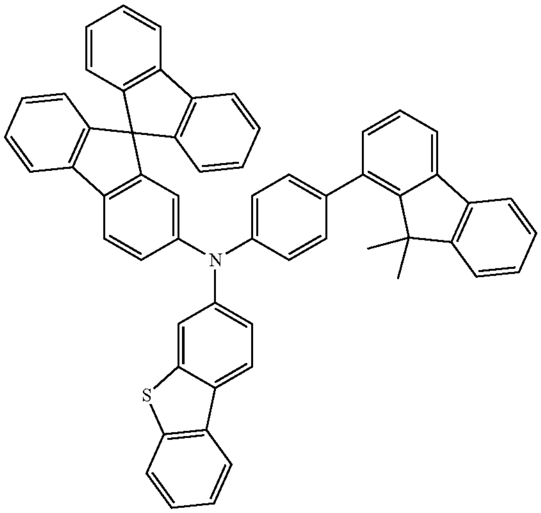
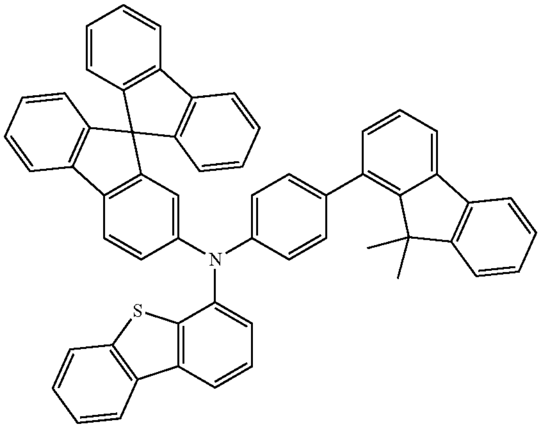
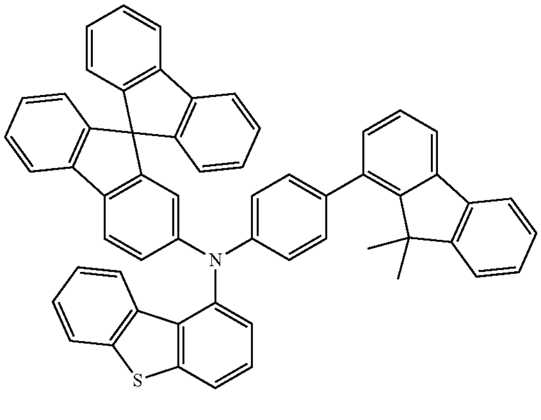
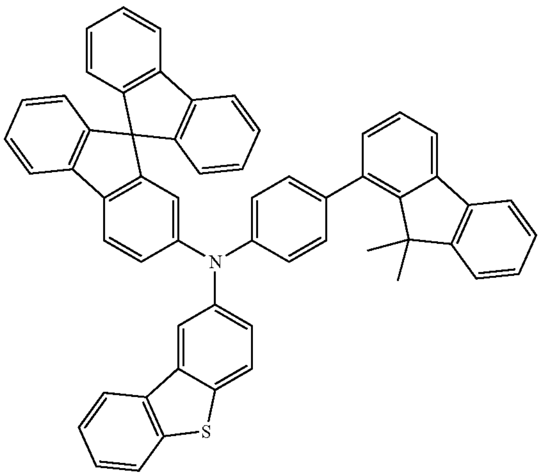
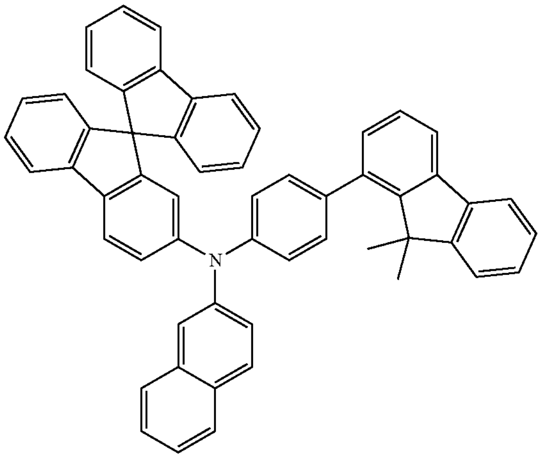

-continued
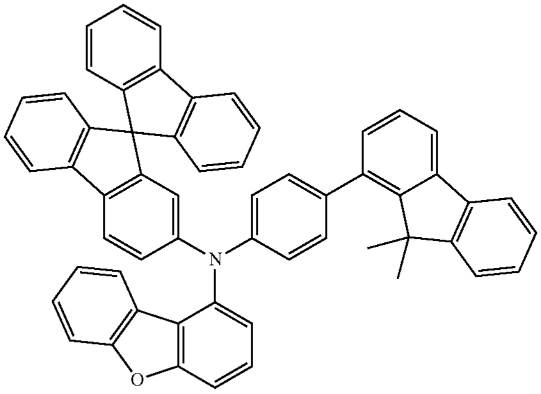
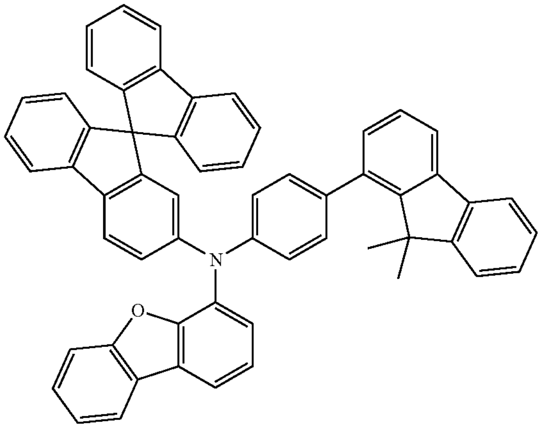
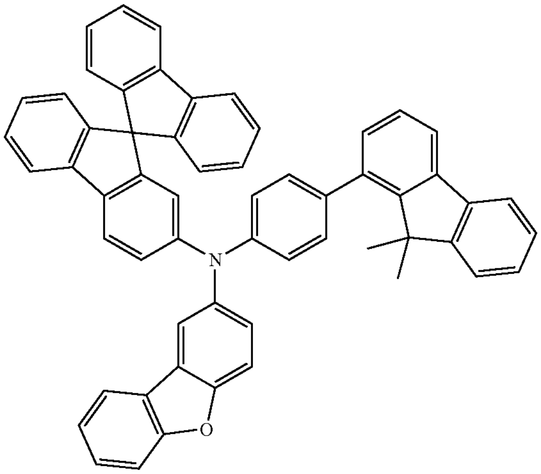
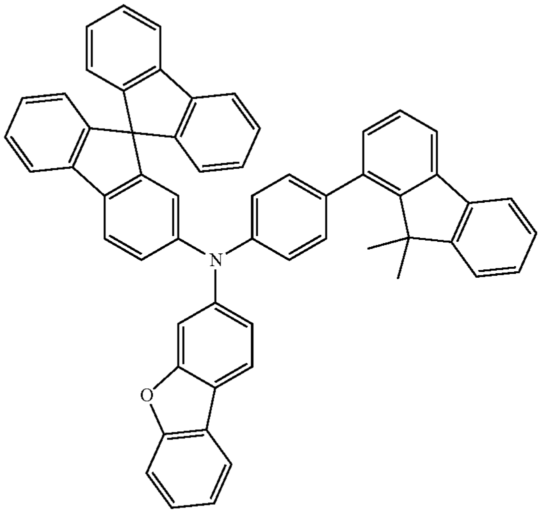
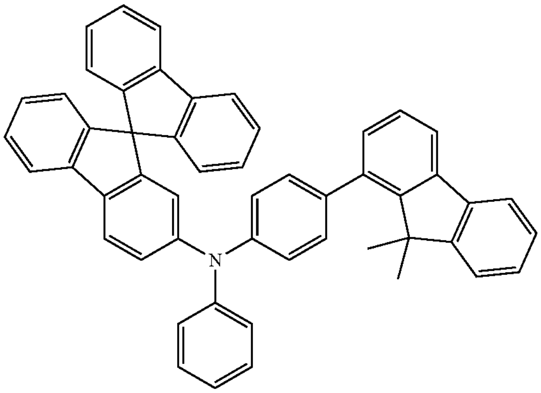
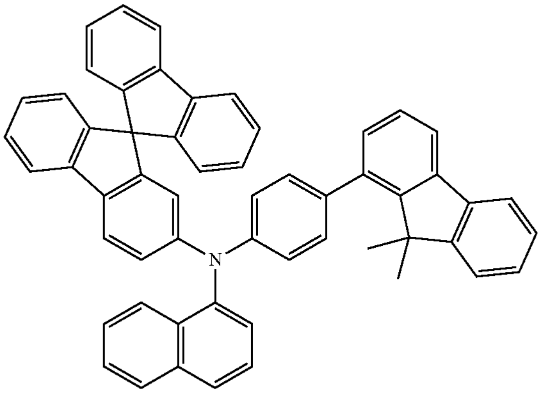

-continued
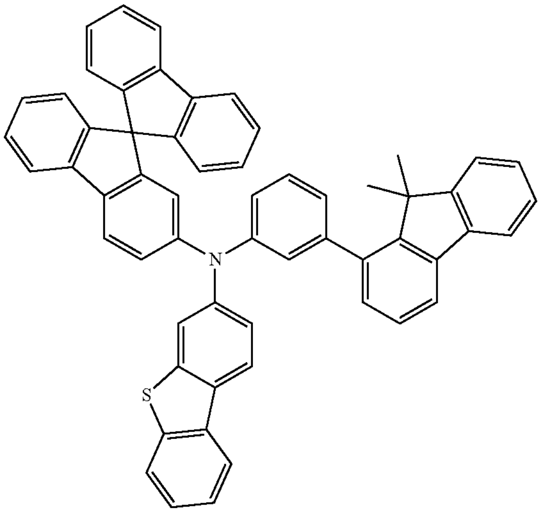
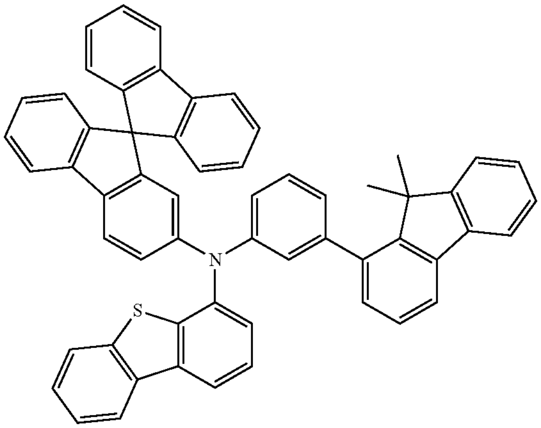
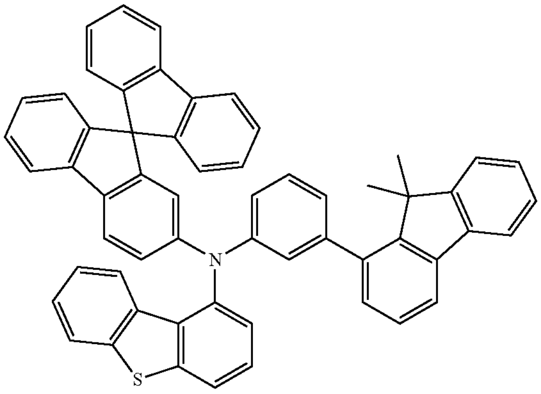
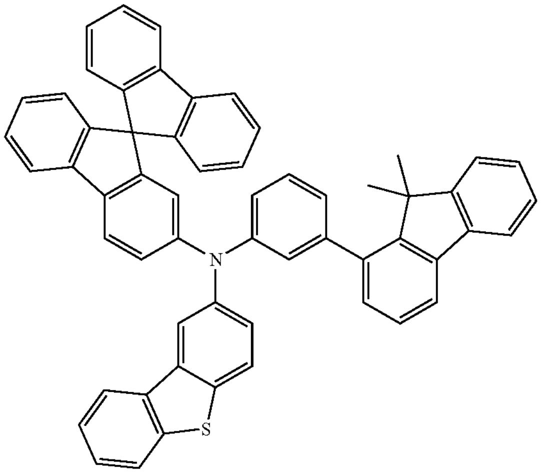
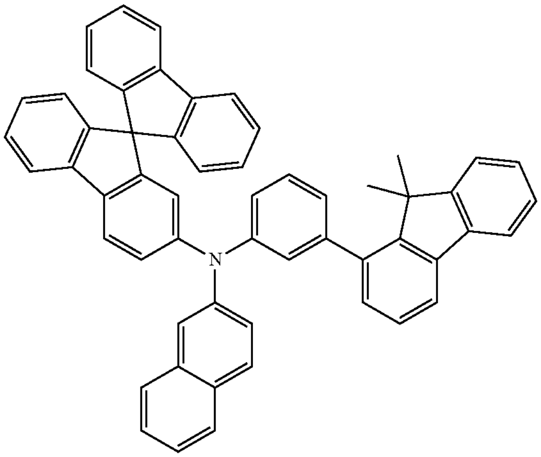
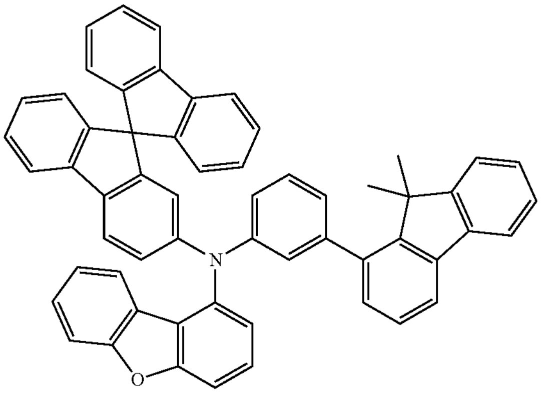

-continued
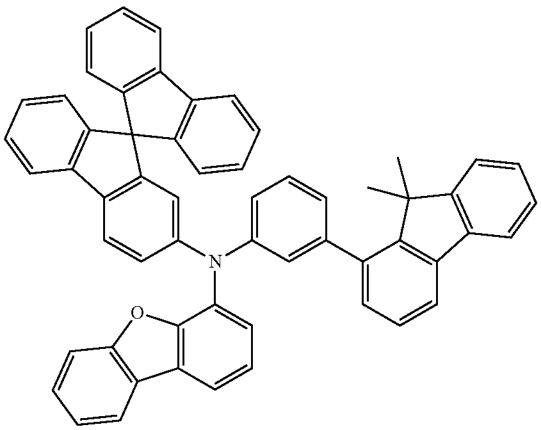
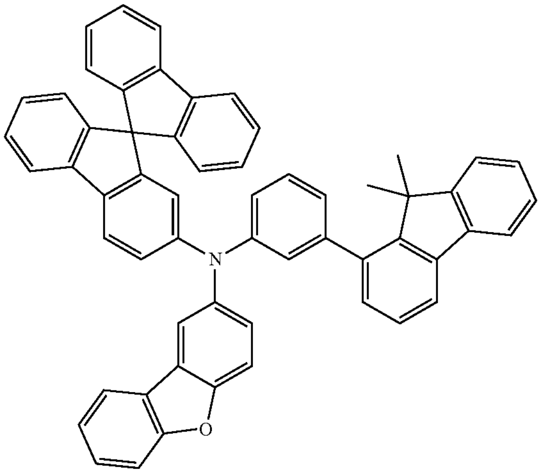
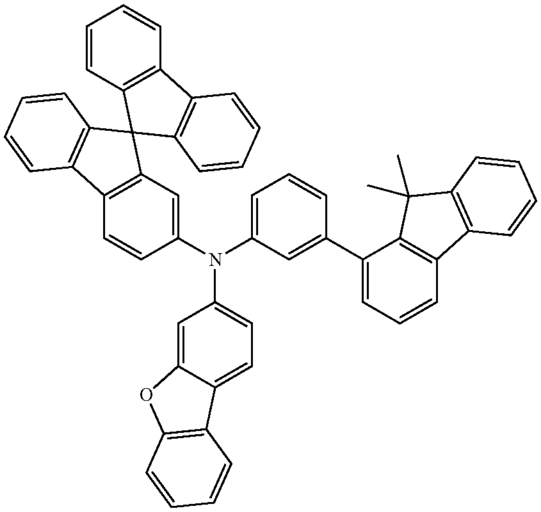
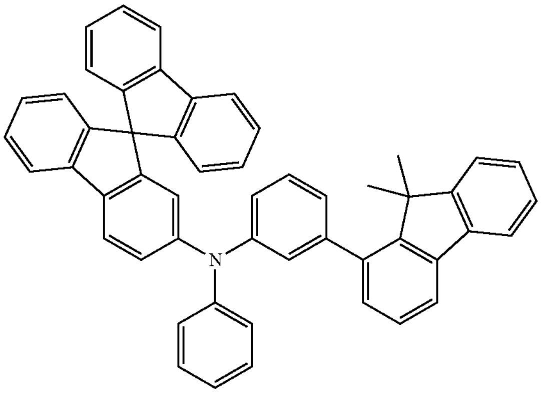
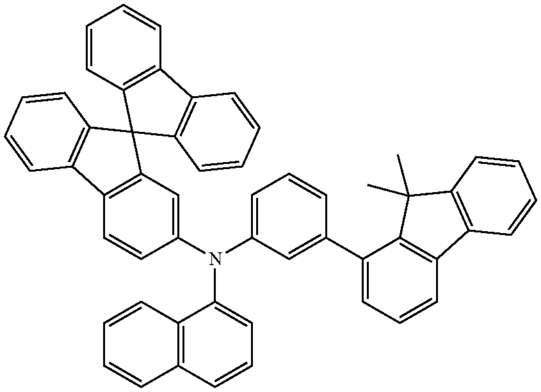
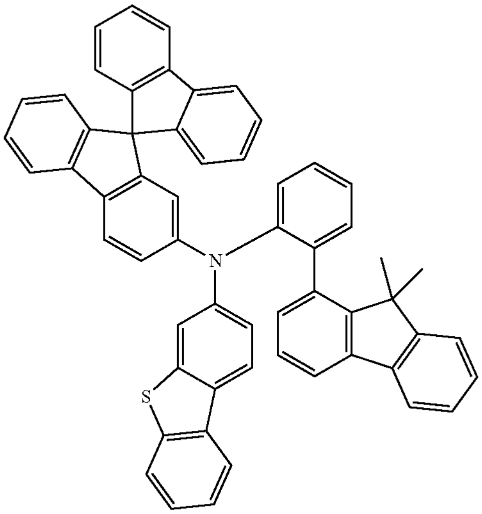

-continued
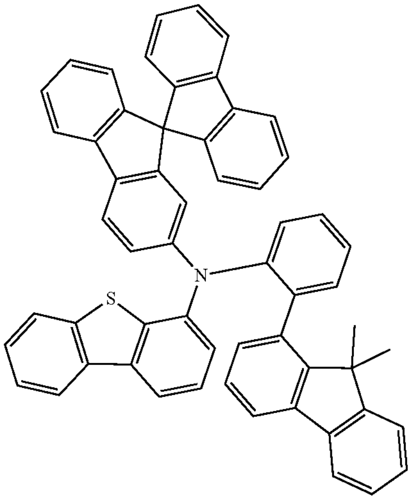
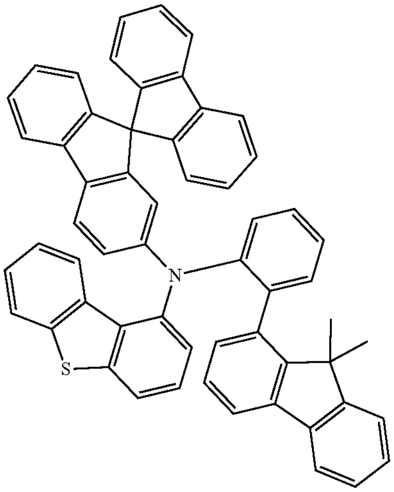
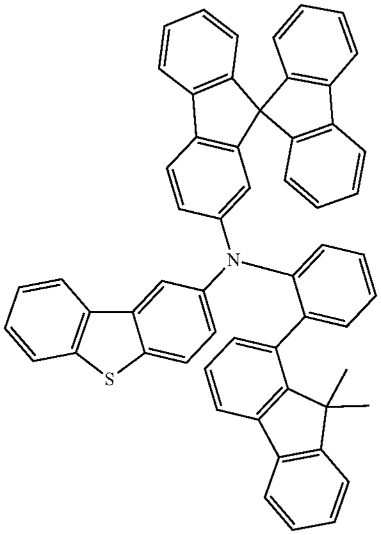
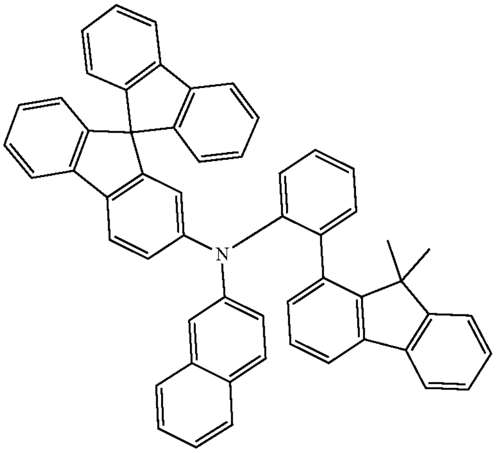
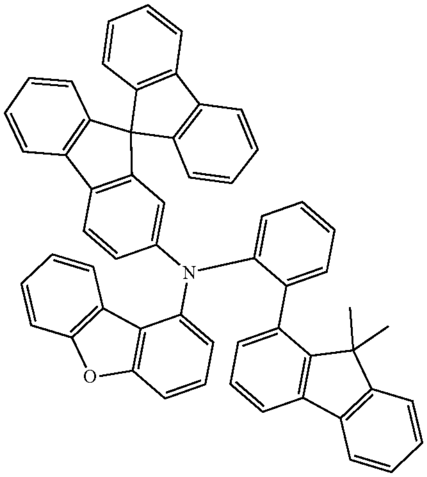
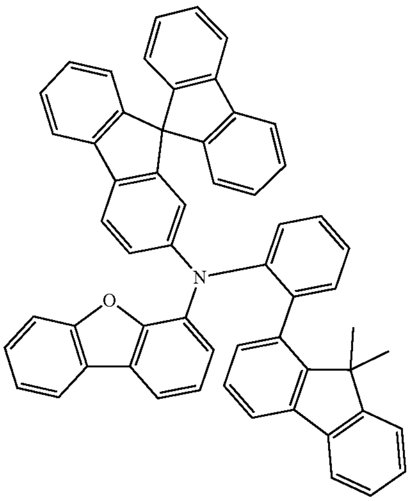

-continued
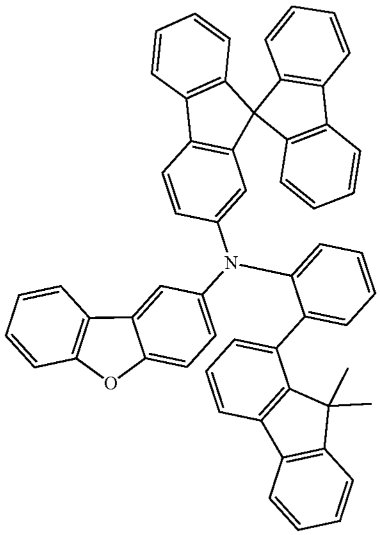
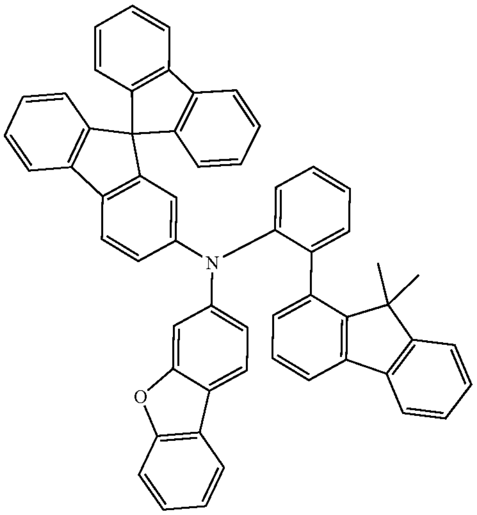
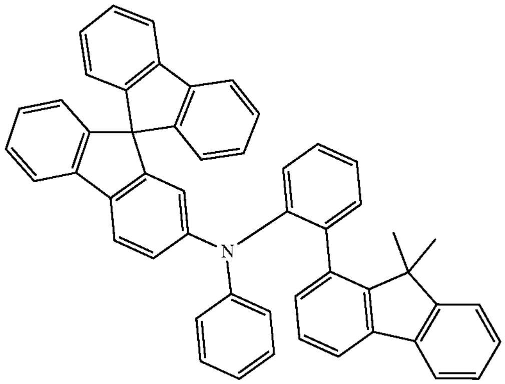
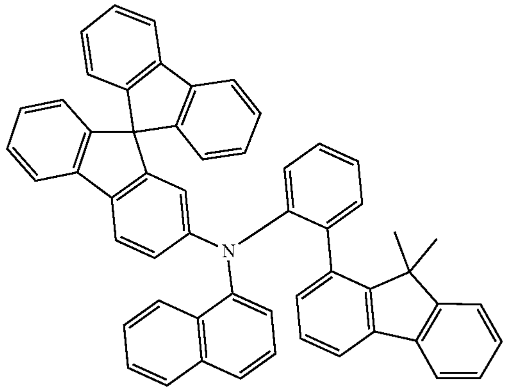
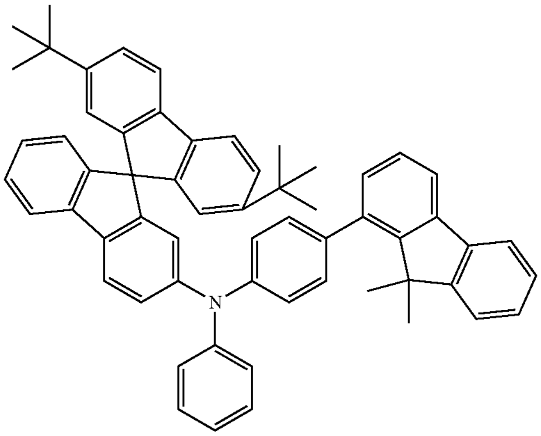
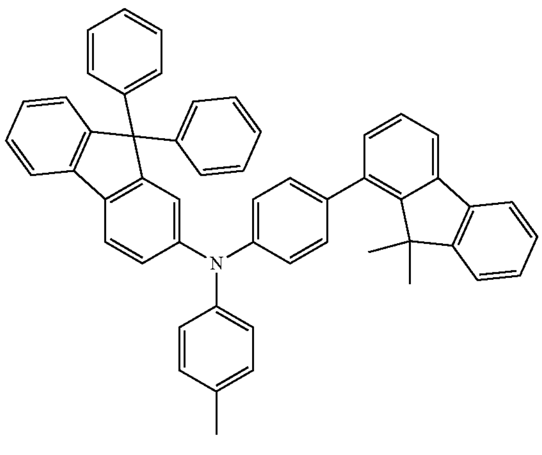

-continued
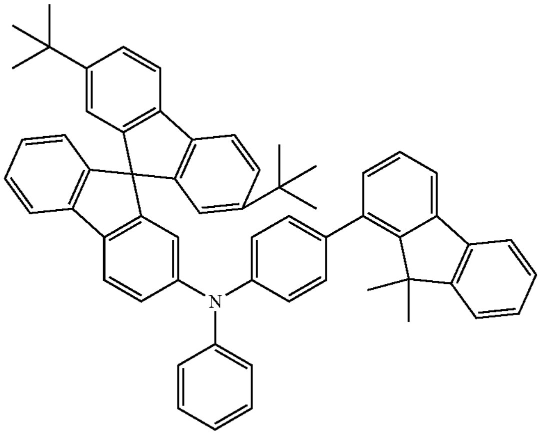
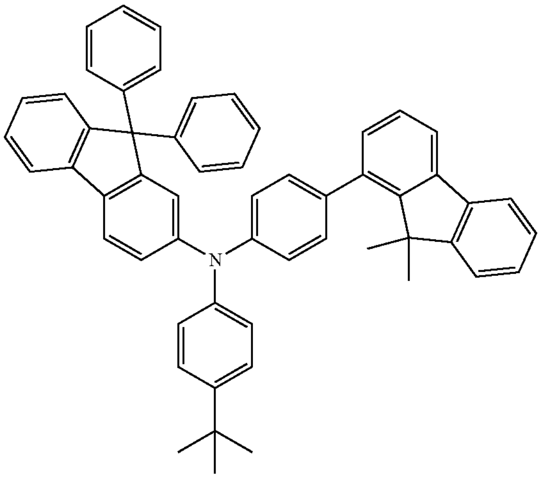
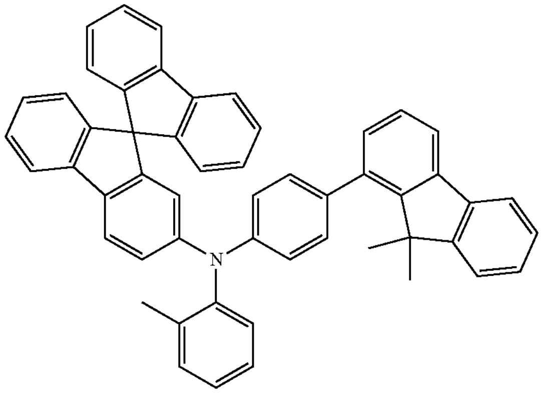
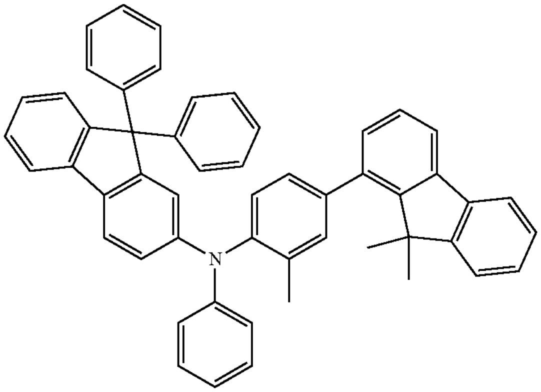
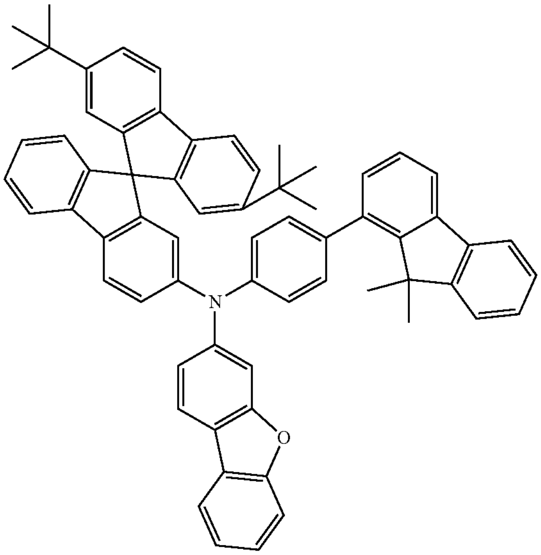

-continued
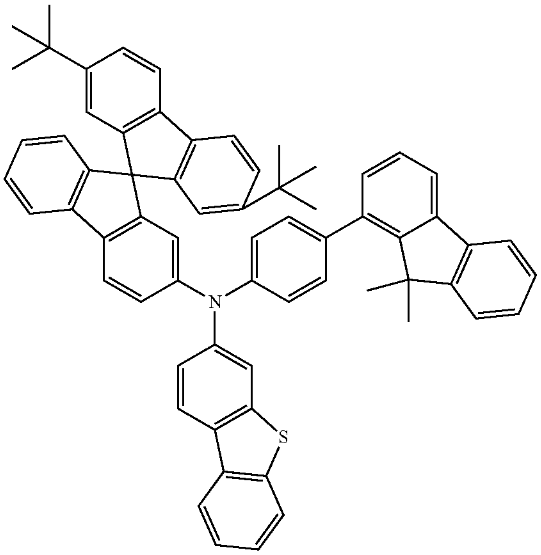
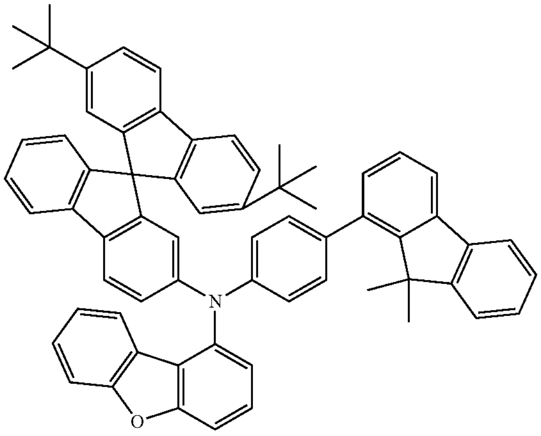
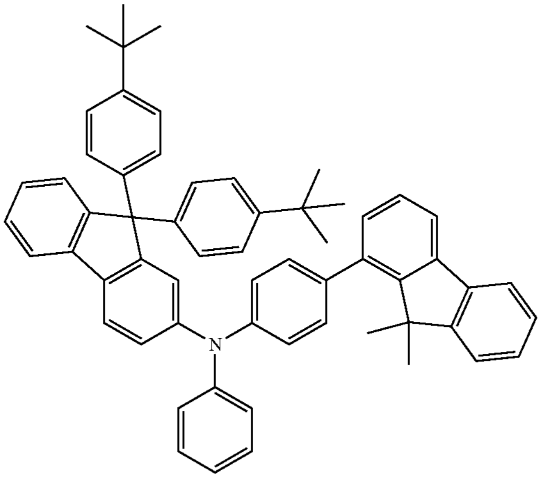
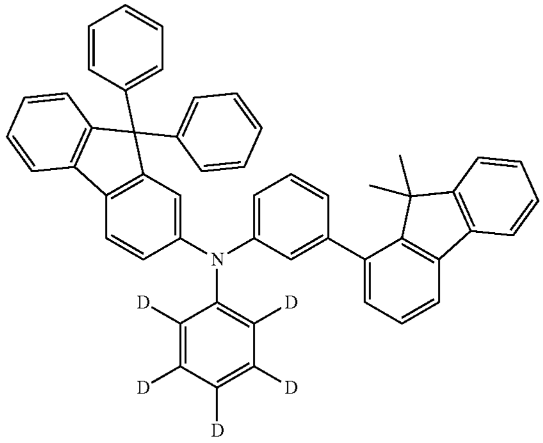
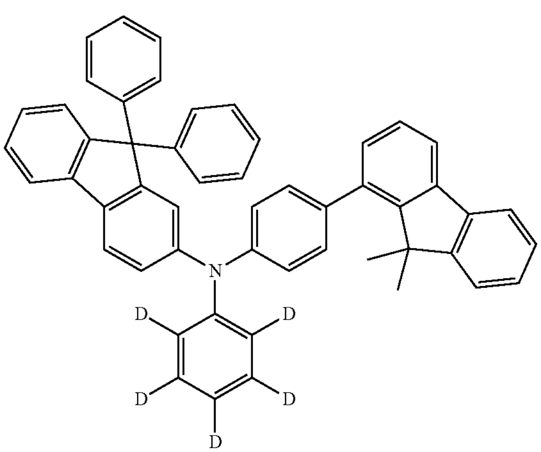
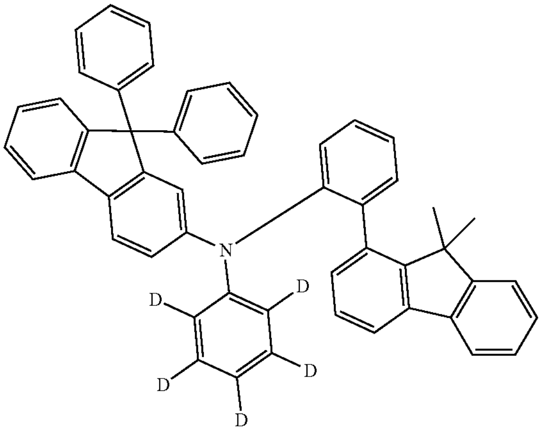

-continued
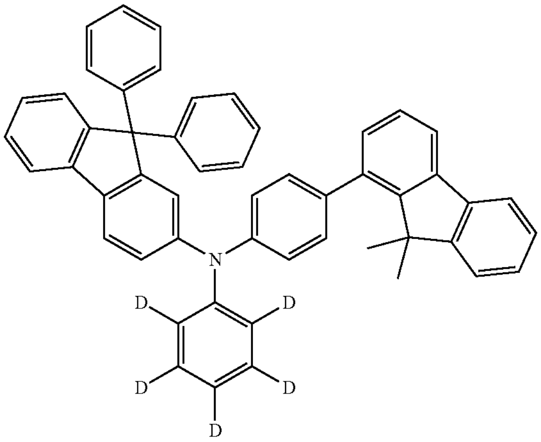
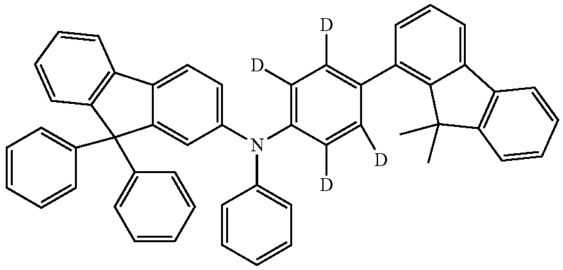
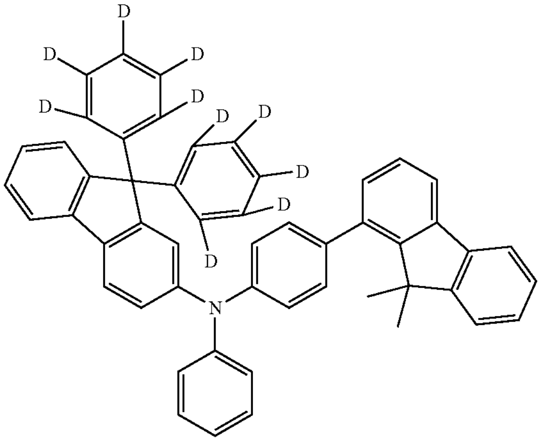
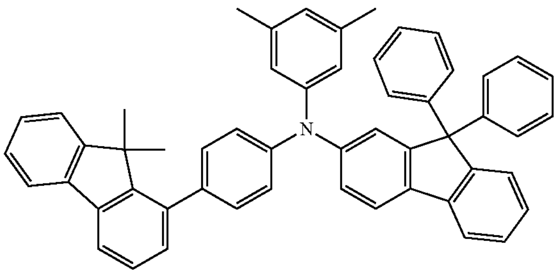
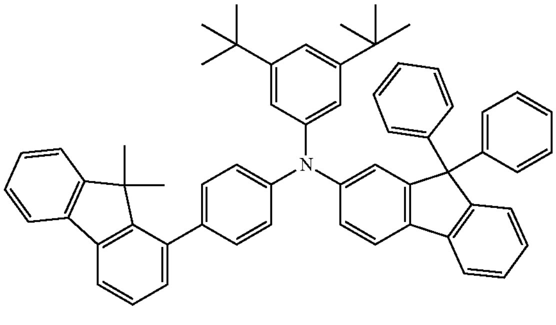
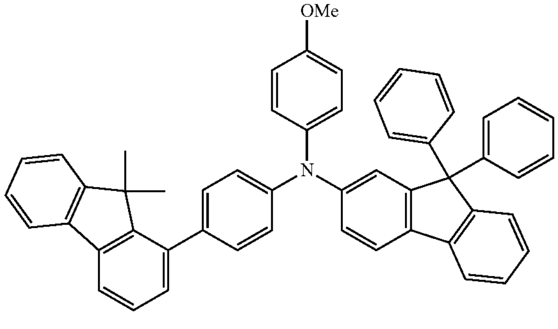
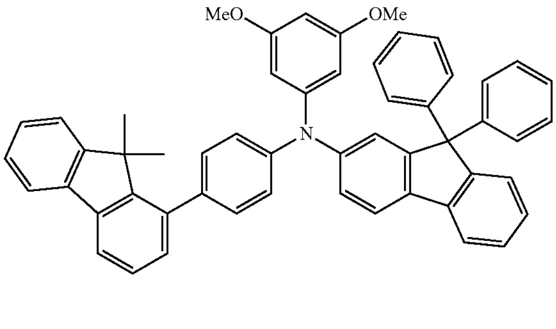
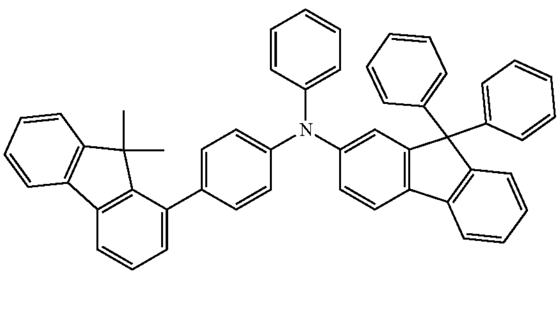

-continued
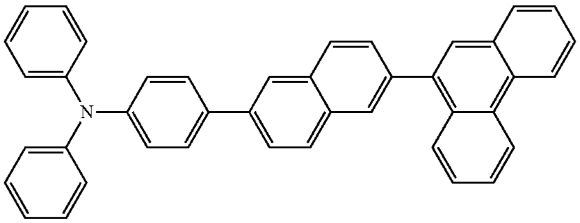
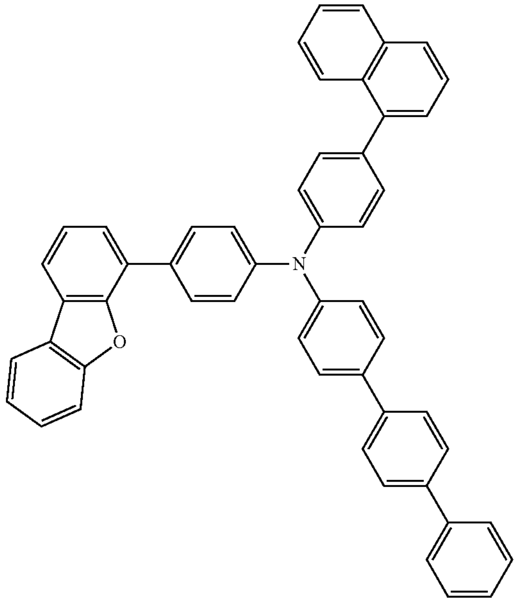
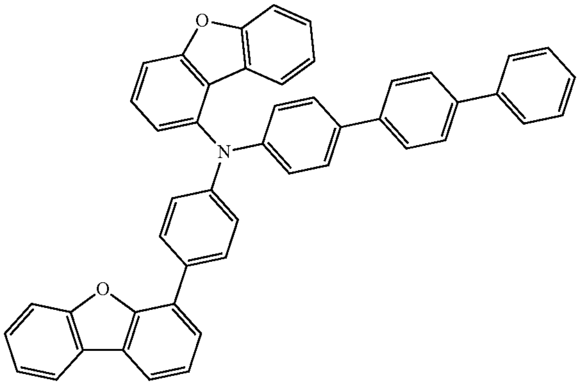
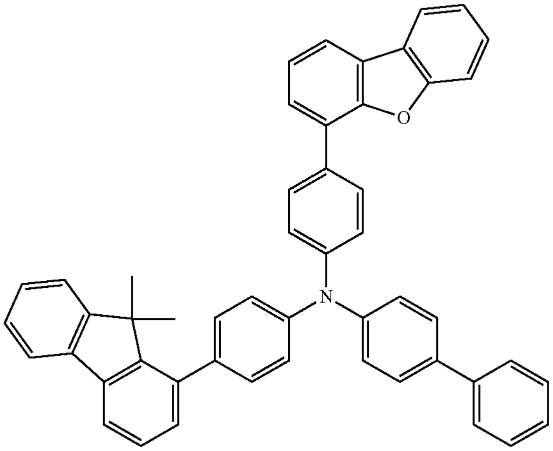
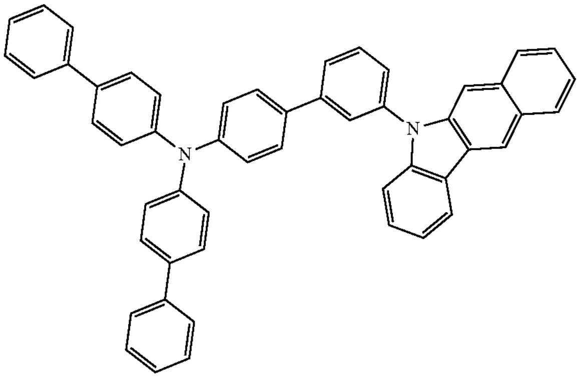
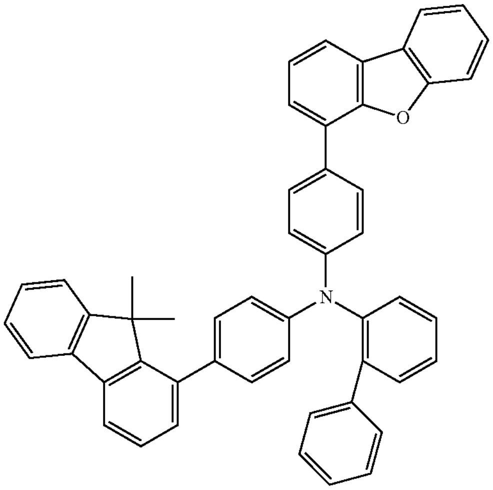

-continued
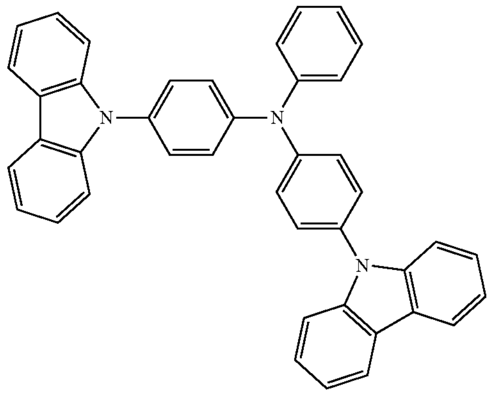
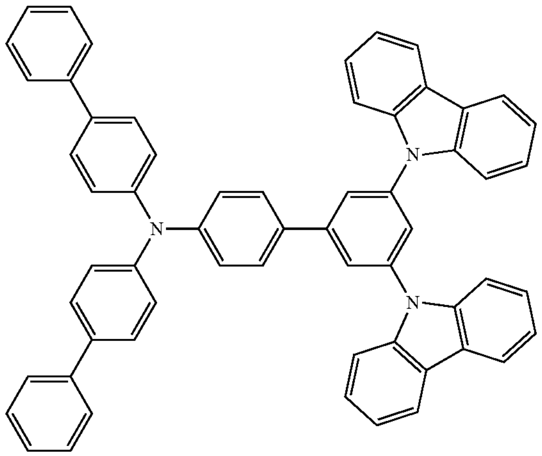
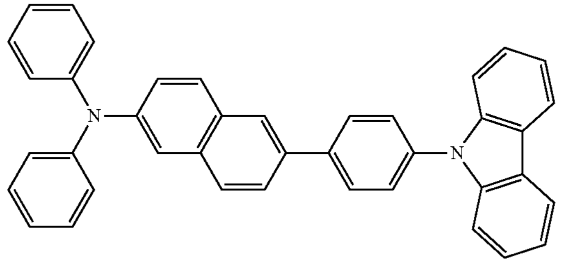
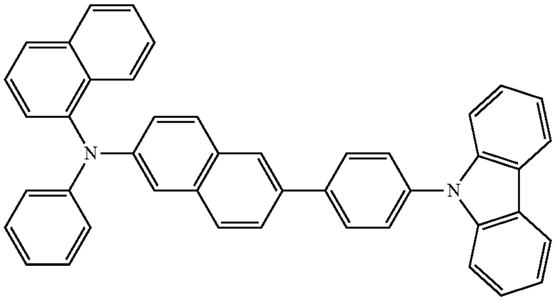
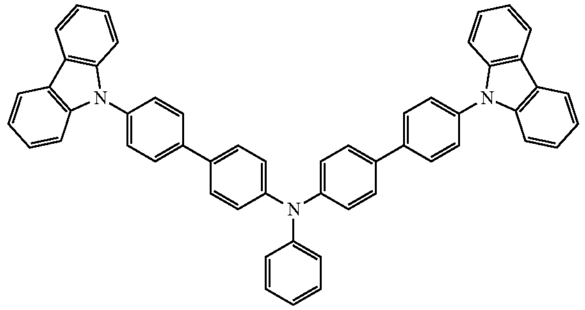
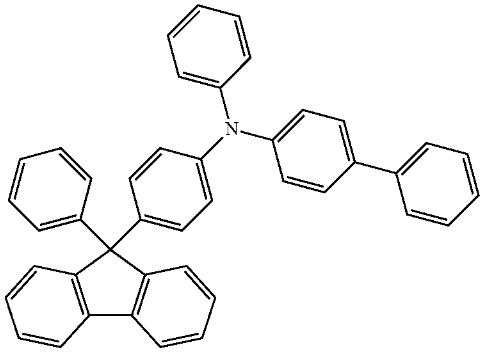
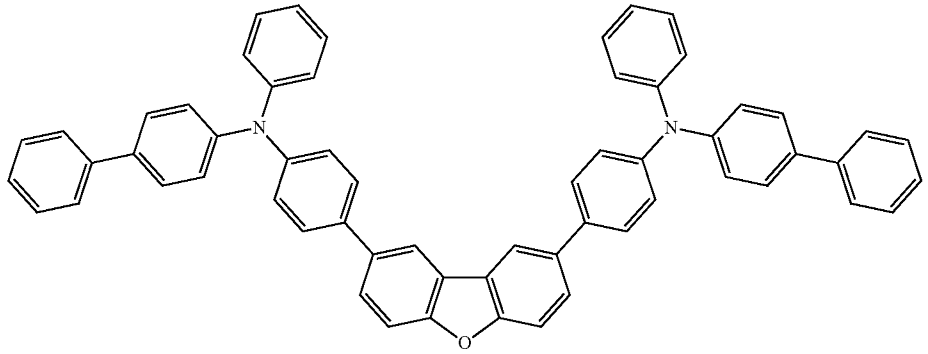

-continued
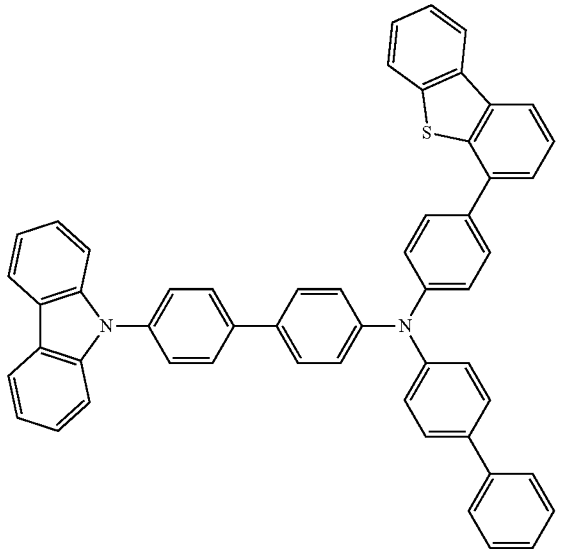
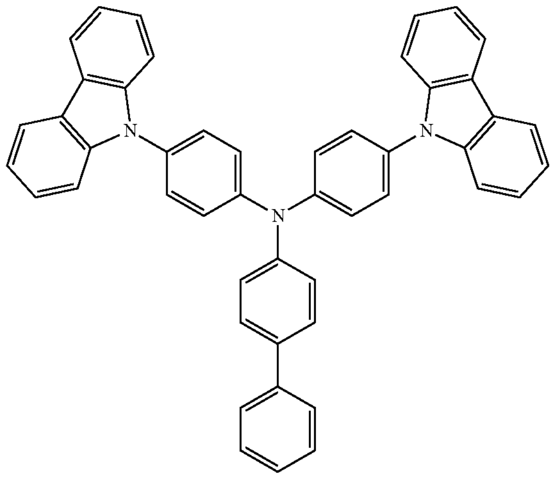
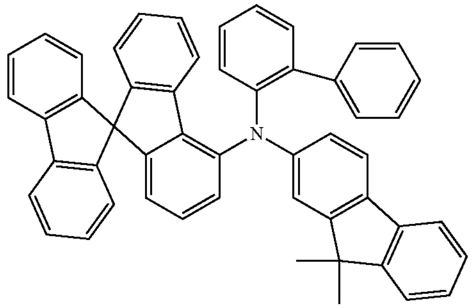
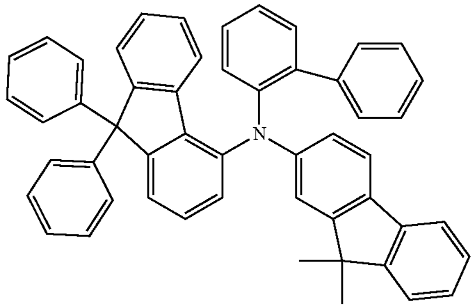
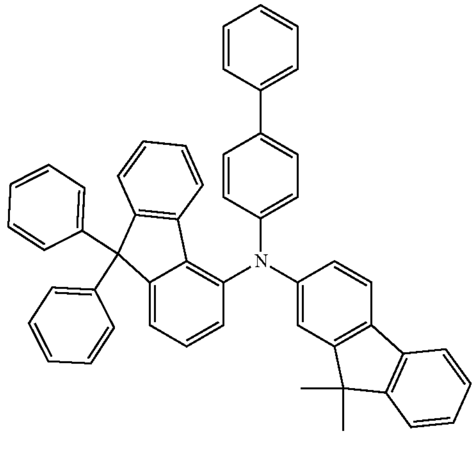
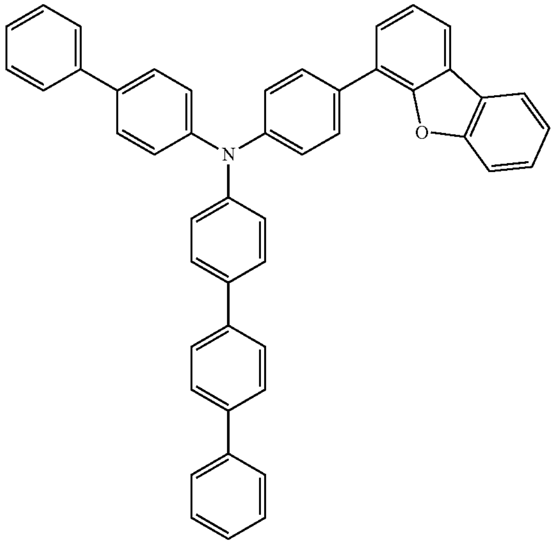

-continued
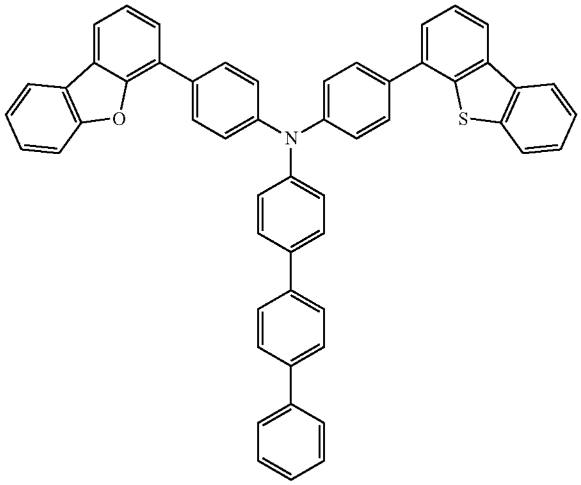
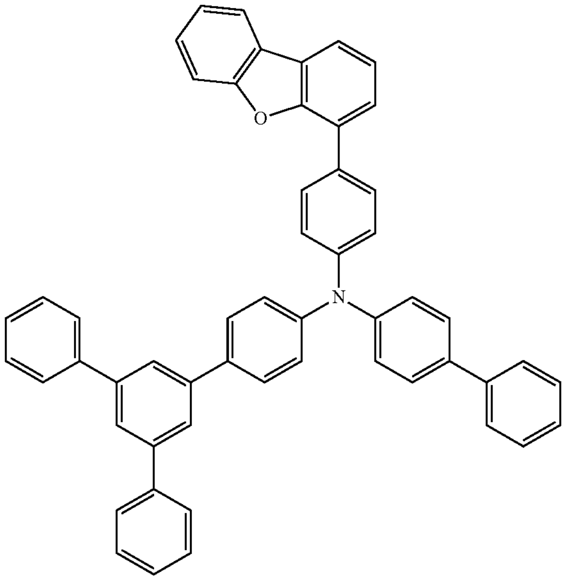
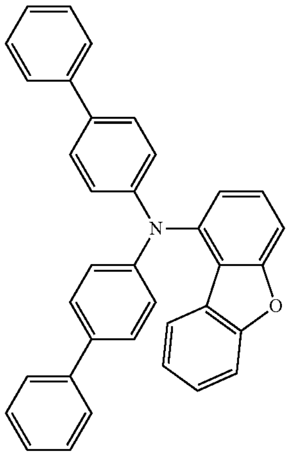
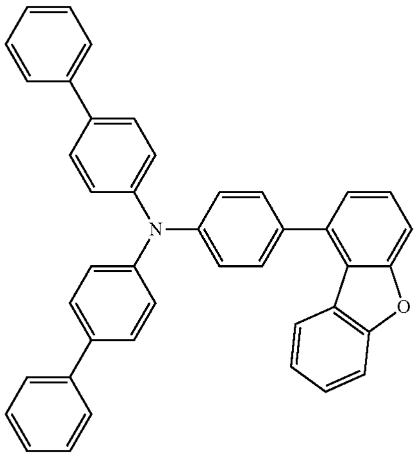

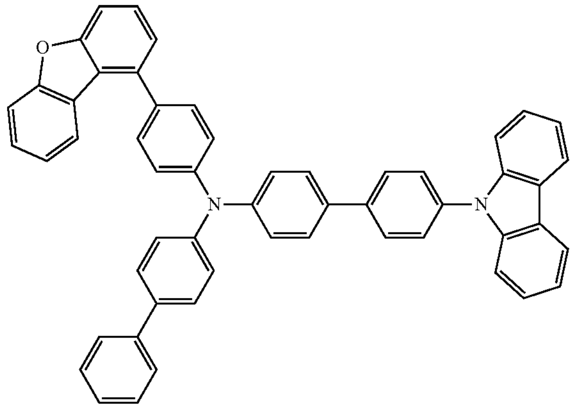
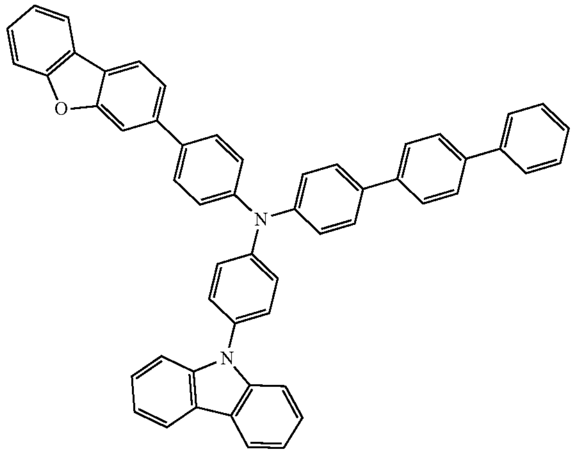
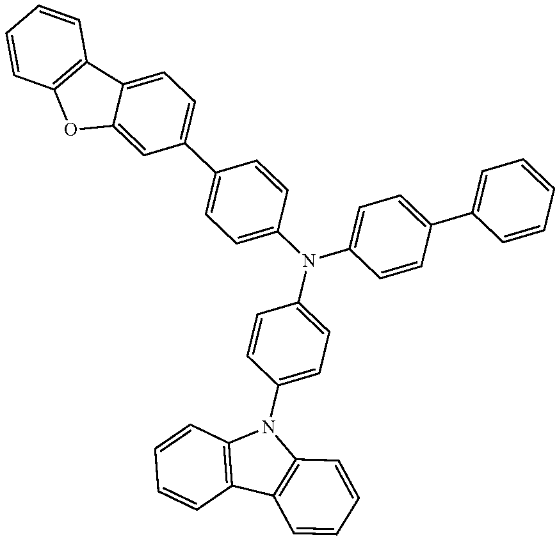

-continued
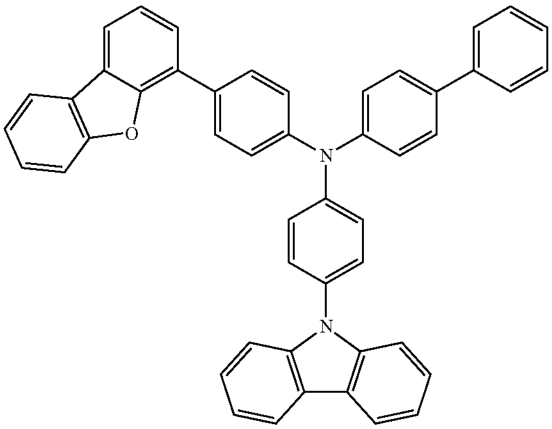
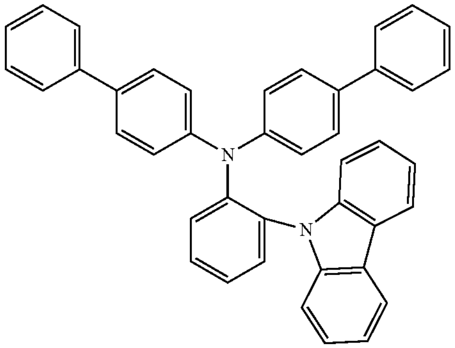
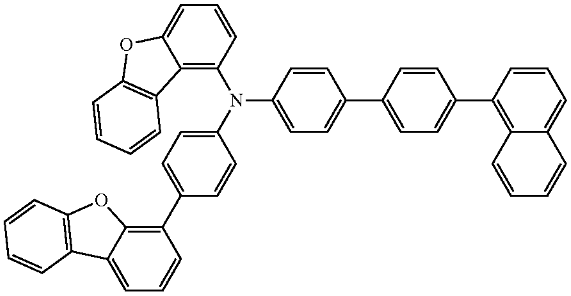
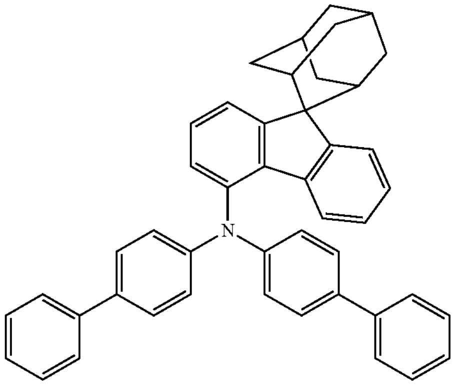

-continued
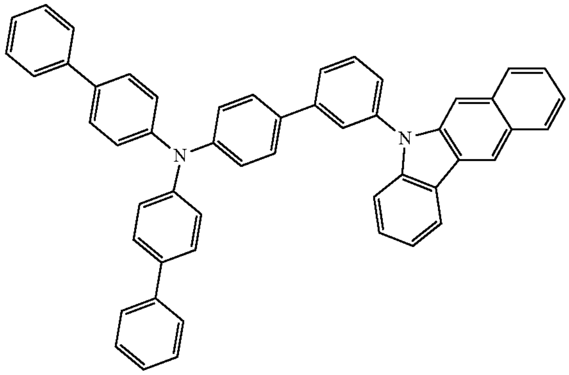
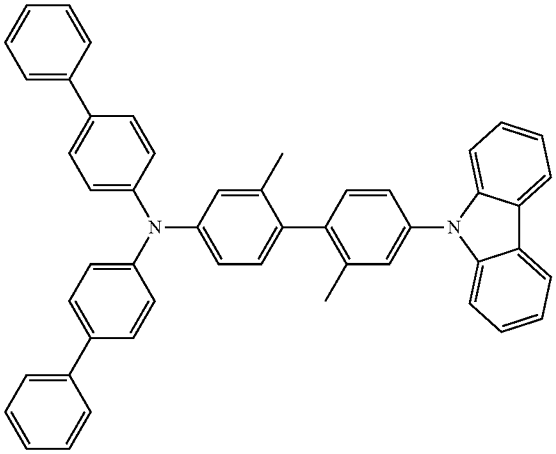
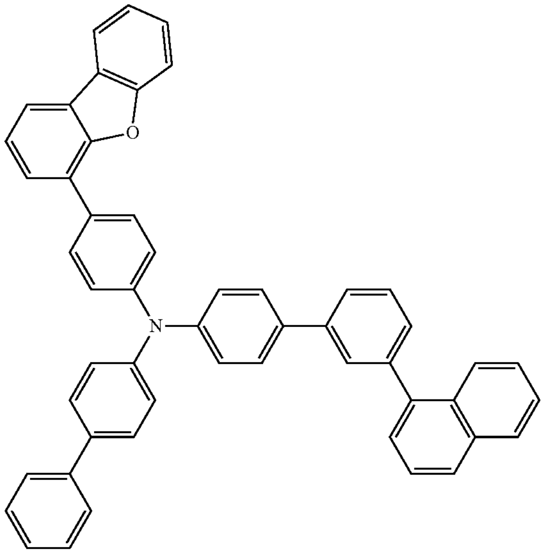

-continued
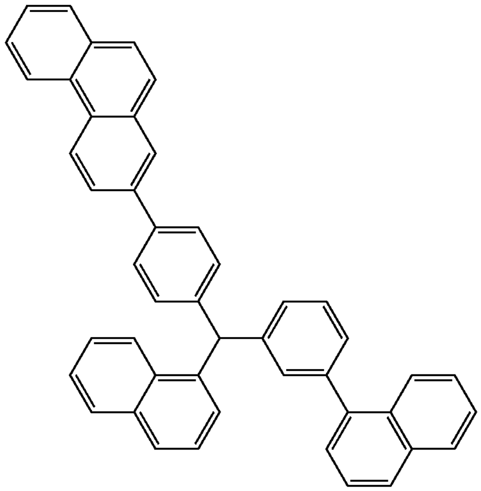
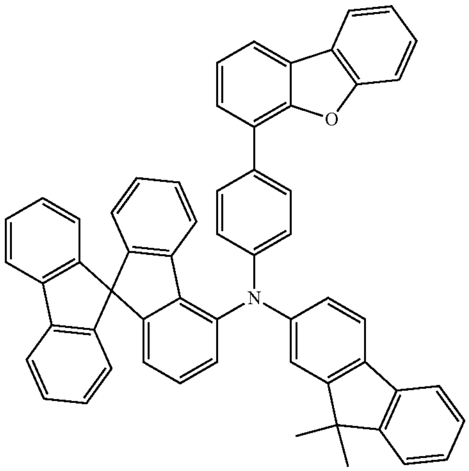
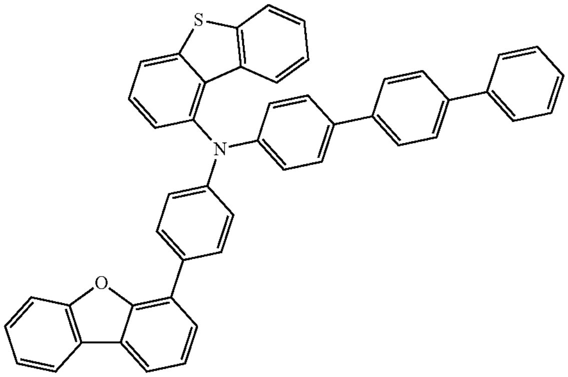

-continued
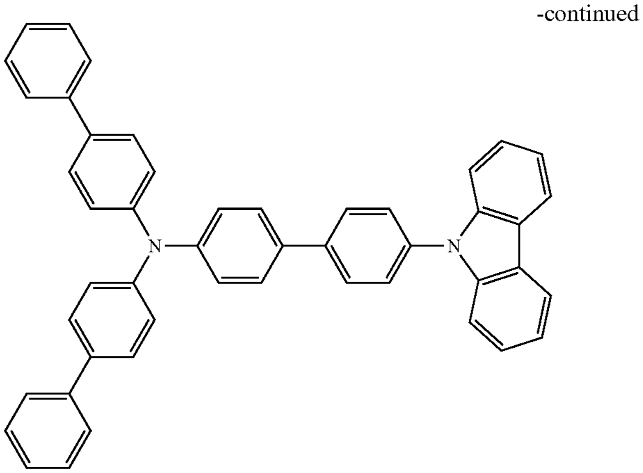
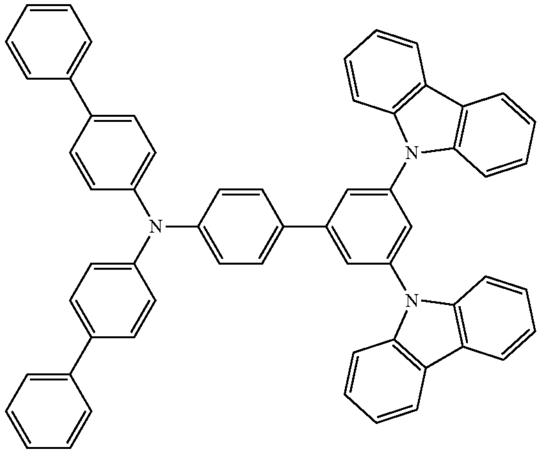
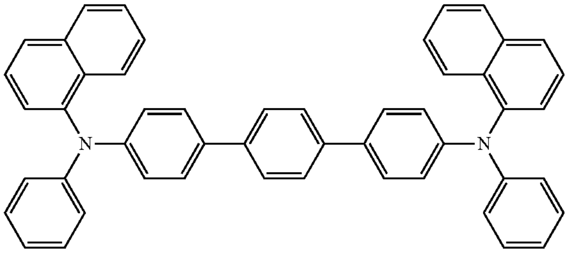
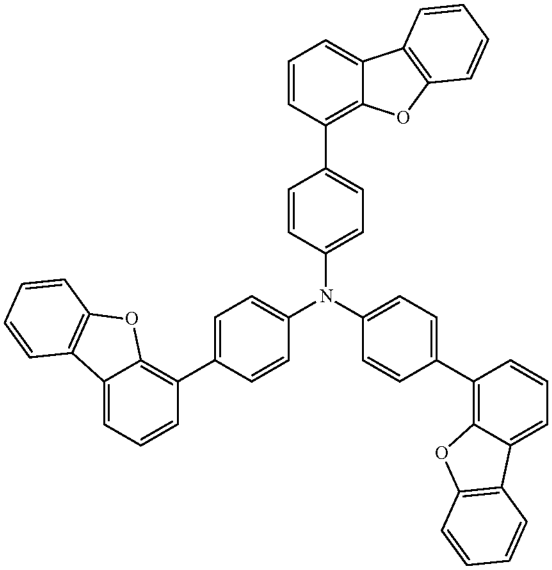

-continued
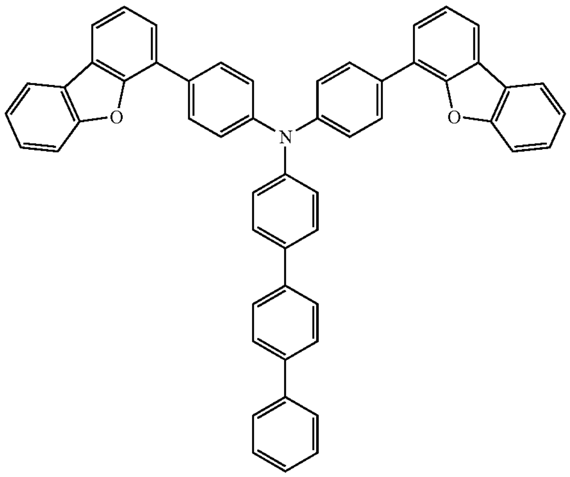
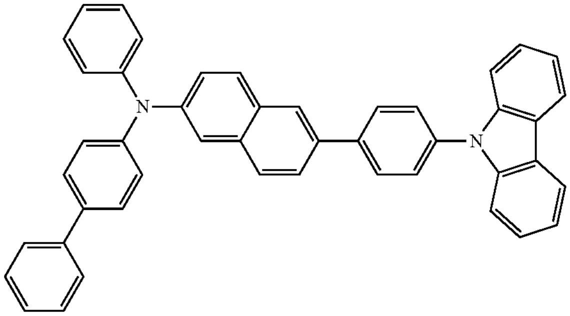
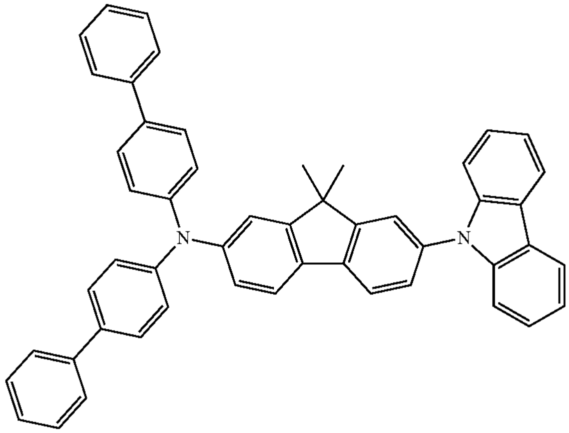
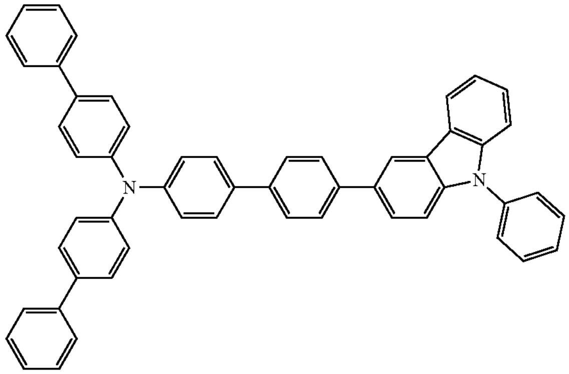

-continued
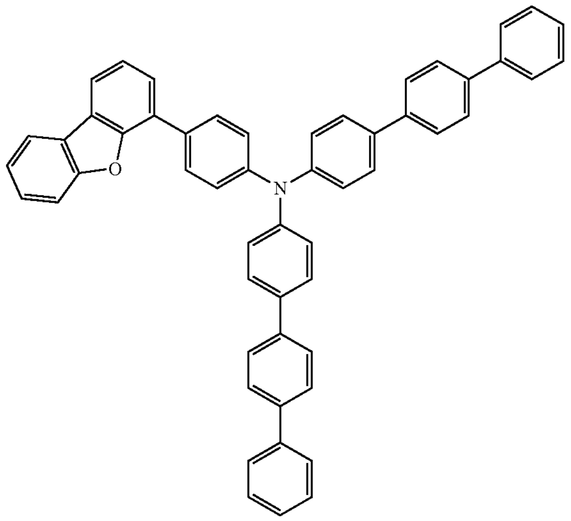
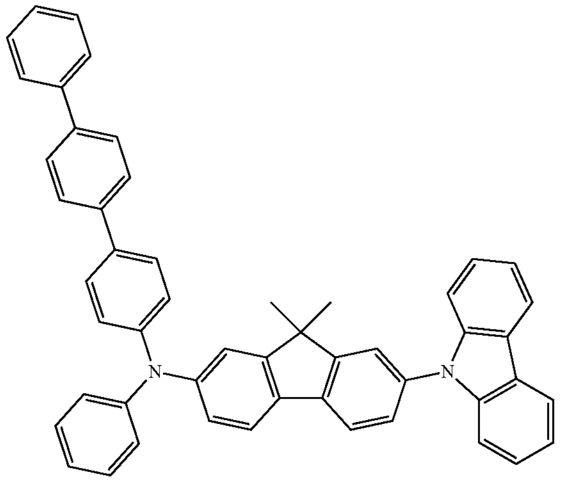
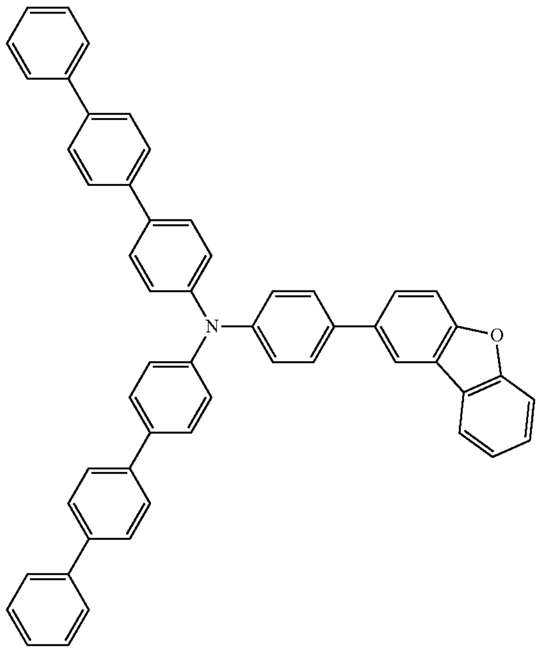

-continued
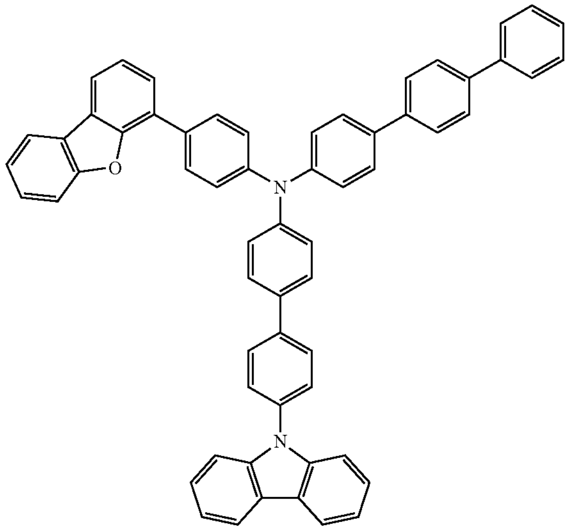
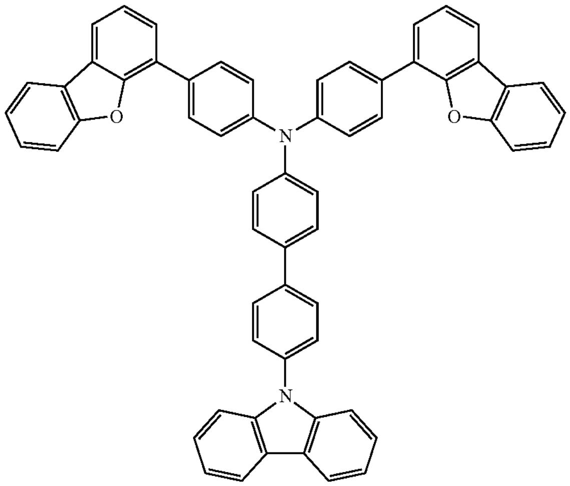
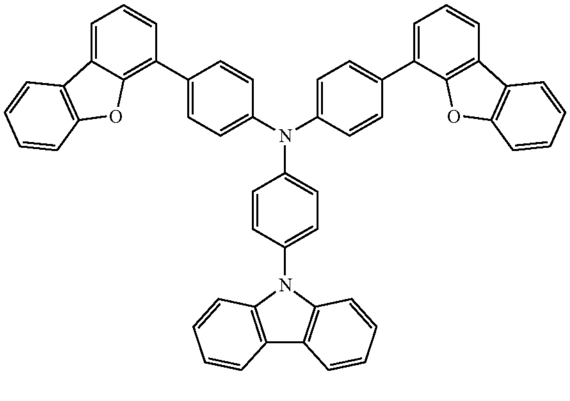

-continued
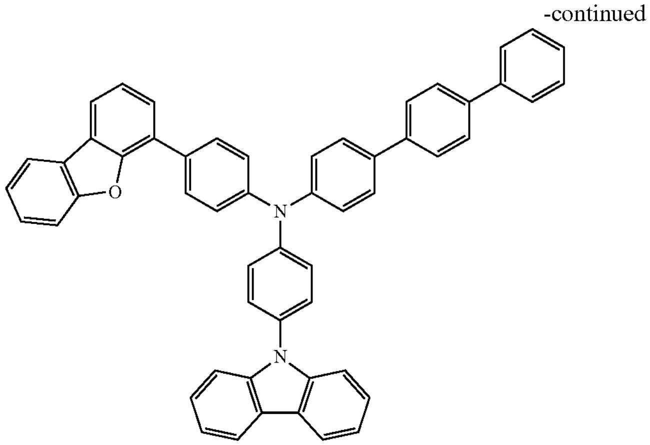
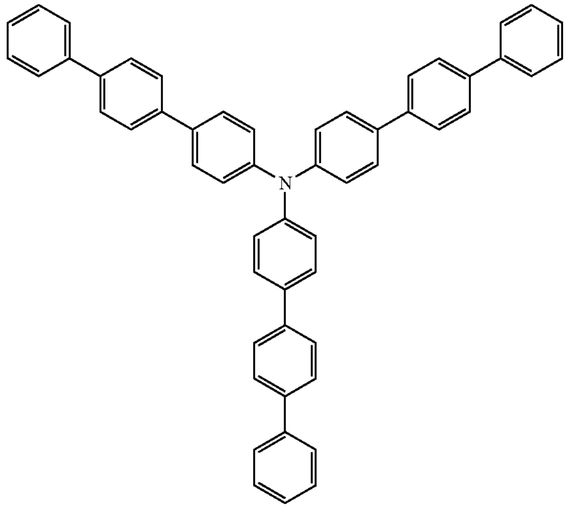
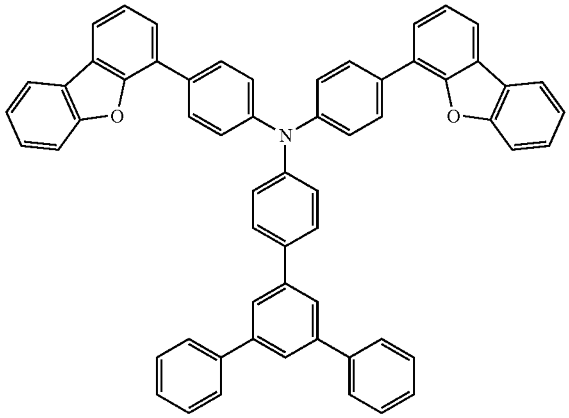
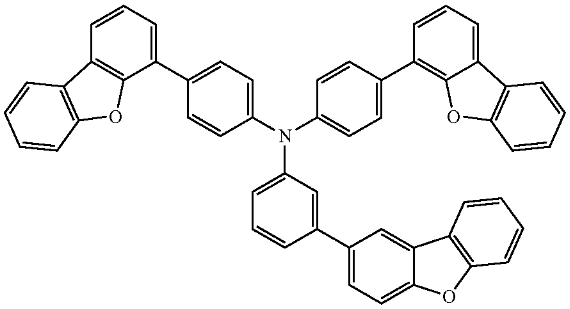

-continued
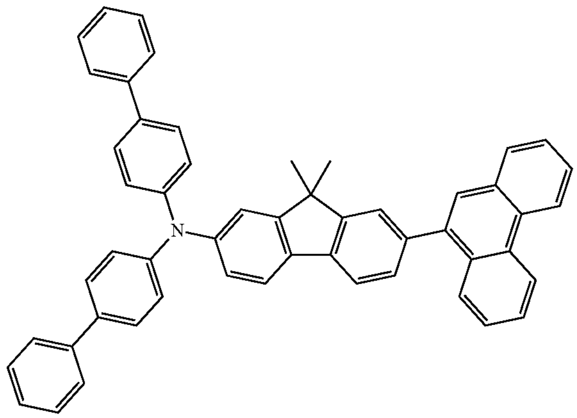
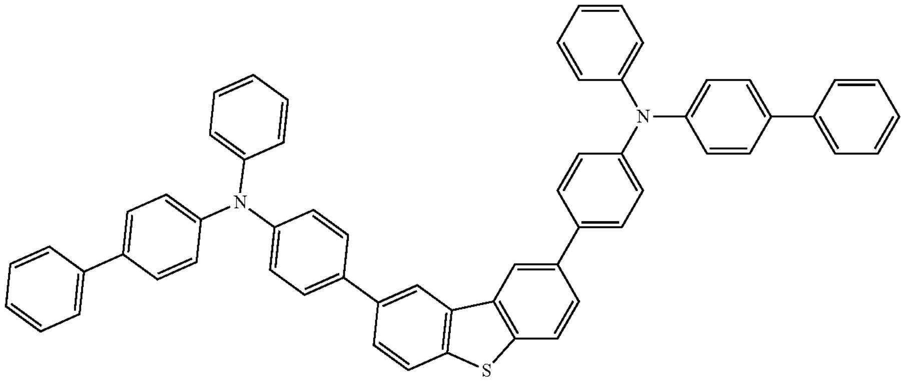
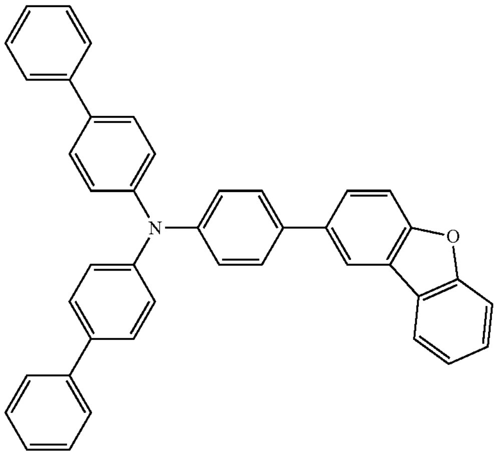
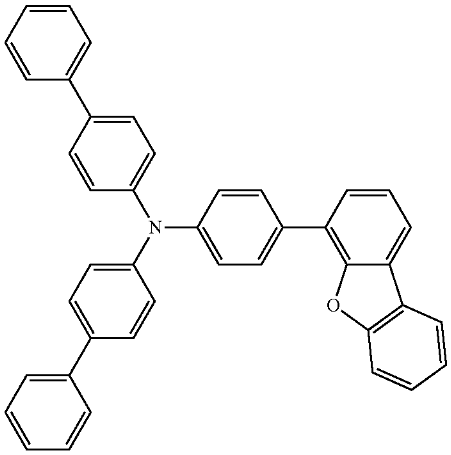

-continued
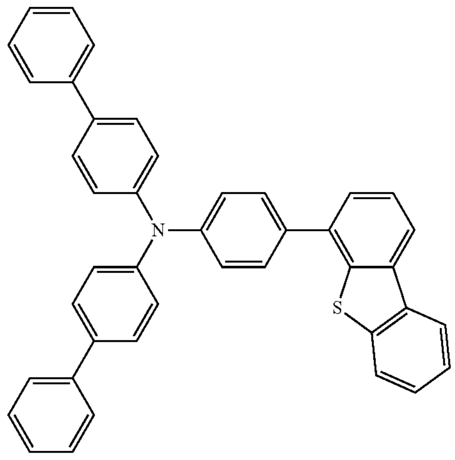
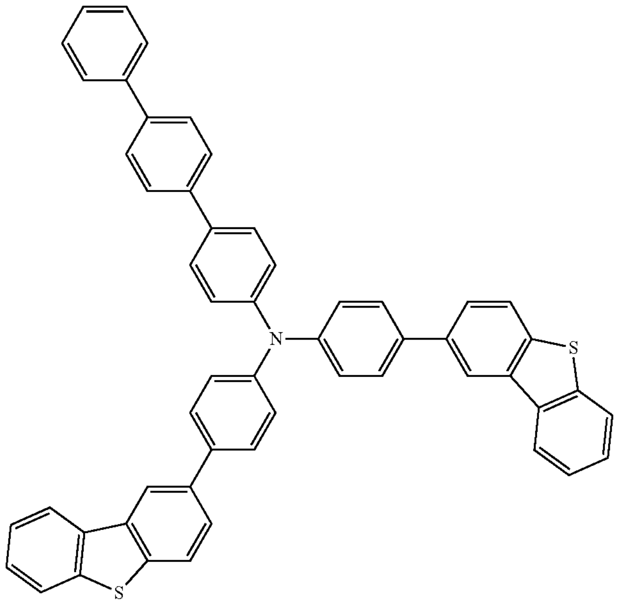
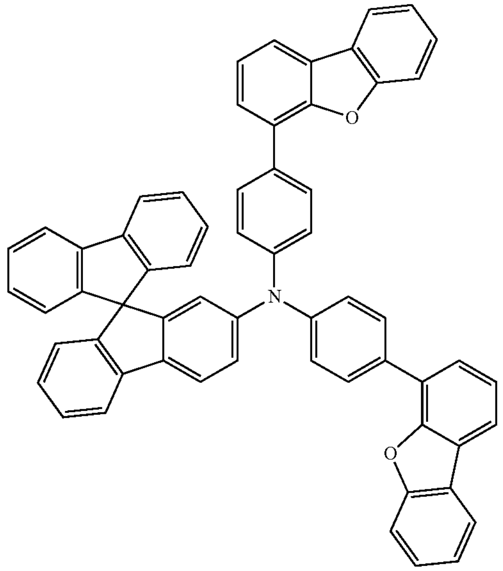
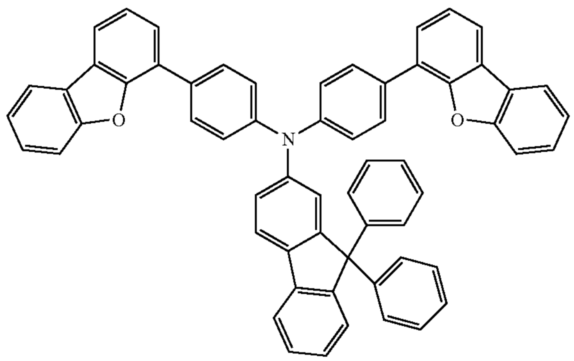

-continued
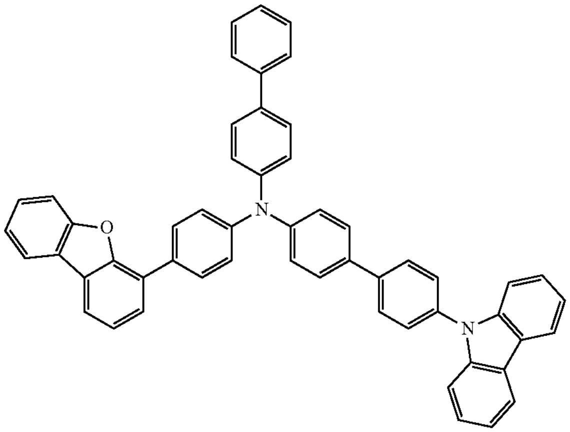
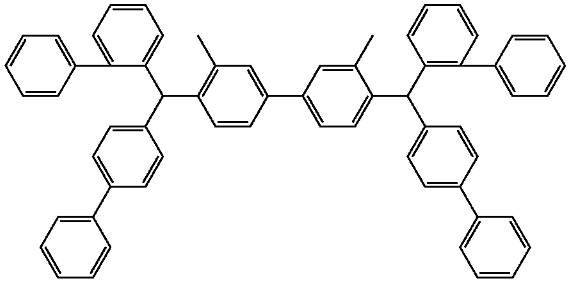
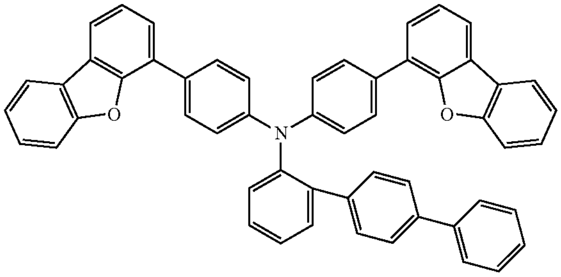
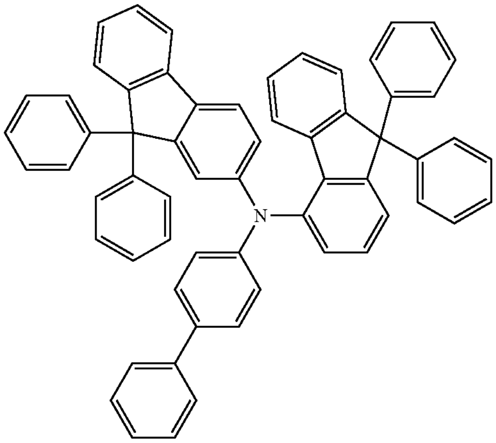
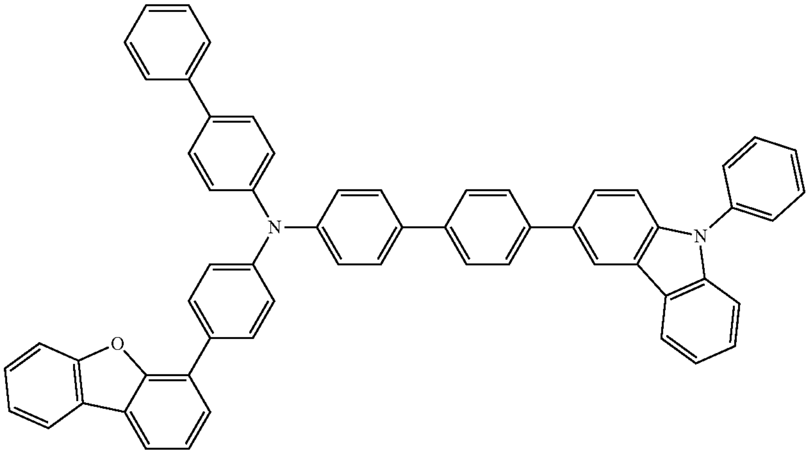

-continued
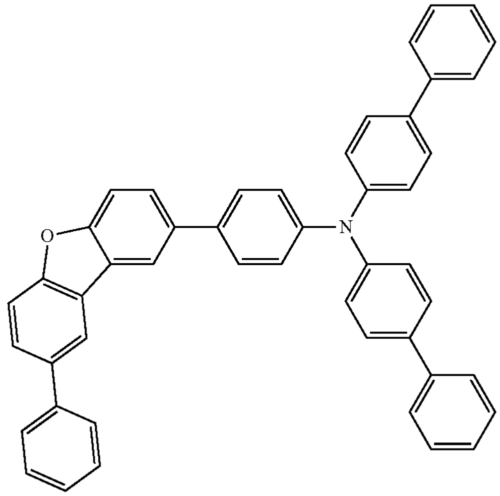
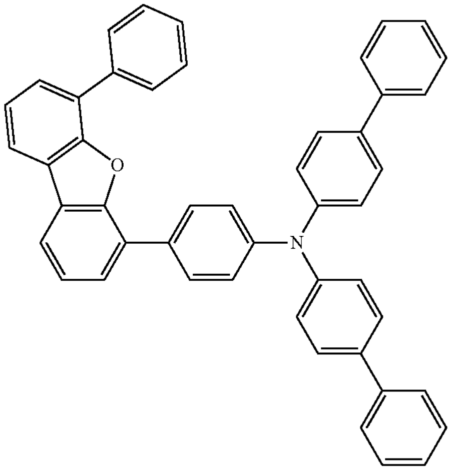
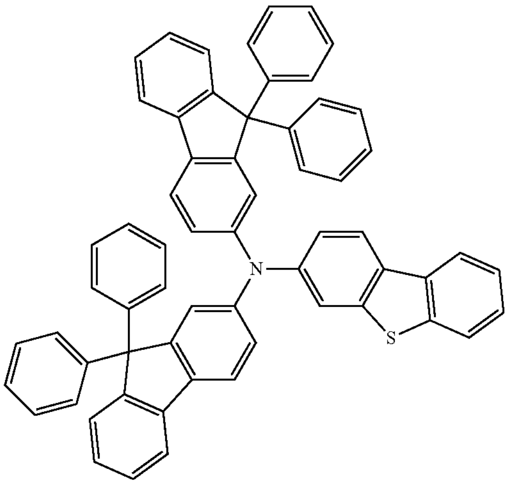
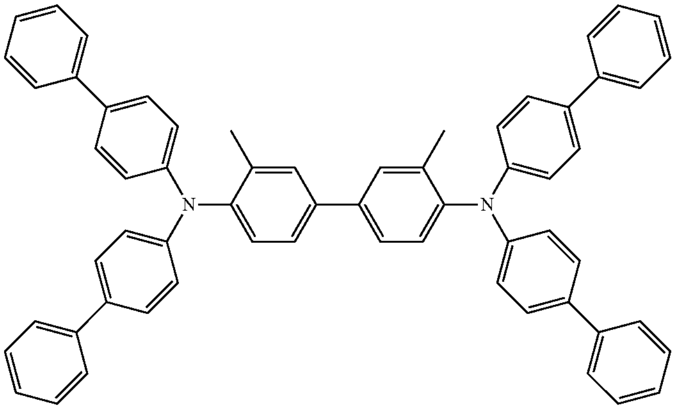
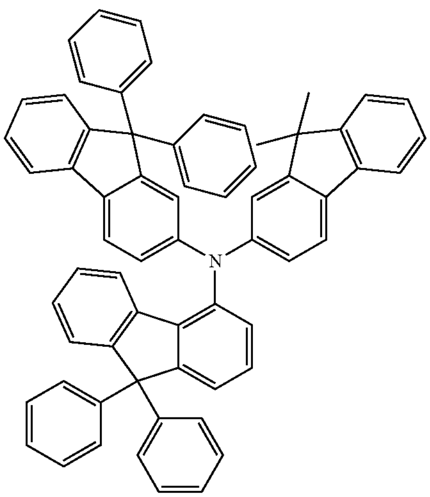

-continued
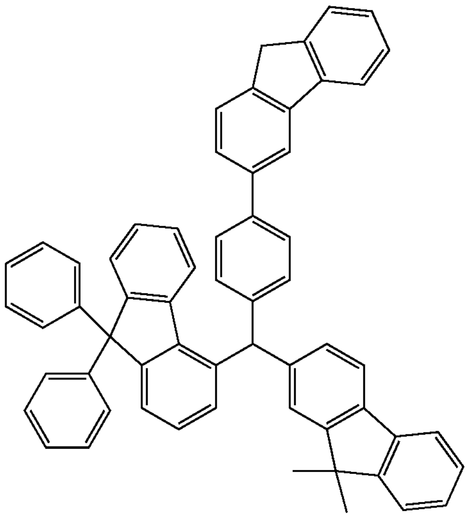
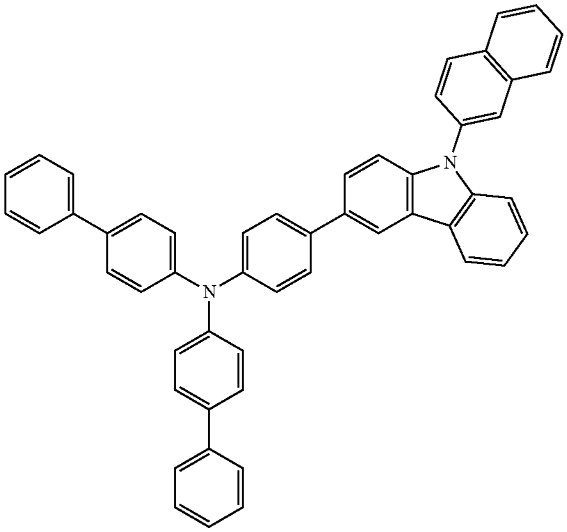
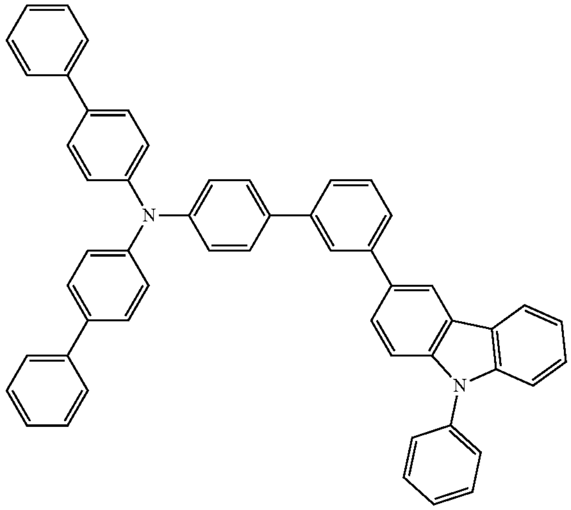

-continued
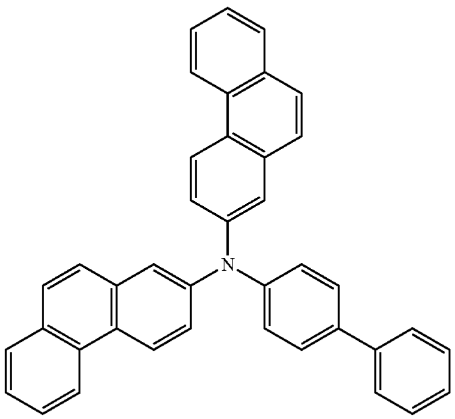
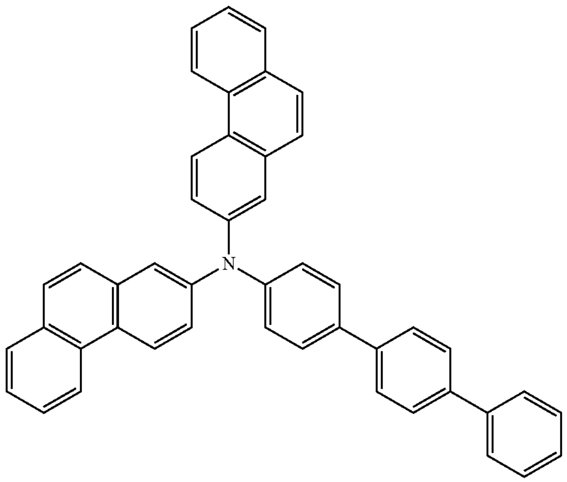
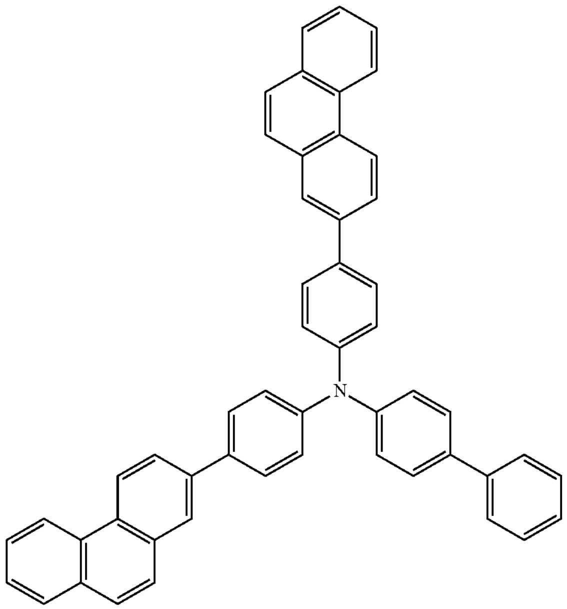

-continued
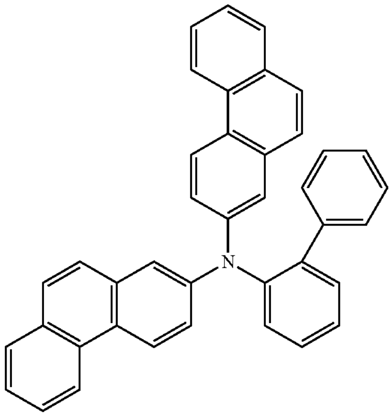
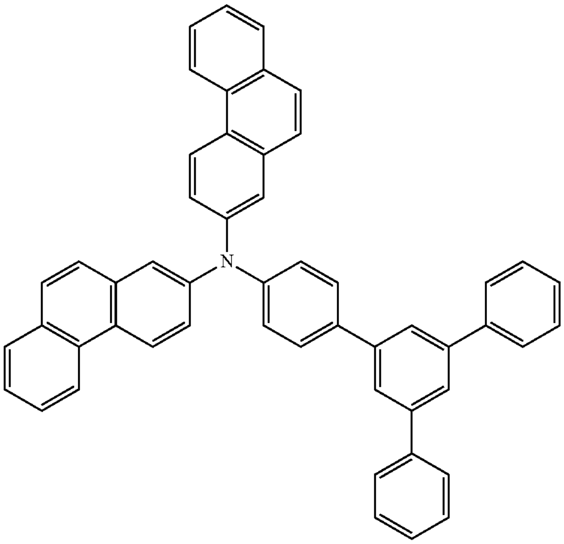
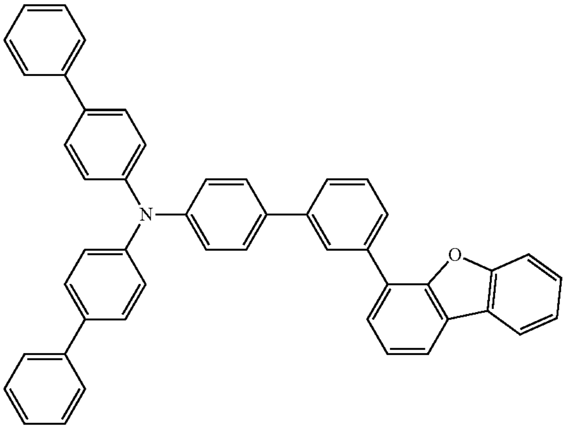

-continued
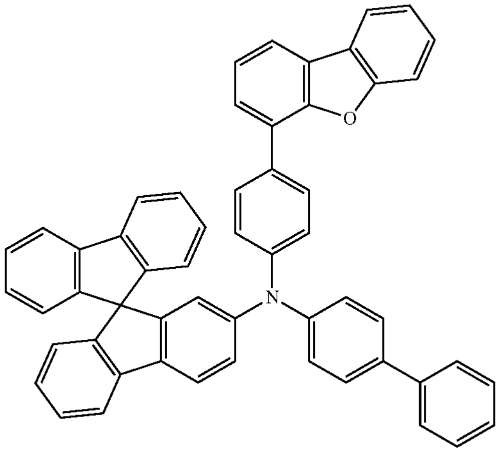
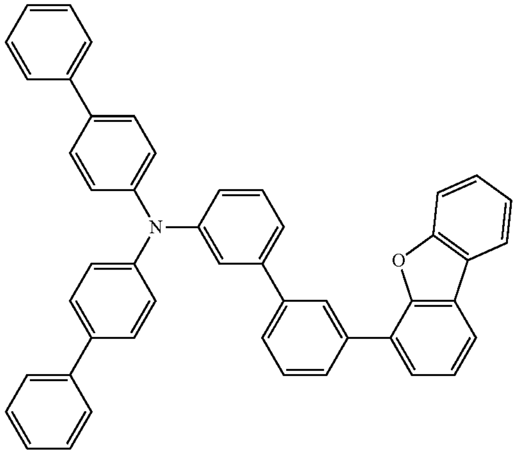
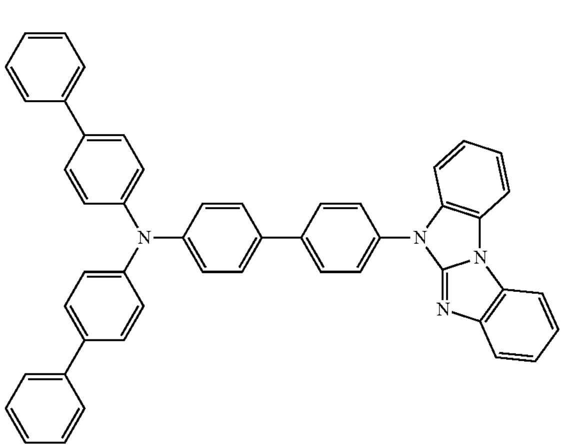

-continued
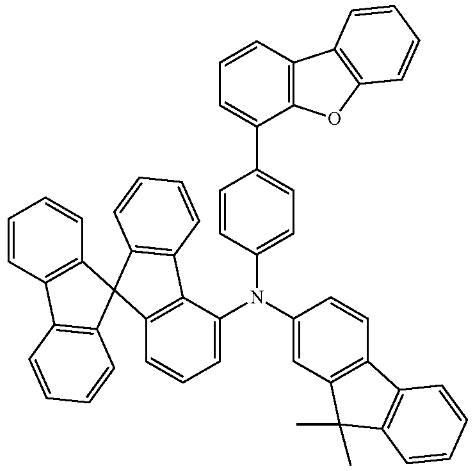
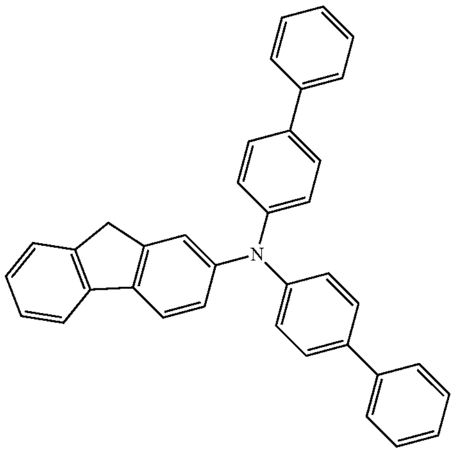
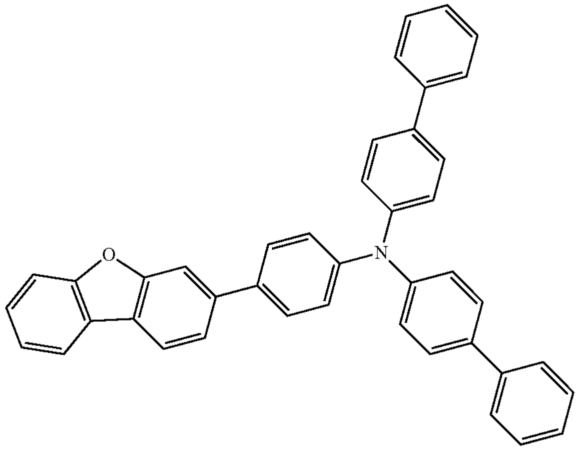

-continued
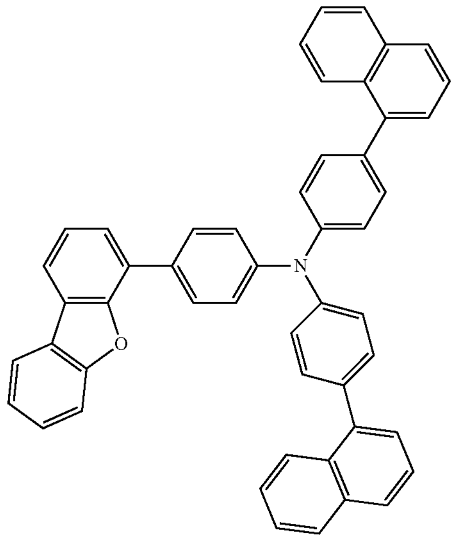
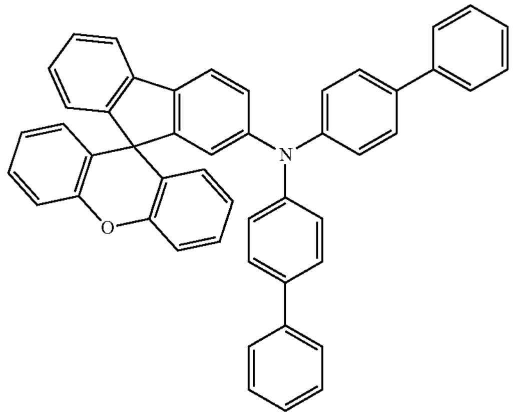
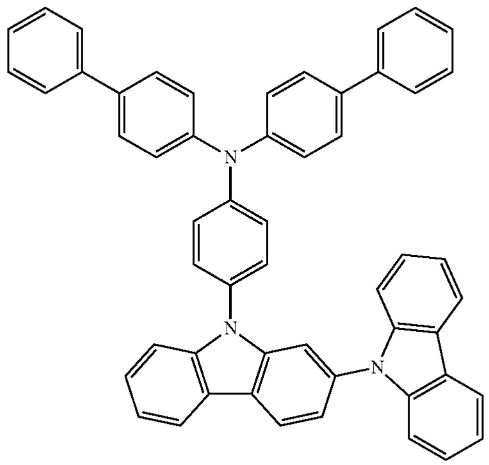

-continued
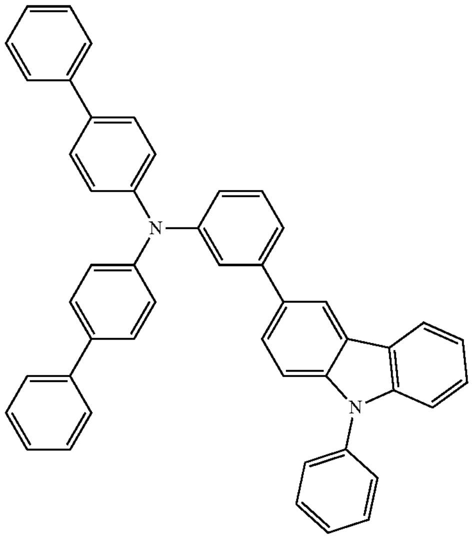
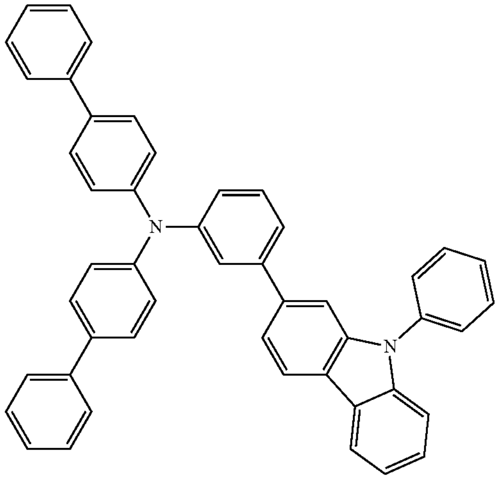
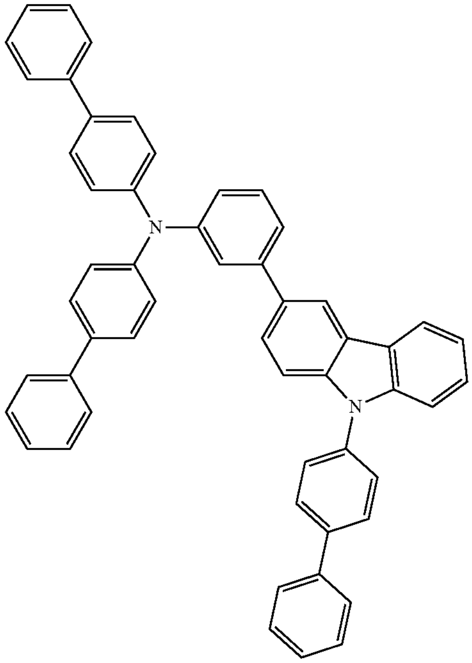

-continued
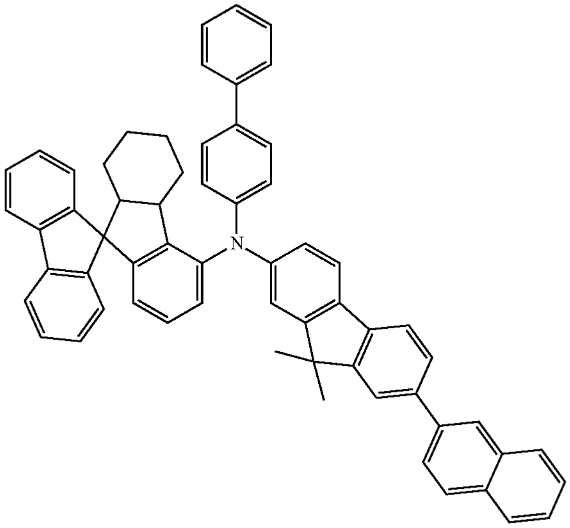
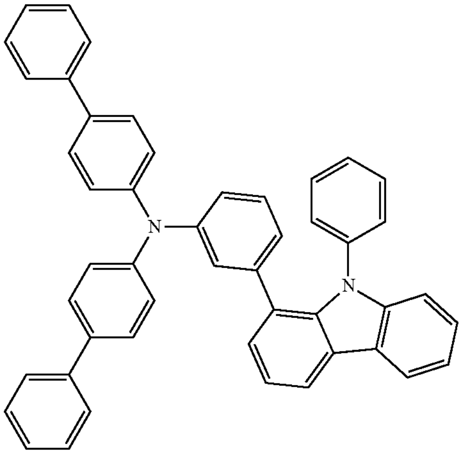
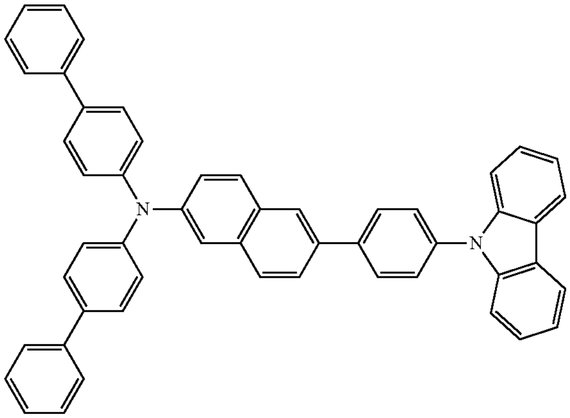

-continued
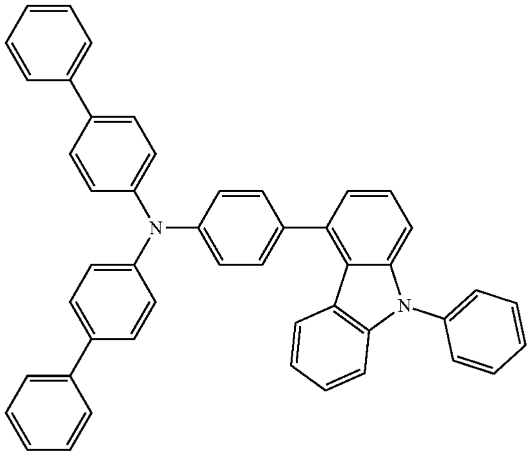
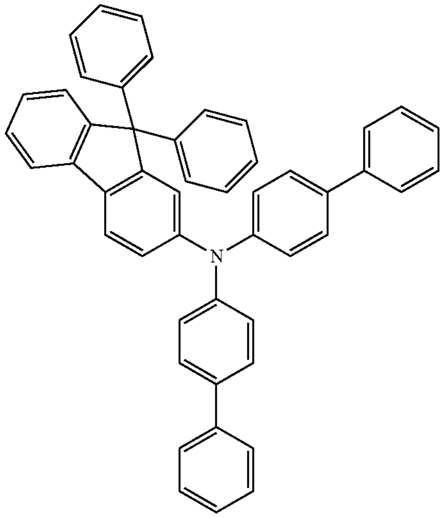
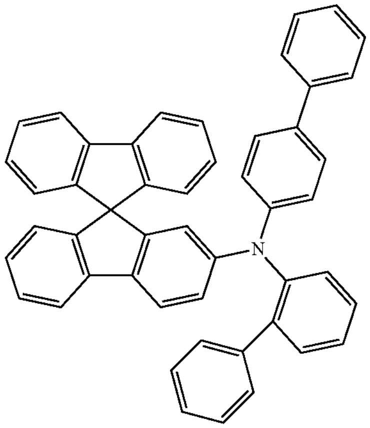

-continued
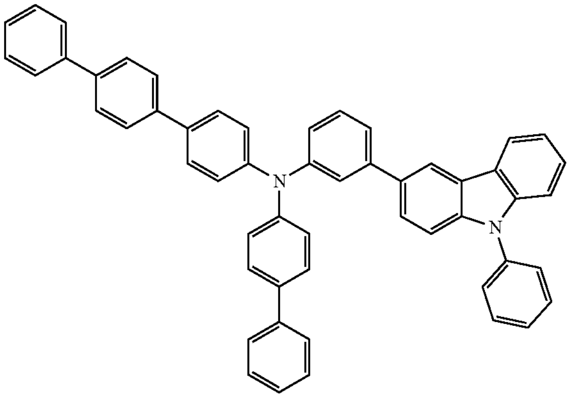
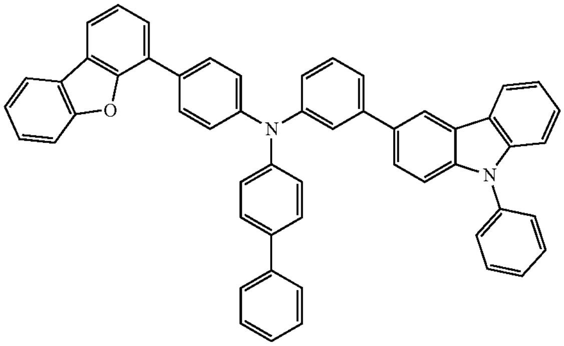
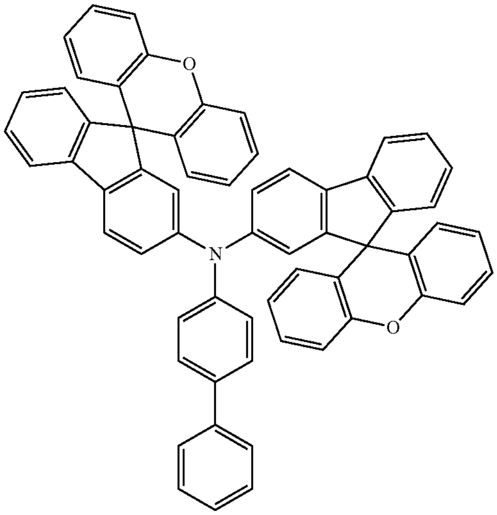
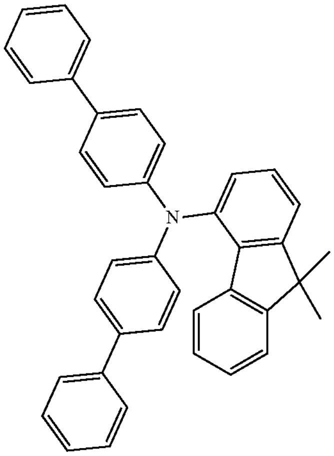

-continued
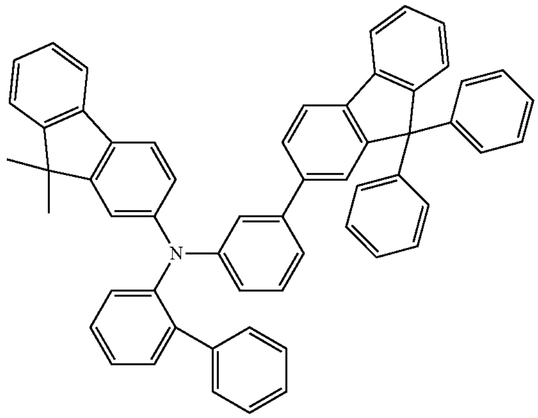
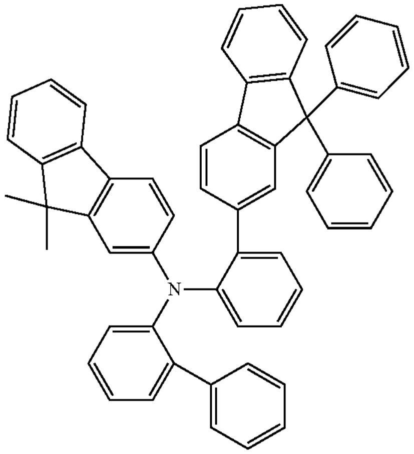
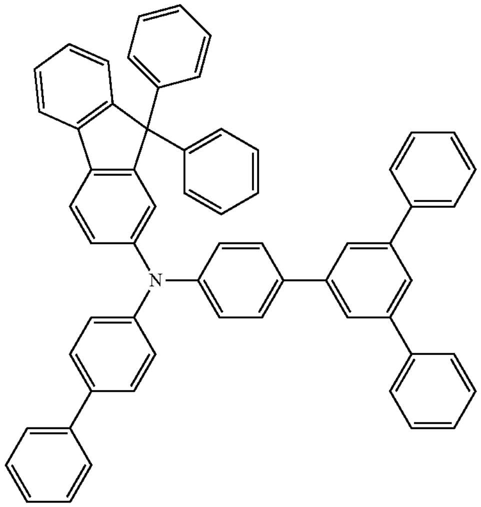
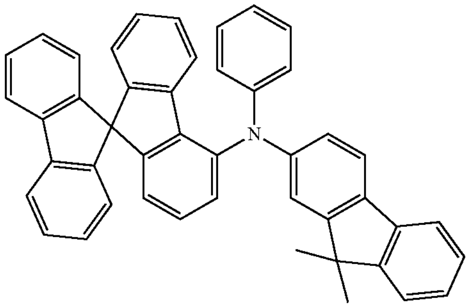

-continued
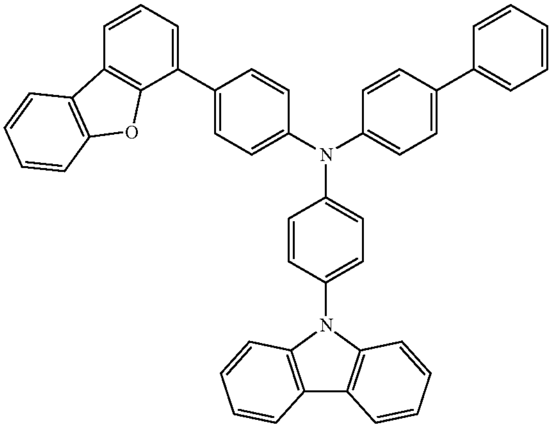
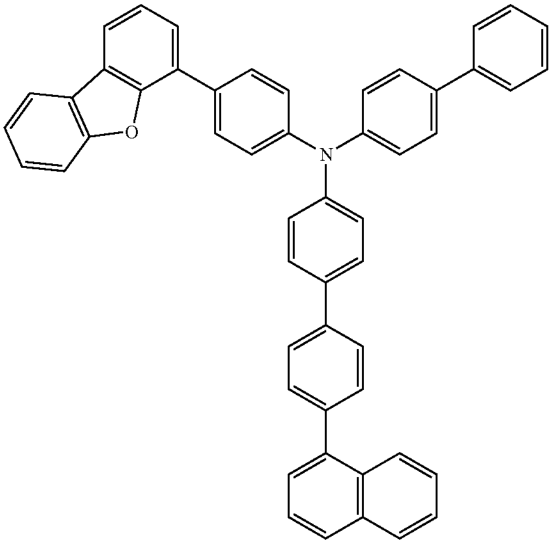
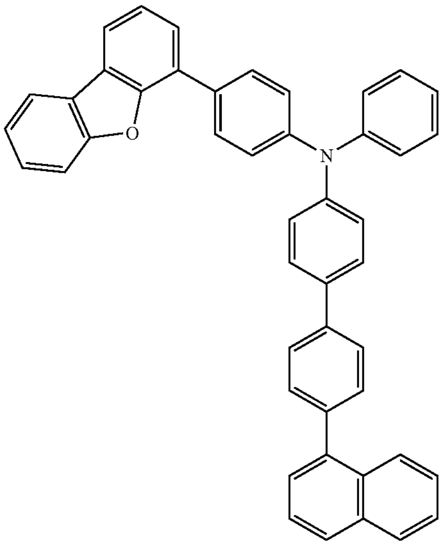

-continued
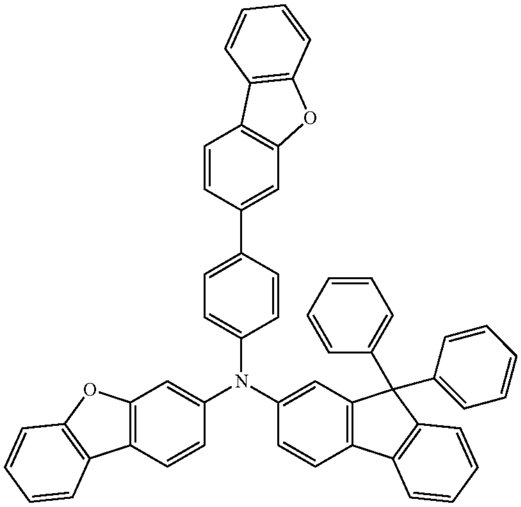
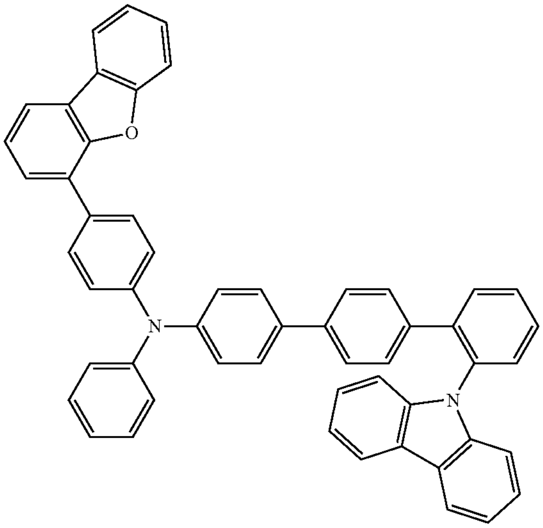
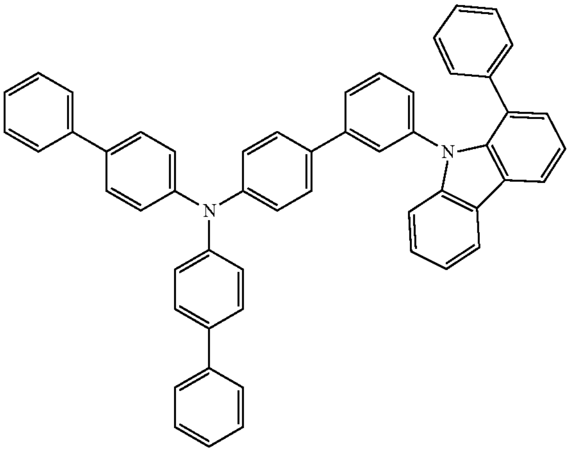

-continued
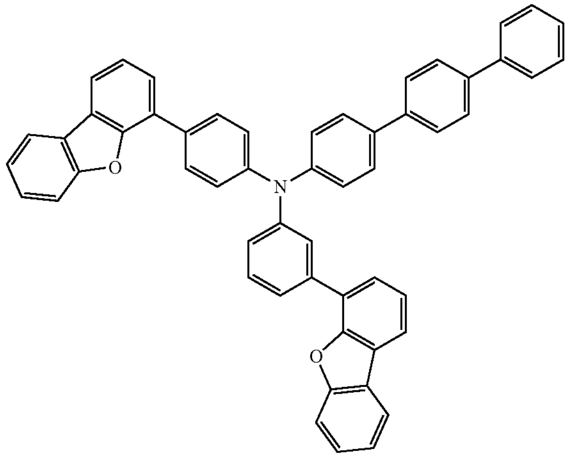
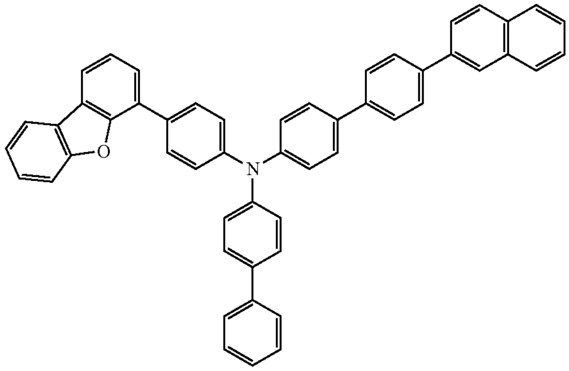
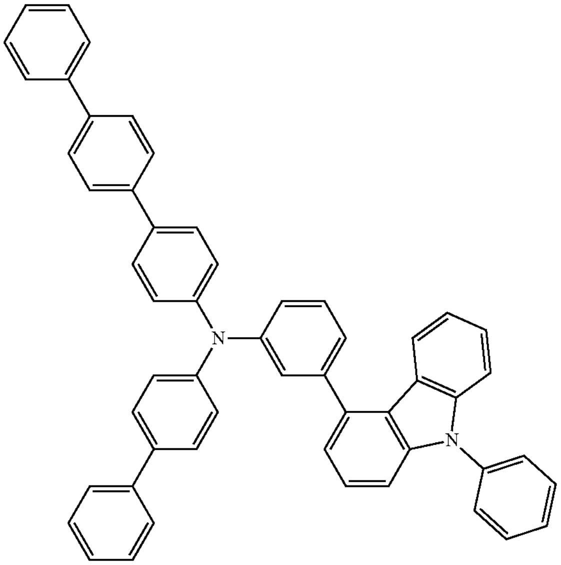

-continued
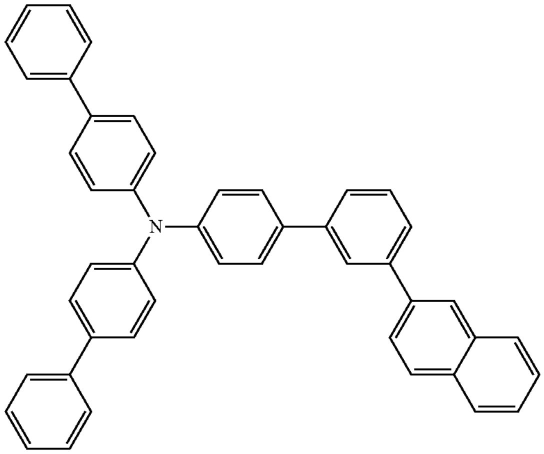
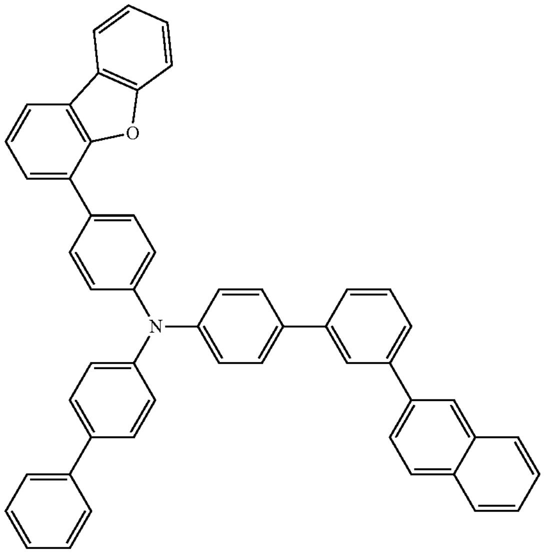
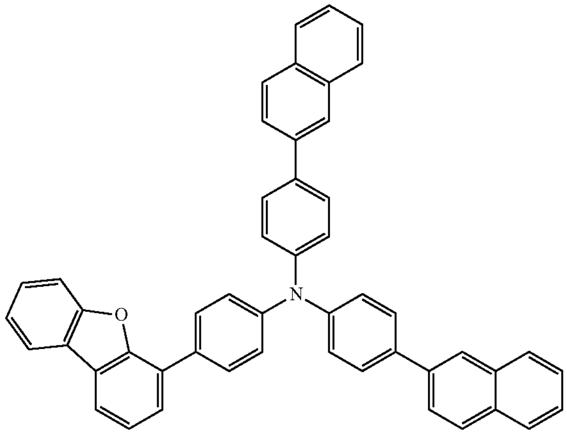

-continued

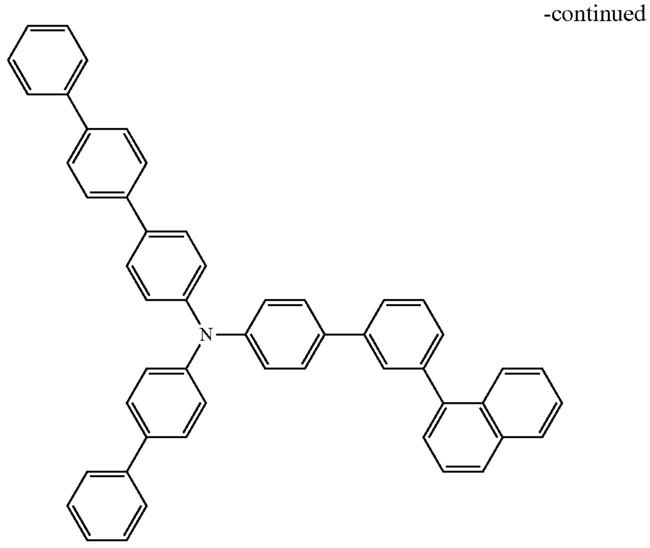

Examples of Compound Contained in First Anode Side Organic Layer

In an arrangement of the organic EL device according to the exemplary embodiment, it is preferable that the second organic material (first hole transporting zone material) contained in the first anode side organic layer is at least one compound selected from compounds below.

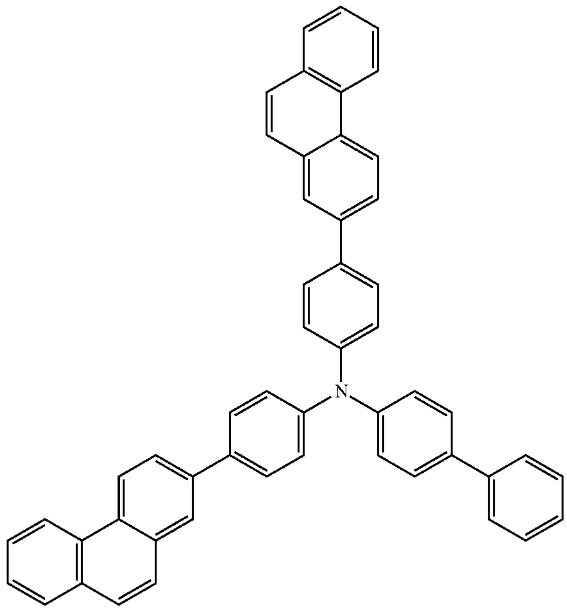

-continued

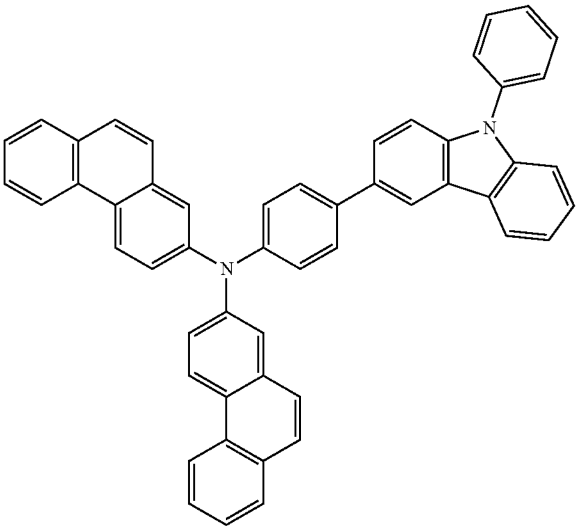

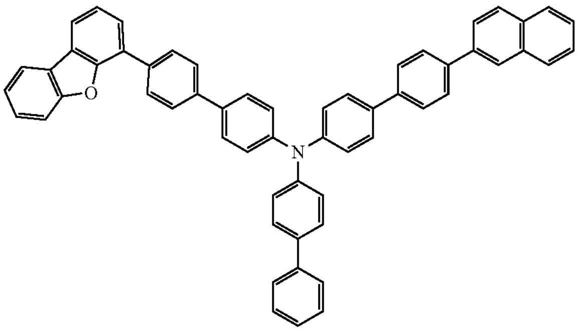

-continued
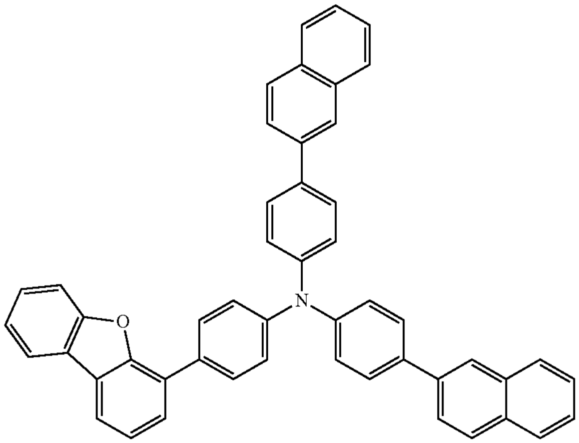
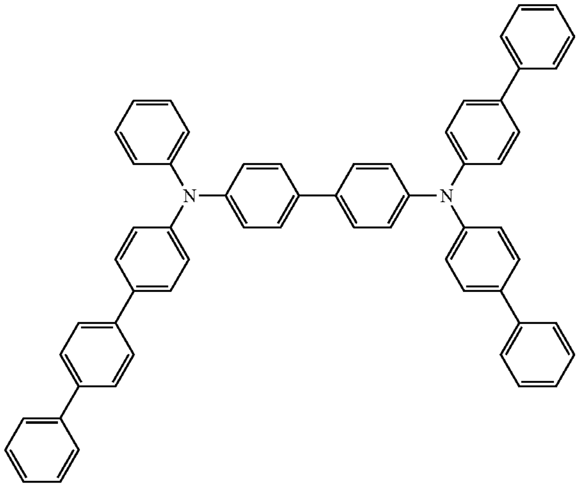
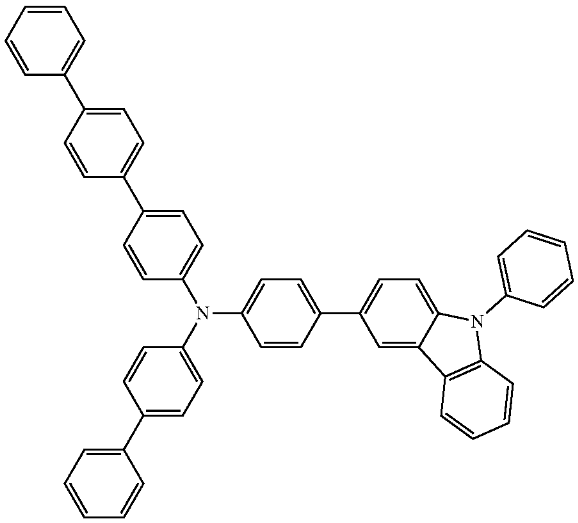
-continued
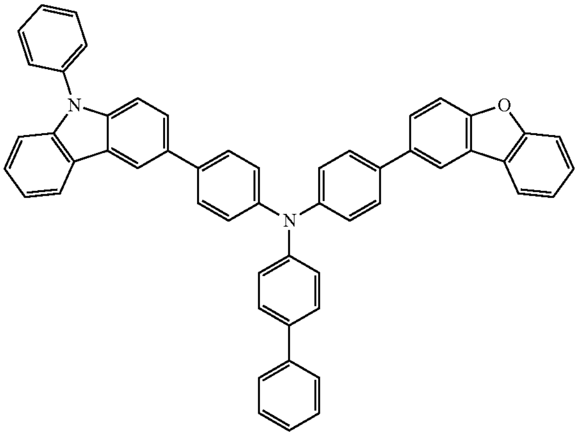
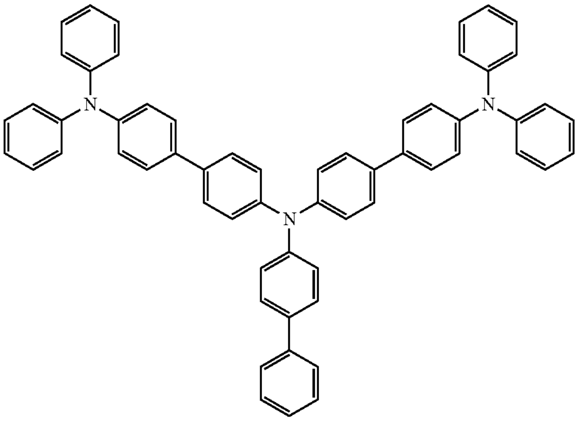
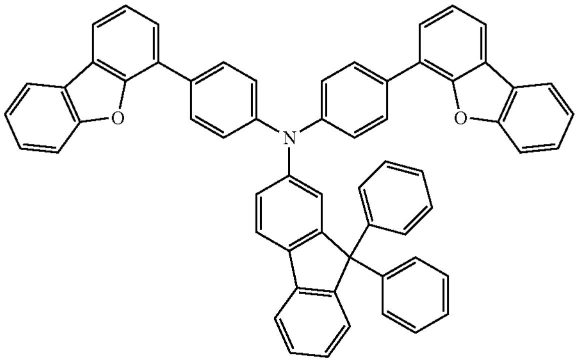
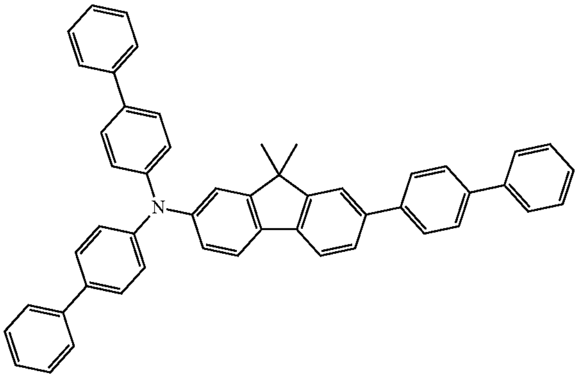

-continued
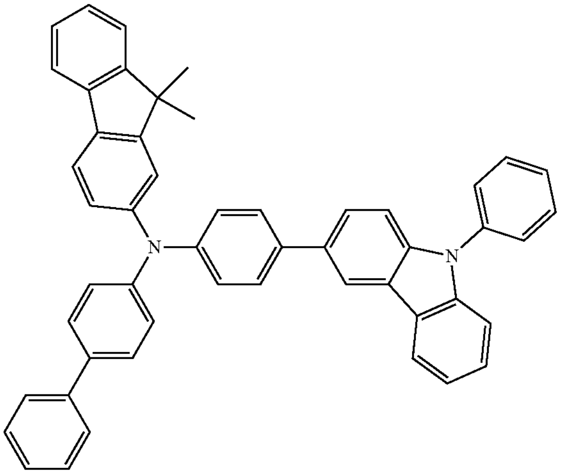
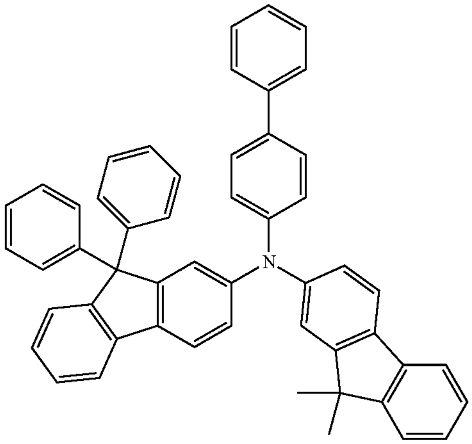
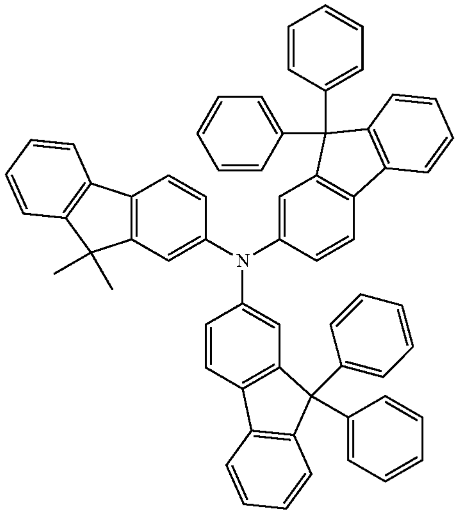
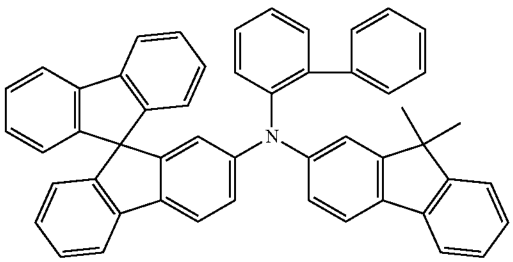
-continued
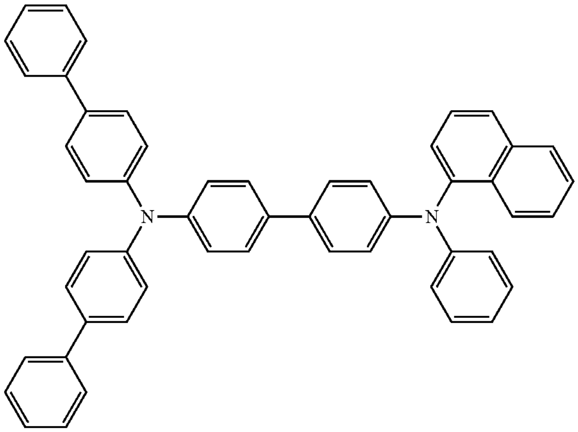
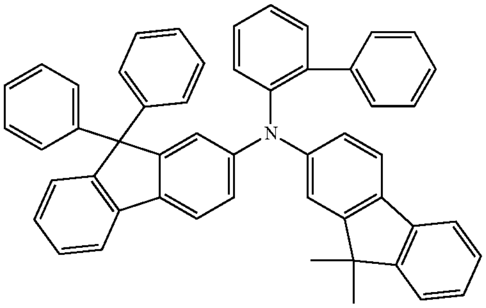
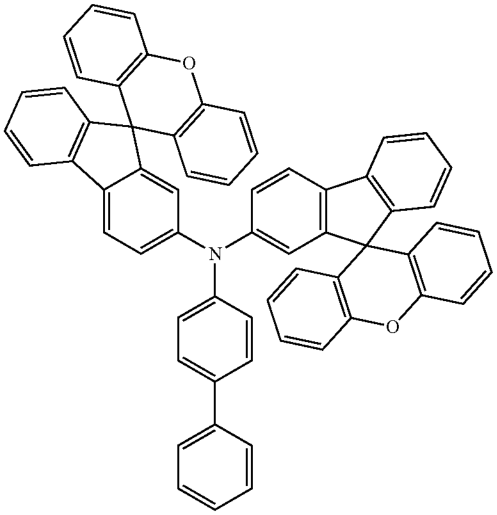

-continued
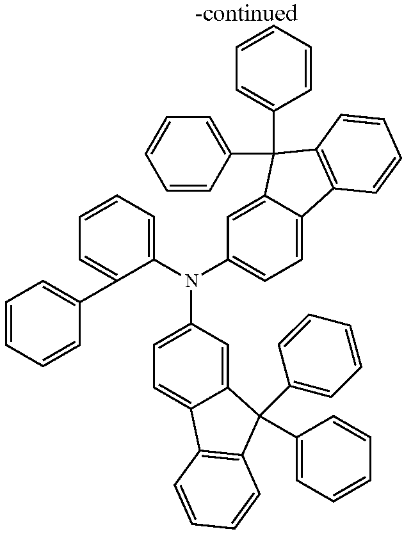
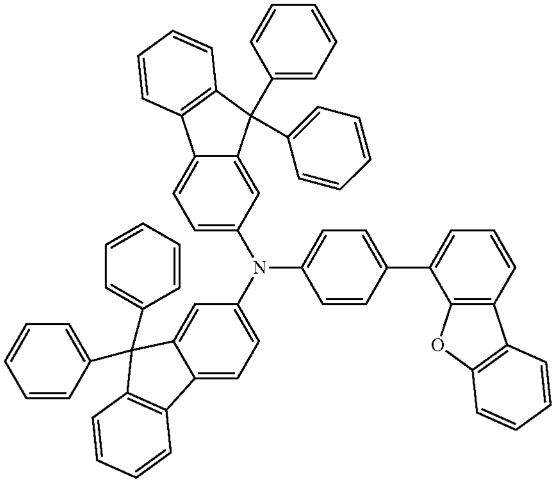
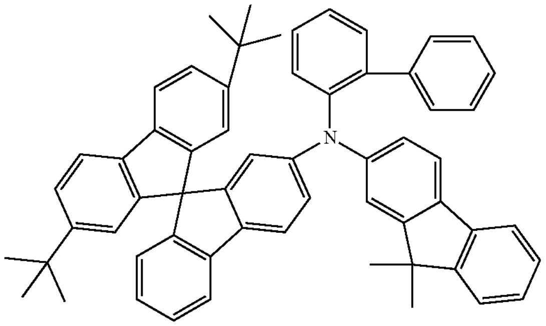
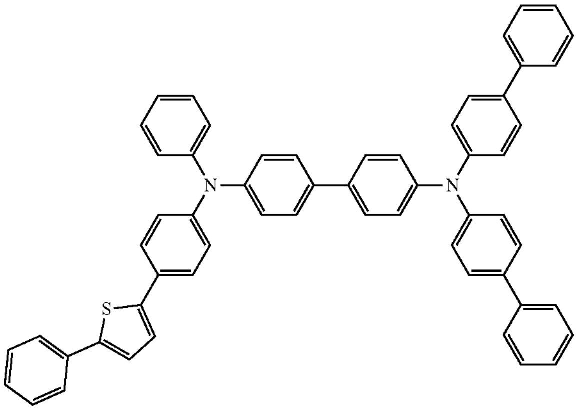
-continued
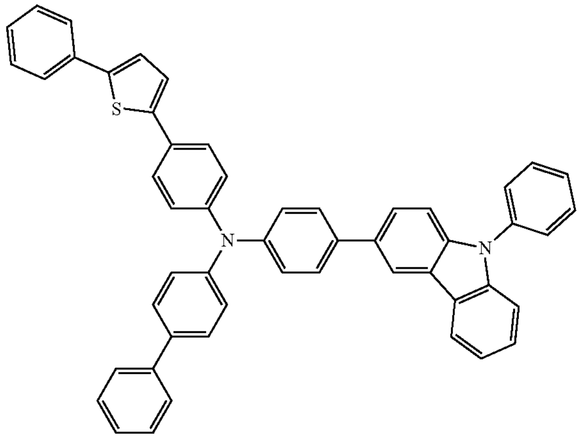
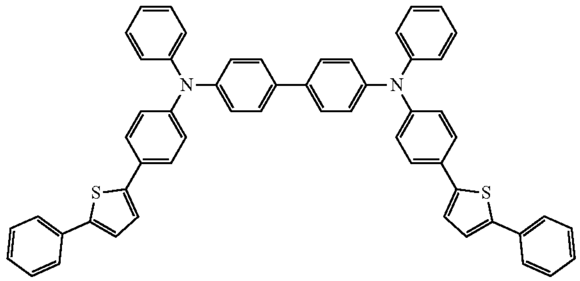
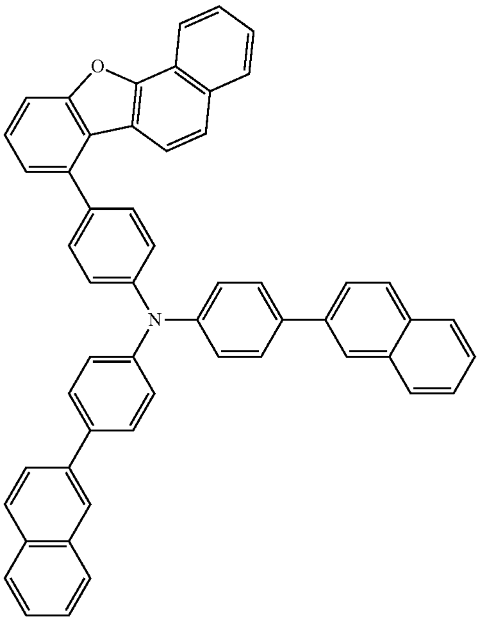

-continued
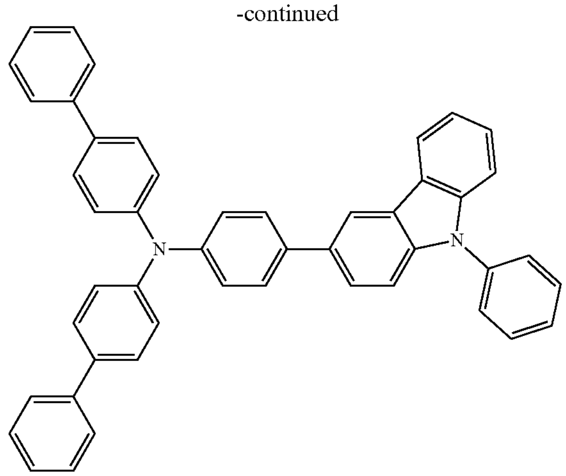
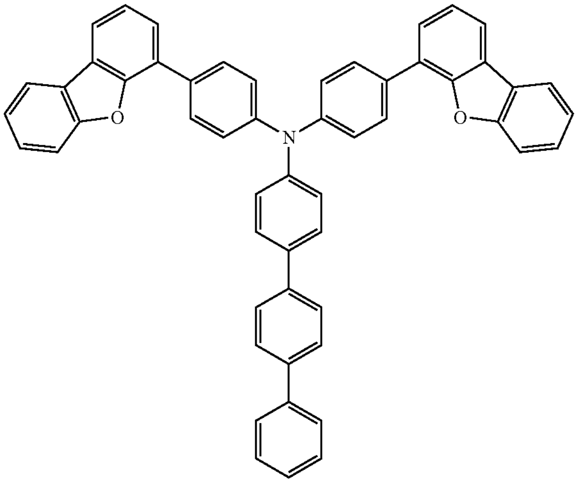
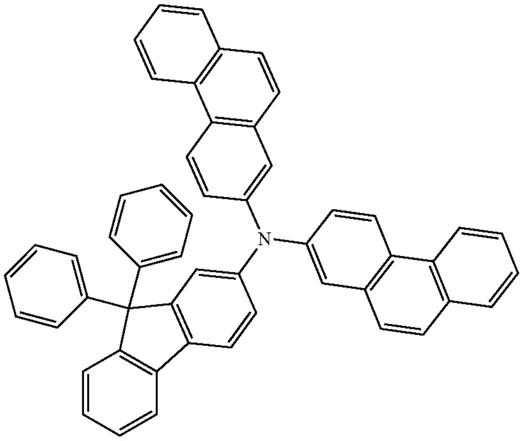
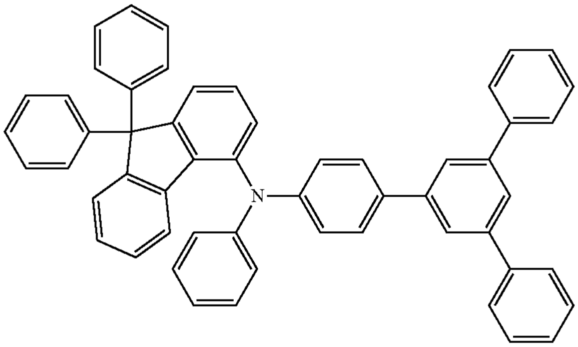
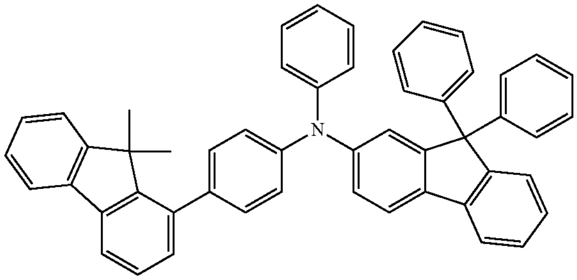
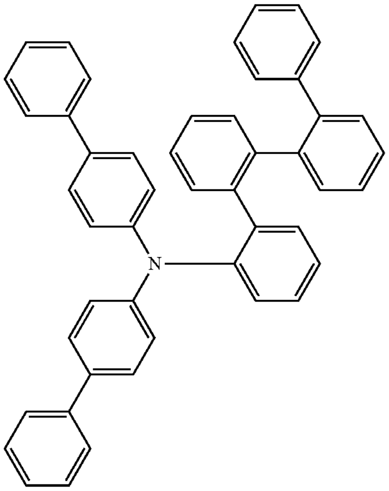
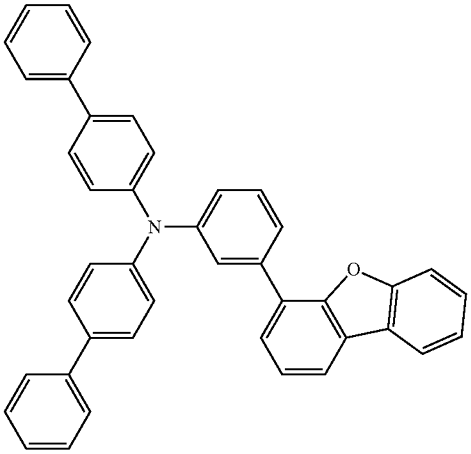
Examples of Compound Contained in Second Anode Side Organic Layer
In an arrangement of the organic EL device according to the exemplary embodiment, it is preferable that the compound (second hole transporting zone material) contained in the second anode side organic layer is at least one compound selected from compounds below.

-continued
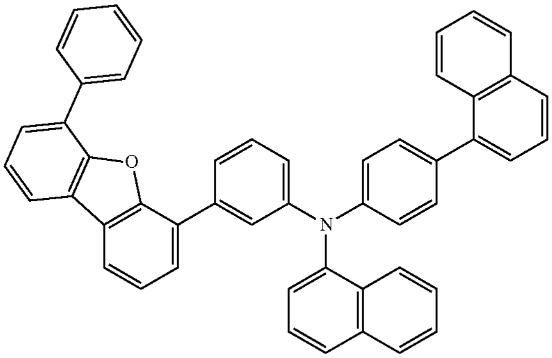
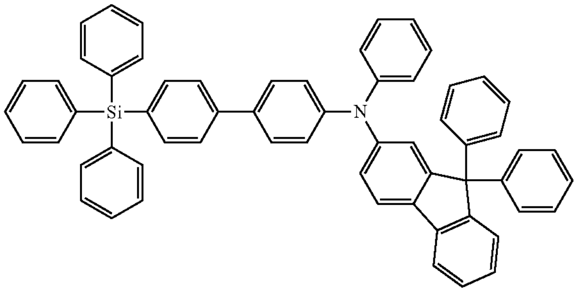
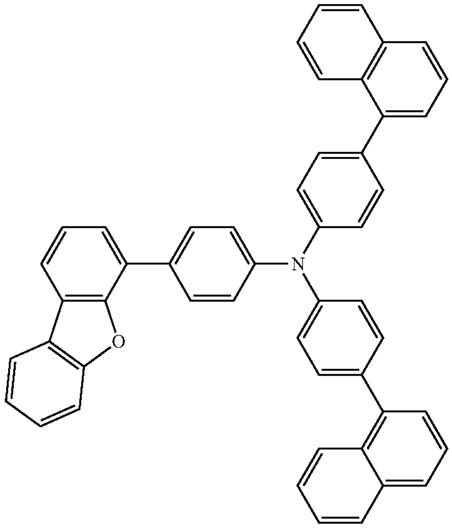
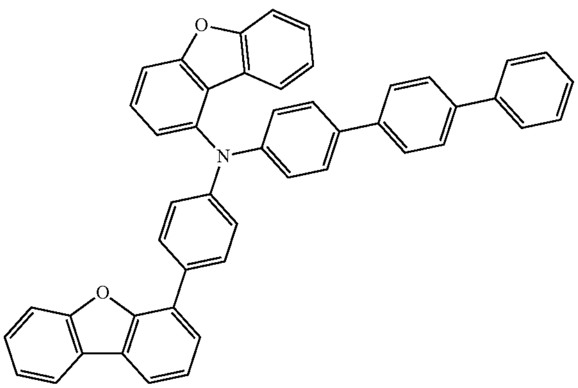
-continued
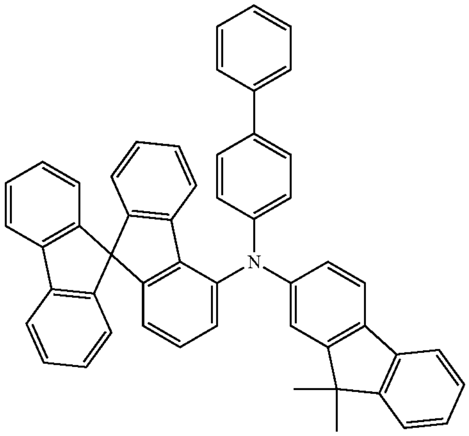
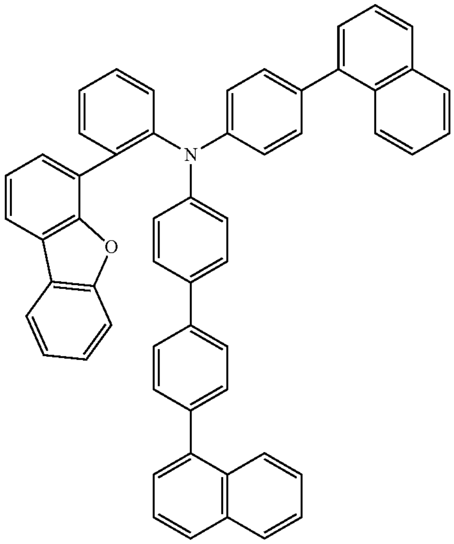
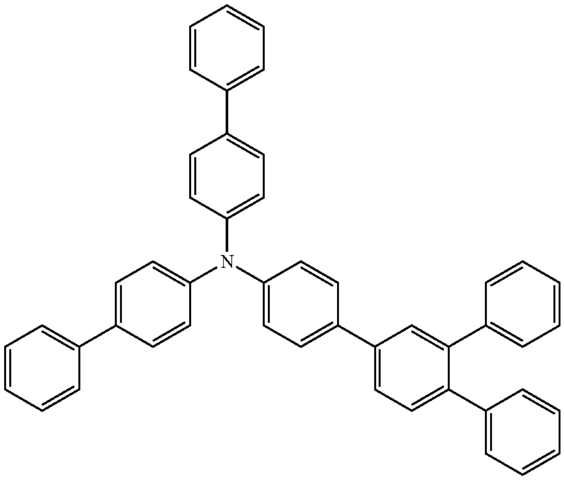

-continued

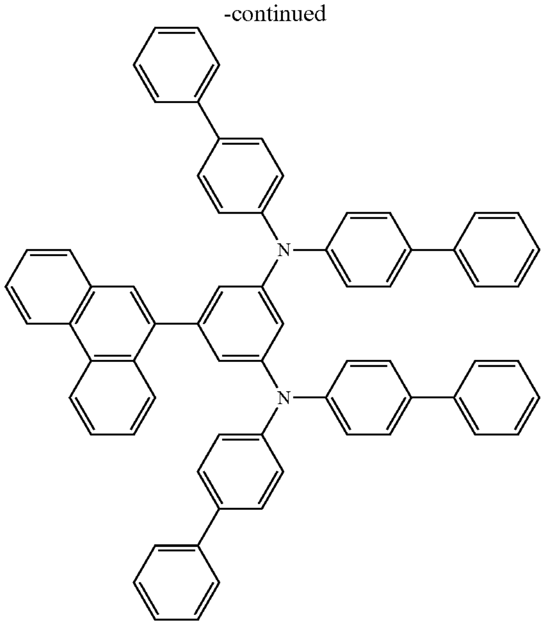

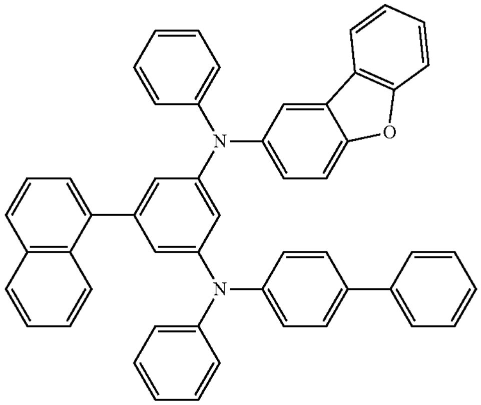

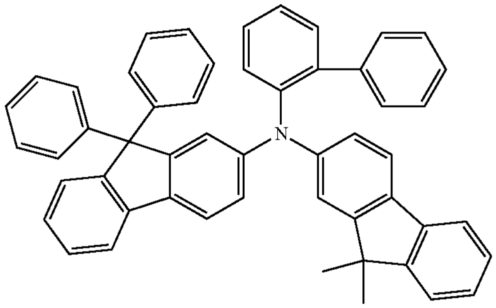

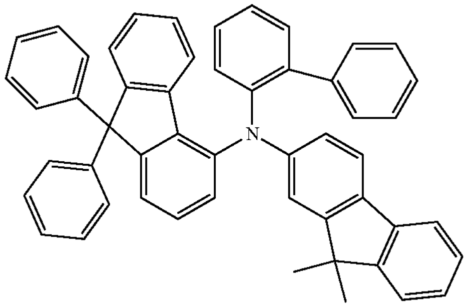

-continued

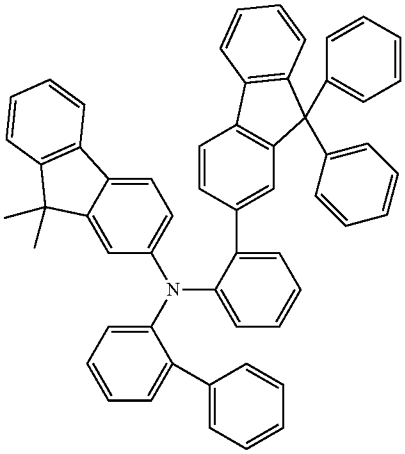

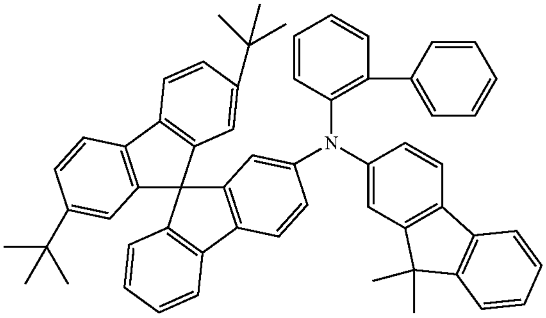

It should be noted that compounds shown as examples of compounds contained in the first anode side organic layer, the second anode side organic layer and the third anode side organic layer may overlap with each other; however, in the exemplary embodiment, different compounds can be appropriately selected from among these shown compounds, as compounds usable in the first anode side organic layer, the second anode side organic layer and the third anode side organic layer.

Specific Examples of Doped Compound

Specific examples of the doped compound include the following compounds. It should however be noted that the invention is not limited to the specific examples of the doped compound.

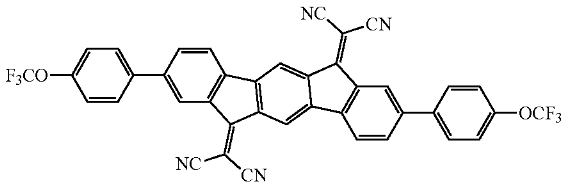
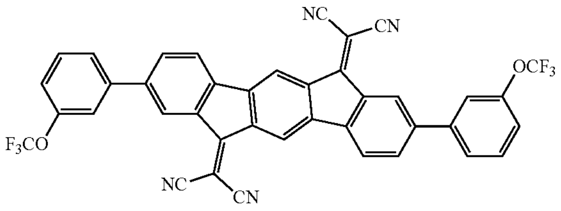
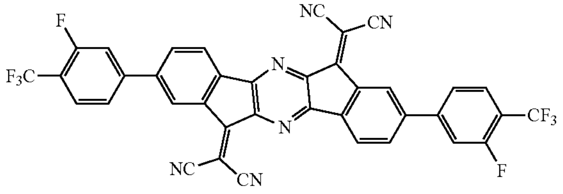
(A-1)
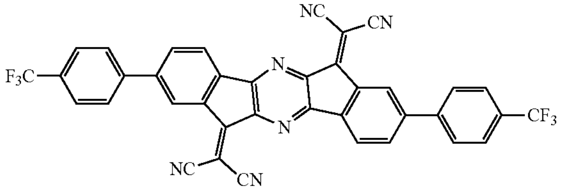
(A-2)
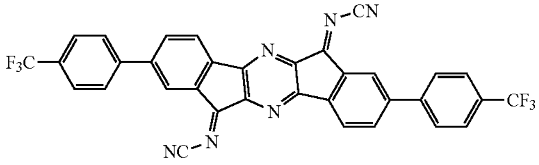
(A-3)
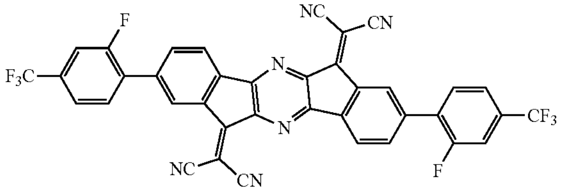
(A-4)
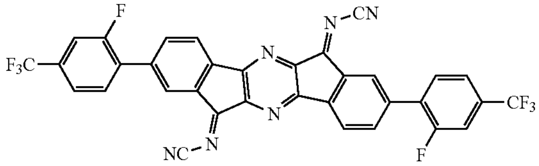
(A-5)
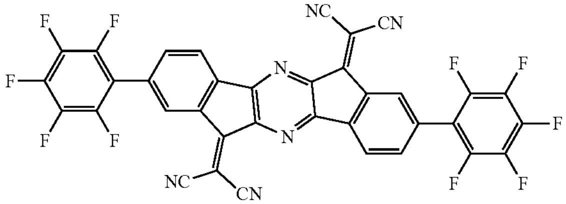
(A-6)
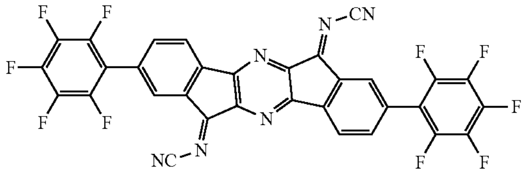
(A-7)
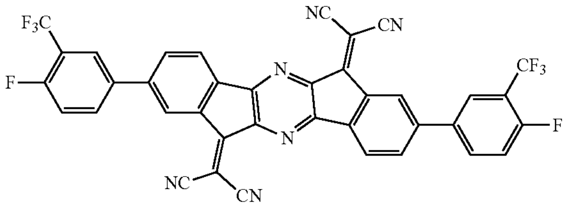
(A-8)
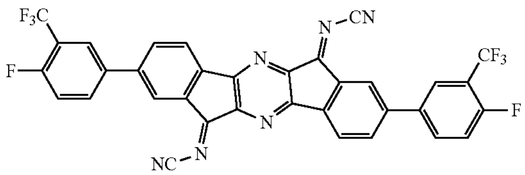
(A-9)
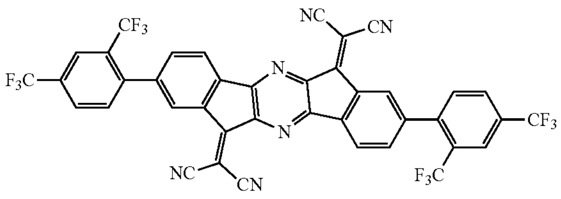
(A-10)
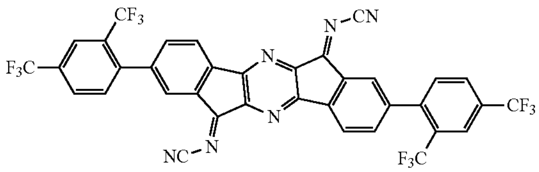
(A-11)
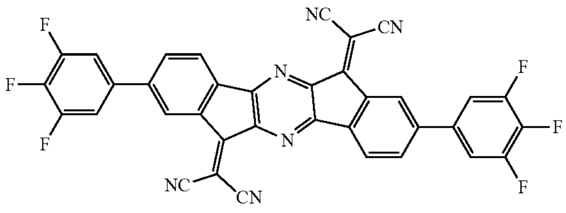

-continued
(A-12)
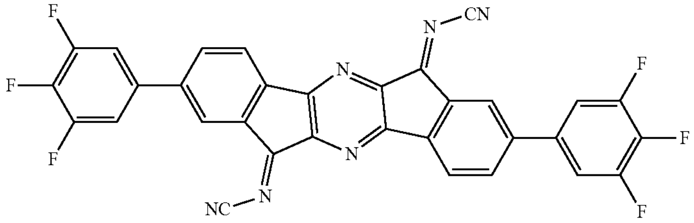
(A-13)
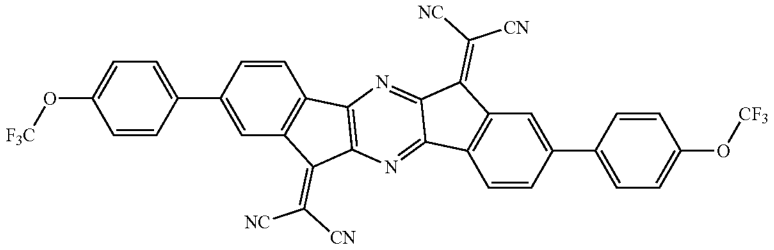
(A-14)
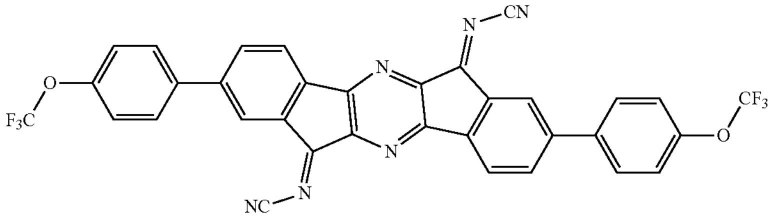
(A-15)
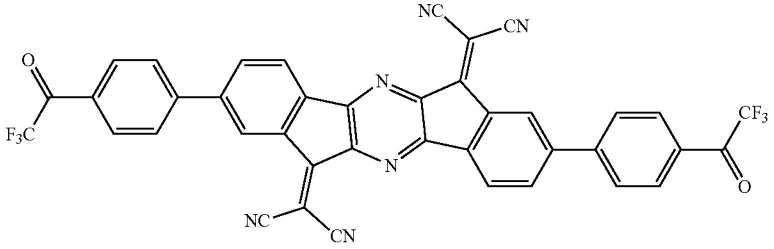
(A-16)
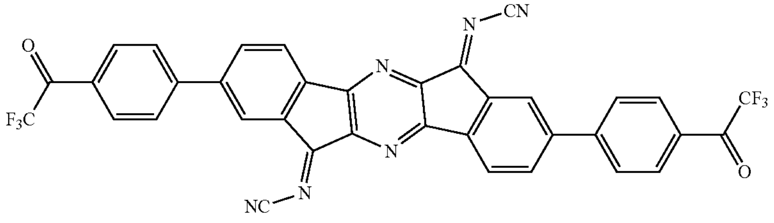
(A-17)
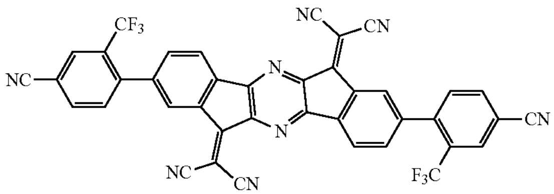
(A-18)
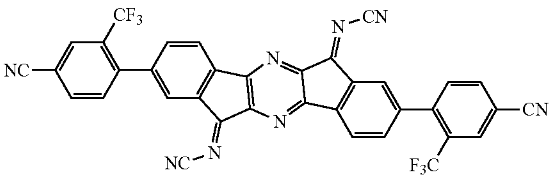

-continued
(A-19)
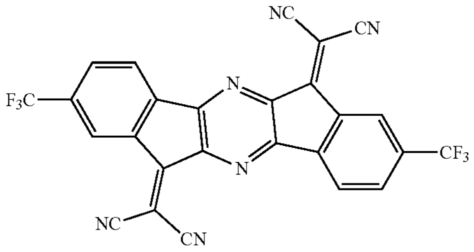
(A-20)
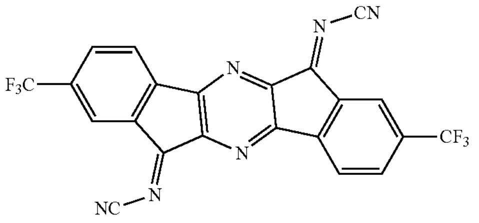
(A-21)
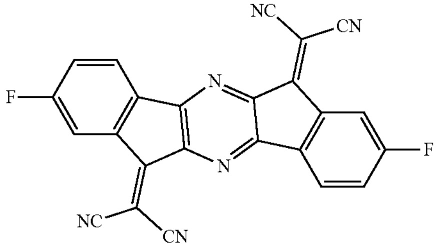
(A-22)
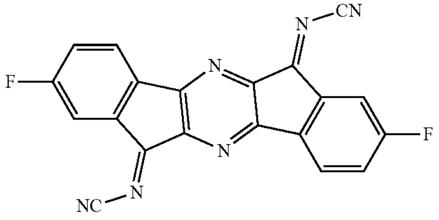
(A-23)
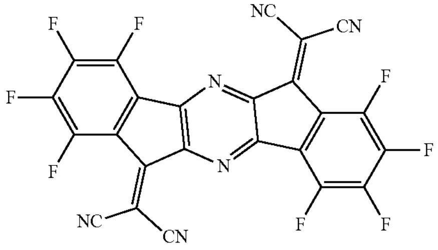
(A-24)
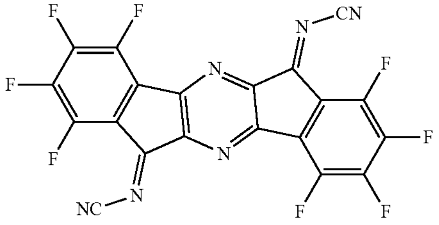
(A-25)
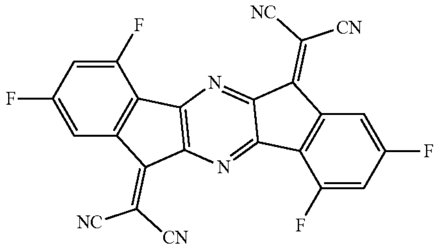
(A-26)
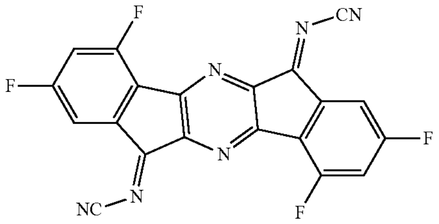
(A-27)
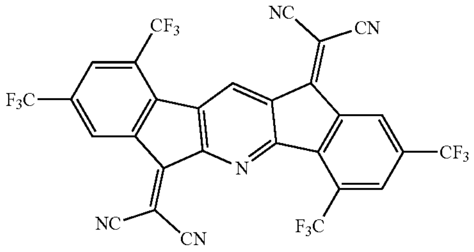
(A-28)
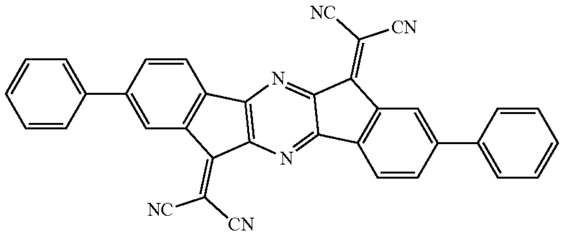

-continued
(A-29)
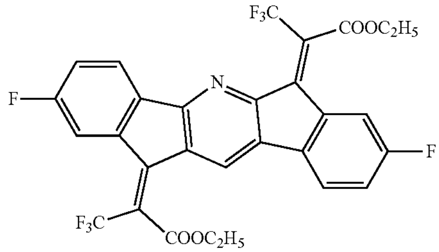
(A-30)
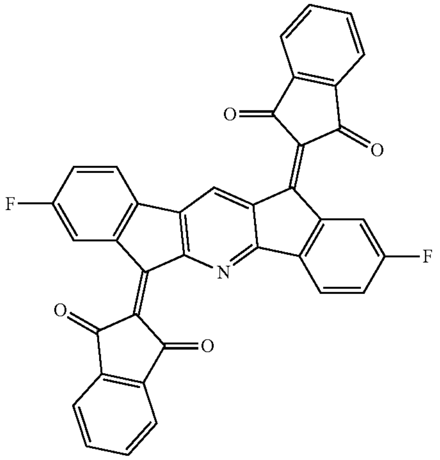
(A-31)
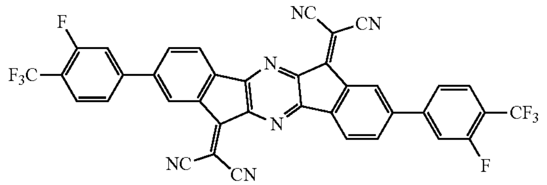
(A-32)
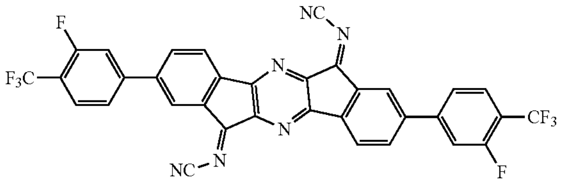
(A-33)
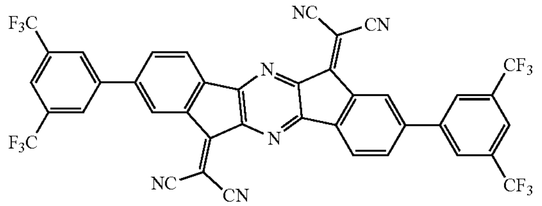
(A-34)
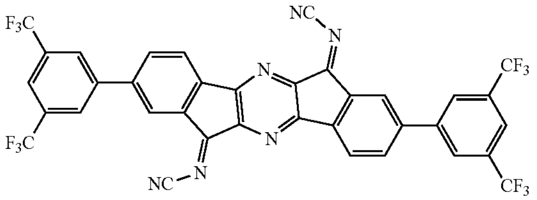
(A-35)
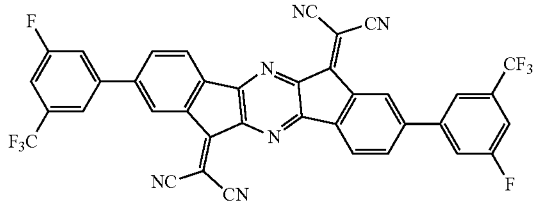
(A-36)
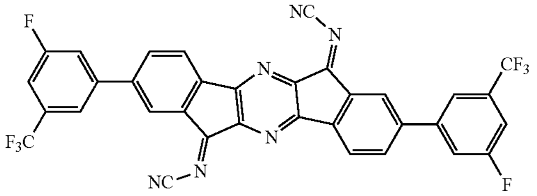
(A-37)
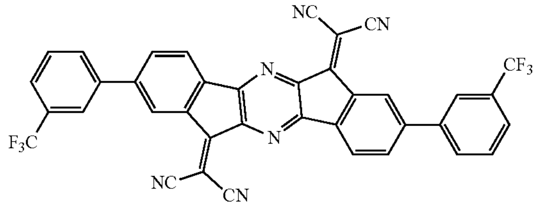
(A-38)
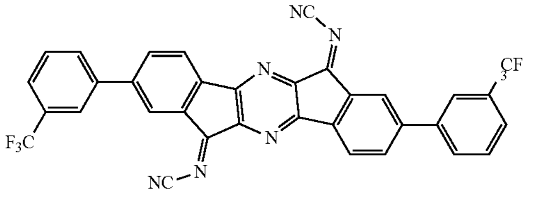
(A-39)
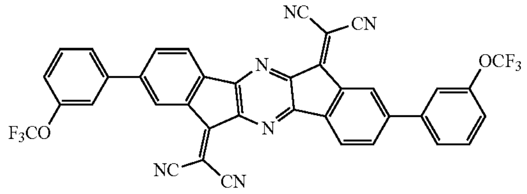
(A-40)
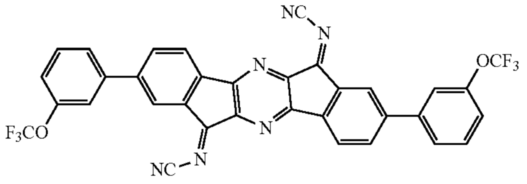

-continued
(A-41)
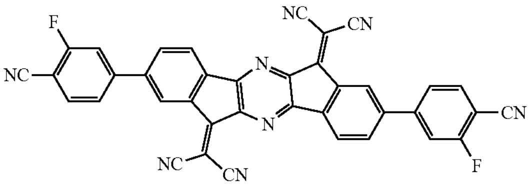
(A-42)
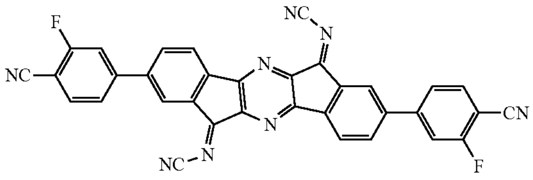
(A-43)
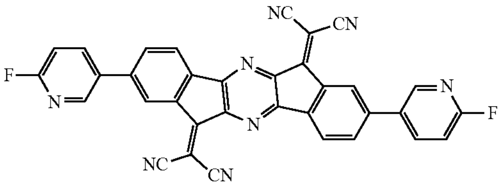
(A-44)
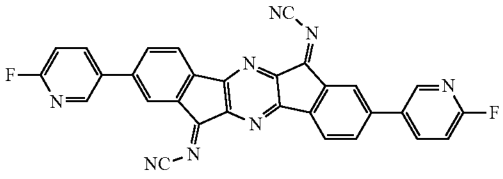
(A-45)
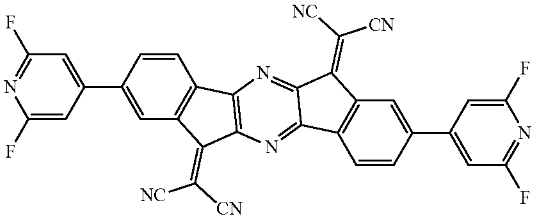
(A-46)
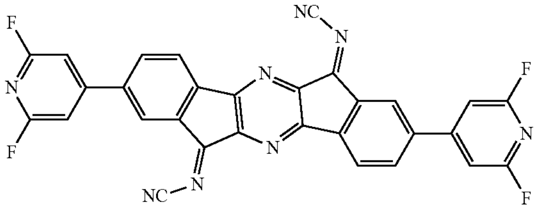
(A-47)
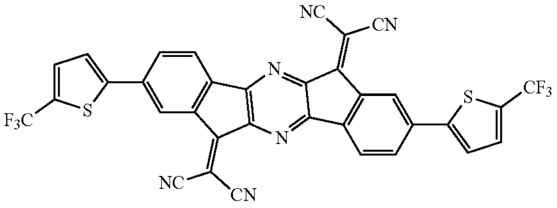
(A-48)
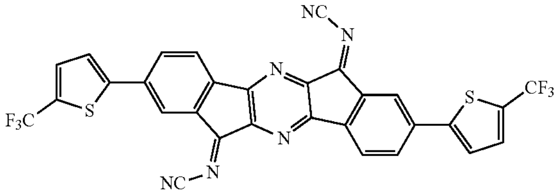
(A-49)
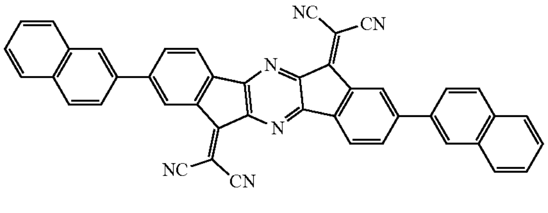
(A-50)
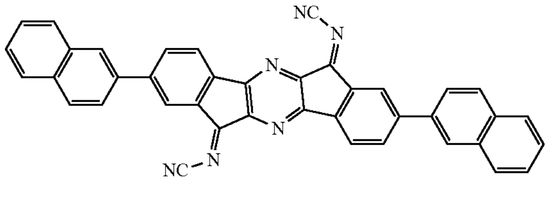
(A-51)
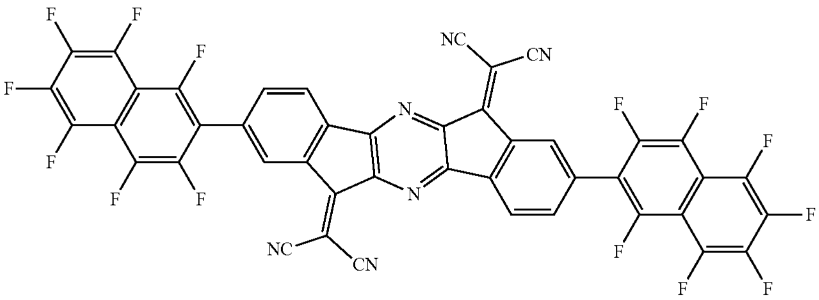

-continued
(A-52)
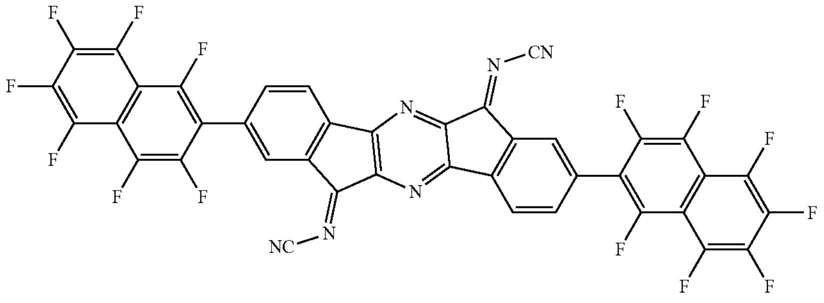
(A-53)
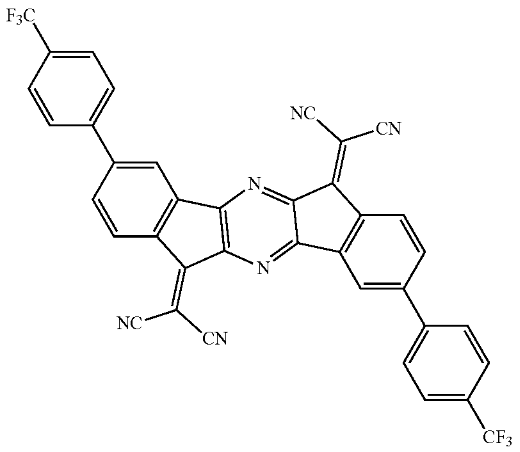
(A-54)
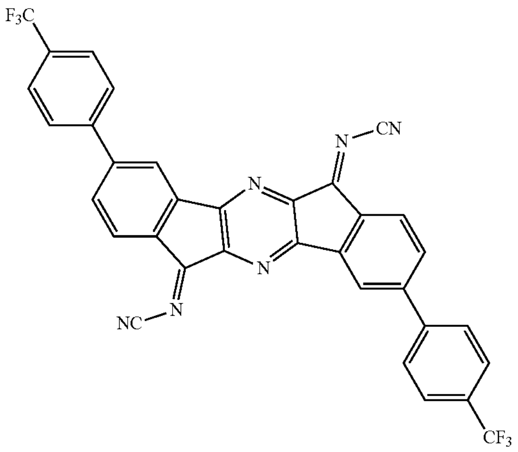
(A-55)
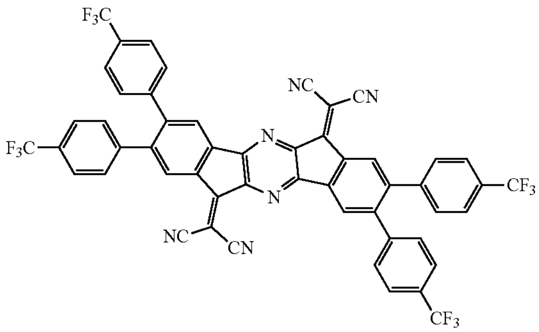
(A-56)
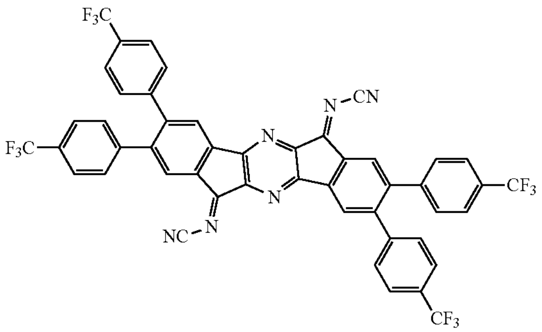
(A-57)
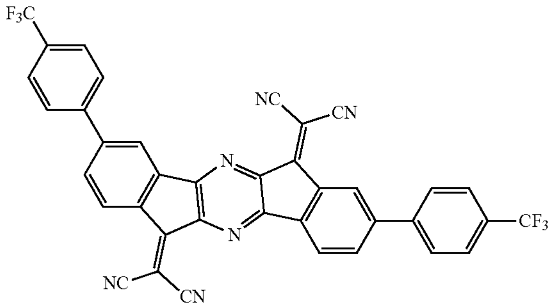
(A-58)
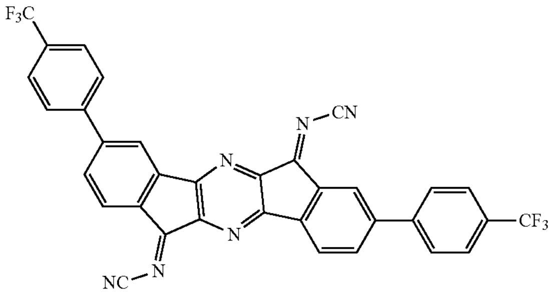

-continued
(A-59)
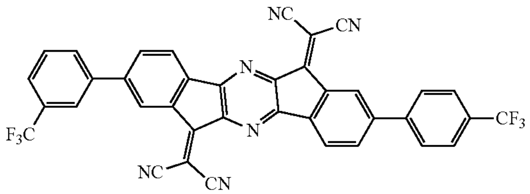
(A-60)
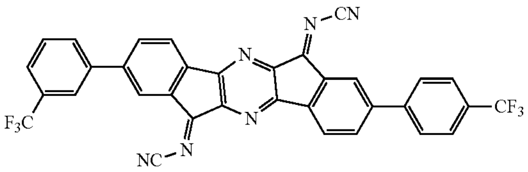
(A-61)
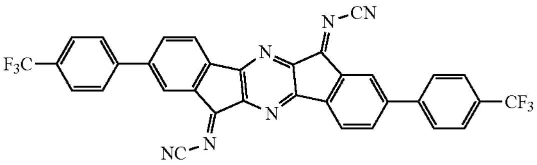
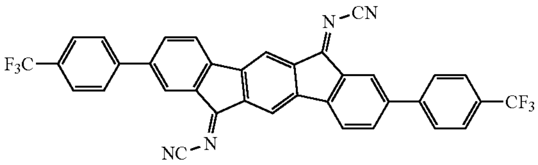
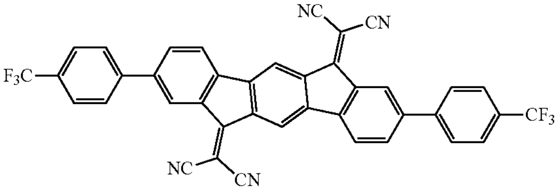
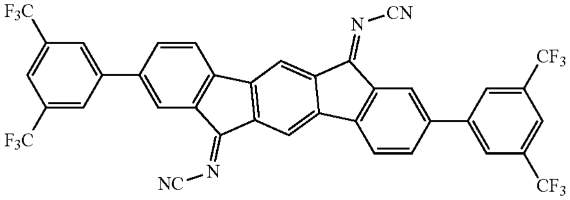
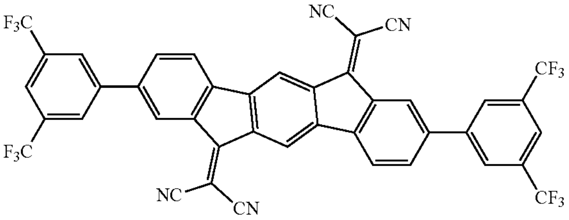
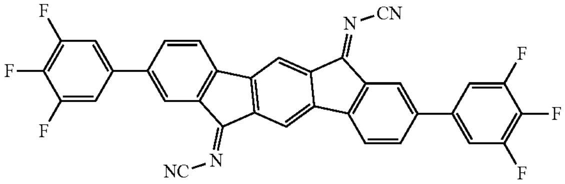
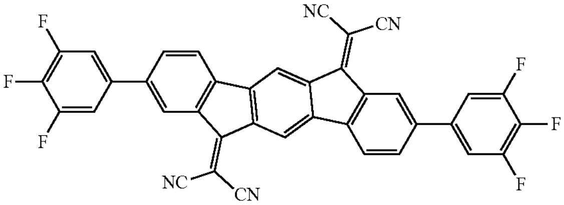
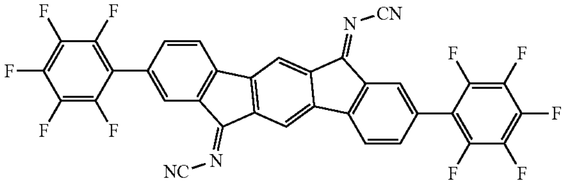
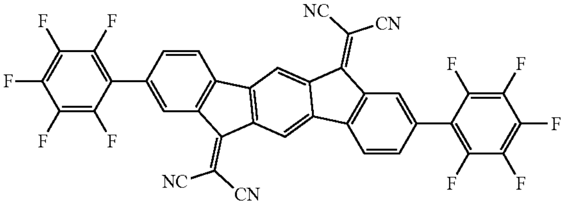
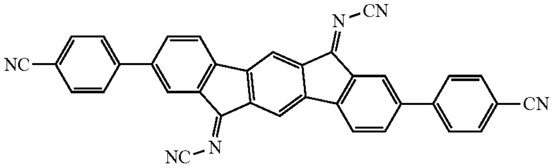
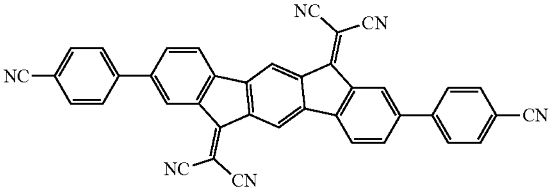
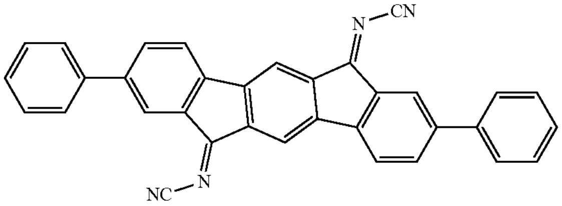
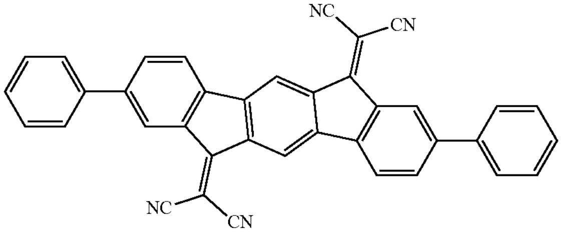
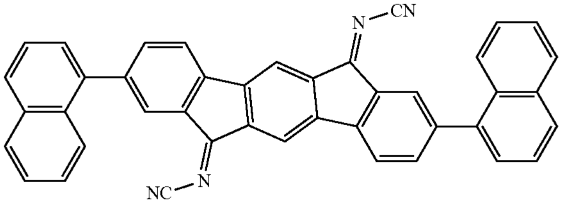

-continued
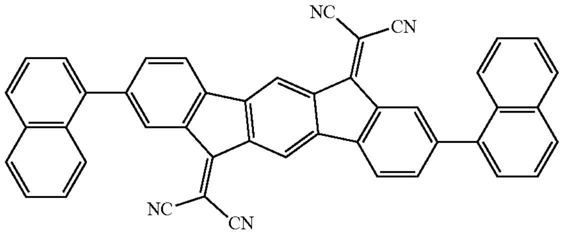
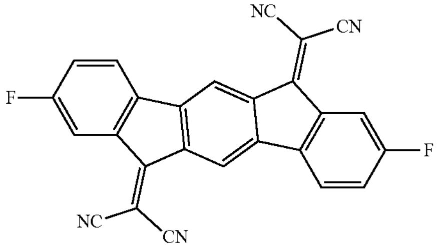
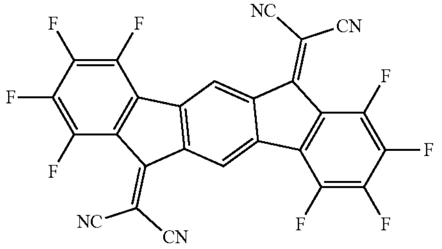
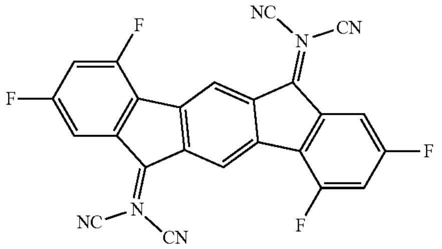
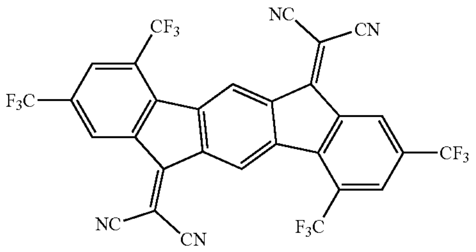
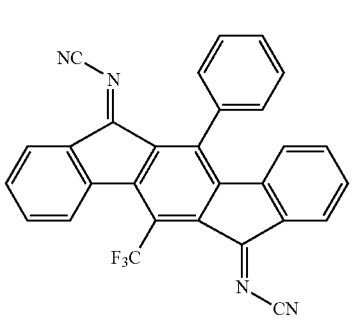
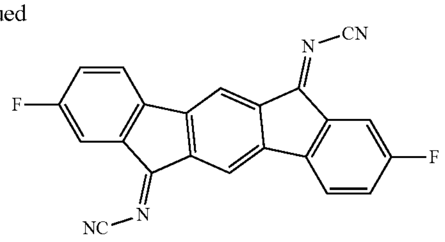
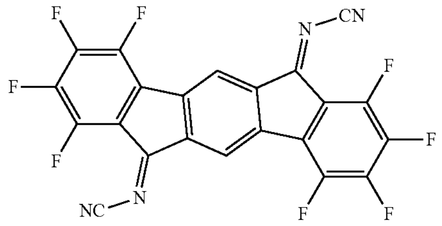
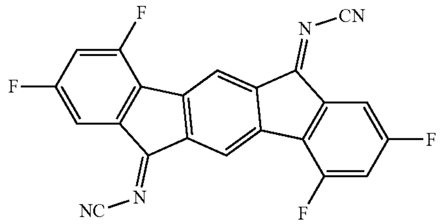
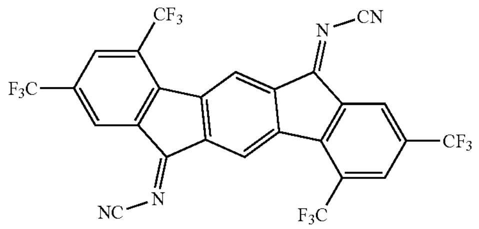
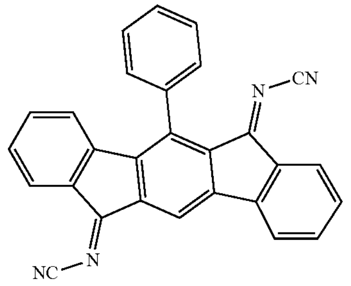
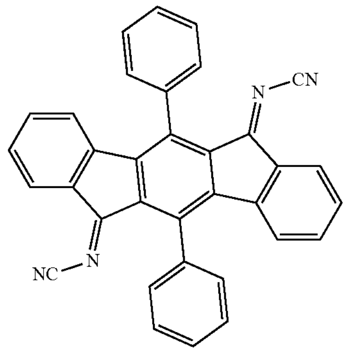

-continued
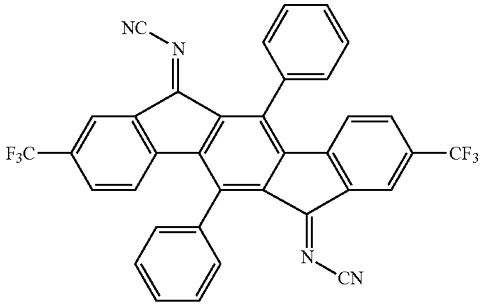
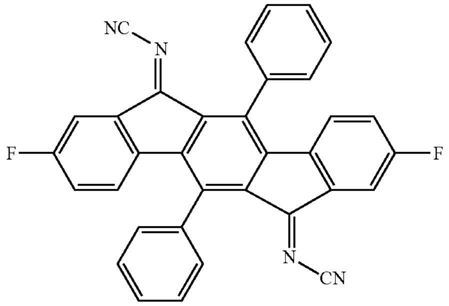
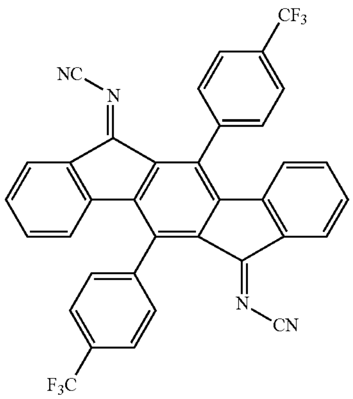
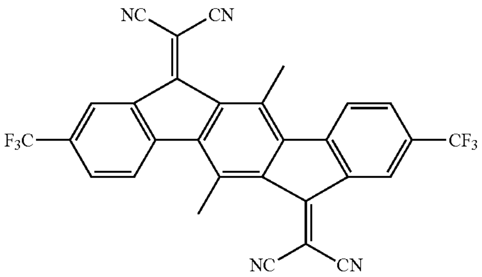
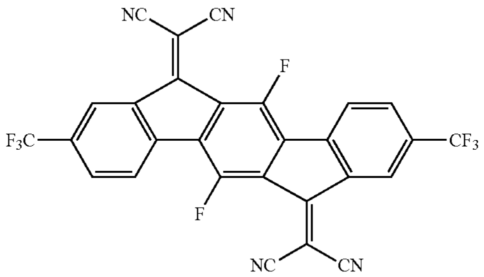
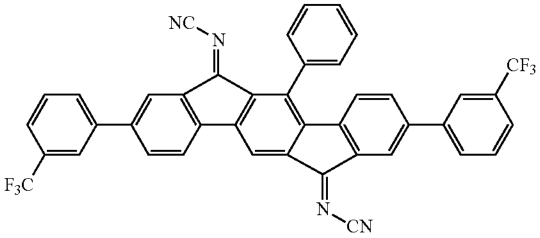
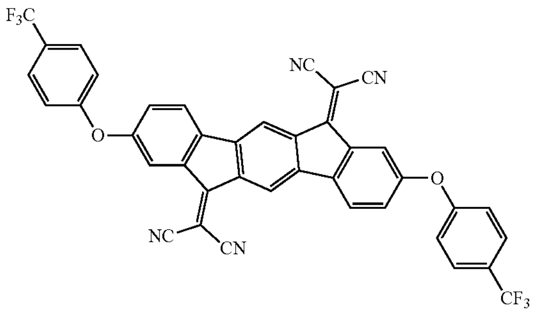
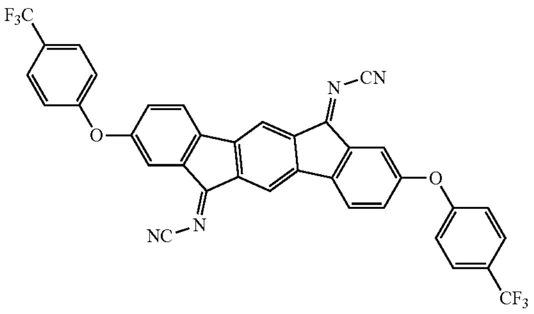
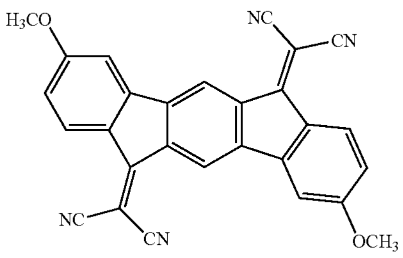
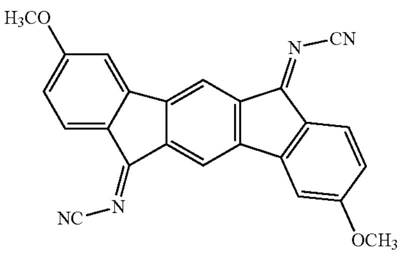

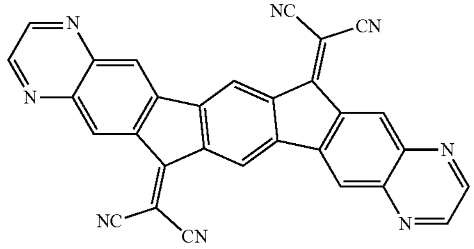
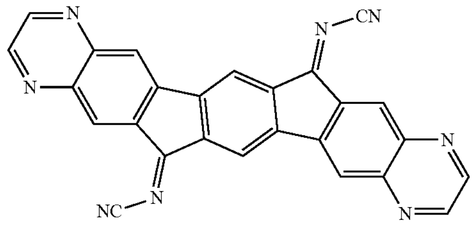
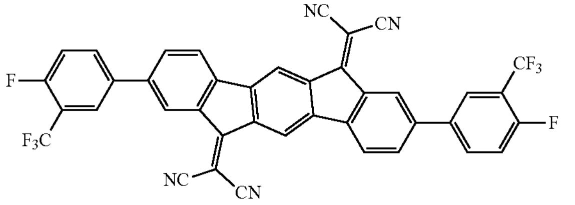
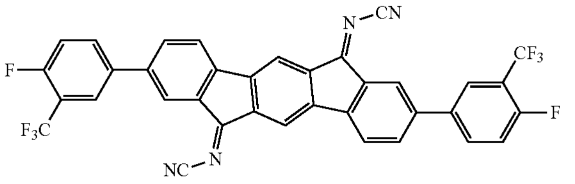
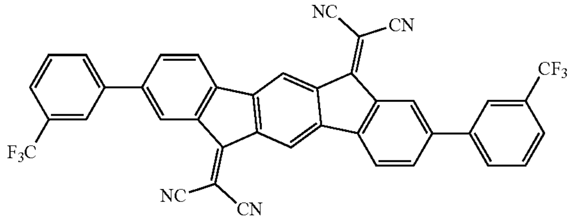
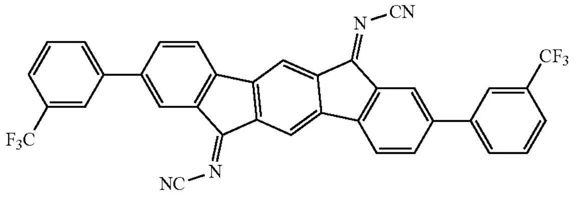
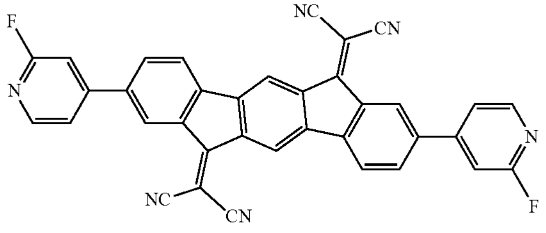
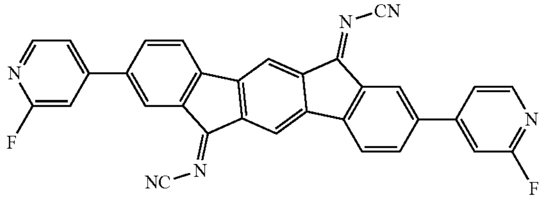
-continued
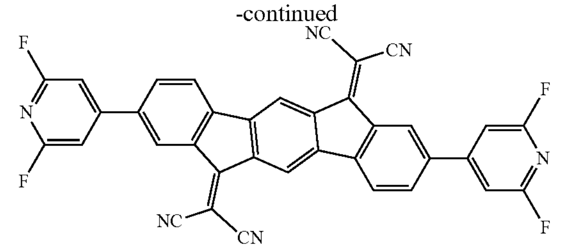
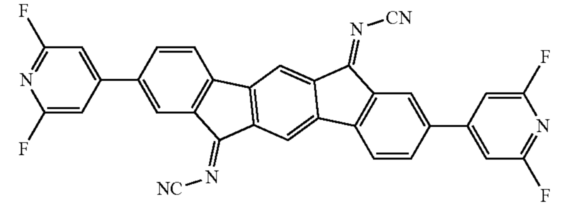
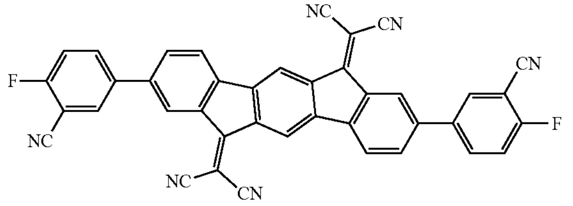
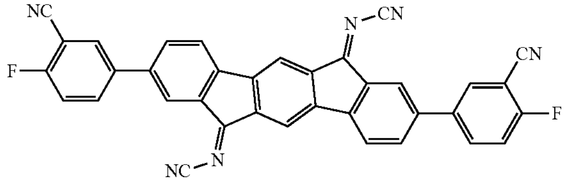
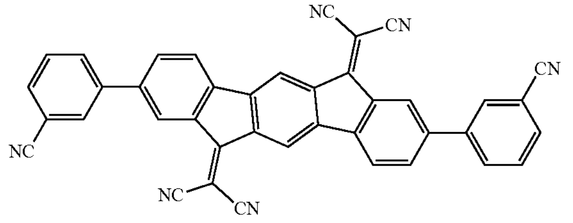
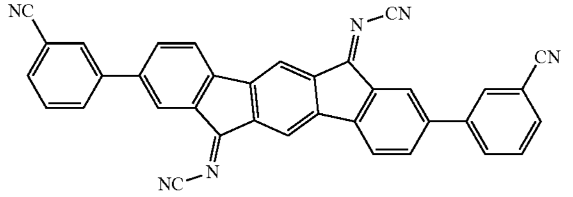
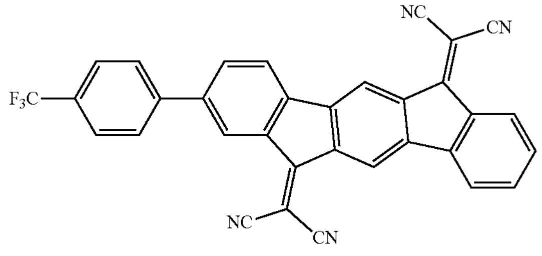
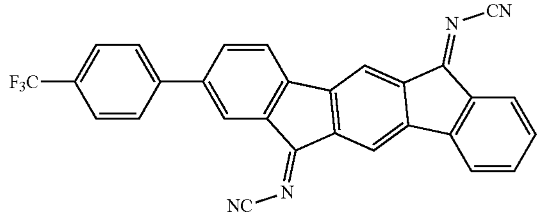

-continued
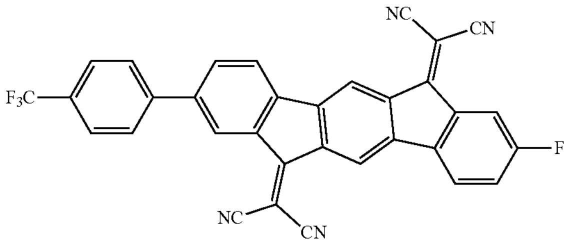
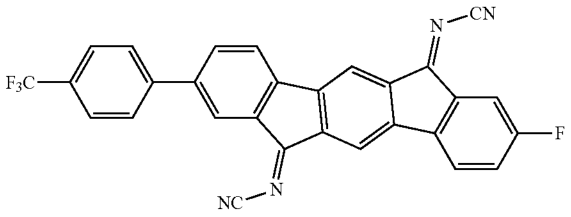
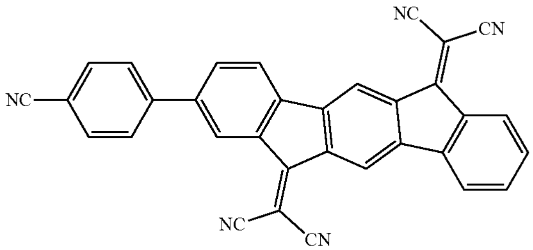
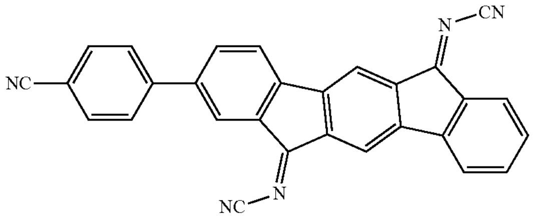
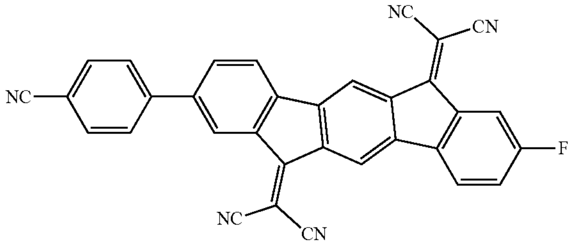
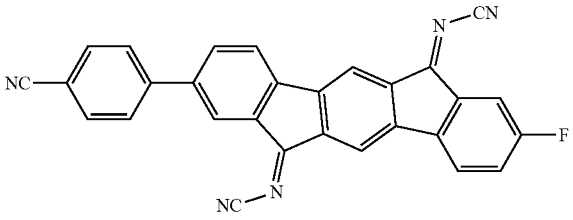
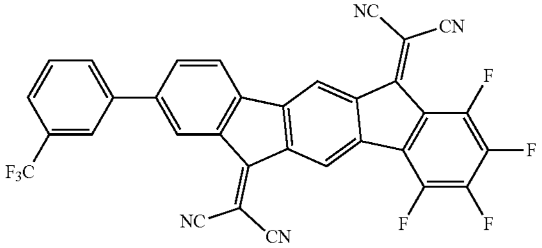
-continued
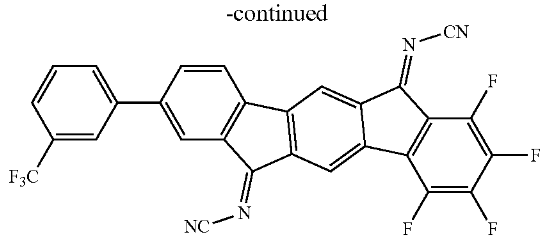
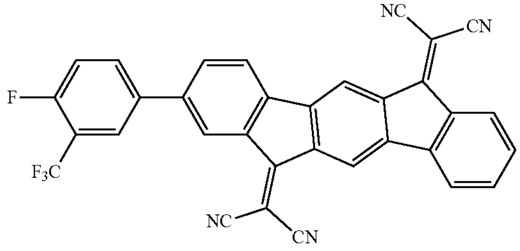
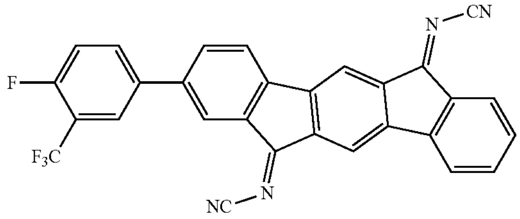
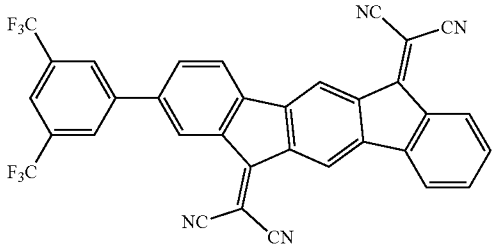
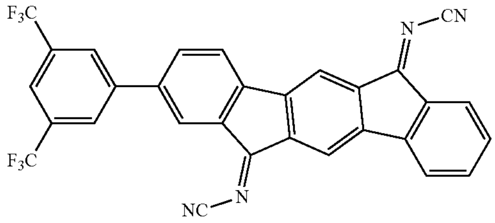
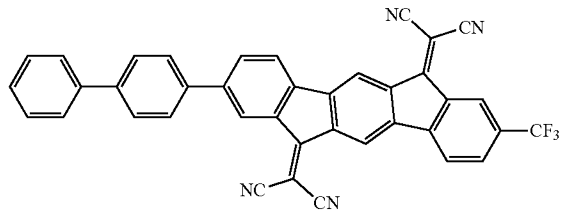
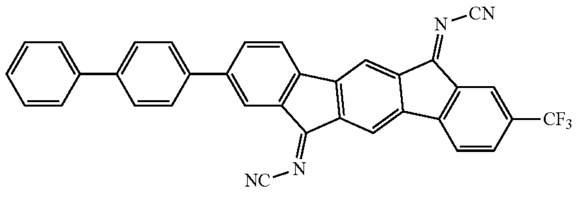

-continued
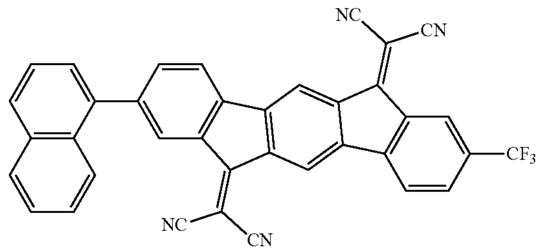
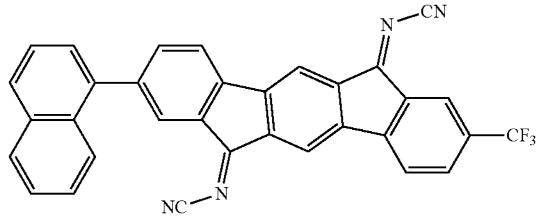
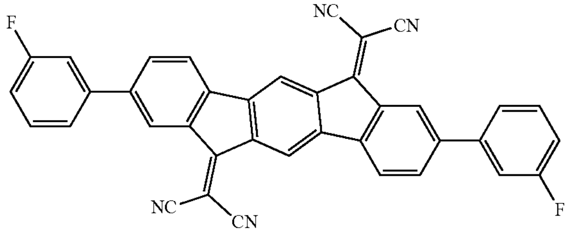
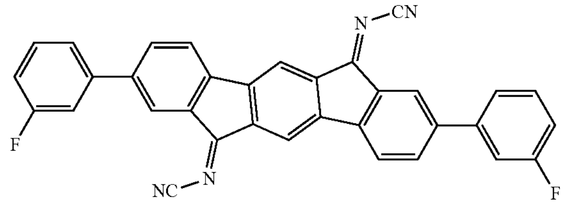
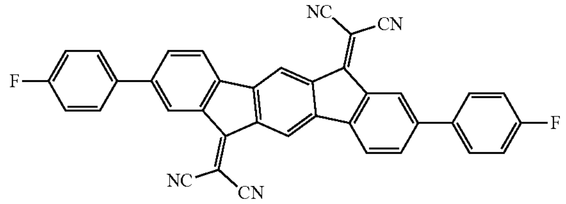
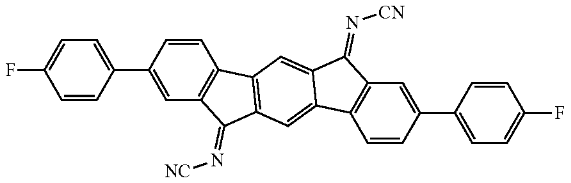
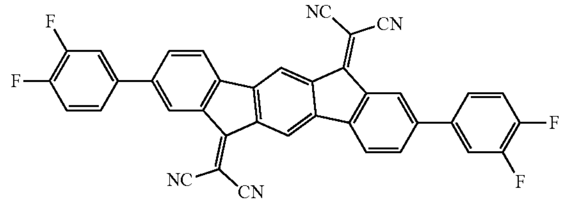
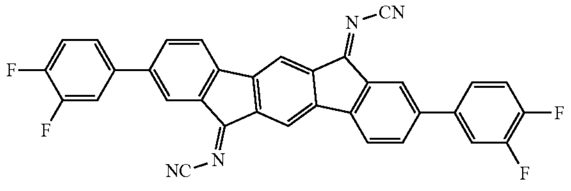
-continued
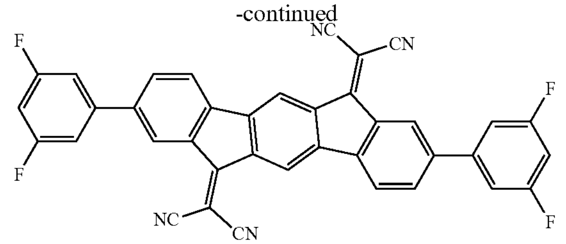
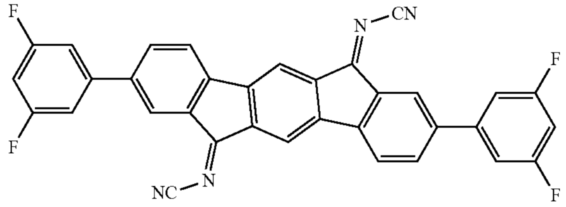
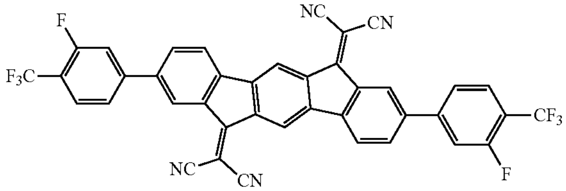
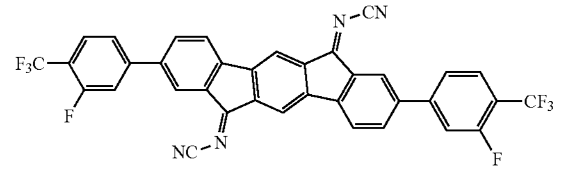
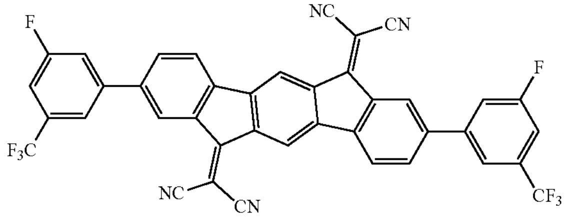
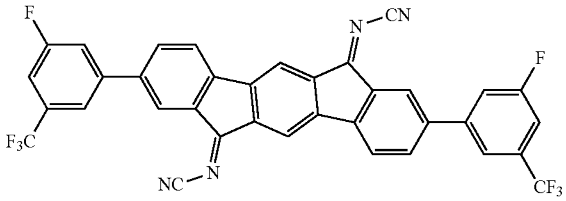
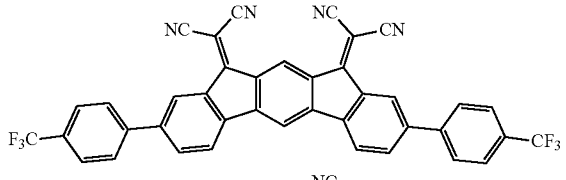
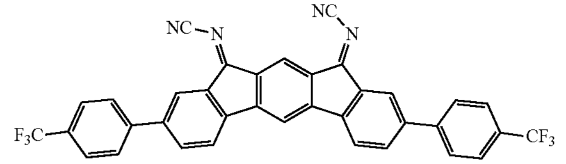
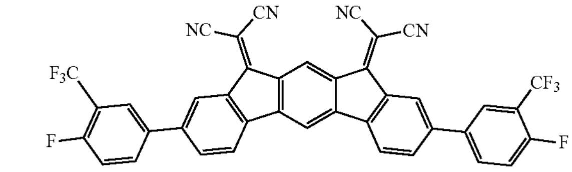

-continued
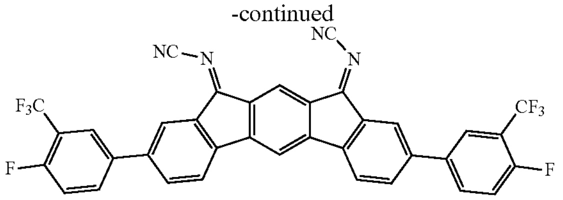
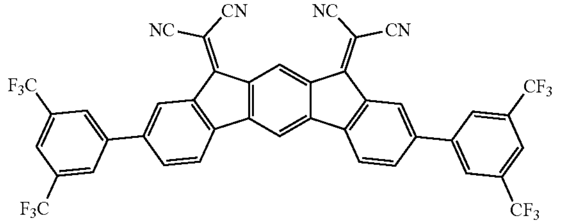
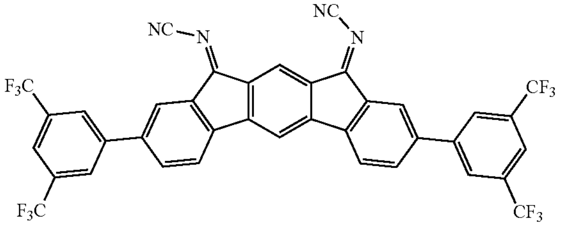
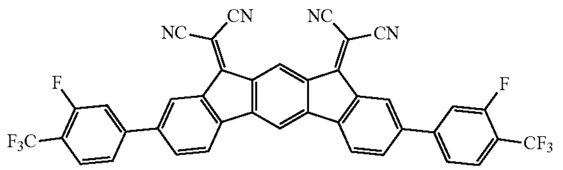
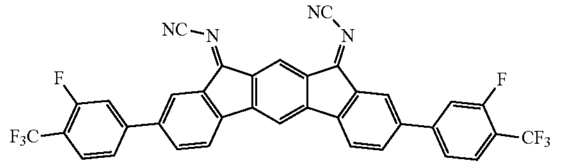
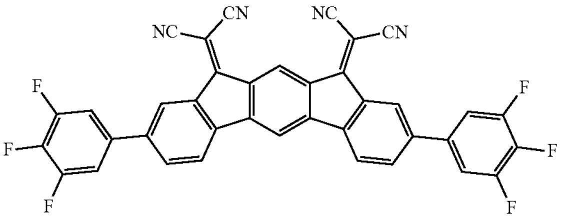
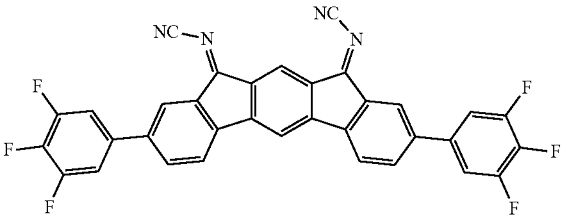
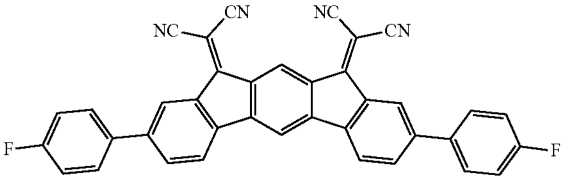
-continued
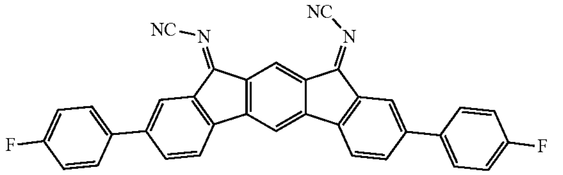
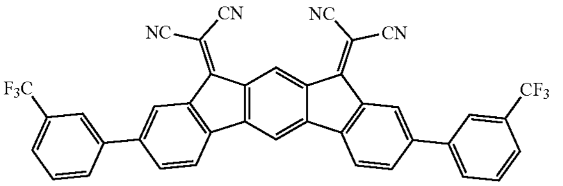
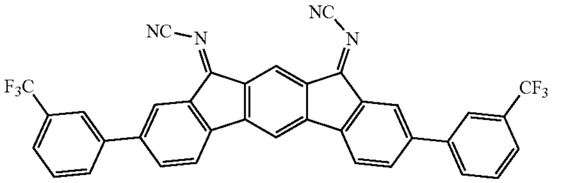
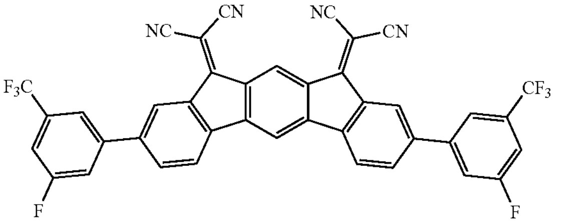
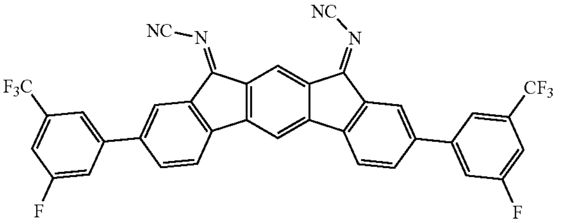
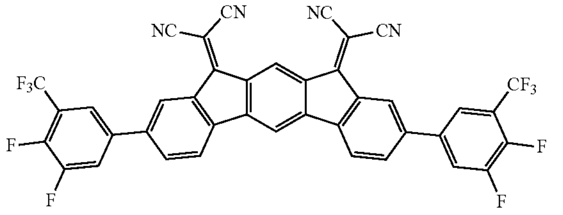
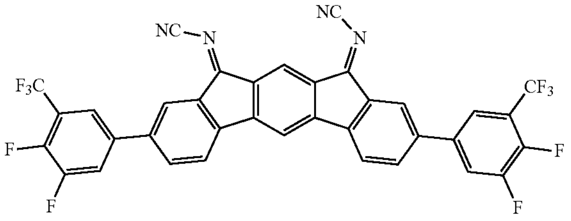
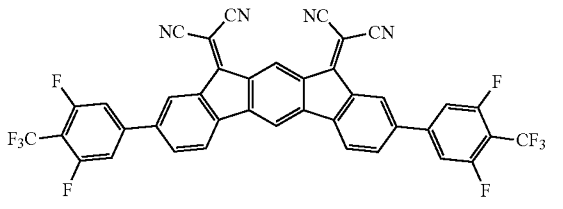

-continued
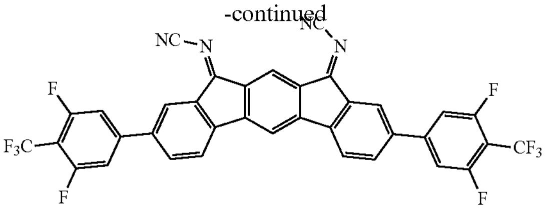
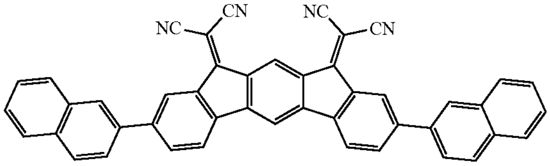
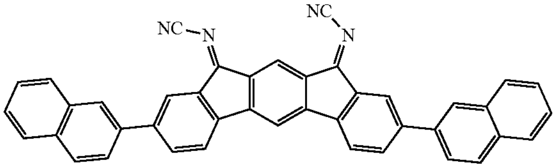
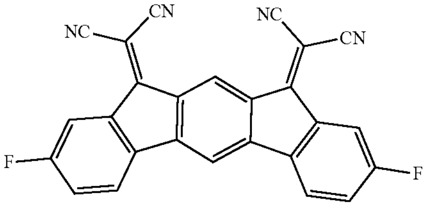
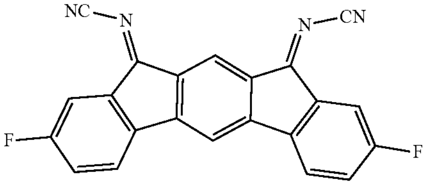
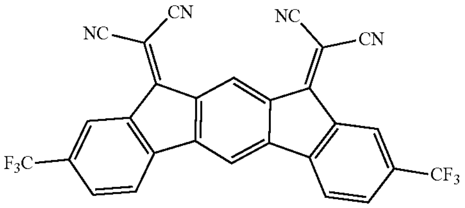
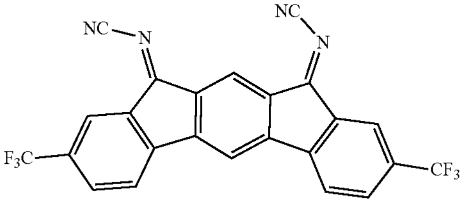
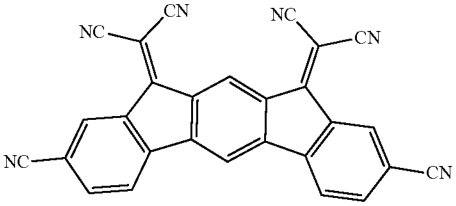
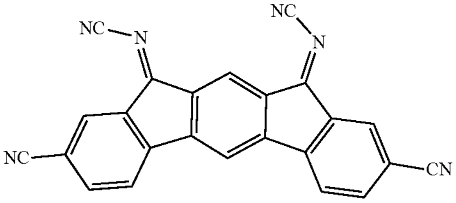
-continued
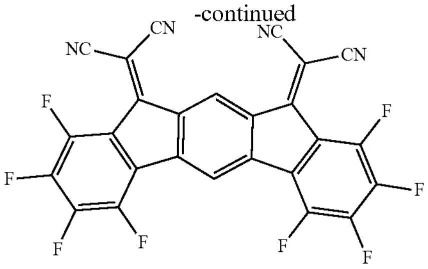
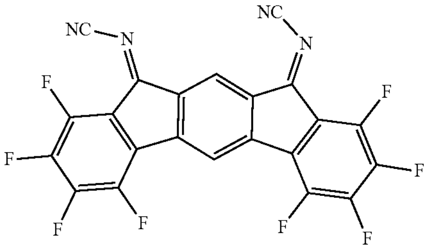
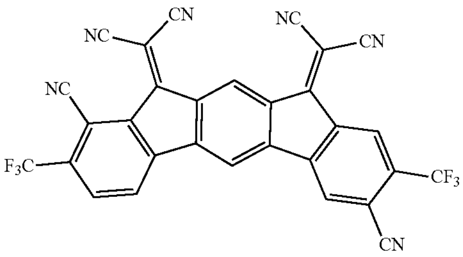
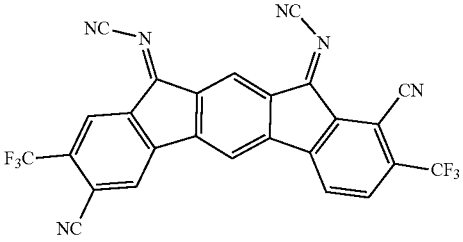
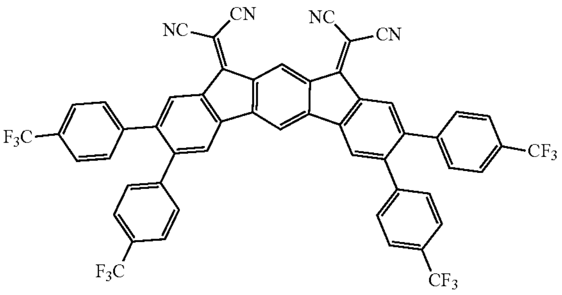
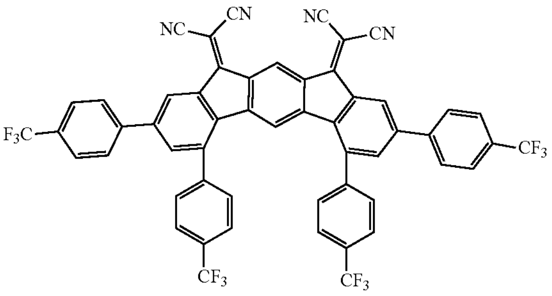

-continued
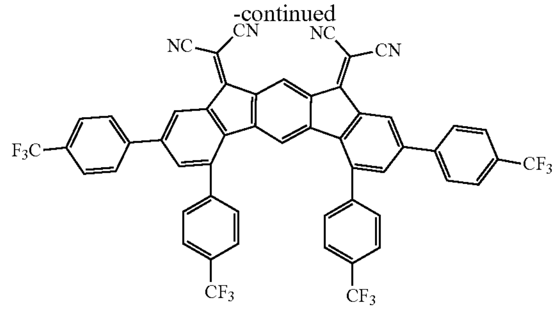
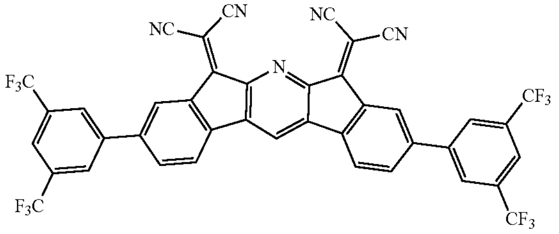
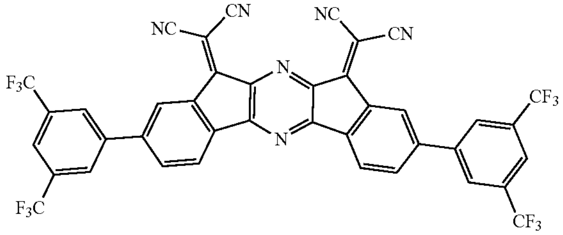
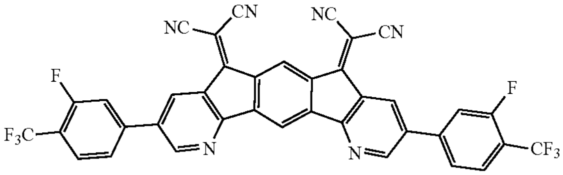
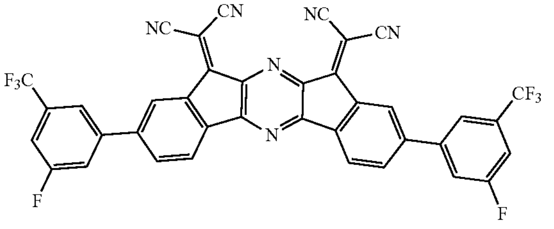
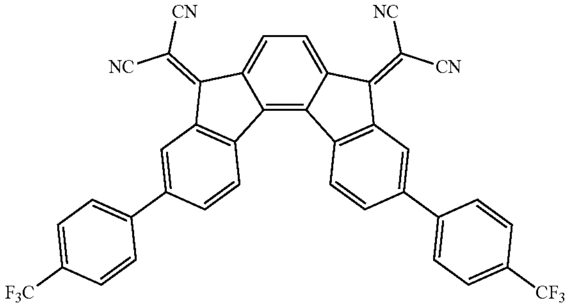
-continued
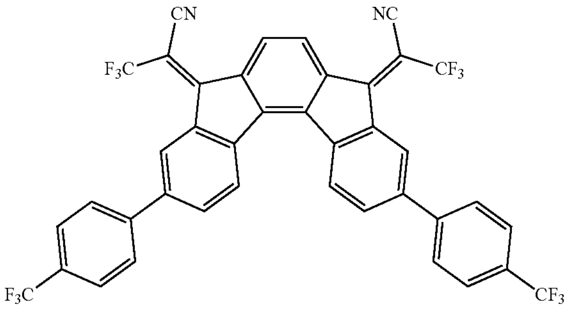
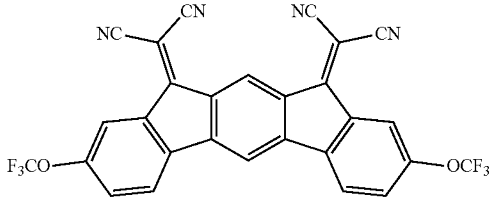
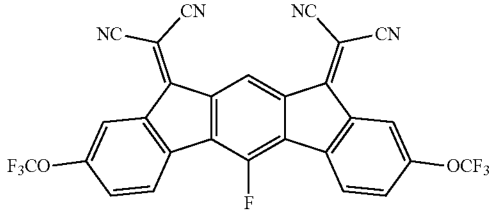
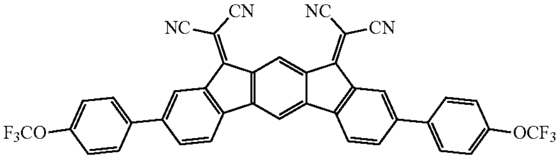
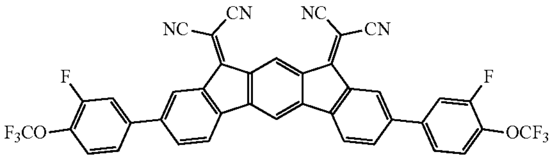
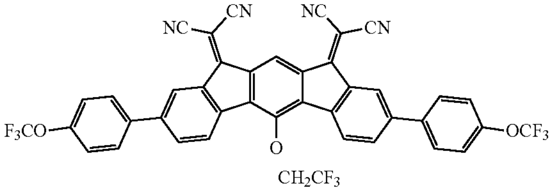
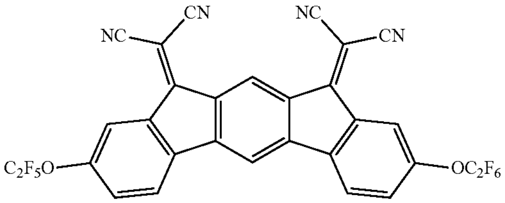
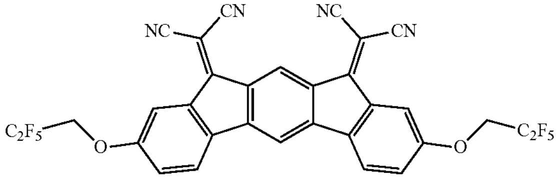

-continued
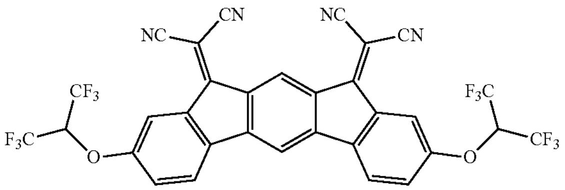
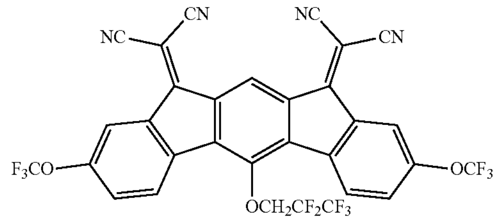
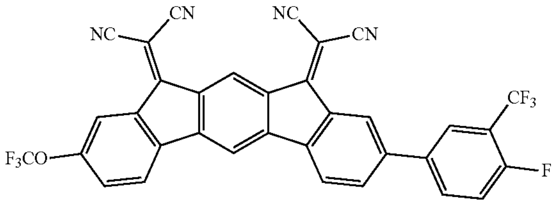
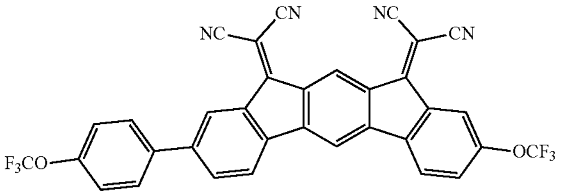
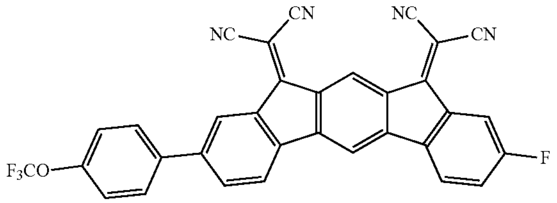
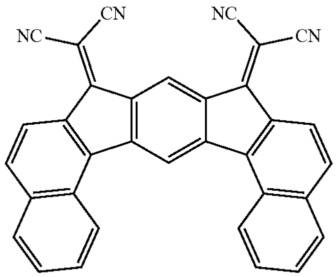
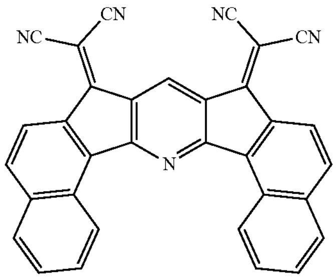
-continued
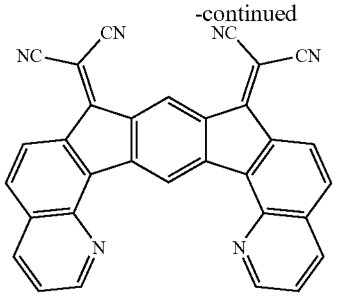
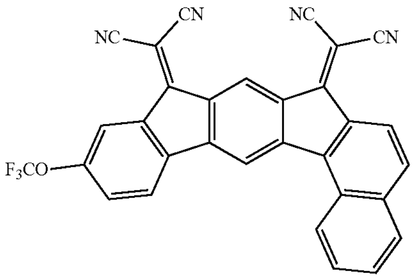
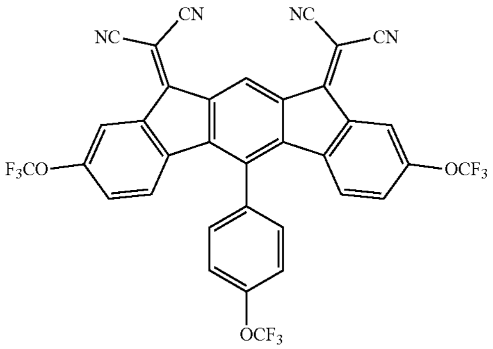
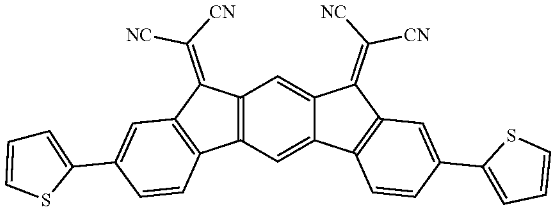
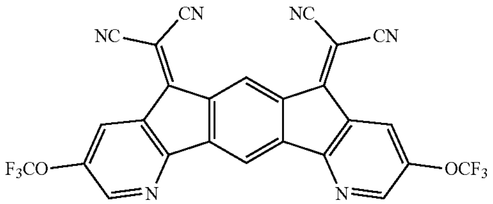
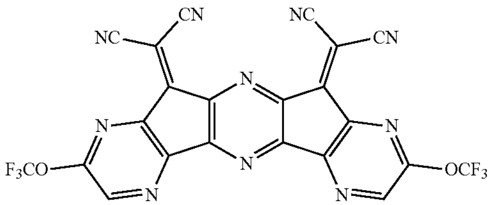

-continued

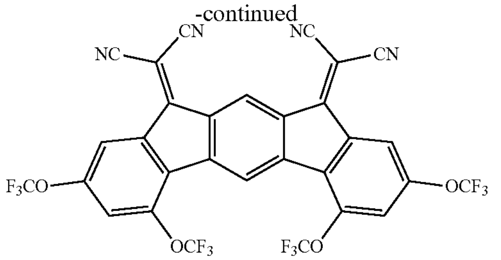

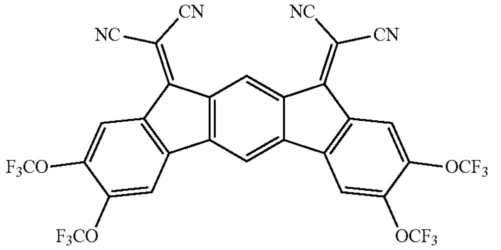

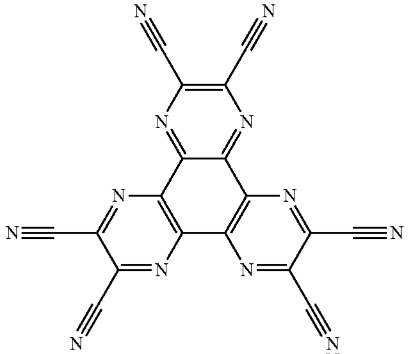

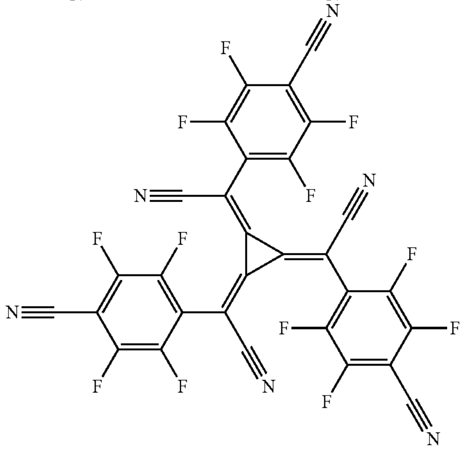

Emitting Region

The emitting region includes at least one emitting layer.

In the organic EL device according to the exemplary embodiment, the emitting region preferably contains a fluorescent substance and an organic compound. The fluorescent substance contained in the emitting region is also preferably a fluorescent compound described later. The organic compound contained in the emitting region is also preferably a host material described later.

In an arrangement of the organic EL device according to the exemplary embodiment, the emitting region includes one emitting layer.

In an arrangement of the organic EL device according to the exemplary embodiment, the emitting region consists of one emitting layer.

In an arrangement of the organic EL device according to the exemplary embodiment, the emitting region includes, as two emitting layers, a first emitting layer and a second emitting layer.

In an arrangement of the organic EL device according to the exemplary embodiment, the emitting region consists of two emitting layers.

In the organic EL device according to the exemplary embodiment, the emitting layer preferably contains an emitting compound. Although the emitting compound is not particularly limited, the emitting compound may include, for instance, at least one emitting compound selected from the group consisting of a first emitting compound and a second emitting compound described below. In the organic EL device according to the exemplary embodiment, the emitting layer preferably contains the emitting compound at 0.5 mass % or more with respect to a total mass of the emitting layer. The emitting layer preferably contains the emitting compound at 10 mass % or less, more preferably at 7 mass % or less, further preferably at 5 mass % or less, with respect to the total mass of the emitting layer.

In an arrangement of the organic EL device according to the exemplary embodiment, at least one emitting layer in the emitting region contains an emitting compound that emits light having a maximum peak wavelength of 500 nm or less.

In an arrangement of the organic EL device according to the exemplary embodiment, at least one emitting layer in the emitting region contains an emitting compound that emits fluorescence having a maximum peak wavelength of 500 nm or less.

In the organic EL device according to the exemplary embodiment, the emitting region also preferably includes at least the first emitting layer containing the first host material and the second emitting layer containing the second host material. The first host material and the second host material are different from each other.

Herein, the "host material" refers to, for instance, a material that accounts for "50 mass % or more of the layer." Accordingly, for instance, the first emitting layer contains the first host material at 50 mass % or more with respect to a total mass of the first emitting layer. Further, for instance, the second emitting layer contains the second host material at 50 mass % or more with respect to the total mass of the second emitting layer. Moreover, for instance, the "host material" may account for 60 mass % or more of the layer, 70 mass % or more of the layer, 80 mass % or more of the layer, 90 mass % or more of the layer, or 95 mass % or more of the layer.

A triplet energy $T_1$(H1) of the first host material and a triplet energy $T_1$(H2) of the second host material preferably satisfy a relationship of a numerical formula (Numerical Formula 1) below.

$$T_1(H1)>T_1(H2) \quad \text{(Numerical Formula 1)}$$

In the organic EL device according to the exemplary embodiment, the triplet energy $T_1$(H1) of the first host material and the triplet energy $T_1$(H2) of the second host material preferably satisfy a relationship of a numerical formula (Numerical Formula 5) below.

$$T_1(H1)-T_1(H2)>0.03\text{ eV} \quad \text{(Numerical Formula 5)}$$

The organic EL device according to the exemplary embodiment including the first emitting layer and the second emitting layer that satisfy the relationship of the above numerical formula (Numerical Formula 1) has improved luminous efficiency.

Conventionally, Triplet-Triplet-Annihilation (sometimes referred to as TTA) is known as a technique for enhancing the luminous efficiency of the organic electroluminescence device. TTA is a mechanism in which triplet excitons collide with one another to generate singlet excitons. It should be noted that the TTA mechanism is also sometimes referred to as a TTF mechanism as described in WO2010/134350.

The TTF phenomenon will be described. Holes injected from an anode and electrons injected from a cathode are recombined in an emitting layer to generate excitons. As for the spin state, as is conventionally known, singlet excitons account for 25% and triplet excitons account for 75%. In a conventionally known fluorescent device, light is emitted when singlet excitons of 25% are relaxed to the ground state. The remaining triplet excitons of 75% are returned to the ground state without emitting light through a thermal deactivation process. Accordingly, the theoretical limit value of the internal quantum efficiency of a conventional fluorescent device is believed to be 25%.

The behavior of triplet excitons generated within an organic substance has been theoretically examined. According to S. M. Bachilo et al. (J. Phys. Chem. A, 104, 7711 (2000)), assuming that high-order excitons such as quintet excitons are quickly returned to triplet excitons, triplet excitons (hereinafter abbreviated as $^3A^*$) collide with one another with an increase in the density thereof, whereby a reaction shown by the following formula occurs. In the formula, $^1A$ represents the ground state and $^1A^*$ represents the lowest singlet excitons.

$$^3A^*+^3A^*\rightarrow(4/9)^1A+(1/9)^1A^*+(13/9)^3A^*$$

In other words, $5^3A^*\rightarrow4^1A+1A^*$ is satisfied, and it is expected that, among triplet excitons initially generated, which account for 75%, one fifth thereof (i.e., 20%) is changed to singlet excitons. Accordingly, the amount of singlet excitons which contribute to emission is 40%, which is a value obtained by adding 15% (75%×(⅕)=15%) to 25%, which is the amount ratio of initially generated singlet excitons. At this time, a ratio of luminous intensity derived from TTF (TTF ratio) relative to the total luminous intensity is 15/40, i.e., 37.5%. Assuming that singlet excitons are generated by collision of initially generated triplet excitons accounting for 75% (i.e., one siglet exciton is generated from two triplet excitons), a significantly high internal quantum efficiency of 62.5% is obtained, which is a value obtained by adding 37.5% (75%×(½)=37.5%) to 25% (the amount ratio of initially generated singlet excitons). At this time, the TTF ratio is 37.5/62.5=60%.

When the emitting region of the organic EL device according to the exemplary embodiment includes at least two emitting layers (i.e., the first emitting layer and the second emitting layer) and the triplet energy $T_1$(H1) of the first host material in the first emitting layer and the triplet energy $T_1$(H2) of the second host material in the second emitting layer satisfy the relationship of the above numerical formula (Numerical Formula 1), it is considered that triplet excitons generated by recombination of holes and electrons in the first emitting layer and present on an interface between the first emitting layer and organic layer(s) in direct contact therewith are not likely to be quenched even under the presence of excessive carriers on the interface between the first emitting layer and the organic layer(s). For instance, the presence of a recombination region locally on an interface between the first emitting layer and a hole transporting layer or an electron blocking layer is considered to cause quenching by excessive electrons. Meanwhile, the presence of a recombination region locally on an interface between the first emitting layer and an electron transporting layer or a hole blocking layer is considered to cause quenching by excessive holes.

By including the first emitting layer and the second emitting layer so as to satisfy the relationship of the numerical formula (Numerical Formula 1), triplet excitons generated in the first emitting layer can transfer to the second emitting layer without being quenched by excessive carriers and be inhibited from back-transferring from the second emitting layer to the first emitting layer. Consequently, the second emitting layer exhibits the TTF mechanism to effectively generate singlet excitons, thereby improving the luminous efficiency.

Accordingly, the organic EL device according to the exemplary embodiment includes, as different regions, the first emitting layer mainly generating triplet excitons and the second emitting layer mainly exhibiting the TTF mechanism using triplet excitons having transferred from the first emitting layer, and a difference in triplet energy is provided by using a compound having a smaller triplet energy than that of the first host material in the first emitting layer as the second host material in the second emitting layer, thereby improving the luminous efficiency.

In the organic EL device according to the exemplary embodiment, it is also preferable that the first emitting layer is disposed between the anode and the cathode and the second emitting layer is disposed between the first emitting layer and the cathode. The organic EL device according to the exemplary embodiment may include the first emitting layer and the second emitting layer in this order from the anode, or may include the second emitting layer and the first emitting layer in this order from the anode. In either of the orders of including the first emitting layer and the second emitting layer, the effect of the laminate arrangement of the emitting layers can be expected by selecting a combination of materials that satisfy the relationship of the numerical formula (Numerical Formula 1).

In the organic EL device according to the exemplary embodiment, the first emitting layer is also preferably disposed close to the anode with respect to the second emitting layer.

In the organic EL device according to the exemplary embodiment, when the first emitting layer is disposed close to the anode with respect to the second emitting layer, the first emitting layer and the hole transporting zone are preferably in direct contact with each other. When the hole transporting zone does not include the fourth anode side organic layer, the first emitting layer and the third anode side organic layer are preferably in direct contact with each other. When the hole transporting zone includes the fourth anode side organic layer, the first emitting layer and the fourth anode side organic layer are preferably in direct contact with each other.

In the organic EL device according to the exemplary embodiment, the first emitting layer and the second emitting layer are also preferably in direct contact with each other.

Herein, a layer arrangement in which "the first emitting layer and the second emitting layer are in direct contact with each other" can include one of embodiments (LS1), (LS2), and (LS3) below.

(LS1) An embodiment in which a region containing both the first host material and the second host material is generated in a process of vapor-depositing the compound of the first emitting layer and vapor-depositing the compound of the second emitting layer, and is present on the interface between the first emitting layer and the second emitting layer.

(LS2) An embodiment in which in a case of containing an emitting compound in the first emitting layer and the second emitting layer, a region containing all of the first host material, the second host material and the emitting compound is generated in a process of vapor-depositing the compound of the first emitting layer and vapor-depositing the compound of the second emitting layer, and is present on the interface between the first emitting layer and the second emitting layer.

(LS3) An embodiment in which in a case of containing an emitting compound in the first emitting layer and the second emitting layer, a region containing the emitting compound, a region containing the first host material or a region containing the second host material is generated in a process of vapor-depositing the compound of the first emitting layer and vapor-depositing the compound of the second emitting layer, and is present on the interface between the first emitting layer and the second emitting layer.

First Emitting Layer

The first emitting layer includes the first host material. The first host material is a compound different from the second host material contained in the second emitting layer.

The first emitting layer preferably contains the first emitting compound. The first emitting compound is not particularly limited. The first emitting compound is preferably a compound that emits light having a maximum peak wavelength of 500 nm or less, more preferably a compound that emits light having a maximum peak wavelength in a range from 430 nm to 480 nm. The first emitting compound is preferably a fluorescent compound that emits fluorescence having a maximum peak wavelength of 500 nm or less, more preferably a fluorescent compound that emits fluorescence having a maximum peak wavelength in a range from 430 nm to 480 nm.

In the organic EL device according to the exemplary embodiment, the first emitting compound is preferably a compound containing no azine ring structure in a molecule thereof.

In the organic EL device according to the exemplary embodiment, the first emitting compound is preferably not a boron-containing complex, more preferably not a complex.

For instance, examples of a fluorescent compound that emits blue fluorescence that is usable for the first emitting layer include a pyrene derivative, styrylamine derivative, chrysene derivative, fluoranthene derivative, fluorene derivative, diamine derivative, and triarylamine derivative.

Herein, the blue light emission refers to a light emission in which a maximum peak wavelength of emission spectrum is in a range from 430 nm to 500 nm.

In the organic EL device according to the exemplary embodiment, the first emitting layer preferably does not contain a metal complex. Moreover, in the organic EL device according to the exemplary embodiment, the first emitting layer also preferably does not contain a boron-containing complex.

In the organic EL device according to the exemplary embodiment, the first emitting layer preferably does not contain a phosphorescent material (dopant material).

Moreover, the first emitting layer preferably does not contain a heavy-metal complex and a phosphorescent rare earth metal complex. Examples of the heavy-metal complex herein include iridium complex, osmium complex, and platinum complex.

A measurement method of the maximum peak wavelength of a compound is as follows. A toluene solution of a measurement target compound at a concentration of 5 μmol/L is prepared and put in a quartz cell. An emission spectrum (ordinate axis: luminous intensity, abscissa axis: wavelength) of the thus-obtained sample is measured at a normal temperature (300K). The emission spectrum can be measured using a spectrophotometer (machine name: F-7000) manufactured by Hitachi High-Tech Science Corporation. It should be noted that the machine for measuring the emission spectrum is not limited to the machine used herein.

A peak wavelength of the emission spectrum exhibiting the maximum luminous intensity is defined as the maximum peak wavelength. Herein, the maximum peak wavelength of fluorescence is sometimes referred to as the maximum fluorescence peak wavelength (FL-peak).

In an emission spectrum of the first emitting compound, where a peak exhibiting a maximum luminous intensity is defined as a maximum peak and a height of the maximum peak is defined as 1, heights of other peaks appearing in the emission spectrum are preferably less than 0.6. It should be noted that the peaks in the emission spectrum are defined as local maximal values.

Moreover, in the emission spectrum of the first emitting compound, the number of peaks is preferably less than three.

In the organic EL device according to the exemplary embodiment, a singlet energy $S_1(H1)$ of the first host material and a singlet energy $S_1(D1)$ of the first emitting compound preferably satisfy a relationship of a numerical formula (Numerical Formula 20) below.

$$S_1(H1)>S_1(D1) \quad \text{(Numerical Formula 20)}$$

The singlet energy $S_1$ means an energy difference between the lowest singlet state and the ground state.

When the first host material and the first emitting compound satisfy the relationship of the numerical formula (Numerical Formula 20), singlet excitons generated on the first host material easily energy-transfer from the first host material to the first emitting compound, thereby contributing to fluorescence of the first emitting compound.

In the organic EL device according to the exemplary embodiment, the triplet energy $T_1(H1)$ of the first host material and a triplet energy $T_1(D1)$ of the first emitting compound preferably satisfy a relationship of a numerical formula (Numerical Formula 20A) below.

$$T_1(D1)>(H1) \quad \text{(Numerical Formula 20A)}$$

When the first host material and the first emitting compound satisfy the relationship of the numerical formula (Numerical Formula 20A), triplet excitons generated in the first emitting layer are transferred not onto the first emitting compound having higher triplet energy but onto the first host material, thereby being easily transferred to the second emitting layer.

The organic EL device according to the exemplary embodiment preferably satisfies a relationship of a numerical formula (Numerical Formula 20B) below.

$$T_1(D1)>T_1(H1)>T_1(H2) \quad \text{(Numerical Formula 20B)}$$

In the organic EL device according to the exemplary embodiment, the first emitting layer preferably contains the first emitting compound at 0.5 mass % or more with respect to the total mass of the first emitting layer.

The first emitting layer preferably contains the first emitting compound at 10 mass % or less, more preferably at 7 mass % or less, further preferably at 5 mass % or less, with respect to the total mass of the first emitting layer.

In the organic EL device of the exemplary embodiment, the first emitting layer preferably contains the first emitting compound as the first host material at 60 mass % or more, more preferably at 70 mass % or more, further preferably at 80 mass % or more, further more preferably at 90 mass % or more, still further more preferably at 95 mass % or more, with respect to the total mass of the first emitting layer.

The first emitting layer preferably contains the first host material at 99.5 mass % or less with respect to the total mass of the first emitting layer.

It should be noted that when the first emitting layer contains the first host material and the first emitting compound, an upper limit of the total of the respective content ratios of the first host material and the first emitting compound is 100 mass %.

In the organic EL device according to the exemplary embodiment, a film thickness of the first emitting layer is preferably 3 nm or more, more preferably 5 nm or more. When the film thickness of the first emitting layer is 3 nm or more, the film thickness is sufficiently large to cause recombination of holes and electrons in the first emitting layer.

In the organic EL device according to the exemplary embodiment, the film thickness of the first emitting layer is preferably 15 nm or less, more preferably 10 nm or less. When the film thickness of the first emitting layer is 15 nm or less, the film thickness is sufficiently small to allow for transfer of triplet excitons to the second emitting layer.

In the organic EL device according to the exemplary embodiment, the film thickness of the first emitting layer is more preferably in a range from 3 nm to 15 nm.

Second Emitting Layer

The second emitting layer contains the second host material. The second host material is a different compound from the first host material contained in the first emitting layer.

The second emitting layer preferably contains the second emitting compound. The second emitting compound is not particularly limited. The second emitting compound is preferably a compound that emits light having a maximum peak wavelength of 500 nm or less, more preferably a compound that emits light having a maximum peak wavelength in a range from 430 nm to 480 nm. The second emitting compound is preferably a fluorescent compound that emits fluorescence having a maximum peak wavelength of 500 nm or less, more preferably a fluorescent compound that emits fluorescence having a maximum peak wavelength in a range from 430 nm to 480 nm.

A measurement method of the maximum peak wavelength of a compound is as follows.

In the organic EL device according to the exemplary embodiment, the second emitting layer preferably emits light having a maximum peak wavelength of 500 nm or less when being driven.

In the organic EL device according to the exemplary embodiment, a half bandwidth of a maximum peak of the second emitting compound is preferably in a range from 1 nm to 20 nm.

In the organic EL device according to the exemplary embodiment, a Stokes shift of the second emitting compound preferably exceeds 7 nm.

When the Stokes shift of the second emitting compound is more than 7 nm, a reduction in luminous efficiency due to self-absorption is likely to be prevented.

The self-absorption is a phenomenon that emitted light is absorbed by the same compound to reduce luminous efficiency. The self-absorption is notably observed in a compound having a small Stokes shift (i.e., a large overlap between an absorption spectrum and a fluorescence spectrum). Accordingly, in order to reduce the self-absorption, it is preferable to use a compound having a large Stokes shift (i.e., a small overlap between the absorption spectrum and the fluorescence spectrum). The Stokes shift can be measured by the following method. A measurement target compound is dissolved in toluene at a concentration of $2.0\times10^{-5}$ mol/L to prepare a measurement sample. The measurement sample is put into a quartz cell and is irradiated with continuous light falling within an ultraviolet-to-visible region at a room temperature (300K) to measure an absorption spectrum (ordinate axis: absorbance, abscissa axis: wavelength). A spectrophotometer such as a spectrophotometer U-3900/3900H manufactured by Hitachi High-Tech Science Corporation can be used for the absorption spectrum measurement. Moreover, a measurement target compound is dissolved in toluene at a concentration of $4.9\times10^{-6}$ mol/L to prepare a measurement sample. The measurement sample is put into a quartz cell and is irradiated with excited light at a room temperature (300K) to measure fluorescence spectrum (ordinate axis: fluorescence intensity, abscissa axis: wavelength). A spectrophotometer can be used for the fluorescence spectrum measurement. For instance, a spectrophotofluorometer F-7000 manufactured by Hitachi High-Tech Science Corporation can be used for the measurement. A difference between an absorption local maximum wavelength and a fluorescence local maximum wavelength is calculated from the absorption spectrum and the fluorescence spectrum to obtain a Stokes shift (SS). A unit of the Stokes shift (SS) is denoted by nm.

In the organic EL device according to the exemplary embodiment, a triplet energy $T_1$(D2) of the second emitting compound and the triplet energy $T_1$(H2) of the second host material preferably satisfy a relationship of a numerical formula (Numerical Formula 30A) below.

$$T_1(D2)>T_1(H2) \quad \text{(Numerical Formula 30A)}$$

In the organic EL device according to the exemplary embodiment, when the second emitting compound and the second host material satisfy the relationship of the numerical formula (Numerical Formula 30A), in transfer of triplet excitons generated in the first emitting layer to the second emitting layer, the triplet excitons energy-transfer not onto the second emitting compound having higher triplet energy but onto molecules of the second host material. In addition, triplet excitons generated by recombination of holes and electrons on the second host material do not transfer to the second emitting compound having higher triplet energy. Triplet excitons generated by recombination on molecules of the second emitting compound quickly energy-transfer to molecules of the second host material.

Triplet excitons in the second host material do not transfer to the second emitting compound but efficiently collide with one another on the second host material to generate singlet excitons by the TTF phenomenon.

In the organic EL device according to the exemplary embodiment, a singlet energy $S_1$(H2) of the second host material and a singlet energy $S_1$(D2) of the second emitting compound preferably satisfy a relationship of a numerical formula (Numerical Formula 4) below.

$$S_1(H2)>S_1(D2) \quad \text{(Numerical Formula 4)}$$

In the organic EL device according to the exemplary embodiment, when the second emitting compound and the second host material satisfy the relationship of the numerical formula (Numerical formula 4), due to the singlet energy of the second emitting compound being smaller than the singlet energy of the second host material, singlet excitons generated by the TTF phenomenon energy-transfer from the second host material to the second emitting compound, thereby contributing to fluorescence of the second emitting compound.

In the organic EL device according to the exemplary embodiment, the second emitting compound is preferably a compound containing no azine ring structure in a molecule thereof.

In the organic EL device according to the exemplary embodiment, the second emitting compound is preferably not a boron-containing complex, more preferably not a complex.

For instance, examples of a compound that emits blue fluorescence that is usable for the second emitting layer include a pyrene derivative, styrylamine derivative, chrysene derivative, fluoranthene derivative, fluorene derivative, diamine derivative, and triarylamine derivative.

In the organic EL device according to the exemplary embodiment, the second emitting layer preferably does not contain a metal complex. Moreover, in the organic EL device according to the exemplary embodiment, the second emitting layer also preferably does not contain a boron-containing complex.

In the organic EL device according to the exemplary embodiment, the second emitting layer preferably does not contain a phosphorescent material (dopant material).

Moreover, the second emitting layer preferably does not contain a heavy-metal complex and a phosphorescent rare earth metal complex. Examples of the heavy-metal complex herein include iridium complex, osmium complex, and platinum complex.

In the organic EL device according to the exemplary embodiment, the second emitting layer further preferably contains the second emitting compound at 0.5 mass % or more with respect to a total mass of the second emitting layer.

The second emitting layer preferably contains the second emitting compound at 10 mass % or less, more preferably at 7 mass % or less, further preferably at 5 mass % or less, with respect to the total mass amount of the second emitting layer.

The second emitting layer preferably contains a second compound as the second host material at 60 mass % or more, more preferably at 70 mass % or more, further preferably at 80 mass % or more, further more preferably at 90 mass % or more, still further preferably at 95 mass % or more, with respect to the total mass of the second emitting layer.

The second emitting layer preferably contains the second host material at 99.5 mass % or less with respect to the total mass of the second emitting layer.

When the second emitting layer contains the second host material and the second emitting compound, an upper limit of the total of the respective content ratios of the second host material and the second emitting compound is 100 mass %.

In the organic EL device according to the exemplary embodiment, the film thickness of the second emitting layer is preferably 5 nm or more, more preferably 15 nm or more. When the film thickness of the second emitting layer is 5 nm or more, it is easy to inhibit triplet excitons having transferred from the first emitting layer to the second emitting layer from returning to the first emitting layer. Further, when the film thickness of the second emitting layer is 5 nm or more, triplet excitons can be sufficiently separated from the recombination portion in the first emitting layer.

In the organic EL device according to the exemplary embodiment, the film thickness of the second emitting layer is preferably 20 nm or less. When the film thickness of the second emitting layer is 20 nm or less, a density of the triplet excitons in the second emitting layer is improved to cause the TTF phenomenon more easily.

In the organic EL device according to the exemplary embodiment, the film thickness of the second emitting layer is preferably in a range from 5 nm to 20 nm.

In the organic EL device according to the exemplary embodiment, a triplet energy $T_1(DX)$ of the first emitting compound or the second emitting compound, the triplet energy $T_1(H1)$ of the first host material and the triplet energy $T_1(H2)$ of the second host material preferably satisfy a relationship of a numerical formula (Numerical Formula 9) below, more preferably satisfy a relationship of a numerical formula (Numerical Formula 10) below.

$$2.7\ \text{eV} > T_1(DX) > T_1(H1) > T_1(H2) \quad \text{(Numerical Formula 9)}$$

$$2.6\ \text{eV} > T_1(DX) > T_1(H1) > T_1(H2) \quad \text{(Numerical Formula 10)}$$

The triplet energy $T_1(D1)$ of the first emitting compound preferably satisfies a relationship of a numerical formula (Numerical Formula 9A) below, more preferably satisfies a relationship of a numerical formula (Numerical Formula 10A) below.

$$2.7\ \text{eV} > T_1(D1) > T_1(H1) > T_1(H2) \quad \text{(Numerical Formula 9A)}$$

$$2.6\ \text{eV} > T_1(D1) > T_1(H1) > T_1(H2) \quad \text{(Numerical Formula 10A)}$$

The triplet energy $T_1(D2)$ of the second emitting compound preferably satisfies a relationship of a numerical formula (Numerical Formula 9B) below, more preferably satisfies a relationship of a numerical formula (Numerical Formula 10B) below.

$$2.7\ \text{eV} > T_1(D2) > T_1(H1) > T_1(H2) \quad \text{(Numerical Formula 9B)}$$

$$2.6\ \text{eV} > T_1(D2) > T_1(H1) > T_1(H2) \quad \text{(Numerical Formula 10B)}$$

In the organic EL device according to the exemplary embodiment, the triplet energy $T_1(DX)$ of the first emitting compound or the second emitting compound and the triplet energy $T_1(H1)$ of the first host material preferably satisfy a relationship of a numerical formula (Numerical Formula 11) below.

$$0\ \text{eV} < T_1(DX) - T_1(H1) < 0.6\ \text{eV} \quad \text{(Numerical Formula 11)}$$

The triplet energy $T_1(D1)$ of the first emitting compound preferably satisfies a relationship of a numerical formula (Numerical Formula 11A) below.

$$0\ \text{eV} < T_1(D1) - T_1(H1) < 0.6\ \text{eV} \quad \text{(Numerical Formula 11A)}$$

The triplet energy $T_1(D2)$ of the second emitting compound preferably satisfies a relationship of a numerical formula (Numerical Formula 11B) below.

$$0\ \text{eV} < T_1(D2) - T_1(H2) < 0.8\ \text{eV} \quad \text{(Numerical Formula 11B)}$$

In the organic EL device according to the exemplary embodiment, the triplet energy $T_1(H1)$ of the first host material preferably satisfies a relationship of a numerical formula (Numerical Formula 12) below.

$$T_1(H1) > 2.0\ \text{eV} \quad \text{(Numerical Formula 12)}$$

In the organic EL device according to the exemplary embodiment, the triplet energy $T_1(H1)$ of the first host material also preferably satisfies a relationship of a numerical formula (Numerical Formula 12A) below, or also preferably satisfies a relationship of a numerical formula (Numerical Formula 12B) below.

$$T_1(H1) > 2.10\ \text{eV} \quad \text{(Numerical Formula 12A).}$$

$$T_1(H1) > 2.15\ \text{eV} \quad \text{(Numerical Formula 12B)}$$

In the organic EL device according to the exemplary embodiment, when the triplet energy $T_1$(H1) of the first host material satisfies the relationship of the numerical formula (Numerical Formula 12A) or the numerical formula (Numerical Formula 12B), triplet excitons generated in the first emitting layer are easily transferred to the second emitting layer, and also easily inhibited from back-transferring from the second emitting layer to the first emitting layer. Consequently, singlet excitons are efficiently generated, thereby improving luminous efficiency.

In the organic EL device according to the exemplary embodiment, the triplet energy $T_1$(H1) of the first host material also preferably satisfies a relationship of a numerical formula (Numerical Formula 12C) below, or also preferably satisfies a relationship of a numerical formula (Numerical Formula 12D) below.

$$2.08\ \text{eV}>(H1)>1.87\ \text{eV} \qquad \text{(Numerical Formula 12C).}$$

$$2.05\ \text{eV}>T_1(H1)>1.90\ \text{eV} \qquad \text{(Numerical Formula 12D)}$$

In the organic EL device according to the exemplary embodiment, when the triplet energy $T_1$(H1) of the first host material satisfies the relationship of the numerical formula (Numerical Formula 12C) or the numerical formula (Numerical Formula 12D), the triplet excitons generated in the first emitting layer have smaller energy, allowing for a longer lifetime of a blue-emitting organic EL device of the organic EL device.

In the organic EL device according to the exemplary embodiment, the triplet energy $T_1$(D1) of the first emitting compound also preferably satisfies a relationship of a numerical formula (Numerical Formula 14A) below, or also preferably satisfies a relationship of a numerical formula (Numerical Formula 14B) below.

$$2.60\ \text{eV}>T_1(D1) \qquad \text{(Numerical Formula 14A)}$$

$$2.50\ \text{eV}>T_1(D1) \qquad \text{(Numerical Formula 14B)}$$

When the first emitting layer contains the first emitting compound that satisfies the relationship of the numerical formula (Numerical Formula 14A) or (Numerical Formula 14B), the blue-emitting organic EL device of the organic EL device has a longer lifetime.

In the organic EL device according to the exemplary embodiment, the triplet energy $T_1$(D2) of the second emitting compound also preferably satisfies a relationship of a numerical formula (Numerical Formula 14C) below, or also preferably satisfies a relationship of a numerical formula (Numerical Formula 14D) below.

$$2.60\ \text{eV}>T_1(D2) \qquad \text{(Numerical Formula 14C)}$$

$$2.50\ \text{eV}>T_1(D2) \qquad \text{(Numerical Formula 14D)}$$

When the second emitting layer contains the compound that satisfies the relationship of the numerical formula (Numerical Formula 14C) or (Numerical Formula 14D), the blue-emitting organic EL device of the organic EL device has a longer lifetime.

In the organic EL device according to the exemplary embodiment, the triplet energy $T_1$(H2) of the second host material preferably satisfies a relationship of a numerical formula (Numerical Formula 13) below.

$$T_1(H2)\geq 1.9\ \text{eV} \qquad \text{(Numerical Formula 13).}$$

In the organic EL device according to the exemplary embodiment, when the first emitting layer and the second emitting layer are laminated in this order from the anode, it is also preferable that an electron mobility μe(H1) of the first host material and an electron mobility μe(H2) of the second host material satisfy a relationship of a numerical formula (Numerical Formula 30) below.

$$\mu e(H2)>\mu e(H1) \qquad \text{(Numerical Formula 30)}$$

When the first host material and the second host material satisfy the relationship of the numerical formula (Numerical Formula 30), a recombination ability between holes and electrons in the first emitting layer is improved.

In the organic EL device according to the exemplary embodiment, when the first emitting layer and the second emitting layer are laminated in this order from the anode, it is also preferable that a hole mobility μh(H1) of the first host material and a hole mobility μh(H2) of the second host material satisfy a relationship of a numerical formula (Numerical Formula 31) below.

$$\mu h(H1)>\mu h(H2) \qquad \text{(Numerical Formula 31).}$$

In the organic EL device according to the exemplary embodiment, when the first emitting layer and the second emitting layer are laminated in this order from the anode, it is also preferable that the hole mobility μh(H1) of the first host material, an electron mobility μe(H1) of the first host material, the hole mobility μh(H2) of the second host material and an electron mobility μe(H2) of the second host material satisfy a relationship of a numerical formula (Numerical Formula 32) below.

$$(\mu e(H2)/\mu h(H2))>(\mu e(H1)/\mu h(H1)) \qquad \text{(Numerical Formula 32)}$$

First Host Material and Second Host Material

In the organic EL device according to the exemplary embodiment, it is also preferable that the first host material and the second host material are each, for instance, a compound selected from the group consisting of the first compound represented by a formula (1) below, the first compound represented by a formula (1X), (12X), (13X), (14X), (15X), or (16X) below, and the second compound represented by a formula (2) below. Moreover, the first compound is usable as the first host material and the second host material. In this case, the compound represented by the formula (1), (1X), (12X), (13X), (14X), (15X), or (16X) used as the second host material is sometimes referred to as the second compound for convenience.

First Compound

In the organic EL device according to the exemplary embodiment, the first compound is exemplified by the compound represented by the formula (1), (1X), (12X), (13X), (14X), (15X), or (16X).

Compound Represented by Formula (1)

In the organic EL device according to the exemplary embodiment, the first compound is also preferably the compound represented by the formula (1). The first compound represented by the formula (1) has at least one group represented by a formula (11) below.

(1)

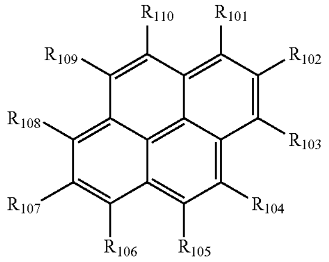

-continued

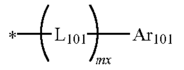

(11)

In the formula (1):

$R_{101}$ to $R_{110}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11);

at least one of $R_{101}$ to $R_{110}$ is a group represented by the formula (11); when a plurality of groups represented by the formula (11) are present, the plurality of groups represented by the formula (11) are mutually the same or different;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In an exemplary embodiment, $Ar_{101}$ is preferably a substituted or unsubstituted aryl group having 6 to 50 ring carbon atoms.

In an exemplary embodiment, $Ar_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted pyrenyl group, a substituted or unsubstituted phenanthryl group, or a substituted or unsubstituted fluorenyl group.

In an exemplary embodiment, the first compound is preferably represented by a formula (101) below.

(101)

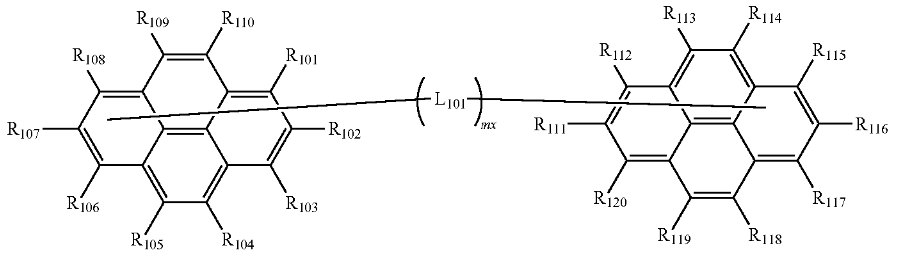

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 0, 1, 2, 3, 4 or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11) represents a bonding position to a pyrene ring in the formula (1).

In the first compound represented by the formula (1):

$R_{901}$, $R_{902}$, $R_{903}$, $R_{904}$, $R_{905}$, $R_{906}$, $R_{907}$, $R_{801}$ and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

In the formula (101):

$R_{101}$ to $R_{120}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

one of $R_{101}$ to $R_{110}$ represents a bonding position to $L_{101}$, and one of $R_{111}$ to $R_{120}$ represents a bonding position to $L_{101}$;

$L_{101}$ is a single bond, a substituted or unsubstituted arylene group having 6 to 50 ring carbon atoms, or a substituted or unsubstituted divalent heterocyclic group having 5 to 50 ring atoms;

mx is 0, 1, 2, 3, 4 or 5; and when two or more $L_{101}$ are present, the two or more $L_{101}$ are mutually the same or different.

In an exemplary embodiment, $L_{101}$ is preferably a single bond or a substituted or unsubstituted arylene group having 6 to 50 ring carbon atoms.

In an exemplary embodiment, two or more of $R_{101}$ to $R_{110}$ are preferably the groups represented by the formula (11).

In an exemplary embodiment, it is preferable that two or more of $R_{101}$ to $R_{110}$ are the groups represented by the formula (11) and $Ar_{101}$ is a substituted or unsubstituted aryl group having 6 to 50 ring carbon atoms.

In an exemplary embodiment, it is preferable that: $Ar_{101}$ is not a substituted or unsubstituted pyrenyl group;

$L_{101}$ is not a substituted or unsubstituted pyrenylene group; and the substituted or unsubstituted aryl group having 6 to 50 ring carbon atoms as $R_{101}$ to $R_{110}$ not being the group represented by the formula (11) is not a substituted or unsubstituted pyrenyl group.

In an exemplary embodiment, $R_{101}$ to $R_{110}$ not being the group represented by the formula (11) are preferably each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In an exemplary embodiment, $R_{101}$ to $R_{110}$ not being the group represented by the formula (11) are preferably each independently a hydrogen atom, a substituted or unsubstituted alkyl group having 1 to 50 carbon atoms, or a substituted or unsubstituted cycloalkyl group having 3 to 50 ring carbon atoms.

In an exemplary embodiment, $R_{101}$ to $R_{110}$ not being the group represented by the formula (11) are each preferably a hydrogen atom.

Compound Represented by Formula (1X)

In the organic EL device according to the exemplary embodiment, the first compound is also preferably a compound represented by a formula (1X) below.

(1X)

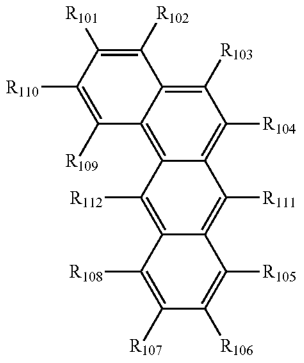

(11X)

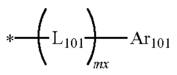

In the formula (1X):

$R_{101}$ to $R_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (11X);

at least one of $R_{101}$ to $R_{112}$ is the group represented by the formula (11X);

when a plurality of groups represented by the formula (11X) are present, the plurality of groups represented by the formula (11X) are mutually the same or different;

$L_{101}$ is a single bond, a substituted or unsubstituted arylene group having 6 to 50 ring carbon atoms, or a substituted or unsubstituted divalent heterocyclic group having 5 to 50 ring atoms;

$Ar_{101}$ is a substituted or unsubstituted aryl group having 6 to 50 ring carbon atoms, or a substituted or unsubstituted heterocyclic group having 5 to 50 ring atoms;

mx is 1, 2, 3, 4 or 5;

when two or more $L_{101}$ are present, the two or more $L_{101}$ are mutually the same or different;

when two or more $Ar_{101}$ are present, the two or more $Ar_{101}$ are mutually the same or different; and

* in the formula (11X) represents a bonding position to a benz[a]anthracene ring in the formula (1X).

In the organic EL device according to the exemplary embodiment, the group represented by the formula (11X) is preferably a group represented by a formula (111X) below.

(111X)

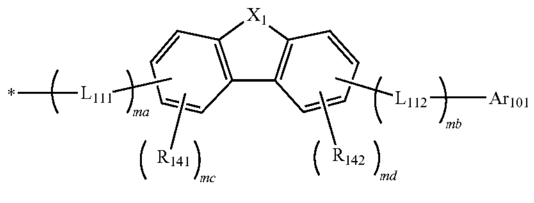

In the formula (111X):

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3, or 4;

mb is 1, 2, 3, or 4;

ma+mb is 2, 3, or 4;

$Ar_{101}$ represents the same as $Ar_{101}$ in the formula (11X);

$R_{141}$, $R_{142}$, $R_{143}$, $R_{144}$, and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{141}$ are mutually the same or different;

and is 3; and three $R_{142}$ are mutually the same or different.

Among positions *1 to *8 of carbon atoms in a cyclic structure represented by a formula (111aX) below in the group represented by the formula (111X), $L_{111}$ is bonded to one of the positions *1 to *4, $R_{141}$ is bonded to each of three positions of the rest of *1 to *4, $L_{112}$ is bonded to one of the positions *5 to *8, and $R_{142}$ is bonded to each of three positions of the rest of *5 to *8.

(111aX)

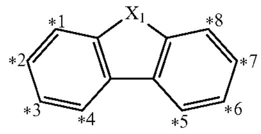

For instance, in the group represented by the formula (111X), when $L_{111}$ is bonded to a carbon atom at *2 in the cyclic structure represented by the formula (111aX) and $L_{112}$ is bonded to a carbon atom at *7 in the cyclic structure represented by the formula (111aX), the group represented by the formula (111X) is represented by a formula (111bX) below.

(111bX)

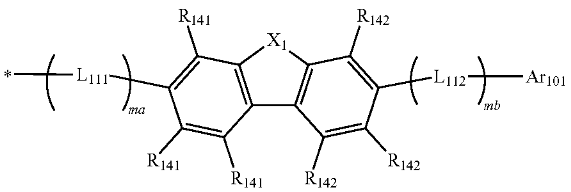

In the formula (111bX):

$X_1$, $L_{111}$, $L_{112}$, ma, mb, $Ar_{101}$, $R_{141}$, $R_{142}$, $R_{143}$, $R_{144}$ and $R_{145}$ each independently represent the same as $X_1$, $L_{111}$, $L_{112}$, ma, mb, $Ar_{101}$, $R_{141}$, $R_{142}$, $R_{143}$, $R_{144}$ and $R_{145}$ in the formula (111X);

a plurality of $R_{141}$ are mutually the same or different; and a plurality of $R_{142}$ are mutually the same or different.

In the organic EL device according to the exemplary embodiment, the group represented by the formula (111X) is preferably the group represented by the formula (111bX).

In the compound represented by the formula (1X), it is preferable that ma is 1 or 2 and mb is 1 or 2.

In the compound represented by the formula (1X), it is preferable that ma is 1 and mb is 1.

In the compound represented by the formula (1X), $Ar_{101}$ is preferably a substituted or unsubstituted aryl group having 6 to 50 ring carbon atoms.

In the compound represented by the formula (1X), $Ar_{101}$ is preferably a substituted or unsubstituted phenyl group, a substituted or unsubstituted naphthyl group, a substituted or unsubstituted biphenyl group, a substituted or unsubstituted terphenyl group, a substituted or unsubstituted benz[a]anthryl group, a substituted or unsubstituted pyrenyl group, a substituted or unsubstituted phenanthryl group, or a substituted or unsubstituted fluorenyl group.

The compound represented by the formula (1X) is also preferably represented by a formula (101X) below.

(101X)

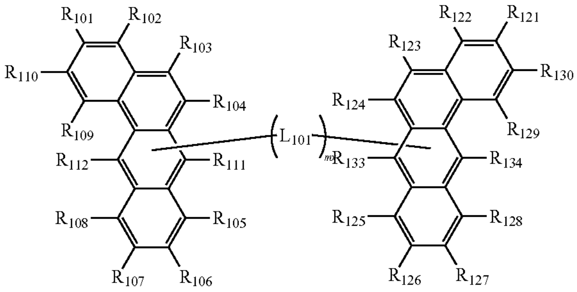

In the formula (101X):

one of $R_{111}$ and $R_{112}$ represents a bonding position to $L_{101}$ and one of $R_{133}$ and $R_{134}$ represents a bonding position to $L_{101}$;

$R_{101}$ to $R_{110}$, $R_{121}$ to $R_{130}$, $R_{111}$ or $R_{112}$ that is not a bonding position to $L_{101}$, and $R_{133}$ or $R_{134}$ that is not a bonding position to $L_{101}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{101}$ is a single bond, a substituted or unsubstituted arylene group having 6 to 50 ring carbon atoms, or a substituted or unsubstituted divalent heterocyclic group having 5 to 50 ring atoms;

mx is 1, 2, 3, 4 or 5; and when two or more $L_{101}$ are present, the two or more $L_{101}$ are mutually the same or different.

In the compound represented by the formula (1X), $L_{101}$ is preferably a single bond or a substituted or unsubstituted arylene group having 6 to 50 ring carbon atoms.

The compound represented by the formula (1X) is also preferably represented by a formula (102X) below.

(102X)

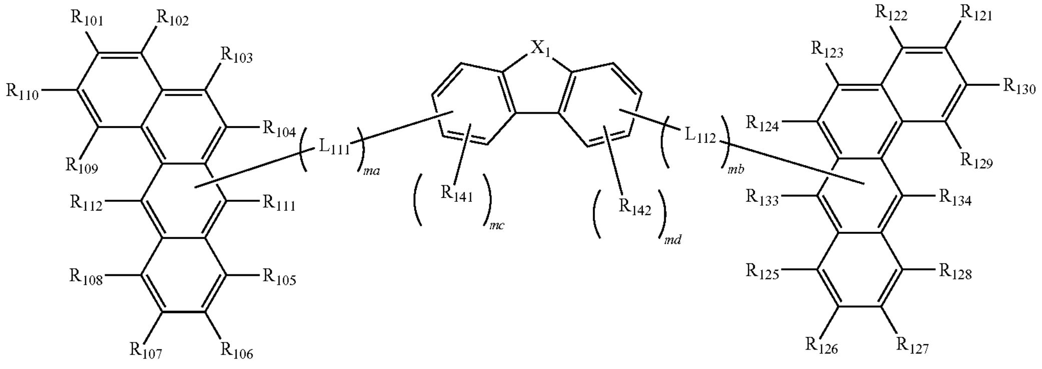

In the formula (102X):

one of $R_{111}$ and $R_{112}$ represents a bonding position to $L_{111}$ and one of $R_{133}$ and $R_{134}$ represents a bonding position to $L_{112}$;

$R_{101}$ to $R_{110}$, $R_{121}$ to $R_{130}$, $R_{111}$ or $R_{112}$ that is not a bonding position to Li, and $R_{133}$ or $R_{134}$ that is not a bonding position to $L_{112}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$X_1$ is $CR_{143}R_{144}$, an oxygen atom, a sulfur atom, or $NR_{145}$;

$L_{111}$ and $L_{112}$ are each independently a single bond, a substituted or unsubstituted arylene group having 6 to 50 ring carbon atoms, or a substituted or unsubstituted divalent heterocyclic group having 5 to 50 ring atoms;

ma is 1, 2, 3, or 4;

mb is 1, 2, 3, or 4;

ma+mb is 2, 3, 4, or 5;

$R_{141}$, $R_{142}$, $R_{143}$, $R_{144}$, and $R_{145}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(═O)$R_{801}$, a group represented by —COOR$_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

mc is 3;

three $R_{141}$ are mutually the same or different;

md is 3; and three $R_{142}$ are mutually the same or different.

In the compound represented by the formula (1X), it is preferable that ma is 1 or 2 and mb is 1 or 2 in the formula (102X).

In the compound represented by the formula (1X), it is preferable that ma is 1 and mb is 1 in the formula (102X).

In the compound represented by the formula (1X), the group represented by the formula (11X) is also preferably a group represented by a formula (11AX) below or a group represented by a formula (11BX) below.

(11AX)

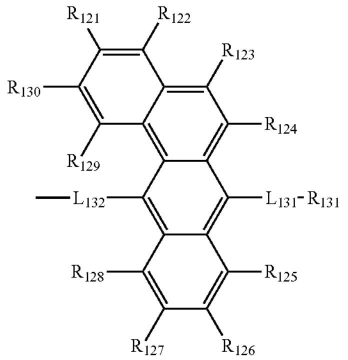

(11BX)

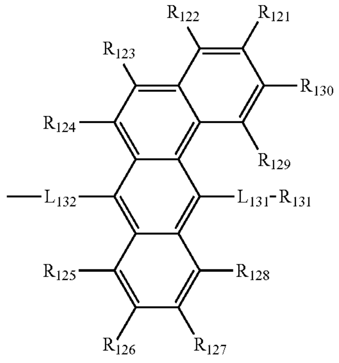

In the formulae (11AX) and (11BX):

$R_{121}$ to $R_{131}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

when a plurality of groups represented by the formula (11AX) are present, the plurality of groups represented by the formula (11AX) are mutually the same or different;

when a plurality of groups represented by the formula (11BX) are present, the plurality of groups represented by the formula (11BX) are mutually the same or different;

$L_{131}$ and $L_{132}$ are each independently a single bond, a substituted or unsubstituted arylene group having 6 to 50 ring carbon atoms, or a substituted or unsubstituted divalent heterocyclic group having 5 to 50 ring atoms; and

* in each of the formulae (11AX) and (11BX) represents a bonding position to a benz[a]anthracene ring in the formula (1X).

The compound represented by the formula (1X) is also preferably represented by a formula (103X) below.

(103X)

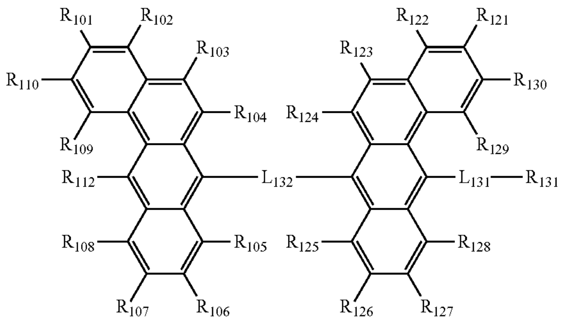

In the formula (103X):

$R_{101}$ to $R_{110}$ and $R_{112}$ respectively represent the same as $R_{101}$ to $R_{110}$ and $R_{112}$ in the formula (1X); and $R_{121}$ to $R_{131}$, $L_{131}$, and $L_{132}$ respectively represent the same as $R_{121}$ to $R_{131}$, $L_{131}$, and $L_{132}$ in the formula (11BX).

In the compound represented by the formula (1X), $L_{131}$ is also preferably a substituted or unsubstituted arylene group having 6 to 50 ring carbon atoms.

In the compound represented by the formula (1X), $L_{132}$ is also preferably a substituted or unsubstituted arylene group having 6 to 50 ring carbon atoms.

In the compound represented by the formula (1X), two or more of $R_{101}$ to $R_{112}$ are also preferably the groups represented by the formula (11X).

In the compound represented by the formula (1X), it is preferable that two or more of $R_{101}$ to $R_{112}$ are the groups represented by the formula (11X) and $Ar_{101}$ in the formula (11X) is a substituted or unsubstituted aryl group having 6 to 50 ring carbon atoms.

In the compound represented by the formula (1X), it is also preferable that: $Ar_{101}$ is not a substituted or unsubstituted benz[a]anthryl group;

$L_{101}$ is not a substituted or unsubstituted benz[a]anthrylene group; and a substituted or unsubstituted aryl group having 6 to 50 ring carbon atoms as $R_{101}$ to $R_{110}$ not being the group represented by the formula (11X) is not a substituted or unsubstituted benz[a]anthryl group.

In the compound represented by the formula (1X), $R_{101}$ to $R_{112}$ not being the group represented by the formula (11X) are preferably each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

In the compound represented by the formula (1X), $R_{101}$ to $R_{112}$ not being the group represented by the formula (11X) are preferably a hydrogen atom, a substituted or unsubstituted alkyl group having 1 to 50 carbon atoms, or a substituted or unsubstituted cycloalkyl group having 3 to 50 ring carbon atoms.

In the compound represented by the formula (1X), $R_{101}$ to $R_{112}$ not being the group represented by the formula (11X) are each preferably a hydrogen atom.

Compound Represented by Formula (12X)

In the organic EL device according to the exemplary embodiment, the first compound is also preferably the compound represented by the formula (12X).

(12X)

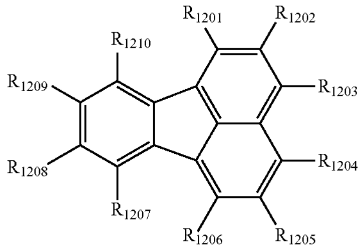

(121)

$$*—(L_{1201})_{mx2}—Ar_{12021}$$

In the formula (12X):

at least one combination of adjacent two or more of $R_{1201}$ to $R_{1210}$ are mutually bonded to form a substituted or unsubstituted monocyclic ring, or mutually bonded to form a substituted or unsubstituted fused ring;

$R_{1201}$ to $R_{1210}$ not forming the substituted or unsubstituted monocyclic ring and not forming the substituted or unsubstituted fused ring are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (121);

a substituent for substituting the substituted or unsubstituted monocyclic ring, a substituent for substituting the substituted or unsubstituted fused ring, and at least one of $R_{1201}$ to $R_{1210}$ are the group represented by the formula (121);

when a plurality of groups represented by the formula (121) are present, the plurality of groups represented by the formula (121) are mutually the same or different;

$L_{1201}$ is a single bond, a substituted or unsubstituted arylene group having 6 to 50 ring carbon atoms, or a substituted or unsubstituted divalent heterocyclic group having 5 to 50 ring atoms;

$Ar_{1201}$ is a substituted or unsubstituted aryl group having 6 to 50 ring carbon atoms, or a substituted or unsubstituted heterocyclic group having 5 to 50 ring atoms;

mx2 is 0, 1, 2, 3, 4, or 5;

when two or more $L_{1201}$ are present, the two or more $L_{1201}$ are mutually the same or different;

when two or more $Ar_{1201}$ are present, the two or more $Ar_{1201}$ are mutually the same or different; and

* in the formula (121) represents a bonding position to a ring represented by the formula (12X).

In the formula (12X), combinations of adjacent two of $R_{1201}$ to $R_{1210}$ refer to a combination of $R_{1201}$ and $R_{1202}$, a combination of $R_{1202}$ and $R_{1203}$, a combination of $R_{1203}$ and $R_{1204}$, a combination of $R_{1204}$ and $R_{1205}$, a combination of $R_{1205}$ and $R_{1206}$, a combination of $R_{1207}$ and $R_{1208}$, a combination of $R_{1208}$ and $R_{1209}$, and a combination of $R_{1209}$ and $R_{1210}$.

Compound Represented by Formula (13X)

In the organic EL device according to the exemplary embodiment, the first compound is also preferably a compound represented by a formula (13X) below.

(13X)

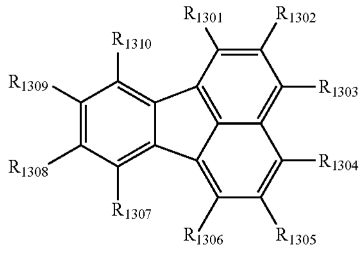

(131)

$$*-(L_{1301})_{mx3}-Ar_{1301}$$

In the formula (13X):

$R_{1301}$ to $R_{1310}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a group represented by —S—($R_{905}$), a substituted or unsubstituted aralkyl group having 7 to 50 carbon atoms, a group represented by —C(=O)$R_{801}$, a group represented by —COO$R_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (131);

at least one of $R_{1301}$ to $R_{1310}$ is the group represented by the formula (131);

when a plurality of groups represented by the formula (131) are present, the plurality of groups represented by the formula (131) are mutually the same or different;

$L_{1301}$ is a single bond, a substituted or unsubstituted arylene group having 6 to 50 ring carbon atoms, or a substituted or unsubstituted divalent heterocyclic group having 5 to 50 ring atoms;

$Ar_{1301}$ is a substituted or unsubstituted aryl group having 6 to 50 ring carbon atoms, or a substituted or unsubstituted heterocyclic group having 5 to 50 ring atoms;

mx3 is 0, 1, 2, 3, 4, or 5;

when two or more $L_{1301}$ are present, the two or more $L_{1301}$ are mutually the same or different;

when two or more $Ar_{1301}$ are present, the two or more $Ar_{1301}$ are mutually the same or different; and

* in the formula (131) represents a bonding position to a fluoranthene ring in the formula (13X).

In the organic EL device according to the exemplary embodiment, none of a combination(s) of adjacent two or more of $R_{1301}$ to $R_{1310}$ not being the group represented by the formula (131) are not bonded to each other. In the formula (13X), combinations of adjacent two of $R_{1301}$ to $R_{1310}$ refer to a combination of $R_{1301}$ and $R_{1302}$, a combination of $R_{1302}$ and $R_{1303}$, a combination of $R_{1303}$ and $R_{1304}$, a combination of $R_{1304}$ and $R_{1305}$, a combination of $R_{1305}$ and $R_{1306}$, a combination of $R_{1307}$ and $R_{1308}$, a combination of $R_{1308}$ and $R_{1309}$, and a combination of $R_{1309}$ and $R_{1310}$.

Compound Represented by Formula (14X)

In the organic EL device according to the exemplary embodiment, the first compound is also preferably a compound represented by a formula (14X) below.

(14X)

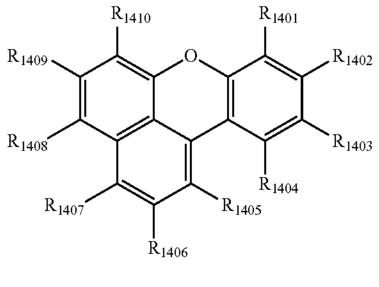

(141)

$$*-(L_{1401})_{mx4}-Ar_{1401}$$

In the formula (14X):

$R_{1401}$ to $R_{1410}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (141);

at least one of $R_{1401}$ to $R_{1410}$ is the group represented by the formula (141);

when a plurality of groups represented by the formula (141) are present, the plurality of groups represented by the formula (141) are mutually the same or different;

$L_{1401}$ is a single bond, a substituted or unsubstituted arylene group having 6 to 50 ring carbon atoms, or a substituted or unsubstituted divalent heterocyclic group having 5 to 50 ring atoms;

$Ar_{1401}$ is a substituted or unsubstituted aryl group having 6 to 50 ring carbon atoms, or a substituted or unsubstituted heterocyclic group having 5 to 50 ring atoms;

mx4 is 0, 1, 2, 3, 4, or 5;

when two or more $L_{1401}$ are present, the two or more $L_{1401}$ are mutually the same or different;

when two or more $Ar_{1401}$ are present, the two or more $Ar_{1401}$ are mutually the same or different; and

* in the formula (141) represents a bonding position to a ring represented by the formula (14X).

Compound Represented by Formula (15X)

In the organic EL device according to the exemplary embodiment, the first compound is also preferably a compound represented by a formula (15X) below.

(15X)

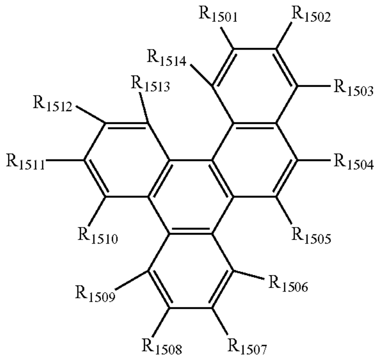

(151)

$$*-(L_{1501})_{mx5}-Ar_{1501}$$

In the formula (15X):

$R_{1501}$ to $R_{1514}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by $-C(=O)R_{801}$, a group represented by $-COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (151);

at least one of $R_{1501}$ to $R_{1514}$ is the group represented by the formula (151);

when a plurality of groups represented by the formula (151) are present, the plurality of groups represented by the formula (151) are mutually the same or different;

$L_{1501}$ is a single bond, a substituted or unsubstituted arylene group having 6 to 50 ring carbon atoms, or a substituted or unsubstituted divalent heterocyclic group having 5 to 50 ring atoms;

$Ar_{1501}$ is a substituted or unsubstituted aryl group having 6 to 50 ring carbon atoms, or a substituted or unsubstituted heterocyclic group having 5 to 50 ring atoms;

mx5 is 0, 1, 2, 3, 4, or 5;

when two or more $L_{1501}$ are present, the two or more $L_{1501}$ are mutually the same or different;

when two or more $Ar_{1501}$ are present, the two or more $Ar_{1501}$ are mutually the same or different; and

* in the formula (151) represents a bonding position to a ring represented by the formula (15X).

Compound Represented by Formula (16X)

In the organic EL device according to the exemplary embodiment, the first compound is also preferably a compound represented by a formula (16X) below.

(16X)

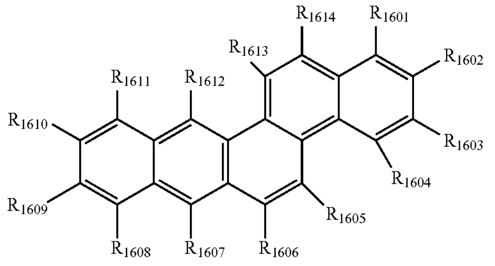

(161)

$$*-(L_{1601})_{mx6}-Ar_{1601}$$

In the formula (16X):

$R_{1601}$ to $R_{1614}$ are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $-Si(R_{901})(R_{902})(R_{903})$, a group represented by $-O-(R_{904})$, a group represented by $-S-(R_{905})$, a substituted or unsubstituted aralkyl group having 7 to 50 carbon atoms, a group represented by —C(═O)$R_{801}$, a group represented by —$COOR_{802}$, a halogen atom, a cyano group, a nitro group, a substituted or unsubstituted aryl group having 6 to 50 ring carbon atoms, a substituted or unsubstituted heterocyclic group having 5 to 50 ring atoms, or a group represented by the formula (161);

at least one of $R_{1601}$ to $R_{1614}$ is the group represented by the formula (161);

when a plurality of groups represented by the formula (161) are present, the plurality of groups represented by the formula (161) are mutually the same or different;

$L_{1601}$ is a single bond, a substituted or unsubstituted arylene group having 6 to 50 ring carbon atoms, or a substituted or unsubstituted divalent heterocyclic group having 5 to 50 ring atoms;

$Ar_{1601}$ is a substituted or unsubstituted aryl group having 6 to 50 ring carbon atoms, or a substituted or unsubstituted heterocyclic group having 5 to 50 ring atoms;

mx6 is 0, 1, 2, 3, 4, or 5;

when two or more $L_{1601}$ are present, the two or more $L_{1601}$ are mutually the same or different;

when two or more $Ar_{1601}$ are present, the two or more $Ar_{1601}$ are mutually the same or different; and

* in the formula (161) represents a bonding position to a ring represented by the formula (16X).

In the organic EL device according to the exemplary embodiment, it is also preferable that the first host material has, in a molecule, a linking structure including a benzene ring and a naphthalene ring linked to each other with a single bond, in which the benzene ring and the naphthalene ring in the linking structure are each independently fused or not fused with a further monocyclic ring or fused ring, and the benzene ring and the naphthalene ring in the linking structure are further linked to each other by cross-linking at least one site other than the single bond.

Since the first host material has the linking structure including such cross-linking, it can be expected to suppress deterioration in chromaticity of the organic EL device.

The first host material in the above case is only required to have a linking structure as the minimum unit in a molecule, the linking structure including a benzene ring and a naphthalene ring linked to each other with a single bond (sometimes referred to as a benzene-naphthalene linking structure), the linking structure being as represented by a formula ($X_1$) or a formula ($X_2$) below. Further, the benzene ring may be fused with a monocyclic ring or fused ring, and the naphthalene ring may be fused with a monocyclic ring or fused ring. For instance, also in a case where the first host material has, in a molecule, a linking structure including a naphthalene ring and a naphthalene ring linked to each other with a single bond (sometimes referred to as a naphthalene-naphthalene linking structure) and being as represented by a formula ($X_3$), a formula ($X_4$), or a formula ($X_5$) below, the naphthalene-naphthalene linking structure is regarded as including the benzene-naphthalene linking structure since one of the naphthalene rings includes a benzene ring.

(X1)

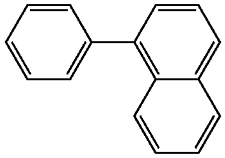

-continued (X2)

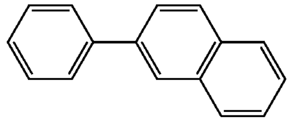

(X3)

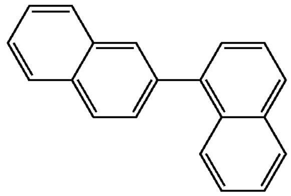

(X4)

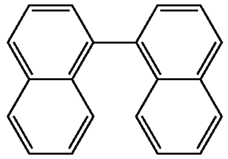

(X5)

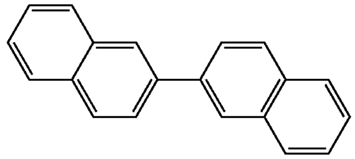

In the organic EL device according to the exemplary embodiment, the cross-linking also preferably includes a double bond.

Specifically, the first host material also preferably has a structure in which the benzene ring and the naphthalene ring are further linked to each other at any other site than the single bond by the cross-linking structure including a double bond.

Assuming that the benzene ring and the naphthalene ring in the benzene-naphthalene linking structure are further linked to each other at at least one site other than the single bond by cross-linking, for example, a linking structure (fused ring) represented by a formula (X11) below is obtained in a case of the formula (X1), and a linking structure (fused ring) represented by a formula (X31) below is obtained in a case of the formula (X3).

Assuming that the benzene ring and the naphthalene ring in the benzene-naphthalene linking structure are further linked to each other at any other site than the single bond by cross-linking including a double bond, for example, a linking structure (fused ring) represented by a formula (X12) below is obtained in a case of the formula (X1), a linking structure (fused ring) represented by a formula (X21) or formula (X22) below is obtained in a case of the formula (X2), a linking structure (fused ring) represented by a formula (X41) below is obtained in a case of the formula (X4), and a linking structure (fused ring) represented by a formula (X51) below is obtained in a case of the formula (X5).

Assuming that the benzene ring and the naphthalene ring in the benzene-naphthalene linking structure are further linked to each other at at least one site other than the single bond by cross-linking including a hetero atom (e.g., an oxygen atom), for example, a linking structure (fused ring) represented by a formula (X13) below is obtained in a case of the formula (X1).

(X11)

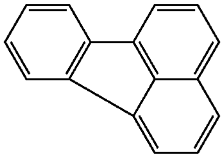

(X12)

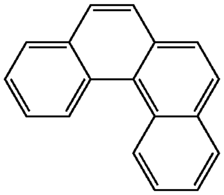

(X13)

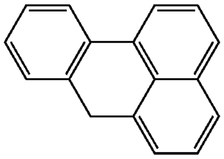

(X21)

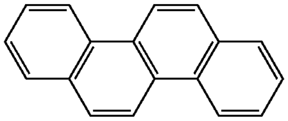

(X22)

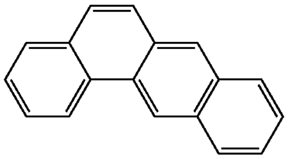

(X31)

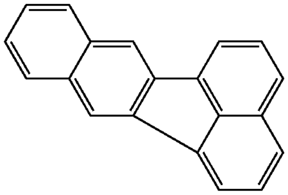

(X41)

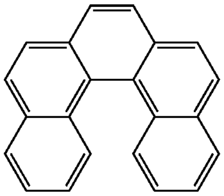

(X51)

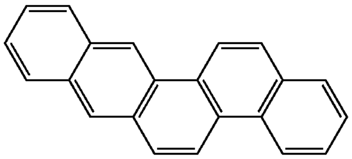

In the organic EL device according to the exemplary embodiment, it is also preferable that: the first host material has, in a molecule, a biphenyl structure in which a first benzene ring and a second benzene ring are linked to each other with a single bond; and the first benzene ring and the second benzene ring in the biphenyl structure are further linked to each other by cross-linking at at least one site other than the single bond.

In the organic EL device according to the exemplary embodiment, it is also preferable that the first benzene ring and the second benzene ring in the biphenyl structure are further linked to each other by the cross-linking at one site other than the single bond. Since the first host material has the biphenyl structure including such cross-linking, it can be expected to inhibit the deterioration in the chromaticity of the organic EL device.

In the organic EL device according to the exemplary embodiment, it is also preferable that the cross-linking includes a double bond.

In the organic EL device according to the exemplary embodiment, it is also preferable that the cross-linking does not include a double bond.

It is also preferable that the first benzene ring and the second benzene ring in the biphenyl structure are further linked to each other by the cross-linking at two sites other than the single bond.

In the organic EL device according to the exemplary embodiment, it is also preferable that the first benzene ring and the second benzene ring in the biphenyl structure are further linked to each other by the cross-linking at two sites other than the single bond and the cross-linking includes no double bond. Since the first host material has the biphenyl structure including such cross-linking, it can be expected to inhibit the deterioration in the chromaticity of the organic EL device.

For example, assuming that the first benzene ring and the second benzene ring in the biphenyl structure represented by a formula (BP1) below are further linked to each other by cross-linking at at least one site other than the single bond, the biphenyl structure is exemplified by linking structures (fused rings) represented by formulae (BP11) to (BP15) below.

(BP1)

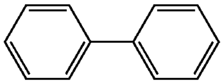

(BP11)

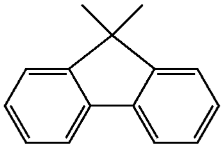

(BP12)

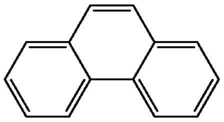

(BP13)

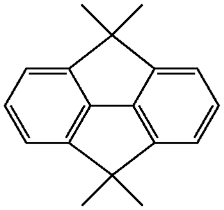

-continued (BP14)

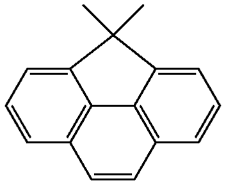

(BP15)

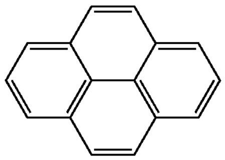

The formula (BP11) represents a linking structure in which the first benzene ring and the second benzene ring are linked to each other at one site other than the single bond by cross-linking including no double bond.

The formula (BP12) represents a linking structure in which the first benzene ring and the second benzene ring are linked to each other at one site other than the single bond by cross-linking including a double bond.

The formula (BP13) represents a linking structure in which the first benzene ring and the second benzene ring are linked to each other at two sites other than the single bond by cross-linking including no double bond.

The formula (BP14) represents a linking structure in which the first benzene ring and the second benzene ring are linked to each other at one of two sites other than the single bond by cross-linking including no double bond while being linked to each other at the other of the two sites other than the single bond by cross-linking including a double bond.

The formula (BP15) represents a linking structure in which the first benzene ring and the second benzene ring are linked to each other at two sites other than the single bond by cross-linking including double bonds.

In the first compound and the second compound, it is preferable that all groups described as “substituted or unsubstituted” groups are “unsubstituted” groups.

Manufacturing Method of First Compound

The first compound that is usable in the organic EL device according to the exemplary embodiment can be manufactured by a known method. The first compound also can be manufactured based on a known method through a known alternative reaction using a known material(s) tailored for the target compound.

Specific Examples of First Compound

Specific examples of the first compound usable in the organic EL device according to the exemplary embodiment include the following compounds. It should however be noted that the invention is not limited by the specific examples of the first compound.

In the specific examples of the compound herein, D represents a deuterium atom, Me represents a methyl group, and tBu represents a tert-butyl group.

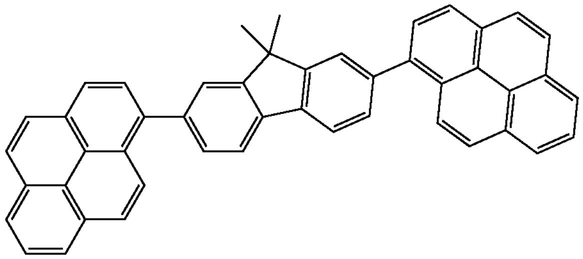

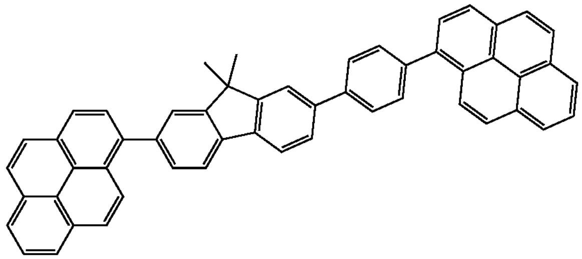

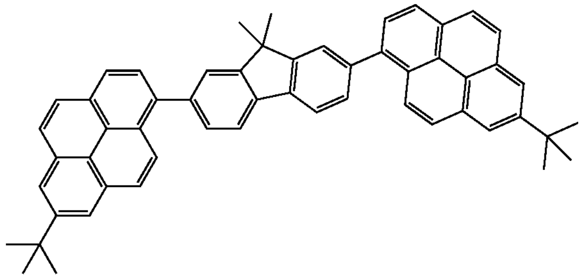

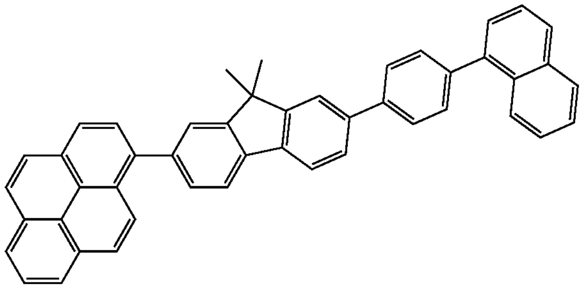

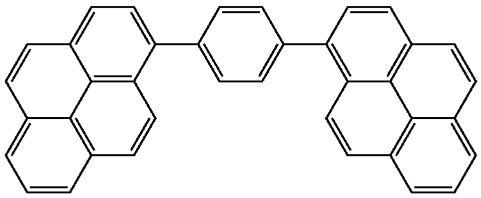

-continued
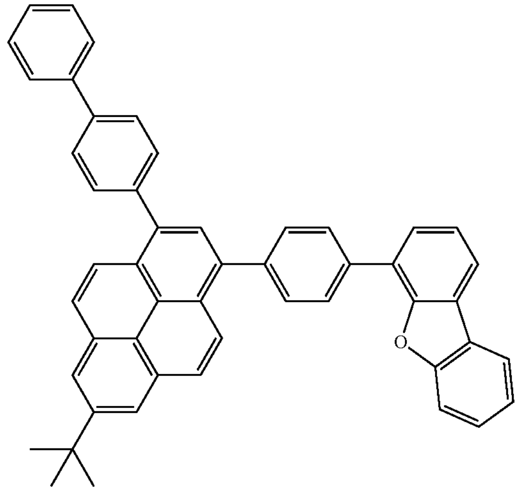
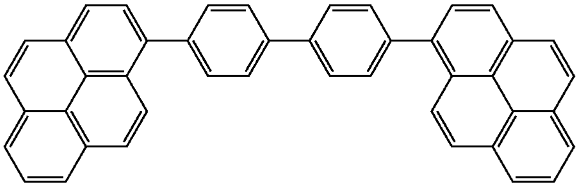
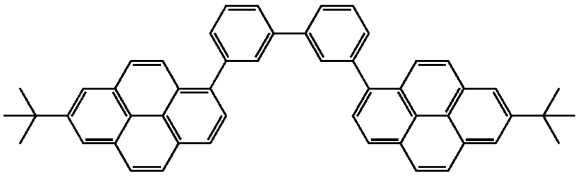
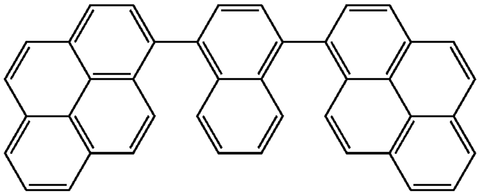
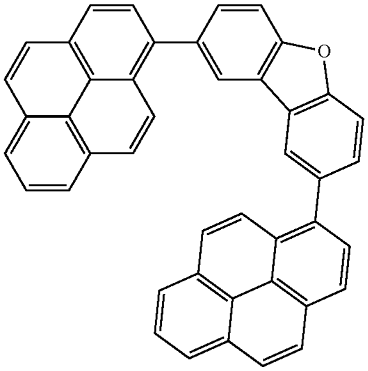
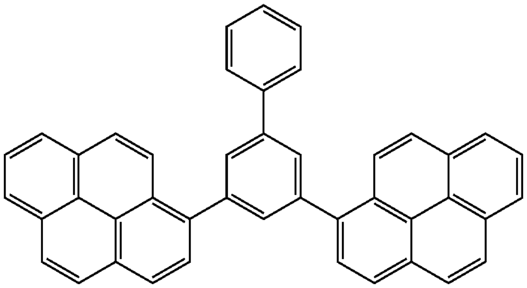
-continued
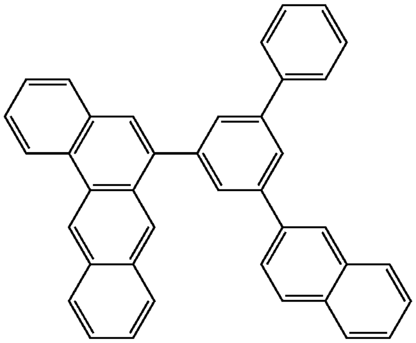
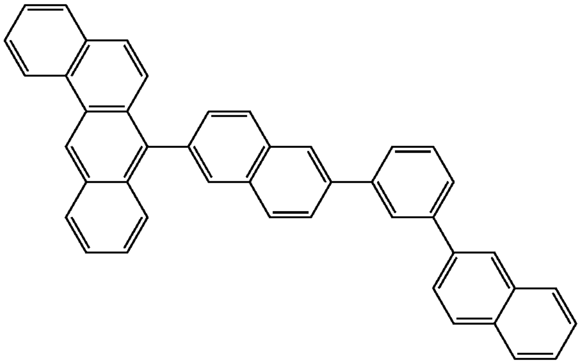
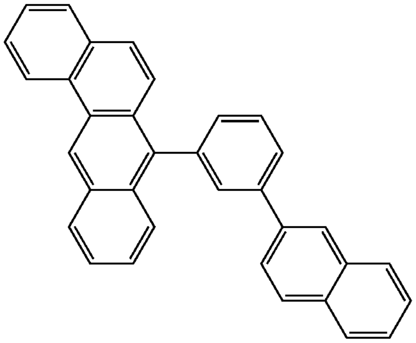
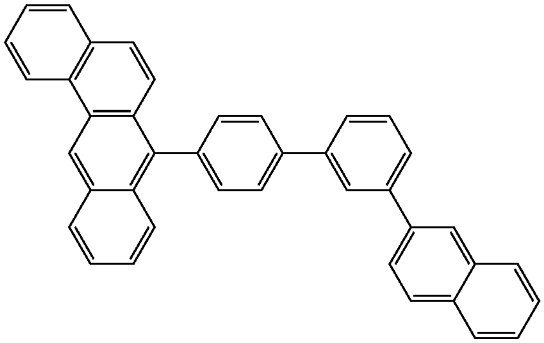

-continued
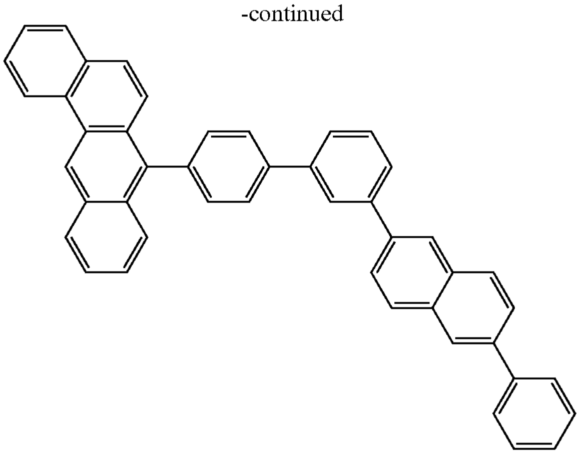
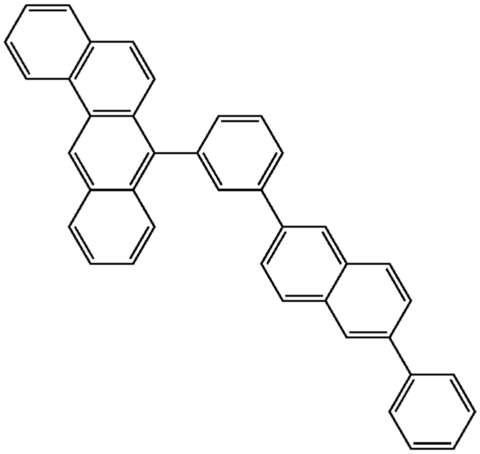
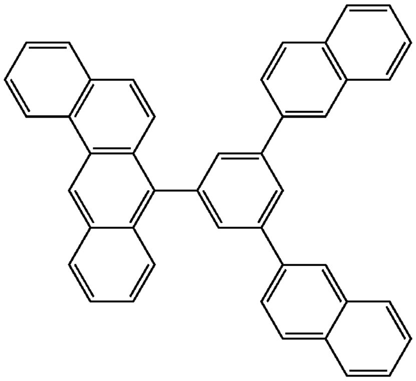
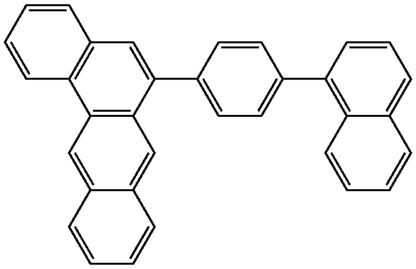
-continued
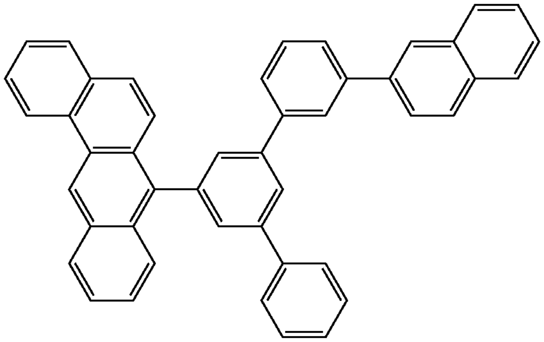
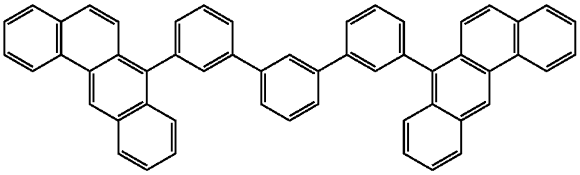
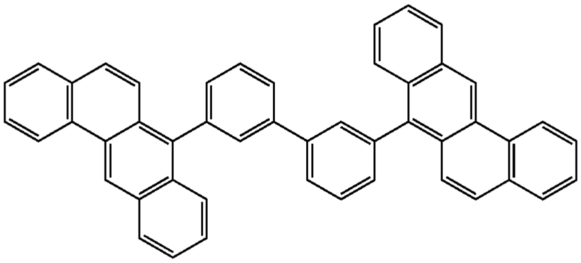
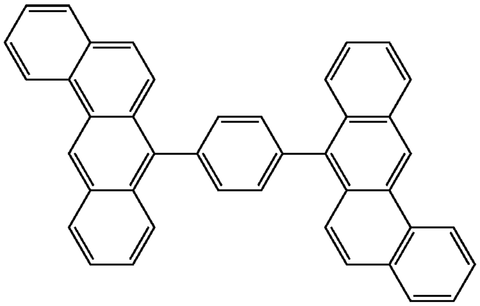
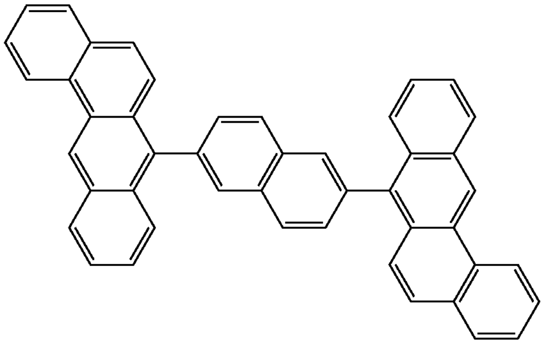
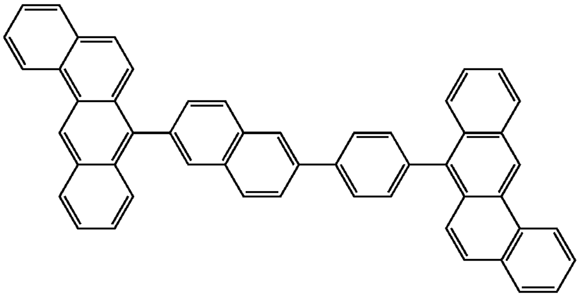

-continued
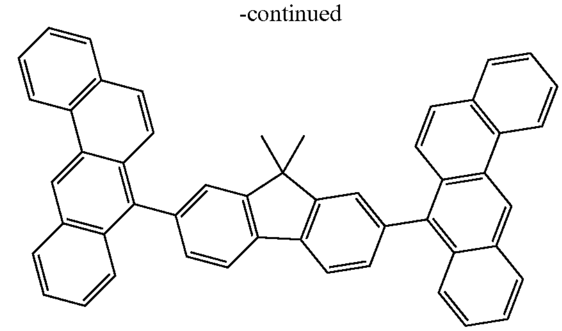
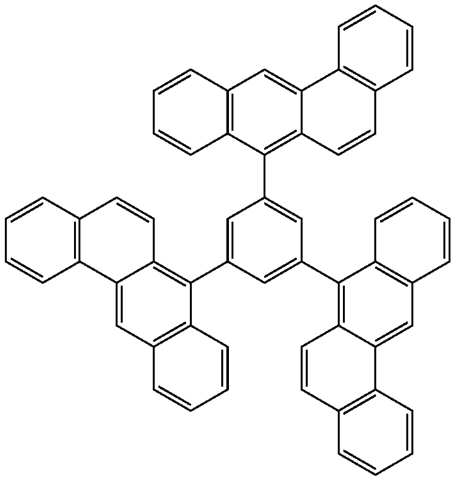
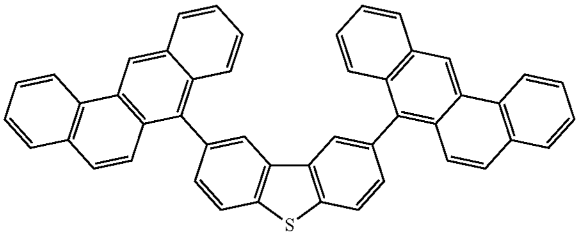
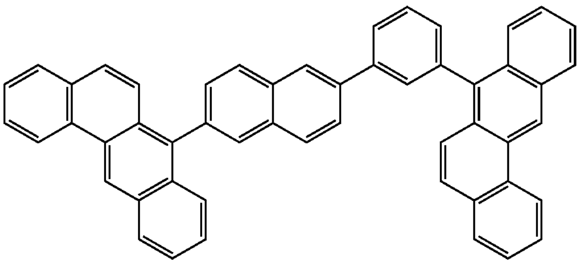
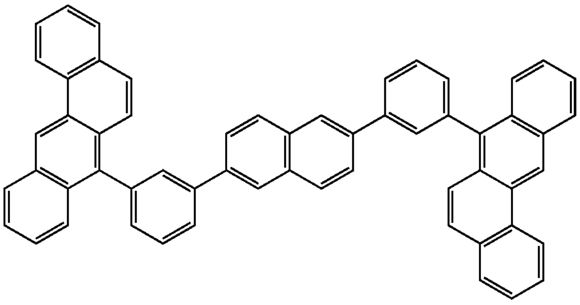
-continued
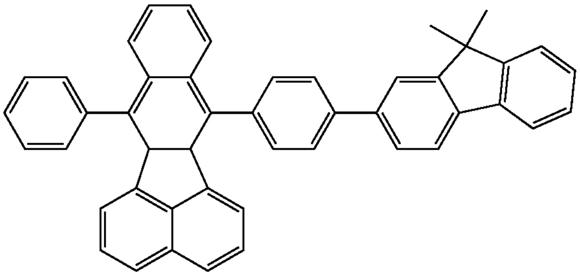
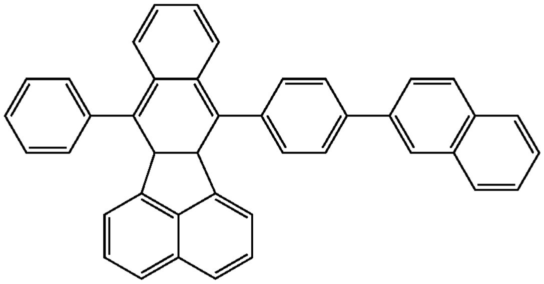
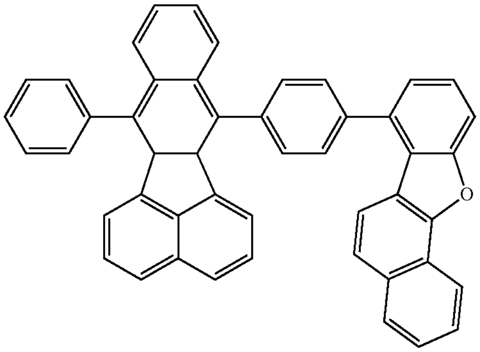
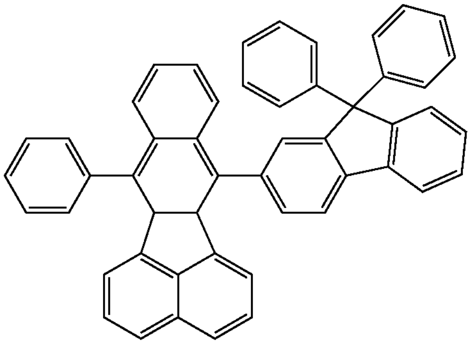
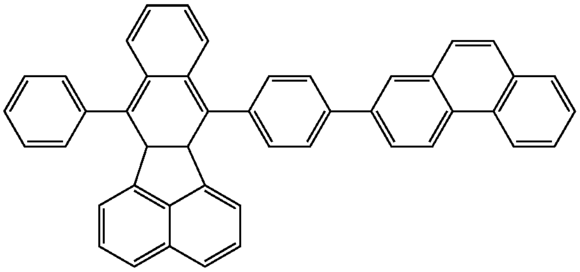

-continued
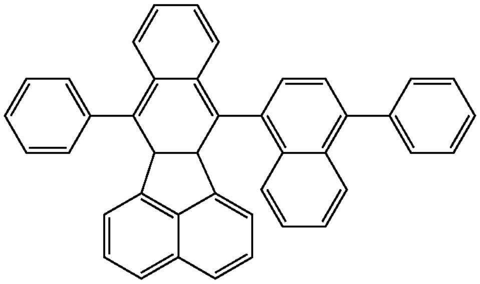
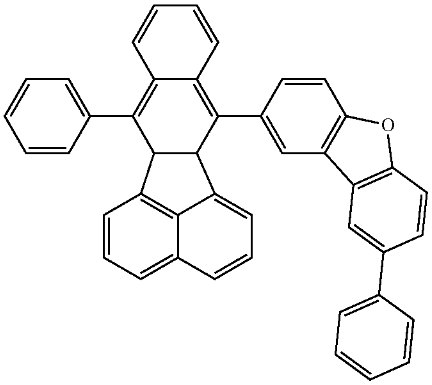
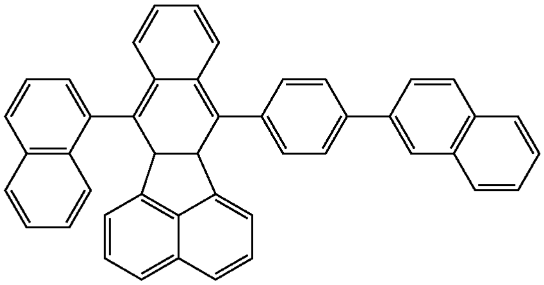
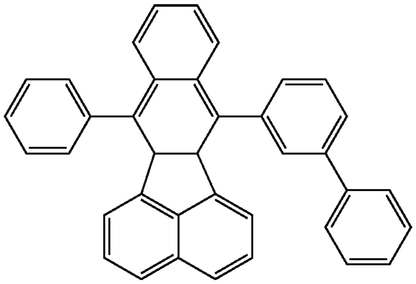
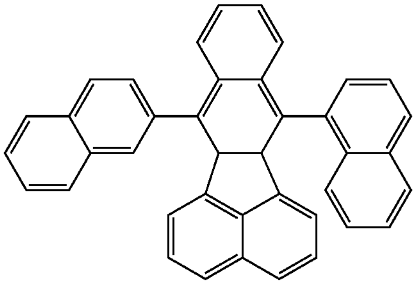
-continued
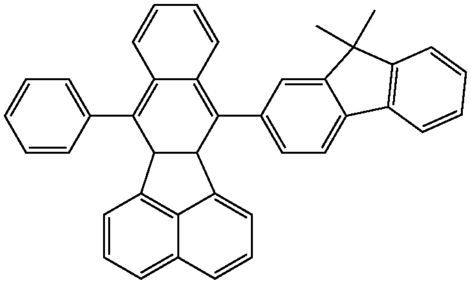
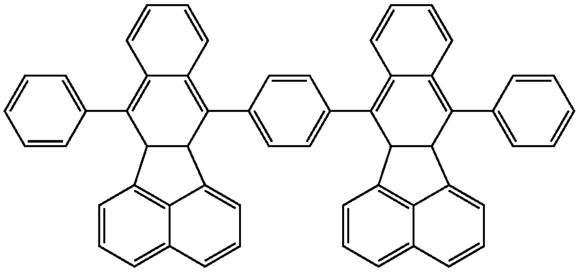
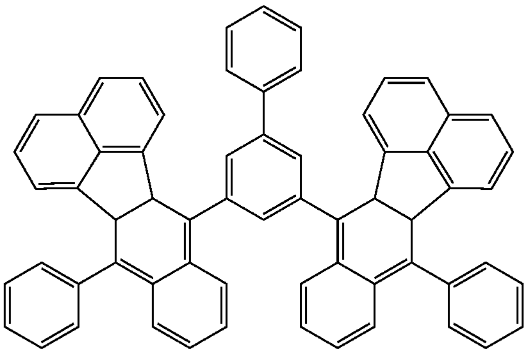
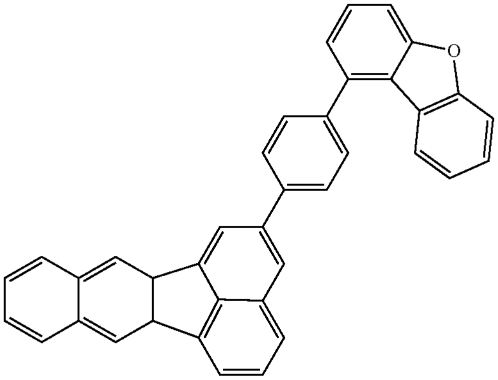

-continued
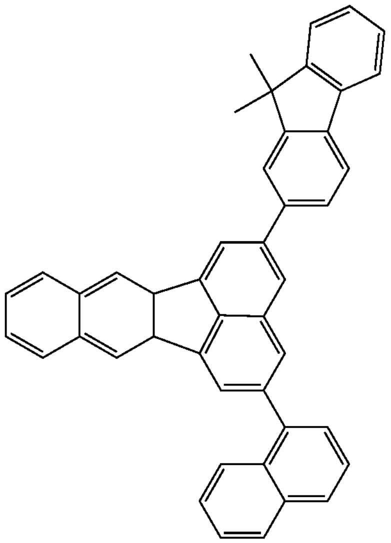
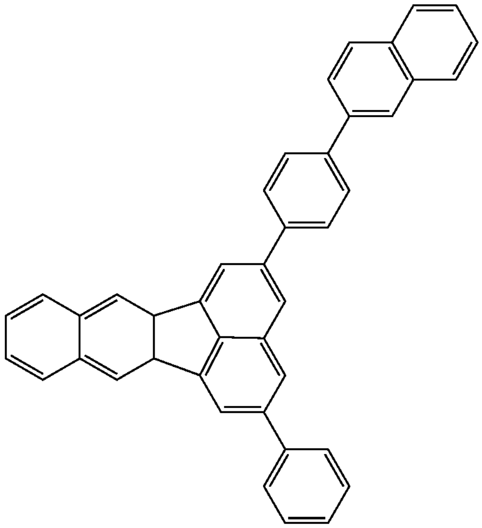
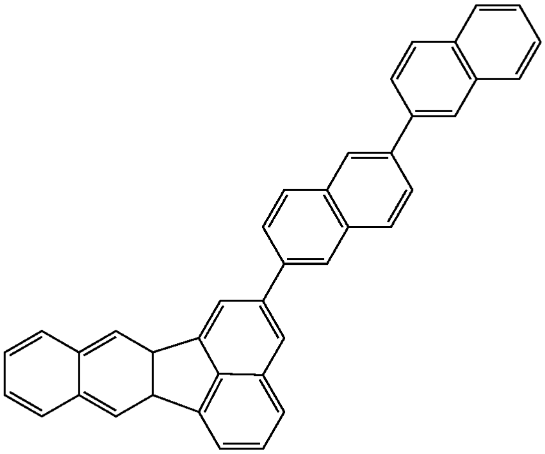
-continued
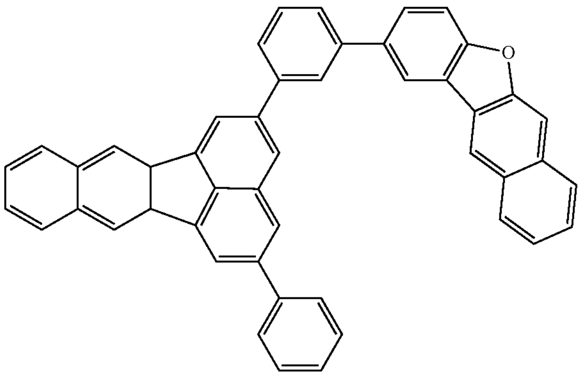
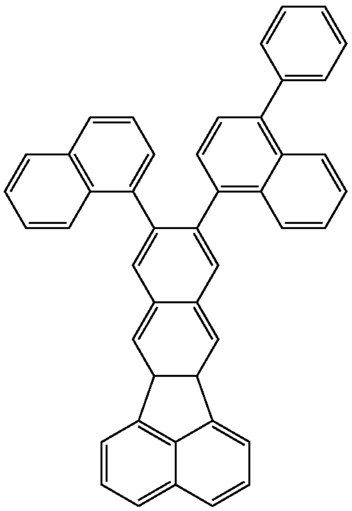
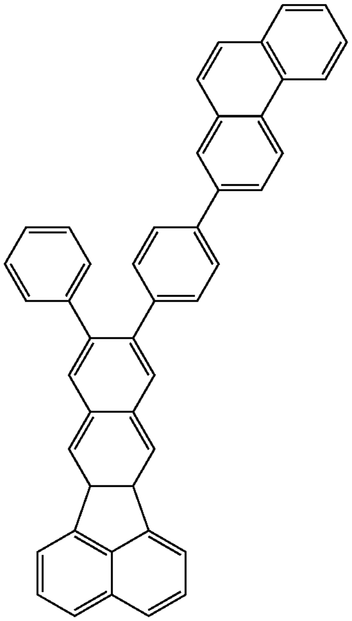

-continued
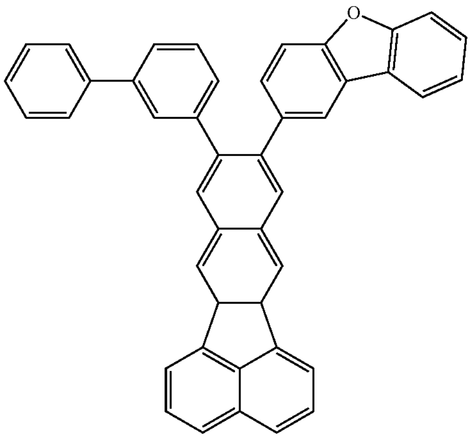
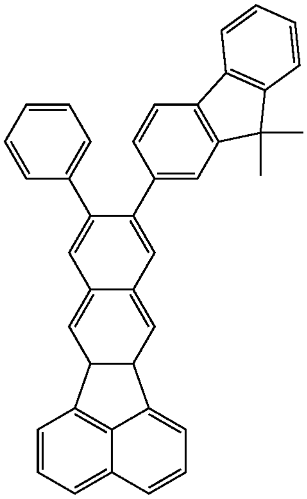
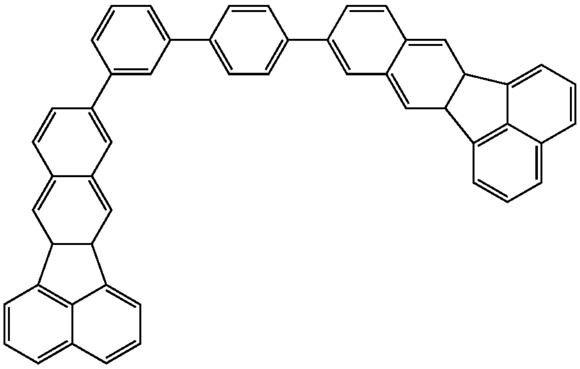
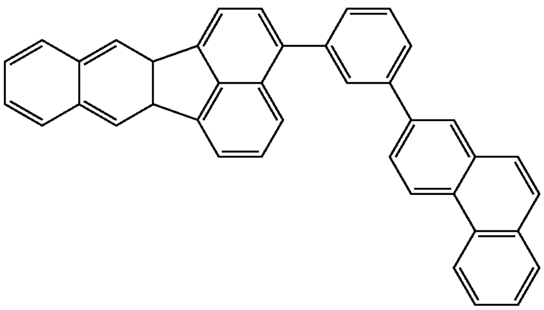
-continued
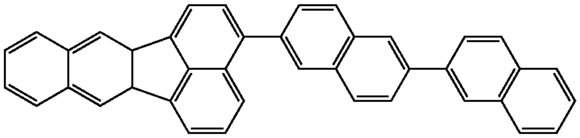
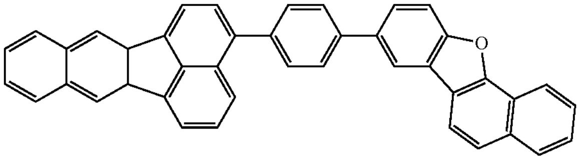
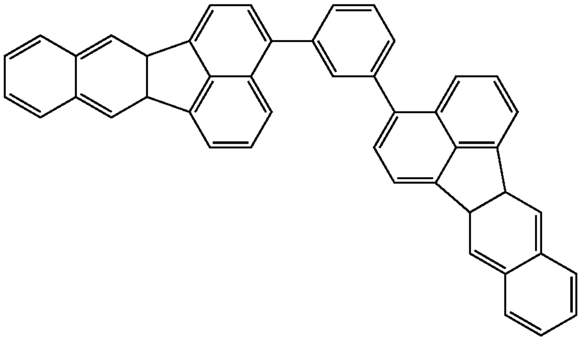
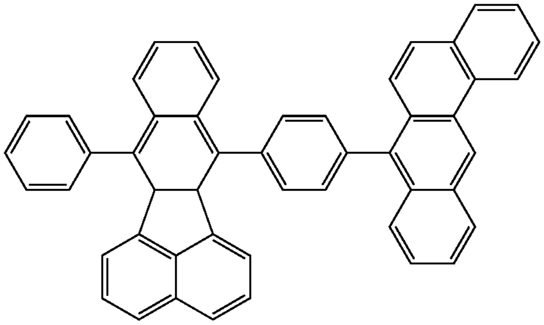
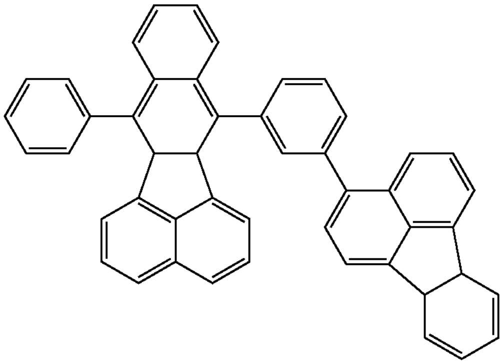

-continued
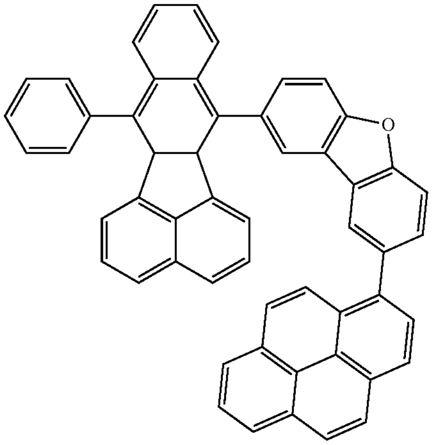
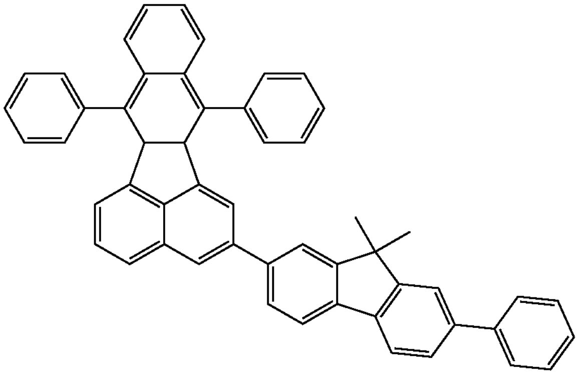
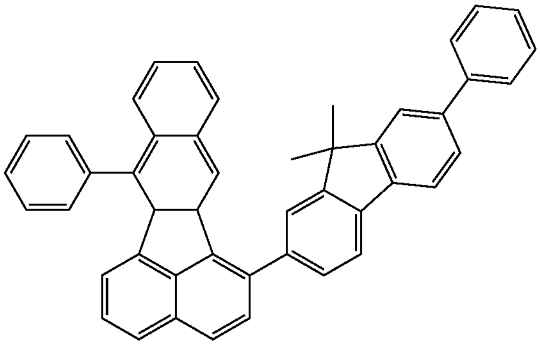
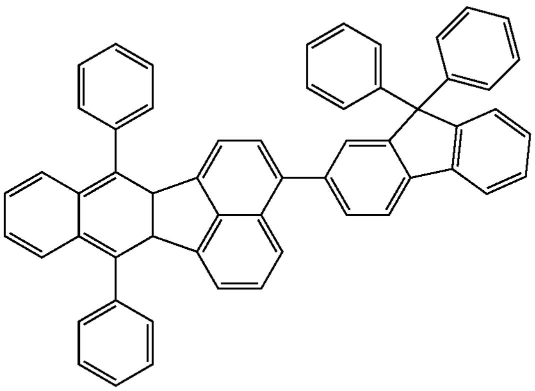
-continued
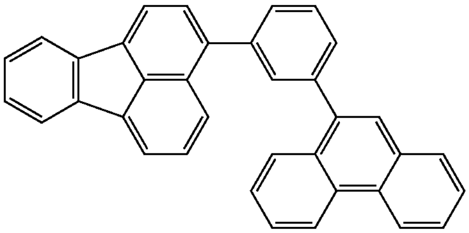
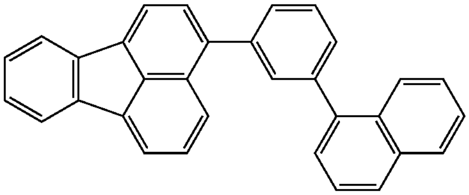
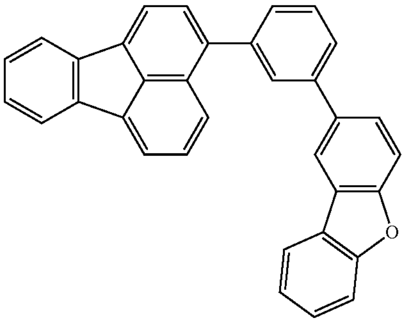
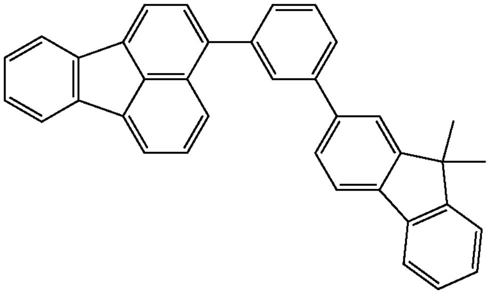
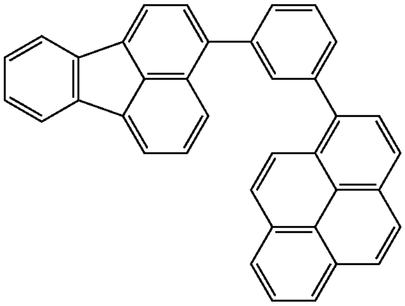
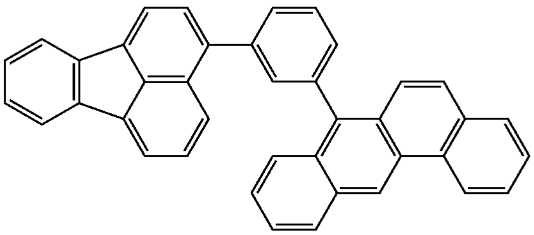

-continued
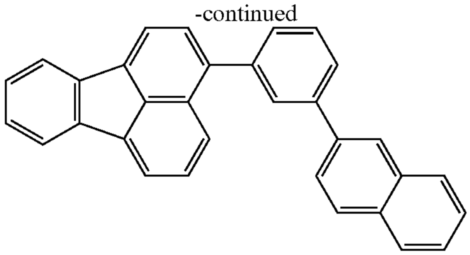
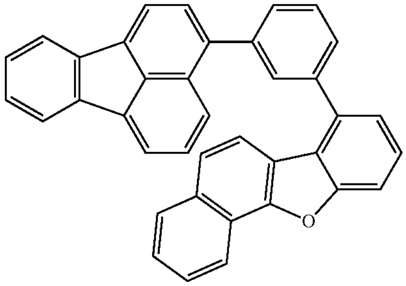
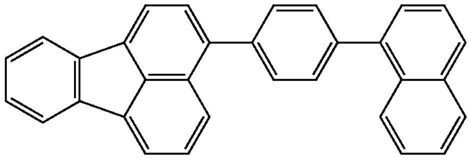
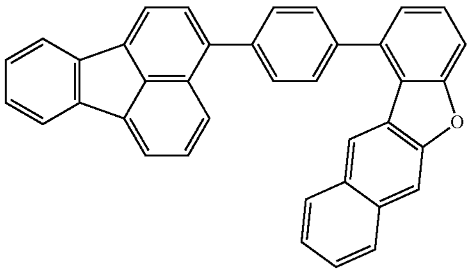
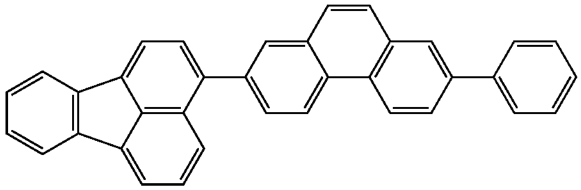
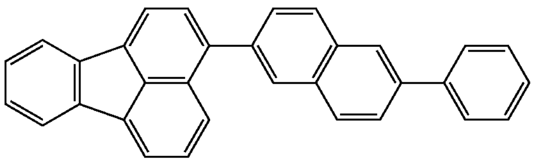
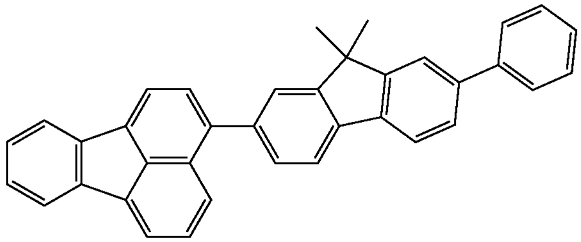
-continued
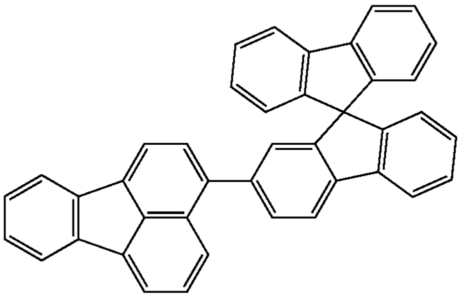
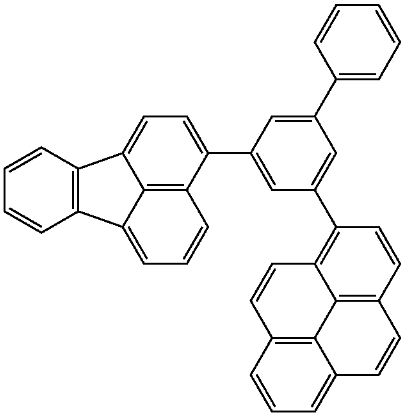
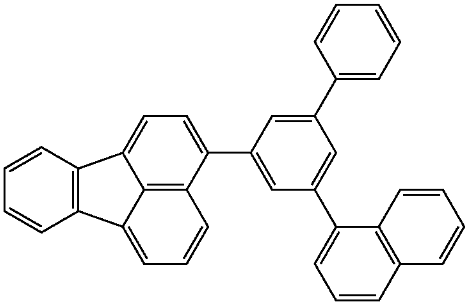
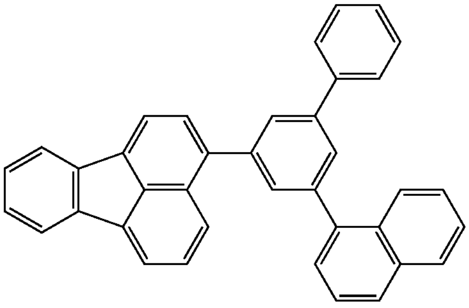
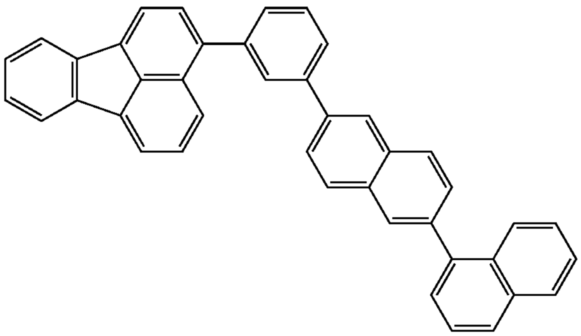

-continued
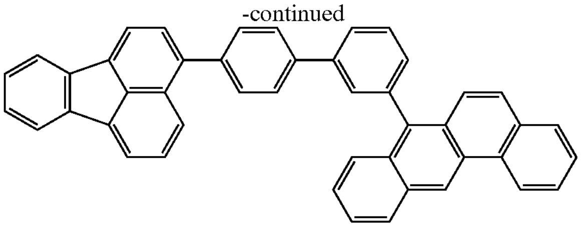
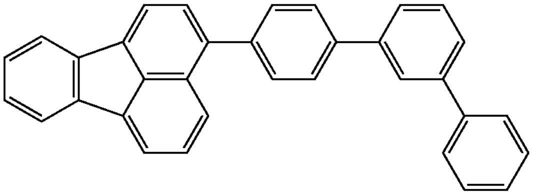
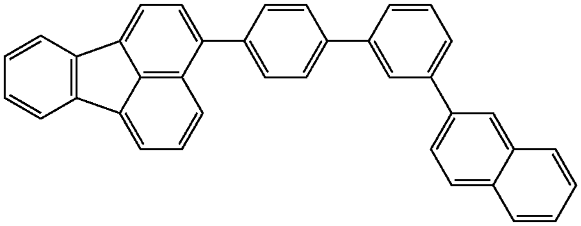
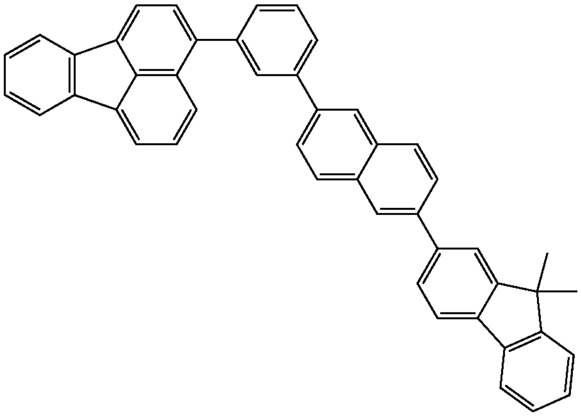
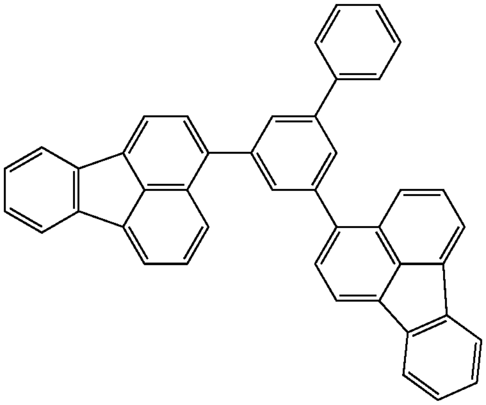
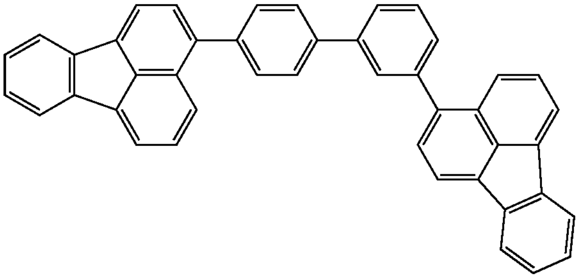
-continued
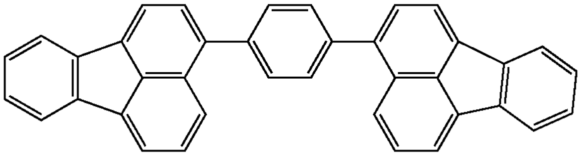
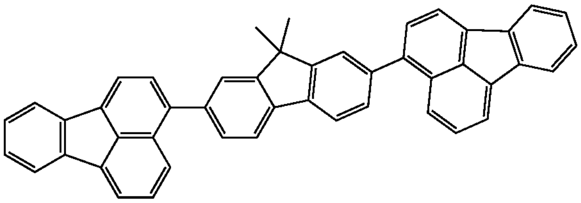
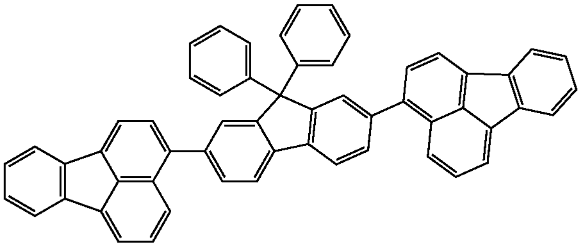
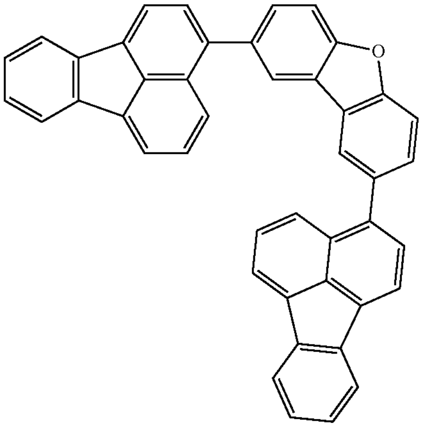
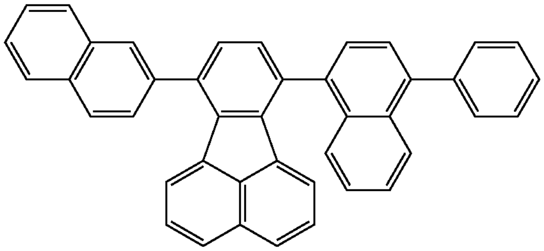
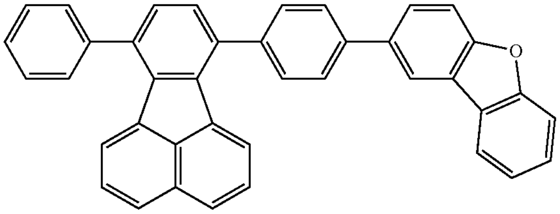
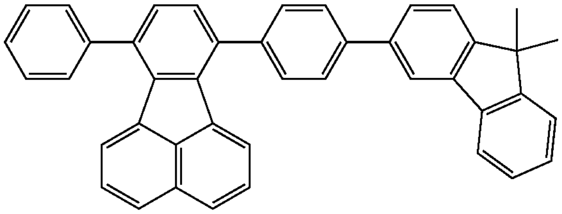

-continued
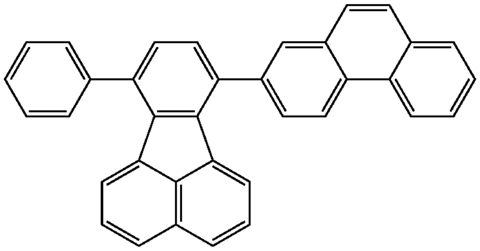
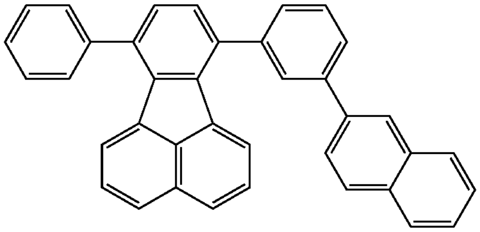
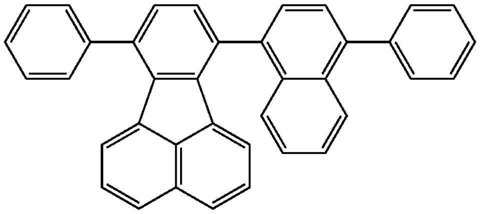
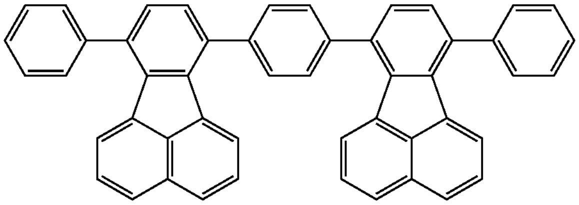
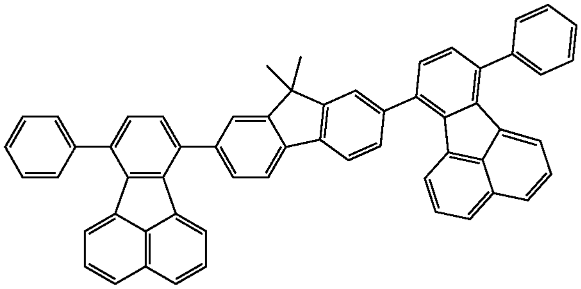
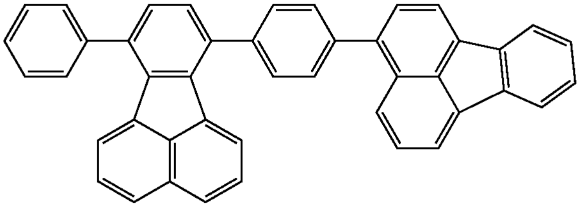
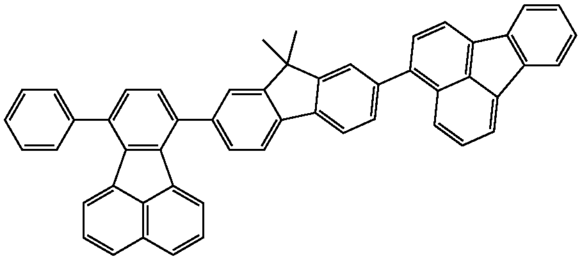
-continued
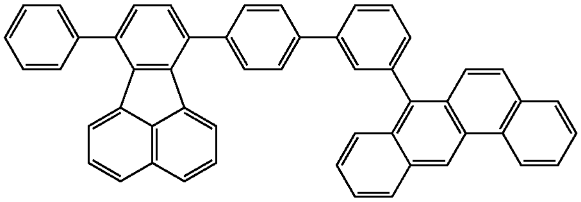
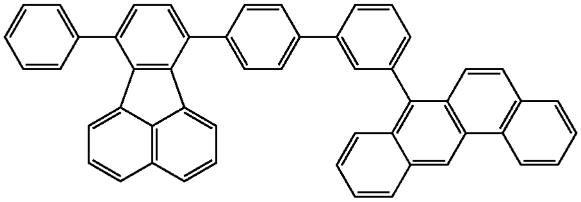
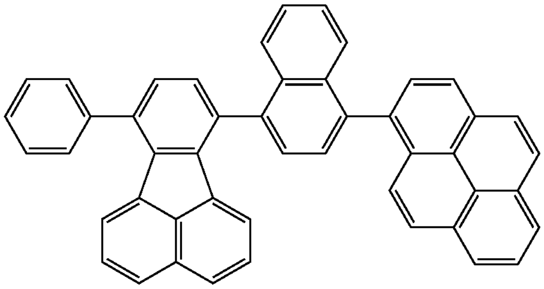
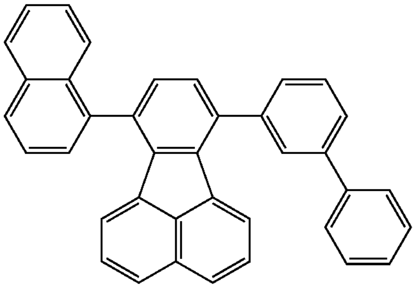
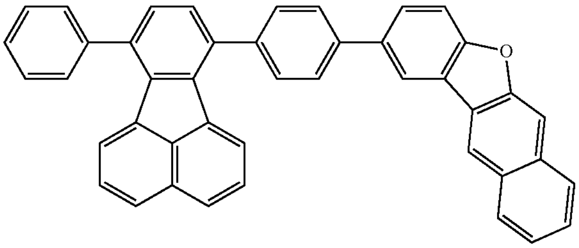
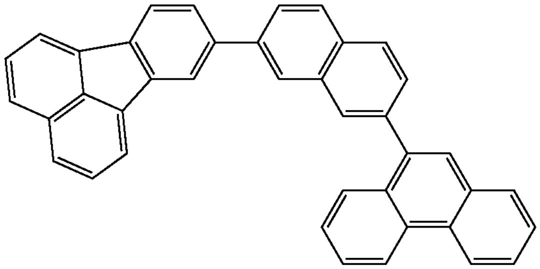
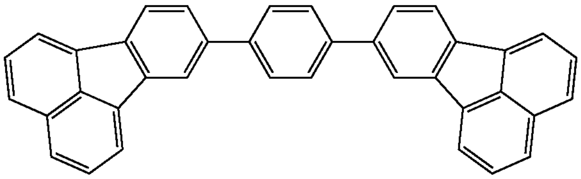

-continued
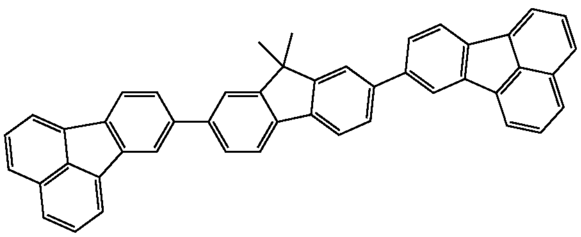
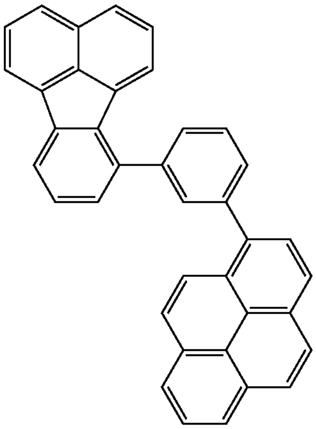
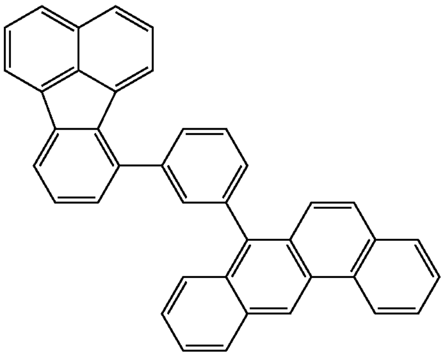
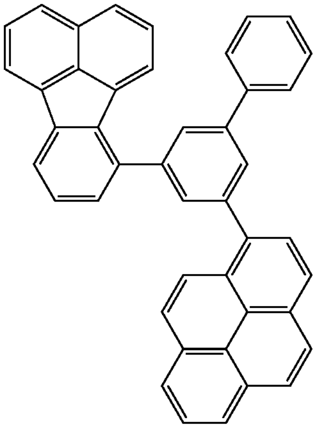
-continued
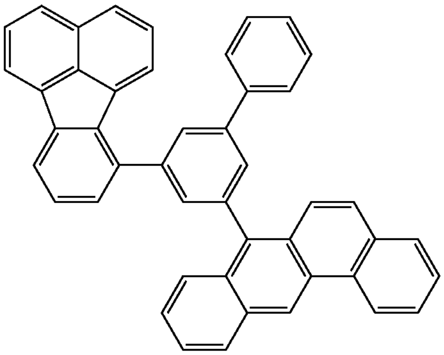
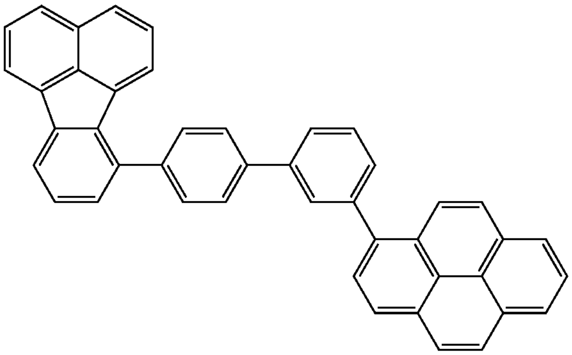
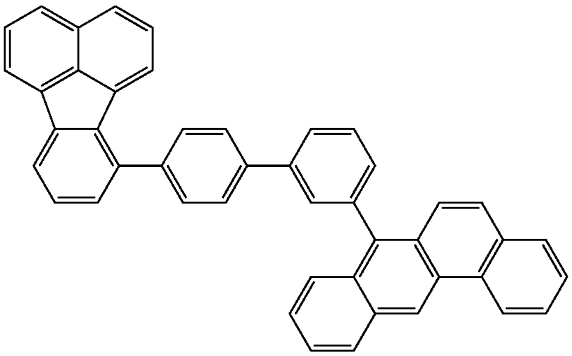
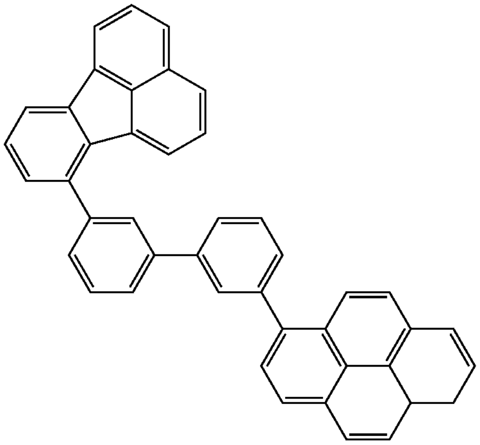

-continued
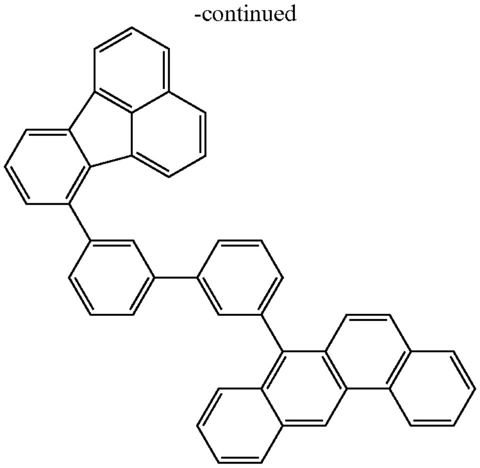
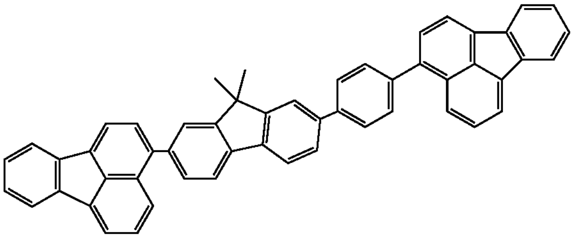
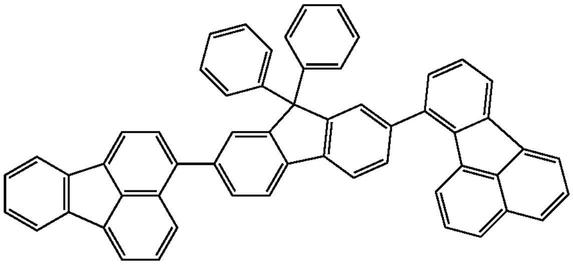
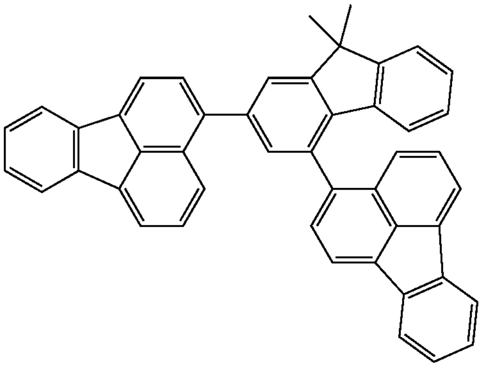
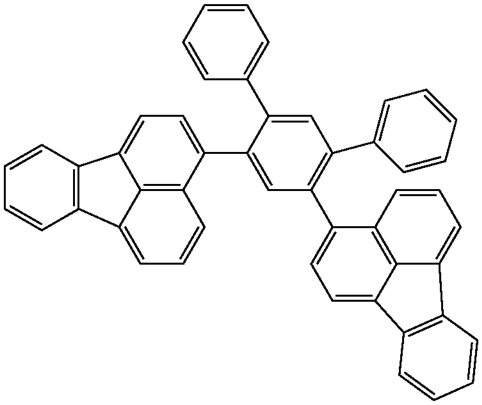
-continued
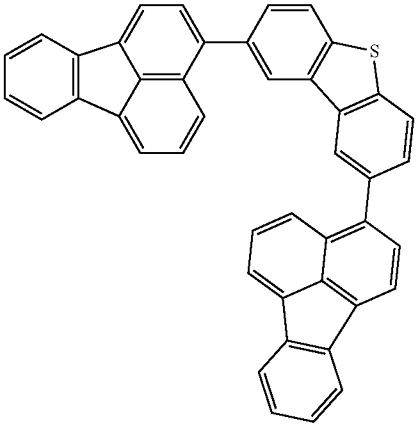
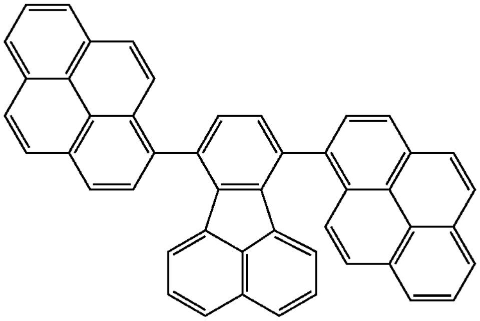
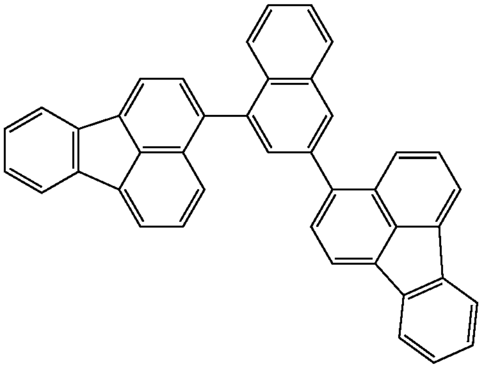
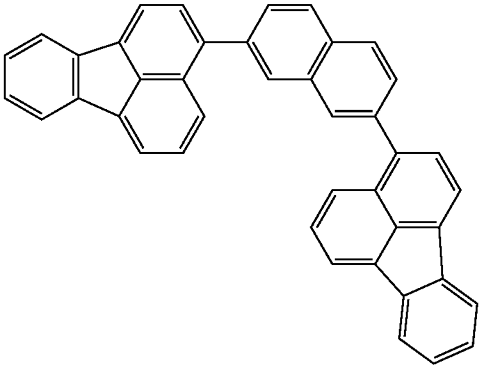
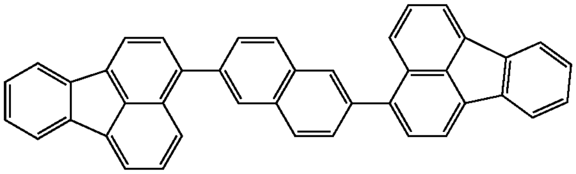

-continued
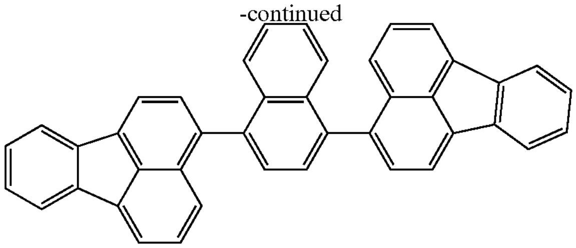
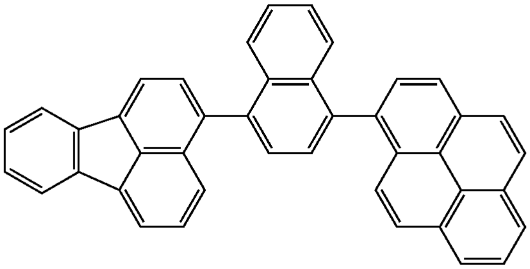
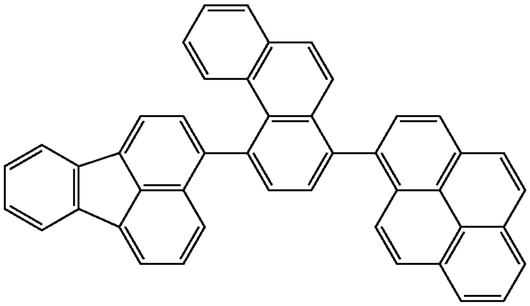
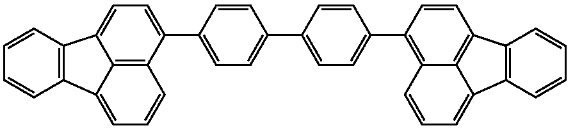
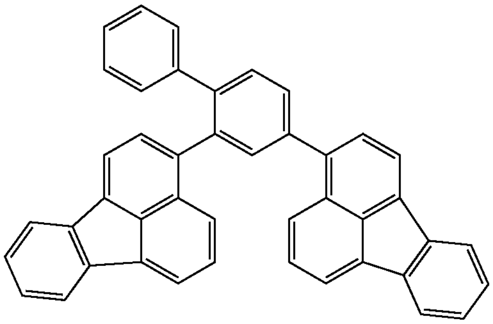
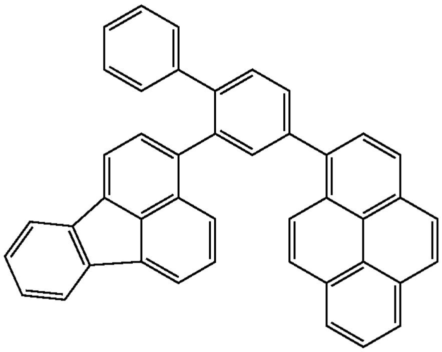
-continued
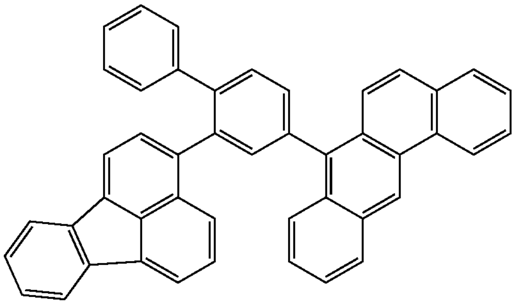
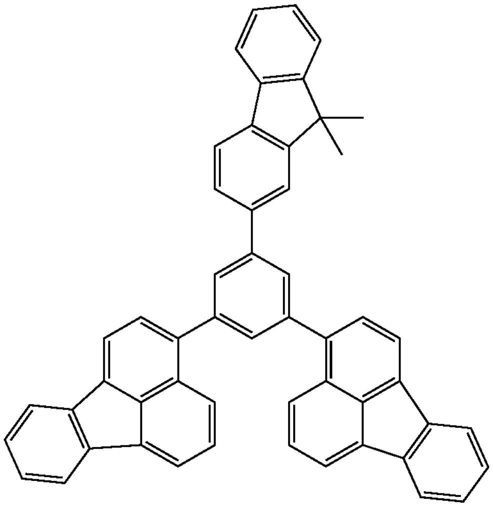
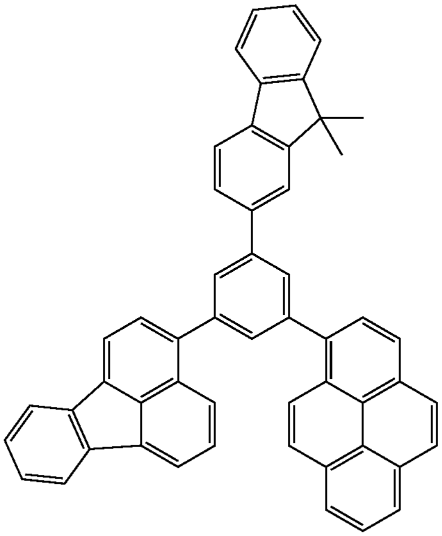

-continued
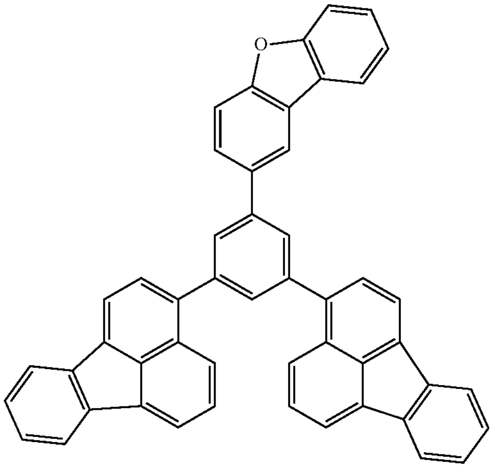
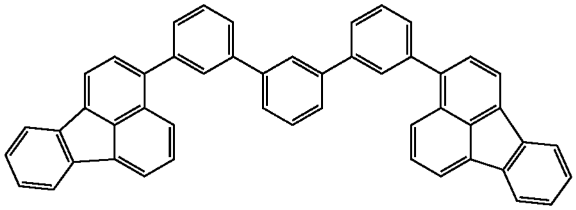
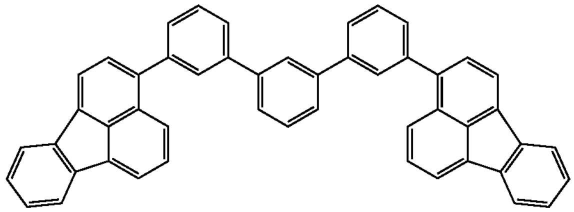
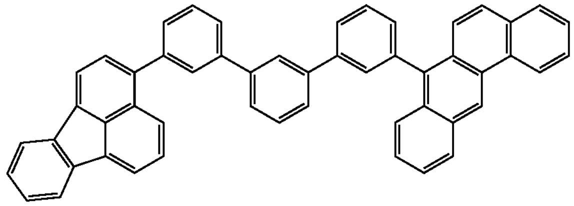
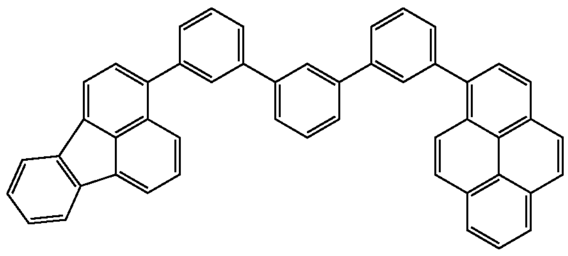
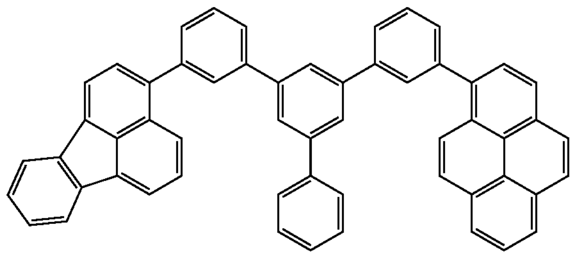
-continued
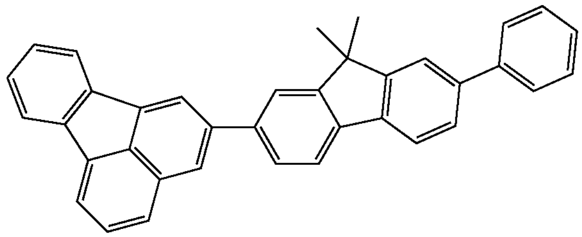
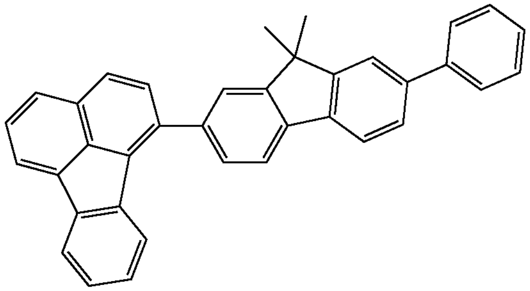
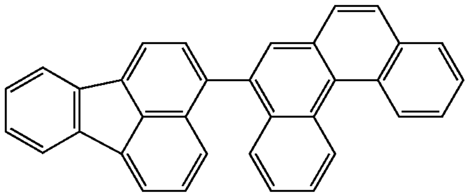
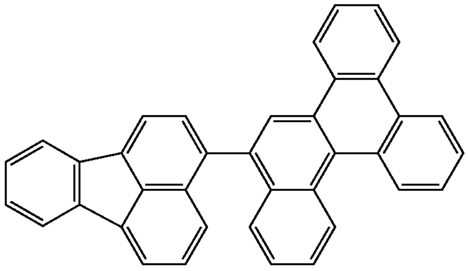
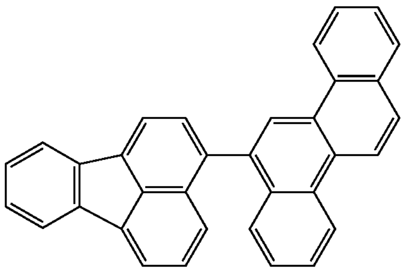
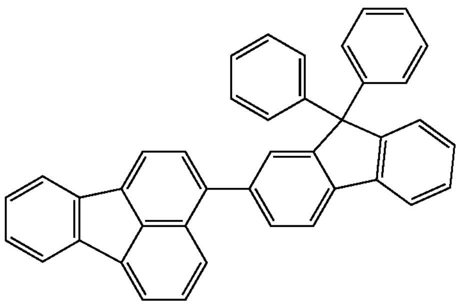

-continued
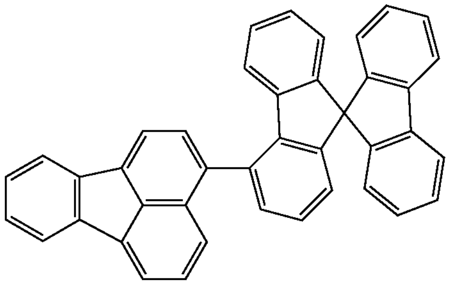
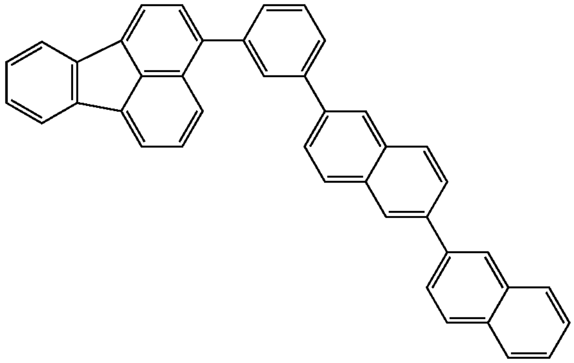
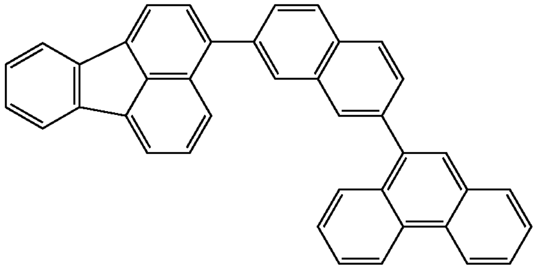
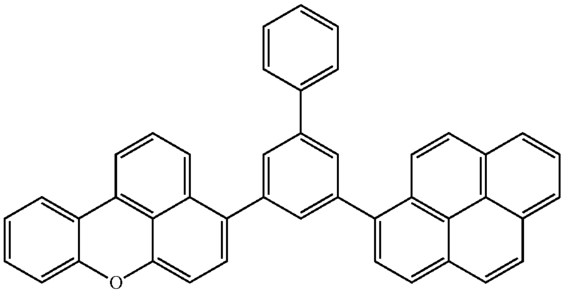
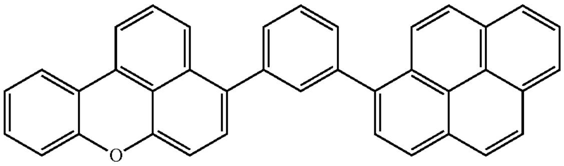
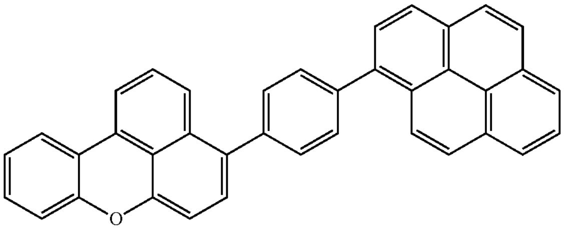
-continued
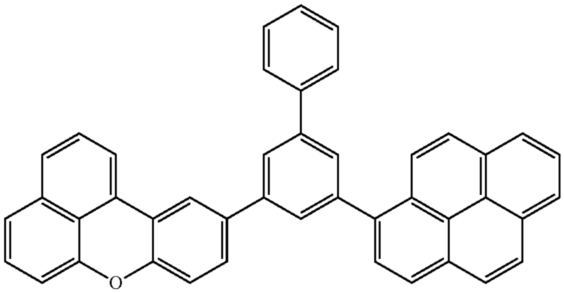
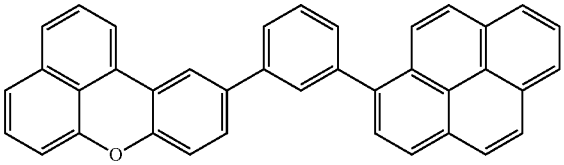
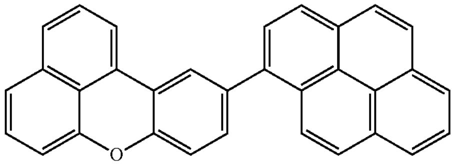
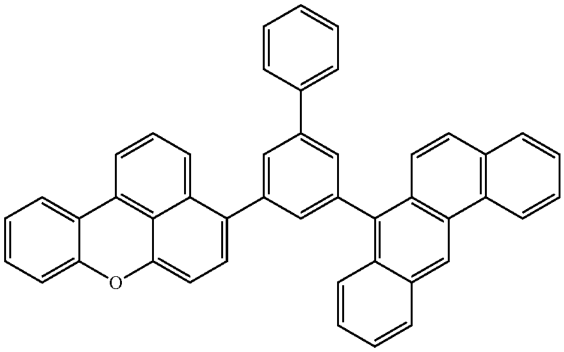
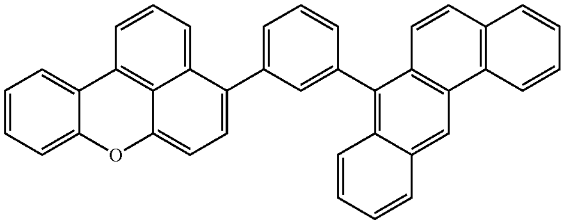
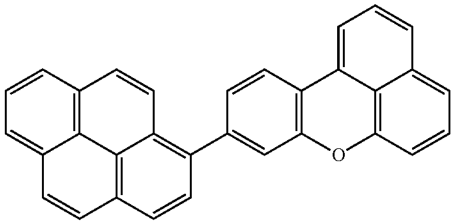
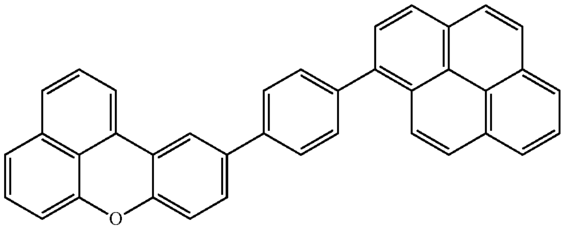

-continued

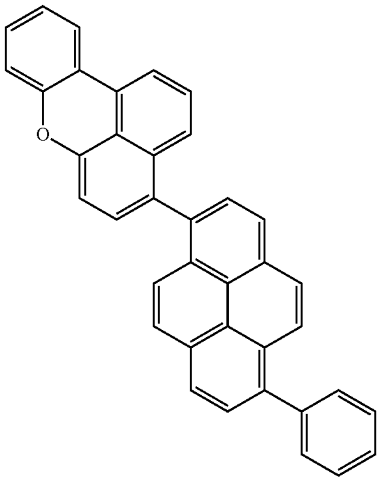

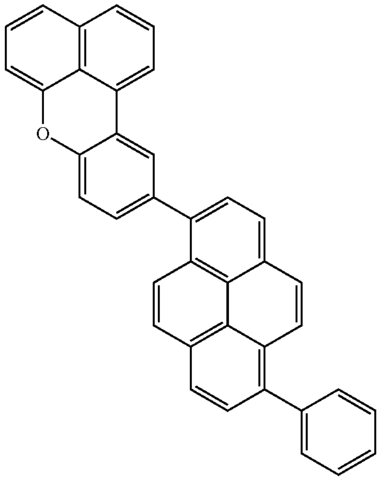

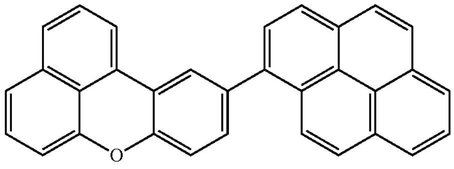

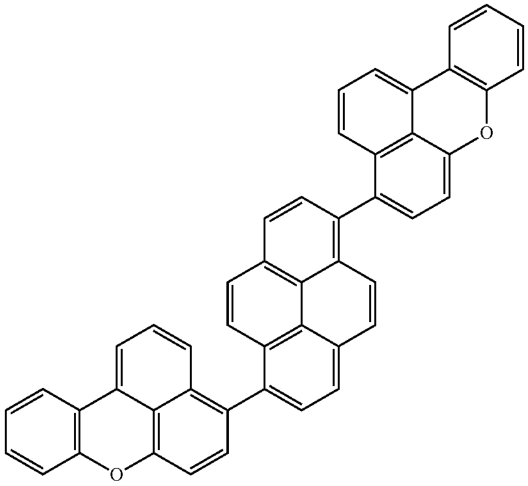

-continued

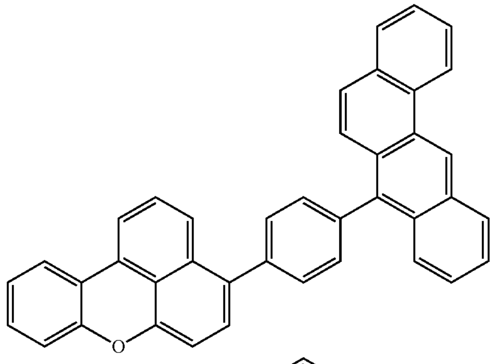

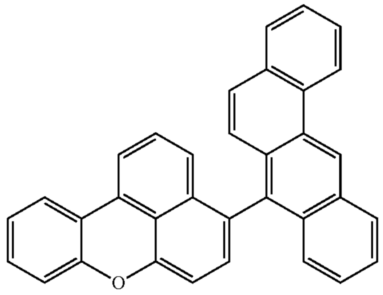

Second Compound

The second compound represented by the formula (2) in the exemplary embodiment will be described.

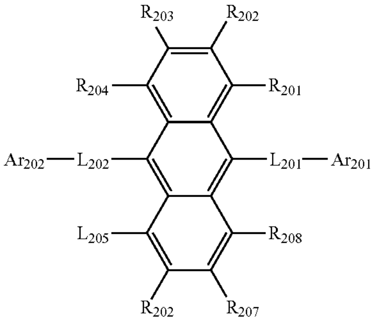

(2)

In the formula (2):

$R_{201}$ to 8208 are each independently a hydrogen atom, a substituted or unsubstituted alkyl group having 1 to 50 carbon atoms, a substituted or unsubstituted haloalkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a group represented by $—Si(R_{901})(R_{902})(R_{903})$, a group represented by $—O—(R_{904})$, a group represented by $—S—(R_{905})$, a group represented by $—N(R_{906})(R_{907})$, a substituted or unsubstituted aralkyl group having 7 to 50 carbon atoms, a group represented by $—C(=O)R_{801}$, a group represented by $—COOR_{802}$, a halogen atom, a cyano group, a nitro group, a substituted or unsubstituted aryl group having 6 to 50 ring carbon atoms, or a substituted or unsubstituted heterocyclic group having 5 to 50 ring atoms;

$L_{201}$ and $L_{202}$ are each independently a single bond, a substituted or unsubstituted arylene group having 6 to 50 ring carbon atoms, or a substituted or unsubstituted divalent heterocyclic group having 5 to 50 ring atoms; and $Ar_{201}$ and $Ar_{202}$ are each independently a substituted or unsubstituted aryl group having 6 to 50 ring carbon atoms, or a substituted or unsubstituted heterocyclic group having 5 to 50 ring atoms.

In the second compound according to the exemplary embodiment:

$R_{901}$, $R_{902}$, $R_{903}$, $R_{904}$, $R_{905}$, $R_{906}$, $R_{907}$, $R_{801}$, and $R_{802}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different;

when a plurality of $R_{904}$ are present, the plurality of $R_{904}$ are mutually the same or different;

when a plurality of $R_{905}$ are present, the plurality of $R_{905}$ are mutually the same or different;

when a plurality of $R_{906}$ are present, the plurality of $R_{906}$ are mutually the same or different;

when a plurality of $R_{907}$ are present, the plurality of $R_{907}$ are mutually the same or different;

when a plurality of $R_{801}$ are present, the plurality of $R_{801}$ are mutually the same or different; and when a plurality of $R_{802}$ are present, the plurality of $R_{802}$ are mutually the same or different.

In an exemplary embodiment, it is preferable that: $L_{201}$ and $L_{202}$ are each independently a single bond or a substituted or unsubstituted arylene group having 6 to 50 ring carbon atoms; and $Ar_{201}$ and $Ar_{202}$ are each independently a substituted or unsubstituted aryl group having 6 to 50 ring carbon atoms.

In an exemplary embodiment, $Ar_{201}$ and $Ar_{202}$ are preferably each independently a phenyl group, a naphthyl group, a phenanthryl group, a biphenyl group, a terphenyl group, a diphenylfluorenyl group, a dimethylfluorenyl group, a benzodiphenylfluorenyl group, a benzodimethylfluorenyl group, a dibenzofuranyl group, a dibenzothienyl group, a naphthobenzofuranyl group, or a naphthobenzothienyl group.

In an exemplary embodiment, it is preferable that: $L_{101}$ is a single bond or an unsubstituted arylene group having 6 to 22 ring carbon atoms; and $Ar_{101}$ is a substituted or unsubstituted aryl group having 6 to 22 ring carbon atoms.

In an exemplary embodiment, in the second compound represented by the formula (2), $R_{201}$ to $R_{208}$ are preferably each independently a hydrogen atom, a substituted or unsubstituted alkyl group having 1 to 50 carbon atoms, a substituted or unsubstituted cycloalkyl group having 3 to 50 ring carbon atoms, or a group represented by $—Si(R_{901})(R_{902})(R_{903})$.

In an exemplary embodiment, in the second compound represented by the formula (2), $R_{201}$ to $R_{208}$ each preferably are a hydrogen atom.

In an exemplary embodiment, the second compound is also preferably a compound represented by the formula (2) in which $L_{202}$ is a single bond and $Ar_{202}$ is an unsubstituted phenyl group.

In an exemplary embodiment, the second compound is also preferably a compound represented by the formula (2) in which $L_{202}$ is a single bond and $Ar_{202}$ is an unsubstituted 2-naphthyl group.

In an exemplary embodiment, the second compound is also preferably a compound represented by the formula (2) in which $L_{202}$ is a single bond and $Ar_{202}$ is an unsubstituted 1-naphthyl group.

In an exemplary embodiment, the second compound is also preferably a compound represented by the formula (2) in which $L_{202}$ is an unsubstituted p-phenylene group and $Ar_{202}$ is an unsubstituted phenyl group.

In an exemplary embodiment, the second compound is also preferably a compound represented by the formula (2) in which $L_{202}$ is an unsubstituted m-phenylene group and $Ar_{202}$ is an unsubstituted phenyl group.

In an exemplary embodiment, the second compound is also preferably a compound represented by the formula (2) in which $L_{202}$ is an unsubstituted o-phenylene group and $Ar_{202}$ is an unsubstituted phenyl group.

In an exemplary embodiment, the second compound is also preferably a compound represented by the formula (2) in which $L_{202}$ is an unsubstituted p-phenylene group and $Ar_{202}$ is an unsubstituted 1-naphthyl group.

In an exemplary embodiment, the second compound is also preferably a compound represented by the formula (2) in which $L_{202}$ is an unsubstituted p-phenylene group and $Ar_{202}$ is an unsubstituted 2-naphthyl group.

In an exemplary embodiment, the second compound is also preferably a compound represented by the formula (2) in which $L_{202}$ is an unsubstituted 1,4-naphthalene-diyl group and $Ar_{202}$ is an unsubstituted phenyl group.

In an exemplary embodiment, the second compound is also preferably a compound represented by the formula (2) in which $L_{202}$ is an unsubstituted m-phenylene group and $Ar_{202}$ is an unsubstituted 2-naphthyl group.

In an exemplary embodiment, the second compound is also preferably a compound represented by a formula (2X) below.

(2X)

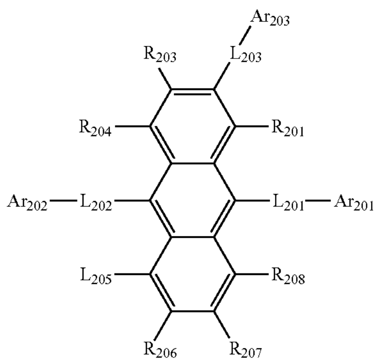

In the formula (2X):

$R_{201}$ and $R_{203}$ to $R_{208}$ each independently represent the same as $R_{201}$ and $R_{203}$ to $R_{208}$ in the formula (2);

$L_{201}$, $L_{202}$, $Ar_{201}$ and $Ar_{202}$ respectively represent the same as $L_{201}$, $L_{202}$, $Ar_{201}$ and $Ar_{202}$ in the formula (2);

$L_{203}$ represents the same as $L_{201}$ in the formula (2);

$L_{201}$, $L_{202}$ and $L_{203}$ are mutually the same or different;

$Ar_{203}$ represents the same as $Ar_{201}$ in the formula (2); and $Ar_{201}$, $Ar_{202}$ and $Ar_{203}$ are mutually the same or different.

In an exemplary embodiment, the second compound is also preferably a compound represented by the formula (2X) in which $L_{202}$ is a single bond and $Ar_{202}$ is an unsubstituted phenyl group.

In an exemplary embodiment, the second compound is also preferably a compound represented by the formula (2X) in which $L_{202}$ is a single bond and $Ar_{202}$ is an unsubstituted 2-naphthyl group.

In an exemplary embodiment, the second compound is also preferably a compound represented by the formula (2X) in which $L_{202}$ is a single bond and $Ar_{202}$ is an unsubstituted 1-naphthyl group.

In an exemplary embodiment, the second compound is also preferably a compound represented by the formula (2X) in which $L_{202}$ is an unsubstituted p-phenylene group and $Ar_{202}$ is an unsubstituted phenyl group.

In an exemplary embodiment, the second compound is also preferably a compound represented by the formula (2X) in which $L_{202}$ is an unsubstituted m-phenylene group and $Ar_{202}$ is an unsubstituted phenyl group.

In an exemplary embodiment, the second compound is also preferably a compound represented by the formula (2X) in which $L_{202}$ is an unsubstituted o-phenylene group and $Ar_{202}$ is an unsubstituted phenyl group.

In an exemplary embodiment, the second compound is also preferably a compound represented by the formula (2X) in which $L_{202}$ is an unsubstituted p-phenylene group and $Ar_{202}$ is an unsubstituted 1-naphthyl group.

In an exemplary embodiment, the second compound is also preferably a compound represented by the formula (2X) in which $L_{202}$ is an unsubstituted p-phenylene group and $Ar_{202}$ is an unsubstituted 2-naphthyl group.

In an exemplary embodiment, the second compound is also preferably a compound represented by the formula (2X) in which $L_{202}$ is an unsubstituted 1,4-naphthalene-diyl group and $Ar_{202}$ is an unsubstituted phenyl group.

In an exemplary embodiment, the second compound is also preferably a compound represented by the formula (2X) in which $L_{202}$ is an unsubstituted m-phenylene group and $Ar_{202}$ is an unsubstituted 2-naphthyl group.

In an exemplary embodiment, the second compound is also preferably a compound represented by the formula (2X) in which $L_{201}$ is a single bond and $Ar_{201}$ is an unsubstituted phenyl group.

In an exemplary embodiment, the second compound is also preferably a compound represented by the formula (2X) in which $L_{201}$ is a single bond and $Ar_{201}$ is an unsubstituted 2-naphthyl group.

In an exemplary embodiment, the second compound is also preferably a compound represented by the formula (2X) in which $L_{201}$ is a single bond and $Ar_{201}$ is an unsubstituted 1-naphthyl group.

In an exemplary embodiment, the second compound is also preferably a compound represented by the formula (2X) in which $L_{201}$ is an unsubstituted p-phenylene group and $Ar_{201}$ is an unsubstituted phenyl group.

In an exemplary embodiment, the second compound is also preferably a compound represented by the formula (2X) in which $L_{201}$ is an unsubstituted m-phenylene group and $Ar_{201}$ is an unsubstituted phenyl group.

In an exemplary embodiment, the second compound is also preferably a compound represented by the formula (2X) in which $L_{201}$ is an unsubstituted o-phenylene group and $Ar_{201}$ is an unsubstituted phenyl group.

In an exemplary embodiment, the second compound is also preferably a compound represented by the formula (2X) in which $L_{201}$ is an unsubstituted p-phenylene group and $Ar_{201}$ is an unsubstituted 1-naphthyl group.

In an exemplary embodiment, the second compound is also preferably a compound represented by the formula (2X) in which $L_{201}$ is an unsubstituted p-phenylene group and $Ar_{201}$ is an unsubstituted 2-naphthyl group.

In an exemplary embodiment, the second compound is also preferably a compound represented by the formula (2X) in which $L_{201}$ is an unsubstituted 1,4-naphthalene-diyl group and $Ar_{201}$ is an unsubstituted phenyl group.

In an exemplary embodiment, the second compound is also preferably a compound represented by the formula (2X) in which $L_{201}$ is an unsubstituted m-phenylene group and $Ar_{201}$ is an unsubstituted 2-naphthyl group.

In an exemplary embodiment, in the second compound represented by the formula (2), $R_{201}$ to $R_{208}$ not being the group represented by $-L_{203}-Ar_{203}$ are preferably each independently a hydrogen atom, a substituted or unsubstituted alkyl group having 1 to 50 carbon atoms, a substituted or unsubstituted cycloalkyl group having 3 to 50 ring carbon atoms, or a group represented by $—Si(R_{901})(R_{902})(R_{903})$.

In the second compound, all groups described as "substituted or unsubstituted" groups are preferably "unsubstituted" groups.

In an exemplary embodiment, the second emitting layer preferably contains the second compound represented by the formula (2) as the second host material. Accordingly, for instance, the second emitting layer contains the second compound represented by the formula (2) at 50 mass % or more with respect to the total mass of the second emitting layer.

In the organic EL device according to the exemplary embodiment, $R_{201}$ to $R_{208}$ that are substituents on an anthracene skeleton in the second compound represented by the formula (2) are preferably hydrogen atoms in terms of preventing inhibition of intermolecular interaction to inhibit a decrease in electron mobility. However, $R_{201}$ to $R_{208}$ may be a substituted or unsubstituted aryl group having 6 to 50 ring carbon atoms or a substituted or unsubstituted heterocyclic group having 5 to 50 ring atoms.

Assuming that $R_{201}$ to $R_{208}$ each are a bulky substituent such as an alkyl group and a cycloalkyl group, intermolecular interaction may be inhibited to decrease the electron mobility of the second compound relative to that of the first host material, so that the relationship of $\mu e(H2)>\mu e(H1)$ shown by the numerical formula (Numerical Formula 30) may not be satisfied. When the second compound is used in the second emitting layer, it can be expected that satisfying the relationship of $\mu e(H2)>\mu e(H1)$ inhibits a decrease in a recombination ability between holes and electrons in the first emitting layer and a decrease in luminous efficiency. It should be noted that as the substituent, namely, a haloalkyl group, alkenyl group, alkynyl group, group represented by $—Si(R_{901})(R_{902})(R_{903})$, group represented by $—O—(R_{904})$, group represented by $—S—(R_{905})$, group represented by $—N(R_{906})(R_{907})$, aralkyl group, group represented by $—C(=O)R_{801}$, group represented by $—COOR_{802}$, halogen atom, cyano group, and nitro group are likely to be bulky, and an alkyl group and cycloalkyl group are likely to bebulkier.

In the second compound represented by the formula (2), $R_{201}$ to $R_{208}$, which are the substituents on the anthracene skeleton, are each preferably not a bulky substituent and preferably not an alkyl group and cycloalkyl group. More preferably, $R_{201}$ to $R_{208}$ are not an alkyl group, cycloalkyl group, haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COOR$_{802}$, halogen atom, cyano group, and nitro group.

In the second compound, examples of a substituent for a "substituted or unsubstituted" group on $R_{201}$ to $R_{208}$ also preferably do not include the above-described substituent that is likely to be bulky, especially a substituted or unsubstituted alkyl group and a substituted or unsubstituted cycloalkyl group. Since the examples of the substituent for the "substituted or unsubstituted" group on $R_{201}$ to $R_{208}$ do not include a substituted or unsubstituted alkyl group and a substituted or unsubstituted cycloalkyl group, inhibition of intermolecular interaction to be caused by presence of a bulky substituent such as an alkyl group and a cycloalkyl group can be prevented, thereby preventing a decrease in the electron mobility. Moreover, when the second compound described above is used in the second emitting layer, a decrease in a recombination ability between holes and electrons in the first emitting layer and a decrease in the luminous efficiency can be inhibited.

It is more preferable that $R_{201}$ to $R_{208}$, which are the substituents on the anthracene skeleton, are not bulky substituents, and $R_{201}$ to $R_{208}$ as substituents are unsubstituted. Assuming that $R_{201}$ to $R_{208}$, which are the substituents on the anthracene skeleton, are not bulky substituents and substituents are bonded to $R_{201}$ to $R_{208}$ which are the not-bulky substituents, the substituents bonded to $R_{201}$ to $R_{208}$ are also preferably not the bulky substituents; the substituents bonded to $R_{201}$ to $R_{208}$ serving as substituents are preferably not an alkyl group and cycloalkyl group, more preferably not an alkyl group, cycloalkyl group, haloalkyl group, alkenyl group, alkynyl group, group represented by —Si($R_{901}$)($R_{902}$)($R_{903}$), group represented by —O—($R_{904}$), group represented by —S—($R_{905}$), group represented by —N($R_{906}$)($R_{907}$), aralkyl group, group represented by —C(═O)$R_{801}$, group represented by —COOR$_{802}$, halogen atom, cyano group, and nitro group.

Manufacturing Method of Second Compound

The second compound can be manufactured by a known method. The second compound can also be manufactured based on a known method through a known alternative reaction using a known material(s) tailored for the target compound.

Specific Examples of Second Compound

Specific examples of the second compound include the following compounds. It should however be noted that the invention is not limited by the specific examples of the second compound.

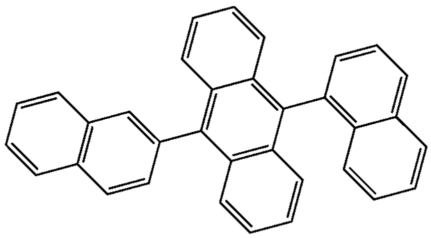

-continued

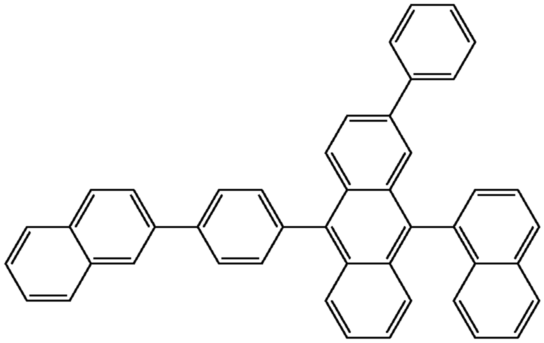

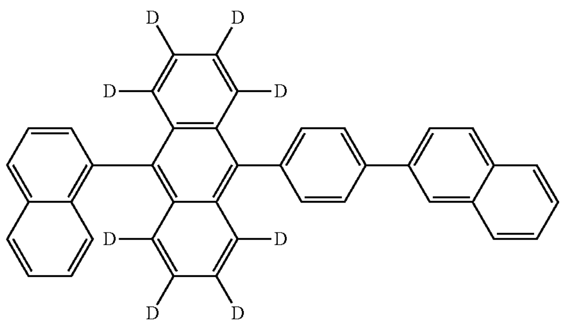

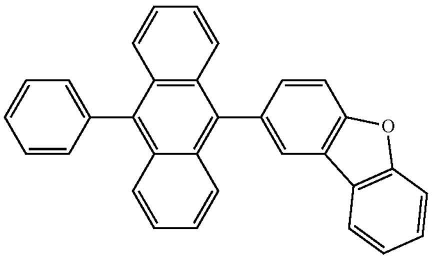

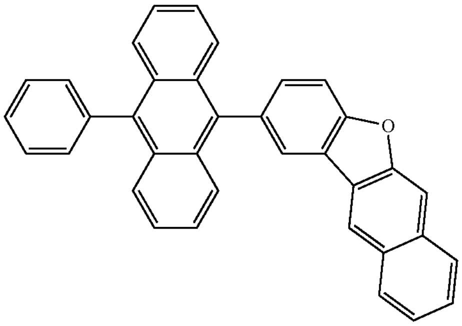

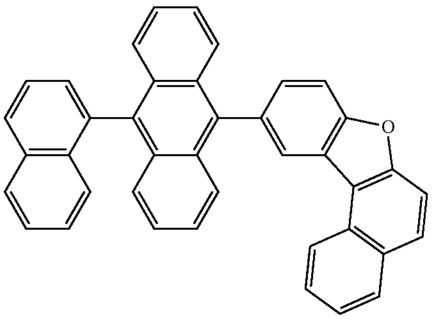

-continued

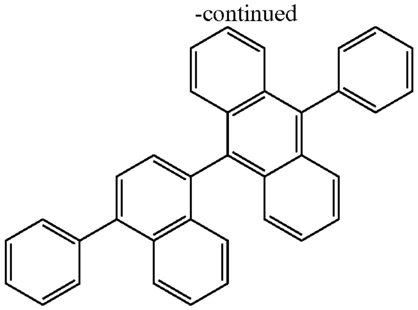

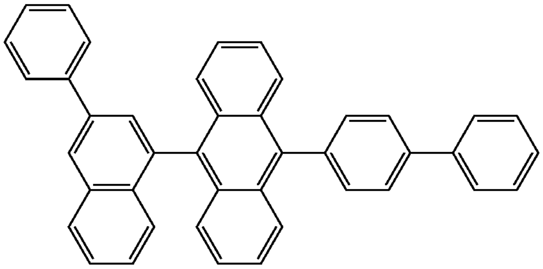

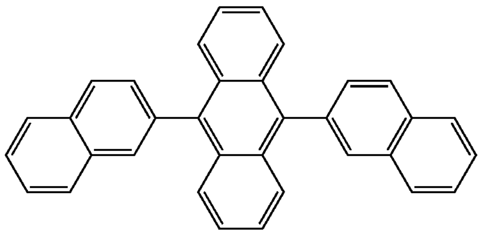

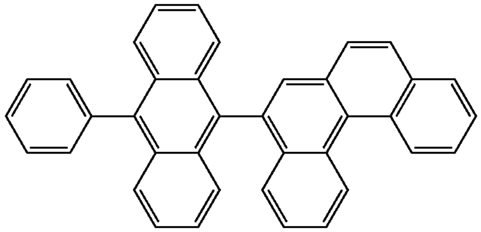

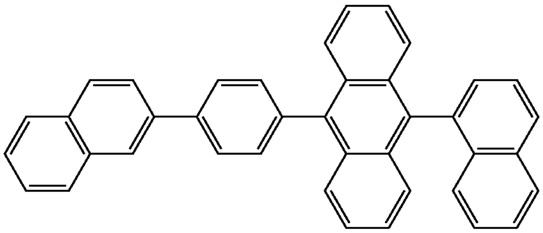

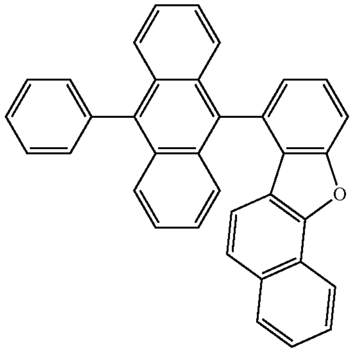

-continued

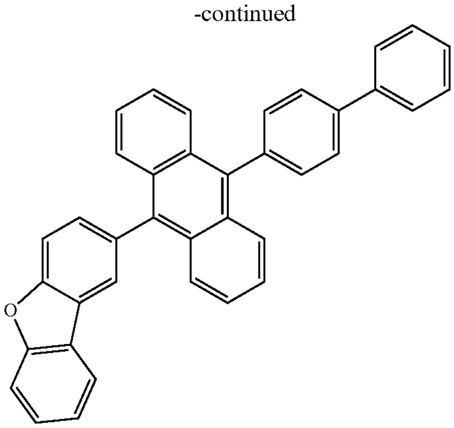

Additional Layers of Organic EL Device

The organic EL device according to the exemplary embodiment may include one or more organic layer(s) in addition to the first anode side organic layer, the second anode side organic layer and the emitting layer in the emitting region. Examples of the organic layer include at least one layer selected from the group consisting of an electron injecting layer, an electron transporting layer, a hole blocking layer and an electron blocking layer in addition to the third anode side organic layer and the fourth anode side organic layer described above.

In the organic EL device according to the exemplary embodiment, the organic layer may consist of the first anode side organic layer, the second anode side organic layer and the emitting layer in the emitting region. Alternatively, the organic layer may further include, for instance, at least one layer selected from the group consisting of the third anode side organic layer, the fourth anode side organic layer, the electron injecting layer, the electron transporting layer and the hole blocking layer.

FIG. 1 schematically shows an exemplary arrangement of the organic EL device of the exemplary embodiment.

An organic EL device 1D includes a substrate 2, an anode 3, a cathode 4, and an organic layer 14 provided between the anode 3 and the cathode 4. The organic layer 14 includes a first anode side organic layer 61, a second anode side organic layer 62, an emitting layer 50, an electron transporting layer 8, and an electron injecting layer 9, which are sequentially laminated on the anode 3.

FIG. 2 schematically shows another exemplary arrangement of the organic EL device according to the exemplary embodiment.

An organic EL device 1 includes the substrate 2, the anode 3, the cathode 4, and an organic layer 10 provided between the anode 3 and the cathode 4. The organic layer 10 includes the first anode side organic layer 61, the second anode side organic layer 62, a third anode side organic layer 63, the emitting layer 50, the electron transporting layer 8, and the electron injecting layer 9, which are sequentially laminated on the anode 3.

FIG. 3 schematically shows still another exemplary arrangement of the organic EL device according to the exemplary embodiment.

An organic EL device 1A includes the substrate 2, the anode 3, the cathode 4, and an organic layer 11 provided between the anode 3 and the cathode 4. The organic layer 11 includes the first anode side organic layer 61, the second anode side organic layer 62, the third anode side organic layer 63, a fourth anode side organic layer 64, the emitting layer 50, the electron transporting layer 8, and the electron injecting layer 9, which are sequentially laminated on the anode 3.

FIG. 4 schematically shows a further exemplary arrangement of the organic EL device according to the exemplary embodiment.

An organic EL device 1E includes the substrate 2, the anode 3, the cathode 4, and an organic layer 15 provided between the anode 3 and the cathode 4. The organic layer 15 includes the first anode side organic layer 61, the second anode side organic layer 62, a first emitting layer 51, a second emitting layer 52, the electron transporting layer 8, and the electron injecting layer 9, which are sequentially laminated from the anode 3.

FIG. 5 schematically shows a still further exemplary arrangement of the organic EL device according to the exemplary embodiment.

An organic EL device 1B includes the substrate 2, the anode 3, the cathode 4, and an organic layer 12 provided between the anode 3 and the cathode 4. The organic layer 12 includes the first anode side organic layer 61, the second anode side organic layer 62, the third anode side organic layer 63, the first emitting layer 51, the second emitting layer 52, the electron transporting layer 8, and the electron injecting layer 9, which are sequentially laminated on the anode 3.

FIG. 6 schematically shows a still further exemplary arrangement of the organic EL device according to the exemplary embodiment.

An organic EL device 1C includes the substrate 2, the anode 3, the cathode 4, and an organic layer 13 provided between the anode 3 and the cathode 4. The organic layer 13 includes the first anode side organic layer 61, the second anode side organic layer 62, the third anode side organic layer 63, a fourth anode side organic layer 64, the first emitting layer 51, the second emitting layer 52, the electron transporting layer 8, and the electron injecting layer 9, which are sequentially laminated on the anode 3.

In the organic EL device 1D of FIG. 1, the organic EL device 1 of FIG. 2 and the organic EL device 1A of FIG. 3, an emitting region 5 includes the emitting layer 50.

In the organic EL device 1E of FIG. 4, the organic EL device 1B of FIG. 5 and the organic EL device 1C of FIG. 6, an emitting region 5B includes the first emitting layer 51 and the second emitting layer 52.

In the organic EL device 1D of FIG. 1 and the organic EL device 1E of FIG. 4, the hole transporting zone includes the first anode side organic layer 61 and the second anode side organic layer 62.

In the organic EL device 1 of FIG. 2 and the organic EL device 1B of FIG. 5, the hole transporting zone includes the first anode side organic layer 61, the second anode side organic layer 62 and the third anode side organic layer 63.

In the organic EL device 1A of FIG. 3 and the organic EL device 1C of FIG. 6, the hole transporting zone includes the first anode side organic layer 61, the second anode side organic layer 62, the third anode side organic layer 63 and the fourth anode side organic layer 64.

The invention is not limited to the arrangements of the organic EL device shown in FIGS. 1 to 6. Examples of further arrangement of the organic EL device include an arrangement of the organic EL device in which the second emitting layer and the first emitting layer in the emitting region are laminated in this order from the anode.

Interposed Layer

The organic EL device according to the exemplary embodiment also may include an interposed layer as an organic layer disposed between the first emitting layer and the second emitting layer.

In the exemplary embodiment, in order to inhibit an overlap between a Singlet emitting region and a TTF emitting region, the interposed layer contains no emitting compound or may contain an emitting compound in an insubstantial amount provided that the overlap can be inhibited.

For instance, the interposed layer contains 0 mass % of an emitting compound. Alternatively, for instance, the interposed layer may contain an emitting compound provided that the emitting compound contained is a component accidentally mixed in a manufacturing process or a component contained as impurities in a material.

For instance, when the interposed layer consists of a material A, a material B, and a material C, content ratios of the materials A, B, and C in the interposed layer are each 10 mass % or more, and the total of the content ratios of the materials A, B, and C is 100 mass %.

In the following, the interposed layer is occasionally referred to as a "non-doped layer". A layer containing an emitting compound is occasionally referred to as a "doped layer".

It is considered that the Singlet emitting region and the TTF emitting region are typically likely to be separated from each other in laminated emitting layers, thus improving luminous efficiency.

In the organic EL device according to the exemplary embodiment, when the interposed layer (non-doped layer) is disposed between the first emitting layer and the second emitting layer in the emitting region, it is expected that a region where the Singlet emitting region and the TTF emitting region overlap with each other is reduced to inhibit a decrease in TTF efficiency caused by collision between triplet excitons and carriers. That is, it is considered that providing the interposed layer (non-doped layer) between the emitting layers contributes to the improvement in the efficiency of TTF emission.

The interposed layer is the non-doped layer.

The interposed layer contains no metal atom. The interposed layer thus contains no metal complex.

The interposed layer contains an interposed layer material. The interposed layer material is not an emitting compound.

The interposed layer material may be any material except for the emitting compound.

Examples of the interposed layer material include: 1) a heterocyclic compound such as an oxadiazole derivative, benzimidazole derivative, or phenanthroline derivative; 2) a fused aromatic compound such as a carbazole derivative, anthracene derivative, phenanthrene derivative, pyrene derivative or chrysene derivative; and 3) an aromatic amine compound such as a triarylamine derivative or a fused polycyclic aromatic amine derivative.

Although one or both of the first host material and the second host material may be used as the interposed layer material, the interposed layer material may be any material provided that the Singlet emitting region and the TTF emitting region are separated from each other and the Singlet emission and the TTF emission are not hindered.

In the organic EL device according to the exemplary embodiment, content ratios of all the materials forming the interposed layer in the interposed layer are each 10 mass % or more.

The interposed layer contains the interposed layer material as a material forming the interposed layer.

The interposed layer preferably contains the interposed layer material at 60 mass % or more, more preferably at 70 mass % or more, further preferably at 80 mass % or more, further more preferably at 90 mass % or more, still further more preferably at 95 mass % or more, with respect to the total mass of the interposed layer.

The interposed layer may contain a single type of the interposed layer material or may contain two or more types of the interposed layer material.

When the interposed layer contains two or more types of the interposed layer material, an upper limit of the total of the content ratios of the two or more types of the interposed layer material is 100 mass %.

It is not excluded that the interposed layer of the exemplary embodiment may further contain material(s) other than the interposed layer material.

The interposed layer may be provided in the form of a single layer or a laminate of two or more layers.

As long as the overlap between the Singlet emitting region and the TTF emitting region is inhibited, a film thickness of the interposed layer is not particularly limited but each layer in the interposed layer is preferably in a range from 3 nm to 15 nm, more preferably in a range from 5 nm to 10 nm.

The interposed layer having a film thickness of 3 nm or more easily separates the Singlet emitting region from the emitting region derived from TTF.

The interposed layer having a film thickness of 15 nm or less easily inhibits a phenomenon in which the host material of the interposed layer emits light.

It is preferable that: the interposed layer contains the interposed layer material as a material forming the interposed layer; and the triplet energy $T_1(H1)$ of the first host material, the triplet energy $T_1(H2)$ of the second host material, and a triplet energy $T_1(M_{mid})$ of at least one interposed layer material satisfy a relationship of a numerical formula (Numerical Formula 21) below.

$$T_1(H1) \geq T_1(M_{mid}) \geq T_1(H2) \quad \text{(Numerical Formula 21)}$$

When the interposed layer contains two or more interposed layer materials as materials forming the interposed layer, the triplet energy $T_1(H1)$ of the first host material, the triplet energy $T_1(H2)$ of the second host material, and a triplet energy $T_1(M_{EA})$ of each of the interposed layer materials more preferably satisfy a relationship of a numerical formula (Numerical Formula 21A) below.

$$T_1(H1) \geq T_1(M_{EA}) \geq (H2) \quad \text{(Numerical Formula 21A)}$$

The organic EL device according to the exemplary embodiment may further include a diffusion layer.

When the organic EL device according to the exemplary embodiment includes the diffusion layer, the diffusion layer is preferably disposed between the first emitting layer and the second emitting layer.

An arrangement of an organic EL device will be further described below. It should be noted that the reference numerals will be sometimes omitted below.

Substrate

The substrate is used as a support for the organic EL device. For instance, glass, quartz, plastics and the like are usable for the substrate. A flexible substrate is also usable. The flexible substrate is a bendable substrate, which is exemplified by a plastic substrate. Examples of the material for the plastic substrate include polycarbonate, polyarylate, polyethersulfone, polypropylene, polyester, polyvinyl fluoride, polyvinyl chloride, polyimide, and polyethylene naphthalate. Moreover, an inorganic vapor deposition film is also usable.

Anode

Metal, an alloy, an electrically conductive compound, a mixture thereof, or the like having a large work function (specifically, 4.0 eV or more) is preferably used as the anode formed on the substrate. Specific examples of the material include ITO (Indium Tin Oxide), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, the indium oxide-zinc oxide can be formed into a film by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the anode may be formed by a vacuum deposition method, a coating method, an inkjet method, a spin coating method or the like.

Among the organic layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

A material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the anode. It should be noted that the vacuum deposition method and the sputtering method are usable for forming the anode using the alkali metal, alkaline earth metal and the alloy thereof. Further, when a silver paste is used for the anode, the coating method and the inkjet method are usable.

Cathode

It is preferable to use metal, an alloy, an electroconductive compound, a mixture thereof, or the like having a small work function (specifically, 3.8 eV or less) for the cathode. Examples of the material for the cathode include elements belonging to Groups 1 and 2 in the periodic table of the elements, specifically, the alkali metal such as lithium (Li) and cesium (Cs), the alkaline earth metal such as magnesium (Mg), calcium (Ca) and strontium (Sr), alloys (e.g., MgAg and AlLi) including the alkali metal or the alkaline earth metal, the rare earth metal such as europium (Eu) and ytterbium (Yb), and alloys including the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide may be used for forming the cathode regardless of the work function. The conductive materials can be formed into a film using the sputtering method, inkjet method, spin coating method and the like.

Electron Transporting Layer

In an arrangement of the organic EL device according to the exemplary embodiment, an electron transporting layer is provided between an emitting region and a cathode.

The electron transporting layer is a layer containing a highly electron-transporting substance. For the electron transporting layer, 1) a metal complex such as an aluminum complex, beryllium complex, and zinc complex, 2) a heteroaromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: $Almq_3$), bis(10-hydroxybenzo[h]quinolinato)beryllium (abbreviation: $BeBq_2$), BAlq, Znq, ZnPBO and ZnBTZ is usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable. In the exemplary embodiment, a benzimidazole compound is preferably usable. The above-described substances mostly have an electron mobility of $10^{-6}$ $cm^2/Vs$ or more. It should be noted that any substance other than the above substance may be used for the electron transporting layer as long as the substance exhibits a higher electron transportability than the hole transportability. The electron transporting layer may be provided in the form of a single layer or a laminate of two or more layers of the above substance(s).

Further, a high polymer compound is usable for the electron transporting layer. For instance, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy) and the like are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride ($CaF_2$), and lithium oxide (LiOx). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected from the cathode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the heteroaromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

Tandem Organic Electroluminescence Device

The organic EL device according to the exemplary embodiment may be a so-called tandem organic EL device, in which a plurality of emitting regions are laminated via a charge generating layer (occasionally also referred to as an intermediate layer and the like). The tandem organic EL device is exemplified by an organic EL device below.

In an arrangement of the organic EL device according to the exemplary embodiment, the tandem organic EL device includes: a first emitting unit including the hole transporting zone as a first hole transporting zone and the emitting region as a first emitting region; a first charge generating layer provided between the first emitting unit and the cathode; and a second emitting unit provided between the first charge generating layer and the cathode and including a second hole transporting zone and a second emitting region, in which the first hole transporting zone, the first emitting region, the first charge generating layer, the second hole transporting zone and the second emitting region are disposed in this order from the anode.

In an arrangement of the organic EL device according to the exemplary embodiment, the tandem organic EL device further includes a third emitting unit; and a second charge generating layer, in which the third emitting unit is disposed between the second emitting unit and the cathode, and the second charge generating layer is disposed between the third emitting unit and the second emitting unit. In an arrangement of the organic EL device according to the exemplary embodiment, the third emitting unit includes a third emitting region and a third hole transporting zone.

In the tandem organic EL device according to the above arrangements, the second emitting region and the third emitting region each independently include at least one emitting layer. The emitting layers included in the second emitting region and the third emitting region may be each independently the same as or different from the emitting layer(s) included in the first emitting region.

In the tandem organic EL device according to the above arrangement, the second hole transporting zone and the third hole transporting zone each independently include at least one organic layer. The organic layers included in the second hole transporting zone and the third hole transporting zone may be each independently the same as or different from the organic layer(s) included in the first hole transporting zone.

In the tandem organic EL device according to the above arrangement, the first charge generating layer and the second charge generating layer each mean a layer in which holes and electrons are generated when a voltage is applied. For instance, when the first charge generating layer includes a plurality of layers, the first charge generating layer preferably includes an N layer disposed close to the anode and configured to inject electrons into the first emitting unit, and a P layer disposed close to the cathode and configured to inject holes into the second emitting unit. For instance, when the second charge generating layer includes a plurality of layers, the second charge generating layer preferably includes an N layer disposed close to the anode and configured to inject electrons into the second emitting unit, and a P layer disposed close to the cathode and configured to inject holes into the third emitting unit. Examples of a material usable for the first charge generating layer and the second charge generating layer include a known material(s) usable for the charge generating layer in the tandem organic EL device.

In an arrangement of the organic EL device according to the exemplary embodiment, the tandem organic EL device is usable for a light-emitting device.

Layer Formation Method(s)

A method for forming each layer of the organic EL device in the exemplary embodiment is subject to no limitation except for the above particular description. However, known methods of dry film-forming such as vacuum deposition, sputtering, plasma or ion plating and wet film-forming such as spin coating, dipping, flow coating or ink-jet are applicable.

Film Thickness

A film thickness of each of the organic layers of the organic EL device in the exemplary embodiment is not limited unless otherwise specified in the above. In general, the thickness preferably ranges from several nanometers to 1 μm because excessively small film thickness is likely to cause defects (e.g. pin holes) and excessively large thickness leads to the necessity of applying high voltage and consequent reduction in efficiency.

Emission Wavelength of Organic EL Device

The organic electroluminescence device according to the exemplary embodiment preferably emits light having a maximum peak wavelength of 500 nm or less when being driven.

The organic electroluminescence device according to the exemplary embodiment more preferably emits light having a maximum peak wavelength in a range from 430 nm to 480 nm when being driven.

The maximum peak wavelength of the light emitted from the organic EL device when being driven is measured as follows. Voltage is applied on the organic EL devices such that a current density becomes 10 mA/cm$^2$, where spectral radiance spectrum is measured by a spectroradiometer CS-2000 (manufactured by Konica Minolta, Inc.). In the obtained spectral radiance spectrum, the peak wavelength of the emission spectrum at which the luminous intensity is at the maximum is measured, and defined as a maximum peak wavelength (unit: nm).

Triplet Energy $T_1$

A method of measuring triplet energy $T_1$ is exemplified by a method below.

A measurement target compound is dissolved in EPA (diethylether:isopentane:ethanol=5:5:2 in volume ratio) so as to fall within a range from $10^{-5}$ mol/L to $10^{-4}$ mol/L to prepare a solution, and this solution is put in a quartz cell to provide a measurement sample. A phosphorescence spectrum (ordinate axis: phosphorescent luminous intensity, abscissa axis: wavelength) of the measurement sample is measured at a low temperature (77K). A tangent is drawn to the rise of the phosphorescence spectrum close to the short-wavelength region. An energy amount is calculated by a conversion equation (F1) below on a basis of a wavelength value $\lambda_{edge}$ [nm] at an intersection of the tangent and the abscissa axis. The calculated energy amount is defined as triplet energy $T_1$.

$$T_1\ [\text{eV}]=1239.85/\lambda_{edge} \qquad \text{Conversion Equation (F1):}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 (manufactured by Hitachi High-Technologies Corporation) is usable. Any device for phosphorescence measurement is usable. A combination of a cooling unit, a low temperature container, an excitation light source and a light-receiving unit may be used for phosphorescence measurement.

Singlet Energy $S_1$

A method of measuring a singlet energy $S_1$ with use of a solution (occasionally referred to as a solution method) is exemplified by a method below.

A toluene solution of a measurement target compound at a concentration ranging from $10^{-5}$ mol/L to $10^{-4}$ mol/L is prepared and put in a quartz cell. An absorption spectrum (ordinate axis: absorption intensity, abscissa axis: wavelength) of the thus-obtained sample is measured at a normal temperature (300K). A tangent is drawn to the fall of the absorption spectrum on the long-wavelength side, and a wavelength value fledge (nm) at an intersection of the tangent and the abscissa axis is assigned to a conversion equation (F2) below to calculate singlet energy.

$$S_1\ [\text{eV}]=1239.85/\lambda_{edge} \qquad \text{Conversion Equation (F2):}$$

Any device for measuring absorption spectrum is usable. For instance, a spectrophotometer (U3310 manufactured by Hitachi, Ltd.) is usable.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

Method of Measuring Electron Mobility

The electron mobility can be measured according to an impedance measurement using a mobility evaluation device manufactured by the following steps. The mobility evaluation device is, for instance, manufactured by the following steps.

A compound Target, which is to be measured for an electron mobility, is vapor-deposited on a glass substrate having an aluminum electrode (anode) so as to cover the aluminum electrode, thereby forming a measurement target layer. A compound ET-A below is vapor-deposited on this measurement target layer to form an electron transporting layer. LiF is vapor-deposited on this formed electron transporting layer to form an electron injecting layer. Metal aluminum (Al) is vapor-deposited on this formed electron injecting layer to form a metal cathode.

An arrangement of the mobility evaluation device above is roughly shown as follows.

Glass/Al(50)/Target(200)/ET-A(10)/LiF(1)/Al(50)

Numerals in parentheses represent a film thickness (nm).

ET-A

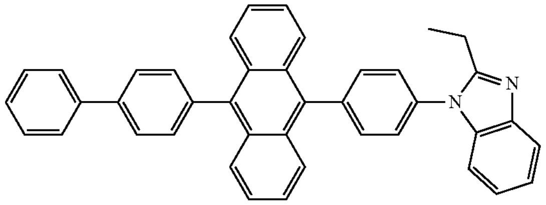

The mobility evaluation device for an electron mobility is set in an impedance measurement device to perform an impedance measurement. In the impedance measurement, a measurement frequency is swept from 1 Hz to 1 MHz. At this time, an alternating current amplitude of 0.1 V and a direct current voltage V are applied to the device. A modulus M is calculated from a measured impedance Z using a relationship of a calculation formula (C1) below.

$$M=j\omega Z \qquad \text{Calculation formula (C1):}$$

In the calculation formula (C1), j is an imaginary unit whose square is −1 and ω is an angular frequency [rad/s].

In a bode plot in which an imaginary part of the modulus M is represented by an ordinate axis and the frequency [Hz] is represented by an abscissa axis, an electrical time constant τ of the mobility evaluation device is obtained from a frequency fmax showing a peak using a calculation formula (C2) below.

$$\tau=1/(2\pi f\max) \qquad \text{Calculation formula (C2):}$$

π in the calculation formula (C2) is a symbol representing a circumference ratio.

An electron mobility μe is calculated from a relationship of a calculation formula (C3-1) below using τ.

$$\mu e=d^2/(V\tau) \qquad \text{Calculation formula (C3-1):}$$

d in the calculation formula (C3-1) is a total film thickness of organic thin film(s) forming the device. In a case of the arrangement of the mobility evaluation device for an electron mobility, d=210 [nm] is satisfied.

Method of Measuring Hole Mobility

The hole mobility can be measured according to an impedance measurement using a mobility evaluation device manufactured by the following steps. The mobility evaluation device is, for instance, manufactured by the following steps.

A compound HA-2 below is vapor-deposited on a glass substrate having an ITO transparent electrode (anode) so as to cover the transparent electrode, thereby forming a hole injecting layer. A compound HT-A below is vapor-deposited on this formed hole injecting layer to form a hole transporting layer. Subsequently, a compound Target, which is to be measured for a hole mobility, is vapor-deposited to form a measurement target layer. Metal aluminum (Al) is vapor-deposited on this measurement target layer to form a metal cathode.

An arrangement of the mobility evaluation device above is roughly shown as follows.

ITO(130)/HA-2(5)/HT-A(10)/Target(200)/Al(80)

Numerals in parentheses represent a film thickness (nm).

HA-2

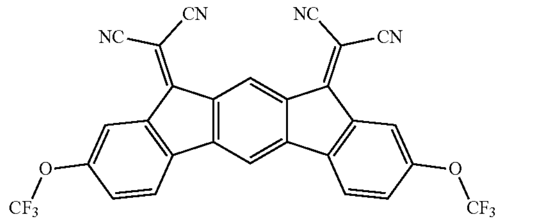

HT-A

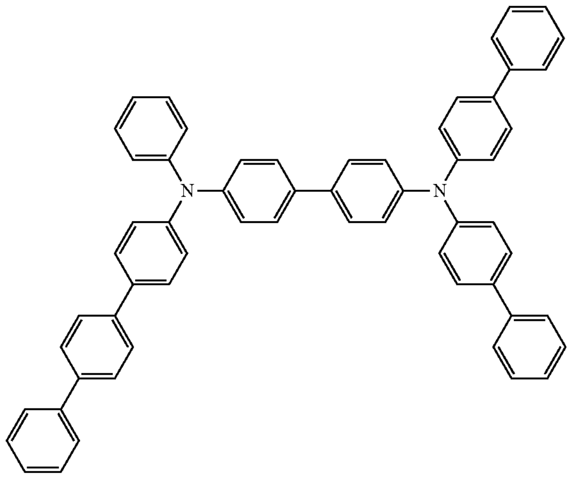

The mobility evaluation device for a hole mobility is set in an impedance measurement device to perform an impedance measurement. In the impedance measurement, a measurement frequency is swept from 1 Hz to 1 MHz. At this time, an alternating current amplitude of 0.1 V and a direct current voltage V are applied to the device. A modulus M is calculated from a measured impedance Z using the relationship of the calculation formula (C1).

In a bode plot in which an imaginary part of the modulus M is represented by an ordinate axis and the frequency [Hz] is represented by an abscissa axis, an electrical time constant τ of the mobility evaluation device is obtained from a frequency fmax showing a peak using the calculation formula (C2).

A hole mobility μh is calculated from a relationship of a calculation formula (C3-2) below using T obtained from the calculation formula (C2).

$$\mu h = d^2/(V\tau) \quad \text{Calculation formula (C3-2):}$$

d in the calculation formula (C3-2) is a total film thickness of organic thin film(s) forming the device. In a case of the arrangement of the mobility evaluation device for a hole mobility, d=215 [nm] is satisfied.

The electron mobility and the hole mobility herein are each a value obtained in a case where a square root of an electric field intensity meets $E^{1/2}=500$ [$V^{1/2}/cm^{1/2}$]. The square root of an electric field intensity, $E^{112}$, can be calculated from a relationship of a calculation formula (C4) below.

$$E^{1/2}=V^{1/2}/d^{1/2} \quad \text{Calculation formula (C4):}$$

For the impedance measurement, a 1260 type by Solartron Analytical is used as the impedance measurement device, and for a higher accuracy, a 1296 type dielectric constant measurement interface by Solartron Analytical can be used together therewith.

Second Exemplary Embodiment

An organic electroluminescence display device (hereinafter also referred to as an organic EL display device) according to a second exemplary embodiment will be described below. In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable, unless otherwise specified.

Organic Electroluminescence Display Device

An organic electroluminescence display device according to the second exemplary embodiment includes: an anode and a cathode provided to face each other; a blue-emitting organic EL device as a blue pixel; a green-emitting organic EL device as a green pixel; and a red-emitting organic EL device as a red pixel, in which the blue pixel includes the organic electroluminescence device according to the first exemplary embodiment as the blue-emitting organic EL device, the green-emitting organic EL device includes a green emitting region provided between the anode and the cathode, and the red-emitting organic EL device includes a red emitting region provided between the anode and the cathode.

In the organic electroluminescence display device according to the second exemplary embodiment, in a case where the first anode side organic layer, the second anode side organic layer and the third anode side organic layer are provided for the blue-emitting organic EL device, the first anode side organic layer, the second anode side organic layer and the third anode side organic layer are provided in a shared manner across the blue-emitting organic EL device, the green-emitting organic EL device and the red-emitting organic EL device between the anode and the emitting region of the blue-emitting organic EL device, the green emitting region and the red emitting region.

In the organic electroluminescence display device according to the second exemplary embodiment, in a case where the third anode side organic layer is not provided and the first anode side organic layer and the second anode side organic layer are provided for the blue-emitting organic EL device, the first anode side organic layer and the second anode side organic layer are provided in a shared manner across the blue-emitting organic EL device, the green-emitting organic EL device and the red-emitting organic EL device between the anode and the emitting region of the blue-emitting organic EL device, the green emitting region and the red emitting region.

In the organic EL display device according to the second exemplary embodiment, various arrangements are included as examples of the arrangement of the blue-emitting organic EL device included in the blue pixel. In the organic EL display device herein, the emitting region of the blue-emitting organic EL device included in the blue pixel is occasionally referred to as a blue emitting region.

The elements that may be included in the blue-emitting organic EL device of the organic EL display device according to each of the arrangements of the second exemplary embodiment are the same as the elements that may be included in the organic EL device described in the first exemplary embodiment.

Since the blue pixel of the organic EL display device according to the second exemplary embodiment includes, as the blue-emitting organic EL device, the organic EL device according to any of the arrangements of the first exemplary embodiment, the luminous efficiency of the blue-emitting organic EL device as the blue pixel is improved. The performance of the organic EL display device is thus improved.

Further, the blue-emitting organic EL device as the blue pixel has improved luminous efficiency by providing the first emitting layer and the second emitting layer that satisfy the relationship of the numerical formula (Numerical Formula 1) in the emitting region of the blue-emitting organic EL device similarly to the first exemplary embodiment, as compared with a case where the emitting region includes a single emitting layer.

The blue-emitting organic EL device as the blue pixel has a longer lifetime by providing the fourth anode side organic layer between the emitting region of the blue-emitting organic EL device and the third anode side organic layer similarly to the first exemplary embodiment.

Herein, a layer provided in a shared manner across a plurality of devices is occasionally referred to as a common layer. Herein, a layer not provided in a shared manner across a plurality of devices is occasionally referred to as a non-common layer.

Herein, a zone provided in a shared manner across a plurality of devices is occasionally referred to as a common zone. The hole transporting zone, which is provided in a shared manner across the blue-emitting organic EL device, the green-emitting organic EL device, and the red-emitting organic EL device between the anode and the blue emitting region of the blue-emitting organic EL device, the green emitting layer of the green-emitting organic EL device, and the red emitting layer of the red-emitting organic EL device, is a common zone.

Herein, "blue", "green", or "red" used for each element, such as "pixel", "emitting layer", "organic layer", or "material", is used to distinguish one from another. Although "blue", "green", or "red" may represent a color of light emitted from "pixel", "emitting layer", "organic layer", or "material", "blue", "green", or "red" does not mean the color of appearance of each element.

Referring to FIG. 7, explanation is made about an exemplary arrangement of the organic EL display device according to the second exemplary embodiment.

FIG. 7 shows an organic EL display device 100A according to an exemplary embodiment.

The organic EL display device 100A includes electrodes and organic layers supported by a substrate 2A.

The organic EL display device 100A includes an anode 3 and a cathode 4 provided to face each other.

The organic EL display device 100A includes a blue-emitting organic EL device 10B as a blue pixel, a green-emitting organic EL device 10G as a green pixel, and a red-emitting organic EL device 10R as a red pixel.

It should be noted that FIG. 7 schematically shows the organic EL display device 100A, and thus does not limit a size of the organic EL display device 100A, a thickness of each layer, or the like. For instance, FIG. 7 shows that a green emitting layer 53 and a red emitting layer 54 have the same thickness, but does not necessarily mean that these layers in an actual organic EL display device have the same thickness. The same applies to organic EL display devices shown in FIGS. 8 to 10.

In the organic EL display device 100A, a hole transporting zone is provided as a common zone between the anode 3 and the respective emitting regions of the blue-emitting organic EL device 10B, the green-emitting organic EL device 10G, and the red-emitting organic EL device 10R.

In the hole transporting zone of the organic EL display device 100A, a first anode side organic layer 61A, a second anode side organic layer 62A, and a third anode side organic layer 63A are laminated in this order from the anode 3. In the organic EL display device 100A, the hole transporting zone is provided in a shared manner across the blue-emitting organic EL device 10B, the green-emitting organic EL device 10G, and the red-emitting organic EL device 10R.

In the organic EL display device 100A, the electron transporting layer 8 and the electron injecting layer 9 as common layers are laminated in this order between the cathode and the respective emitting regions of the organic EL devices 10G, 10G, 10R.

The emitting region of the blue-emitting organic EL device 10B of the organic EL display device 100A is the same as the emitting region 5 according to the first exemplary embodiment. The blue emitting region 5 includes a blue emitting layer 50B. The blue emitting layer 50B corresponds to the emitting layer 50 according to the first exemplary embodiment.

The green emitting region of the green-emitting organic EL device 10G of the organic EL display device 100A includes the green emitting layer 53. In the green-emitting organic EL device 10G, a green organic layer 531 is provided as a non-common layer between the green emitting layer 53 and the third anode side organic layer 63A.

The red emitting region of the red-emitting organic EL device 10R of the organic EL display device 100A includes the red emitting layer 54. In the red-emitting organic EL device 10R, a red organic layer 541 is provided as a non-common layer between the red emitting layer 54 and the third anode side organic layer 63A.

The anode 3 of the organic EL display device 100A is defined by respective anodes of the blue-emitting organic EL device 10B, the green-emitting organic EL device 10G and the red-emitting organic EL device 10R. The anode 3 is independently provided for each of the blue-emitting organic EL device 10B, the green-emitting organic EL device 10G, and the red-emitting organic EL device 10R. Thus, the blue-emitting organic EL device 10B, the green-emitting organic EL device 10G, and the red-emitting organic EL device 10R can be individually driven in the organic EL display device 100A. The respective anodes of the organic EL devices 10B, 10G, 10R are insulated from each other by an insulation material (not shown) or the like. The cathode 4 of the organic EL display device 100A is defined by respective cathodes of the blue-emitting organic EL device 10B, the green-emitting organic EL device 10G and the red-emitting organic EL device 10R. The cathode 4 is provided to be shared by the blue-emitting organic EL device 10B, the green-emitting organic EL device 10G, and the red-emitting organic EL device 10R.

In an exemplary embodiment, the blue-emitting organic EL device 10B, the green-emitting organic EL device 10G, and the red-emitting organic EL device 10R as pixels are arranged in parallel with each other on the substrate 2A.

FIG. 8 schematically shows another exemplary arrangement of the organic EL display device according to the second exemplary embodiment.

An organic EL display device 100B shown in FIG. 8 is configured the same as the organic EL display device 100A shown in FIG. 7 except for a blue-emitting organic EL device 11B as a blue pixel. Thus, only differences from the organic EL display device 100A are described below.

The blue-emitting organic EL device 11B includes a fourth anode side organic layer 64A as a non-common layer between the blue emitting layer 50B and the third anode side organic layer 63A. In FIG. 8, the fourth anode side organic layer 64A is in direct contact with the blue emitting layer 50B and the third anode side organic layer 63A. The fourth anode side organic layer 64A is preferably an electron blocking layer.

FIG. 9 schematically shows still another exemplary arrangement of the organic EL display device according to the second exemplary embodiment.

An organic EL display device 100C shown in FIG. 9 is configured the same as the organic EL display device 100A shown in FIG. 7 except for a blue-emitting organic EL device 12B as a blue pixel. Thus, only differences from the organic EL display device 100A are described below.

A blue emitting region 5B of the blue-emitting organic EL device 12B is the same as the emitting region 5B of the first exemplary embodiment. The blue emitting region 5B includes the first emitting layer 51 and the second emitting layer 52, which are laminated in this order.

FIG. 10 schematically shows a further exemplary arrangement of the organic EL display device according to the second exemplary embodiment.

An organic EL display device 100D shown in FIG. 10 is configured the same as the organic EL display device 100A shown in FIG. 7 except for a blue-emitting organic EL device 13B as a blue pixel. Thus, only differences from the organic EL display device 100A are described below.

The blue-emitting organic EL device 13B includes the fourth anode side organic layer 64A as a non-common layer between the first emitting layer 51 of the blue emitting region 5B and the third anode side organic layer 63A. In FIG. 10, the fourth anode side organic layer 64A is in direct contact with the first emitting layer 51 and the third anode side organic layer 63A. The fourth anode side organic layer 64A is preferably an electron blocking layer.

The invention is not limited to the arrangements of the organic EL display device shown in FIGS. 7 to 10.

For instance, in an arrangement of the organic EL display device according to the second exemplary embodiment, the green organic layer 531 is not provided between the green emitting layer 53 and the third anode side organic layer 63A, and the green emitting layer 53 is in direct contact with the third anode side organic layer 63A.

For instance, in an arrangement of the organic EL display device according to the second exemplary embodiment, the red organic layer 541 is not provided between the red emitting layer 54 and the third anode side organic layer 63A, and the red emitting layer 54 is in direct contact with the third anode side organic layer 63A.

For instance, in an arrangement of the organic EL display device according to the second exemplary embodiment, a hole transporting zone in which the first anode side organic layer 61A and the second anode side organic layer 62A are laminated in this order may be provided in place of the hole transporting zone of the organic EL display device 100A. In this arrangement, the third anode side organic layer 63A is not provided and thus the blue emitting layer 50B, the green organic layer 531 and the red organic layer 541 are provided on the second anode side organic layer 62A.

For instance, in an arrangement of the organic EL display device according to the second exemplary embodiment, the hole transporting zone in which the first anode side organic layer 61A and the second anode side organic layer 62A are laminated in this order may be provided in place of the hole transporting zone of the organic EL display device 100C. In this arrangement, the third anode side organic layer 63A is not provided and thus the first emitting layer 51, the green organic layer 531 and the red organic layer 541 are provided on the second anode side organic layer 62A.

For instance, in an arrangement of the organic EL display device according to the second exemplary embodiment, the blue-emitting organic EL device, the green-emitting organic EL device, and the red-emitting organic EL device may each independently further include a layer(s) different from the layers shown in FIGS. 7 to 10. For instance, a hole blocking layer may be provided as a common layer between the emitting regions and the electron transporting layer.

For instance, in an arrangement of the organic EL display device according to the second exemplary embodiment, the blue-emitting organic EL device, the green-emitting organic EL device, and the red-emitting organic EL device may be each independently a device that fluoresces or a device that phosphoresces. The blue-emitting organic EL device is preferably a device that fluoresces.

In an arrangement of the organic EL display device according to the second exemplary embodiment, the first anode side organic layer as a common layer contains the first organic material and the second organic material (the first hole transporting zone material) of the first exemplary embodiment.

In an arrangement of the organic EL display device according to the second exemplary embodiment, the second anode side organic layer as a common layer contains the second hole transporting zone material of the first exemplary embodiment.

In an arrangement of the organic EL display device according to the second exemplary embodiment, the third anode side organic layer as a common layer contains the third hole transporting zone material of the first exemplary embodiment.

In an arrangement of the organic EL display device according to the second exemplary embodiment, the fourth anode side organic layer as a non-common layer contains the fourth hole transporting zone material of the first exemplary embodiment.

In an arrangement of the organic EL display device according to the exemplary embodiment, the green emitting layer contains a host material. For instance, the green emitting layer contains the host material at 50 mass % or more with respect to a total mass of the green emitting layer.

In an arrangement of the organic EL display device according to the second exemplary embodiment, the green emitting layer of the green-emitting organic EL device contains a green emitting compound that emits light having a maximum peak wavelength in a range from 500 nm to 550 nm. For instance, the green emitting compound is a fluorescent compound that exhibits fluorescence having a maximum peak wavelength in a range from 500 nm to 550 nm. For instance, the green emitting compound is a phosphorescent compound that exhibits phosphorescence having a maximum peak wavelength in a range from 500 nm to 550 nm. Herein, the green light emission refers to a light emission in which a maximum peak wavelength of emission spectrum is in a range from 500 nm to 550 nm.

The fluorescent compound is a compound capable of emitting light from a singlet state. The phosphorescent compound is a compound capable of emitting light from a triplet state.

Examples of a green fluorescent compound usable for the green emitting layer include an aromatic amine derivative. Examples of a green phosphorescent compound usable for the green emitting layer include an iridium complex.

Maximum Phosphorescence Peak Wavelength (PH-peak)

A maximum peak wavelength (maximum phosphorescence peak wavelength) of a phosphorescent compound can be measured by the following method. A measurement target compound is dissolved in EPA (diethylether:isopentane:ethanol=5:5:2 in volume ratio) so as to fall within a range from $10^{-5}$ mol/L to $10^{4}$ mol/L, and the obtained EPA solution is put in a quartz cell to provide a measurement sample. A phosphorescence spectrum (ordinate axis: phosphorescent luminous intensity, abscissa axis: wavelength) of the measurement sample is measured at a low temperature (77K). The local maximum value closest to the short-wavelength region among the local maximum values of the phosphorescence spectrum is defined as the maximum phosphorescence peak wavelength. A spectrophotofluorometer F-7000 manufactured by Hitachi High-Tech Science Corporation can be used to measure phosphorescence. Any device for phosphorescence measurement is usable. A combination of a cooling unit, a low temperature container, an excitation light source and a light-receiving unit may be used for phosphorescence measurement. Herein, the maximum peak wavelength of phosphorescence is occasionally referred to as the maximum phosphorescence peak wavelength (PH-peak).

In an arrangement of the organic EL display device according to the second exemplary embodiment, the green-emitting organic EL device includes the green organic layer between the green emitting layer and the third anode side organic layer. The green organic layer may be in direct contact with the hole transporting zone. The green organic layer may be in direct contact with the green emitting layer. An emission position in the green-emitting organic EL device is easily adjustable by providing the green organic layer in the green-emitting organic EL device.

The green organic layer contains a green organic material. The hole transporting zone material according to the first exemplary embodiment is usable as the green organic material. Although the green organic material and the hole transporting zone material contained in the hole transporting zone may be the same compound or different compounds, the green organic material is preferably different from the hole transporting zone material. A hole mobility of the green organic material is preferably larger than a hole mobility of the hole transporting zone material contained in the hole transporting zone. The green organic material is a compound different from the host material and the green emitting compound contained in the green emitting layer.

In an arrangement of the organic EL display device according to the second exemplary embodiment, the red emitting layer contains a host material. For instance, the red emitting layer contains the host material at 50 mass % or more with respect to a total mass of the red emitting layer.

In an arrangement of the organic EL display device according to the second exemplary embodiment, the red emitting layer of the red-emitting organic EL device contains a red emitting compound that emits light having a maximum peak wavelength in a range from 600 nm to 640 nm. For instance, the red emitting compound is a fluorescent compound that exhibits fluorescence having a maximum peak wavelength in a range from 600 nm to 640 nm. For instance, the red emitting compound is a phosphorescent compound that exhibits phosphorescence having a maximum peak wavelength in a range from 600 nm to 640 nm. Herein, the red light emission refers to a light emission in which a maximum peak wavelength of emission spectrum is in a range from 600 nm to 640 nm.

Examples of a red fluorescent compound usable for the red emitting layer include a tetracene derivative and a diamine derivative. Examples of a red phosphorescent compound usable for the red emitting layer include metal complexes such as an iridium complex, platinum complex, terbium complex, and europium complex.

In an arrangement of the organic EL display device according to the second exemplary embodiment, the red-emitting organic EL device preferably includes the red organic layer between the red emitting layer and the third anode side organic layer. The red organic layer may be in direct contact with the hole transporting zone. The red organic layer may be in direct contact with the red emitting layer. In an arrangement of the organic EL display device according to the second exemplary embodiment, an emission position in the red-emitting organic EL device is easily adjustable by providing the red organic layer in the red-emitting organic EL device.

The red organic layer contains a red organic material. The hole transporting zone material according to the first exemplary embodiment is usable as the red organic material. Although the red organic material and the hole transporting zone material contained in the hole transporting zone may be the same compound or different compounds, the red organic material is preferably different from the hole transporting zone material. A hole mobility of the red organic material is preferably larger than the hole mobility of the hole transporting zone material contained in the hole transporting zone. The red organic material is a compound different from the host material and the red emitting compound contained in the red emitting layer.

Although the red organic material contained in the red organic layer of the red-emitting organic EL device and the green organic material contained in the green emitting layer of the green-emitting organic EL device may be the same compound or different compounds, the red organic material is preferably different from the green organic material. The hole mobility of the red organic material is preferably larger than the hole mobility of the green organic material.

In an arrangement of the organic EL display device according to the second exemplary embodiment, a film thickness of the red organic layer is preferably larger than a film thickness of the green organic layer.

In an arrangement of the organic EL display device according to the second exemplary embodiment, the host material contained in the green emitting layer and the host material contained in the red emitting layer are, for instance, a compound for dispersing a highly emittable substance (dopant material) in the emitting layers. As the host material contained in the green emitting layer and the host material contained in the red emitting layer, it is possible to use, for instance, a substance having a higher Lowest Unoccupied Molecular Orbital (LUMO) level and a lower Highest Occupied Molecular Orbital (HOMO) level than the highly emittable substance.

For instance, the following compounds (1) to (4) can be each independently used as the host material contained in the green emitting layer and the host material contained in the red emitting layer.

(1) a metal complex such as an aluminum complex, beryllium complex, or zinc complex (2) a heterocyclic compound such as an oxadiazole derivative, benzimidazole derivative, or phenanthroline derivative (3) a fused aromatic compound such as a carbazole derivative, anthracene derivative, phenanthrene derivative, pyrene derivative or chrysene derivative (4) an aromatic amine compound such as a triarylamine derivative or a fused polycyclic aromatic amine derivative Referring to FIG. 7, the organic EL display device according to the second exemplary embodiment will be further explained. Descriptions on the same arrangements as those in the first exemplary embodiment are simplified or omitted.

Anode

In an exemplary embodiment, the anode 3 is disposed to face the cathode 4.

In an exemplary embodiment, the anode 3 is typically a non-common layer. In an exemplary embodiment, for instance, when the anode 3 is a non-common layer, the respective anodes in the blue-emitting organic EL device 10B, the green-emitting organic EL device 10G and the red-emitting organic EL device 10R are physically separated from each other, and specifically, may be insulated from each other by an insulation material (not shown) or the like.

Cathode

In an exemplary embodiment, the cathode 4 is disposed to face the anode 3.

In an exemplary embodiment, the cathode 4 may be a common layer or a non-common layer.

In an exemplary embodiment, the cathode 4 is preferably a common layer provided in a shared manner across the blue-emitting organic EL device 10B, the green-emitting organic EL device 10G, and the red-emitting organic EL device 10R.

In an exemplary embodiment, the cathode 4 is in direct contact with the electron injecting layer 9.

In an exemplary embodiment, when the cathode 4 is a common layer, a film thickness of the cathode 4 is the same across the blue-emitting organic EL device 10B, the green-emitting organic EL device 10G, and the red-emitting organic EL device 10R. When the cathode 4 is a common layer, the cathode 4 provided for the blue-emitting organic EL device 10B, the green-emitting organic EL device 10G, and the red-emitting organic EL device 10R can be produced without changing a mask or the like. The productivity of the organic EL display device 100A is thus enhanced.

Hole Transporting Zone

In an exemplary embodiment, the electron transporting layer 8 is a common layer provided in a shared manner across the blue-emitting organic EL device 10B, the green-emitting organic EL device 10G, and the red-emitting organic EL device 10R.

In an exemplary embodiment, the electron transporting layer 8 is provided between the electron injecting layer 9 and the respective emitting layers of the blue-emitting organic EL device 10B, the green-emitting organic EL device 10G, and the red-emitting organic EL device 10R.

In an exemplary embodiment, the side of the electron transporting layer 8 close to the anode 3 is in direct contact with the emitting region 5 (the blue emitting layer 50B), the green emitting layer 53 and the red emitting layer 54.

The side of the electron transporting layer 8 close to the cathode 4 is in direct contact with the electron injecting layer 9.

In an exemplary embodiment, the electron transporting layer 8 is a common layer. In this case, a film thickness of the electron transporting layer 8 is the same across the blue-emitting organic EL device 10B, the green-emitting organic EL device 10G, and the red-emitting organic EL device 10R. When the electron transporting layer 8 is a common layer, the electron transporting layer 8 provided for the blue-emitting organic EL device 10B, the green-emitting organic EL device 10G, and the red-emitting organic EL device 10R can be produced without changing a mask or the like. The productivity of the organic EL display device 100A is thus enhanced.

Electron Injecting Layer

In an exemplary embodiment, the electron injecting layer 9 is a common layer provided in a shared manner across the blue-emitting organic EL device 10B, the green-emitting organic EL device 10G, and the red-emitting organic EL device 10R.

In an exemplary embodiment, the electron injecting layer 9 is disposed between the electron transporting layer 8 and the cathode 4.

In an exemplary embodiment, the electron injecting layer 9 is in direct contact with the electron transporting layer 8.

In an exemplary embodiment, the electron injecting layer 9 is a common layer. In this case, a film thickness of the electron injecting layer 9 is constant across the blue-emitting organic EL device 10B, the green-emitting organic EL device 10G, and the red-emitting organic EL device 10R. When the electron injecting layer 9 is a common layer, the electron injecting layer 9 provided for the blue-emitting organic EL device 10B, the green-emitting organic EL device 10G, and the red-emitting organic EL device 10R can be produced without changing a mask or the like. The productivity of the organic EL display device 100A is thus enhanced.

In an exemplary embodiment, any other layer(s) than the emitting layer(s), the first emitting layer, the second emitting layer, the fourth anode side organic layer, the green emitting layer, the red emitting layer, the green organic layer and the red organic layer are preferably provided in a shared manner across the blue-emitting organic EL device, the green-emitting organic EL device, and the red-emitting organic EL device. Reducing the number of the non-common layers in the organic EL display device improves manufacturing efficiency thereof.

Manufacturing Method of Organic EL Display Device

A manufacturing method of the organic EL display device 100A shown in FIG. 7 will be described as an example of a manufacturing method of the organic EL display device according to the second exemplary embodiment.

First, the anode 3 is formed on the substrate 2A.

Subsequently, the anode side organic layers (first anode side organic layer 61A, second anode side organic layer 62A, and third anode side organic layer 63A) as common layers are sequentially formed on the anode 3, forming a hole transporting zone as a common zone. Each organic layer in the hole transporting zone of the blue-emitting organic EL device 10B, the green-emitting organic EL device 10G, and the red-emitting organic EL device 10R is formed to have a constant film thickness.

Subsequently, the blue emitting layer 50B is formed on the third anode side organic layer 63A in a region corresponding to the anode 3 of the blue-emitting organic EL device 10B using a predetermined film-forming mask (mask for the blue-emitting organic EL device).

Subsequently, the green organic layer 531 is formed on the third anode side organic layer 63A in a region corresponding to the anode 3 of the green-emitting organic EL device 10G using a predetermined film-forming mask (mask for the green-emitting organic EL device). After forming the green organic layer 531, the green emitting layer 53 is formed on the green organic layer 531.

Subsequently, the red organic layer 541 is formed on the third anode side organic layer 63A in a region corresponding to the anode 3 of the red-emitting organic EL device 10R using a predetermined film-forming mask (mask for the red-emitting organic EL device). After forming the red organic layer 541, the red emitting layer 54 is formed on the red organic layer 541.

The emitting layer 50, the green emitting layer 53, and the red emitting layer 54 are formed from different materials.

It should be noted that after the formation of the third anode side organic layer 63A, the order of forming the non-common layers of the blue-emitting organic EL device 10B, the green-emitting organic EL device 10G, and the red-emitting organic EL device 10R is not particularly limited.

For instance, after forming the third anode side organic layer 63A, the green organic layer 531 and the green emitting layer 53 of the green-emitting organic EL device 10G may be formed, then the red organic layer 541 and the red emitting layer 54 of the red-emitting organic EL device 10R may be formed, and then the blue emitting layer 50B of the blue-emitting organic EL device 10B may be formed.

Alternatively, for instance, after forming the third anode side organic layer 63A, the red organic layer 541 and the red emitting layer 54 of the red-emitting organic EL device 10R may be formed, then the green organic layer 531 and the green emitting layer 53 of the green-emitting organic EL device 10G may be formed, and then the blue emitting layer 50B of the blue-emitting organic EL device 10B may be formed.

Subsequently, the electron transporting layer 8 as a common layer is formed over the blue emitting layer 50B, the green emitting layer 53, and the red emitting layer 54. The electron transporting layer 8 of the blue-emitting organic EL device 10B, the green-emitting organic EL device 10G, and the red-emitting organic EL device 10R is formed to have a constant film thickness using the same material.

Subsequently, the electron injecting layer 9 as a common layer is formed on the electron transporting layer 8. The electron injecting layer 9 of the blue-emitting organic EL device 10B, the green-emitting organic EL device 10G, and the red-emitting organic EL device 10R is formed to have a constant film thickness using the same material.

Subsequently, the cathode 4 as a common layer is formed on the electron injecting layer 9. The cathode 4 of the blue-emitting organic EL device 10B, the green-emitting organic EL device 10G, and the red-emitting organic EL device 10R is formed to have a constant film thickness using the same material.

The organic EL display device 100A shown in FIG. 7 is manufactured as described above.

The organic EL display device 100B shown in FIG. 8 is different from the organic EL display device 100A shown in FIG. 7 in that the organic EL display device 100B includes the fourth anode side organic layer 64A. In manufacture of the organic EL display device 100B shown in FIG. 8, the fourth anode side organic layer 64A is formed on the third anode side organic layer 63A in a region corresponding to the anode 3 of the blue-emitting organic EL device 11B using a predetermined film-forming mask (mask for the blue-emitting organic EL device). Subsequently, the blue emitting layer 50B is formed on the fourth anode side organic layer 64A. Any other manufacturing steps of the organic EL display device 100B are the same as those of the organic EL display device 100A.

The organic EL display device 100C shown in FIG. 9 is different from the organic EL display device 100A shown in FIG. 7 in that the emitting region 5B includes the first emitting layer 51 and the second emitting layer 52. In manufacture of the organic EL display device 100C shown in FIG. 9, the first emitting layer 51 is formed on the third anode side organic layer 63A in a region corresponding to the anode 3 of the blue-emitting organic EL device 12B using a predetermined film-forming mask (mask for the blue-emitting organic EL device). Subsequently, the second emitting layer 52 is formed on the first emitting layer 51. Then, the electron transporting layer 8 as a common layer is formed over the second emitting layer 52, the green emitting layer 53, and the red emitting layer 54. Any other manufacturing steps of the organic EL display device 100C are the same as those of the organic EL display device 100A.

The organic EL display device 100D shown in FIG. 10 is different from the organic EL display device 100C shown in FIG. 9 in that the organic EL display device 100D includes the fourth anode side organic layer 64A. In manufacture of the organic EL display device 100D shown in FIG. 10, the fourth anode side organic layer 64A is formed on the third anode side organic layer 63A in a region corresponding to the anode 3 of the blue-emitting organic EL device 13B using a predetermined film-forming mask (mask for the blue-emitting organic EL device). Subsequently, the first emitting layer 51 is formed on the fourth anode side organic layer 64A. Then, the second emitting layer 52 is formed on the first emitting layer 51. Any other manufacturing steps of the organic EL display device 100D are the same as those of the organic EL display device 100C.

The organic EL display device that does not include the third anode side organic layer can be manufactured according to the same manufacturing steps as those of the above-described organic EL display devices except that formation of the second anode side organic layer as a common layer is followed by forming the respective emitting regions of the blue-emitting organic EL device, the green-emitting organic EL device and the red-emitting organic EL device on the second anode side organic layer.

Third Exemplary Embodiment

Electronic Device

An electronic device according to a third exemplary embodiment is installed with one of the organic EL devices according to the above exemplary embodiments or one of the organic EL display devices according to the above exemplary embodiment. Examples of the electronic device include a display device and a light-emitting device. Examples of the display device include a display component (e.g., an organic EL panel module), TV, mobile phone, tablet and personal computer. Examples of the light-emitting device include an illuminator and a vehicle light.

In an arrangement of the electronic device according to the third exemplary embodiment, the light-emitting device is installed with the tandem organic EL device according to the first exemplary embodiment. The light-emitting device preferably includes the tandem organic EL device according to the first exemplary embodiment and a color conversion layer. The light-emitting device preferably includes a color filter. The color conversion layer is preferably disposed between the tandem organic EL device and the color filter. The color conversion layer preferably contains a substance that absorbs light to emit light. The substance that absorbs light to emit light is preferably a quantum dot. In the light-emitting device, the color conversion layer is preferably disposed to be irradiated with light emission from the tandem organic EL device.

In an arrangement of the electronic device according to the third exemplary embodiment, the display device is installed with the light-emitting device according to the third exemplary embodiment. The light-emitting device also can be used for a display device, for instance, as a backlight of the display device.

Modification of Exemplary Embodiment(s)

The scope of the invention is not limited by the above-described exemplary embodiments but includes any modification and improvement as long as such modification and improvement are compatible with the invention.

For instance, the number of the emitting layers is not limited to one or two, and more than two emitting layers may be provided and laminated with each other. For instance, the rest of the emitting layers may be a fluorescent emitting layer or a phosphorescent emitting layer with use of emission caused by electron transfer from the triplet excited state directly to the ground state.

For instance, a blocking layer is optionally provided adjacent to the emitting layer close to the cathode. The blocking layer provided in direct contact with the side of the emitting layer close to the cathode preferably blocks at least one of holes or excitons.

For instance, when the blocking layer is provided in contact with the side of the emitting layer close to the cathode, the blocking layer permits transport of electrons and blocks holes from reaching a layer provided close to the cathode (e.g., the electron transporting layer) beyond the blocking layer. When the organic EL device includes the electron transporting layer, the blocking layer may be disposed between the emitting layer and the electron transporting layer.

Alternatively, the blocking layer may be provided adjacent to the emitting layer so that excitation energy does not leak out from the emitting layer toward neighboring layer(s). The blocking layer blocks excitons generated in the emitting layer from being transferred to a layer(s) (e.g., the electron transporting layer) closer to the electrode(s) than the blocking layer. The emitting layer is preferably in direct contact with the blocking layer.

Specific structure, shape and the like of the components in the invention may be designed in any manner as long as an object of the invention can be achieved.

EXAMPLES
Compounds
A structure of a compound as the first organic material used for manufacturing organic EL devices in Examples 1-1 to 1-47 and 2-1 to 2-46 is shown below.
HA
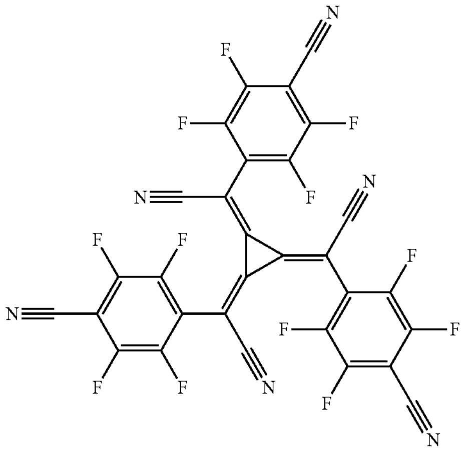
Structures of compounds as the second organic material used for manufacturing the organic EL devices in Examples 1-1 to 1-47 and 2-1 to 2-46 are shown below.
HT-1-1
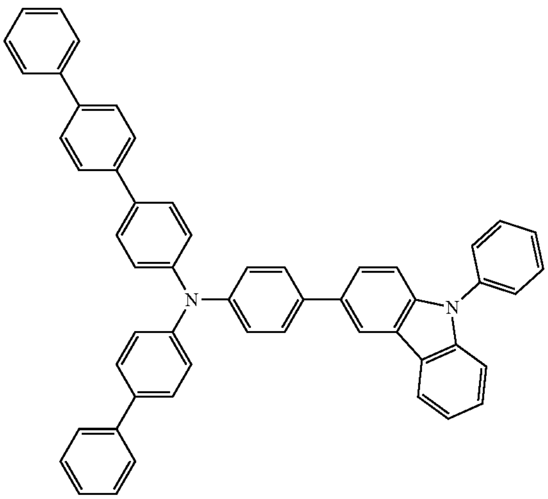
-continued
HT-1-2
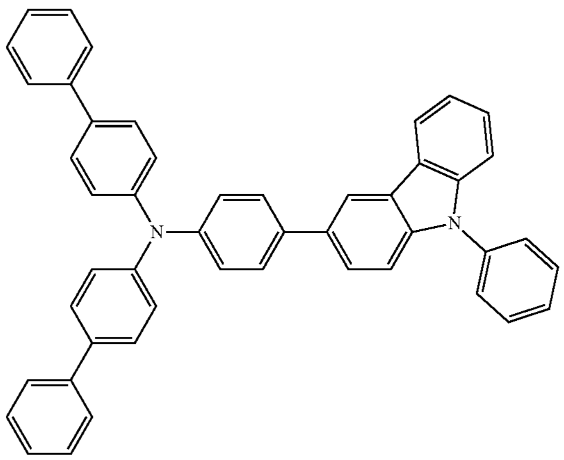 [SMILES: c1ccc(-c2ccc(N(c3ccc(-c4ccccc4)cc3)c3ccc(-c4ccc5c(c4)c4ccccc4n5-c4ccccc4)cc3)cc2)cc1]
HT-1-3
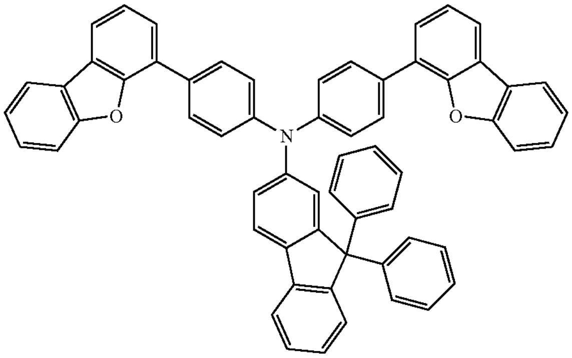
HT-1-4
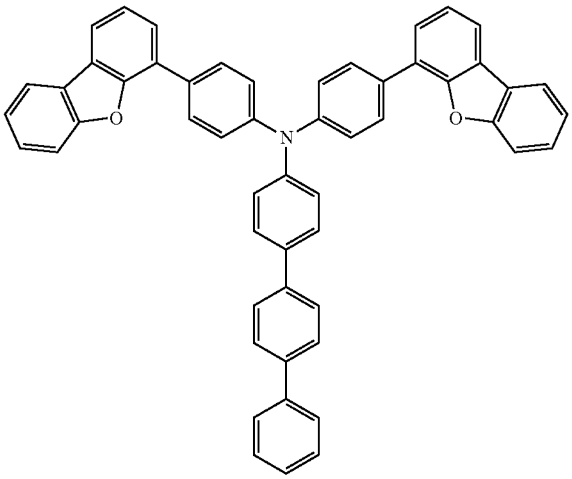

-continued
HT-1-5
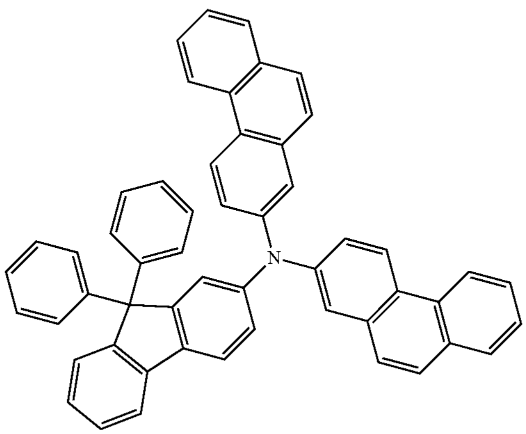
HT-1-6
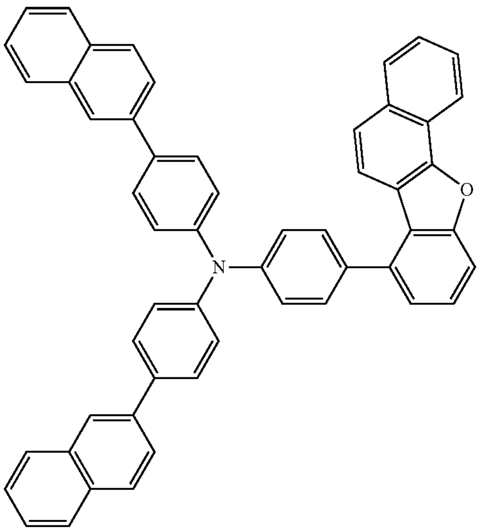
Structures of compounds contained in the second anode side organic layer used for manufacturing the organic EL devices in Examples 1-1 to 1-47 and 2-1 to 2-46 are shown below.
HT-2-1
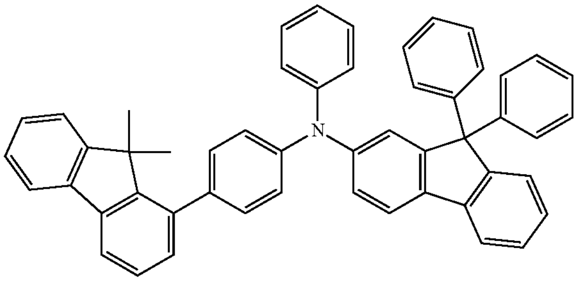
-continued
HT-2-2
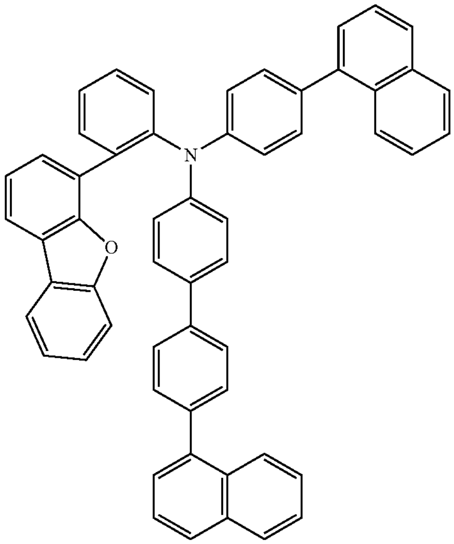
HT-2-3
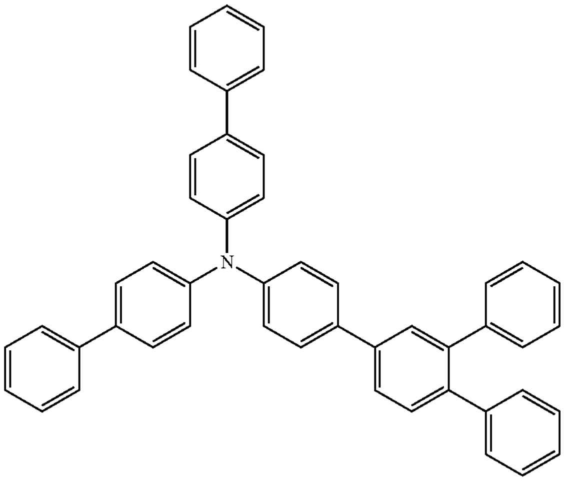
HT-2-4
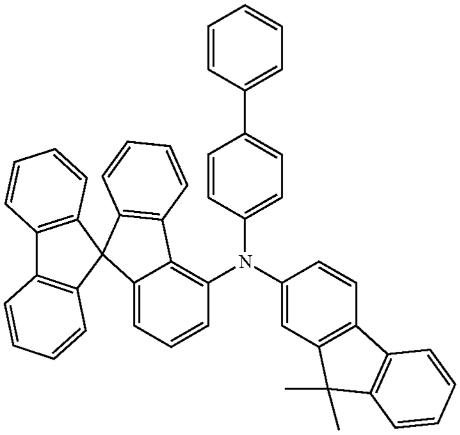

-continued
HT-2-5
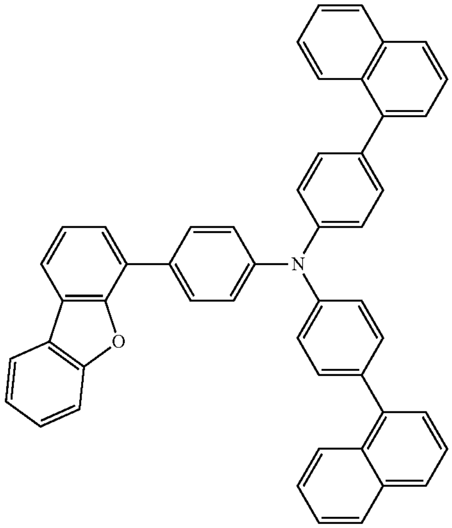
HT-2-6
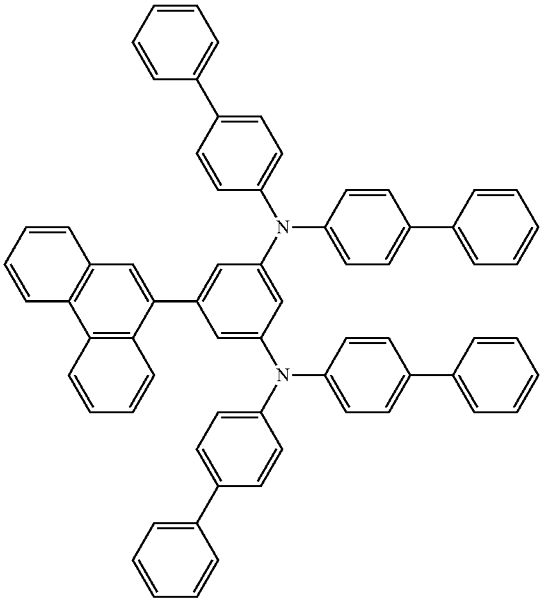
HT-2-7
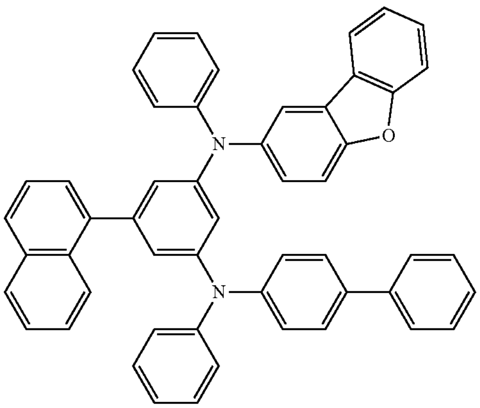
-continued
HT-2-8
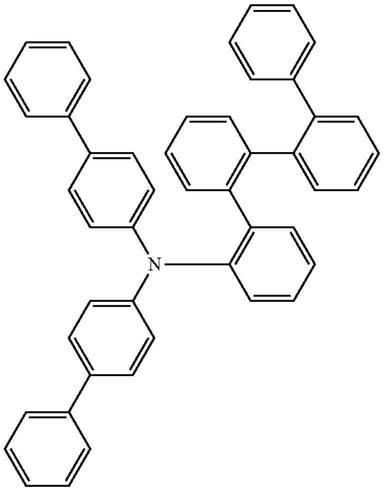
HT-2-9
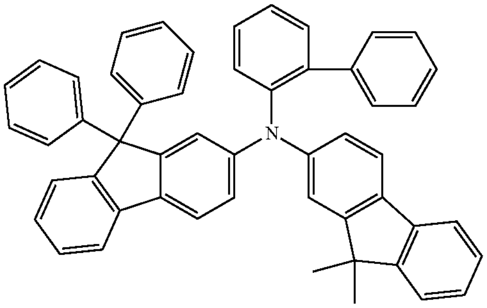
HT-2-10
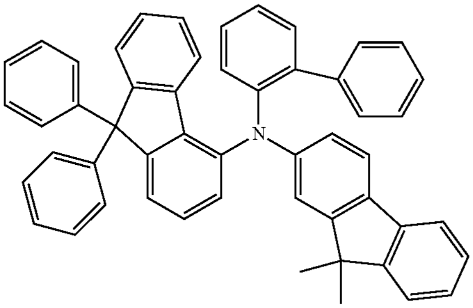
HT-2-11
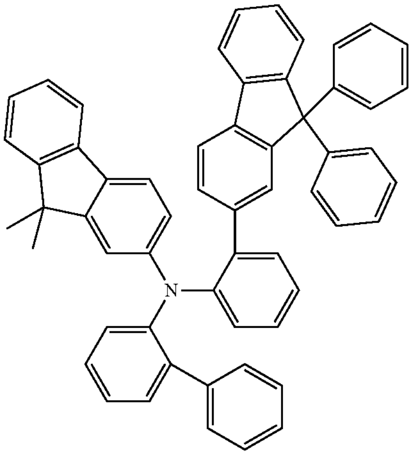

-continued

HT-2-12

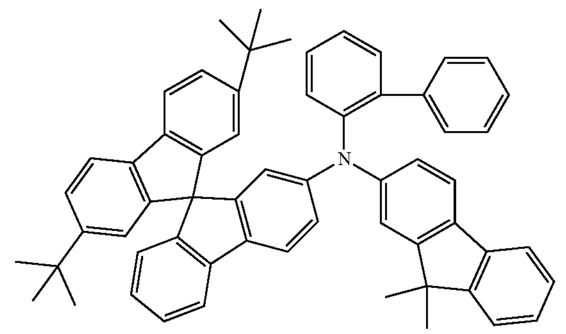

A structure of a compound contained in the third anode side organic layer used for manufacturing the organic EL devices in Examples 1-1, 1-8 to 1-13, 1-18 to 1-23, 1-28 to 1-34, 1-36, 1-44 to 1-46, 2-1, 2-7 to 2-12, 2-17 to 2-22, 2-27 to 2-33, 2-35 and 2-43 to 2-45 is shown below.

HT-3-1

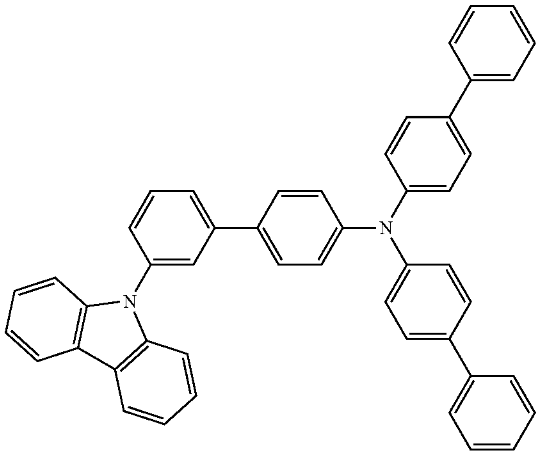

Structures of other compounds used for manufacturing the organic EL devices in Examples 1-1 to 1-47 and 2-1 to 2-46 and organic EL devices in Comparatives 1-1 and 2-1 are shown below.

BH1-1

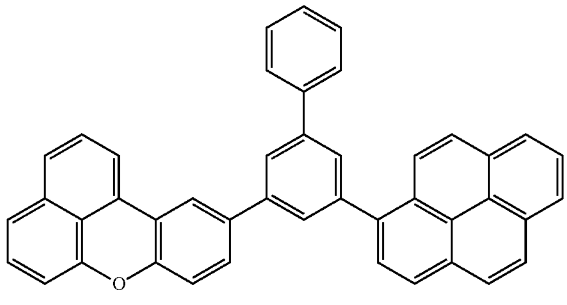

-continued

BH1-2

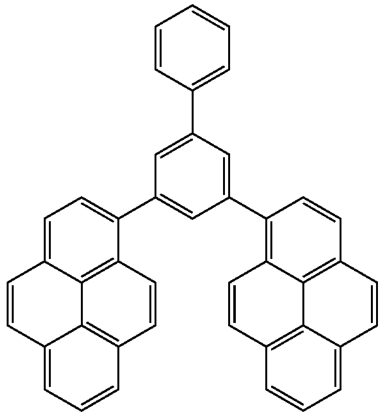

BH2

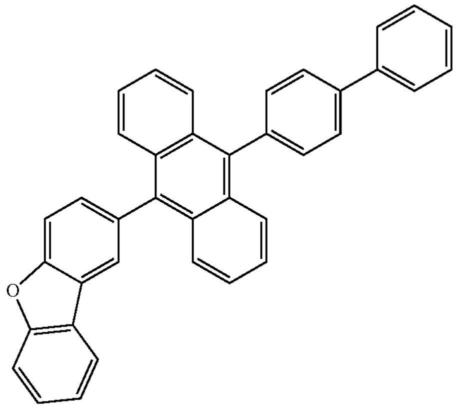

BD

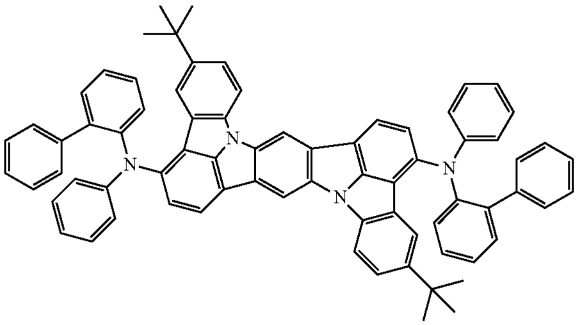

ET-1

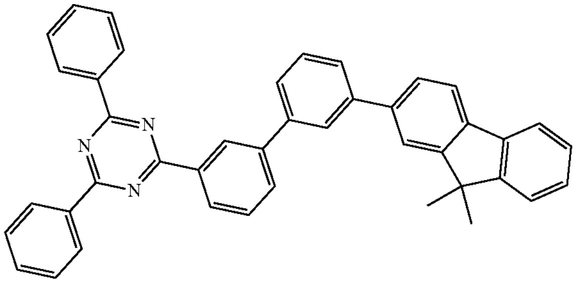

-continued

ET-2

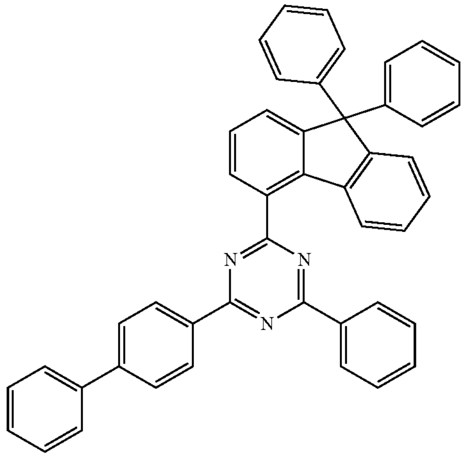

Preparation of Organic EL Device

The organic EL devices were prepared and evaluated as follows.

Example 1-1

A glass substrate (size: 25 mm×75 mm×1.1 mm thick, manufactured by Geomatec Co., Ltd.) having an ITO (Indium Tin Oxide) transparent electrode (anode) was ultrasonic-cleaned in isopropyl alcohol for five minutes, and then UV-ozone-cleaned for 30 minutes. The film thickness of the ITO transparent electrode was 130 nm.

After the glass substrate having the transparent electrode line was cleaned, the glass substrate was mounted on a substrate holder of a vacuum deposition apparatus. First, a compound HT-1-1 and a compound HA were co-deposited on a surface of the glass substrate where the transparent electrode line was provided in a manner to cover the transparent electrode, thereby forming a 10-nm-thick first anode side organic layer (occasionally also referred to as a hole injecting layer). The ratios of the compound HT-1-1 and the compound HA in the first anode side organic layer were 90 mass % and 10 mass %, respectively.

A compound HT-2-1 was vapor-deposited on the first anode side organic layer to form a 40-nm-thick second anode side organic layer (occasionally also referred to as a first hole transporting layer).

A compound HT-3-1 was vapor-deposited on the second anode side organic layer to form a 5-nm-thick third anode side organic layer (occasionally also referred to as an electron blocking layer).

A compound BH1-1 (first host material) and a compound BD (first emitting compound) were co-deposited on the third anode side organic layer so that a ratio of the compound BD accounted for 1 mass %, thereby forming a 10-nm-thick first emitting layer.

A compound BH2 (second host material) and the compound BD (second emitting compound) were co-deposited on the first emitting layer so that a ratio of the compound BD accounted for 1 mass %, thereby forming a 10-nm-thick second emitting layer.

A compound ET-1 was vapor-deposited on the second emitting layer to form a 5-nm-thick first electron transporting layer (occasionally also referred to as a hole blocking layer (HBL)).

A compound ET-2 was vapor-deposited on the first electron transporting layer to form a 20-nm-thick second electron transporting layer (ET).

Ytterbium (Yb) was vapor-deposited on the second electron transporting layer to form a 1-nm-thick electron injecting layer.

Metal (Al) was vapor-deposited on the electron injecting layer to form a 60-nm-thick cathode.

A device arrangement of the organic EL device in Example 1-1 is roughly shown as follows.

ITO(130)/HT-1-1:HA(10,90%: 10%)/HT-2-1(40)/HT-3-1 (5)/B H1-1:BD(10,99%:1%)/BH2:BD(10,99%:1%)/ET-1 (5)/ET-2(20)/Yb(1)/Al(60)

The numerals in parentheses represent a film thickness (unit: nm).

The numerals (90%:10%) represented by percentage in the same parentheses indicate a ratio (mass %) between the compound HT-1-1 and the compound HA in the first anode side organic layer, and the numerals (99%:1%) represented by percentage in the same parentheses indicate a ratio (mass %) between the host material (compound BH-1-1 or BH2) and the emitting compound (compound BD) in the first emitting layer or the second emitting layer.

Example 1-2

The organic EL device in Example 1-2 was manufactured in the same manner as the organic EL device in Example 1-1 except that the thickness of the second anode side organic layer was changed to 45 nm, the third anode side organic layer was not formed and the first emitting layer was formed on the second anode side organic layer.

Example 1-3

The organic EL device in Example 1-3 was manufactured in the same manner as the organic EL device in Example 1-2 except that the first host material (compound BH1-1) contained in the first emitting layer was changed to a compound BH1-2.

Examples 1-4 to 1-7

The organic EL devices in Examples 1~4 to 1-7 were each manufactured in the same manner as the organic EL device in Example 1-2 except that the compound HT-2-1 contained in the second anode side organic layer was changed to a compound shown in Table 1.

Examples 1-8 to 1-13

The organic EL devices in Examples 1-8 to 1-13 were each manufactured in the same manner as the organic EL device in Example 1-1 except that the compound HT-2-1 contained in the second anode side organic layer was changed to a compound shown in Table 1.

Examples 1-14 to 1-17 and 1-24 to 1-27

The organic EL devices in Examples 1-14 to 1-17 and 1-24 to 1-27 were each manufactured in the same manner as the organic EL device in Example 1-2 except that the compound HT-1-1 contained in the first anode side organic layer and the compound HT-2-1 contained in the second anode side organic layer were changed to compounds shown in Table 1.

Examples 1-18 to 1-23 and 1-28 to 1-33

The organic EL devices in Examples 1-18 to 1-23 and 1-28 to 1-33 were each manufactured in the same manner as the organic EL device in Example 1-1 except that the compound HT-1-1 contained in the first anode side organic layer and the compound HT-2-1 contained in the second anode side organic layer were changed to compounds shown in Table 1.

Examples 1-34 and 1-36

The organic EL devices in Examples 1-34 and 1-36 were each manufactured in the same manner as the organic EL device in Example 1-1 except that the compound HT-1-1 contained in the first anode side organic layer was changed to a compound shown in Table 1.

Examples 1-35 and 1-37

The organic EL devices in Examples 1-35 and 1-37 were each manufactured in the same manner as the organic EL device in Example 1-2 except that the compound HT-1-1 contained in the first anode side organic layer was changed to a compound shown in Table 1.

The organic EL devices in Examples 1-38, 1-41 and 1-47 were each manufactured in the same manner as the organic EL device in Example 1-2 except that the compound HT-1-1 contained in the first anode side organic layer was changed to a compound shown in Table 2.

Examples 1-39, 1-40, 1-42 and 1-43

The organic EL devices in Examples 1-39, 1-40, 1-42 and 1-43 were each manufactured in the same manner as the organic EL device in Example 1-2 except that the compound HT-1-1 contained in the first anode side organic layer was changed to a compound shown in Table 2 and the compound HT-2-1 contained in the second anode side organic layer was changed to a compound shown in Table 2.

Examples 1-44 to 1-46

The organic EL devices in Examples 1-44 to 1-46 were each manufactured in the same manner as the organic EL device in Example 1-1 except that the compound HT-2-1 contained in the second anode side organic layer was changed to a compound shown in Table 2.

Comparative 1-1

The organic EL device in Comparative 1-1 was manufactured in the same manner as the organic EL device in Example 1-1 except that the compound HT-2-1 contained in the second anode side organic layer was changed to a compound shown in Table 1. In the organic EL device of Comparative 1-1, the first anode side organic layer and the second anode side organic layer both contained the compound HT-1-1.

Example 2-1

The organic EL device in Example 2-1 was manufactured in the same manner as the organic EL device in Example 1-1 except that the compound BH2 and the compound BD were co-deposited on the third anode side organic layer so that a ratio of the compound BD accounted for 1 mass % to form a 20-nm-thick emitting layer, and the first electron transporting layer was formed on the emitting layer.

A device arrangement of the organic EL device in Example 2-1 is roughly shown as follows.

ITO(130)/HT-1-1:HA(10,90%)/0:10%)/HT-2-1(40)/HT-3-1(5)/BH2:BD(20,99%:1%)/ET-1(5)/ET-2(20)/Yb(1)/Al(60)

Example 2-2

The organic EL device in Example 2-2 was manufactured in the same manner as the organic EL device in Example 2-1 except that the thickness of the second anode side organic layer was changed to 45 nm, the third anode side organic layer was not formed and the emitting layer was formed on the second anode side organic layer.

Examples 2-3 to 2-6

The organic EL devices in Examples 2-3 to 2-6 were each manufactured in the same manner as the organic EL device in Example 2-2 except that the compound HT-2-1 contained in the second anode side organic layer was changed to a compound shown in Table 3.

Examples 2-7 to 2-12

The organic EL devices in Examples 2-7 to 2-12 were each manufactured in the same manner as the organic EL device in Example 2-1 except that the compound HT-2-1 contained in the second anode side organic layer was changed to a compound shown in Table 3.

Examples 2-13 to 2-16 and 2-23 to 2-26

The organic EL devices in Examples 2-13 to 2-16 and 2-23 to 2-26 were each manufactured in the same manner as the organic EL device in Example 2-2 except that the compound HT-1-1 contained in the first anode side organic layer and the compound HT-2-1 contained in the second anode side organic layer were changed to compounds shown in Table 3.

Examples 2-17 to 2-22 and 2-27 to 2-32

The organic EL devices in Examples 2-17 to 2-22 and 2-27 to 2-32 were each manufactured in the same manner as the organic EL device in Example 2-1 except that the compound HT-1-1 contained in the first anode side organic layer and the compound HT-2-1 contained in the second anode side organic layer were changed to compounds shown in Table 3.

Examples 2-33 and 2-35

The organic EL devices in Examples 2-33 and 2-35 were each manufactured in the same manner as the organic EL device in Example 2-1 except that the compound HT-1-1 contained in the first anode side organic layer was changed to a compound shown in Table 3.

Examples 2-34 and 2-36

The organic EL devices in Examples 2-34 and 2-36 were each manufactured in the same manner as the organic EL device in Example 2-2 except that the compound HT-1-1 contained in the first anode side organic layer was changed to a compound shown in Table 3.

Examples 2-37, 2-40 and 2-46

The organic EL devices in Examples 2-37, 2-40 and 2-46 were each manufactured in the same manner as the organic EL device in Example 2-2 except that the compound HT-1-1 contained in the first anode side organic layer was changed to a compound shown in Table 4.

Examples 2-38, 2-39, 2-41 and 2-42

The organic EL devices in Examples 2-38, 2-39, 2-41 and 2-42 were each manufactured in the same manner as the organic EL device in Example 2-2 except that the compound HT-1-1 contained in the first anode side organic layer was changed to a compound shown in Table 4 and the compound HT-2-1 contained in the second anode side organic layer was changed to a compound shown in Table 4.

Examples 2-43 to 2-45

The organic EL devices in Examples 2-43 to 2-45 were each manufactured in the same manner as the organic EL device in Example 2-1 except that the compound HT-2-1 contained in the second anode side organic layer was changed to a compound shown in Table 4.

Comparative 2-1

The organic EL device in Comparative 2-1 was manufactured in the same manner as the organic EL device in Example 2-1 except that the compound HT-2-1 contained in the second anode side organic layer was changed to a compound shown in Table 3. In the organic EL device of Comparative 2-1, the first anode side organic layer and the second anode side organic layer both contained the compound HT-1-1.

Evaluation of Organic EL Devices

The manufactured organic EL devices were evaluated as follows. Evaluation results are shown in Tables 1 to 4.

External Quantum Efficiency EQE

Voltage was applied on each of the manufactured organic EL devices such that a current density was 10 mA/$cm^2$, where spectral radiance spectrum was measured by a spectroradiometer CS-2000 (manufactured by Konica Minolta, Inc.). The external quantum efficiency EQE (unit: %) was calculated based on the obtained spectral radiance spectrum, assuming that the spectra was provided under a Lambertian radiation. "EQEs (relative values)" (unit: %) are shown in Tables 1 to 4.

"EQEs (relative values)" shown in Tables 1 to 4 were each calculated based on a measurement value of EQE of each Example and a numerical formula (Numerical Formula 1X) below.

$$\text{EQE(relative value)}=(\text{EQE of each Example}/\text{EQE of Comparative 1-1})\times 100 \qquad \text{(Numerical Formula 1X)}$$

TABLE 1

| | First Anode Side Organic Layer | | | | Second Anode Side Organic Layer | | | Third Anode Side Organic Layer | | | Refractive Index Difference | | Device Evaluation |
|---|---|---|---|---|---|---|---|---|---|---|---|---|---|
| | First Organic Material Name | Second Organic Material Name | Refractive Index $NM_1$ | Film Thickness [nm] | Compound Name | Refractive Index $NM_2$ | Film Thickness [nm] | Compound Name | Refractive Index $NM_3$ | Film Thickness [nm] | $NM_1 - NM_2$ | $NM_2 - NM_3$ | EQE (Relative Value) |
| Comparative 1-1 | HA | HT-1-1 | 1.96 | 10 | HT-1-1 | 1.96 | 40 | HT-3-1 | 1.90 | 5 | 0.00 | 0.06 | 100% |
| Example 1-1 | HA | HT-1-1 | 1.96 | 10 | HT-2-1 | 1.79 | 40 | HT-3-1 | 1.90 | 5 | 0.17 | −0.11 | 113% |
| Example 1-2 | HA | HT-1-1 | 1.96 | 10 | HT-2-1 | 1.79 | 45 | — | — | — | 0.17 | — | 115% |
| Example 1-3 | HA | HT-1-1 | 1.96 | 10 | HT-2-1 | 1.79 | 45 | — | — | — | 0.17 | — | 122% |
| Example 1-4 | HA | HT-1-1 | 1.96 | 10 | HT-2-2 | 1.89 | 45 | — | — | — | 0.07 | — | 110% |
| Example 1-5 | HA | HT-1-1 | 1.96 | 10 | HT-2-3 | 1.90 | 45 | — | — | — | 0.06 | — | 110% |
| Example 1-6 | HA | HT-1-1 | 1.96 | 10 | HT-2-4 | 1.83 | 45 | — | — | — | 0.13 | — | 110% |
| Example 1-7 | HA | HT-1-1 | 1.96 | 10 | HT-2-5 | 1.92 | 45 | — | — | — | 0.04 | — | 110% |
| Example 1-8 | HA | HT-1-1 | 1.96 | 10 | HT-2-2 | 1.89 | 40 | HT-3-1 | 1.90 | 5 | 0.07 | −0.01 | 110% |
| Example 1-9 | HA | HT-1-1 | 1.96 | 10 | HT-2-3 | 1.90 | 40 | HT-3-1 | 1.90 | 5 | 0.06 | 0.00 | 110% |
| Example 1-10 | HA | HT-1-1 | 1.96 | 10 | HT-2-4 | 1.83 | 40 | HT-3-1 | 1.90 | 5 | 0.13 | −0.07 | 110% |
| Example 1-11 | HA | HT-1-1 | 1.96 | 10 | HT-2-6 | 1.89 | 40 | HT-3-1 | 1.90 | 5 | 0.07 | −0.01 | 110% |
| Example 1-12 | HA | HT-1-1 | 1.96 | 10 | HT-2-7 | 1.83 | 40 | HT-3-1 | 1.90 | 5 | 0.13 | −0.07 | 115% |
| Example 1-13 | HA | HT-1-1 | 1.96 | 10 | HT-2-5 | 1.92 | 40 | HT-3-1 | 1.90 | 5 | 0.04 | 0.02 | 110% |
| Example 1-14 | HA | HT-1-2 | 1.94 | 10 | HT-2-2 | 1.89 | 45 | — | — | — | 0.05 | — | 107% |
| Example 1-15 | HA | HT-1-2 | 1.94 | 10 | HT-2-3 | 1.90 | 45 | — | — | — | 0.04 | — | 107% |
| Example 1-16 | HA | HT-1-2 | 1.94 | 10 | HT-2-4 | 1.83 | 45 | — | — | — | 0.11 | — | 107% |
| Example 1-17 | HA | HT-1-2 | 1.94 | 10 | HT-2-5 | 1.92 | 45 | — | — | — | 0.02 | — | 107% |
| Example 1-18 | HA | HT-1-2 | 1.94 | 10 | HT-2-2 | 1.89 | 40 | HT-3-1 | 1.90 | 5 | 0.05 | −0.01 | 107% |
| Example 1-19 | HA | HT-1-2 | 1.94 | 10 | HT-2-3 | 1.90 | 40 | HT-3-1 | 1.90 | 5 | 0.04 | 0.00 | 107% |
| Example 1-20 | HA | HT-1-2 | 1.94 | 10 | HT-2-4 | 1.83 | 40 | HT-3-1 | 1.90 | 5 | 0.11 | −0.07 | 107% |
| Example 1-21 | HA | HT-1-2 | 1.94 | 10 | HT-2-6 | 1.89 | 40 | HT-3-1 | 1.90 | 5 | 0.05 | −0.01 | 107% |
| Example 1-22 | HA | HT-1-2 | 1.94 | 10 | HT-2-7 | 1.83 | 40 | HT-3-1 | 1.90 | 5 | 0.11 | −0.07 | 112% |
| Example 1-23 | HA | HT-1-2 | 1.94 | 10 | HT-2-5 | 1.92 | 40 | HT-3-1 | 1.90 | 5 | 0.02 | 0.02 | 107% |
| Example 1-24 | HA | HT-1-3 | 1.99 | 10 | HT-2-2 | 1.89 | 45 | — | — | — | 0.10 | — | 107% |
| Example 1-25 | HA | HT-1-3 | 1.99 | 10 | HT-2-3 | 1.90 | 45 | — | — | — | 0.09 | — | 107% |
| Example 1-26 | HA | HT-1-3 | 1.99 | 10 | HT-2-4 | 1.83 | 45 | — | — | — | 0.16 | — | 107% |
| Example 1-27 | HA | HT-1-3 | 1.99 | 10 | HT-2-5 | 1.92 | 45 | — | — | — | 0.07 | — | 107% |
| Example 1-28 | HA | HT-1-3 | 1.99 | 10 | HT-2-2 | 1.89 | 40 | HT-3-1 | 1.90 | 5 | 0.10 | −0.01 | 107% |
| Example 1-29 | HA | HT-1-3 | 1.99 | 10 | HT-2-3 | 1.90 | 40 | HT-3-1 | 1.90 | 5 | 0.09 | 0.00 | 107% |
| Example 1-30 | HA | HT-1-3 | 1.99 | 10 | HT-2-4 | 1.83 | 40 | HT-3-1 | 1.90 | 5 | 0.16 | −0.07 | 107% |
| Example 1-31 | HA | HT-1-3 | 1.99 | 10 | HT-2-6 | 1.89 | 40 | HT-3-1 | 1.90 | 5 | 0.10 | −0.01 | 107% |
| Example 1-32 | HA | HT-1-3 | 1.99 | 10 | HT-2-7 | 1.83 | 40 | HT-3-1 | 1.90 | 5 | 0.16 | −0.07 | 112% |
| Example 1-33 | HA | HT-1-3 | 1.99 | 10 | HT-2-5 | 1.92 | 40 | HT-3-1 | 1.90 | 5 | 0.07 | 0.02 | 107% |
| Example 1-34 | HA | HT-1-2 | 1.94 | 10 | HT-2-1 | 1.79 | 40 | HT-3-1 | 1.90 | 5 | 0.15 | −0.11 | 110% |
| Example 1-35 | HA | HT-1-2 | 1.94 | 10 | HT-2-1 | 1.79 | 45 | — | — | — | 0.15 | — | 112% |
| Example 1-36 | HA | HT-1-3 | 1.99 | 10 | HT-2-1 | 1.79 | 40 | HT-3-1 | 1.90 | 5 | 0.20 | −0.11 | 110% |
| Example 1-37 | HA | HT-1-3 | 1.99 | 10 | HT-2-1 | 1.79 | 45 | — | — | — | 0.20 | — | 112% |

TABLE 2

| | First Anode Side Organic Layer | | | | Second Anode Side Organic Layer | | | Third Anode Side Organic Layer | | | Refractive Index Difference | | Device Evaluation |
|---|---|---|---|---|---|---|---|---|---|---|---|---|---|
| | First Organic Material Name | Second Organic Material Name | Refractive Index $NM_1$ | Film Thickness [nm] | Compound Name | Refractive Index $NM_2$ | Film Thickness [nm] | Compound Name | Refractive Index $NM_3$ | Film Thickness [nm] | $NM_1 - NM_2$ | $NM_2 - NM_3$ | EQE (Relative Value) |
| Example 1-38 | HA | HT-1-4 | 2.03 | 10 | HT-2-1 | 1.79 | 45 | — | — | — | 0.24 | — | 115% |
| Example 1-39 | HA | HT-1-4 | 2.03 | 10 | HT-2-8 | 1.78 | 45 | — | — | — | 0.25 | — | 116% |
| Example 1-40 | HA | HT-1-4 | 2.03 | 10 | HT-2-10 | 1.77 | 45 | — | — | — | 0.26 | — | 116% |
| Example 1-41 | HA | HT-1-5 | 1.90 | 10 | HT-2-1 | 1.79 | 45 | — | — | — | 0.11 | — | 118% |
| Example 1-42 | HA | HT-1-5 | 1.90 | 10 | HT-2-8 | 1.78 | 45 | — | — | — | 0.12 | — | 119% |
| Example 1-43 | HA | HT-1-5 | 1.90 | 10 | HT-2-10 | 1.77 | 45 | — | — | — | 0.13 | — | 119% |
| Example 1-44 | HA | HT-1-1 | 1.96 | 10 | HT-2-9 | 1.83 | 40 | HT-3-1 | 1.90 | 5 | 0.13 | −0.07 | 112% |
| Example 1-45 | HA | HT-1-1 | 1.96 | 10 | HT-2-11 | 1.78 | 40 | HT-3-1 | 1.90 | 5 | 0.18 | −0.12 | 113% |
| Example 1-46 | HA | HT-1-1 | 1.96 | 10 | HT-2-12 | 1.76 | 40 | HT-3-1 | 1.90 | 5 | 0.20 | −0.14 | 113% |
| Example 1-47 | HA | HT-1-6 | 2.05 | 10 | HT-2-1 | 1.79 | 45 | — | — | — | 0.26 | — | 117% |

TABLE 3

| | First Anode Side Organic Layer | | | | Second Anode Side Organic Layer | | | Third Anode Side Organic Layer | | | Refractive Index Difference | | Device Evaluation |
|---|---|---|---|---|---|---|---|---|---|---|---|---|---|
| | First Organic Material Name | Second Organic Material Name | Refractive Index $NM_1$ | Film Thickness [nm] | Compound Name | Refractive Index $NM_2$ | Film Thickness [nm] | Compound Name | Refractive Index $NM_3$ | Film Thickness [nm] | $NM_1 - NM_2$ | $NM_2 - NM_3$ | EQE (Relative Value) |
| Comparative 2-1 | HA | HT-1-1 | 1.96 | 10 | HT-1-1 | 1.96 | 40 | HT-3-1 | 1.90 | 5 | 0.00 | 0.06 | 95% |
| Example 2-1 | HA | HT-1-1 | 1.96 | 10 | HT-2-1 | 1.79 | 40 | HT-3-1 | 1.90 | 5 | 0.17 | −0.11 | 108% |
| Example 2-2 | HA | HT-1-1 | 1.96 | 10 | HT-2-1 | 1.79 | 45 | —— | — | — | 0.17 | — | 110% |
| Example 2-3 | HA | HT-1-1 | 1.96 | 10 | HT-2-2 | 1.89 | 45 | —— | — | — | 0.07 | — | 105% |
| Example 2-4 | HA | HT-1-1 | 1.96 | 10 | HT-2-3 | 1.90 | 45 | —— | — | — | 0.06 | — | 105% |
| Example 2-5 | HA | HT-1-1 | 1.96 | 10 | HT-2-4 | 1.83 | 45 | —— | — | — | 0.13 | — | 105% |
| Example 2-6 | HA | HT-1-1 | 1.96 | 10 | HT-2-5 | 1.92 | 45 | —— | — | — | 0.04 | — | 105% |
| Example 2-7 | HA | HT-1-1 | 1.96 | 10 | HT-2-2 | 1.89 | 40 | HT-3-1 | 1.90 | 5 | 0.07 | −0.01 | 105% |
| Example 2-8 | HA | HT-1-1 | 1.96 | 10 | HT-2-3 | 1.90 | 40 | HT-3-1 | 1.90 | 5 | 0.06 | 0.00 | 105% |
| Example 2-9 | HA | HT-1-1 | 1.96 | 10 | HT-2-4 | 1.83 | 40 | HT-3-1 | 1.90 | 5 | 0.13 | −0.07 | 105% |
| Example 2-10 | HA | HT-1-1 | 1.96 | 10 | HT-2-6 | 1.89 | 40 | HT-3-1 | 1.90 | 5 | 0.07 | −0.01 | 105% |
| Example 2-11 | HA | HT-1-1 | 1.96 | 10 | HT-2-7 | 1.83 | 40 | HT-3-1 | 1.90 | 5 | 0.13 | −0.07 | 110% |
| Example 2-12 | HA | HT-1-1 | 1.96 | 10 | HT-2-5 | 1.92 | 40 | HT-3-1 | 1.90 | 5 | 0.04 | 0.02 | 105% |
| Example 2-13 | HA | HT-1-2 | 1.94 | 10 | HT-2-2 | 1.89 | 45 | —— | — | — | 0.05 | — | 102% |
| Example 2-14 | HA | HT-1-2 | 1.94 | 10 | HT-2-3 | 1.90 | 45 | —— | — | — | 0.04 | — | 102% |
| Example 2-15 | HA | HT-1-2 | 1.94 | 10 | HT-2-4 | 1.83 | 45 | —— | — | — | 0.11 | — | 102% |
| Example 2-16 | HA | HT-1-2 | 1.94 | 10 | HT-2-5 | 1.92 | 45 | —— | — | — | 0.02 | — | 102% |
| Example 2-17 | HA | HT-1-2 | 1.94 | 10 | HT-2-2 | 1.89 | 40 | HT-3-1 | 1.90 | 5 | 0.05 | −0.01 | 102% |
| Example 2-18 | HA | HT-1-2 | 1.94 | 10 | HT-2-3 | 1.90 | 40 | HT-3-1 | 1.90 | 5 | 0.04 | 0.00 | 102% |
| Example 2-19 | HA | HT-1-2 | 1.94 | 10 | HT-2-4 | 1.83 | 40 | HT-3-1 | 1.90 | 5 | 0.11 | −0.07 | 102% |
| Example 2-20 | HA | HT-1-2 | 1.94 | 10 | HT-2-6 | 1.89 | 40 | HT-3-1 | 1.90 | 5 | 0.05 | −0.01 | 102% |
| Example 2-21 | HA | HT-1-2 | 1.94 | 10 | HT-2-7 | 1.83 | 40 | HT-3-1 | 1.90 | 5 | 0.11 | −0.07 | 107% |
| Example 2-22 | HA | HT-1-2 | 1.94 | 10 | HT-2-5 | 1.92 | 40 | HT-3-1 | 1.90 | 5 | 0.02 | 0.02 | 102% |
| Example 2-23 | HA | HT-1-3 | 1.99 | 10 | HT-2-2 | 1.89 | 45 | —— | — | — | 0.10 | — | 102% |
| Example 2-24 | HA | HT-1-3 | 1.99 | 10 | HT-2-3 | 1.90 | 45 | —— | — | — | 0.09 | — | 102% |
| Example 2-25 | HA | HT-1-3 | 1.99 | 10 | HT-2-4 | 1.83 | 45 | —— | — | — | 0.16 | — | 102% |
| Example 2-26 | HA | HT-1-3 | 1.99 | 10 | HT-2-5 | 1.92 | 45 | —— | — | — | 0.07 | — | 102% |
| Example 2-27 | HA | HT-1-3 | 1.99 | 10 | HT-2-2 | 1.89 | 40 | HT-3-1 | 1.90 | 5 | 0.10 | −0.01 | 102% |
| Example 2-28 | HA | HT-1-3 | 1.99 | 10 | HT-2-3 | 1.90 | 40 | HT-3-1 | 1.90 | 5 | 0.09 | 0.00 | 102% |
| Example 2-29 | HA | HT-1-3 | 1.99 | 10 | HT-2-4 | 1.83 | 40 | HT-3-1 | 1.90 | 5 | 0.16 | −0.07 | 102% |
| Example 2-30 | HA | HT-1-3 | 1.99 | 10 | HT-2-6 | 1.89 | 40 | HT-3-1 | 1.90 | 5 | 0.10 | −0.01 | 102% |
| Example 2-31 | HA | HT-1-3 | 1.99 | 10 | HT-2-7 | 1.83 | 40 | HT-3-1 | 1.90 | 5 | 0.16 | −0.07 | 107% |
| Example 2-32 | HA | HT-1-3 | 1.99 | 10 | HT-2-5 | 1.92 | 40 | HT-3-1 | 1.90 | 5 | 0.07 | 0.02 | 102% |
| Example 2-33 | HA | HT-1-2 | 1.94 | 10 | HT-2-1 | 1.79 | 40 | HT-3-1 | 1.90 | 5 | 0.15 | −0.11 | 105% |
| Example 2-34 | HA | HT-1-2 | 1.94 | 10 | HT-2-1 | 1.79 | 45 | —— | — | — | 0.15 | — | 107% |
| Example 2-35 | HA | HT-1-3 | 1.99 | 10 | HT-2-1 | 1.79 | 40 | HT-3-1 | 1.90 | 5 | 0.20 | −0.11 | 105% |
| Example 2-36 | HA | HT-1-3 | 1.99 | 10 | HT-2-1 | 1.79 | 45 | —— | — | — | 0.20 | — | 107% |

TABLE 4

| | First Anode Side Organic Layer | | | | Second Anode Side Organic Layer | | | Third Anode Side Organic Layer | | | Refractive Index Difference | | Device Evaluation EQE |
|---|---|---|---|---|---|---|---|---|---|---|---|---|---|
| | First Organic Material Name | Second Organic Material Name | Refractive Index $NM_1$ | Film Thickness [nm] | Compound Name | Refractive Index $NM_2$ | Film Thickness [nm] | Compound Name | Refractive Index $NM_3$ | Film Thickness [nm] | $NM_1 - NM_2$ | $NM_2 - NM_3$ | (Relative Value) |
| Example 2-37 | HA | HT-1-4 | 2.03 | 10 | HT-2-1 | 1.79 | 45 | — | — | — | 0.24 | — | 110% |
| Example 2-38 | HA | HT-1-4 | 2.03 | 10 | HT-2-8 | 1.78 | 45 | — | — | — | 0.25 | — | 111% |
| Example 2-39 | HA | HT-1-4 | 2.03 | 10 | HT-2-10 | 1.77 | 45 | — | — | — | 0.26 | — | 111% |
| Example 2-40 | HA | HT-1-5 | 1.90 | 10 | HT-2-1 | 1.79 | 45 | — | — | — | 0.11 | — | 113% |
| Example 2-41 | HA | HT-1-5 | 1.90 | 10 | HT-2-8 | 1.78 | 45 | — | — | — | 0.12 | — | 114% |
| Example 2-42 | HA | HT-1-5 | 1.90 | 10 | HT-2-10 | 1.77 | 45 | — | — | — | 0.13 | — | 114% |
| Example 2-43 | HA | HT-1-1 | 1.96 | 10 | HT-2-9 | 1.83 | 40 | HT-3-1 | 1.90 | 5 | 0.13 | −0.07 | 107% |
| Example 2-44 | HA | HT-1-1 | 1.96 | 10 | HT-2-11 | 1.78 | 40 | HT-3-1 | 1.90 | 5 | 0.18 | −0.12 | 108% |
| Example 2-45 | HA | HT-1-1 | 1.96 | 10 | HT-2-12 | 1.76 | 40 | HT-3-1 | 1.90 | 5 | 0.20 | −0.14 | 108% |
| Example 2-46 | HA | HT-1-6 | 2.05 | 10 | HT-2-1 | 1.79 | 45 | — | — | — | 0.26 | — | 112% |

Evaluation of Compounds

Singlet Energy $S_1$

A toluene solution of a measurement target compound at a concentration of 10 μmol/L was prepared and put in a quartz cell. An absorption spectrum (ordinate axis: absorption intensity, abscissa axis: wavelength) of the thus-obtained sample was measured at a normal temperature (300K). A tangent was drawn to the fall of the absorption spectrum close to the long-wavelength region, and a wavelength value $\lambda_{edge}$ (nm) at an intersection of the tangent and the abscissa axis was assigned to a conversion equation (F2) below to calculate the singlet energy.

$$S_1\ [\text{eV}]=1239.85/\lambda_{edge} \qquad \text{Conversion Equation (F2):}$$

A spectrophotometer (U3310 manufactured by Hitachi, Ltd.) was used for measuring absorption spectrum.

The tangent to the fall of the absorption spectrum close to the long-wavelength region is drawn as follows. While moving on a curve of the absorption spectrum from the local maximum value closest to the long-wavelength region, among the local maximum values of the absorption spectrum, in a long-wavelength direction, a tangent at each point on the curve is checked. An inclination of the tangent is decreased and increased in a repeated manner as the curve falls (i.e., a value of the ordinate axis is decreased). A tangent drawn at a point where the inclination of the curve is the local minimum closest to the long-wavelength region (except when absorbance is 0.1 or less) is defined as the tangent to the fall of the absorption spectrum close to the long-wavelength region.

The local maximum absorbance of 0.2 or less is not counted as the above-mentioned local maximum absorbance closest to the long-wavelength region.

Triplet Energy $T_1$

A measurement target compound was dissolved in EPA (diethylether:isopentane:ethanol=5:5:2 in volume ratio) at a concentration of 10 μmol/L to prepare a solution. The obtained solution was put in a quartz cell to provide a measurement sample. A phosphorescence spectrum (ordinate axis: phosphorescent luminous intensity, abscissa axis: wavelength) of the measurement sample was measured at a low temperature (77K). A tangent was drawn to the rise of the phosphorescence spectrum close to the short-wavelength region. An energy amount was calculated by a conversion equation (F1) below on a basis of a wavelength value $\lambda_{edge}$ [nm] at an intersection of the tangent and the abscissa axis. The calculated energy amount was defined as triplet energy $T_1$. It should be noted that the triplet energy $T_1$ has an error of about plus or minus 0.02 eV depending on measurement conditions.

$$T_1\ [\text{eV}]=1239.85/\lambda_{edge} \qquad \text{Conversion Equation (F1):}$$

The tangent to the rise of the phosphorescence spectrum close to the short-wavelength region is drawn as follows. While moving on a curve of the phosphorescence spectrum from the short-wavelength region to the local maximum value closest to the short-wavelength region among the local maximum values of the phosphorescence spectrum, a tangent is checked at each point on the curve toward the long-wavelength of the phosphorescence spectrum. An inclination of the tangent is increased along the rise of the curve (i.e., a value of the ordinate axis is increased). A tangent drawn at a point of the local maximum inclination (i.e., a tangent at an inflection point) is defined as the tangent to the rise of the phosphorescence spectrum close to the short-wavelength region.

A local maximum point where a peak intensity is 15% or less of the maximum peak intensity of the spectrum is not counted as the above-mentioned local maximum peak intensity closest to the short-wavelength region. The tangent drawn at a point that is closest to the local maximum peak intensity closest to the short-wavelength region and where the inclination of the curve is the local maximum is defined as a tangent to the rise of the phosphorescence spectrum close to the short-wavelength region.

For phosphorescence measurement, a spectrophotofluorometer body F-4500 (manufactured by Hitachi High-Technologies Corporation) was used.

Table 5 shows measurement values of the singlet energy $S_1$ and the triplet energy $T_1$ of the compounds used for manufacturing the organic EL devices.

TABLE 5

| | $S_1$ [eV] | $T_1$ [eV] |
|---|---|---|
| BH1-1 | 3.08 | 2.09 |
| BH1-2 | 3.31 | 2.09 |
| BH2 | 3.01 | 1.87 |
| BD | 2.78 | 2.32 |

Measurement of Maximum Fluorescence Peak Wavelength (FL-Peak)

A measurement target compound was dissolved in toluene at a concentration of $4.9\times10^{-6}$ mol/L to prepare a toluene solution. Using a fluorescence spectrometer (spectrophotofluorometer F-7000 manufactured by Hitachi High-Tech Science Corporation), the toluene solution of the measurement target compound was excited at 390 nm, where a maximum fluorescence peak wavelength A (unit: nm) was measured.

The maximum fluorescence peak wavelength A of the compound BD was 445 nm.

Refractive Index

The refractive index of the constituent material (compound) forming the organic layer was measured as follows.

A measurement target material was vacuum-deposited on a glass substrate to form an approximately 50-nm-thick film. Using a spectroscopic ellipsometer (M-2000UI, manufactured by J. A. Woollam Co., Inc. (US)), the obtained sample film was irradiated with incident light (from ultraviolet light through visible light to near-infrared light) every 5 degrees in a measurement angle range of 45 degrees to 75 degrees to measure changes in a deflection state of the light reflected by the sample surface. In order to improve measurement accuracy of an extinction coefficient, a transmission spectrum in a substrate normal direction (direction perpendicular to a surface of the substrate of the organic EL device) was also measured by M-2000UI. Similarly, the same measurement was also performed on a glass substrate on which no measurement target material was vapor-deposited. The measurement information obtained was fitted using analysis software (Complete EASE) manufactured by J. A. Woollam Co., Inc.

Refractive indices in an in-plane direction and a normal direction, extinction coefficients in the in-plane direction and the normal direction, and an order parameter of an organic film formed on the substrate were calculated under fitting conditions of using an anisotropic model rotationally symmetric about one axis and setting a parameter MSE indicating a mean square error in the analysis software to be 3.0 or less. A peak close to the long-wavelength region of the extinction coefficient (in-plane direction) was defined as $S_1$, and the order parameter was calculated by a peak wavelength of $S_1$. As fitting conditions for the glass substrate, an isotropic model was used.

Typically, a film formed by vacuum-depositing a low molecular material on the substrate is rotationally symmetric about one axis extending along the substrate normal direction. When an angle formed by the substrate normal direction and a molecular axis in a thin film formed on the substrate is defined as θ and the extinction coefficients in a substrate parallel direction (Ordinary direction) and a substrate perpendicular direction (Extra-Ordinary direction) obtained by performing the variable-angle spectroscopic ellipsometry measurement on the thin film are respectively defined as ko and ke, S' represented by a formula below is the order parameter.

$$S'=1-\langle\cos 2\theta\rangle=2ko/(ke+2ko)=2/3(1-S)$$

$$S=(1/^{2})\langle 3\cos 2\theta-1\rangle=(ke-ko)/(ke+2ko)$$

An evaluation method of the molecular orientation is a publicly known method, and details thereof are described in Organic Electronics, volume 10, page 127 (2009). Further, the method for forming the thin film is a vacuum deposition method.

The order parameter S' obtained by the variable-angle spectroscopic ellipsometry measurement is 1.0 when all molecules are oriented in parallel with the substrate. When molecules are random without being oriented, the order parameter S' is 0.66.

Herein, a value at 2.7 eV in the substrate parallel direction (Ordinary direction), from among the values measured above, is defined as a refractive index of the measurement target material.

When a layer was formed by a constituent material containing a plurality of compounds, a refractive index of the constituent material of the layer, the layer being a film formed by co-depositing the plurality of compounds as the measurement target material on the glass substrate or a film formed by vapor-depositing a mixture containing the plurality of compounds, was measured using a spectroscopic ellipsometer in the same manner as above.

Tables 1 and 2 show constituent materials of the first anode side organic layer, the second anode side organic layer and the third anode side organic layer, a refractive index of a constituent material (compound(s)) of each layer and refractive index differences $NM_1-NM_2$ and $NM_2-NM_3$.

What is claimed is:

1. An organic electroluminescence device comprising:

a cathode;

an anode;

an emitting region provided between the cathode and the anode; and a hole transporting zone provided between the anode and the emitting region, wherein the emitting region comprises at least one emitting layer, the hole transporting zone comprises at least a first anode side organic layer, a second anode side organic layer and a third anode side organic layer, the first anode side organic layer is in direct contact with the second anode side organic layer, the first anode side organic layer and the second anode side organic layer are disposed between the anode and the emitting region in this order from the anode, the third anode side organic layer is disposed between the second anode side organic layer and the emitting region, the third anode side organic layer being in direct contact with the emitting region, a total film thickness of the hole transporting zone is in a range from 20 nm to 80 nm, the first anode side organic layer does not comprise a compound comprised in the second anode side organic layer, the first anode side organic layer comprises compounds comprising a first organic material and a second organic material, the first organic material is different from the second organic material, a content of the first organic material in the first anode side organic layer is less than 50 mass %, and a difference $NM_1-NM_2$ between a refractive index $NM_1$ of a constituent material comprised in the first anode side organic layer and a refractive index $NM_2$ of a constituent material comprised in the second anode side organic layer satisfies a relationship of a numerical formula (Numerical Formula N1) below, $$NM_1-NM_2\geq 0.04 \quad \text{(Numerical Formula N1)}.$$

2. The organic electroluminescence device according to claim 1, wherein the difference $NM_1-NM_2$ between the refractive index $NM_1$ of the constituent material comprised in the first anode side organic layer and the refractive index $NM_2$ of the constituent material comprised in the second anode side organic layer satisfies a relationship of a numerical formula (Numerical Formula N2) below, $$NM_1 - NM_2 \geq 0.10 \quad \text{(Numerical Formula N2).}$$

3. The organic electroluminescence device according to claim 1, wherein the compound comprised in the second anode side organic layer has a refractive index of 1.90 or less.

4. The organic electroluminescence device according to claim 1, wherein the compounds comprised in the first anode side organic layer have a refractive index of 1.94 or more.

5. The organic electroluminescence device according to claim 1, wherein a film thickness of the second anode side organic layer is 20 nm or more.

6. The organic electroluminescence device according to claim 1, wherein a film thickness of the second anode side organic layer is in a range from 20 nm to 60 nm.

7. The organic electroluminescence device according to claim 1, wherein the compounds comprised in the first anode side organic layer are different from the compound comprised in the second anode side organic layer.

8. The organic electroluminescence device according to claim 1, wherein the second anode side organic layer comprises at least one compound selected from the group consisting of a compound represented by a formula (cHT3-1) below, a compound represented by a formula (cHT3-2) below, a compound represented by a formula (cHT3-3) below and a compound represented by a formula (cHT3-4) below, (cHT3-1)

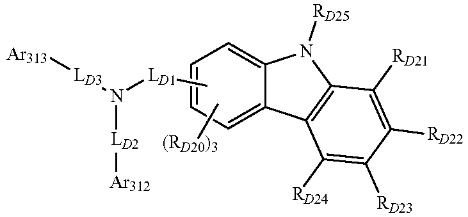

(cHT3-2)

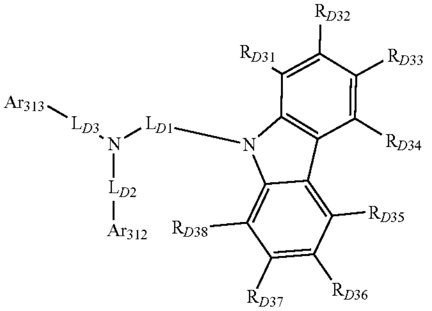

(cHT3-3)

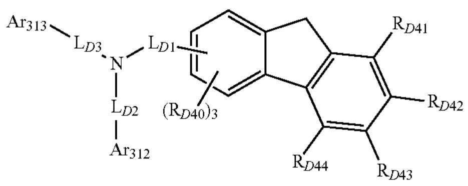

-continued (cHT3-4)

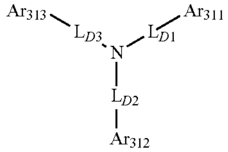

where, in the formulae (cHT3-1), (cHT3-2), (cHT3-3) and (cHT3-4):

$Ar_{311}$ is a group represented by one of formulae (1-a), (1-b), (1-c) and (1-d) below;

$Ar_{312}$ and $Ar_{313}$ are each independently a substituted or unsubstituted aryl group having 6 to 50 ring carbon atoms, a substituted or unsubstituted heterocyclic group having 5 to 50 ring atoms, or —$Si(R_{C1})(R_{C2})(R_{C3})$;

$R_{C1}$, $R_{C2}$ and $R_{C3}$ are each independently a substituted or unsubstituted aryl group having 6 to 50 ring carbon atoms;

when a plurality of $R_{C1}$ are present, the plurality of $R_{C1}$ are mutually the same or different;

when a plurality of $R_{C2}$ are present, the plurality of $R_{C2}$ are mutually the same or different;

when a plurality of $R_{C3}$ are present, the plurality of $R_{C3}$ are mutually the same or different;

$L_{D1}$, $L_{D2}$ and $L_{D3}$ are each independently a single bond, a substituted or unsubstituted arylene group having 6 to 50 ring carbon atoms, or a substituted or unsubstituted divalent heterocyclic group having 5 to 50 ring atoms;

at least one combination of adjacent two or more of $R_{D20}$ to $R_{D24}$ are mutually bonded to form a substituted or unsubstituted monocyclic ring, mutually bonded to form a substituted or unsubstituted fused ring, or not mutually bonded;

at least one combination of adjacent two or more of $R_{D31}$ to $R_{D38}$ are mutually bonded to form a substituted or unsubstituted monocyclic ring, mutually bonded to form a substituted or unsubstituted fused ring, or not mutually bonded;

at least one combination of adjacent two or more of $R_{D40}$ to $R_{D44}$ are mutually bonded to form a substituted or unsubstituted monocyclic ring, mutually bonded to form a substituted or unsubstituted fused ring, or not mutually bonded;

$X_3$ is an oxygen atom, a sulfur atom, or $C(R_{D45})(R_{D46})$;

a combination of $R_{D45}$ and $R_{D46}$ are mutually bonded to form a substituted or unsubstituted monocyclic ring, mutually bonded to form a substituted or unsubstituted fused ring, or not mutually bonded;

$R_{D25}$, and $R_{D20}$ to $R_{D24}$, $R_{D31}$ to $R_{D38}$, $R_{D40}$ to $R_{D44}$, $R_{D45}$ and $R_{D46}$ not forming the substituted or unsubstituted monocyclic ring and not forming the substituted or unsubstituted fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —$Si(R_{901})(R_{902})(R_{903})$, a group represented by —O—$(R_{904})$, a substituted or unsubstituted aryl group having 6 to 50 ring carbon atoms, or a substituted or unsubstituted heterocyclic group having 5 to 50 ring atoms;

in the compounds represented by the formulae (cHT3-1), (cHT3-2), (cHT3-3) and (cHT3-4), $R_{901}$ to $R_{904}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different; and when a plurality of $R_{904}$ are present, the plurality of $R_{904}$ are mutually the same or different, (1-a)

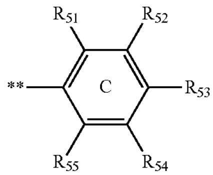

where, in the formula (1-a):

none of a combination of adjacent two or more of $R_{51}$ to $R_{55}$ are mutually bonded;

$R_{51}$ to $R_{55}$ are each independently a hydrogen atom or a substituted or unsubstituted alkyl group having 1 to 6 carbon atoms; and

** represents a bonding position to $L_{D1}$, (1-b)

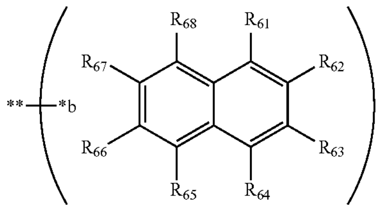

where, in the formula (1-b):

one of $R_{61}$ to $R_{68}$ is a single bond with *b;

none of a combination of adjacent two or more of $R_{61}$ to $R_{68}$ not being the single bond with *b are mutually bonded;

$R_{61}$ to $R_{68}$ not being the single bond with *b are each independently a hydrogen atom, a substituted or unsubstituted alkyl group having 1 to 6 carbon atoms, or a substituted or unsubstituted aryl group having 6 to 12 ring carbon atoms; and

** represents a bonding position to $L_{D1}$, (1-c)

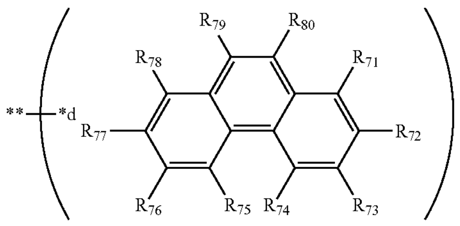

where, in the formula (1-c):

one of $R_{71}$ to $R_{80}$ is a single bond with *d;

none of a combination of adjacent two or more of $R_{71}$ to $R_{80}$ not being the single bond with *d are mutually bonded;

$R_{71}$ to $R_{80}$ not being the single bond with *d are each independently a hydrogen atom, a substituted or unsubstituted alkyl group having 1 to 6 carbon atoms, or a substituted or unsubstituted aryl group having 6 to 12 ring carbon atoms; and

** represents a bonding position to $L_{D1}$, and (1-d)

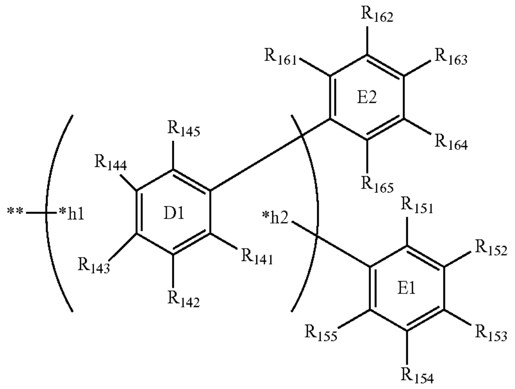

where, in the formula (1-d):

one of $R_{141}$ to $R_{145}$ is a single bond with *h1, and another one of $R_{141}$ to $R_{145}$ is a single bond with *h2;

none of a combination of adjacent two or more of $R_{141}$ to $R_{145}$ not being the single bond with *h1 and not being the single bond with *h2 are mutually bonded;

at least one combination of adjacent two or more of $R_{151}$ to $R_{155}$ are mutually bonded to form a substituted or unsubstituted monocyclic ring, mutually bonded to form a substituted or unsubstituted fused ring, or not mutually bonded;

at least one combination of adjacent two or more of $R_{161}$ to $R_{165}$ are mutually bonded to form a substituted or unsubstituted monocyclic ring, mutually bonded to form a substituted or unsubstituted fused ring, or not mutually bonded;

$R_{141}$ to $R_{145}$ not being the single bond with *h1 and not being the single bond with *h2, and $R_{151}$ to $R_{155}$ and $R_{161}$ to $R_{165}$ not forming the substituted or unsubstituted monocyclic ring and not forming the substituted or unsubstituted fused ring are each independently a hydrogen atom, a substituted or unsubstituted alkyl group having 1 to 6 carbon atoms, or a substituted or unsubstituted aryl group having 6 to 12 ring carbon atoms; and

** represents a bonding position to $L_{D1}$.

9. The organic electroluminescence device according to claim 1, wherein the first anode side organic layer comprises at least one compound selected from the group consisting of a compound represented by a formula (cHT2-1) below, a compound represented by a formula (cHT2-2) below and a compound represented by a formula (cHT2-3) below, (cHT2-1)

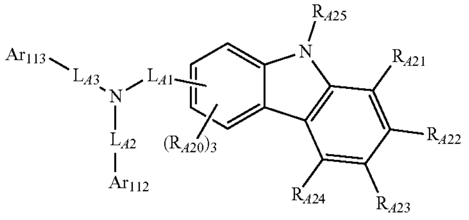

-continued (cHT2-2)

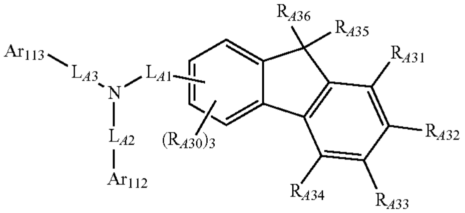

(cHT2-3)

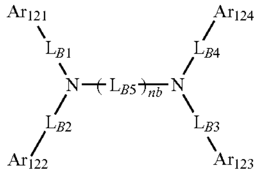

where, in the formulae (cHT2-1), (cHT2-2) and (cHT2-3):

$Ar_{112}$, $Ar_{113}$, $Ar_{121}$, $Ar_{122}$, $Ar_{123}$ and $Ar_{124}$ are each independently a substituted or unsubstituted aryl group having 6 to 50 ring carbon atoms, a substituted or unsubstituted heterocyclic group having 5 to 50 ring atoms, or —Si($R_{C1}$)($R_{C2}$)($R_{C3}$);

$R_{C1}$, $R_{C2}$ and $R_{C3}$ are each independently a substituted or unsubstituted aryl group having 6 to 50 ring carbon atoms;

when a plurality of $R_{C1}$ are present, the plurality of $R_{C1}$ are mutually the same or different;

when a plurality of $R_{C2}$ are present, the plurality of $R_{C2}$ are mutually the same or different;

when a plurality of $R_{C3}$ are present, the plurality of $R_{C3}$ are mutually the same or different;

$L_{A1}$, $L_{A2}$, $L_{A3}$, $L_{B1}$, $L_{B2}$, $L_{B3}$ and $L_{B4}$ are each independently a single bond, a substituted or unsubstituted arylene group having 6 to 50 ring carbon atoms, or a substituted or unsubstituted divalent heterocyclic group having 5 to 50 ring atoms;

nb is 1, 2, 3, or 4;

when nb is 1, $L_{B5}$ is a substituted or unsubstituted arylene group having 6 to 50 ring carbon atoms, or a substituted or unsubstituted divalent heterocyclic group having 5 to 50 ring atoms;

when nb is 2, 3 or 4, a plurality of $L_{B5}$ are mutually the same or different;

when nb is 2, 3 or 4, a plurality of $L_{B5}$ are mutually bonded to form a substituted or unsubstituted monocyclic ring, mutually bonded to form a substituted or unsubstituted fused ring, or not mutually bonded;

$L_{B5}$ not forming the substituted or unsubstituted monocyclic ring and not forming the substituted or unsubstituted fused ring is a substituted or unsubstituted arylene group having 6 to 50 ring carbon atoms, or a substituted or unsubstituted divalent heterocyclic group having 5 to 50 ring atoms;

a combination of $R_{A35}$ and $R_{A36}$ are mutually bonded to form a substituted or unsubstituted monocyclic ring, mutually bonded to form a substituted or unsubstituted fused ring, or not mutually bonded;

$R_{A25}$, and $R_{A35}$ and $R_{A36}$ not forming the substituted or unsubstituted monocyclic ring and not forming the substituted or unsubstituted fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

at least one combination of adjacent two or more of $R_{A20}$ to $R_{A24}$ are mutually bonded to form a substituted or unsubstituted monocyclic ring, mutually bonded to form a substituted or unsubstituted fused ring, or not mutually bonded;

at least one combination of adjacent two or more of $R_{A30}$ to $R_{A34}$ are mutually bonded to form a substituted or unsubstituted monocyclic ring, mutually bonded to form a substituted or unsubstituted fused ring, or not mutually bonded;

$R_{A20}$ to $R_{A24}$ and $R_{A30}$ to $R_{A34}$ not forming the substituted or unsubstituted monocyclic ring and not forming the substituted or unsubstituted fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

in the compounds represented by the formulae (cHT2-1), (cHT2-2) and (cHT2-3), $R_{901}$ to $R_{904}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different; and when a plurality of $R_{904}$ are present, the plurality of $R_{904}$ are mutually the same or different.

10. The organic electroluminescence device according to claim 8, wherein the first anode side organic layer comprises at least one compound selected from the group consisting of a compound represented by a formula (cHT2-1) below, a compound represented by a formula (cHT2-2) below and a compound represented by a formula (cHT2-3) below, (cHT2-1)

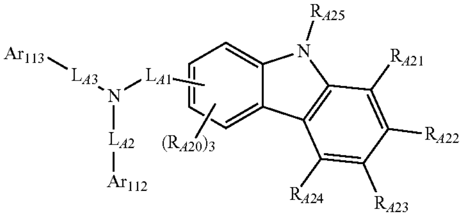

-continued (cHT2-2)

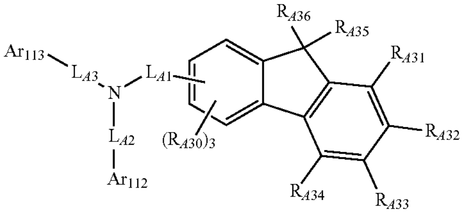

(cHT2-3)

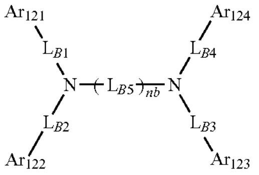

where, in the formulae (cHT2-1), (cHT2-2) and (cHT2-3):

$Ar_{112}$, $Ar_{113}$, $Ar_{121}$, $Ar_{122}$, $Ar_{123}$ and $Ar_{124}$ are each independently a substituted or unsubstituted aryl group having 6 to 50 ring carbon atoms, a substituted or unsubstituted heterocyclic group having 5 to 50 ring atoms, or —Si($R_{C1}$)($R_{C2}$)($R_{C3}$);

$R_{C1}$, $R_{C2}$ and $R_{C3}$ are each independently a substituted or unsubstituted aryl group having 6 to 50 ring carbon atoms;

when a plurality of $R_{C1}$ are present, the plurality of $R_{C1}$ are mutually the same or different;

when a plurality of $R_{C2}$ are present, the plurality of $R_{C2}$ are mutually the same or different;

when a plurality of $R_{C3}$ are present, the plurality of $R_{C3}$ are mutually the same or different;

$L_{A1}$, $L_{A2}$, $L_{A3}$, $L_{B1}$, $L_{B2}$, $L_{B3}$ and $L_{B4}$ are each independently a single bond, a substituted or unsubstituted arylene group having 6 to 50 ring carbon atoms, or a substituted or unsubstituted divalent heterocyclic group having 5 to 50 ring atoms;

nb is 1, 2, 3, or 4;

when nb is 1, $L_{B5}$ is a substituted or unsubstituted arylene group having 6 to 50 ring carbon atoms, or a substituted or unsubstituted divalent heterocyclic group having 5 to 50 ring atoms;

when nb is 2, 3 or 4, a plurality of $L_{B5}$ are mutually the same or different;

when nb is 2, 3 or 4, a plurality of $L_{B5}$ are mutually bonded to form a substituted or unsubstituted monocyclic ring, mutually bonded to form a substituted or unsubstituted fused ring, or not mutually bonded;

$L_{B5}$ not forming the substituted or unsubstituted monocyclic ring and not forming the substituted or unsubstituted fused ring is a substituted or unsubstituted arylene group having 6 to 50 ring carbon atoms, or a substituted or unsubstituted divalent heterocyclic group having 5 to 50 ring atoms;

a combination of $R_{A35}$ and $R_{A36}$ are mutually bonded to form a substituted or unsubstituted monocyclic ring, mutually bonded to form a substituted or unsubstituted fused ring, or not mutually bonded;

$R_{A25}$, and $R_{A35}$ and $R_{A36}$ not forming the substituted or unsubstituted monocyclic ring and not forming the substituted or unsubstituted fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

at least one combination of adjacent two or more of $R_{A20}$ to $R_{A24}$ are mutually bonded to form a substituted or unsubstituted monocyclic ring, mutually bonded to form a substituted or unsubstituted fused ring, or not mutually bonded;

at least one combination of adjacent two or more of $R_{A30}$ to $R_{A34}$ are mutually bonded to form a substituted or unsubstituted monocyclic ring, mutually bonded to form a substituted or unsubstituted fused ring, or not mutually bonded;

$R_{A20}$ to $R_{A24}$ and $R_{A30}$ to $R_{A34}$ not forming the substituted or unsubstituted monocyclic ring and not forming the substituted or unsubstituted fused ring are each independently a hydrogen atom, a cyano group, a substituted or unsubstituted alkyl group having 1 to 50 carbon atoms, a substituted or unsubstituted alkyl halide group having 1 to 50 carbon atoms, a substituted or unsubstituted cycloalkyl group having 3 to 50 ring carbon atoms, a group represented by —Si($R_{901}$)($R_{902}$)($R_{903}$), a group represented by —O—($R_{904}$), a substituted or unsubstituted aryl group having 6 to 50 ring carbon atoms, or a substituted or unsubstituted heterocyclic group having 5 to 50 ring atoms;

in the compounds represented by the formulae (cHT2-1), (cHT2-2) and (cHT2-3), $R_{901}$ to $R_{904}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms;

when a plurality of $R_{901}$ are present, the plurality of $R_{901}$ are mutually the same or different;

when a plurality of $R_{902}$ are present, the plurality of $R_{902}$ are mutually the same or different;

when a plurality of $R_{903}$ are present, the plurality of $R_{903}$ are mutually the same or different; and when a plurality of $R_{904}$ are present, the plurality of $R_{904}$ are mutually the same or different.

11. The organic electroluminescence device according to claim 1, wherein the second organic material is a monoamine compound comprising one substituted or unsubstituted amino group in a molecule thereof.

12. The organic electroluminescence device according to claim 1, wherein the second organic material comprises at least one group selected from the group consisting of a group represented by a formula (2-a) below, a group represented by a formula (2-b) below, a group represented by a formula (2-c) below, a group represented by a formula (2-d) below, a group represented by a formula (2-e) below and a group represented by a formula (2-f) below, (2-a)

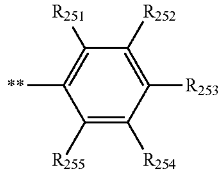

where, in the formula (2-a):

none of a combination of adjacent two or more of $R_{251}$ to $R_{255}$ are mutually bonded;

$R_{251}$ to $R_{255}$ are each independently a hydrogen atom, or a substituted or unsubstituted alkyl group having 1 to 6 carbon atoms; and

** represents a bonding position, (2-b)

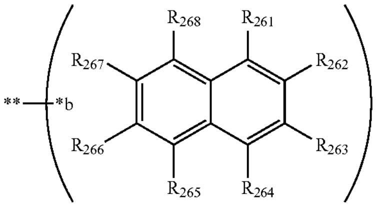

where, in the formula (2-b):

one of $R_{261}$ to $R_{268}$ is a single bond with *b;

none of a combination of adjacent two or more of $R_{261}$ to $R_{268}$ not being the single bond with *b are mutually bonded;

$R_{261}$ to $R_{268}$ not being the single bond with *b are each independently a hydrogen atom, a substituted or unsubstituted alkyl group having 1 to 6 carbon atoms, or a substituted or unsubstituted aryl group having 6 to 12 ring carbon atoms; and

** represents a bonding position, (2-c)

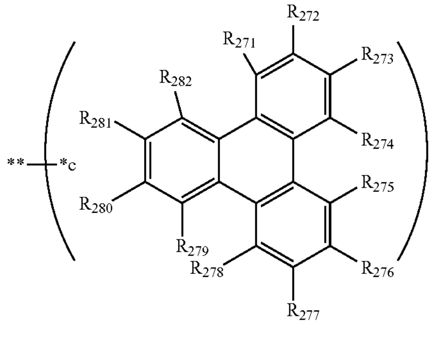

where, in the formula (2-c):

one of $R_{271}$ to $R_{282}$ is a single bond with *c;

none of a combination of adjacent two or more of $R_{271}$ to $R_{282}$ not being the single bond with *c are mutually bonded;

$R_{271}$ to $R_{282}$ not being the single bond with *c are each independently a hydrogen atom, a substituted or unsubstituted alkyl group having 1 to 6 carbon atoms, or a substituted or unsubstituted aryl group having 6 to 12 ring carbon atoms; and

** represents a bonding position, (2-d)

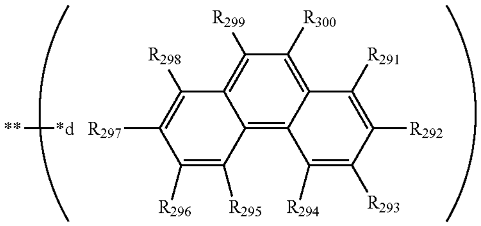

where, in the formula (2-d):

one of $R_{291}$ to $R_{300}$ is a single bond with *d;

none of a combination of adjacent two or more of $R_{291}$ to $R_{300}$ not being the single bond with *d are mutually bonded;

$R_{291}$ to $R_{300}$ not being the single bond with *d are each independently a hydrogen atom, a substituted or unsubstituted alkyl group having 1 to 6 carbon atoms, or a substituted or unsubstituted aryl group having 6 to 12 ring carbon atoms; and

** represents a bonding position, (2-e)

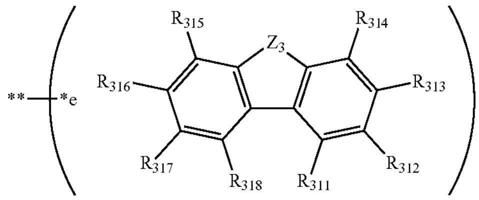

where, in the formula (2-e):

$Z_3$ is an oxygen atom, a sulfur atom, $NR_{319}$ or $C(R_{320})(R_{321})$;

one of $R_{311}$ to $R_{321}$ is a single bond with *e, or one of carbon atoms of a substituted or unsubstituted benzene ring, described below, formed by mutually bonding a combination of adjacent two or more of $R_{311}$ to $R_{318}$ is bonded to *e by a single bond;

a combination of adjacent two or more of $R_{311}$ to $R_{318}$ not being the single bond with *e are mutually bonded to form a substituted or unsubstituted benzene ring, or not mutually bonded;

$R_{311}$ to $R_{318}$ not being the single bond with *e and not forming the substituted or unsubstituted benzene ring are each independently a hydrogen atom, a substituted or unsubstituted alkyl group having 1 to 6 carbon atoms, a substituted or unsubstituted aryl group having 6 to 12 ring carbon atoms, or a substituted or unsubstituted heterocyclic group having 5 to 10 ring atoms;

$R_{319}$ not being the single bond with *e is a hydrogen atom, a substituted or unsubstituted alkyl group having 1 to 6 carbon atoms, or a substituted or unsubstituted aryl group having 6 to 12 ring carbon atoms;

a combination of $R_{320}$ and $R_{321}$ not being the single bond with *e are mutually bonded to form a substituted or unsubstituted monocyclic ring, mutually bonded to form a substituted or unsubstituted fused ring, or not mutually bonded;

$R_{320}$ and $R_{321}$ not being the single bond with *e, not forming the substituted or unsubstituted monocyclic ring and not forming the substituted or unsubstituted fused ring are each independently a hydrogen atom, a substituted or unsubstituted alkyl group having 1 to 6 carbon atoms, or a substituted or unsubstituted aryl group having 6 to 12 ring carbon atoms; and

** represents a bonding position, and (2-f)

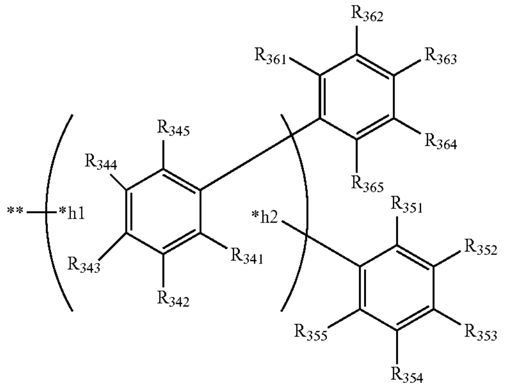

where, in the formula (2-f):

one of $R_{341}$ to $R_{345}$ is a single bond with *h1, and another one of $R_{341}$ to $R_{345}$ is a single bond with *h2;

none of a combination of adjacent two or more of $R_{341}$ to $R_{345}$ not being the single bond with *h1 and not being the single bond with *h2 are mutually bonded;

at least one combination of adjacent two or more of $R_{351}$ to $R_{355}$ are mutually bonded to form a substituted or unsubstituted monocyclic ring, mutually bonded to form a substituted or unsubstituted fused ring, or not mutually bonded;

at least one combination of adjacent two or more of $R_{361}$ to $R_{365}$ are mutually bonded to form a substituted or unsubstituted monocyclic ring, mutually bonded to form a substituted or unsubstituted fused ring, or not mutually bonded;

$R_{341}$ to $R_{345}$ not being the single bond with *h1 and not being the single bond with *h2, and $R_{351}$ to $R_{355}$ and $R_{361}$ to $R_{365}$ not forming the substituted or unsubstituted monocyclic ring and not forming the substituted or unsubstituted fused ring are each independently a hydrogen atom, a substituted or unsubstituted alkyl group having 1 to 6 carbon atoms, or a substituted or unsubstituted aryl group having 6 to 12 ring carbon atoms; and

** represents a bonding position.

13. The organic electroluminescence device according to claim 12, wherein the second organic material is a monoamine compound comprising one substituted or unsubstituted amino group in a molecule thereof, and the group represented by the formula (2-a), the group represented by the formula (2-b), the group represented by the formula (2-c), the group represented by the formula (2-d), the group represented by the formula (2-e) and the group represented by the formula (2-f) are each independently bonded directly, through a phenylene group, or through a biphenylene group to a nitrogen atom of the amino group of the monoamine compound.

14. The organic electroluminescence device according to claim 1, wherein the compounds comprised in the first anode side organic layer comprise no thiophene ring in a molecule thereof.

15. The organic electroluminescence device according to claim 1, wherein the content of the first organic material in the first anode side organic layer is 5 mass % or more.

16. The organic electroluminescence device according to claim 1, wherein the total film thickness of the hole transporting zone is in a range from 40 nm to 80 nm.

17. The organic electroluminescence device according to claim 1, wherein the anode is in direct contact with the hole transporting zone, and the emitting region is in direct contact with the hole transporting zone.

18. The organic electroluminescence device according to claim 1, wherein the anode is in direct contact with the first anode side organic layer.

19. The organic electroluminescence device according to claim 1, wherein the second anode side organic layer is in direct contact with the third anode side organic layer.

20. The organic electroluminescence device according to claim 1, wherein the hole transporting zone further comprises a fourth anode side organic layer, and the fourth anode side organic layer is disposed between the third anode side organic layer and the emitting region.

21. The organic electroluminescence device according to claim 1, wherein the emitting region consists of one emitting layer.

22. The organic electroluminescence device according to claim 1, wherein the emitting region consists of two emitting layers.

23. The organic electroluminescence device according to claim 1, wherein the at least one emitting layer in the emitting region comprises an emitting compound that emits light having a maximum peak wavelength of 500 nm or less.

24. The organic electroluminescence device according to claim 1, further comprising:

a first emitting unit comprising the hole transporting zone as a first hole transporting zone and the emitting region as a first emitting region;

a first charge generating layer provided between the first emitting unit and the cathode; and a second emitting unit provided between the first charge generating layer and the cathode and comprising a second hole transporting zone and a second emitting region, wherein the first hole transporting zone, the first emitting region, the first charge generating layer, the second hole transporting zone and the second emitting region are disposed in this order.

25. The organic electroluminescence device according to claim 24, further comprising:

a third emitting unit; and a second charge generating layer, wherein the third emitting unit is disposed between the second emitting unit and the cathode, and the second charge generating layer is disposed between the third emitting unit and the second emitting unit.

26. A light-emitting device comprising the organic electroluminescence device according to claim 24 and a color conversion layer.

27. An organic electroluminescence display device comprising:

an anode and a cathode provided to face each other;

a blue-emitting organic EL device as a blue pixel;

a green-emitting organic EL device as a green pixel; and a red-emitting organic EL device as a red pixel, wherein the blue pixel comprises the organic electroluminescence device according to claim 1 as the blue-emitting organic EL device, the green-emitting organic EL device comprises a green emitting region provided between the anode and the cathode, the red-emitting organic EL device comprises a red emitting region provided between the anode and the cathode, and the first anode side organic layer, the second anode side organic layer and the third anode side organic layer are provided in a shared manner across the blue-emitting organic EL device, the green-emitting organic EL device and the red-emitting organic EL device between the anode and the emitting region of the blue-emitting organic EL device, the green emitting region and the red emitting region.

28. An electronic device comprising the organic electroluminescence device according to claim 1.

29. An organic electroluminescence device comprising:

a cathode;

an anode;

an emitting region provided between the cathode and the anode; and a hole transporting zone provided between the anode and the emitting region, wherein the emitting region comprises at least one emitting layer, the hole transporting zone comprises at least a first anode side organic layer, a second anode side organic layer and a third anode side organic layer, the first anode side organic layer is in direct contact with the second anode side organic layer, the first anode side organic layer and the second anode side organic layer are disposed between the anode and the emitting region in this order from the anode, the third anode side organic layer is disposed between the second anode side organic layer and the emitting region, the hole transporting zone further comprises a fourth anode side organic layer, the fourth anode side organic layer is disposed between the third anode side organic layer and the emitting region, a total film thickness of the hole transporting zone is in a range from 20 nm to 80 nm, the first anode side organic layer does not comprise a compound comprised in the second anode side organic layer, the first anode side organic layer comprises compounds comprising a first organic material and a second organic material, the first organic material is different from the second organic material, a content of the first organic material in the first anode side organic layer is less than 50 mass %, and a difference $NM_1-NM_2$ between a refractive index $NM_1$ of a constituent material comprised in the first anode side organic layer and a refractive index $NM_2$ of a constituent material comprised in the second anode side organic layer satisfies a relationship of a numerical formula (Numerical Formula N1) below, $$NM_1-NM_2 \geq 0.04 \qquad \text{(Numerical Formula N1).}$$

* * * * *